US011316533B2

(12) United States Patent
Ikegaya et al.

(10) Patent No.: US 11,316,533 B2
(45) Date of Patent: *Apr. 26, 2022

(54) DATA PROCESSING DEVICE AND DATA PROCESSING METHOD

(71) Applicant: Saturn Licensing LLC, New York, NY (US)

(72) Inventors: Ryoji Ikegaya, Kanagawa (JP); Makiko Yamamoto, Tokyo (JP); Yuji Shinohara, Kanagawa (JP)

(73) Assignee: Saturn Licensing LLC, New York, NY (US)

( * ) Notice: Subject to any disclaimer, the term of this patent is extended or adjusted under 35 U.S.C. 154(b) by 109 days.

This patent is subject to a terminal disclaimer.

(21) Appl. No.: 16/854,501

(22) Filed: Apr. 21, 2020

(65) Prior Publication Data

US 2020/0321980 A1 Oct. 8, 2020

Related U.S. Application Data

(63) Continuation of application No. 16/290,147, filed on Mar. 1, 2019, now Pat. No. 10,686,470, which is a (Continued)

(30) Foreign Application Priority Data

May 21, 2014 (JP) ................................ 2014-104807

(51) Int. Cl.
*H03M 13/11* (2006.01)
*H03M 13/03* (2006.01)
(Continued)

(52) U.S. Cl.
CPC ......... *H03M 13/1148* (2013.01); *G06F 11/10* (2013.01); *H03M 13/036* (2013.01);
(Continued)

(58) Field of Classification Search
None
See application file for complete search history.

(56) References Cited

U.S. PATENT DOCUMENTS 10,277,257 B2 4/2019 Shinohara et al.
10,320,416 B2 6/2019 Shinohara et al.
(Continued)

FOREIGN PATENT DOCUMENTS

CN 101946414 A 1/2011
CN 103548272 A 1/2014
(Continued)

OTHER PUBLICATIONS

International Search Report dated Jun. 9, 2015, in PCT/JP2015/063251 filed May 8, 2015.

(Continued)

*Primary Examiner* — Guerrier Merant
(74) *Attorney, Agent, or Firm* — Oblon, McClelland, Maier & Neustadt, L.L.P.

(57) ABSTRACT

The present technology relates to a data processing device and a data processing method, which are capable of securing excellent communication quality in data transmission using an LDPC code. In group-wise interleave, an LDPC code in which a code length N is 16200 bits and an encoding rate r is 6/15, 8/15, or 10/15 is interleaved in units of bit groups of 360 bits. In group-wise deinterleave, a sequence of the LDPC code that has undergone the group-wise interleave is restored to an original sequence. For example, the present technology can be applied to a technique of performing data transmission using an LDPC code.

20 Claims, 243 Drawing Sheets

Related U.S. Application Data continuation of application No. 15/935,439, filed on Mar. 26, 2018, now Pat. No. 10,333,550, which is a continuation of application No. 15/310,930, filed as application No. PCT/JP2015/063251 on May 8, 2015, now abandoned.

(51) Int. Cl.

| | |
|---|---|
| ***H03M 13/25*** | (2006.01) |
| ***H03M 13/27*** | (2006.01) |
| ***H03M 13/29*** | (2006.01) |
| ***H03M 13/35*** | (2006.01) |
| ***H04L 1/00*** | (2006.01) |
| ***G06F 11/10*** | (2006.01) |
| ***H03M 13/00*** | (2006.01) |
| ***H03M 13/15*** | (2006.01) |

(52) U.S. Cl.

CPC .... *H03M 13/1137* (2013.01); *H03M 13/1165* (2013.01); *H03M 13/255* (2013.01); *H03M 13/271* (2013.01); *H03M 13/2757* (2013.01); *H03M 13/2778* (2013.01); *H03M 13/2792* (2013.01); *H03M 13/2906* (2013.01); *H03M 13/356* (2013.01); *H03M 13/616* (2013.01); *H04L 1/00* (2013.01); *H04L 1/0041* (2013.01); *H04L 1/0057* (2013.01); *H04L 1/0058* (2013.01); *H04L 1/0071* (2013.01); *H03M 13/152* (2013.01)

(56) References Cited

U.S. PATENT DOCUMENTS

| | | | | |
|---|---|---|---|---|
| 10,333,550 | B2 | 6/2019 | Ikegaya et al. | |
| 10,454,501 | B2 * | 10/2019 | Ikegaya .............. | H03M 13/271 |
| 10,680,649 | B2 | 6/2020 | Ikegaya et al. | |
| 10,686,470 | B2 * | 6/2020 | Ikegaya .............. | H03M 13/036 |
| 2007/0011570 | A1 | 1/2007 | Jeong et al. | |
| 2011/0090948 | A1 | 4/2011 | Zhou et al. | |
| 2013/0216001 | A1 | 8/2013 | Petrov | |
| 2014/0082452 | A1 | 3/2014 | Shinohara et al. | |
| 2016/0164540 | A1 | 6/2016 | Shinohara et al. | |

FOREIGN PATENT DOCUMENTS

| | | | |
|---|---|---|---|
| EP | 2 560 310 | A1 | 2/2013 |
| EP | 3 148 090 | A1 | 3/2017 |
| JP | 2007-6494 | A | 1/2007 |
| JP | 2011-523318 | A | 8/2011 |
| JP | 2013-5124 | A | 1/2013 |

OTHER PUBLICATIONS

"Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, (Aug. 2009), 78 pages.

"ATSC 3.0 Physical Layer Proposal Rev. 01," Guarneri Communications Ltd., Nov. 17, 2013, 18 pages.

Extended European Search Report dated Apr. 19, 2018 in Patent Application No. 157796840.5, 17 pages.

"Digital Video Broadcasting (DVB); Next Generation broadcasting system to Handheld, physical layer specification (DVB-NGH)", Digital Video Broadcasting, DVB Document A160, Draft ETSI EN 303 105 V1.1.1, XP055248828, Nov. 2012, pp. 3-295 (with cover pages).

"ATSC Candidate Standard: Physical Layer Protocol", Advanced Television Systems Committee, Doc. S32-230r21, XP017846934, Sep. 28, 2015, pp. ii-xiii and 14-228 (with cover page).

Notification of the First Office Action issued in corresponding Chinese Application No. 2015800250368 dated Dec. 28, 2018, 37 pages (with English translation).

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal ENCODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 15
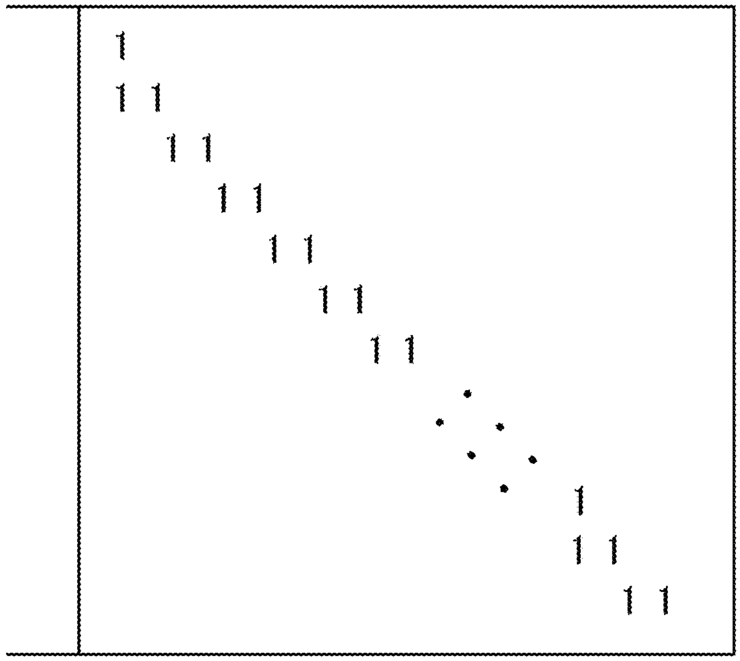
STAIRCASE STRUCTURE OF PARITY MATRIX
A
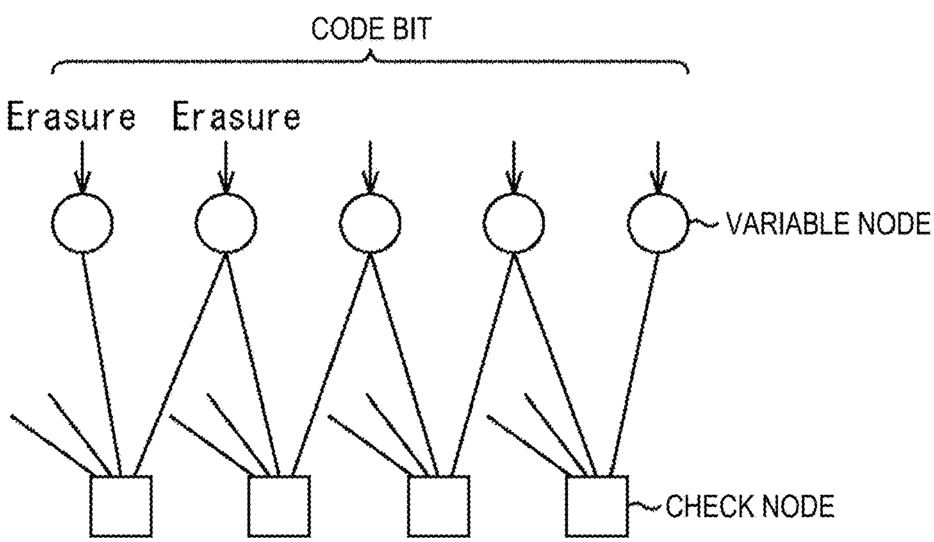
STAIRCASE STRUCTURE PORTION OF Tanner Graph
B

DISPLAY ROW NUMBER OF PARITY CHECK MATRIX (INFORMATION MATRIX $H_A$) FOR EVERY 360 COLUMNS FROM 1ST COLUMN

ROW NUMBER OF PARITY CHECK MATRIX →

1ST COLUMN OF $H_A$ →
361ST COLUMN OF $H_A$ →
721ST COLUMN OF $H_A$ →
1081ST COLUMN OF $H_A$ →

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

$h_{3,5}$ (boxed entry: 2650)

PARITY CHECK MATRIX INITIAL VALUE TABLE

PROVIDED BY CRC/ETRI

FIG. 30

N=16200, rate=8/15

```
  5 519 825 1871 2098 2478 2659 2820 3200 3294 3650 3804 3949 4426 4460 4503 456
8 4590 4949 5219 5662 5738 5905 5911 6160 6404 6637 6708 6737 6814 7263 7412
  81 391 1272 1633 2062 2882 3443 3503 3535 3908 4033 4163 4490 4929 5262 5399 5
576 5768 5910 6331 6430 6844 6867 7201 7274 7290 7343 7350 7378 7387 7440 7554
  105 975 3421 3480 4120 4444 5957 5971 6119 6617 6761 6810 7067 7353
  6 138 485 1444 1512 2615 2990 3109 5604 6435 6513 6632 6704 7507
  20 858 1051 2539 3049 5162 5308 6158 6391 6604 6744 7071 7195 7238
  1140 5838 6203 6748
  6282 6466 6481 6638
  2346 2592 5436 7487
  2219 3897 5896 7528
  2897 6028 7018
  1285 1863 5324
  3075 6005 6466
  5 6020 7551
  2121 3751 7507
  4027 5488 7542
  2 6012 7011
  3823 5531 5687
  1379 2262 5297
  1882 7498 7551
  3749 4806 7227
  2 2074 6898
  17 616 7482
  9 6823 7480
  5195 5880 7559
```

N=16200, rate=10/15

N=16200, rate=12/15

N=64800, rate=7/15

N=64800, rate=9/15

N=64800, rate=11/15

N=64800, rate=13/15

N=64800, rate=6/15

1606 3402 4961 6751 7132 11516 12300 12482 12592 13342 13764 14123 21576 23946 24533 25376 25667 26836 31799 34173 35462 36153 36740 37085 37152 37468 37658
4621 5007 6910 8732 9757 11508 13099 15513 16335 18052 19512 21319 23663 25628 27208 31333 32219 33003 33239 33447 36200 36473 36938 37201 37283 37495 38642
16 1094 2020 3080 4194 5098 5631 6877 7889 8237 9804 10067 11017 11366 13136 13354 15379 18934 20199 24522 26172 28666 30386 32714 36390 37015 37162
700 897 1708 6017 6490 7372 7825 9546 10398 16605 18561 18745 21625 22137 23693 24340 24966 25015 26995 28586 28895 29687 33938 34520 34858 37056 38297
159 2010 2573 3617 4452 4958 5556 5832 6481 8227 9924 10836 14954 15594 16623 18065 19249 22394 22677 23408 23731 24076 24776 27007 28222 30343 38371
3118 3545 4768 4992 5227 6732 8170 9397 10522 11508 15536 20218 21921 28599 29445 29758 29968 31014 32027 33685 34378 35867 36323 36728 36870 38335 38623
1264 4254 6936 9165 9486 9950 10861 11653 13697 13961 15164 15665 18444 19470 20313 21189 24371 26431 26999 28086 28251 29261 31981 34015 35850 36129 37186
111 1307 1628 2041 2524 5358 7988 8191 10322 11905 12919 14127 15515 15711 17061 19024 21195 22902 23727 24401 24608 25111 25228 27338 35398 37794 38196
961 3035 7174 7948 13355 13607 14971 18189 18339 18665 18875 19142 20615 21136 21309 21758 23366 24745 25849 25982 27583 30006 31118 32106 36469 36583 37920
2990 3549 4273 4808 5707 6021 6509 7456 8240 10044 12262 12660 13085 14750 15680 16049 21587 23997 25803 28343 28693 34393 34860 35490 36021 37737 38296
955 4323 5145 6885 8123 9730 11840 12216 19194 20313 23056 24248 24830 25268 26617 26801 28557 29753 30745 31450 31973 32839 33025 33296 35710 37366 37509
264 605 4181 4483 5156 7238 8863 10939 11251 12964 16254 17511 20017 22395 22818 23261 23422 24064 26329 27723 28186 30434 31956 33971 34372 36764 38123
520 2562 2794 3528 3860 4402 5676 6963 8655 9018 9783 11933 16336 17193 17320 19035 20606 23579 23769 24123 24966 27866 32457 34011 34499 36620 37526
10106 10637 10906 34242
1856 15100 19378 21848
943 11191 27806 29411
4575 6359 13629 19383
4476 4953 18782 24313
5441 6381 21840 35943
9638 9763 12546 30120
9587 10626 11047 25700
4088 15298 28768 35047
2332 6363 8782 28863
4625 4933 28298 30289
3541 4918 18257 31746
1221 25233 26757 34892
8150 16677 27934 30021
8500 25016 33043 38070
7374 10207 16189 35811
611 18480 20064 38261
25416 27352 36089 38469
1667 17614 25839 32776
4118 12481 21912 37945
5573 13222 23619 31271
18271 26251 27182 30587
14690 26430 26799 34355

PROVIDED BY Samsung

PROVIDED BY Samsung

FIG. 49

N=64800, rate=8/15

2768 3039 4059 5856 6245 7013 8157 9341 9802 10470 11521 12083 16610 18361 203
21 24601 27420 28206 29788
2739 8244 8891 9157 12624 12973 15534 16622 16919 18402 18780 19854 20220 2054
3 22306 25540 27478 27678 28053
1727 2268 6246 7815 9010 9556 10134 10472 11389 14599 15719 16204 17342 17666
18850 22058 25579 25860 29207
28 1346 3721 5565 7019 9240 12355 13109 14800 16040 16839 17369 17631 19357 19
473 19891 20381 23911 29683
869 2450 4386 5316 6160 7107 10362 11132 11271 13149 16397 16532 17113 19894 2
2043 22784 27383 28615 28804
508 4292 5831 8559 10044 10412 11283 14810 15888 17243 17538 19903 20528 22090
22652 27235 27384 28208 28485
389 2248 5840 6043 7000 9054 11075 11760 12217 12565 13587 15403 19422 19528 2
1493 25142 27777 28566 28702
1015 2002 5764 6777 9346 9629 11039 11153 12690 13068 13990 16841 17702 20021
24106 26300 29332 30081 30196
1480 3084 3467 4401 4798 5187 7851 11368 12323 14325 14546 16360 17158 18010 2
1333 25612 26556 26906 27005
6925 8876 12392 14529 15253 15437 19226 19950 20321 23021 23651 24393 24653 26
668 27205 28269 28529 29041 29292
2547 3404 3538 4666 5126 5468 7695 8799 14732 15072 15881 17410 18971 19609 19
717 22150 24941 27908 29018
888 1581 2311 5511 7218 9107 10454 12252 13662 15714 15894 17025 18671 24304 2
5316 25556 28489 28977 29212
1047 1494 1718 4645 5030 6811 7868 8146 10611 15767 17682 18391 22614 23021 23
763 25478 26491 29088 29757
59 1781 1900 3814 4121 8044 8906 9175 11156 14841 15789 16033 16755 17292 1855
0 19310 22505 29567 29850
1952 3057 4399 9476 10171 10769 11335 11569 15002 19501 20621 22642 23452 2436
0 25109 25290 25828 28505 29122
2895 3070 3437 4764 4905 6670 9244 11845 13352 13573 13975 14600 15871 17996 1
9672 20079 20579 25327 27958
612 1528 2004 4244 4599 4926 5843 7684 10122 10443 12267 14368 18413 19058 229
85 24257 26202 26596 27899
1361 2195 4146 6708 7158 7538 9138 9998 14862 15359 16076 18925 21401 21573 22
503 24146 24247 27778 29312
5229 6235 7134 7655 9139 13527 15408 16058 16705 18320 19909 20901 22238 22437
23654 25131 27550 28247 29903
697 2035 4887 5275 6909 9166 11805 15338 16381 18403 20425 20688 21547 24590 2
5171 26726 28848 29224 29412
5379 17329 22659 23062
11814 14759 22329 22936
2423 2811 10296 12727
8460 15260 16769 17290
14191 14608 29536 30187
7103 10069 20111 22850
4285 15413 26448 29069
548 2137 9189 10928
4581 7077 23382 23949

PROVIDED BY Samsung

PROVIDED BY Samsung

PROVIDED BY Samsung

FIG. 52

N=64800, rate=12/15

584 1472 1621 1867 3338 3568 3723 4185 5126 5889 7737 8632 8940 9725
221 445 590 3779 3835 6939 7743 8280 8448 8491 9367 10042 11242 12917
4662 4837 4900 5029 6449 6687 6751 8684 9936 11681 11811 11886 12089 12909
2418 3018 3647 4210 4473 7447 7502 9490 10067 11092 11139 11256 12201 12383
2591 2947 3349 3406 4417 4519 5176 6672 8498 8863 9201 11294 11376 12184
27 101 197 290 871 1727 3911 5411 6676 8701 9350 10310 10798 12439
1765 1897 2923 3584 3901 4048 6963 7054 7132 9165 10184 10824 11278 12669
2183 3740 4808 5217 5660 6375 6787 8219 8466 9037 10353 10583 11118 12762
73 1594 2146 2715 3501 3572 3639 3725 6959 7187 8406 10120 10507 10691
240 732 1215 2185 2788 2830 3499 3881 4197 4991 6425 7061 9756 10491
831 1568 1828 3424 4319 4516 4639 6018 9702 10203 10417 11240 11518 12458
2024 2970 3048 3638 3676 4152 5284 5779 5926 9426 9945 10873 11787 11837
1049 1218 1651 2328 3493 4363 5750 6483 7613 8782 9738 9803 11744 11937
1193 2060 2289 2964 3478 4592 4756 6709 7162 8231 8326 11140 11908 12243
978 2120 2439 3338 3850 4589 6567 8745 9656 9708 10161 10542 10711 12639
2403 2938 3117 3247 3711 5593 5844 5932 7801 10152 10226 11498 12162 12941
1781 2229 2276 2533 3582 3951 5279 5774 7930 9824 10920 11038 12340 12440
289 384 1980 2230 3464 3873 5958 8656 8942 9006 10175 11425 11745 12530
155 354 1090 1330 2002 2236 3559 3705 4922 5958 6576 8564 9972 12760
303 876 2059 2142 5244 5330 6644 7576 8614 9598 10410 10718 11033 12957
3449 3617 4408 4602 4727 6182 8835 8928 9372 9644 10237 10747 11655 12747
811 2565 2820 8677 8974 9632 11069 11548 11839 12107 12411 12695 12812 12890
972 4123 4943 6385 6449 7339 7477 8379 9177 9359 10074 11709 12552 12831
842 973 1541 2262 2905 5276 6758 7099 7894 8128 8325 8663 8875 10050
474 791 968 3902 4924 4965 5085 5908 6109 6329 7931 9038 9401 10568
1397 4461 4658 5911 6037 7127 7318 8678 8924 9000 9473 9602 10446 12692
1334 7571 12881
1393 1447 7972
633 1257 10597
4843 5102 11056
3294 8015 10513
1108 10374 10546
5353 7824 10111
3398 7674 8569
7719 9478 10503
2997 9418 9581
5777 6519 11229
1966 5214 9899
6 4088 5827
836 9248 9612
483 7229 7548
7865 8289 9804
2915 11098 11900
6180 7096 9481
1431 6786 8924
748 6757 8625
3312 4475 7204
1852 8958 11020
1915 2903 4006

PROVIDED BY Samsung

PROVIDED BY Samsung

PROVIDED BY Samsung

FIG. 55

N=16200, rate=6/15

27 430 519 828 1897 1943 2513 2600 2640 3310 3415 4266 5044 5100 5328 5483 592
8 6204 6392 6416 6602 7019 7415 7623 8112 8485 8724 8994 9445 9667
27 174 188 631 1172 1427 1779 2217 2270 2601 2813 3196 3582 3895 3908 3948 446
3 4955 5120 5809 5988 6478 6604 7096 7673 7735 7795 8925 9613 9670
27 370 617 852 910 1030 1326 1521 1606 2118 2248 2909 3214 3413 3623 3742 3752
4317 4694 5300 5687 6039 6100 6232 6491 6621 6860 7304 8542 8634
990 1753 7635 8540
933 1415 5666 8745
27 6567 8707 9216
2341 8692 9580 9615
260 1092 5839 6080
352 3750 4847 7726
4610 6580 9506 9597
2512 2974 4814 9348
1461 4021 5060 7009
1796 2883 5553 8306
1249 5422 7057
3965 6968 9422
1498 2931 5092
27 1090 6215
26 4232 6354

PROVIDED BY LGE

FIG. 56

N=16200, rate=7/15

553 742 901 1327 1544 2179 2519 3131 3280 3603 3789 3792 4253 5340 5934 5962 6004 6698 7793 8001 8058 8126 8276 8559
503 590 598 1185 1266 1336 1806 2473 3021 3356 3490 3680 3936 4501 4659 5891 6132 6340 6602 7447 8007 8045 8059 8249
795 831 947 1330 1502 2041 2328 2513 2814 2829 4048 4802 6044 6109 6461 6777 6800 7099 7126 8095 8428 8519 8556 8610
601 787 899 1757 2259 2518 2783 2816 2823 2949 3396 4330 4494 4684 4700 4837 4881 4975 5130 5464 6554 6912 7094 8297
4229 5628 7917 7992
1506 3374 4174 5547
4275 5650 8208 8533
1504 1747 3433 6345
3659 6955 7575 7852
607 3002 4913 6453
3533 6860 7895 8048
4094 6366 8314
2206 4513 5411
32 3882 5149
389 3121 4626
1308 4419 6520
2092 2373 6849
1815 3679 7152
3582 3979 6948
1049 2135 3754
2276 4442 6591

PROVIDED BY LGE

FIG. 57

N=16200, rate=9/15

212 255 540 967 1033 1517 1538 3124 3408 3800 4373 4864 4905 5163 5177 6186
275 660 1351 2211 2876 3063 3433 4088 4273 4544 4618 4632 5548 6101 6111 6136
279 335 494 865 1662 1681 3414 3775 4252 4595 5272 5471 5796 5907 5986 6008
345 352 3094 3188 4297 4338 4490 4865 5303 6477
222 681 1218 3169 3850 4878 4954 5666 6001 6237
172 512 1536 1559 2179 2227 3334 4049 6464
716 934 1694 2890 3276 3608 4332 4468 5945
1133 1593 1825 2571 3017 4251 5221 5639 5845
1076 1222 6465
159 5064 6078
374 4073 5357
2833 5526 5845
1594 3639 5419
1028 1392 4239
115 622 2175
300 1748 6245
2724 3276 5349
1433 6117 6448
485 663 4955
711 1132 4315
177 3266 4339
1171 4841 4982
33 1584 3692
2820 3485 4249
1716 2428 3125
250 2275 6338
108 1719 4961

PROVIDED BY LGE

FIG. 58

N=16200, rate=11/15

49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401

PROVIDED BY LGE

FIG. 59

N=16200, rate=13/15

71 334 645 779 786 1124 1131 1267 1379 1554 1766 1798 1939
6 183 364 506 512 922 972 981 1039 1121 1537 1840 2111
6 71 153 204 253 268 781 799 873 1118 1194 1661 2036
6 247 353 581 921 940 1108 1146 1208 1268 1511 1527 1671
6 37 466 548 747 1142 1203 1271 1512 1516 1837 1904 2125
6 171 863 953 1025 1244 1378 1396 1723 1783 1816 1914 2121
1268 1360 1647 1769
6 458 1231 1414
183 535 1244 1277
107 360 498 1456
6 2007 2059 2120
1480 1523 1670 1927
139 573 711 1790
6 1541 1889 2023
6 374 957 1174
287 423 872 1285
6 1809 1918
65 818 1396
590 766 2107
192 814 1843
775 1163 1256
42 735 1415
334 1008 2055
109 596 1785
406 534 1852
684 719 1543
401 465 1040
112 392 621
82 897 1950
887 1962 2125
793 1088 2159
723 919 1139
610 839 1302
218 1080 1816
627 1646 1749
496 1165 1741
916 1055 1662
182 722 945
5 595 1674

PROVIDED BY LGE

FIG. 60

N=64800, rate=10/15

316 1271 3692 9495 12147 12849 14928 16671 16938 17864 19108 20502 21097 21115
2341 2559 2643 2816 2865 5137 5331 7000 7523 8023 10439 10797 13208 15041
5556 6858 7677 10162 10207 11349 12321 12398 14787 15743 15859 15952 19313 208
79
349 573 910 2702 3654 6214 9246 9353 10638 11772 14447 14953 16620 19888
204 1390 2887 3835 6230 6533 7443 7876 9299 10291 10896 13960 18287 20086
541 2429 2838 7144 8523 8637 10490 10585 11074 12074 15762 16812 17900 18548
733 1659 3838 5323 5805 7882 9429 10682 13697 16909 18846 19587 19592 20904
1134 2136 4631 4653 4718 5197 10410 11666 14996 15305 16048 17417 18960 20303
734 1001 1283 4959 10016 10176 10973 11578 12051 15550 15915 19022 19430 20121
745 4057 5855 9885 10594 10989 13156 13219 13351 13631 13685 14577 17713 20386
968 1446 2130 2502 3092 3787 5323 8104 8418 9998 11681 13972 17747 17929
3020 3857 5275 5786 6319 8608 11943 14062 17144 17752 18001 18453 19311 21414
709 747 1038 2181 5320 8292 10584 10859 13964 15009 15277 16953 20675 21509
1663 3247 5003 5760 7186 7360 10346 14211 14717 14792 15155 16128 17355 17970
516 578 1914 6147 9419 11148 11434 13289 13325 13332 19106 19257 20962 21556
5009 5632 6531 9430 9886 10621 11765 13969 16178 16413 18110 18249 20616 20759
457 2686 3318 4608 5620 5858 6480 7430 9602 12691 14664 18777 20152 20848
33 2877 5334 6851 7907 8654 10688 15401 16123 17942 17969 18747 18931 20224
87 897 7636 8663 11425 12288 12672 14199 16435 17615 17950 18953 19667 20281
1042 1832 2545 2719 2947 3672 3700 6249 6398 6833 11114 14283 17694 20477
326 488 2662 2880 3009 5357 6587 8882 11604 14374 18781 19051 19057 20508
854 1294 2436 2852 4903 6466 7761 9072 9564 10321 13638 15658 16946 19119
194 899 1711 2408 2786 5391 7108 8079 8716 11453 17303 19484 20989 21389
1631 3121 3994 5005 7810 8850 10315 10589 13407 17162 18624 18758 19311 20301
736 2424 4792 5600 6370 10061 16053 16775 18600
1254 8163 8876 9157 12141 14587 16545 17175 18191
388 6641 8974 10607 10716 14477 16825 17191 18400
5578 6082 6824 7360 7745 8655 11402 11665 12428
3603 8729 13463 14698 15210 19112 19550 20727 21052
48 1732 3805 5158 15442 16909 19854 21071 21579
11707 14014 21531
1542 4133 4925
10083 13505 21198
14300 15765 16752
778 1237 11215
1325 3199 14534
2007 14510 20599
1996 5881 16429
5111 15018 15980
4989 10681 12810
3763 10715 16515
2259 10080 15642
9032 11319 21305
3915 15213 20884
11150 15022 20201
1147 6749 19625
12139 12939 18870
3840 4634 10244

PROVIDED BY LGE

PROVIDED BY LGE

PROVIDED BY LGE

FIG. 63

N=64800, rate=9/15

218 592 1116 2229 2989 3217 3922 4338 5063 7196 8516 9168 10774 12013 12355 12
485 13238 13315 13365 15102 16325 16379 17222 17866 19091 21096 21677 22183 2288
4 23023 23059 23295 23694 24888 25755
142 556 754 1359 1813 2861 3733 4015 4103 4137 4590 5431 7423 8429 9924 10043
11764 12672 13476 14250 15182 15575 15835 16093 16893 17014 17993 18328 19778 20
782 22151 22347 23841 25434 25647
8 1287 1813 2927 4094 4691 5599 7087 7503 8777 9100 11299 11310 12283 12638 12
774 12983 13161 13750 13899 14093 14581 15066 18310 19537 21141 21530 21920 2272
6 23080 23250 23588 23749 25129 25493
170 2231 2273 4646 5468 5912 7624 7804 8019 8715 9157 10173 10978 13144 14209
14508 15118 15510 16699 17285 18189 18842 19164 19242 19568 20657 20745 22599 22
754 24105 24136 24644 25091 25259 25476
611 3593 5689 5980 6779 7830 8200 8420 8701 10161 10601 10863 11251 11540 1230
6 12364 12396 13247 13256 13454 13683 13810 13912 14254 14665 15530 16749 18022
21173 21359 21564 21860 23562 23936 25873
225 490 1197 1357 2322 3436 3759 5720 5886 10068 10994 12476 13186 13403 13774
14376 14505 14946 15555 16515 17068 17581 18317 19533 19993 20376 20597 21656 2
3103 23230 23860 24883 25100 25576 25835
910 1479 3144 3600 4255 5851 6277 6587 7337 8562 9592 11428 11534 12127 12452
13565 14336 15311 15470 16915 17520 18194 18324 18385 18575 19627 20126 20219 21
108 21294 22218 22466 22541 23614 24218
120 6693 11582 11756 14656 16088 24473 24811
990 3571 8517 10259 14187 15732 17864 23697
2366 5536 8236 14281 16178 19247 25431 25641
9056 10221 16011 17287 22095 22694 23634 24541
1138 3241 4444 11816 14651 17585 20317 24036
3166 5421 7828 11855 13148 16492 22830 25181
3644 5858 7555 12551 14018 15716 20181 20877
3405 7546 10508 12355 12455 16386 22014 22846
5305 12878 13734 15949 16747 17458 18068 23552
2717 4365 5192 9626 11487 17811 24163 25201
4705 5787 12649 14298 15570 19876 23193 24688
3394 4960 9629 11445 19031 23128 23563 25774
1648 4768 8372 11388 11448 13373 14773 15814
4043 10049 13225 14765 18206 19663 20316 25534
8820 15709 17949 18383 18624 19746 23307 25346
221 10075 12281 13163 16430 18834 20637 21646
264 296 2837 4856 9223 10324 16336 18557
4532 7935 12782 16508 17549 21310 23929 24846
5143 5666 6753 8248 12394 13840 14926 15611
4289 9811 10826 11025 11425 15567 20767 25246
1826 4386 6372 6698 7467 20479 23360 24751
740 1873 3727 8628 11803 21326 24482 25134
315 664 2026 10700 12624 21194 24678 24802
8431 9604 11559 12120 19557 21047 21161 21584
6275 8787 9830 10580 12795 15287 20794 21063
3780 7735 9717 10410 14334 19217 24239 24857
4214 9796 10451 17817 18072 18697 19265 24591
2497 5485 6337 10065 13070 14240 20115 23668

PROVIDED BY NERC

PROVIDED BY NERC

PROVIDED BY NERC

FIG. 66

N=16200, rate=5/15

69 244 706 5145 5994 6066 6763 6815 8509
257 541 618 3933 6188 7048 7484 8424 9104
69 500 536 1494 1669 7075 7553 8202 10305
11 189 340 2103 3199 6775 7471 7918 10530
333 400 434 1806 3264 5693 8534 9274 10344
111 129 260 3562 3676 3680 3809 5169 7308 8280
100 303 342 3133 3952 4226 4713 5053 5717 9931
83 87 374 828 2460 4943 6311 8657 9272 9571
114 166 325 2680 4698 7703 7886 8791 9978 10684
281 542 549 1671 3178 3955 7153 7432 9052 10219
202 271 608 3860 4173 4203 5169 6871 8113 9757
16 359 419 3333 4198 4737 6170 7987 9573 10095
235 244 584 4640 5007 5563 6029 6816 7678 9968
123 449 646 2460 3845 4161 6610 7245 7686 8651
136 231 468 835 2622 3292 5158 5294 6584 9926
3085 4683 8191 9027 9922 9928 10550
2462 3185 3976 4091 8089 8772 9342

PROVIDED BY CRC/ETRI

FIG. 67

N=64800, rate=5/15

221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649

PROVIDED BY CRC/ETRI

PROVIDED BY CRC/ETRI

FIG. 69

N=64800, rate=6/15

71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753
99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943
103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382
346 423 806 5669 7668 8789 9928 19724 24039 27893
48 460 1055 3512 7389 7549 20216 22180 28221 35437
187 636 824 1678 4508 13588 19683 21750 30311 33480

PROVIDED BY CRC/ETRI

PROVIDED BY CRC/ETRI

FIG. 71

N=64800, rate=7/15

460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281

PROVIDED BY CRC/ETRI

PROVIDED BY CRC/ETRI

CODE LENGTH : N=16200

ENCODING RATE : {8, 10, 12}/15

| Rate | PERFORMANCE THRESHOLD VALUE (Es/N0) | MINIMUM CYCLE LENGTHS |
|---|---|---|
| 8/15 | 0. 805765 | 6 |
| 10/15 | 2. 471011 | 6 |
| 12/15 | 4. 269922 | 6 |

| Rate | X1 | KX1 | X2 | KX2 | Y1 | KY1 | Y2 | KY2 | M |
|---|---|---|---|---|---|---|---|---|---|
| 8/15 | 32 | 720 | 14 | 1080 | 4 | 1440 | 3 | 5400 | 7560 |
| 10/15 | 25 | 720 | 14 | 1440 | 4 | 360 | 3 | 8280 | 5400 |
| 12/15 | 14 | 2160 | — | 0 | 4 | 720 | 3 | 10080 | 3240 |

CODE LENGTH : N=64800

ENCODING RATE : {7, 9, 11, 13}/15

| Rate | PERFORMANCE THRESHOLD VALUE (Es/N0) | MINIMUM CYCLE LENGTHS |
|---|---|---|
| 7/15 | -0.093751 | 6 |
| 9/15 | 1.658523 | 8 |
| 11/15 | 3.351930 | 6 |
| 13/15 | 5.301749 | 6 |

| Rate | X1 | KX1 | X2 | KX2 | Y1 | KY1 | Y2 | KY2 | M |
|---|---|---|---|---|---|---|---|---|---|
| 7/15 | 33 | 2160 | 15 | 5040 | 4 | 0 | 3 | 23040 | 34560 |
| 9/15 | 19 | 6840 | — | 0 | 4 | 6840 | 3 | 25200 | 25920 |
| 11/15 | 15 | 8280 | — | 0 | 4 | 2520 | 3 | 36720 | 17280 |
| 13/15 | 13 | 9360 | — | 0 | 4 | 360 | 3 | 46440 | 8640 |

CODE LENGTH : N=64800
ENCODING RATE : {6, 8, 12} /15

| Rate | X1 | KX1 | X2 | KX2 | Y1 | KY1 | Y2 | KY2 | M |
|---|---|---|---|---|---|---|---|---|---|
| 6/15 | 27 | 4680 | — | 0 | 4 | 13680 | 3 | 7560 | 38880 |
| 8/15 | 19 | 7200 | — | 0 | 4 | 5760 | 3 | 21600 | 30240 |
| 12/15 | 14 | 9360 | — | 0 | 4 | 0 | 3 | 42480 | 12960 |

PROVIDED BY Samsung

CODE LENGTH : N=16200

ENCODING RATE : {6, 7, 9, 11, 13} /15

| Rate | X1 | KX1 | X2 | KX2 | Y1 | KY1 | Y2 | KY2 | M |
|---|---|---|---|---|---|---|---|---|---|
| 6/15 | 30 | 1080 | – | – | 4 | 3600 | 3 | 1800 | 9720 |
| 7/15 | 24 | 1440 | – | – | 4 | 2520 | 3 | 3600 | 8640 |
| 9/15 | 16 | 1080 | 10 | 720 | 9 | 1080 | 3 | 6840 | 6480 |
| 11/15 | 12 | 2520 | – | – | – | – | 3 | 9360 | 4320 |
| 13/15 | 13 | 2160 | – | – | 4 | 3600 | 3 | 8280 | 2160 |

PROVIDED BY LGE

CODE LENGTH : N=64800

ENCODING RATE : 10/15

| Rate | X1 | KX1 | X2 | KX2 | Y1 | KY1 | Y2 | KY2 | M |
|---|---|---|---|---|---|---|---|---|---|
| 10/15 | 14 | 8640 | 9 | 2160 | 4 | 0 | 3 | 32400 | 21600 |

PROVIDED BY LGE

CODE LENGTH : N=64800

ENCODING RATE : 9/15

| Rate | X1 | KX1 | X2 | KX2 | Y1 | KY1 | Y2 | KY2 | M |
|---|---|---|---|---|---|---|---|---|---|
| 9/15 | 35 | 2520 | 8 | 11520 | 4 | 1080 | 3 | 23760 | 25920 |

PROVIDED BY NERC

CODE LENGTH : N=16200

ENCODING RATE : 5/15

| Rate | N | K | N-K | g | Q1 | Q2 |
|---|---|---|---|---|---|---|
| 5/15 | 16200 | 5400 | 10800 | 720 | 2 | 28 |

※Q1=g/360, Q2=(N-K-g)/360

PROVIDED BY CRC/ETRI

CODE LENGTH : N=64800

ENCODING RATE : {5, 6, 7}/15

| Rate | N | K | N-K | M1 | M2 | Q1 | Q2 |
|---|---|---|---|---|---|---|---|
| 5/15 | 64800 | 21600 | 43200 | 1440 | 41760 | 4 | 116 |
| 6/15 | 64800 | 25920 | 38880 | 1080 | 37800 | 3 | 105 |
| 7/15 | 64800 | 30240 | 34560 | 1080 | 33480 | 3 | 93 |

※M1=g, M2=N-K-g, Q1=M1/360, Q2=M2/360

PROVIDED BY CRC/ETRI

FIG. 84
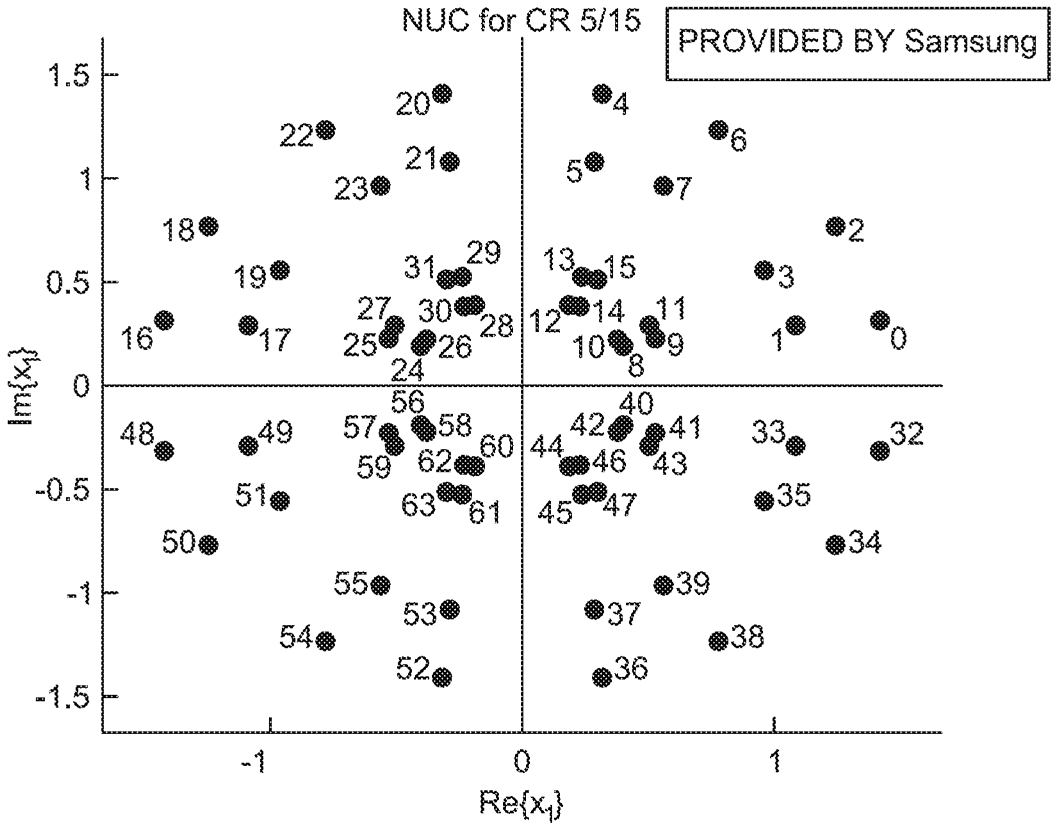
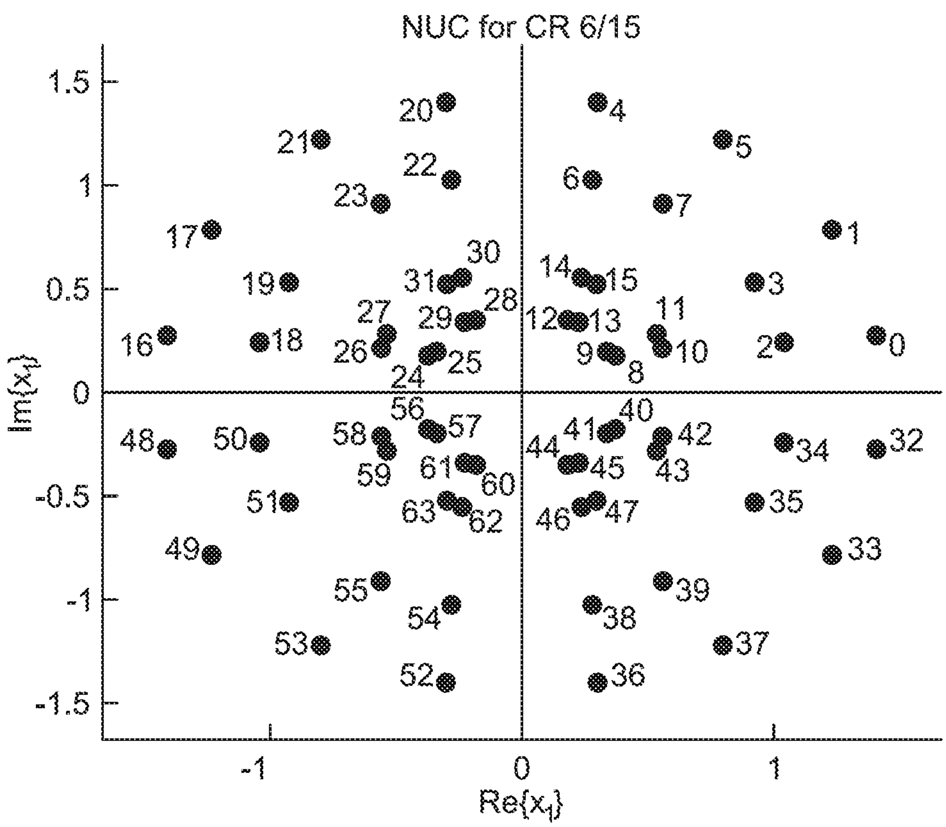

FIG. 84 (Cont'd)
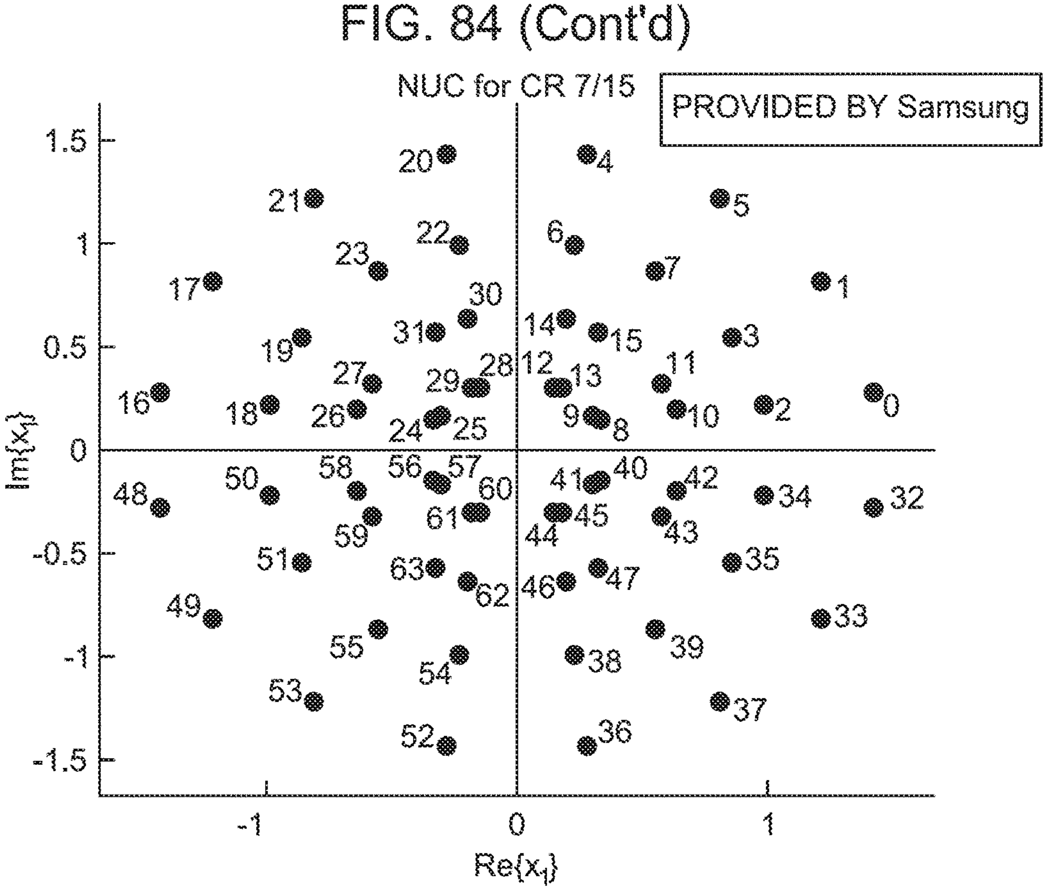
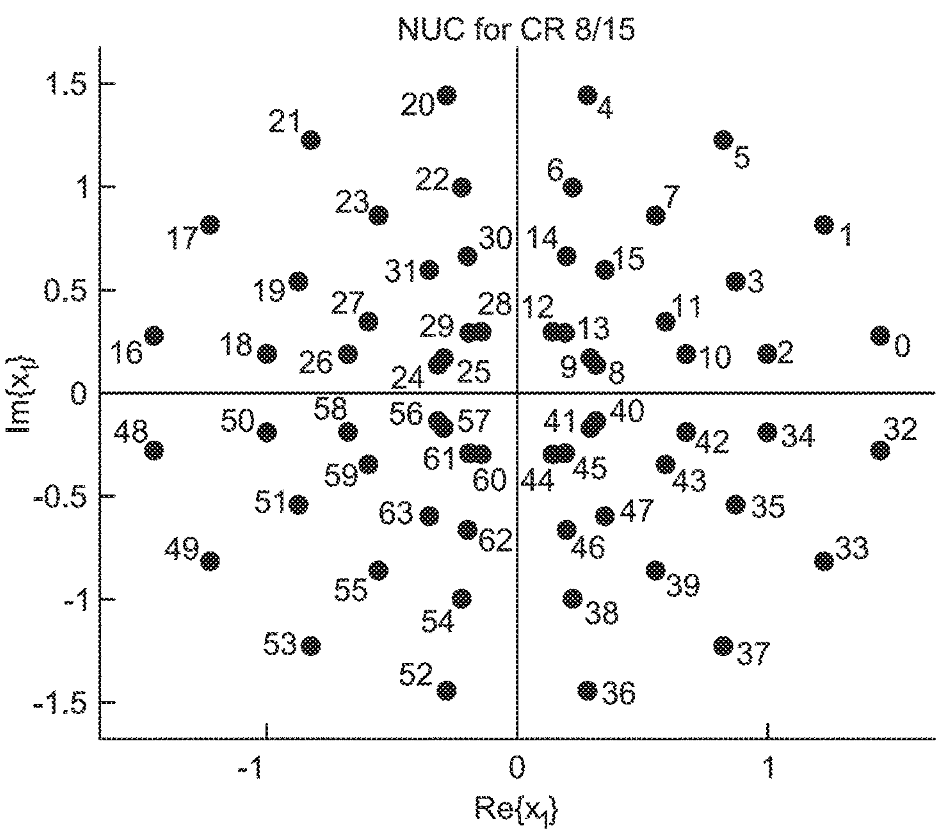

FIG. 84 (Cont'd)
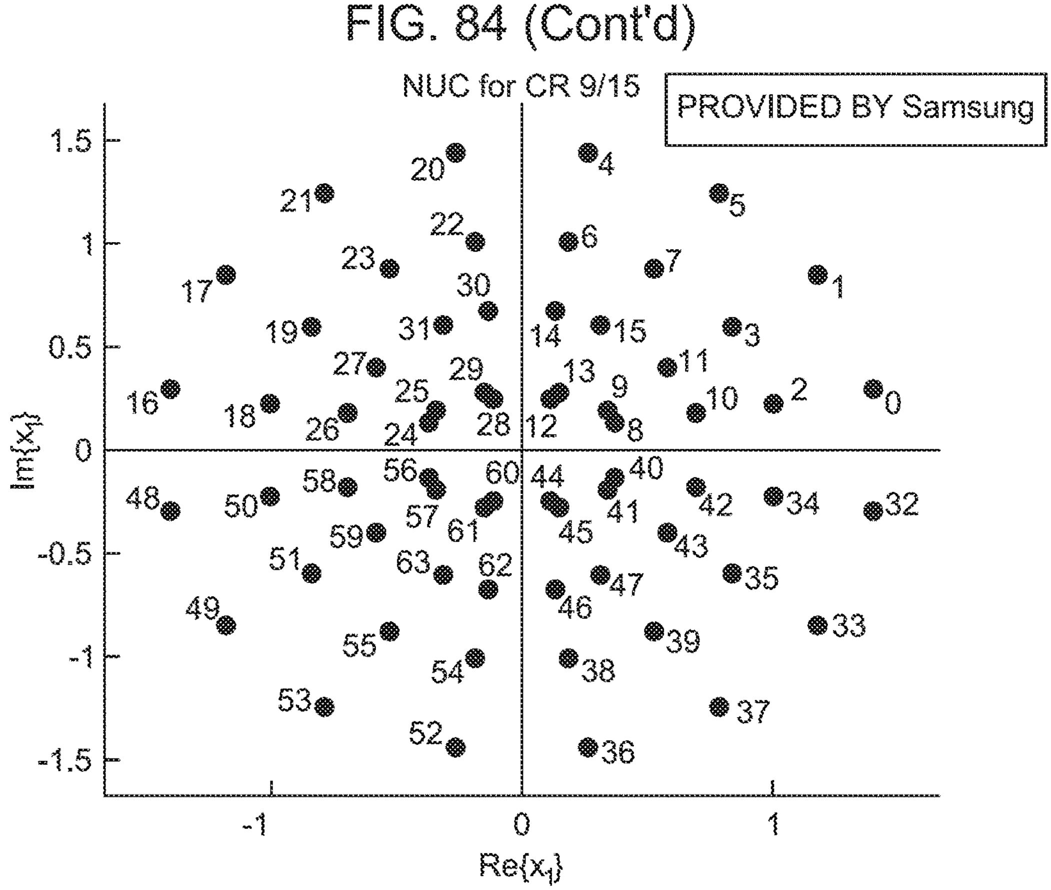
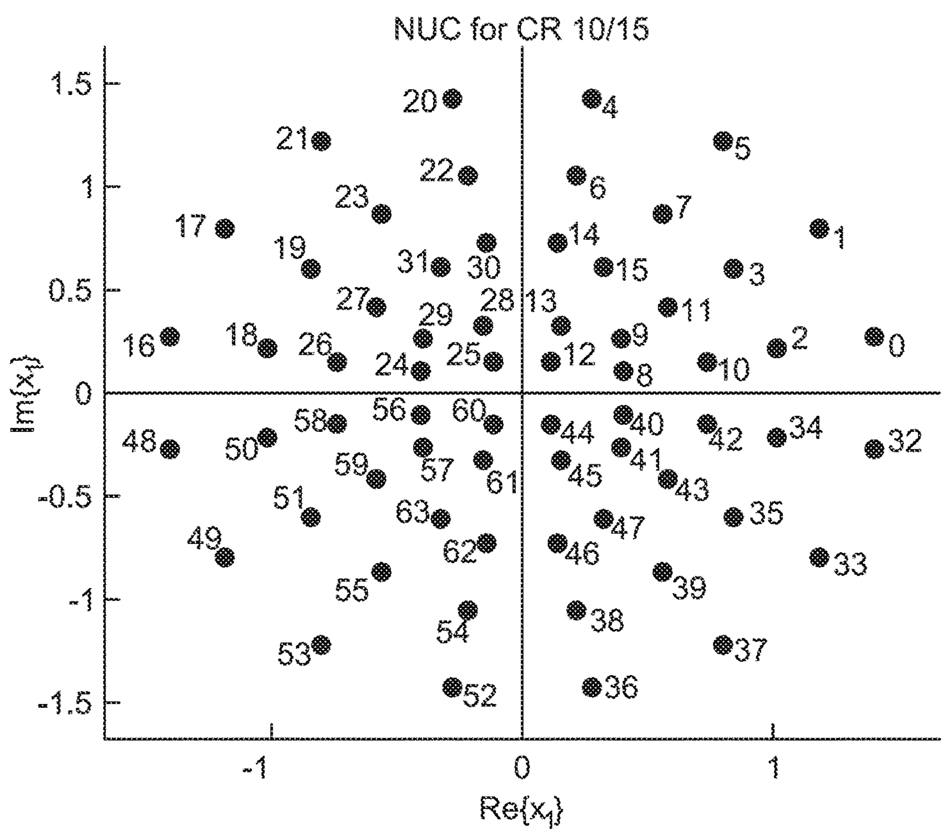

FIG. 85 (Cont'd)
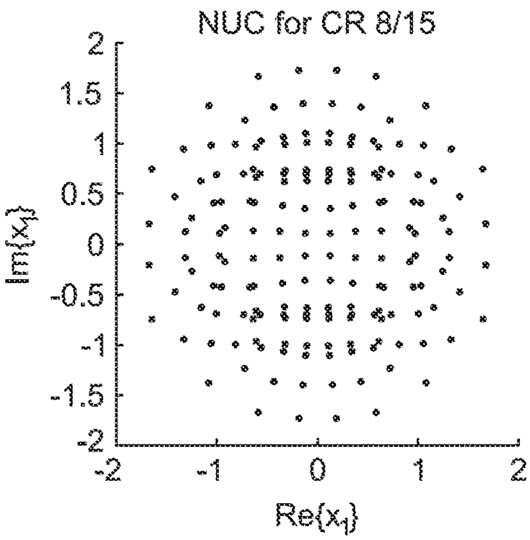
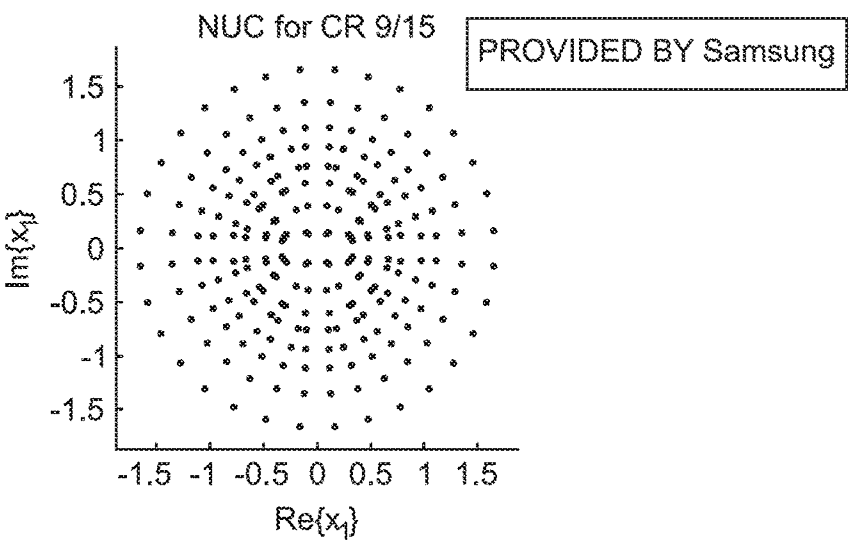
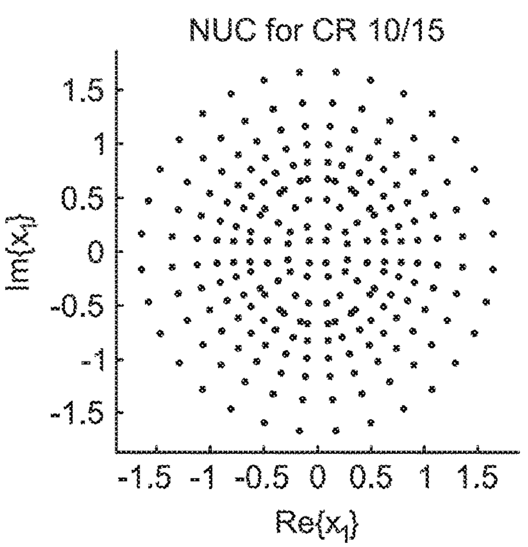

FIG. 85 (Cont'd)
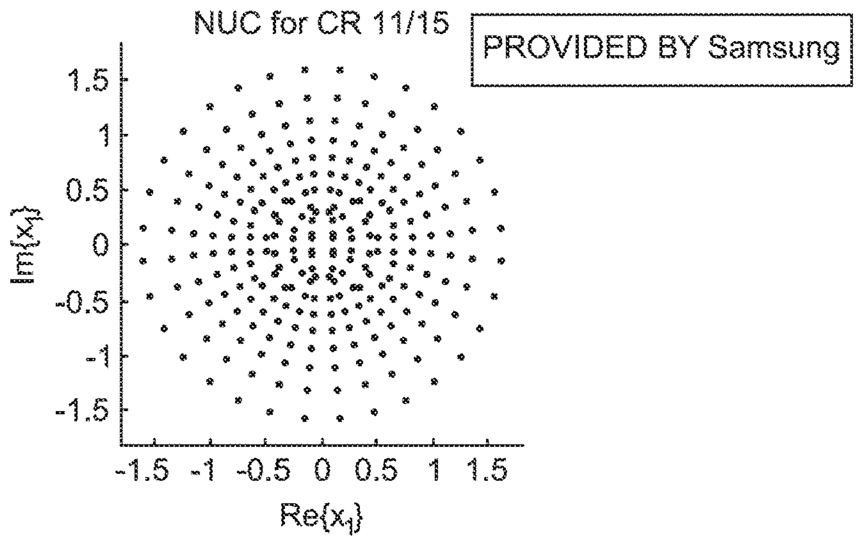
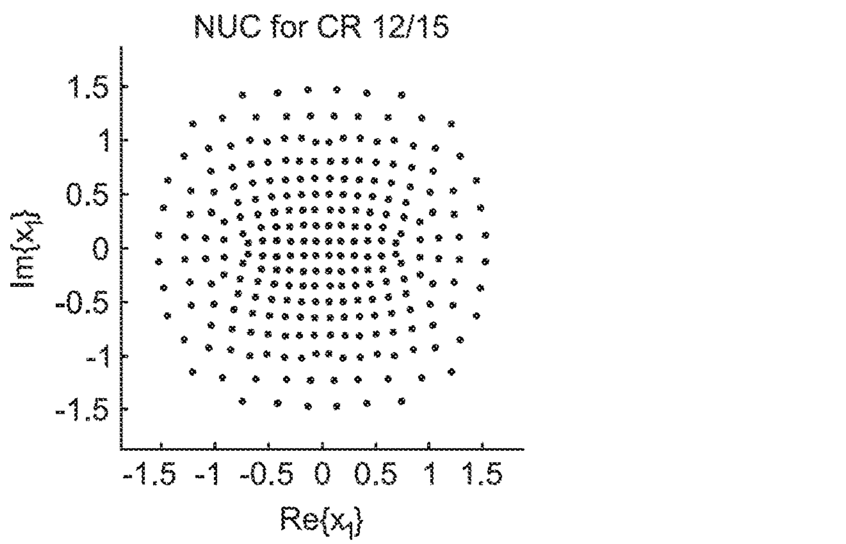
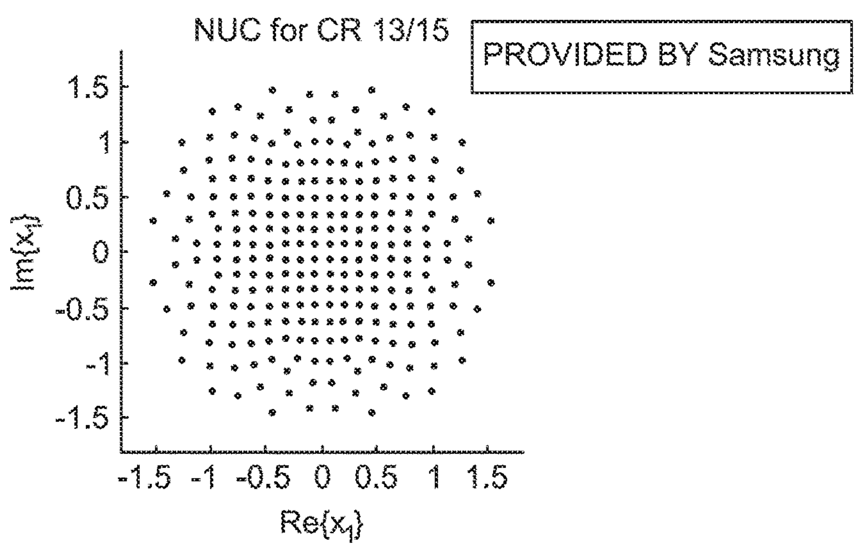

PROVIDED BY Samsung

FIG. 86 (Cont'd)
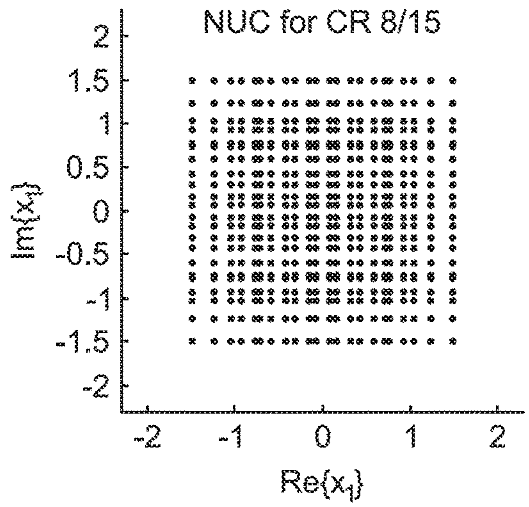
PROVIDED BY Samsung
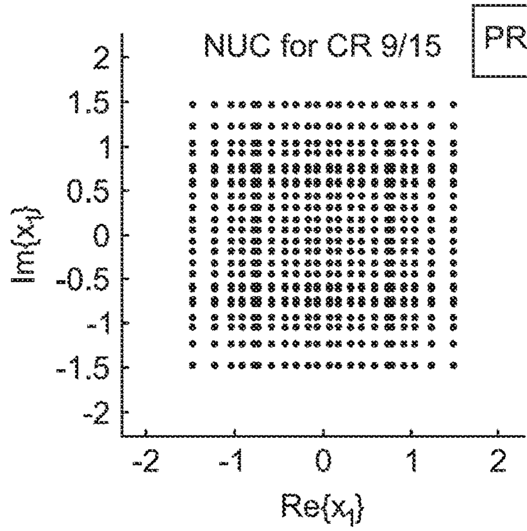
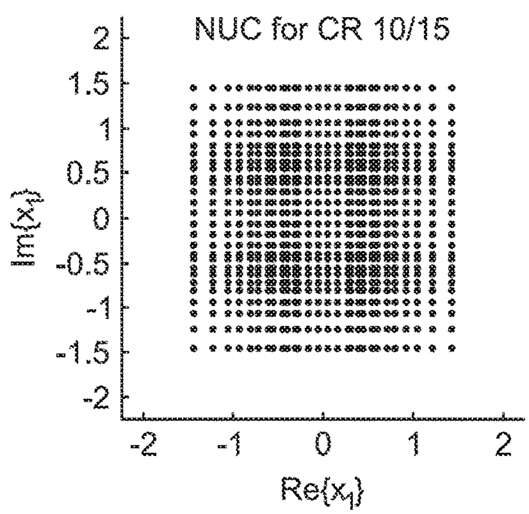

FIG. 86 (Cont'd)
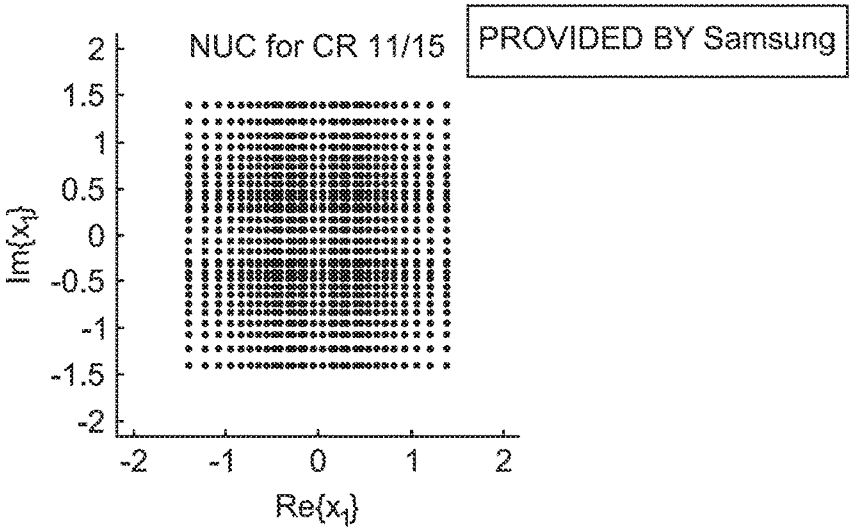
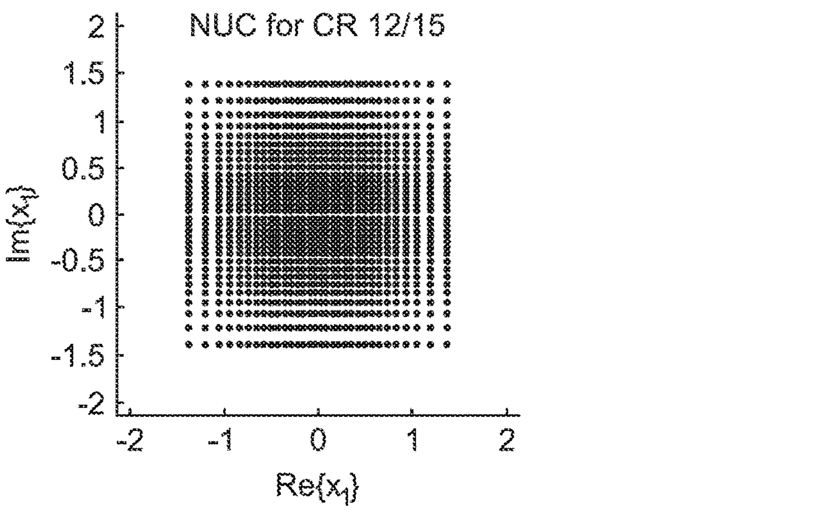
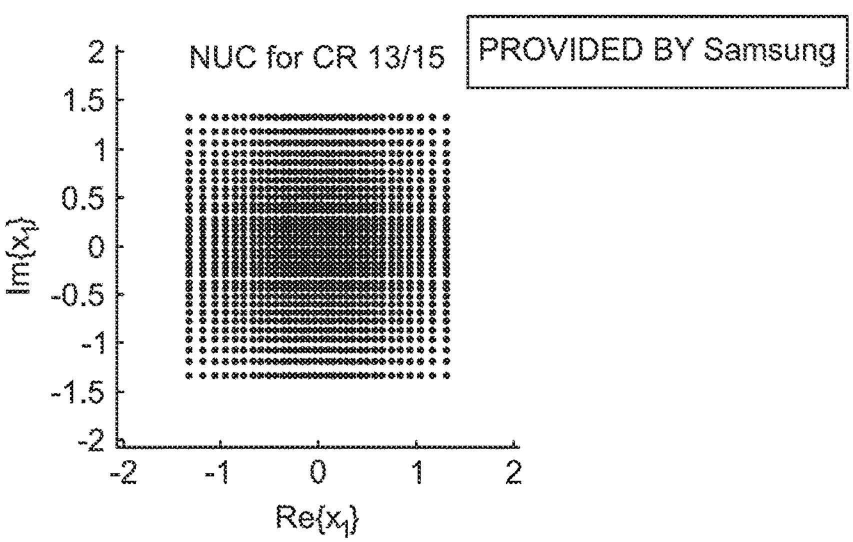

FIG. 89

| Input cell word y | Constellation point zq |
|---|---|
| (00) | $(1+1i)/\sqrt{2}$ |
| (01) | $(1-1i)/\sqrt{2}$ |
| (10) | $(-1+1i)/\sqrt{2}$ |
| (11) | $(-1-1i)/\sqrt{2}$ |

FIG. 90

| w/Shape | NUC_16_5/15 | NUC_16_6/15 | NUC_16_7/15 | NUC_16_8/15 |
|---|---|---|---|---|
| w0 | 0.5309 + 1.1928i | 0.5115 + 1.2092i | 0.5029 + 1.1949i | 0.4951 + 1.2068i |
| w1 | 1.1928 + 0.5309i | 1.2092 + 0.5115i | 1.1962 + 0.5050i | 1.2068 + 0.4951i |
| w2 | 0.2842 + 0.4633i | 0.2663 + 0.4530i | 0.2632 + 0.4959i | 0.2575 + 0.4819i |
| w3 | 0.4633 + 0.2842i | 0.4530 + 0.2663i | 0.4993 + 0.2625i | 0.4819 + 0.2575i |

| w/Shape | NUC_16_9/15 | NUC_16_10/15 | NUC_16_11/15 | NUC_16_12/15 | NUC_16_13/15 |
|---|---|---|---|---|---|
| w0 | 0.4967 + 1.1932i | 0.4487 + 1.1657i | 0.9342 + 0.9847i | 0.9555 + 0.9555i | 0.9517 + 0.9511i |
| w1 | 1.1896 + 0.4896i | 1.2080 + 0.5377i | 0.9866 + 0.2903i | 0.9555 + 0.2949i | 0.9524 + 0.3061i |
| w2 | 0.2452 + 0.5326i | 0.2213 + 0.4416i | 0.2716 + 0.9325i | 0.2949 + 0.9555i | 0.3067 + 0.9524i |
| w3 | 0.5210 + 0.2440i | 0.6186 + 0.2544i | 0.2901 + 0.2695i | 0.2949 + 0.2949i | 0.3061 + 0.3067i |

FIG. 91

| w/Shape | NUC_64_5/15 | NUC_64_6/15 | NUC_64_7/15 | NUC_64_8/15 |
|---|---|---|---|---|
| w0 | 1.4327+0.3305i | 1.4521+0.3005i | 1.4865+0.2932i | 1.4827+0.2920i |
| w1 | 1.0909+0.2971i | 1.2657+0.8178i | 1.2618+0.8446i | 1.2563+0.8411i |
| w2 | 1.2484+0.7803i | 1.0666+0.2744i | 1.0271+0.2345i | 1.0211+0.2174i |
| w3 | 0.9762+0.5715i | 0.9500+0.5641i | 0.8976+0.5624i | 0.8798+0.5702i |
| w4 | 0.3309+1.4326i | 0.3011+1.4529i | 0.2943+1.4811i | 0.2920+1.4827i |
| w5 | 0.2979+1.0923i | 0.8202+1.2651i | 0.8402+1.2602i | 0.8410+1.2563i |
| w6 | 0.7829+1.2477i | 0.2750+1.0676i | 0.2356+1.0261i | 0.2174+1.0211i |
| w7 | 0.5739+0.9763i | 0.5656+0.9499i | 0.5632+0.8957i | 0.5702+0.8798i |
| w8 | 0.3901+0.2112i | 0.3553+0.1948i | 0.3147+0.1567i | 0.3040+0.1475i |
| w9 | 0.5317+0.2475i | 0.3569+0.2094i | 0.3116+0.1730i | 0.3028+0.1691i |
| w10 | 0.3945+0.2289i | 0.5596+0.2431i | 0.6512+0.2053i | 0.6855+0.1871i |
| w11 | 0.5236+0.2894i | 0.5410+0.3002i | 0.5965+0.3353i | 0.6126+0.3563i |
| w12 | 0.2108+0.3911i | 0.1946+0.3566i | 0.1567+0.3125i | 0.1475+0.3040i |
| w13 | 0.2475+0.5327i | 0.2094+0.3579i | 0.1733+0.3091i | 0.1691+0.3028i |
| w14 | 0.2287+0.3955i | 0.2430+0.5607i | 0.2056+0.6506i | 0.1871+0.6855i |
| w15 | 0.2898+0.5246i | 0.3004+0.5417i | 0.3364+0.5943i | 0.3563+0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 1.4678+0.3029i | 1.4388+0.2878i | 1.4443+0.2683i | 1.4480+0.2403i | 1.4303+0.2329i |
| w1 | 1.2296+0.8500i | 1.2150+0.8133i | 0.7471+1.2243i | 0.6406+1.1995i | 0.6297+1.1818i |
| w2 | 1.0496+0.2245i | 1.0386+0.2219i | 1.1749+0.7734i | 1.0952+0.9115i | 1.0803+0.9154i |
| w3 | 0.8739+0.6079i | 0.8494+0.6145i | 0.7138+0.8201i | 0.6868+0.8108i | 0.6870+0.8095i |
| w4 | 0.2834+1.4645i | 0.2931+1.4656i | 0.1638+1.0769i | 1.0500+0.1642i | 1.0444+0.1681i |
| w5 | 0.8084+1.2532i | 0.8230+1.2278i | 0.2927+1.4217i | 0.7170+0.1473i | 0.7240+0.1548i |
| w6 | 0.2038+1.0260i | 0.2069+1.0649i | 0.1462+0.7457i | 1.0519+0.5188i | 1.0553+0.5250i |
| w7 | 0.5574+0.8905i | 0.5677+0.8971i | 0.4134+0.7408i | 0.7146+0.4532i | 0.7142+0.4710i |
| w8 | 0.3884+0.1313i | 0.4119+0.1177i | 1.0203+0.1517i | 0.1677+1.0405i | 0.2114+1.4305i |
| w9 | 0.3771+0.1914i | 0.3998+0.2516i | 0.6653+0.1357i | 0.2402+1.4087i | 0.2020+1.0575i |
| w10 | 0.7243+0.1752i | 0.7442+0.1559i | 0.9639+0.4465i | 0.1369+0.7073i | 0.1221+0.6613i |
| w11 | 0.6116+0.4008i | 0.5954+0.4328i | 0.6746+0.4339i | 0.4044+0.7057i | 0.3735+0.7557i |
| w12 | 0.1358+0.2445i | 0.1166+0.1678i | 0.1271+0.1428i | 0.1374+0.1295i | 0.1455+0.1275i |
| w13 | 0.1677+0.2860i | 0.1582+0.3325i | 0.3782+0.1406i | 0.4185+0.1357i | 0.4322+0.1389i |
| w14 | 0.1555+0.6756i | 0.1355+0.7408i | 0.1311+0.4288i | 0.1325+0.3998i | 0.1432+0.3852i |
| w15 | 0.3472+0.6007i | 0.3227+0.6200i | 0.3919+0.4276i | 0.4122+0.4120i | 0.4220+0.4278i |

FIG. 92

| w/Shape | NUC_256_5/15 | NUC_256_6/15 | NUC_256_7/15 | NUC_256_8/15 |
|---|---|---|---|---|
| w0 | 0.3454+1.7407 i | 0.6800+1.6926 i | 0.1256+0.2068 i | 1.0804+1.3788 i |
| w1 | 0.2848+1.4216 i | 0.3911+1.3645 i | 0.1255+0.2077 i | 1.0487+0.9862 i |
| w2 | 0.2900+1.4190 i | 0.2191+1.7524 i | 0.1265+0.2240 i | 1.6464+0.7428 i |
| w3 | 0.2737+1.3492 i | 0.2274+1.4208 i | 0.1264+0.2247 i | 1.3245+0.9414 i |
| w4 | 0.9875+1.4751 i | 0.8678+1.2487 i | 0.1557+0.2325 i | 0.7198+1.2427 i |
| w5 | 0.8056+1.2096 i | 0.7275+1.1667 i | 0.1555+0.2328 i | 0.8106+1.0040 i |
| w6 | 0.8024+1.2105 i | 0.8747+1.0470 i | 0.1594+0.2446 i | 0.5595+1.0317 i |
| w7 | 0.7633+1.1501 i | 0.7930+1.0406 i | 0.1590+0.2447 i | 0.6118+0.9722 i |
| w8 | 0.2418+1.0058 i | 0.2098+0.9768 i | 0.1383+0.6402 i | 1.6768+0.2002 i |
| w9 | 0.2421+1.0268 i | 0.2241+1.0454 i | 0.1417+0.6402 i | 0.9997+0.6844 i |
| w10 | 0.2430+1.0263 i | 0.1858+1.9878 i | 0.1344+0.6027 i | 1.4212+0.4769 i |
| w11 | 0.2435+1.0473 i | 0.1901+1.0659 i | 0.1366+0.6023 i | 1.1479+0.6312 i |
| w12 | 0.5466+0.8834 i | 0.5547+0.8312 i | 0.3330+0.5769 i | 0.6079+0.6566 i |
| w13 | 0.5600+0.8986 i | 0.5479+0.8651 i | 0.3228+0.5787 i | 0.7284+0.6957 i |
| w14 | 0.5596+0.8990 i | 0.6073+0.8182 i | 0.3099+0.5483 i | 0.5724+0.7031 i |
| w15 | 0.5732+0.9141 i | 0.5955+0.8420 i | 0.3017+0.5493 i | 0.6302+0.7259 i |
| w16 | 1.7419+0.3438 i | 1.4070+0.1790 i | 0.4168+0.1173 i | 0.1457+1.4010 i |
| w17 | 1.4213+0.2870 i | 1.7227+0.2900 i | 0.4168+0.1185 i | 0.1866+1.7346 i |
| w18 | 1.4197+0.2879 i | 1.3246+0.2562 i | 0.4205+0.1200 i | 0.1174+1.1035 i |
| w19 | 1.3494+0.2745 i | 1.3636+0.3854 i | 0.4202+0.1215 i | 0.1095+1.0132 i |
| w20 | 1.4793+0.9855 i | 1.3708+1.2834 i | 0.3852+0.1797 i | 0.4357+1.3636 i |
| w21 | 1.2123+0.8007 i | 1.6701+0.8403 i | 0.3860+0.1803 i | 0.5853+1.6820 i |
| w22 | 1.2118+0.7988 i | 1.1614+0.7909 i | 0.3867+0.1760 i | 0.3439+1.0689 i |
| w23 | 1.1521+0.7597 i | 1.2241+0.7367 i | 0.3879+0.1765 i | 0.3234+0.9962 i |
| w24 | 1.0044+0.2394 i | 0.9769+0.1863 i | 0.7366+0.1528 i | 0.1092+0.6174 i |
| w25 | 1.0250+0.2403 i | 0.9452+0.2057 i | 0.7255+0.1884 i | 0.1074+0.6307 i |
| w26 | 1.0252+0.2408 i | 1.0100+0.2182 i | 0.7219+0.1535 i | 0.1109+0.6996 i |
| w27 | 1.0460+0.2418 i | 0.9795+0.2417 i | 0.7117+0.1857 i | 0.1076+0.7345 i |
| w28 | 0.8845+0.5424 i | 0.8241+0.4856 i | 0.5825+0.4149 i | 0.3291+0.6264 i |
| w29 | 0.8997+0.5562 i | 0.8232+0.4837 i | 0.6012+0.4001 i | 0.3126+0.6373 i |
| w30 | 0.9000+0.5558 i | 0.8799+0.5391 i | 0.5715+0.3988 i | 0.3392+0.6999 i |
| w31 | 0.9148+0.5690 i | 0.8796+0.5356 i | 0.5889+0.3864 i | 0.3202+0.7282 i |

FIG. 92 (Cont'd)

| | | | | |
|---|---|---|---|---|
| w32 | 0.1617+0.3255 i | 0.1376+0.3342 i | 0.1671+1.7095 i | 0.9652+0.1066 i |
| w33 | 0.1624+0.3255 i | 0.1383+0.3292 i | 0.4420+1.6137 i | 0.9075+0.1666 i |
| w34 | 0.1624+0.3255 i | 0.1363+0.3322 i | 0.1477+1.3374 i | 0.9724+0.1171 i |
| w35 | 0.1621+0.3256 i | 0.1370+0.3273 i | 0.3135+1.3073 i | 0.9186+0.1752 i |
| w36 | 0.1790+0.3237 i | 0.1655+0.3265 i | 1.0214+1.3784 i | 0.6342+0.1372 i |
| w37 | 0.1789+0.3238 i | 0.1656+0.3227 i | 0.7434+1.5169 i | 0.6550+0.1495 i |
| w38 | 0.1791+0.3239 i | 0.1634+0.3246 i | 0.7869+1.1040 i | 0.6290+0.1393 i |
| w39 | 0.1791+0.3240 i | 0.1636+0.3208 i | 0.6252+1.2041 i | 0.6494+0.1504 i |
| w40 | 0.2113+0.6188 i | 0.1779+0.6841 i | 0.1526+1.9140 i | 1.3127+0.1240 i |
| w41 | 0.2119+0.6257 i | 0.1828+0.6845 i | 0.1914+0.9087 i | 0.9572+0.4344 i |
| w42 | 0.2122+0.6254 i | 0.1745+0.6828 i | 0.1539+1.0179 i | 1.2403+0.2631 i |
| w43 | 0.2127+0.6319 i | 0.1793+0.6829 i | 0.2095+1.0084 i | 1.0254+0.4130 i |
| w44 | 0.3178+0.5735 i | 0.3547+0.6009 i | 0.5021+0.7976 i | 0.6096+0.4214 i |
| w45 | 0.3218+0.5787 i | 0.3593+0.6011 i | 0.4537+0.8238 i | 0.6773+0.4284 i |
| w46 | 0.3215+0.5788 i | 0.3576+0.5990 i | 0.5663+0.8802 i | 0.5995+0.4102 i |
| w47 | 0.3257+0.5842 i | 0.3624+0.5994 i | 0.5021+0.9146 i | 0.6531+0.4101 i |
| w48 | 0.3188+0.1624 i | 0.2697+0.1443 i | 1.7030+0.1913 i | 0.1250+0.1153 i |
| w49 | 0.3195+0.1623 i | 0.2704+0.1433 i | 1.6116+0.5458 i | 0.1252+0.1158 i |
| w50 | 0.3195+0.1624 i | 0.2644+0.1442 i | 1.3788+0.1641 i | 0.1245+0.1152 i |
| w51 | 0.3201+0.1623 i | 0.2650+0.1432 i | 1.3121+0.4320 i | 0.1247+0.1156 i |
| w52 | 0.3184+0.1783 i | 0.2763+0.1638 i | 1.2722+1.1406 i | 0.3768+0.1244 i |
| w53 | 0.3196+0.1785 i | 0.2768+0.1626 i | 1.4536+0.8623 i | 0.3707+0.1237 i |
| w54 | 0.3189+0.1791 i | 0.2715+0.1630 i | 1.0204+0.9076 i | 0.3779+0.1260 i |
| w55 | 0.3200+0.1794 i | 0.2719+0.1618 i | 1.1634+0.7212 i | 0.3717+0.1252 i |
| w56 | 0.6175+0.2099 i | 0.6488+0.1696 i | 0.9979+0.1554 i | 0.1161+0.3693 i |
| w57 | 0.6234+0.2098 i | 0.6462+0.1706 i | 0.9681+0.2706 i | 0.1157+0.3645 i |
| w58 | 0.6230+0.2110 i | 0.6456+0.1745 i | 1.0796+0.1672 i | 0.1176+0.3469 i |
| w59 | 0.6291+0.2117 i | 0.6431+0.1753 i | 1.0514+0.3095 i | 0.1171+0.3424 i |
| w60 | 0.5729+0.3146 i | 0.5854+0.3186 i | 0.7488+0.6179 i | 0.3530+0.3899 i |
| w61 | 0.5781+0.3186 i | 0.5862+0.3167 i | 0.8017+0.5596 i | 0.3422+0.3808 i |
| w62 | 0.5779+0.3188 i | 0.5864+0.3275 i | 0.8168+0.6803 i | 0.3614+0.3755 i |
| w63 | 0.5831+0.3226 i | 0.5873+0.3254 i | 0.8882+0.5928 i | 0.3509+0.3656 i |

FIG. 93

| w/Shape | NUC_256_9/15 | NUC_256_10/15 | NUC_256_11/15 | NUC_256_12/15 | NUC_256_13/15 |
|---|---|---|---|---|---|
| w0 | 0.0899+0.1337 i | 1.6097+0.1548 i | 0.0591+0.3040 i | 1.1980+1.1541 i | 1.5315+0.2812 i |
| w1 | 0.0910+0.1377 i | 1.5549+0.4605 i | 0.1067+0.3390 i | 0.9192+1.2082 i | 0.9982+1.2680 i |
| w2 | 0.0873+0.3862 i | 1.3226+0.1290 i | 0.0687+0.4930 i | 1.2778+0.8523 i | 1.2623+0.9828 i |
| w3 | 0.0883+0.3873 i | 1.2772+0.3829 i | 0.1491+0.4654 i | 1.0390+0.9253 i | 1.0130+1.0317 i |
| w4 | 0.1115+0.1442 i | 1.2753+1.0242 i | 0.0887+0.2236 i | 0.6057+1.2200 i | 0.5551+1.2232 i |
| w5 | 0.1135+0.1472 i | 1.4434+0.7540 i | 0.1828+0.2696 i | 0.7371+1.4217 i | 0.7500+1.3030i |
| w6 | 0.2067+0.3591 i | 1.0491+0.8476 i | 0.3356+0.3853 i | 0.6678+1.0021 i | 0.6087+1.0227 i |
| w7 | 0.1975+0.3621 i | 1.1861+0.6253 i | 0.2702+0.3881 i | 0.8412+0.9448 i | 0.7948+1.0535 i |
| w8 | 0.1048+0.7533 i | 0.9326+0.0970 i | 0.0835+0.7880 i | 1.2128+0.5373 i | 1.4036+0.5215 i |
| w9 | 0.1770+0.7412 i | 0.8962+0.2804 i | 0.2394+0.7591 i | 1.0048+0.5165 i | 0.9890+0.6534 i |
| w10 | 0.1022+0.5904 i | 1.1044+0.1102 i | 0.0760+0.6412 i | 1.4321+0.6343 i | 1.2520+0.7351 i |
| w11 | 0.1191+0.5890 i | 1.0648+0.3267 i | 0.1987+0.6157 i | 1.0245+0.7152 i | 1.0227+0.8252 i |
| w12 | 0.4264+0.6230 i | 0.7325+0.6071 i | 0.5245+0.6123 i | 0.6384+0.6073 i | 0.6403+0.6582 i |
| w13 | 0.3650+0.6689 i | 0.8260+0.4559 i | 0.3927+0.6985 i | 0.8175+0.5684 i | 0.8060+0.6652 i |
| w14 | 0.3254+0.5153 i | 0.8744+0.7153 i | 0.4287+0.4942 i | 0.6568+0.7801 i | 0.6373+0.8319 i |
| w15 | 0.2959+0.5302 i | 0.9882+0.5300 i | 0.3318+0.5634 i | 0.8311+0.7459 i | 0.8148+0.8469 i |
| w16 | 0.3256+0.0768 i | 0.1646+1.6407 i | 0.0989+0.0607 i | 0.1349+1.4742 i | 0.0862+1.1910 i |
| w17 | 0.3266+0.0870 i | 0.4867+1.5743 i | 0.2630+0.0643 i | 0.1105+1.2309 i | 0.1233+1.4227 i |
| w18 | 0.4721+0.0994 i | 0.1363+1.3579 i | 0.4932+0.0751 i | 0.0634+0.9796 i | 0.0755+0.9944 i |
| w19 | 0.4721+0.1206 i | 0.4023+1.3026 i | 0.4161+0.0867 i | 0.1891+1.0198 i | 0.2181+0.9629 i |

FIG. 93 (Cont'd)

| | | | | | |
|---|---|---|---|---|---|
| w20 | 0.2927+0.1267 i | 1.0542+1.2584 i | 0.0968+0.0986 i | 0.4142+1.4461 i | 0.4487+1.4550 i |
| w21 | 0.2947+0.1296 i | 0.7875+1.4450 i | 0.2399+0.1452 i | 0.3323+1.2279 i | 0.3074+1.2765 i |
| w22 | 0.3823+0.2592 i | 0.8687+1.0407 i | 0.4202+0.2731 i | 0.4998+0.9827 i | 0.4457+0.9767 i |
| w23 | 0.3944+0.2521 i | 0.6502+1.1951 i | 0.3814+0.2140 i | 0.3467+1.0202 i | 0.3244+1.0818 i |
| w24 | 0.7755+0.1118 i | 0.0982+0.9745 i | 0.8082+0.0772 i | 0.0680+0.6501 i | 0.0654+0.6354 i |
| w25 | 0.7513+0.2154 i | 0.2842+0.9344 i | 0.7885+0.2238 i | 0.2016+0.6464 i | 0.1971+0.6324 i |
| w26 | 0.6591+0.1033 i | 0.1142+1.1448 i | 0.6399+0.0777 i | 0.0719+0.8075 i | 0.0669+0.8037 i |
| w27 | 0.6446+0.1737 i | 0.3385+1.0973 i | 0.6420+0.1790 i | 0.2088+0.8146 i | 0.2018+0.7966 i |
| w28 | 0.5906+0.4930 i | 0.6062+0.7465 i | 0.6417+0.5007 i | 0.4809+0.6296 i | 0.4855+0.6442 i |
| w29 | 0.6538+0.4155 i | 0.4607+0.8538 i | 0.7299+0.3774 i | 0.3374+0.6412 i | 0.3382+0.6322 i |
| w30 | 0.4981+0.3921 i | 0.7263+0.8764 i | 0.5309+0.3792 i | 0.4955+0.8008 i | 0.4757+0.8090 i |
| w31 | 0.5373+0.3586 i | 0.5450+1.0067 i | 0.5944+0.3031 i | 0.3431+0.8141 i | 0.3361+0.7848 i |
| w32 | 0.1630+1.6621 i | 0.2655+0.0746 i | 0.1546+1.5857 i | 1.2731+0.1108 i | 1.1297+0.0851 i |
| w33 | 0.4720+1.5898 i | 0.2664+0.0759 i | 0.4570+1.5271 i | 1.0794+0.0977 i | 0.9487+0.0716 i |
| w34 | 0.1268+1.3488 i | 0.4571+0.0852 i | 0.1299+1.3237 i | 1.5126+0.1256 i | 1.3237+0.1117 i |
| w35 | 0.3752+1.2961 i | 0.4516+0.1062 i | 0.3843+1.2747 i | 0.9029+0.0853 i | 0.9393+0.2065 i |
| w36 | 1.0398+1.2991 i | 0.2559+0.1790 i | 1.0096+1.2448 i | 0.5429+0.0694 i | 0.6190+0.0700 i |
| w37 | 0.7733+1.4772 i | 0.2586+0.1772 i | 0.7469+1.4138 i | 0.6795+0.0559 i | 0.7738+0.0686 i |
| w38 | 0.8380+1.0552 i | 0.3592+0.2811 i | 0.8493+1.0396 i | 0.5628+0.1945 i | 0.6220+0.2081 i |
| w39 | 0.6242+1.2081 i | 0.3728+0.2654 i | 0.6271+1.1808 i | 0.7326+0.1410 i | 0.7757+0.2088 i |
| w40 | 0.1103+0.9397 i | 0.7706+0.0922 i | 0.0962+0.9482 i | 1.2283+0.3217 i | 1.1814+0.4884 i |
| w41 | 0.2415+0.9155 i | 0.7407+0.2260 i | 0.2825+0.9136 i | 1.0269+0.3261 i | 0.9824+0.4891 i |

FIG. 93 (Cont'd)

| | | | | | |
|---|---|---|---|---|---|
| w42 | 0.1118+1.1163 i | 0.6180+0.0927 i | 0.1111+1.1188 i | 1.4663+0.3716 i | 1.1993+0.3009 i |
| w43 | 0.3079+1.0866 i | 0.6019+0.1658 i | 0.3278+1.0767 i | 0.9085+0.2470 i | 0.9901+0.3353 i |
| w44 | 0.5647+0.7638 i | 0.6007+0.4980 i | 0.6212+0.7418 i | 0.6160+0.4549 i | 0.6359+0.4984 i |
| w45 | 0.4385+0.8433 i | 0.6673+0.3928 i | 0.4618+0.8431 i | 0.7818+0.4247 i | 0.8014+0.4986 i |
| w46 | 0.6846+0.8841 i | 0.4786+0.3935 i | 0.7246+0.8784 i | 0.5938+0.3170 i | 0.6291+0.3515 i |
| w47 | 0.5165+1.0034 i | 0.5176+0.3391 i | 0.5361+0.9967 i | 0.7600+0.2850 i | 0.7895+0.3529 i |
| w48 | 1.6489+0.1630 i | 0.0757+0.1003 i | 1.6072+0.1609 i | 0.0595+0.0707 i | 0.0671+0.0678 i |
| w49 | 1.5848+0.4983 i | 0.0753+0.1004 i | 1.5432+0.4731 i | 0.1722+0.0706 i | 0.1990+0.0681 i |
| w50 | 1.3437+0.1389 i | 0.0777+0.4788 i | 1.3489+0.1333 i | 0.0599+0.2119 i | 0.0672+0.2013 i |
| w51 | 1.2850+0.4025 i | 0.0867+0.4754 i | 1.2954+0.3928 i | 0.1748+0.2114 i | 0.2001+0.2020 i |
| w52 | 1.2728+1.0661 i | 0.1023+0.2243 i | 1.2390+1.0268 i | 0.4134+0.0701 i | 0.4732+0.0691 i |
| w53 | 1.4509+0.7925 i | 0.1010+0.2242 i | 1.4186+0.7656 i | 0.2935+0.0705 i | 0.3357+0.0687 i |
| w54 | 1.0249+0.8794 i | 0.1950+0.3919 i | 1.0410+0.8559 i | 0.4231+0.2066 i | 0.4760+0.2065 i |
| w55 | 1.1758+0.6545 i | 0.1881+0.3969 i | 1.1906+0.6386 i | 0.2979+0.2100 i | 0.3369+0.2036 i |
| w56 | 0.9629+0.1113 i | 0.0930+0.8122 i | 0.9742+0.0932 i | 0.0638+0.5002 i | 0.0662+0.4806 i |
| w57 | 0.9226+0.2849 i | 0.2215+0.7840 i | 0.9407+0.2747 i | 0.1905+0.4966 i | 0.1986+0.4811 i |
| w58 | 1.1062+0.1118 i | 0.0937+0.6514 i | 1.1464+0.1111 i | 0.0612+0.3552 i | 0.0673+0.3384 i |
| w59 | 1.0674+0.3393 i | 0.1540+0.6366 i | 1.1015+0.3295 i | 0.1810+0.3533 i | 0.1996+0.3401 i |
| w60 | 0.7234+0.6223 i | 0.4810+0.6306 i | 0.7601+0.6105 i | 0.4630+0.4764 i | 0.4830+0.4908 i |
| w61 | 0.8211+0.4860 i | 0.3856+0.7037 i | 0.8677+0.4536 i | 0.3231+0.4895 i | 0.3383+0.4845 i |
| w62 | 0.8457+0.7260 i | 0.3527+0.5230 i | 0.8874+0.7222 i | 0.4416+0.3397 i | 0.4783+0.3476 i |
| w63 | 0.9640+0.5518 i | 0.3100+0.5559 i | 1.0145+0.5366 i | 0.3083+0.3490 i | 0.3375+0.3430 i |

FIG. 94

| u/Shape | NUC_1k_5/15 | NUC_1k_6/15 | NUC_1k_7/15 | NUC_1k_8/15 | NUC_1k_9/15 | NUC_1k_10/15 | NUC_1k_11/15 | NUC_1k_12/15 | NUC_1k_13/15 |
|---|---|---|---|---|---|---|---|---|---|
| u1 | 0.9997 | 1.0003 | 0.9963 | 1.0005 | 1.0011 | 1.0772 | 1.2776 | 2.5983 | 2.9754 |
| u2 | 0.9916 | 1.0149 | 1.1928 | 2.0897 | 2.7364 | 2.8011 | 3.2278 | 4.5193 | 4.9976 |
| u3 | 0.9911 | 1.0158 | 1.1963 | 2.0888 | 2.7353 | 2.9634 | 3.6845 | 6.1649 | 7.0187 |
| u4 | 2.4349 | 2.6848 | 3.0187 | 3.9945 | 4.7973 | 4.8127 | 5.5155 | 8.2107 | 9.1029 |
| u5 | 2.4346 | 2.6903 | 3.0304 | 3.9931 | 4.7912 | 5.1864 | 6.3531 | 9.9594 | 11.2221 |
| u6 | 2.486 | 2.882 | 3.6381 | 5.3843 | 6.7638 | 6.7838 | 8.0757 | 12.0321 | 13.4239 |
| u7 | 2.4864 | 2.8747 | 3.6181 | 5.3894 | 6.7793 | 7.5029 | 9.3579 | 13.9574 | 15.6992 |
| u8 | 4.4576 | 4.7815 | 5.5244 | 7.5206 | 9.0009 | 9.2380 | 11.0655 | 16.2598 | 18.0937 |
| u9 | 4.4646 | 4.7619 | 5.4955 | 7.6013 | 9.1536 | 10.3200 | 12.7075 | 18.4269 | 20.6137 |
| u10 | 4.9706 | 5.5779 | 6.7182 | 9.3371 | 11.3648 | 12.0115 | 14.5719 | 20.9273 | 23.2898 |
| u11 | 4.9552 | 5.6434 | 6.9391 | 9.8429 | 12.0321 | 13.5356 | 16.5813 | 23.4863 | 26.1557 |
| u12 | 6.7222 | 7.3854 | 8.7621 | 11.9255 | 14.393 | 15.6099 | 18.8402 | 26.4823 | 29.2399 |
| u13 | 7.0327 | 7.8797 | 9.6592 | 13.3962 | 16.1857 | 17.7524 | 21.3824 | 29.7085 | 32.5936 |
| u14 | 8.5382 | 9.635 | 11.7195 | 15.8981 | 19.1014 | 20.5256 | 24.2862 | 33.6247 | 36.309 |
| u15 | 10.4411 | 11.7874 | 14.3731 | 19.1591 | 22.8664 | 24.1254 | 27.7376 | 38.5854 | 40.584 |

| | | | | | | | | | | | | | | | | |
|---|---|---|---|---|---|---|---|---|---|---|---|---|---|---|---|---|
| y0, q | 1 | 1 | 1 | 1 | 1 | 1 | 1 | 1 | 1 | 1 | 1 | 1 | 1 | 1 | 1 | 1 |
| y2, q | 0 | 0 | 0 | 0 | 0 | 0 | 0 | 0 | 1 | 1 | 1 | 1 | 1 | 1 | 1 | 1 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 |
| Y0, q | 0 | 0 | 0 | 0 | 0 | 0 | 0 | 0 | 0 | 0 | 0 | 0 | 0 | 0 | 0 | 0 |
| y2, q | 1 | 1 | 1 | 1 | 1 | 1 | 1 | 1 | 0 | 0 | 0 | 0 | 0 | 0 | 0 | 0 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| $Re(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| y1, q | 1 | 1 | 1 | 1 | 1 | 1 | 1 | 1 | 1 | 1 | 1 | 1 | 1 | 1 | 1 | 1 |
| y3, q | 0 | 0 | 0 | 0 | 0 | 0 | 0 | 0 | 1 | 1 | 1 | 1 | 1 | 1 | 1 | 1 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 |
| y1, q | 0 | 0 | 0 | 0 | 0 | 0 | 0 | 0 | 0 | 0 | 0 | 0 | 0 | 0 | 0 | 0 |
| y3, q | 1 | 1 | 1 | 1 | 1 | 1 | 1 | 1 | 0 | 0 | 0 | 0 | 0 | 0 | 0 | 0 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| $Im(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 96

| u/code rate | 5/15 | 6/15 | 7/15 | 8/15 | 9/15 | 10/15 | 11/15 | 12/15 | 13/15 |
|---|---|---|---|---|---|---|---|---|---|
| u1 | 1.0004 | 0.9998 | 0.9988 | 0.9999 | 0.9999 | 1.0009 | 1.0043 | 2.031 | 2.7135 |
| u2 | 1.0009 | 0.9984 | 0.9996 | 1.0004 | 1.0364 | 2.272 | 2.7379 | 3.8448 | 4.6426 |
| u3 | 1.0008 | 0.9983 | 0.998 | 1.0013 | 1.037 | 2.2732 | 2.746 | 4.8763 | 6.3617 |
| u4 | 0.9953 | 1.2356 | 2.0374 | 2.5341 | 2.7604 | 4.1332 | 4.6828 | 6.8402 | 8.3598 |
| u5 | 0.9956 | 1.2354 | 2.0374 | 2.5347 | 2.7604 | 4.1327 | 4.7079 | 7.912 | 10.0999 |
| u6 | 0.9956 | 1.2372 | 2.0374 | 2.5328 | 2.8536 | 5.4651 | 6.4365 | 9.7373 | 12.0627 |
| u7 | 0.9957 | 1.2366 | 2.0366 | 2.5362 | 2.8534 | 5.4655 | 6.5065 | 10.8859 | 13.8413 |
| u8 | 2.5769 | 2.9864 | 3.93 | 4.5077 | 4.7342 | 7.4777 | 8.4445 | 12.8891 | 15.9032 |
| u9 | 2.5774 | 2.9867 | 3.931 | 4.5089 | 4.7345 | 7.478 | 8.6065 | 14.1091 | 17.7263 |
| u10 | 2.5794 | 2.9906 | 3.9297 | 4.5202 | 5.0028 | 8.9382 | 10.254 | 15.9704 | 19.7625 |
| u11 | 2.5793 | 2.9912 | 3.9294 | 4.5204 | 5.0025 | 8.9384 | 10.5627 | 17.2797 | 21.6431 |
| u12 | 2.6756 | 3.5858 | 5.277 | 6.2318 | 6.6184 | 10.9166 | 12.3025 | 19.2948 | 23.7857 |
| u13 | 2.6764 | 3.5859 | 5.2757 | 6.2314 | 6.6189 | 10.9185 | 12.8281 | 20.7185 | 25.7402 |
| u14 | 2.6747 | 3.577 | 5.2792 | 6.3219 | 7.215 | 12.5855 | 14.3539 | 22.6727 | 27.9051 |
| u15 | 2.6746 | 3.5775 | 5.2795 | 6.3212 | 7.2149 | 12.5908 | 15.1126 | 24.2439 | 29.9595 |
| u16 | 4.6252 | 5.474 | 7.4011 | 8.3718 | 8.9581 | 14.7944 | 16.7817 | 26.3916 | 32.2702 |
| u17 | 4.6243 | 5.4757 | 7.3997 | 8.372 | 8.9585 | 14.8184 | 17.7277 | 28.1062 | 34.4336 |
| u18 | 4.6188 | 5.4675 | 7.4646 | 8.7429 | 9.94 | 16.6805 | 19.2664 | 30.2335 | 36.7993 |
| u19 | 4.62 | 5.4681 | 7.4665 | 8.7398 | 9.9394 | 16.8025 | 20.3968 | 32.1242 | 39.1019 |
| u20 | 5.246 | 6.7028 | 9.1828 | 10.5001 | 11.5978 | 18.9131 | 22.1002 | 34.4644 | 41.6513 |
| u21 | 5.2441 | 6.7104 | 9.1919 | 10.4999 | 11.6041 | 19.325 | 23.4306 | 36.5679 | 44.1297 |
| u22 | 5.2556 | 6.8816 | 9.641 | 11.4966 | 12.9965 | 21.168 | 25.1704 | 39.027 | 46.8305 |
| u23 | 5.2584 | 6.8738 | 9.6278 | 11.5018 | 13.088 | 22.0945 | 26.7556 | 41.4123 | 49.5435 |
| u24 | 7.0279 | 8.6613 | 11.7039 | 13.483 | 14.878 | 24.1425 | 28.7536 | 44.2002 | 52.5353 |
| u25 | 7.0459 | 8.6344 | 11.6913 | 13.5672 | 15.2586 | 25.575 | 30.6214 | 46.9287 | 55.5551 |
| u26 | 7.4305 | 9.4101 | 12.9619 | 15.1187 | 16.8096 | 27.6541 | 32.829 | 50.0315 | 58.8707 |
| u27 | 7.3941 | 9.5027 | 13.2128 | 15.6519 | 17.8237 | 29.6567 | 35.1146 | 53.2678 | 62.3471 |
| u28 | 8.8516 | 11.1654 | 15.161 | 17.6098 | 19.6965 | 32.2679 | 37.8272 | 57.0085 | 66.2558 |
| u29 | 9.1461 | 11.7322 | 16.204 | 19.1046 | 21.4926 | 35.0526 | 40.7685 | 61.0847 | 70.5087 |
| u30 | 10.4828 | 13.5243 | 18.4804 | 21.5413 | 23.9997 | 38.6023 | 44.3725 | 65.9903 | 75.5397 |
| u31 | 12.3176 | 15.7967 | 21.4433 | 24.7641 | 27.2995 | 43.2007 | 48.9596 | 72.1993 | 81.8379 |

| | | | | | | | | | | | | | | | | |
|---|---|---|---|---|---|---|---|---|---|---|---|---|---|---|---|---|
| $Y_0$, q | 1 | 1 | 1 | 1 | 1 | 1 | 1 | 1 | 1 | 1 | 1 | 1 | 1 | 1 | 1 | 1 |
| $Y_2$, q | 0 | 0 | 0 | 0 | 0 | 0 | 0 | 0 | 0 | 0 | 0 | 0 | 0 | 0 | 0 | 0 |
| $Y_4$, q | 0 | 0 | 0 | 0 | 0 | 0 | 0 | 0 | 1 | 1 | 1 | 1 | 1 | 1 | 1 | 1 |
| $Y_6$, q | 0 | 0 | 0 | 0 | 1 | 1 | 1 | 1 | 1 | 1 | 1 | 1 | 0 | 0 | 0 | 0 |
| $Y_8$, q | 0 | 0 | 1 | 1 | 1 | 1 | 0 | 0 | 0 | 0 | 1 | 1 | 1 | 1 | 0 | 0 |
| $Y_{10}$, q | 0 | 1 | 1 | 0 | 0 | 1 | 1 | 0 | 0 | 1 | 1 | 0 | 0 | 1 | 1 | 0 |
| $Re(z_q)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $Y_0$, q | 1 | 1 | 1 | 1 | 1 | 1 | 1 | 1 | 1 | 1 | 1 | 1 | 1 | 1 | 1 | 1 |
| $Y_2$, q | 1 | 1 | 1 | 1 | 1 | 1 | 1 | 1 | 1 | 1 | 1 | 1 | 1 | 1 | 1 | 1 |
| $Y_4$, q | 1 | 1 | 1 | 1 | 1 | 1 | 1 | 1 | 0 | 0 | 0 | 0 | 0 | 0 | 0 | 0 |
| $Y_6$, q | 0 | 0 | 0 | 0 | 1 | 1 | 1 | 1 | 1 | 1 | 1 | 1 | 0 | 0 | 0 | 0 |
| $Y_8$, q | 0 | 0 | 1 | 1 | 1 | 1 | 0 | 0 | 0 | 0 | 1 | 1 | 1 | 1 | 0 | 0 |
| $Y_{10}$, q | 0 | 1 | 1 | 0 | 0 | 1 | 1 | 0 | 0 | 1 | 1 | 0 | 0 | 1 | 1 | 0 |
| $Re(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| $Y_0$, q | 0 | 0 | 0 | 0 | 0 | 0 | 0 | 0 | 0 | 0 | 0 | 0 | 0 | 0 | 0 | 0 |
| $Y_2$, q | 1 | 1 | 1 | 1 | 1 | 1 | 1 | 1 | 1 | 1 | 1 | 1 | 1 | 1 | 1 | 1 |
| $Y_4$, q | 0 | 0 | 0 | 0 | 0 | 0 | 0 | 0 | 1 | 1 | 1 | 1 | 1 | 1 | 1 | 1 |
| $Y_6$, q | 0 | 0 | 0 | 0 | 1 | 1 | 1 | 1 | 1 | 1 | 1 | 1 | 0 | 0 | 0 | 0 |
| $Y_8$, q | 0 | 0 | 1 | 1 | 1 | 1 | 0 | 0 | 0 | 0 | 1 | 1 | 1 | 1 | 0 | 0 |
| $Y_{10}$, q | 0 | 1 | 1 | 0 | 0 | 1 | 1 | 0 | 0 | 1 | 1 | 0 | 0 | 1 | 1 | 0 |
| $Re(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |
| $Y_0$, q | 0 | 0 | 0 | 0 | 0 | 0 | 0 | 0 | 0 | 0 | 0 | 0 | 0 | 0 | 0 | 0 |
| $Y_2$, q | 0 | 0 | 0 | 0 | 0 | 0 | 0 | 0 | 0 | 0 | 0 | 0 | 0 | 0 | 0 | 0 |
| $Y_4$, q | 1 | 1 | 1 | 1 | 1 | 1 | 1 | 1 | 0 | 0 | 0 | 0 | 0 | 0 | 0 | 0 |
| $Y_6$, q | 0 | 0 | 0 | 0 | 1 | 1 | 1 | 1 | 1 | 1 | 1 | 1 | 0 | 0 | 0 | 0 |
| $Y_8$, q | 0 | 0 | 1 | 1 | 1 | 1 | 0 | 0 | 0 | 0 | 1 | 1 | 1 | 1 | 0 | 0 |
| $Y_{10}$, q | 0 | 1 | 1 | 0 | 0 | 1 | 1 | 0 | 0 | 1 | 1 | 0 | 0 | 1 | 1 | 0 |
| $Re(z_q)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

| | | | | | | | | | | | | | | | | |
|---|---|---|---|---|---|---|---|---|---|---|---|---|---|---|---|---|
| $Y_1$, q | 1 | 1 | 1 | 1 | 1 | 1 | 1 | 1 | 1 | 1 | 1 | 1 | 1 | 1 | 1 | 1 |
| $Y_3$, q | 0 | 0 | 0 | 0 | 0 | 0 | 0 | 0 | 0 | 0 | 0 | 0 | 0 | 0 | 0 | 0 |
| $Y_5$, q | 0 | 0 | 0 | 0 | 0 | 0 | 0 | 0 | 1 | 1 | 1 | 1 | 1 | 1 | 1 | 1 |
| $Y_7$, q | 0 | 0 | 0 | 0 | 1 | 1 | 1 | 1 | 1 | 1 | 1 | 1 | 0 | 0 | 0 | 0 |
| $Y_9$, q | 0 | 0 | 1 | 1 | 1 | 1 | 0 | 0 | 0 | 0 | 1 | 1 | 1 | 1 | 0 | 0 |
| $Y_{11}$, q | 0 | 1 | 1 | 0 | 0 | 1 | 1 | 0 | 0 | 1 | 1 | 0 | 0 | 1 | 1 | 0 |
| $Im(z_q)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $Y_1$, q | 1 | 1 | 1 | 1 | 1 | 1 | 1 | 1 | 1 | 1 | 1 | 1 | 1 | 1 | 1 | 1 |
| $Y_3$, q | 1 | 1 | 1 | 1 | 1 | 1 | 1 | 1 | 1 | 1 | 1 | 1 | 1 | 1 | 1 | 1 |
| $Y_5$, q | 1 | 1 | 1 | 1 | 1 | 1 | 1 | 1 | 0 | 0 | 0 | 0 | 0 | 0 | 0 | 0 |
| $Y_7$, q | 0 | 0 | 0 | 0 | 1 | 1 | 1 | 1 | 1 | 1 | 1 | 1 | 0 | 0 | 0 | 0 |
| $Y_9$, q | 0 | 0 | 1 | 1 | 1 | 1 | 0 | 0 | 0 | 0 | 1 | 1 | 1 | 1 | 0 | 0 |
| $Y_{11}$, q | 0 | 1 | 1 | 0 | 0 | 1 | 1 | 0 | 0 | 1 | 1 | 0 | 0 | 1 | 1 | 0 |
| $Im(z_q)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| $Y_1$, q | 0 | 0 | 0 | 0 | 0 | 0 | 0 | 0 | 0 | 0 | 0 | 0 | 0 | 0 | 0 | 0 |
| $Y_3$, q | 1 | 1 | 1 | 1 | 1 | 1 | 1 | 1 | 1 | 1 | 1 | 1 | 1 | 1 | 1 | 1 |
| $Y_5$, q | 0 | 0 | 0 | 0 | 0 | 0 | 0 | 0 | 1 | 1 | 1 | 1 | 1 | 1 | 1 | 1 |
| $Y_7$, q | 0 | 0 | 0 | 0 | 1 | 1 | 1 | 1 | 1 | 1 | 1 | 1 | 0 | 0 | 0 | 0 |
| $Y_9$, q | 0 | 0 | 1 | 1 | 1 | 1 | 0 | 0 | 0 | 0 | 1 | 1 | 1 | 1 | 0 | 0 |
| $Y_{11}$, q | 0 | 1 | 1 | 0 | 0 | 1 | 1 | 0 | 0 | 1 | 1 | 0 | 0 | 1 | 1 | 0 |
| $Im(z_q)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |
| $Y_1$, q | 0 | 0 | 0 | 0 | 0 | 0 | 0 | 0 | 0 | 0 | 0 | 0 | 0 | 0 | 0 | 0 |
| $Y_3$, q | 0 | 0 | 0 | 0 | 0 | 0 | 0 | 0 | 0 | 0 | 0 | 0 | 0 | 0 | 0 | 0 |
| $Y_5$, q | 1 | 1 | 1 | 1 | 1 | 1 | 1 | 1 | 0 | 0 | 0 | 0 | 0 | 0 | 0 | 0 |
| $Y_7$, q | 0 | 0 | 0 | 0 | 1 | 1 | 1 | 1 | 1 | 1 | 1 | 1 | 0 | 0 | 0 | 0 |
| $Y_9$, q | 0 | 0 | 1 | 1 | 1 | 1 | 0 | 0 | 0 | 0 | 1 | 1 | 1 | 1 | 0 | 0 |
| $Y_{11}$, q | 0 | 1 | 1 | 0 | 0 | 1 | 1 | 0 | 0 | 1 | 1 | 0 | 0 | 1 | 1 | 0 |
| $Im(z_q)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 99 (Cont'd)
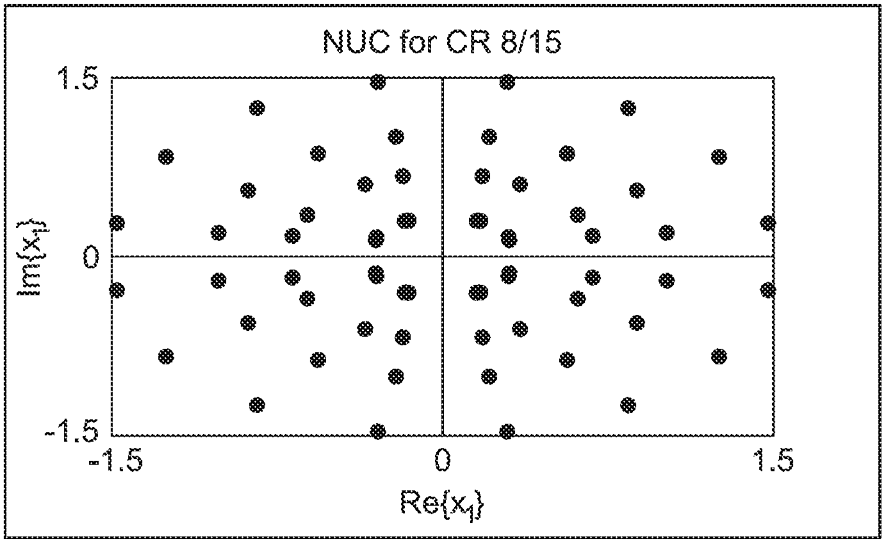
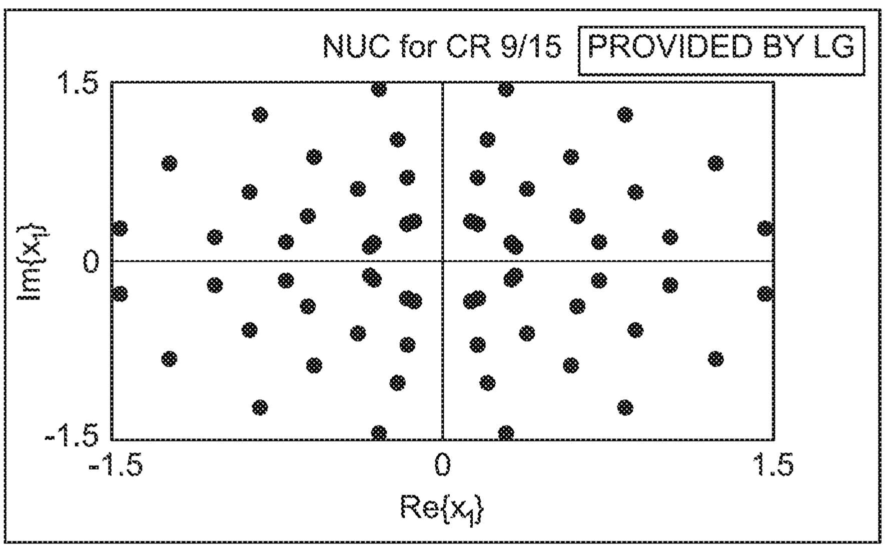
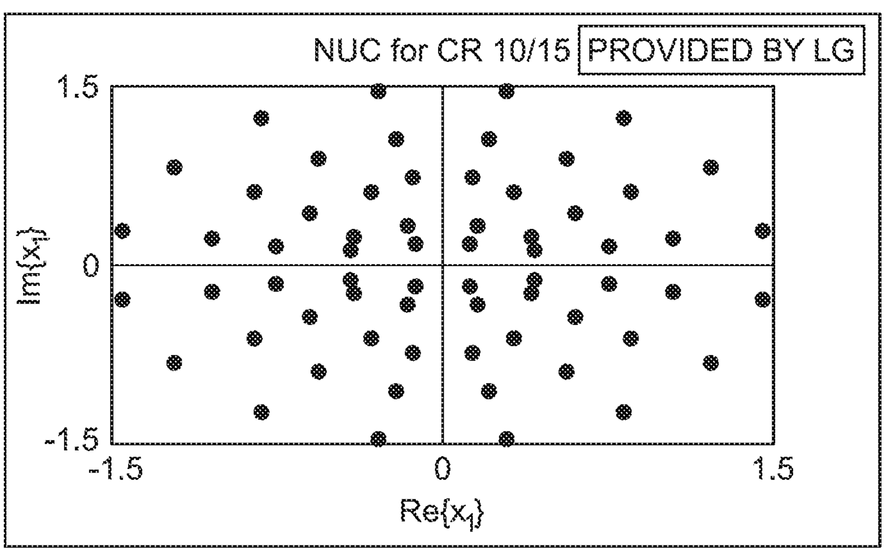

FIG. 99 (Cont'd)
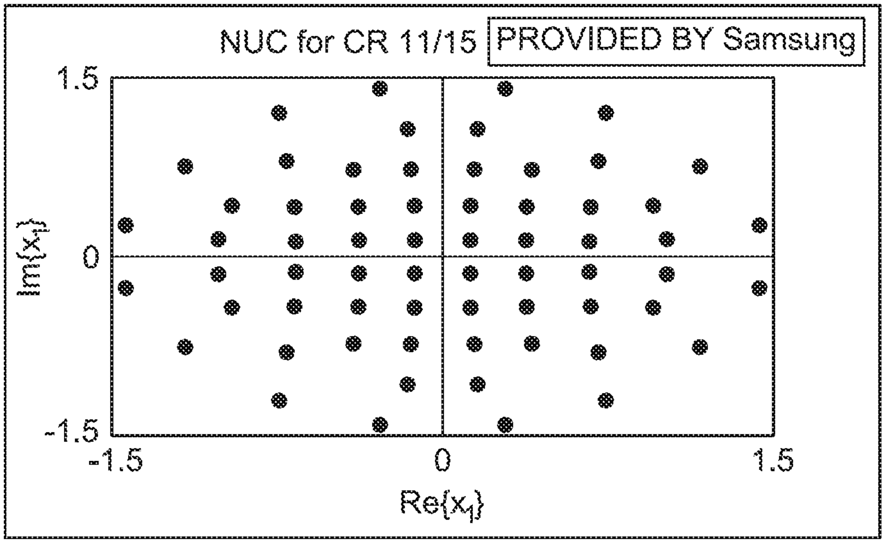
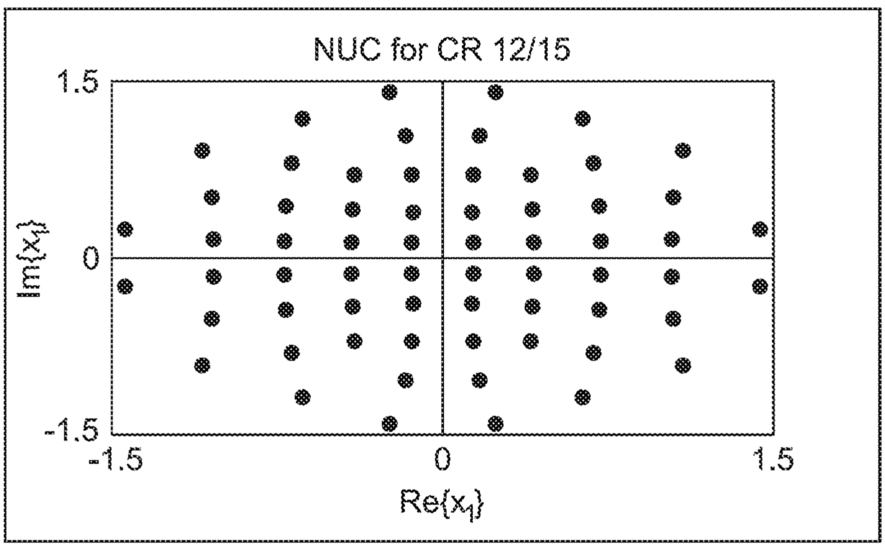
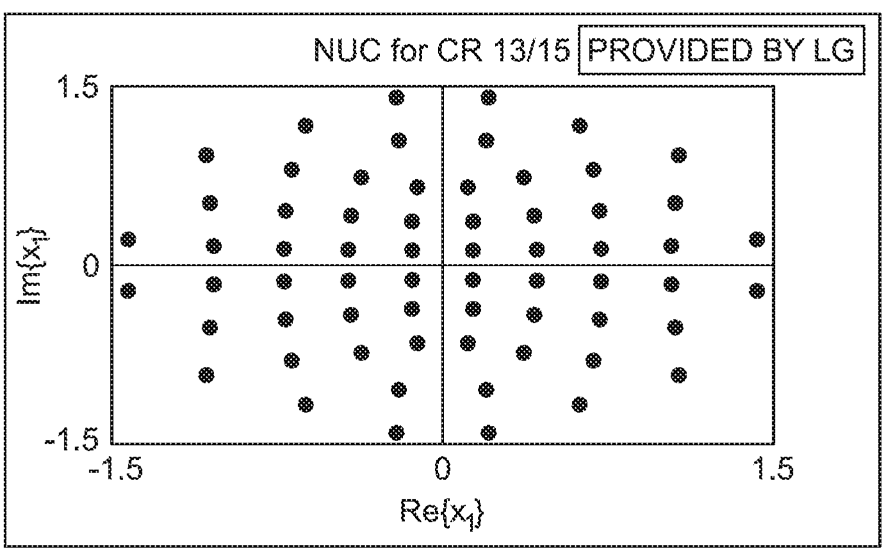

FIG. 100 (Cont'd)
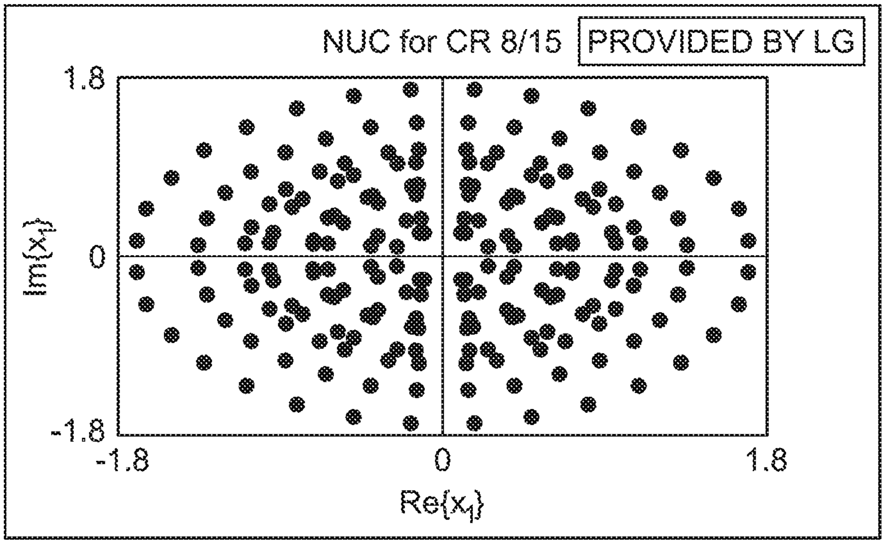
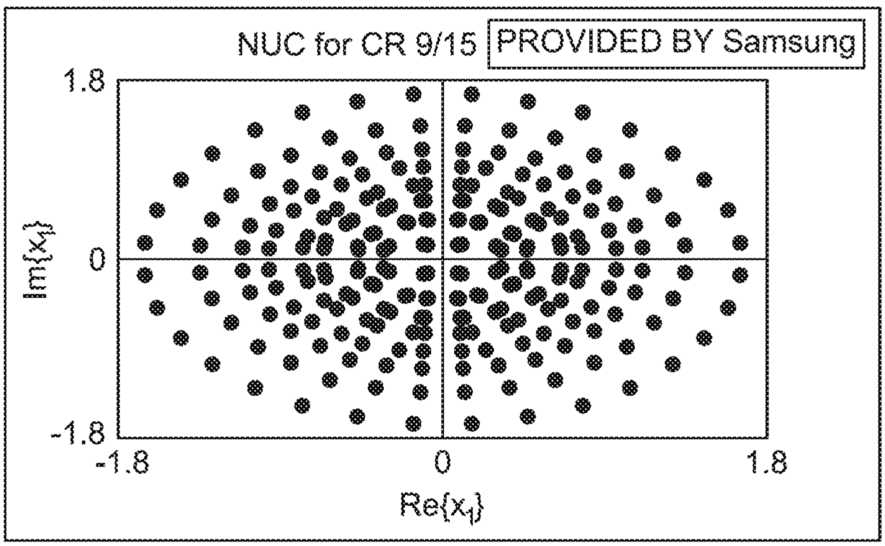
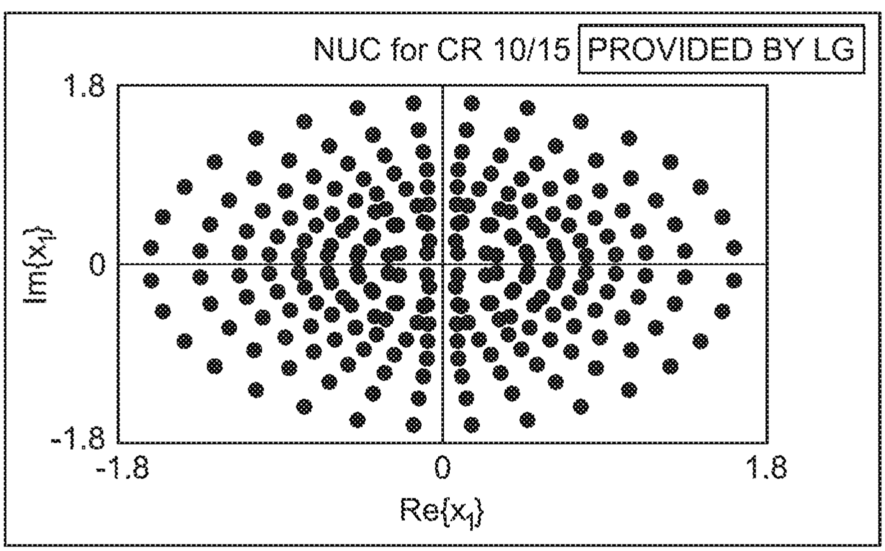

FIG. 100 (Cont'd)
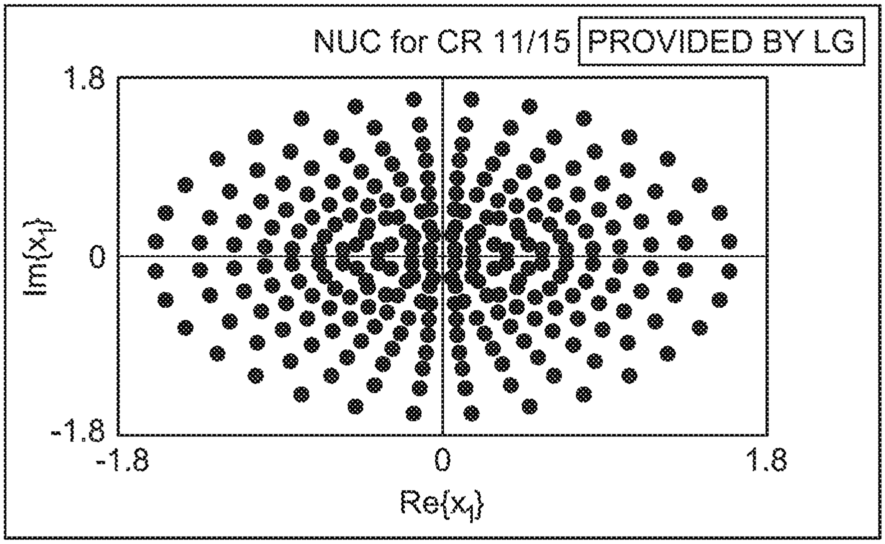
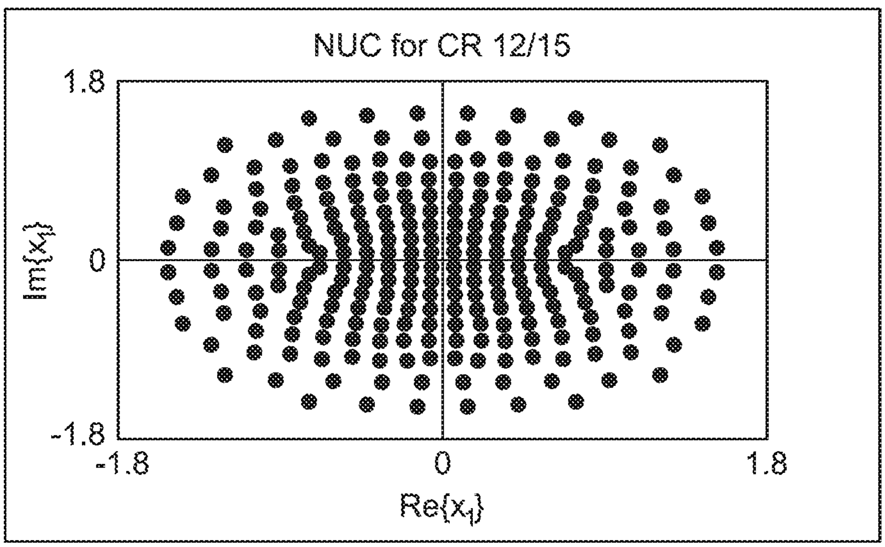
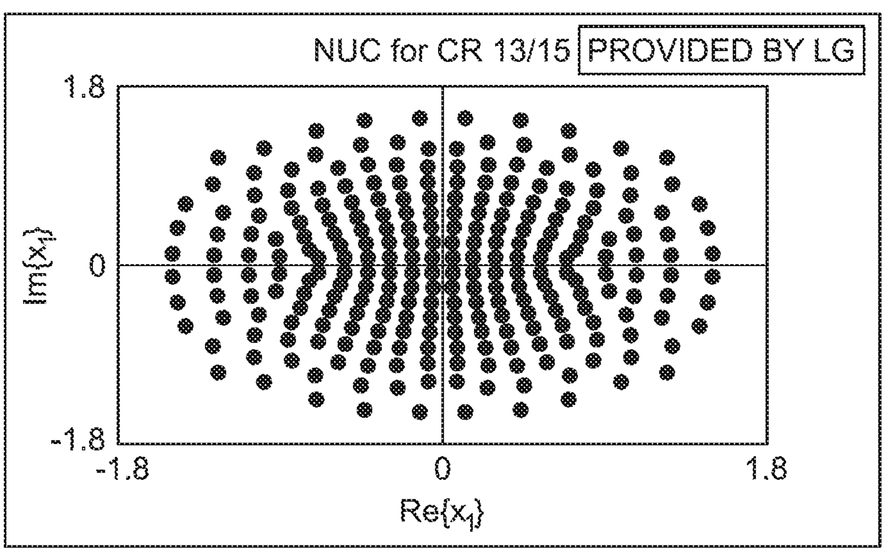

FIG. 101

| w/Shape | NUC_16_5/15 | NUC_16_6/15 | NUC_16_7/15 | NUC_16_8/15 |
|---|---|---|---|---|
| w0 | 0.3192 + 0.5011i | 0.5115 + 1.2092i | 0.2593 + 0.489i | 0.2535 + 0.4923i |
| w1 | 0.5011 + 0.3192i | 1.2092 + 0.5115i | 0.489 + 0.2593i | 0.4923 + 0.2535i |
| w2 | 0.5575 + 1.1559i | 0.2663 + 0.453i | 0.5074 + 1.1984i | 0.4927 + 1.2044i |
| w3 | 1.1559 + 0.5575i | 0.453 + 0.2663i | 1.1984 + 0.5074i | 1.2044 + 0.4927i |

| w/Shape | NUC_16_9/15 | NUC_16_10/15 | NUC_16_11/15 | NUC_16_12/15 | NUC_16_13/15 |
|---|---|---|---|---|---|
| w0 | 0.2386 + 0.5296i | 0.4487 + 1.1657i | 0.9342 + 0.9847i | 0.9555 + 0.9555i | 0.9517 + 0.9511i |
| w1 | 0.5296 + 0.2386i | 1.208 + 0.5377i | 0.9866 + 0.2903i | 0.9555 + 0.2949i | 0.9524 + 0.3061i |
| w2 | 0.4882 + 1.1934i | 0.2213 + 0.4416i | 0.2716 + 0.9325i | 0.2949 + 0.9555i | 0.3067 + 0.9524i |
| w3 | 1.1934 + 0.4882i | 0.6186 + 0.2544i | 0.2901 + 0.2695i | 0.2949 + 0.2949i | 0.3061 + 0.3067i |

FIG. 102

| w/Shape | NUC_64_5/15 | NUC_64_6/15 | NUC_64_7/15 | NUC_64_8/15 |
|---|---|---|---|---|
| w0 | 1.4327 + 0.3305i | 1.4521 + 0.3005i | 0.1567 + 0.3112i | 1.4827 + 0.292i |
| w1 | 1.0909 + 0.2971i | 1.2657 + 0.8178i | 0.1709 + 0.3037i | 1.2563 + 0.8411i |
| w2 | 1.2484 + 0.7803i | 1.0666 + 0.2744i | 0.2093 + 0.6562i | 1.0211 + 0.2174i |
| w3 | 0.9762 + 0.5715i | 0.95 + 0.5641i | 0.3315 + 0.6038i | 0.8798 + 0.5702i |
| w4 | 0.3309 + 1.4326i | 0.3011 + 1.4529i | 0.3112 + 0.1567i | 0.292 + 1.4827i |
| w5 | 0.2979 + 1.0923i | 0.8202 + 1.2651i | 0.3037 + 0.1709i | 0.841 + 1.2563i |
| w6 | 0.7829 + 1.2477i | 0.275 + 1.0676i | 0.6562 + 0.2093i | 0.2174 + 1.0211i |
| w7 | 0.5739 + 0.9763i | 0.5656 + 0.9499i | 0.6038 + 0.3315i | 0.5702 + 0.8798i |
| w8 | 0.3901 + 0.2112i | 0.3553 + 0.1948i | 0.2959 + 1.4877i | 0.304 + 0.1475i |
| w9 | 0.5317 + 0.2475i | 0.3569 + 0.2094i | 0.8427 + 1.2612i | 0.3028 + 0.1691i |
| w10 | 0.3945 + 0.2289i | 0.5596 + 0.2431i | 0.2389 + 1.0228i | 0.6855 + 0.1871i |
| w11 | 0.5236 + 0.2894i | 0.541 + 0.3002i | 0.5559 + 0.8912i | 0.6126 + 0.3563i |
| w12 | 0.2108 + 0.3911i | 0.1946 + 0.3566i | 1.4877 + 0.2959i | 0.1475 + 0.304i |
| w13 | 0.2475 + 0.5327i | 0.2094 + 0.3579i | 1.2612 + 0.8427i | 0.1691 + 0.3028i |
| w14 | 0.2287 + 0.3955i | 0.243 + 0.5607i | 1.0228 + 0.2389i | 0.1871 + 0.6855i |
| w15 | 0.2898 + 0.5246i | 0.3004 + 0.5417i | 0.8912 + 0.5559i | 0.3563 + 0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 0.1305 + 0.3311i | 0.1177 + 0.1729i | 1.4443 + 0.2683i | 1.448 + 0.2403i | 1.4319 + 0.23i |
| w1 | 0.1633 + 0.3162i | 0.1601 + 0.3212i | 0.7471 + 1.2243i | 0.6406 + 1.1995i | 1.0762 + 0.925i |
| w2 | 0.1622 + 0.7113i | 0.1352 + 0.7279i | 1.1749 + 0.7734i | 1.0952 + 0.9115i | 0.629 + 1.182i |
| w3 | 0.3905 + 0.6163i | 0.3246 + 0.6148i | 0.7138 + 0.8201i | 0.6868 + 0.8108i | 0.6851 + 0.8072i |
| w4 | 0.3311 + 0.1305i | 0.4192 + 0.1179i | 0.1638 + 1.0769i | 1.05 + 0.1642i | 1.0443 + 0.1688i |
| w5 | 0.3162 + 0.1633i | 0.4033 + 0.2421i | 0.2927 + 1.4217i | 0.717 + 0.1473i | 1.0635 + 0.5305i |
| w6 | 0.7113 + 0.1622i | 0.7524 + 0.1581i | 0.1462 + 0.7457i | 1.0519 + 0.5188i | 0.722 + 0.154i |
| w7 | 0.6163 + 0.3905i | 0.5996 + 0.433i | 0.4134 + 0.7408i | 0.7146 + 0.4532i | 0.7151 + 0.4711i |
| w8 | 0.2909 + 1.4626i | 0.2902 + 1.4611i | 1.0203 + 0.1517i | 0.1677 + 1.0405i | 0.2099 + 1.4205i |
| w9 | 0.8285 + 1.2399i | 0.818 + 1.2291i | 0.6653 + 0.1357i | 0.2402 + 1.4087i | 0.119 + 0.6677i |
| w10 | 0.2062 + 1.0367i | 0.2036 + 1.0575i | 0.9639 + 0.4465i | 0.1369 + 0.7073i | 0.2031 + 1.0551i |
| w11 | 0.5872 + 0.8789i | 0.5641 + 0.8965i | 0.6746 + 0.4339i | 0.4044 + 0.7057i | 0.3722 + 0.7548i |
| w12 | 1.4626 + 0.2909i | 1.4453 + 0.2907i | 0.1271 + 0.1428i | 0.1374 + 0.1295i | 0.1438 + 0.1287i |
| w13 | 1.2399 + 0.8285i | 1.2157 + 0.8186i | 0.3782 + 0.1406i | 0.4185 + 0.1357i | 0.1432 + 0.3903i |
| w14 | 1.0367 + 0.2062i | 1.0447 + 0.2242i | 0.1311 + 0.4288i | 0.1325 + 0.3998i | 0.4298 + 0.1384i |
| w15 | 0.8789 + 0.5872i | 0.8497 + 0.6176i | 0.3919 + 0.4276i | 0.4122 + 0.412i | 0.4215 + 0.4279i |

FIG. 103

| w/Shape | NUC_256_5/15 | NUC_256_6/15 | NUC_256_7/15 | NUC_256_8/15 |
|---|---|---|---|---|
| w0 | 0.1524 + 0.3087i | 0.143 + 0.3078i | 0.117 + 0.3003i | 0.0995 + 0.2435i |
| w1 | 0.1525 + 0.3087i | 0.143 + 0.3077i | 0.1171 + 0.3003i | 0.0996 + 0.2434i |
| w2 | 0.1513 + 0.3043i | 0.1413 + 0.3003i | 0.1204 + 0.3233i | 0.1169 + 0.3886i |
| w3 | 0.1513 + 0.3043i | 0.1414 + 0.3002i | 0.1204 + 0.3233i | 0.1179 + 0.3883i |
| w4 | 0.1682 + 0.3004i | 0.1637 + 0.2973i | 0.1454 + 0.2877i | 0.1192 + 0.2345i |
| w5 | 0.1682 + 0.3005i | 0.1636 + 0.2973i | 0.1453 + 0.2877i | 0.1192 + 0.2345i |
| w6 | 0.1663 + 0.2964i | 0.1604 + 0.2905i | 0.1566 + 0.3074i | 0.1953 + 0.3558i |
| w7 | 0.1663 + 0.2964i | 0.1603 + 0.2905i | 0.1565 + 0.3074i | 0.1944 + 0.3563i |
| w8 | 0.1964 + 0.6584i | 0.1769 + 0.6686i | 0.1427 + 0.6856i | 0.1293 + 0.7217i |
| w9 | 0.1965 + 0.6583i | 0.1793 + 0.6679i | 0.1562 + 0.6826i | 0.1616 + 0.7151i |
| w10 | 0.1967 + 0.6652i | 0.1769 + 0.6707i | 0.1422 + 0.6584i | 0.1287 + 0.6355i |
| w11 | 0.1968 + 0.6652i | 0.1793 + 0.67i | 0.1529 + 0.656i | 0.1456 + 0.6318i |
| w12 | 0.3371 + 0.5987i | 0.3506 + 0.5961i | 0.384 + 0.5856i | 0.4191 + 0.6016i |
| w13 | 0.337 + 0.5987i | 0.3484 + 0.5974i | 0.3723 + 0.5931i | 0.3916 + 0.6198i |
| w14 | 0.3414 + 0.6039i | 0.3523 + 0.5975i | 0.3651 + 0.566i | 0.3585 + 0.5403i |
| w15 | 0.3413 + 0.6039i | 0.3501 + 0.5987i | 0.3559 + 0.5718i | 0.3439 + 0.5497i |
| w16 | 0.3087 + 0.1524i | 0.3078 + 0.143i | 0.3003 + 0.117i | 0.2435 + 0.0995i |
| w17 | 0.3087 + 0.1525i | 0.3077 + 0.143i | 0.3003 + 0.1171i | 0.2434 + 0.0996i |
| w18 | 0.3043 + 0.1513i | 0.3003 + 0.1413i | 0.3233 + 0.1204i | 0.3886 + 0.1169i |
| w19 | 0.3043 + 0.1513i | 0.3002 + 0.1414i | 0.3233 + 0.1204i | 0.3883 + 0.1179i |
| w20 | 0.3004 + 0.1682i | 0.2973 + 0.1637i | 0.2877 + 0.1454i | 0.2345 + 0.1192i |
| w21 | 0.3005 + 0.1682i | 0.2973 + 0.1636i | 0.2877 + 0.1453i | 0.2345 + 0.1192i |
| w22 | 0.2964 + 0.1663i | 0.2905 + 0.1604i | 0.3074 + 0.1566i | 0.3558 + 0.1953i |
| w23 | 0.2964 + 0.1663i | 0.2905 + 0.1603i | 0.3074 + 0.1565i | 0.3563 + 0.1944i |
| w24 | 0.6584 + 0.1964i | 0.8886 + 0.1768i | 0.6856 + 0.1427i | 0.7217 + 0.1293i |
| w25 | 0.6583 + 0.1965i | 0.6679 + 0.1793i | 0.6826 + 0.1562i | 0.7151 + 0.1616i |
| w26 | 0.6652 + 0.1967i | 0.6707 + 0.1769i | 0.6584 + 0.1422i | 0.6355 + 0.1287i |
| w27 | 0.6652 + 0.1968i | 0.67 + 0.1783i | 0.656 + 0.1529i | 0.6318 + 0.1456i |
| w28 | 0.5987 + 0.3371i | 0.5861 + 0.3506i | 0.5856 + 0.384i | 0.6016 + 0.4191i |
| w29 | 0.5987 + 0.337i | 0.5974 + 0.3484i | 0.5931 + 0.3723i | 0.6198 + 0.3916i |
| w30 | 0.6039 + 0.3414i | 0.5875 + 0.3523i | 0.566 + 0.3651i | 0.5403 + 0.3585i |
| w31 | 0.6039 + 0.3413i | 0.5987 + 0.3591i | 0.5718 + 0.3559i | 0.5497 + 0.3439i |

FIG. 103 (Cont'd)

| | | | | |
|---|---|---|---|---|
| w32 | 0.3183 + 1.5992i | 0.2071 + 1.669i | 0.1683 + 1.7041i | 0.1665 + 1.6859i |
| w33 | 0.3186 + 1.5991i | 0.4482 + 1.621i | 0.4972 + 1.6386i | 0.4919 + 1.6211i |
| w34 | 0.2756 + 1.3848i | 0.208 + 1.3641i | 0.1495 + 1.356i | 0.136 + 1.3488i |
| w35 | 0.2759 + 1.3847i | 0.3307 + 1.3397i | 0.3814 + 1.3099i | 0.3914 + 1.2989i |
| w36 | 0.906 + 1.3557i | 1.0341 + 1.3264i | 1.0862 + 1.3238i | 1.0746 + 1.3096i |
| w37 | 0.9058 + 1.3559i | 0.8297 + 1.463i | 0.8074 + 1.5101i | 0.7987 + 1.494i |
| w38 | 0.7846 + 1.1739i | 0.8178 + 1.1114i | 0.8534 + 1.0644i | 0.8585 + 1.0504i |
| w39 | 0.7843 + 1.1741i | 0.7138 + 1.1809i | 0.6568 + 1.1958i | 0.6419 + 1.1951i |
| w40 | 0.2257 + 0.9956i | 0.1957 + 0.9674i | 0.1552 + 0.9481i | 0.1334 + 0.9483i |
| w41 | 0.2259 + 0.9956i | 0.217 + 0.9629i | 0.22 + 0.9352i | 0.2402 + 0.9271i |
| w42 | 0.2276 + 1.0326i | 0.1977 + 1.0341i | 0.1577 + 1.0449i | 0.1323 + 1.0786i |
| w43 | 0.2278 + 1.0326i | 0.2288 + 1.0277i | 0.2548 + 1.0255i | 0.291 + 1.047i |
| w44 | 0.5446 + 0.8635i | 0.5458 + 0.8224i | 0.5609 + 0.78i | 0.5764 + 0.7648i |
| w45 | 0.5445 + 0.8636i | 0.5276 + 0.8342i | 0.506 + 0.8167i | 0.486 + 0.8252i |
| w46 | 0.5694 + 0.891i | 0.5916 + 0.8709i | 0.6276 + 0.8501i | 0.6693 + 0.8561i |
| w47 | 0.5692 + 0.8911i | 0.5651 + 0.8883i | 0.5452 + 0.9052i | 0.5348 + 0.9459i |
| w48 | 1.5982 + 0.3183i | 1.669 + 0.2071i | 1.7041 + 0.1683i | 1.6859 + 0.1665i |
| w49 | 1.5991 + 0.3186i | 1.621 + 0.4482i | 1.6386 + 0.4972i | 1.6211 + 0.4919i |
| w50 | 1.3848 + 0.2756i | 1.3641 + 0.2081i | 1.356 + 0.1495i | 1.3498 + 0.136i |
| w51 | 1.3847 + 0.2759i | 1.3397 + 0.3307i | 1.3099 + 0.3814i | 1.2989 + 0.3914i |
| w52 | 1.3557 + 0.906i | 1.3264 + 1.0341i | 1.3238 + 1.0862i | 1.3096 + 1.0746i |
| w53 | 1.3559 + 0.9058i | 1.463 + 0.8279i | 1.5101 + 0.8074i | 1.494 + 0.7987i |
| w54 | 1.1739 + 0.7846i | 1.1114 + 0.8178i | 1.0644 + 0.8534i | 1.0504 + 0.8585i |
| w55 | 1.1741 + 0.7843i | 1.1809 + 0.7138i | 1.1958 + 0.6568i | 1.1951 + 0.6419i |
| w56 | 0.9956 + 0.2257i | 0.9674 + 0.1957i | 0.9481 + 0.1552i | 0.9483 + 0.1334i |
| w57 | 0.9956 + 0.2259i | 0.9629 + 0.217i | 0.9352 + 0.22i | 0.9271 + 0.2402i |
| w58 | 1.0326 + 0.2276i | 1.0341 + 0.1977i | 1.0449 + 0.1577i | 1.0786 + 0.1323i |
| w59 | 1.0326 + 0.2278i | 1.0227 + 0.2288i | 1.0255 + 0.2548i | 1.047 + 0.291i |
| w60 | 0.8635 + 0.5446i | 0.8224 + 0.5458i | 0.78 + 0.5609i | 0.7648 + 0.5764i |
| w61 | 0.8636 + 0.5445i | 0.8342 + 0.5276i | 0.8167 + 0.506i | 0.8252 + 0.486i |
| w62 | 0.891 + 0.5694i | 0.8709 + 0.5916i | 0.8501 + 0.6276i | 0.8561 + 0.6683i |
| w63 | 0.8911 + 0.5692i | 0.9883 + 0.5651i | 0.9052 + 0.5452i | 0.9459 + 0.5348i |

FIG. 104

| w/Shape | NUC_256_9/15 | NUC_256_10/15 | NUC_256_11/15 | NUC_256_12/15 | NUC_256_13/15 |
|---|---|---|---|---|---|
| w0 | 0.0899 + 0.1337i | 0.0754 + 0.231i | 0.0593 + 0.2193i | 1.198 + 1.1541i | 1.2412 + 1.0688i |
| w1 | 0.091 + 0.1377i | 0.0766 + 0.2305i | 0.069 + 0.3047i | 0.9192 + 1.2082i | 1.2668 + 0.8034i |
| w2 | 0.0873 + 0.3862i | 0.0924 + 0.4136i | 0.0663 + 0.4879i | 1.2778 + 0.8523i | 0.986 + 1.1758i |
| w3 | 0.0883 + 0.3873i | 0.1043 + 0.4125i | 0.1151 + 0.4474i | 1.039 + 0.9253i | 1.0365 + 0.9065i |
| w4 | 0.1115 + 0.1442i | 0.0829 + 0.1135i | 0.1689 + 0.2163i | 0.6057 + 1.22 | 1.2111 + 0.5135i |
| w5 | 0.1135 + 0.1472i | 0.0836 + 0.1149i | 0.1971 + 0.2525i | 0.7371 + 1.4217i | 1.4187 + 0.6066i |
| w6 | 0.2067 + 0.3591i | 0.2682 + 0.3856i | 0.3096 + 0.3796i | 0.6678 + 1.0021i | 1.0103 + 0.4879i |
| w7 | 0.1975 + 0.3621i | 0.2531 + 0.3906i | 0.2489 + 0.3933i | 0.8412 + 0.9448i | 1.038 + 0.6906i |
| w8 | 0.1048 + 0.7533i | 0.0836 + 0.7817i | 0.079 + 0.797i | 1.2128 + 0.5373i | 0.6963 + 1.3442i |
| w9 | 0.177 + 0.7412i | 0.2052 + 0.7608i | 0.234 + 0.771i | 1.0048 + 0.5165i | 0.7089 + 1.1122i |
| w10 | 0.1022 + 0.5904i | 0.0838 + 0.6034i | 0.0723 + 0.6395i | 1.4321 + 0.6343i | 0.1256 + 1.4745i |
| w11 | 0.1191 + 0.589i | 0.1394 + 0.5961i | 0.1896 + 0.6163i | 1.0245 + 0.7152i | 0.8331 + 0.9455i |
| w12 | 0.4264 + 0.623i | 0.4861 + 0.6331i | 0.509 + 0.6272i | 0.6384 + 0.6073i | 0.6615 + 0.6012i |
| w13 | 0.365 + 0.6689i | 0.3661 + 0.7034i | 0.3787 + 0.7126i | 0.8175 + 0.5684i | 0.6894 + 0.7594i |
| w14 | 0.3254 + 0.5153i | 0.3732 + 0.5159i | 0.4079 + 0.5049i | 0.6568 + 0.7801i | 0.8373 + 0.5633i |
| w15 | 0.2959 + 0.5302i | 0.3095 + 0.5511i | 0.3088 + 0.5677i | 0.8311 + 0.7459i | 0.8552 + 0.741i |
| w16 | 0.3256 + 0.0768i | 0.303 + 0.0811i | 0.0675 + 0.0626i | 0.1349 + 1.4742i | 1.2666 + 0.1027i |
| w17 | 0.3266 + 0.0870i | 0.3017 + 0.0853i | 0.3475 + 0.0595i | 0.1105 + 1.2309i | 1.4915 + 0.1198i |
| w18 | 0.4721 + 0.0994i | 0.4758 + 0.0932i | 0.5482 + 0.0626i | 0.0634 + 0.9796i | 1.0766 + 0.0945i |
| w19 | 0.4721 + 0.1206i | 0.4676 + 0.1242i | 0.4784 + 0.1124i | 0.1891 + 1.0198i | 0.9007 + 0.0848i |

FIG. 104 (Cont'd)

| | | | | | |
|---|---|---|---|---|---|
| w20 | 0.2927 + 0.1267i | 0.2425 + 0.1081i | 0.1674 + 0.0751i | 0.4142 + 1.4461i | 1.2454 + 0.3064i |
| w21 | 0.2947 + 0.1296i | 0.2447 + 0.1115i | 0.2856 + 0.1132i | 0.3323 + 1.2279i | 1.4646 + 0.36i |
| w22 | 0.3823 + 0.2592i | 0.3837 + 0.2813i | 0.4134 + 0.3028i | 0.4998 + 0.9827i | 1.057 + 0.2995i |
| w23 | 0.3944 + 0.2521i | 0.3959 + 0.2642i | 0.4235 + 0.2289i | 0.3467 + 1.0202i | 0.914 + 0.253i |
| w24 | 0.7755 + 0.1118i | 0.7929 + 0.0859i | 0.8258 + 0.084i | 0.068 + 0.6501i | 0.5461 + 0.0679i |
| w25 | 0.7513 + 0.2154i | 0.7652 + 0.2324i | 0.7936 + 0.2483i | 0.2016 + 0.6464i | 0.5681 + 0.1947i |
| w26 | 0.6591 + 0.1033i | 0.6365 + 0.072i | 0.6788 + 0.0783i | 0.0719 + 0.8075i | 0.6874 + 0.0537i |
| w27 | 0.6446 + 0.1737i | 0.6207 + 0.1757i | 0.6501 + 0.2025i | 0.2088 + 0.8146i | 0.7375 + 0.1492i |
| w28 | 0.5906 + 0.493i | 0.6149 + 0.5145i | 0.6246 + 0.5211i | 0.4809 + 0.6296i | 0.629 + 0.4553i |
| w29 | 0.6538 + 0.4155i | 0.6987 + 0.3934i | 0.7241 + 0.3961i | 0.3374 + 0.6412i | 0.6007 + 0.3177i |
| w30 | 0.4981 + 0.3921i | 0.5063 + 0.4029i | 0.5144 + 0.4089i | 0.4955 + 0.8008i | 0.7885 + 0.4231i |
| w31 | 0.5373 + 0.3586i | 0.5526 + 0.3356i | 0.5918 + 0.3146i | 0.3431 + 0.8141i | 0.7627 + 0.2849i |
| w32 | 0.163 + 1.6621i | 0.1598 + 1.6262i | 0.1631 + 1.5801i | 1.2731 + 0.1108i | 0.0816 + 1.1632i |
| w33 | 0.472 + 1.5898i | 0.4733 + 1.5637i | 0.4806 + 1.5133i | 1.0794 + 0.0977i | 0.083 + 0.9813i |
| w34 | 0.1268 + 1.3488i | 0.1307 + 1.3502i | 0.126 + 1.3365i | 1.5126 + 0.1256i | 0.2528 + 1.2315i |
| w35 | 0.3752 + 1.2961i | 0.3877 + 1.2983i | 0.375 + 1.2897i | 0.9029 + 0.0853i | 0.2502 + 1.01i |
| w36 | 1.0398 + 1.2991i | 1.0328 + 1.2617i | 1.0324 + 1.2029i | 0.5429 + 0.0694i | 0.0732 + 0.6827i |
| w37 | 0.7733 + 1.4772i | 0.7675 + 1.4398i | 0.7737 + 1.3837i | 0.6795 + 0.0559i | 0.0811 + 0.8293i |
| w38 | 0.838 + 1.0552i | 0.8496 + 1.0508i | 0.835 + 1.0529i | 0.5628 + 0.1945i | 0.2159 + 0.6673i |
| w39 | 0.6242 + 1.2081i | 0.6297 + 1.1967i | 0.6147 + 1.1949i | 0.7326 + 0.141i | 0.2359 + 0.8283i |
| w40 | 0.1103 + 0.9397i | 0.091 + 0.9531i | 0.0929 + 0.9596i | 1.2283 + 0.3217i | 0.4302 + 1.4458i |
| w41 | 0.2415 + 0.9155i | 0.2649 + 0.9198i | 0.2768 + 0.926i | 1.0269 + 0.3261i | 0.5852 + 0.968i |

FIG. 104 (Cont'd)

| | | | | | |
|---|---|---|---|---|---|
| w42 | 0.1118 + 1.1163i | 0.108 + 1.134i | 0.1095 + 1.1349i | 1.4663 + 0.3716i | 0.4528 + 1.2074i |
| w43 | 0.3079 + 1.0866i | 0.3214 + 1.0926i | 0.325 + 1.0941i | 0.9085 + 0.247i | 0.4167 + 1.0099i |
| w44 | 0.5647 + 0.7638i | 0.5941 + 0.7527i | 0.6086 + 0.7556i | 0.616 + 0.4549i | 0.5035 + 0.6307i |
| w45 | 0.4385 + 0.8433i | 0.4371 + 0.8528i | 0.4514 + 0.8566i | 0.7818 + 0.4247i | 0.5359 + 0.7954i |
| w46 | 0.6846 + 0.8841i | 0.7093 + 0.888i | 0.7161 + 0.8933i | 0.5938 + 0.317i | 0.358 + 0.6532i |
| w47 | 0.5165 + 1.0034i | 0.5235 + 1.009i | 0.5294 + 1.0121i | 0.76 + 0.285i | 0.3841 + 0.8207i |
| w48 | 1.6489 + 0.163i | 1.618 + 0.1602i | 1.5809 + 0.1471i | 0.0595 + 0.0707i | 0.0576 + 0.0745i |
| w49 | 1.5848 + 0.4983i | 1.554 + 0.4734i | 1.5253 + 0.4385i | 0.1722 + 0.0706i | 0.0581 + 0.2241i |
| w50 | 1.3437 + 0.1389i | 1.3411 + 0.1336i | 1.338 + 0.1363i | 0.0599 + 0.2119i | 0.172 + 0.0742i |
| w51 | 1.285 + 0.4025i | 1.2883 + 0.3955i | 1.2837 + 0.4026i | 0.1748 + 0.2114i | 0.1753 + 0.2222i |
| w52 | 1.2728 + 1.0661i | 1.2561 + 1.0337i | 1.2476 + 0.9785i | 0.4134 + 0.0701i | 0.0652 + 0.5269i |
| w53 | 1.4509 + 0.7925i | 1.4311 + 0.7676i | 1.4137 + 0.7196i | 0.2935 + 0.0705i | 0.0611 + 0.3767i |
| w54 | 1.0249 + 0.8794i | 1.0362 + 0.8626i | 1.0246 + 0.8681i | 0.4231 + 0.2066i | 0.1972 + 0.5178i |
| w55 | 1.1758 + 0.6545i | 1.1845 + 0.6419i | 1.1771 + 0.6494i | 0.2979 + 0.21i | 0.1836 + 0.3695i |
| w56 | 0.9629 + 0.1113i | 0.9546 + 0.0957i | 0.9782 + 0.0985i | 0.0638 + 0.5002i | 0.4145 + 0.0709i |
| w57 | 0.9226 + 0.2849i | 0.9163 + 0.2834i | 0.9383 + 0.2922i | 0.1905 + 0.4966i | 0.4266 + 0.21i |
| w58 | 1.1062 + 0.1118i | 1.1282 + 0.1128i | 1.1455 + 0.1158i | 0.0612 + 0.3552i | 0.2912 + 0.073i |
| w59 | 1.0674 + 0.3393i | 1.0838 + 0.334i | 1.0972 + 0.3418i | 0.181 + 0.3533i | 0.2982 + 0.2177i |
| w60 | 0.7234 + 0.6223i | 0.7329 + 0.6204i | 0.7446 + 0.6273i | 0.463 + 0.4764i | 0.4766 + 0.4821i |
| w61 | 0.8211 + 0.486i | 0.8428 + 0.4615i | 0.8573 + 0.4721i | 0.3231 + 0.4895i | 0.4497 + 0.3448i |
| w62 | 0.8457 + 0.726i | 0.868 + 0.7295i | 0.8767 + 0.7377i | 0.4416 + 0.3397i | 0.3334 + 0.5025i |
| w63 | 0.964 + 0.5518i | 0.9959 + 0.5426i | 1.0059 + 0.5518i | 0.3083 + 0.349i | 0.3125 + 0.3601i |

FIG. 106

| | N=64800 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 32400 | 16200 | 10800 | 7920 | 6480 | 5400 |
| R2 | 0 | 0 | 0 | 180 | 0 | 0 |

| | N=16200 | | | | | |
|---|---|---|---|---|---|---|
| | QPSK | 16QAM | 64QAM | 256QAM | 1024QAM | 4096QAM |
| C | 2 | 4 | 6 | 8 | 10 | 12 |
| R1 | 7920 | 3960 | 2520 | 1800 | 1440 | 1080 |
| R2 | 180 | 90 | 180 | 225 | 180 | 270 |

C: NUMBER OF COLUMNS (NUMBER OF SYMBOL BITS)
R1: NUMBER OF ROWS OF Part 1
R2: NUMBER OF ROWS OF Part 2

FIG. 109

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 39 | 47 | 96 | 176 | 33 | 75 | 165 | 38 | 27 | 58 | 90 | 76 | 17 | 46 | 10 | 91 | 133 | 69 | 171 | 32 | 117 | 78 |
| 13 | 146 | 101 | 36 | 0 | 138 | 25 | 77 | 122 | 49 | 14 | 125 | 140 | 93 | 130 | 2 | 104 | 102 | 129 | 4 | 111 | 151 |
| 84 | 167 | 35 | 127 | 156 | 55 | 82 | 85 | 66 | 114 | 8 | 147 | 115 | 113 | 5 | 31 | 100 | 106 | 48 | 52 | 67 | 107 |
| 18 | 126 | 112 | 50 | 9 | 143 | 28 | 160 | 71 | 79 | 43 | 98 | 86 | 94 | 64 | 3 | 166 | 105 | 103 | 118 | 63 | 51 |
| 139 | 172 | 141 | 175 | 56 | 74 | 95 | 29 | 45 | 129 | 120 | 168 | 92 | 150 | 7 | 162 | 153 | 137 | 108 | 159 | 157 | 173 |
| 23 | 89 | 132 | 57 | 37 | 70 | 134 | 40 | 21 | 149 | 80 | 1 | 121 | 59 | 110 | 142 | 152 | 15 | 154 | 145 | 12 | 170 |
| 54 | 155 | 99 | 22 | 123 | 72 | 177 | 131 | 116 | 44 | 158 | 73 | 11 | 65 | 164 | 119 | 174 | 34 | 83 | 53 | 24 | 42 |
| 60 | 26 | 161 | 68 | 178 | 41 | 148 | 109 | 87 | 144 | 135 | 20 | 62 | 81 | 169 | 124 | 6 | 19 | 30 | 163 | 61 | 179 |
| 136 | 97 | 16 | 88 | | | | | | | | | | | | | | | | | | |

FIG. 110

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 6 | 14 | 1 | 127 | 161 | 177 | 75 | 123 | 62 | 103 | 17 | 18 | 167 | 88 | 27 | 34 | 8 | 110 | 7 | 78 | 94 | 44 |
| 45 | 166 | 149 | 61 | 163 | 145 | 155 | 157 | 82 | 130 | 70 | 92 | 151 | 139 | 160 | 133 | 26 | 2 | 79 | 15 | 95 | 122 |
| 126 | 178 | 101 | 24 | 138 | 146 | 179 | 30 | 86 | 58 | 11 | 121 | 159 | 49 | 84 | 132 | 117 | 119 | 50 | 52 | 4 | 51 |
| 48 | 74 | 114 | 59 | 40 | 131 | 33 | 89 | 66 | 136 | 72 | 16 | 134 | 37 | 164 | 77 | 99 | 173 | 20 | 158 | 156 | 90 |
| 41 | 176 | 81 | 42 | 60 | 109 | 22 | 150 | 105 | 120 | 12 | 64 | 56 | 68 | 111 | 21 | 148 | 53 | 169 | 97 | 108 | 35 |
| 140 | 91 | 115 | 152 | 36 | 106 | 154 | 0 | 25 | 54 | 63 | 172 | 80 | 168 | 142 | 118 | 162 | 135 | 73 | 83 | 153 | 141 |
| 9 | 28 | 55 | 31 | 112 | 107 | 85 | 100 | 175 | 23 | 57 | 47 | 38 | 170 | 137 | 76 | 147 | 93 | 19 | 98 | 124 | 39 |
| 87 | 174 | 144 | 46 | 10 | 129 | 69 | 71 | 125 | 96 | 116 | 171 | 128 | 65 | 102 | 5 | 43 | 143 | 104 | 13 | 67 | 29 |
| 3 | 113 | 32 | 165 | | | | | | | | | | | | | | | | | | |

FIG. 111

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 103 | 116 | 158 | 0 | 27 | 73 | 140 | 30 | 148 | 36 | 153 | 154 | 10 | 174 | 122 | 178 | 6 | 106 | 162 | 59 | 142 | 112 |
| 7 | 74 | 11 | 51 | 49 | 72 | 31 | 65 | 156 | 95 | 171 | 105 | 173 | 168 | 1 | 155 | 125 | 82 | 86 | 161 | 57 | 165 |
| 54 | 26 | 121 | 25 | 157 | 93 | 22 | 34 | 33 | 39 | 19 | 46 | 150 | 141 | 12 | 9 | 79 | 118 | 24 | 17 | 85 | 117 |
| 67 | 58 | 129 | 160 | 89 | 61 | 146 | 77 | 130 | 102 | 101 | 137 | 94 | 69 | 14 | 133 | 60 | 149 | 136 | 16 | 108 | 41 |
| 90 | 28 | 144 | 13 | 175 | 114 | 2 | 18 | 63 | 68 | 21 | 109 | 53 | 123 | 75 | 81 | 143 | 169 | 42 | 119 | 138 | 104 |
| 4 | 131 | 145 | 8 | 5 | 76 | 15 | 88 | 177 | 124 | 45 | 97 | 64 | 100 | 37 | 132 | 38 | 44 | 107 | 35 | 43 | 80 |
| 50 | 91 | 152 | 78 | 166 | 55 | 115 | 170 | 159 | 147 | 167 | 87 | 83 | 29 | 96 | 172 | 49 | 98 | 62 | 139 | 70 | 164 |
| 84 | 47 | 151 | 134 | 126 | 113 | 179 | 110 | 111 | 128 | 32 | 52 | 66 | 40 | 135 | 176 | 99 | 127 | 163 | 3 | 120 | 71 |
| 56 | 92 | 23 | 20 | | | | | | | | | | | | | | | | | | |

FIG. 112

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 139 | 106 | 125 | 81 | 88 | 104 | 3 | 66 | 60 | 65 | 2 | 95 | 155 | 24 | 151 | 5 | 51 | 53 | 29 | 75 | 52 | 85 |
| 8 | 22 | 98 | 93 | 168 | 15 | 86 | 126 | 173 | 100 | 130 | 176 | 20 | 10 | 87 | 92 | 175 | 36 | 143 | 110 | 67 | 146 |
| 149 | 127 | 133 | 42 | 84 | 64 | 78 | 1 | 48 | 159 | 79 | 138 | 46 | 112 | 164 | 31 | 152 | 57 | 144 | 69 | 27 | 136 |
| 122 | 170 | 132 | 171 | 129 | 115 | 107 | 134 | 89 | 157 | 113 | 119 | 135 | 45 | 148 | 83 | 114 | 71 | 128 | 161 | 140 | 26 |
| 13 | 59 | 38 | 35 | 96 | 28 | 0 | 80 | 174 | 137 | 49 | 16 | 101 | 74 | 179 | 91 | 44 | 55 | 169 | 131 | 163 | 123 |
| 145 | 162 | 108 | 178 | 12 | 77 | 167 | 21 | 154 | 82 | 54 | 90 | 177 | 17 | 41 | 39 | 7 | 102 | 156 | 62 | 109 | 14 |
| 37 | 23 | 153 | 6 | 147 | 50 | 47 | 63 | 18 | 70 | 68 | 124 | 72 | 33 | 158 | 32 | 118 | 99 | 105 | 94 | 25 | 121 |
| 166 | 120 | 160 | 141 | 165 | 111 | 19 | 150 | 97 | 76 | 73 | 142 | 117 | 4 | 172 | 58 | 11 | 30 | 9 | 103 | 40 | 61 |
| 43 | 34 | 56 | 116 | | | | | | | | | | | | | | | | | | |

FIG. 114

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 8 | 27 | 7 | 70 | 75 | 84 | 50 | 131 | 146 | 99 | 96 | 141 | 155 | 157 | 82 | 57 | 120 | 38 | 137 | 13 | 83 | 23 |
| 40 | 9 | 56 | 171 | 124 | 172 | 39 | 142 | 20 | 128 | 133 | 2 | 89 | 153 | 103 | 112 | 129 | 151 | 162 | 106 | 14 | 62 |
| 107 | 110 | 73 | 71 | 177 | 154 | 80 | 176 | 24 | 91 | 32 | 173 | 25 | 16 | 17 | 159 | 21 | 92 | 6 | 67 | 81 | 37 |
| 15 | 136 | 100 | 64 | 102 | 163 | 168 | 18 | 78 | 76 | 45 | 140 | 123 | 118 | 58 | 122 | 11 | 19 | 86 | 98 | 119 | 111 |
| 26 | 138 | 125 | 74 | 97 | 63 | 10 | 152 | 161 | 175 | 87 | 52 | 60 | 22 | 79 | 104 | 30 | 158 | 54 | 145 | 49 | 34 |
| 166 | 109 | 179 | 174 | 93 | 41 | 116 | 48 | 3 | 29 | 134 | 167 | 105 | 132 | 114 | 169 | 147 | 144 | 77 | 61 | 170 | 90 |
| 178 | 0 | 43 | 149 | 130 | 117 | 47 | 44 | 36 | 115 | 88 | 101 | 148 | 69 | 46 | 94 | 143 | 164 | 139 | 126 | 160 | 156 |
| 33 | 113 | 65 | 121 | 53 | 42 | 66 | 165 | 85 | 127 | 135 | 5 | 55 | 150 | 72 | 35 | 31 | 51 | 4 | 1 | 68 | 12 |
| 28 | 95 | 59 | 108 | | | | | | | | | | | | | | | | | | |

FIG. 117

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 9 | 18 | 15 | 13 | 35 | 26 | 28 | 99 | 40 | 68 | 85 | 58 | 63 | 104 | 50 | 52 | 94 | 69 | 108 | 114 | 120 | 126 |
| 132 | 138 | 144 | 150 | 156 | 162 | 168 | 174 | 8 | 16 | 17 | 24 | 37 | 23 | 22 | 103 | 64 | 43 | 47 | 56 | 92 | 59 |
| 70 | 42 | 106 | 60 | 109 | 115 | 121 | 127 | 133 | 139 | 145 | 151 | 157 | 163 | 169 | 175 | 4 | 1 | 10 | 19 | 30 | 31 |
| 89 | 86 | 77 | 81 | 51 | 79 | 83 | 48 | 45 | 62 | 67 | 65 | 110 | 116 | 122 | 128 | 134 | 140 | 146 | 152 | 158 | 164 |
| 170 | 176 | 6 | 2 | 0 | 25 | 20 | 34 | 98 | 105 | 82 | 96 | 90 | 107 | 53 | 74 | 73 | 93 | 55 | 102 | 111 | 117 |
| 123 | 129 | 135 | 141 | 147 | 153 | 159 | 165 | 171 | 177 | 14 | 7 | 3 | 27 | 21 | 33 | 44 | 97 | 38 | 75 | 72 | 41 |
| 84 | 80 | 100 | 87 | 76 | 57 | 112 | 118 | 124 | 130 | 136 | 142 | 148 | 154 | 160 | 166 | 172 | 178 | 5 | 11 | 12 | 32 |
| 29 | 36 | 88 | 71 | 78 | 95 | 49 | 54 | 61 | 66 | 46 | 39 | 101 | 91 | 113 | 119 | 125 | 131 | 137 | 143 | 149 | 155 |
| 161 | 167 | 173 | 179 | | | | | | | | | | | | | | | | | | |

FIG. 119

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 21 | 11 | 12 | 9 | 0 | 6 | 24 | 25 | 85 | 103 | 118 | 122 | 71 | 101 | 41 | 93 | 55 | 73 | 100 | 40 | 106 | 119 |
| 45 | 80 | 128 | 68 | 129 | 61 | 124 | 36 | 126 | 117 | 114 | 132 | 136 | 140 | 144 | 148 | 152 | 156 | 160 | 164 | 168 | 172 |
| 176 | 20 | 18 | 10 | 13 | 16 | 8 | 26 | 27 | 54 | 111 | 52 | 44 | 87 | 113 | 115 | 58 | 116 | 49 | 77 | 95 | 86 |
| 30 | 78 | 81 | 56 | 125 | 53 | 89 | 94 | 50 | 123 | 65 | 83 | 133 | 137 | 141 | 145 | 149 | 153 | 157 | 161 | 165 | 169 |
| 173 | 177 | 2 | 17 | 1 | 4 | 7 | 15 | 29 | 82 | 32 | 102 | 76 | 121 | 92 | 130 | 127 | 62 | 107 | 38 | 46 | 43 |
| 110 | 75 | 104 | 70 | 91 | 69 | 96 | 120 | 42 | 34 | 79 | 35 | 105 | 134 | 138 | 142 | 146 | 150 | 154 | 158 | 162 | 166 |
| 170 | 174 | 178 | 19 | 5 | 3 | 14 | 22 | 28 | 23 | 109 | 51 | 108 | 131 | 33 | 84 | 88 | 64 | 63 | 59 | 57 | 97 |
| 98 | 48 | 31 | 99 | 37 | 72 | 39 | 74 | 66 | 60 | 67 | 47 | 112 | 90 | 135 | 139 | 143 | 147 | 151 | 155 | 159 | 163 |
| 167 | 171 | 175 | 179 | | | | | | | | | | | | | | | | | | |

FIG. 120

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 12 | 15 | 2 | 16 | 27 | 50 | 35 | 74 | 38 | 70 | 108 | 32 | 112 | 54 | 30 | 122 | 72 | 116 | 36 | 90 | 49 | 85 |
| 132 | 138 | 144 | 150 | 156 | 162 | 168 | 174 | 0 | 14 | 9 | 5 | 23 | 66 | 68 | 52 | 96 | 117 | 84 | 128 | 100 | 63 |
| 60 | 127 | 81 | 99 | 53 | 55 | 103 | 95 | 133 | 139 | 145 | 151 | 157 | 163 | 169 | 175 | 10 | 22 | 13 | 11 | 28 | 104 |
| 37 | 57 | 115 | 46 | 65 | 129 | 107 | 75 | 119 | 110 | 31 | 43 | 97 | 78 | 125 | 58 | 134 | 140 | 146 | 152 | 158 | 164 |
| 170 | 176 | 4 | 19 | 6 | 8 | 24 | 44 | 101 | 94 | 118 | 130 | 69 | 71 | 83 | 34 | 86 | 124 | 48 | 106 | 89 | 40 |
| 102 | 91 | 135 | 141 | 147 | 153 | 159 | 165 | 171 | 177 | 3 | 20 | 7 | 17 | 25 | 87 | 41 | 120 | 47 | 80 | 59 | 62 |
| 88 | 45 | 56 | 131 | 61 | 126 | 113 | 92 | 51 | 98 | 136 | 142 | 148 | 154 | 160 | 166 | 172 | 178 | 21 | 18 | 1 | 26 |
| 29 | 39 | 73 | 121 | 105 | 77 | 42 | 114 | 93 | 82 | 111 | 109 | 67 | 79 | 123 | 64 | 76 | 33 | 137 | 143 | 149 | 155 |
| 161 | 167 | 173 | 179 | | | | | | | | | | | | | | | | | | |

FIG. 123

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 8 | 112 | 92 | 165 | 12 | 55 | 5 | 126 | 87 | 70 | 69 | 94 | 103 | 78 | 137 | 148 | 9 | 60 | 13 | 7 | 178 | 79 |
| 43 | 136 | 34 | 68 | 118 | 152 | 49 | 15 | 99 | 61 | 66 | 28 | 109 | 125 | 33 | 167 | 81 | 93 | 97 | 26 | 35 | 30 |
| 153 | 131 | 122 | 71 | 107 | 130 | 76 | 4 | 95 | 42 | 58 | 134 | 0 | 89 | 75 | 40 | 129 | 31 | 80 | 101 | 52 | 16 |
| 142 | 44 | 138 | 46 | 116 | 27 | 82 | 88 | 143 | 128 | 72 | 29 | 83 | 117 | 172 | 14 | 51 | 159 | 48 | 160 | 100 | 1 |
| 102 | 90 | 22 | 3 | 114 | 19 | 108 | 113 | 39 | 73 | 111 | 155 | 106 | 105 | 91 | 150 | 54 | 25 | 135 | 139 | 147 | 36 |
| 56 | 123 | 6 | 67 | 104 | 96 | 157 | 10 | 62 | 164 | 86 | 74 | 133 | 120 | 174 | 53 | 140 | 156 | 171 | 149 | 127 | 85 |
| 59 | 124 | 84 | 11 | 21 | 132 | 41 | 145 | 158 | 32 | 17 | 23 | 50 | 169 | 170 | 38 | 18 | 151 | 24 | 166 | 175 | 2 |
| 47 | 57 | 98 | 20 | 177 | 161 | 154 | 176 | 163 | 37 | 110 | 168 | 141 | 64 | 65 | 173 | 162 | 121 | 45 | 77 | 115 | 179 |
| 63 | 119 | 146 | 144 | | | | | | | | | | | | | | | | | | |

FIG. 124

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 103 | 138 | 168 | 82 | 116 | 45 | 178 | 28 | 160 | 2 | 129 | 148 | 150 | 23 | 54 | 106 | 24 | 78 | 49 | 87 | 145 | 179 |
| 26 | 112 | 119 | 12 | 18 | 174 | 21 | 48 | 134 | 137 | 102 | 147 | 152 | 72 | 68 | 3 | 22 | 169 | 30 | 64 | 108 | 142 |
| 131 | 13 | 113 | 115 | 121 | 37 | 133 | 136 | 101 | 59 | 73 | 161 | 38 | 164 | 43 | 167 | 42 | 144 | 41 | 85 | 91 | 58 |
| 128 | 154 | 172 | 57 | 75 | 17 | 157 | 19 | 4 | 86 | 15 | 25 | 35 | 9 | 105 | 123 | 14 | 34 | 56 | 111 | 60 | 90 |
| 74 | 149 | 146 | 62 | 163 | 31 | 16 | 141 | 88 | 6 | 155 | 130 | 89 | 107 | 135 | 79 | 8 | 10 | 124 | 171 | 114 | 162 |
| 33 | 66 | 126 | 71 | 44 | 158 | 51 | 84 | 165 | 173 | 120 | 7 | 11 | 170 | 176 | 1 | 156 | 96 | 175 | 153 | 36 | 47 |
| 110 | 63 | 132 | 29 | 95 | 143 | 98 | 70 | 20 | 122 | 53 | 100 | 93 | 140 | 109 | 139 | 76 | 151 | 52 | 61 | 46 | 125 |
| 94 | 50 | 67 | 81 | 69 | 65 | 40 | 127 | 77 | 32 | 39 | 27 | 99 | 97 | 159 | 166 | 80 | 117 | 55 | 92 | 118 | 0 |
| 5 | 83 | 177 | 104 | | | | | | | | | | | | | | | | | | |

FIG. 125

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | | |
|---|---|---|---|---|---|---|---|---|---|---|---|---|---|---|---|---|---|---|---|---|---|
| 104 | 120 | 47 | 136 | 116 | 109 | 22 | 20 | 117 | 61 | 52 | 108 | 86 | 99 | 76 | 90 | 37 | 58 | 36 | 138 | 95 | 130 |
| 177 | 93 | 56 | 33 | 24 | 82 | 0 | 67 | 83 | 46 | 79 | 70 | 154 | 18 | 75 | 43 | 49 | 63 | 162 | 16 | 167 | 80 |
| 125 | 1 | 123 | 107 | 9 | 45 | 53 | 15 | 38 | 23 | 57 | 141 | 4 | 178 | 165 | 113 | 21 | 105 | 11 | 124 | 126 | 77 |
| 146 | 29 | 131 | 27 | 176 | 40 | 74 | 91 | 140 | 64 | 73 | 44 | 129 | 157 | 172 | 51 | 10 | 128 | 119 | 163 | 103 | 28 |
| 85 | 156 | 78 | 6 | 8 | 173 | 160 | 106 | 31 | 54 | 122 | 25 | 139 | 68 | 150 | 164 | 87 | 135 | 97 | 166 | 42 | 169 |
| 161 | 137 | 26 | 39 | 133 | 5 | 94 | 69 | 2 | 30 | 171 | 149 | 115 | 96 | 145 | 101 | 92 | 143 | 12 | 88 | 81 | 71 |
| 19 | 147 | 50 | 152 | 159 | 155 | 151 | 174 | 60 | 32 | 3 | 142 | 72 | 14 | 170 | 112 | 65 | 89 | 175 | 158 | 17 | 114 |
| 62 | 144 | 13 | 98 | 66 | 59 | 7 | 118 | 48 | 153 | 100 | 134 | 84 | 111 | 132 | 127 | 41 | 168 | 110 | 102 | 34 | 121 |
| 179 | 148 | 55 | 35 | | | | | | | | | | | | | | | | | | |

FIG. 126

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 37 | 98 | 160 | 63 | 18 | 6 | 94 | 136 | 8 | 50 | 0 | 75 | 65 | 32 | 107 | 60 | 108 | 17 | 21 | 156 | 157 | 5 |
| 73 | 66 | 38 | 177 | 162 | 130 | 171 | 76 | 57 | 126 | 103 | 62 | 120 | 134 | 154 | 101 | 143 | 29 | 13 | 149 | 16 | 33 |
| 55 | 56 | 159 | 128 | 23 | 146 | 153 | 141 | 169 | 49 | 46 | 152 | 89 | 155 | 111 | 127 | 48 | 14 | 93 | 41 | 7 | 78 |
| 135 | 69 | 123 | 179 | 36 | 87 | 27 | 58 | 88 | 170 | 125 | 110 | 15 | 97 | 178 | 90 | 121 | 173 | 30 | 102 | 10 | 80 |
| 104 | 166 | 64 | 4 | 147 | 1 | 52 | 45 | 148 | 68 | 158 | 31 | 140 | 100 | 85 | 115 | 151 | 70 | 39 | 82 | 122 | 79 |
| 12 | 91 | 133 | 132 | 22 | 163 | 47 | 19 | 119 | 144 | 35 | 25 | 42 | 83 | 92 | 26 | 72 | 138 | 54 | 124 | 24 | 74 |
| 118 | 117 | 168 | 71 | 109 | 112 | 106 | 176 | 175 | 44 | 145 | 11 | 9 | 161 | 96 | 77 | 174 | 137 | 34 | 84 | 2 | 164 |
| 129 | 43 | 150 | 61 | 53 | 20 | 165 | 113 | 142 | 116 | 95 | 3 | 28 | 40 | 81 | 99 | 139 | 114 | 59 | 67 | 172 | 131 |
| 105 | 167 | 51 | 86 | | | | | | | | | | | | | | | | | | |

FIG. 127

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 58 | 70 | 23 | 32 | 26 | 63 | 55 | 48 | 35 | 41 | 53 | 20 | 38 | 51 | 61 | 65 | 44 | 29 | 7 | 2 | 113 | 68 |
| 96 | 104 | 106 | 89 | 27 | 0 | 119 | 21 | 4 | 49 | 46 | 100 | 13 | 36 | 57 | 98 | 102 | 9 | 42 | 39 | 33 | 62 |
| 22 | 95 | 101 | 15 | 91 | 25 | 93 | 132 | 69 | 87 | 47 | 59 | 67 | 124 | 17 | 11 | 31 | 43 | 40 | 37 | 85 | 50 |
| 97 | 140 | 45 | 92 | 56 | 30 | 34 | 60 | 107 | 24 | 52 | 94 | 64 | 5 | 71 | 90 | 66 | 103 | 88 | 86 | 84 | 19 |
| 169 | 159 | 147 | 126 | 28 | 130 | 14 | 162 | 144 | 166 | 108 | 153 | 115 | 135 | 120 | 122 | 112 | 139 | 151 | 156 | 16 | 172 |
| 164 | 123 | 99 | 54 | 136 | 81 | 105 | 128 | 116 | 150 | 155 | 76 | 18 | 142 | 170 | 175 | 83 | 146 | 78 | 109 | 73 | 131 |
| 127 | 82 | 167 | 77 | 110 | 79 | 137 | 152 | 3 | 173 | 148 | 72 | 158 | 117 | 1 | 6 | 12 | 8 | 161 | 74 | 143 | 133 |
| 168 | 171 | 134 | 163 | 138 | 121 | 141 | 160 | 111 | 10 | 149 | 80 | 75 | 165 | 157 | 174 | 129 | 145 | 114 | 125 | 154 | 118 |
| 176 | 177 | 178 | 179 | | | | | | | | | | | | | | | | | | |

FIG. 128

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 40 | 159 | 100 | 14 | 88 | 75 | 53 | 24 | 157 | 84 | 23 | 77 | 140 | 145 | 32 | 28 | 112 | 39 | 76 | 50 | 93 | 27 |
| 107 | 25 | 152 | 101 | 127 | 5 | 129 | 71 | 9 | 21 | 96 | 73 | 35 | 106 | 158 | 49 | 136 | 30 | 137 | 115 | 139 | 48 |
| 167 | 85 | 74 | 72 | 7 | 110 | 161 | 41 | 170 | 147 | 82 | 128 | 149 | 33 | 8 | 120 | 47 | 68 | 58 | 67 | 87 | 155 |
| 11 | 18 | 103 | 151 | 29 | 36 | 83 | 135 | 79 | 150 | 97 | 54 | 70 | 138 | 156 | 31 | 121 | 34 | 20 | 130 | 61 | 57 |
| 2 | 166 | 117 | 15 | 6 | 165 | 118 | 98 | 116 | 131 | 109 | 62 | 126 | 175 | 22 | 111 | 164 | 16 | 133 | 102 | 55 | 105 |
| 64 | 177 | 78 | 37 | 162 | 124 | 119 | 19 | 4 | 69 | 132 | 65 | 123 | 160 | 17 | 52 | 38 | 1 | 80 | 90 | 42 | 81 |
| 104 | 13 | 144 | 51 | 114 | 3 | 43 | 146 | 163 | 59 | 45 | 89 | 122 | 169 | 44 | 94 | 86 | 99 | 66 | 171 | 173 | 0 |
| 141 | 148 | 176 | 26 | 143 | 178 | 60 | 153 | 142 | 91 | 179 | 12 | 168 | 113 | 95 | 174 | 56 | 134 | 92 | 46 | 108 | 125 |
| 10 | 172 | 154 | 63 | | | | | | | | | | | | | | | | | | |

FIG. 130

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 116 | 47 | 155 | 89 | 109 | 137 | 103 | 60 | 114 | 14 | 148 | 100 | 28 | 132 | 129 | 105 | 154 | 7 | 167 | 140 | 160 | 30 |
| 57 | 32 | 81 | 3 | 86 | 45 | 69 | 147 | 125 | 52 | 20 | 22 | 156 | 168 | 17 | 5 | 93 | 53 | 61 | 149 | 56 | 62 |
| 112 | 48 | 11 | 21 | 166 | 73 | 158 | 104 | 79 | 128 | 135 | 126 | 63 | 26 | 44 | 97 | 13 | 151 | 123 | 41 | 118 | 35 |
| 131 | 8 | 90 | 58 | 134 | 6 | 78 | 130 | 82 | 106 | 99 | 178 | 102 | 29 | 108 | 120 | 107 | 139 | 23 | 85 | 36 | 172 |
| 174 | 138 | 95 | 145 | 170 | 122 | 50 | 19 | 91 | 67 | 101 | 92 | 179 | 27 | 94 | 66 | 171 | 39 | 68 | 9 | 59 | 146 |
| 15 | 31 | 38 | 49 | 37 | 64 | 77 | 152 | 144 | 72 | 165 | 163 | 24 | 1 | 2 | 111 | 80 | 124 | 43 | 136 | 127 | 153 |
| 75 | 42 | 113 | 18 | 164 | 133 | 142 | 98 | 96 | 4 | 51 | 150 | 46 | 121 | 76 | 10 | 25 | 176 | 34 | 110 | 115 | 143 |
| 173 | 169 | 40 | 65 | 157 | 175 | 70 | 33 | 141 | 71 | 119 | 16 | 162 | 177 | 12 | 84 | 87 | 117 | 0 | 88 | 161 | 55 |
| 54 | 83 | 74 | 159 | | | | | | | | | | | | | | | | | | |

FIG. 132

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 168 | 18 | 46 | 131 | 88 | 90 | 11 | 89 | 111 | 174 | 172 | 38 | 78 | 153 | 9 | 80 | 53 | 27 | 44 | 79 | 35 | 83 |
| 171 | 51 | 37 | 99 | 95 | 119 | 117 | 127 | 112 | 166 | 28 | 123 | 33 | 160 | 29 | 6 | 135 | 10 | 66 | 69 | 74 | 92 |
| 15 | 109 | 106 | 178 | 65 | 141 | 0 | 3 | 154 | 156 | 164 | 7 | 45 | 115 | 122 | 148 | 110 | 24 | 121 | 126 | 23 | 175 |
| 21 | 113 | 58 | 43 | 26 | 143 | 56 | 142 | 39 | 147 | 30 | 25 | 101 | 145 | 136 | 19 | 4 | 48 | 158 | 118 | 133 | 49 |
| 20 | 102 | 14 | 151 | 5 | 2 | 72 | 103 | 75 | 60 | 84 | 34 | 157 | 169 | 31 | 161 | 81 | 70 | 85 | 159 | 132 | 41 |
| 152 | 179 | 98 | 144 | 36 | 16 | 87 | 40 | 91 | 1 | 130 | 108 | 139 | 94 | 97 | 8 | 104 | 13 | 150 | 137 | 47 | 73 |
| 62 | 12 | 50 | 61 | 105 | 100 | 86 | 146 | 165 | 22 | 17 | 57 | 167 | 59 | 96 | 120 | 155 | 77 | 162 | 55 | 68 | 140 |
| 134 | 82 | 76 | 125 | 32 | 176 | 138 | 173 | 177 | 163 | 107 | 170 | 71 | 129 | 63 | 93 | 42 | 52 | 116 | 149 | 54 | 128 |
| 124 | 114 | 67 | 64 | | | | | | | | | | | | | | | | | | |

FIG. 133

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 18 | 150 | 165 | 42 | 81 | 48 | 63 | 45 | 93 | 152 | 25 | 16 | 174 | 29 | 47 | 83 | 8 | 60 | 30 | 66 | 11 | 113 |
| 44 | 148 | 4 | 155 | 59 | 33 | 134 | 99 | 32 | 176 | 109 | 72 | 36 | 111 | 106 | 73 | 170 | 126 | 64 | 88 | 20 | 17 |
| 172 | 154 | 120 | 121 | 139 | 77 | 98 | 43 | 105 | 133 | 19 | 41 | 78 | 15 | 7 | 145 | 94 | 136 | 131 | 163 | 65 | 31 |
| 96 | 79 | 119 | 143 | 10 | 95 | 9 | 146 | 14 | 118 | 162 | 37 | 97 | 49 | 22 | 51 | 127 | 6 | 71 | 132 | 87 | 21 |
| 39 | 38 | 54 | 115 | 159 | 161 | 84 | 108 | 13 | 102 | 135 | 103 | 156 | 67 | 173 | 76 | 75 | 164 | 52 | 142 | 69 | 130 |
| 56 | 153 | 74 | 166 | 158 | 124 | 141 | 58 | 116 | 85 | 175 | 169 | 168 | 147 | 35 | 62 | 5 | 123 | 100 | 90 | 122 | 101 |
| 149 | 112 | 140 | 86 | 68 | 89 | 125 | 27 | 177 | 160 | 0 | 80 | 55 | 151 | 53 | 2 | 70 | 167 | 114 | 129 | 179 | 138 |
| 1 | 92 | 26 | 50 | 28 | 110 | 61 | 82 | 91 | 117 | 107 | 178 | 34 | 157 | 137 | 128 | 40 | 24 | 57 | 3 | 171 | 46 |
| 104 | 12 | 144 | 23 | | | | | | | | | | | | | | | | | | |

FIG. 134

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 18 | 8 | 166 | 117 | 4 | 111 | 142 | 148 | 176 | 91 | 120 | 144 | 99 | 124 | 20 | 25 | 31 | 78 | 36 | 72 | 2 | 98 |
| 93 | 74 | 174 | 52 | 152 | 62 | 88 | 75 | 23 | 97 | 147 | 15 | 71 | 1 | 127 | 138 | 81 | 83 | 68 | 94 | 112 | 119 |
| 121 | 89 | 163 | 85 | 86 | 28 | 17 | 64 | 14 | 44 | 158 | 159 | 150 | 32 | 128 | 70 | 90 | 29 | 30 | 63 | 100 | 65 |
| 129 | 140 | 177 | 46 | 84 | 92 | 10 | 33 | 58 | 7 | 96 | 151 | 171 | 40 | 76 | 6 | 3 | 37 | 104 | 57 | 135 | 103 |
| 141 | 107 | 116 | 160 | 41 | 153 | 175 | 55 | 130 | 118 | 131 | 42 | 27 | 133 | 95 | 179 | 34 | 21 | 87 | 106 | 105 | 108 |
| 79 | 134 | 113 | 26 | 164 | 114 | 73 | 102 | 77 | 22 | 110 | 161 | 43 | 122 | 123 | 82 | 5 | 48 | 139 | 60 | 49 | 154 |
| 115 | 146 | 67 | 69 | 137 | 109 | 143 | 24 | 101 | 45 | 16 | 12 | 19 | 178 | 80 | 51 | 47 | 149 | 50 | 172 | 170 | 169 |
| 61 | 9 | 39 | 136 | 59 | 38 | 54 | 156 | 126 | 125 | 145 | 0 | 13 | 155 | 132 | 162 | 11 | 157 | 66 | 165 | 173 | 56 |
| 168 | 167 | 53 | 35 | | | | | | | | | | | | | | | | | | |

FIG. 136

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 51 | 47 | 53 | 43 | 55 | 59 | 49 | 33 | 35 | 31 | 24 | 37 | 0 | 2 | 45 | 41 | 39 | 57 | 42 | 44 | 52 | 40 |
| 23 | 30 | 32 | 34 | 54 | 56 | 46 | 50 | 122 | 48 | 1 | 36 | 38 | 58 | 77 | 3 | 65 | 81 | 67 | 147 | 83 | 69 |
| 26 | 75 | 85 | 73 | 79 | 145 | 71 | 63 | 5 | 61 | 70 | 78 | 68 | 62 | 66 | 6 | 64 | 149 | 60 | 82 | 80 | 4 |
| 76 | 84 | 72 | 154 | 86 | 74 | 89 | 128 | 137 | 91 | 141 | 93 | 101 | 7 | 87 | 9 | 103 | 99 | 95 | 11 | 13 | 143 |
| 97 | 133 | 136 | 12 | 100 | 94 | 14 | 88 | 142 | 96 | 92 | 8 | 152 | 10 | 139 | 102 | 104 | 132 | 90 | 98 | 114 | 112 |
| 146 | 123 | 110 | 15 | 125 | 150 | 120 | 153 | 29 | 106 | 134 | 27 | 127 | 108 | 130 | 116 | 28 | 107 | 126 | 25 | 131 | 124 |
| 129 | 151 | 121 | 105 | 111 | 115 | 135 | 148 | 109 | 117 | 158 | 113 | 170 | 119 | 162 | 178 | 155 | 176 | 18 | 20 | 164 | 157 |
| 160 | 22 | 140 | 16 | 168 | 166 | 172 | 174 | 175 | 179 | 118 | 138 | 156 | 19 | 169 | 167 | 163 | 173 | 161 | 177 | 165 | 144 |
| 171 | 17 | 21 | 159 | | | | | | | | | | | | | | | | | | |

FIG. 138

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 71 | 38 | 98 | 159 | 1 | 32 | 28 | 177 | 125 | 102 | 83 | 17 | 121 | 151 | 66 | 92 | 140 | 6 | 165 | 23 | 75 | 91 |
| 87 | 108 | 163 | 50 | 77 | 39 | 110 | 128 | 73 | 148 | 14 | 5 | 68 | 37 | 53 | 93 | 149 | 26 | 166 | 48 | 79 | 10 |
| 122 | 150 | 103 | 178 | 119 | 101 | 61 | 34 | 8 | 86 | 36 | 138 | 146 | 72 | 179 | 143 | 147 | 89 | 4 | 107 | 33 | 144 |
| 141 | 40 | 100 | 29 | 118 | 63 | 46 | 20 | 153 | 90 | 152 | 124 | 7 | 30 | 31 | 43 | 78 | 120 | 85 | 25 | 52 | 47 |
| 64 | 81 | 175 | 94 | 115 | 15 | 112 | 99 | 13 | 21 | 42 | 169 | 76 | 19 | 168 | 16 | 27 | 162 | 167 | 164 | 97 | 82 |
| 44 | 106 | 12 | 109 | 132 | 145 | 161 | 174 | 95 | 0 | 105 | 134 | 173 | 84 | 9 | 65 | 88 | 54 | 67 | 116 | 154 | 80 |
| 22 | 172 | 60 | 111 | 133 | 56 | 170 | 104 | 131 | 123 | 24 | 49 | 113 | 136 | 55 | 3 | 157 | 156 | 35 | 58 | 45 | 155 |
| 70 | 59 | 57 | 171 | 176 | 74 | 117 | 18 | 127 | 114 | 11 | 69 | 158 | 129 | 139 | 62 | 135 | 96 | 142 | 41 | 130 | 160 |
| 2 | 126 | 51 | 137 | | | | | | | | | | | | | | | | | | |

FIG. 141

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 98 | 159 | 59 | 125 | 163 | 89 | 26 | 4 | 102 | 70 | 92 | 36 | 37 | 142 | 176 | 95 | 71 | 19 | 87 | 45 | 81 | 47 |
| 65 | 170 | 103 | 48 | 67 | 61 | 64 | 35 | 76 | 80 | 140 | 77 | 10 | 167 | 178 | 155 | 120 | 156 | 151 | 12 | 58 | 5 |
| 83 | 137 | 41 | 109 | 2 | 66 | 133 | 62 | 135 | 28 | 93 | 128 | 86 | 57 | 153 | 161 | 110 | 52 | 147 | 141 | 31 | 79 |
| 32 | 88 | 160 | 84 | 150 | 6 | 100 | 73 | 126 | 164 | 17 | 42 | 101 | 7 | 55 | 105 | 91 | 22 | 130 | 154 | 1 | 82 |
| 14 | 0 | 9 | 21 | 50 | 165 | 72 | 138 | 175 | 106 | 108 | 3 | 169 | 30 | 157 | 54 | 18 | 20 | 44 | 34 | 134 | 107 |
| 56 | 53 | 15 | 162 | 38 | 166 | 24 | 33 | 60 | 85 | 145 | 115 | 43 | 39 | 40 | 124 | 149 | 144 | 132 | 96 | 11 | 146 |
| 90 | 129 | 119 | 111 | 171 | 8 | 152 | 121 | 173 | 131 | 49 | 27 | 118 | 16 | 148 | 68 | 177 | 94 | 179 | 13 | 114 | 75 |
| 51 | 117 | 25 | 46 | 136 | 143 | 139 | 113 | 127 | 174 | 74 | 29 | 122 | 158 | 69 | 97 | 78 | 63 | 99 | 112 | 104 | 116 |
| 172 | 168 | 23 | 123 | | | | | | | | | | | | | | | | | | |

FIG. 158
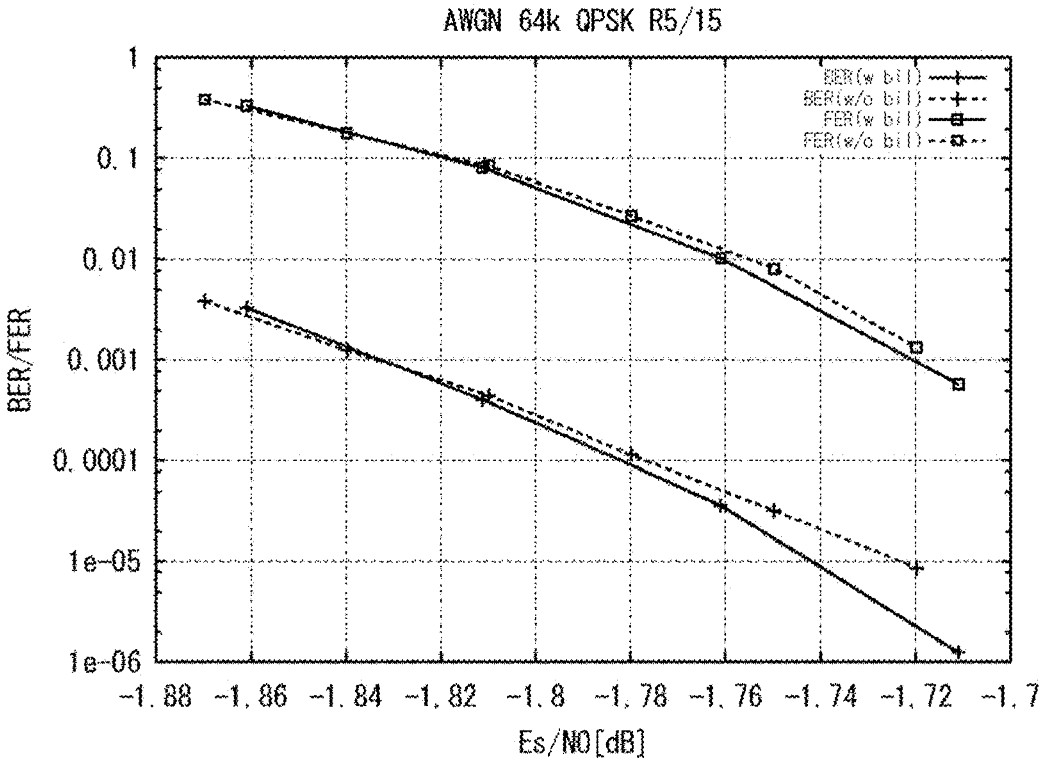
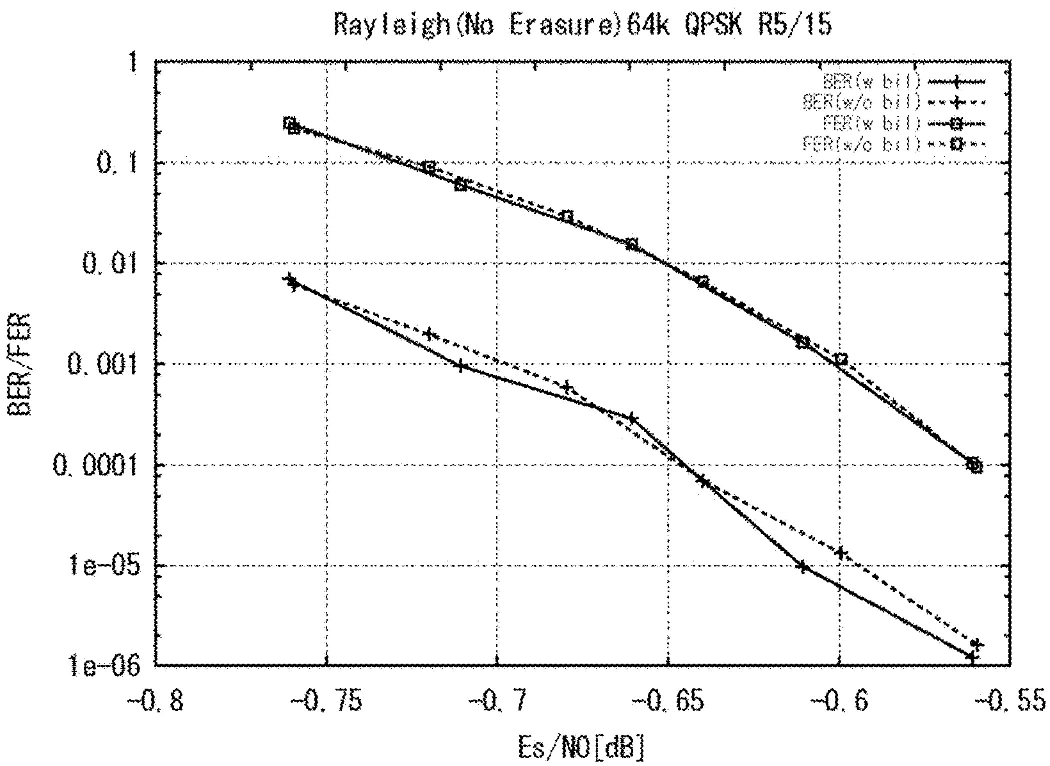

FIG. 160
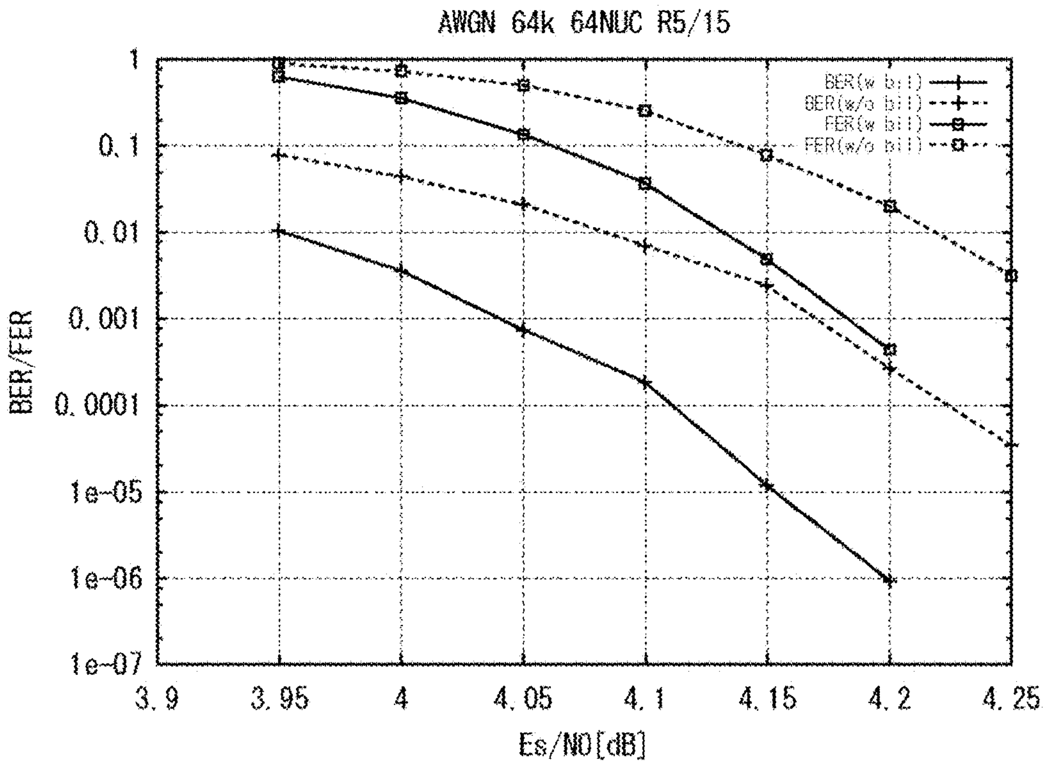
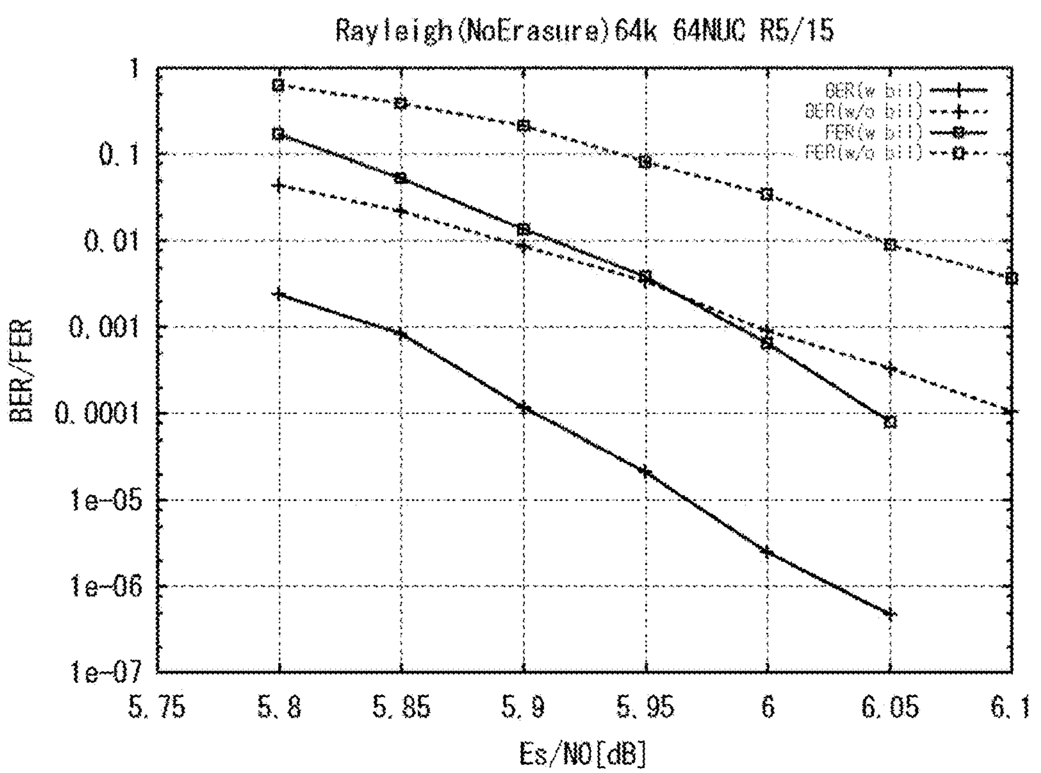

FIG. 162
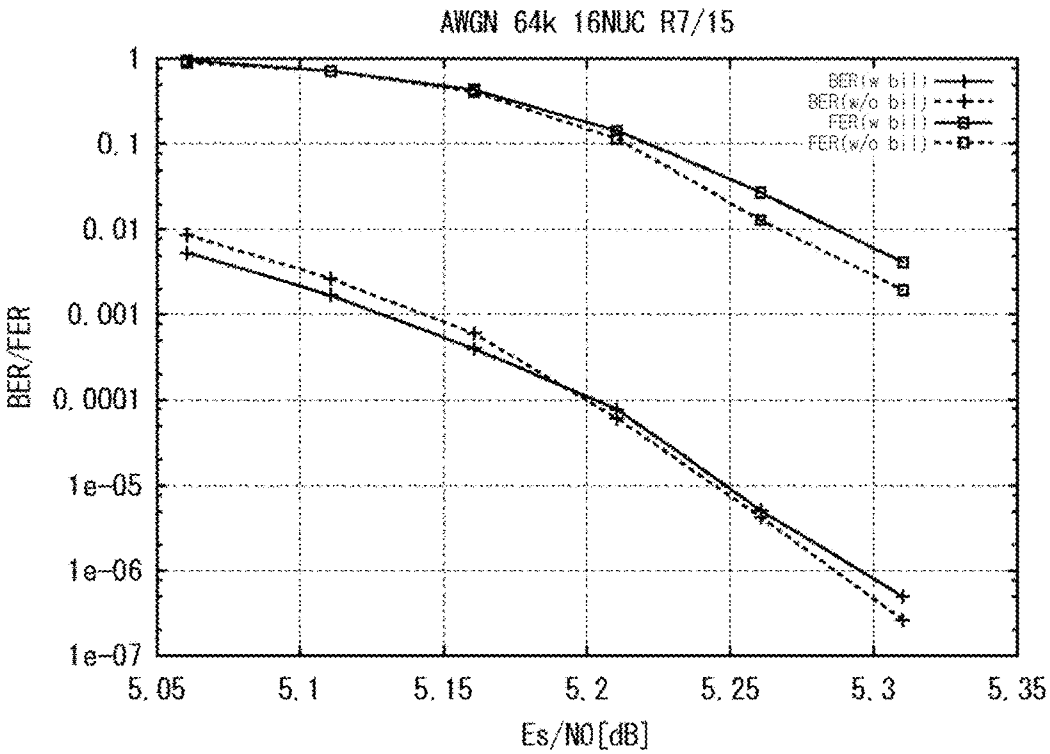
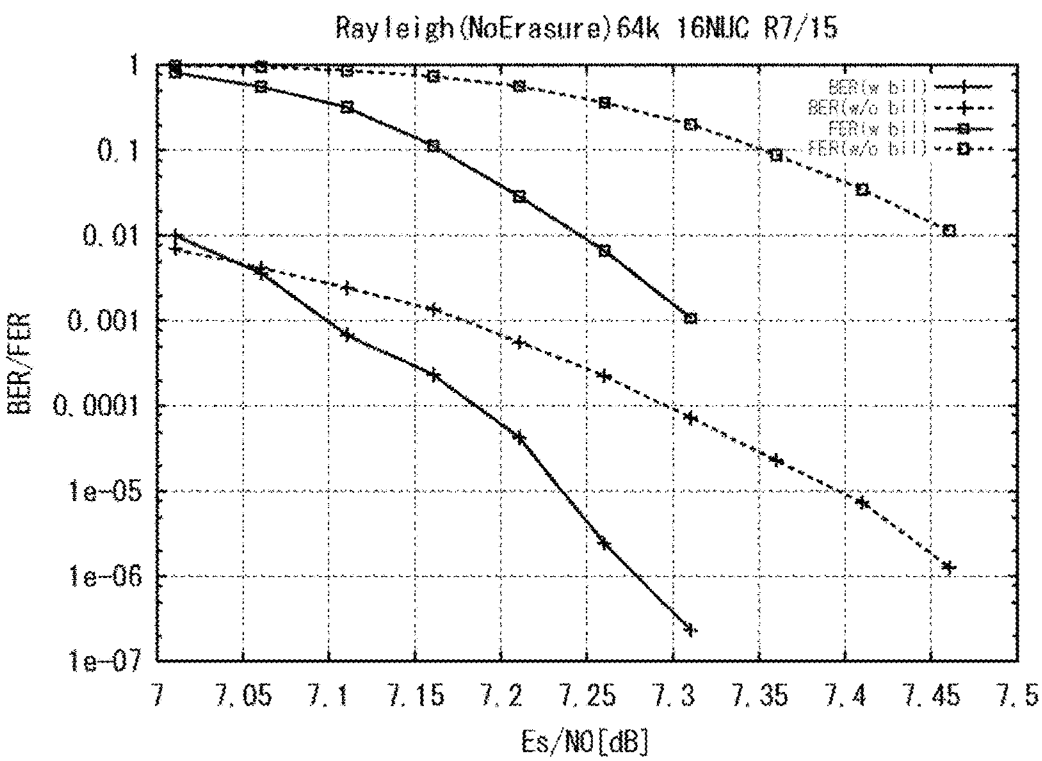

FIG. 163
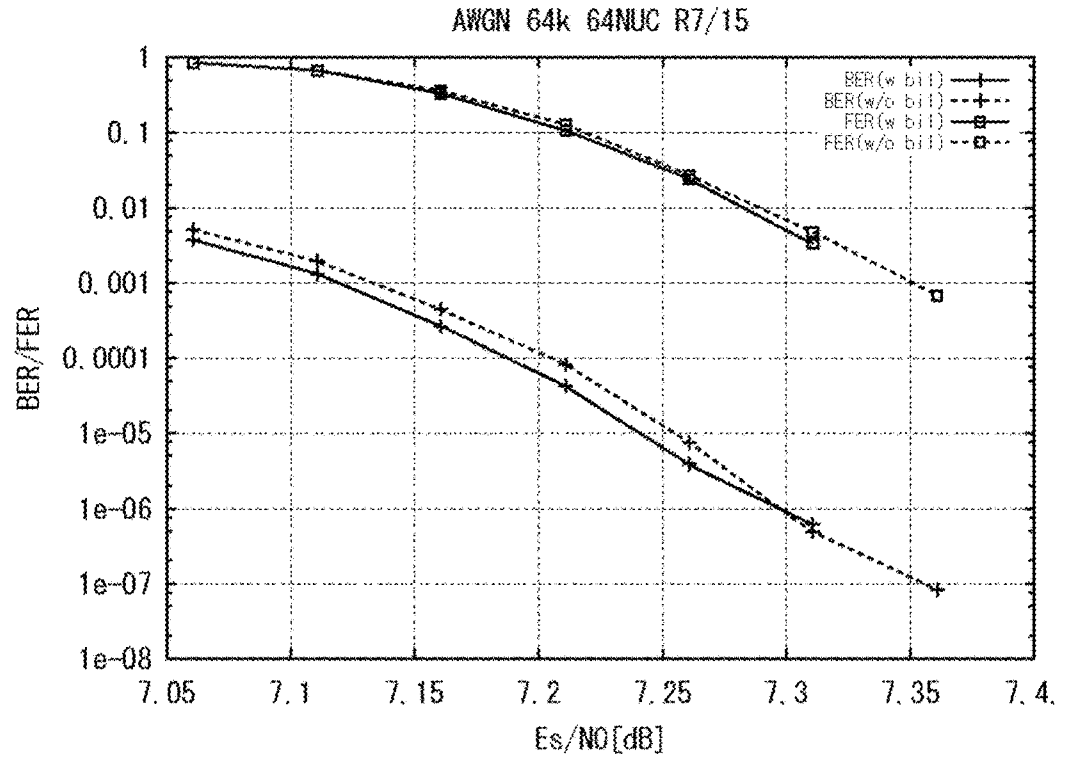
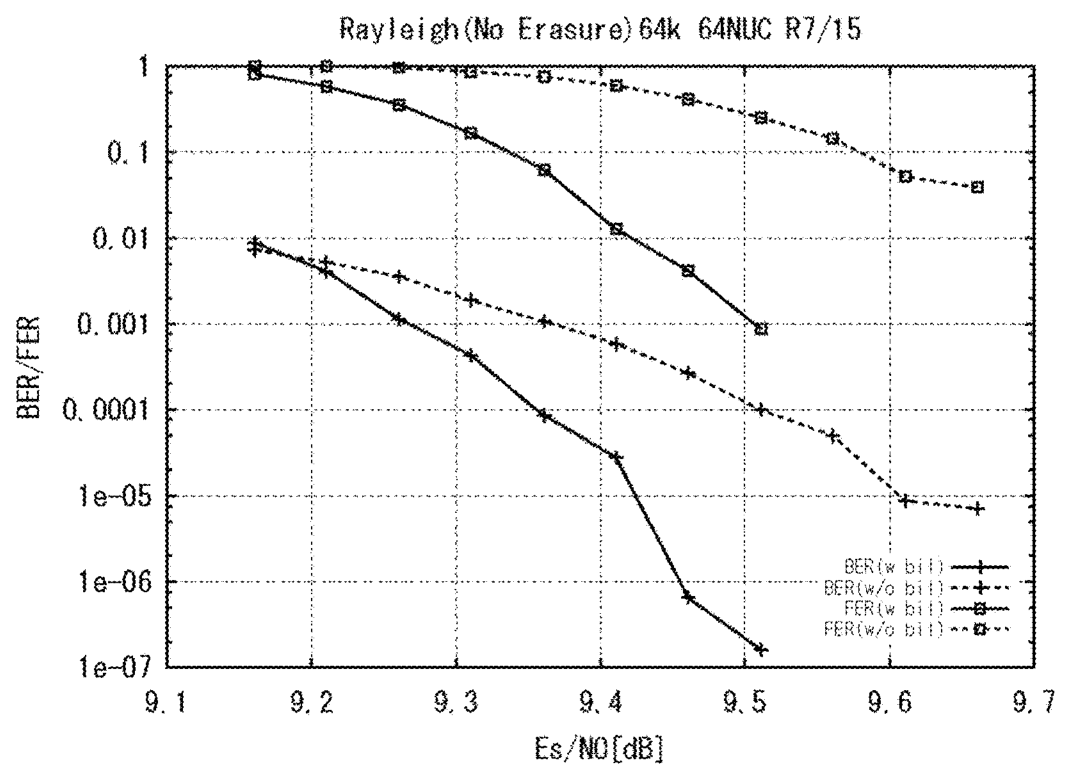

FIG. 166
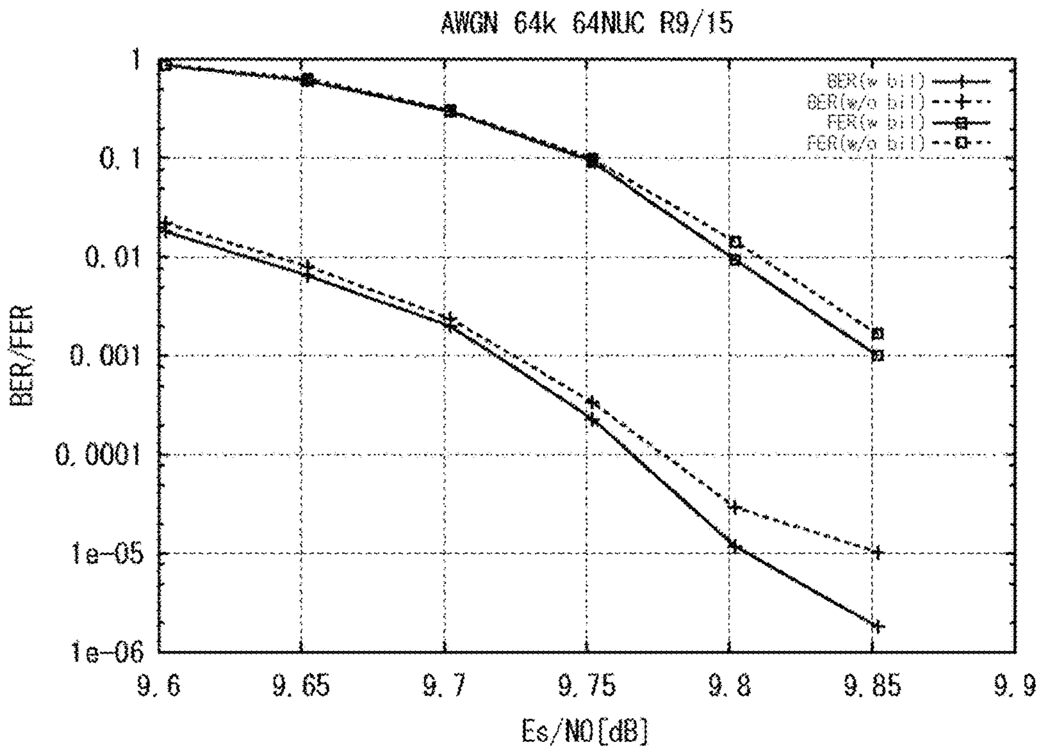
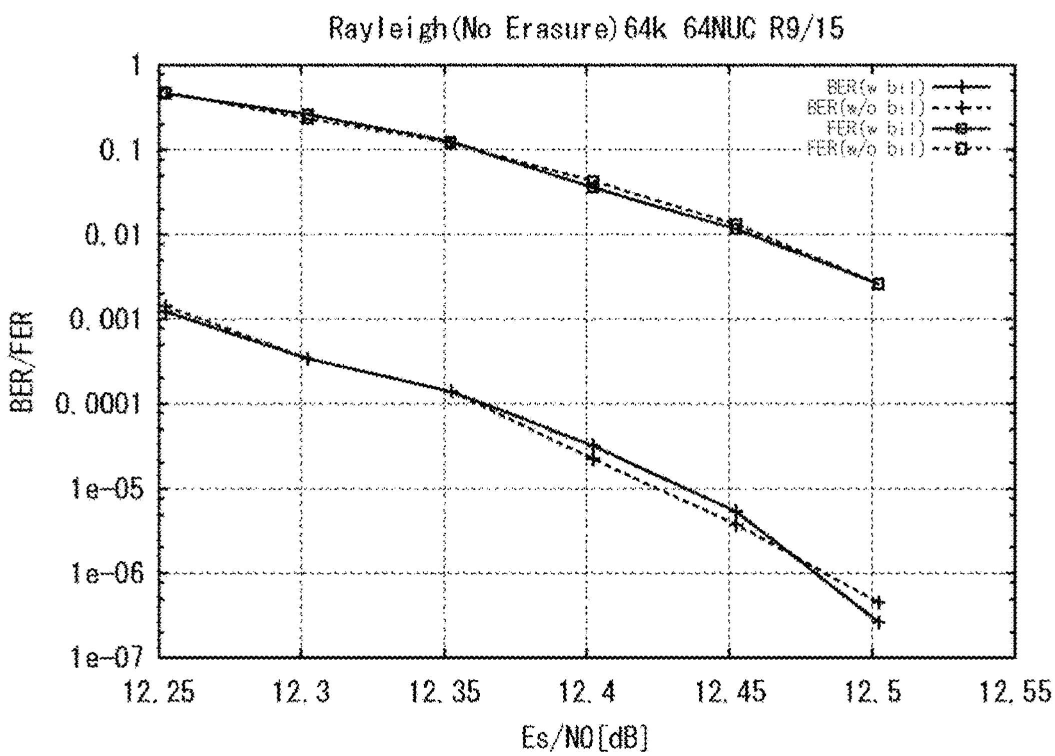

FIG. 174
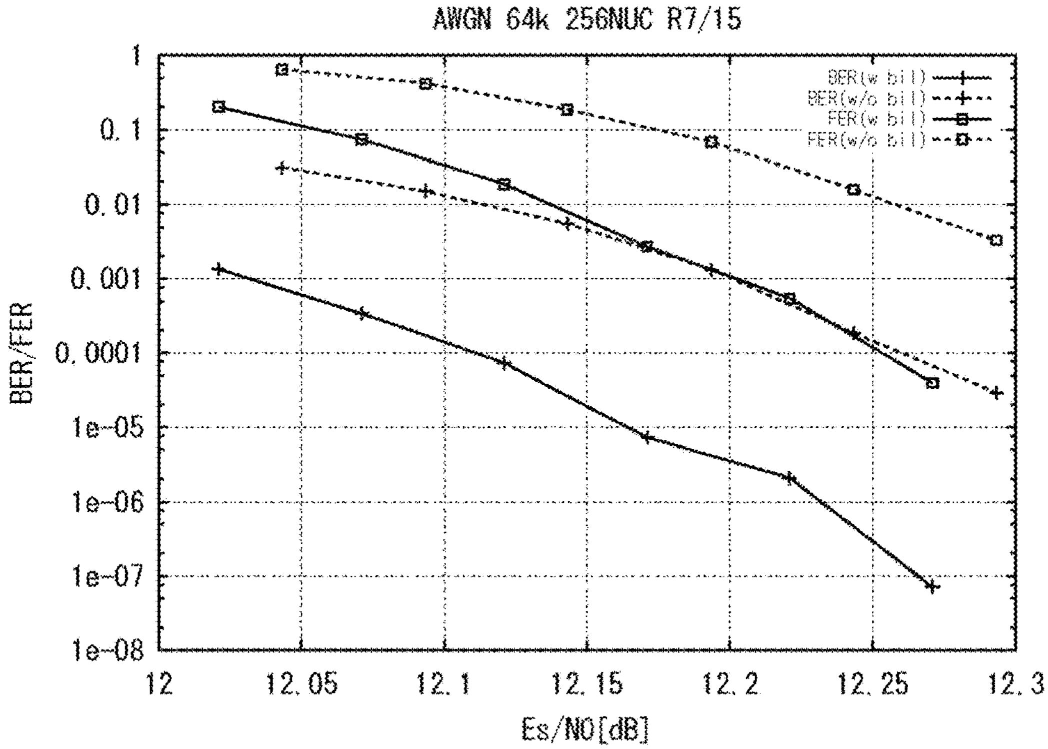
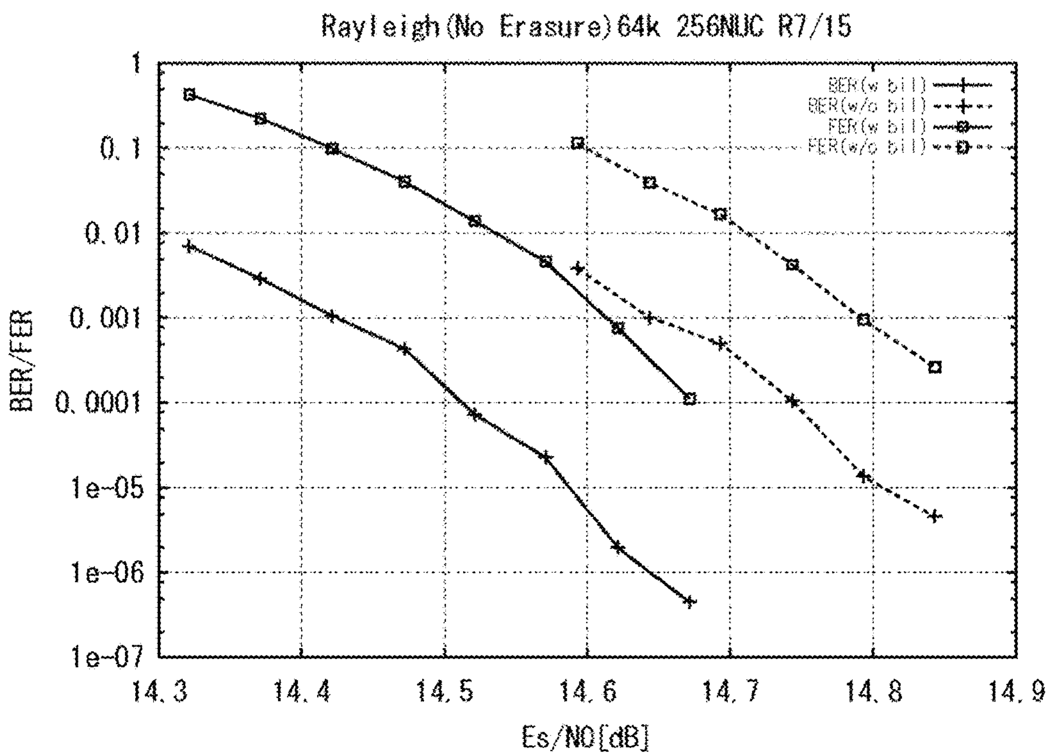

FIG. 176
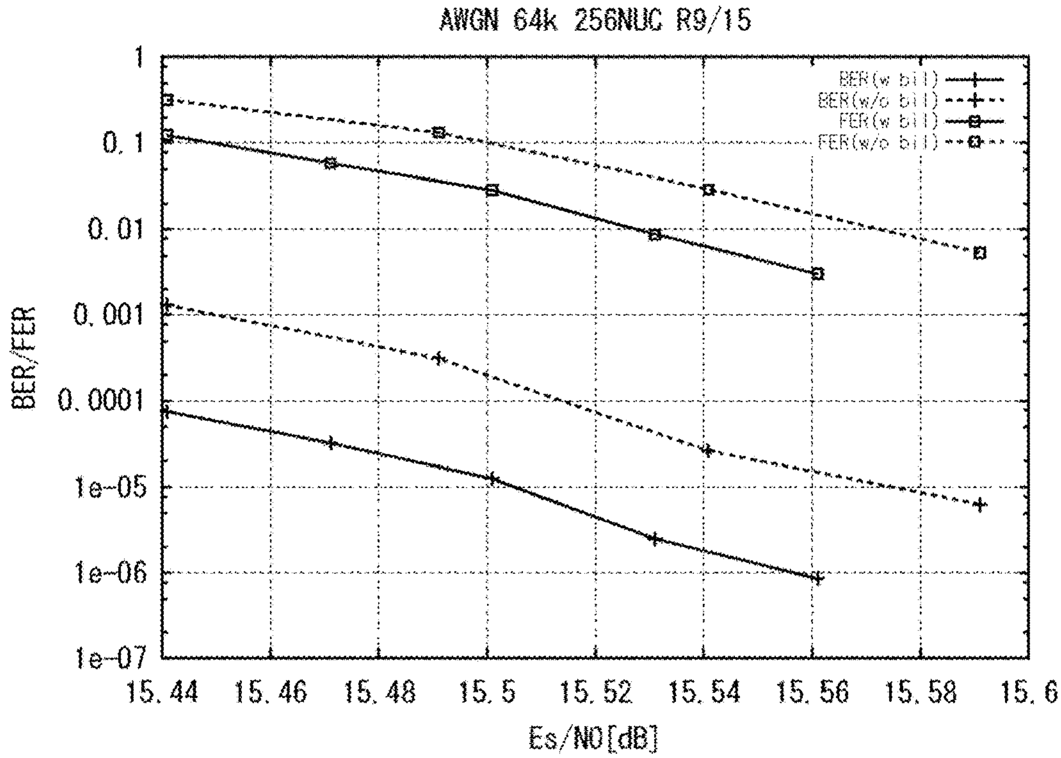
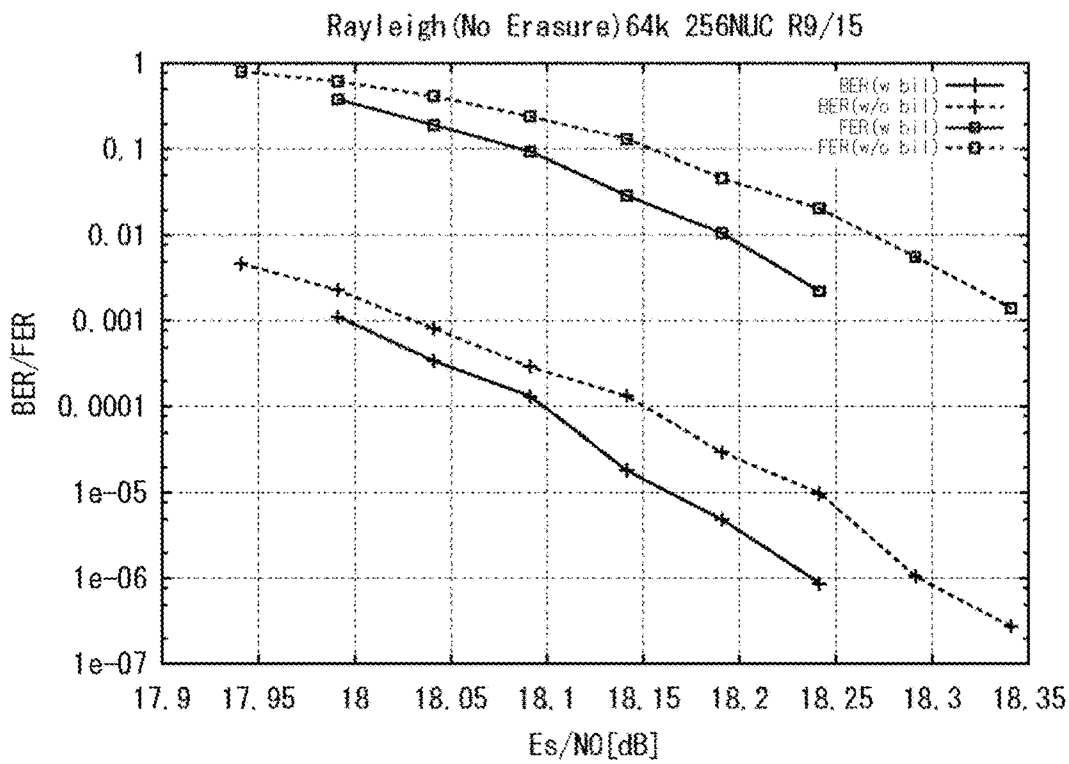

FIG. 178
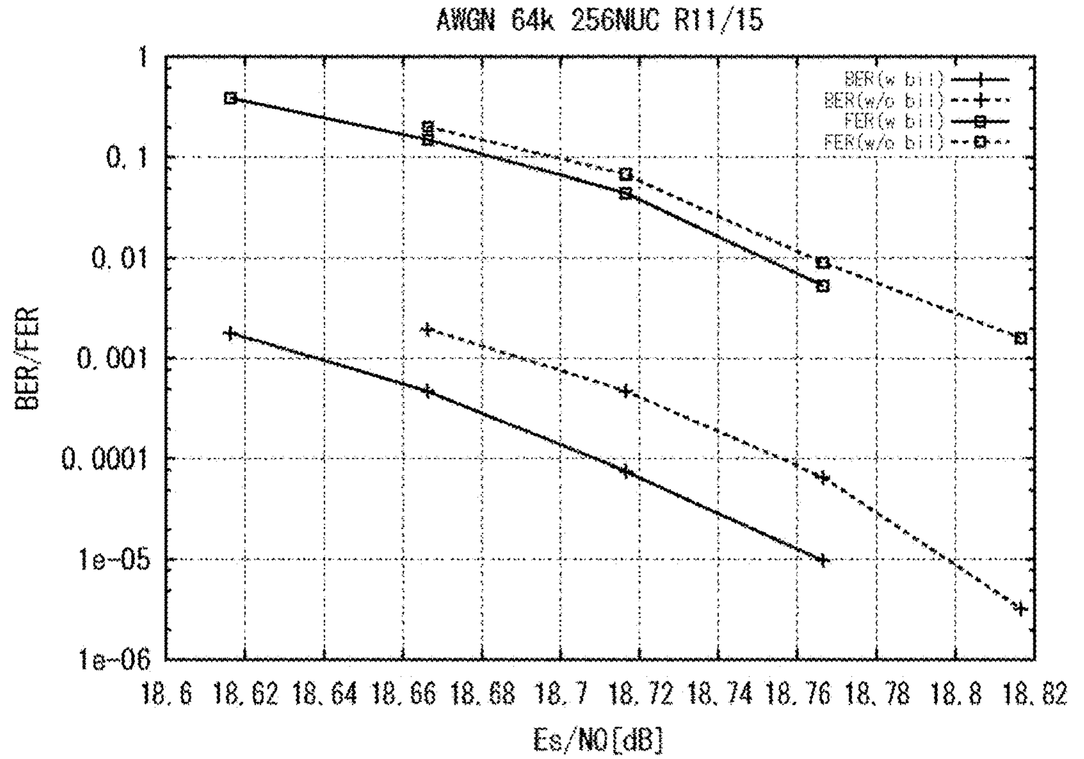
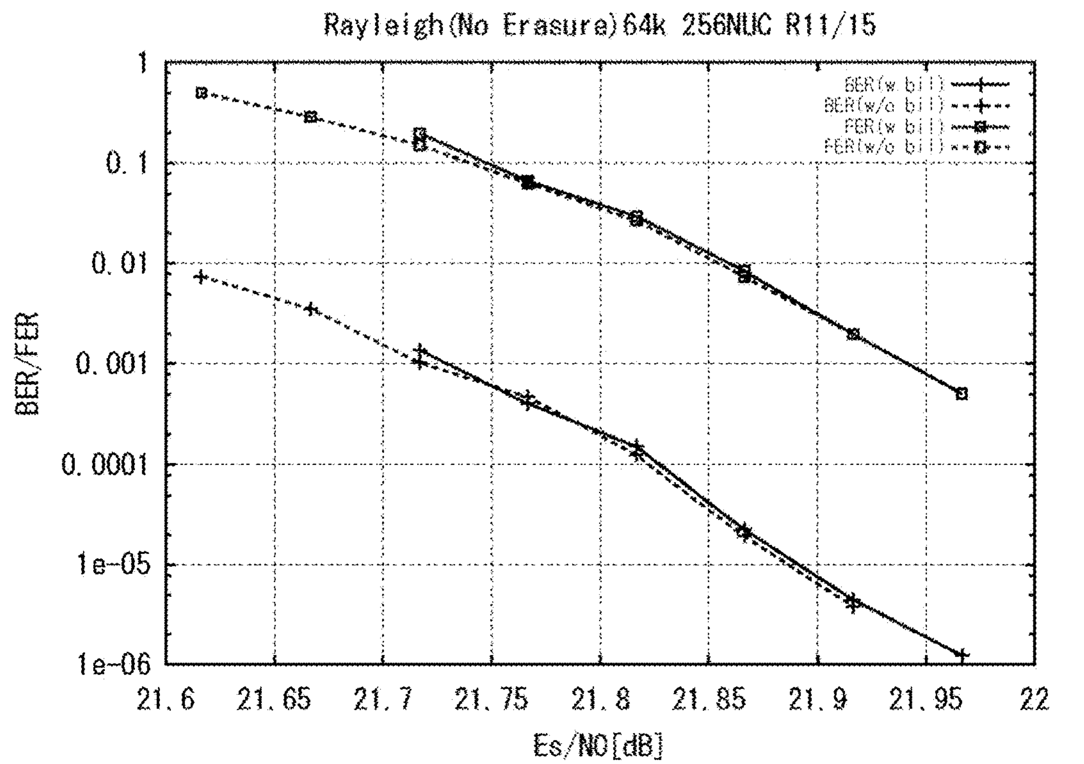

FIG. 179
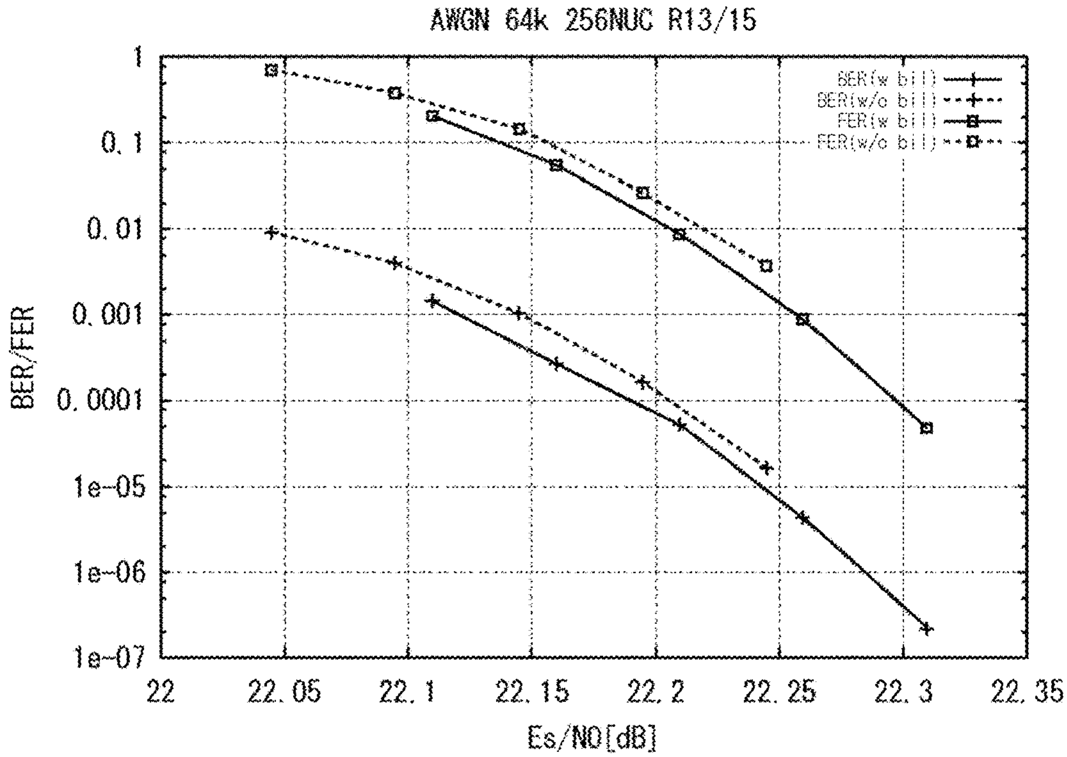
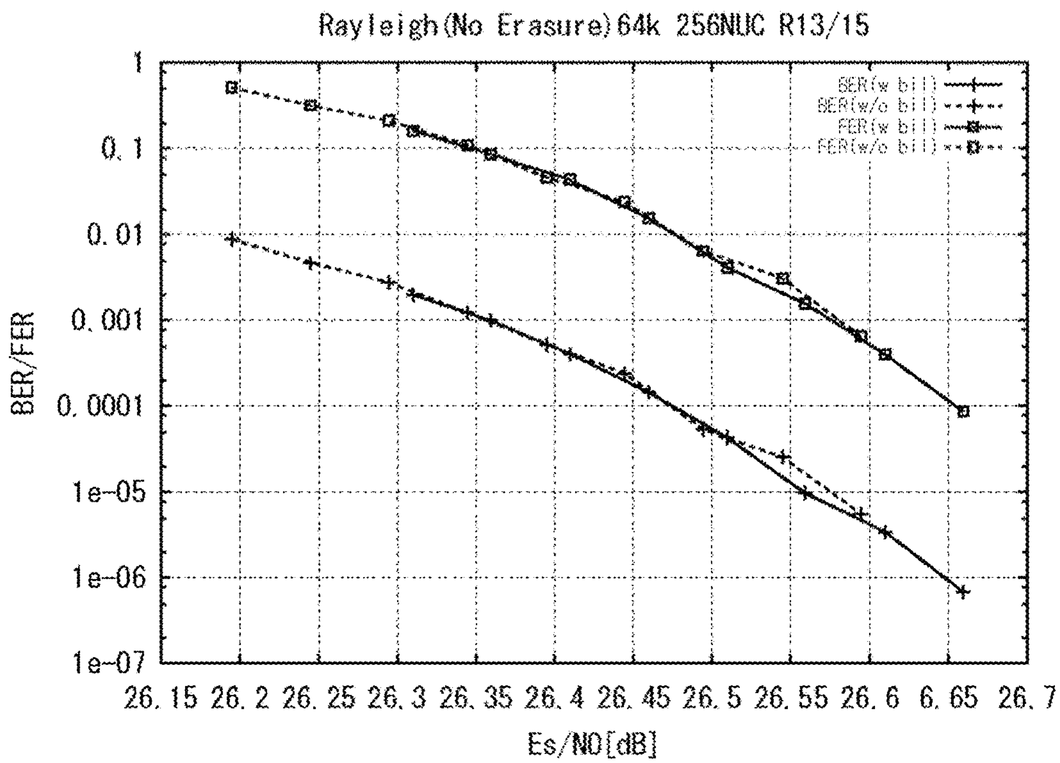

FIG. 181
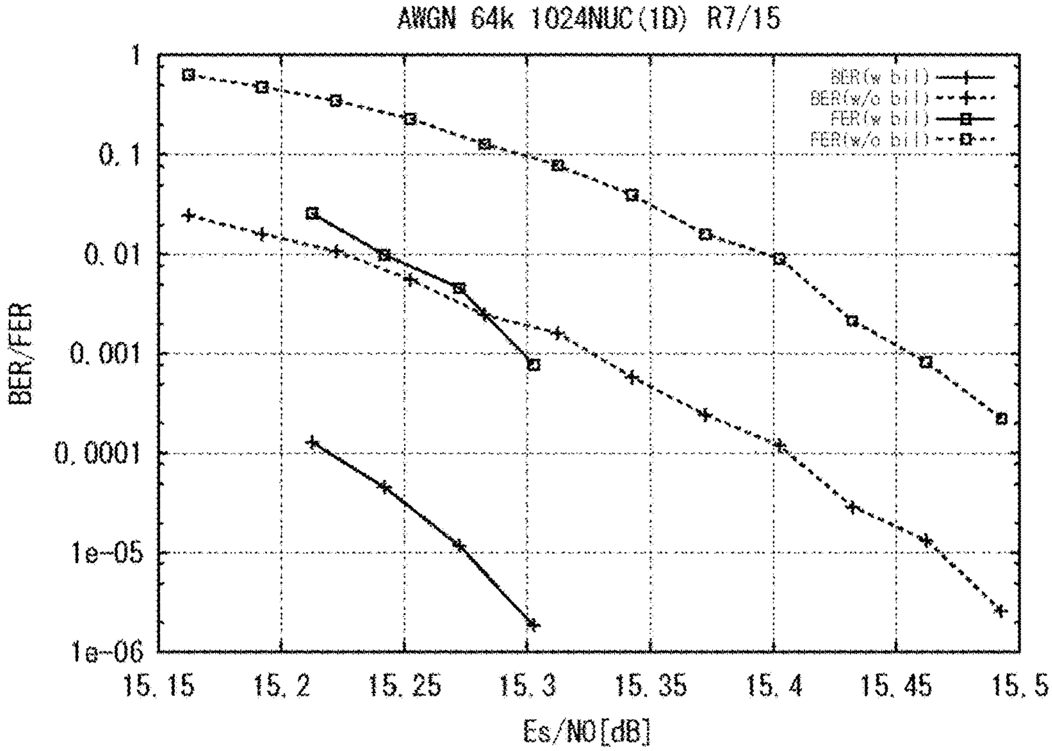
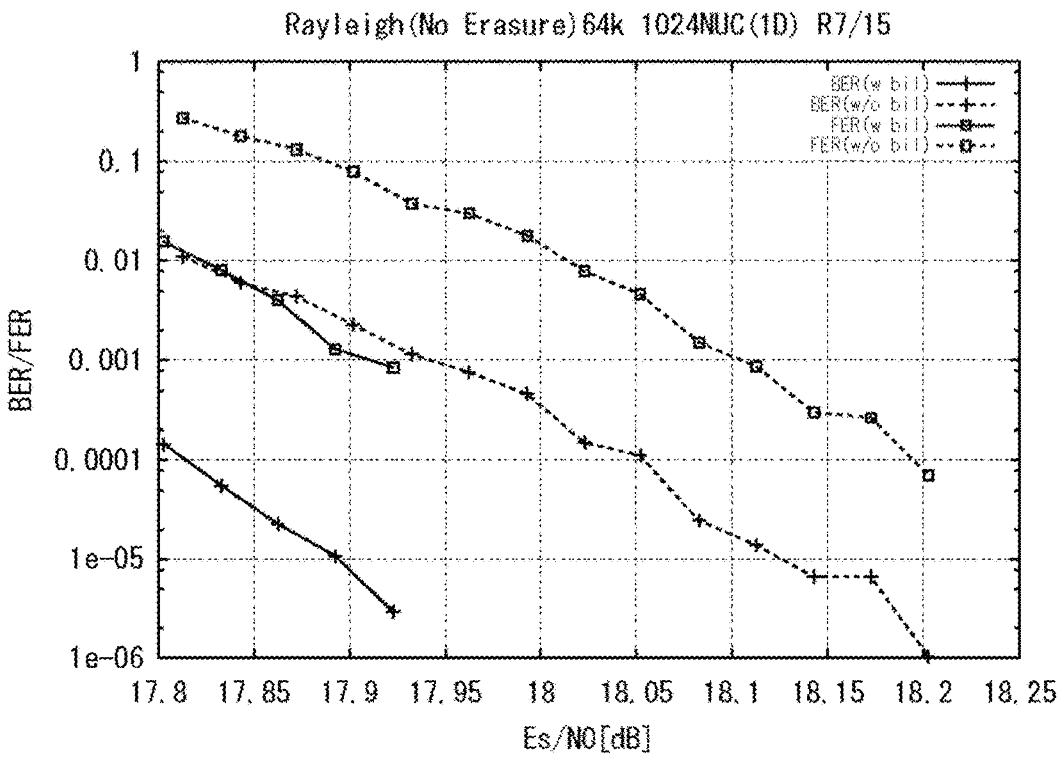

FIG. 185
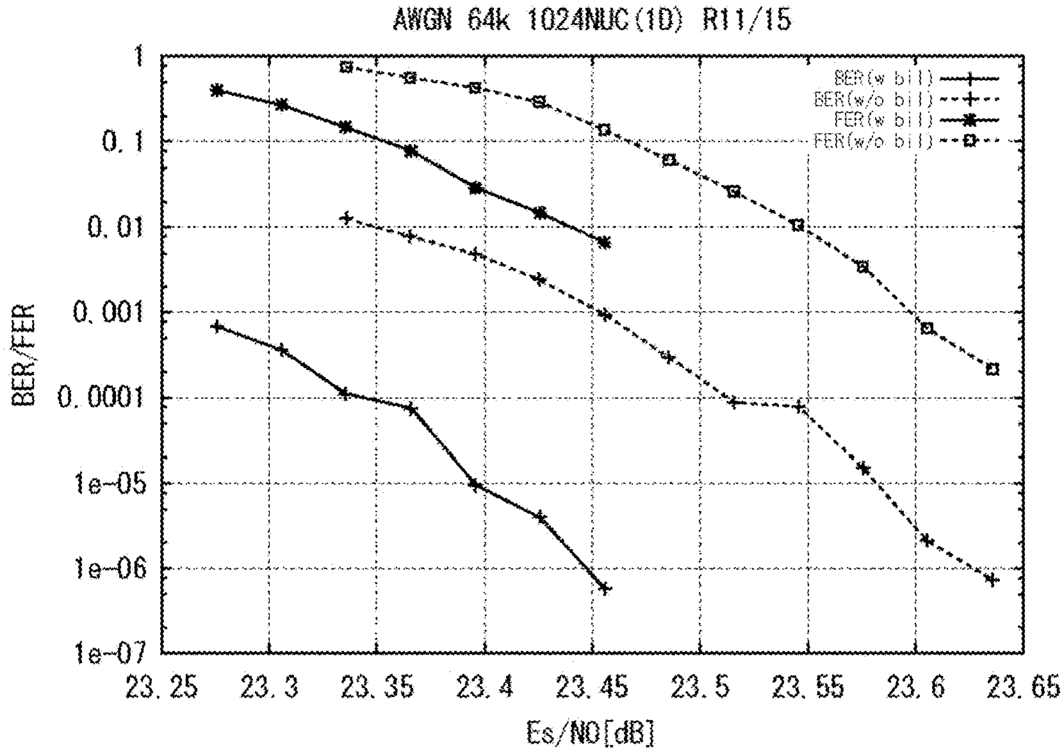
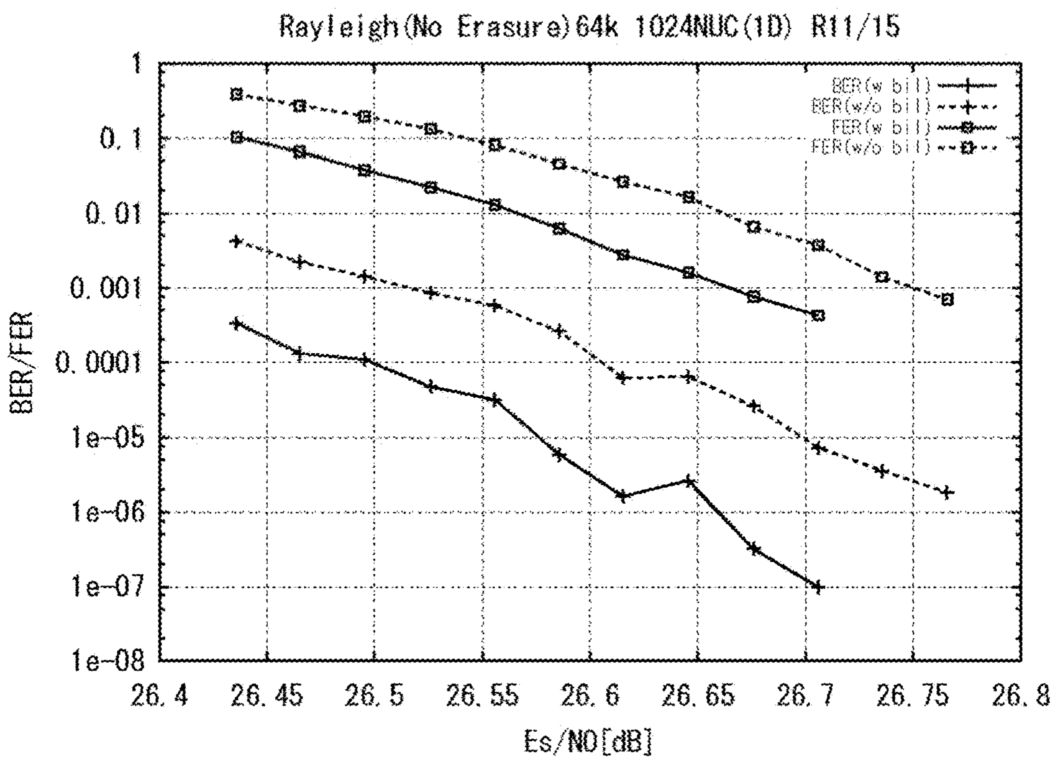

FIG. 188
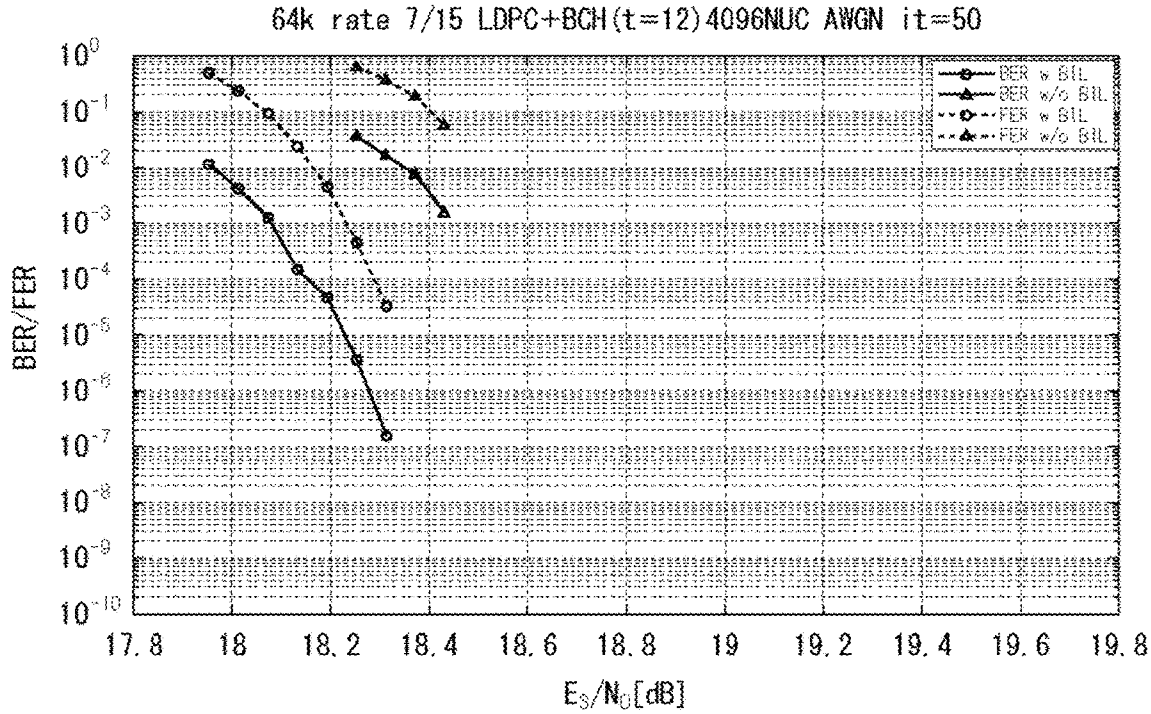
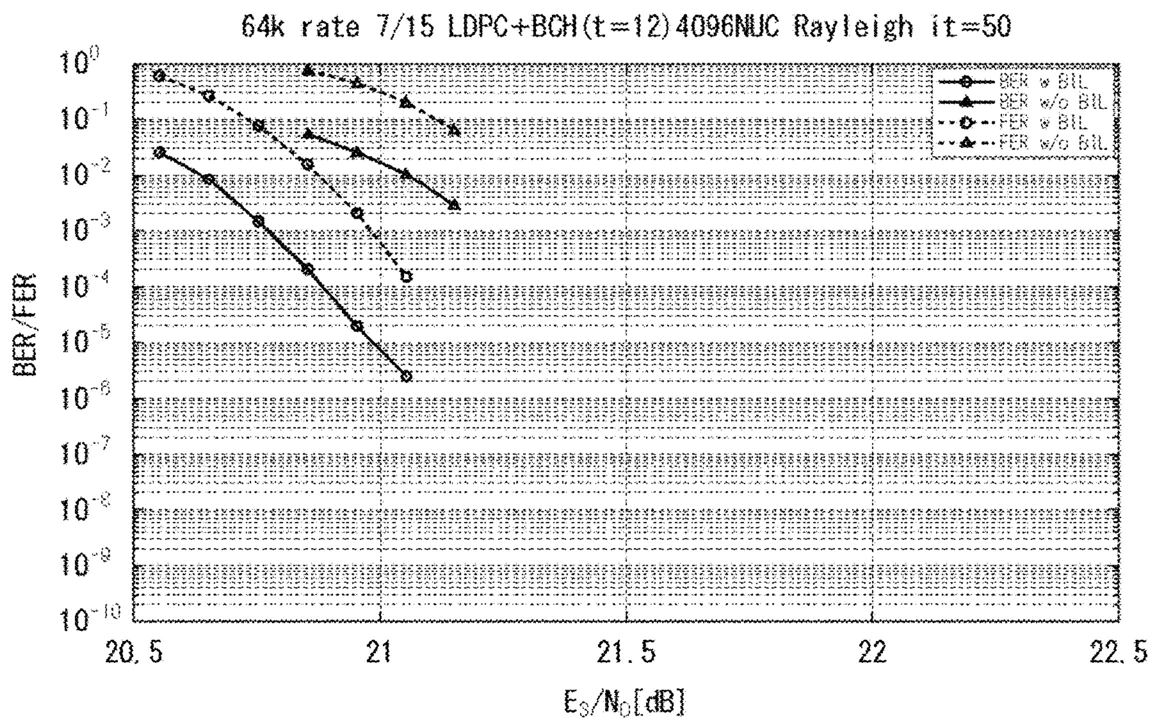

FIG. 193
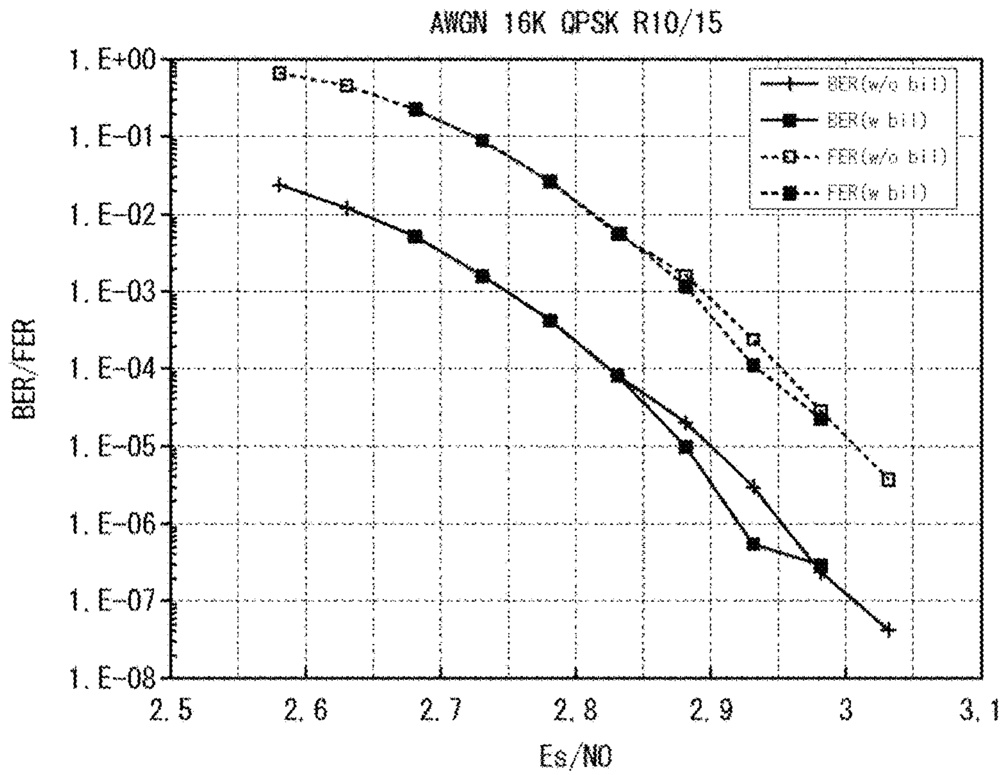
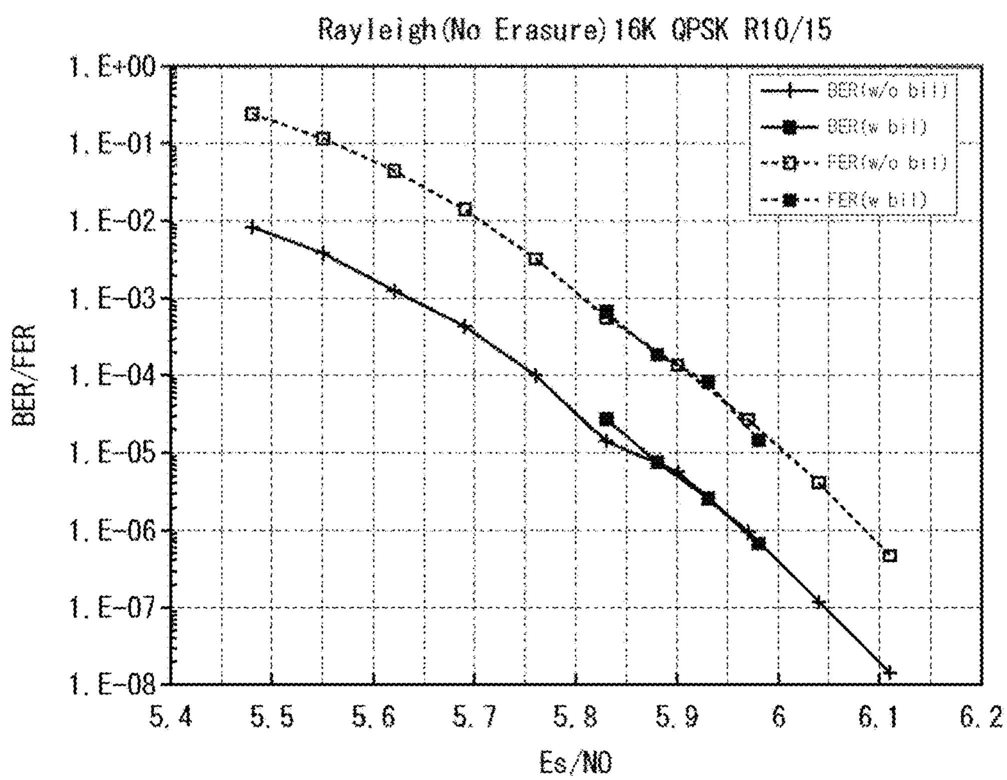

FIG. 194
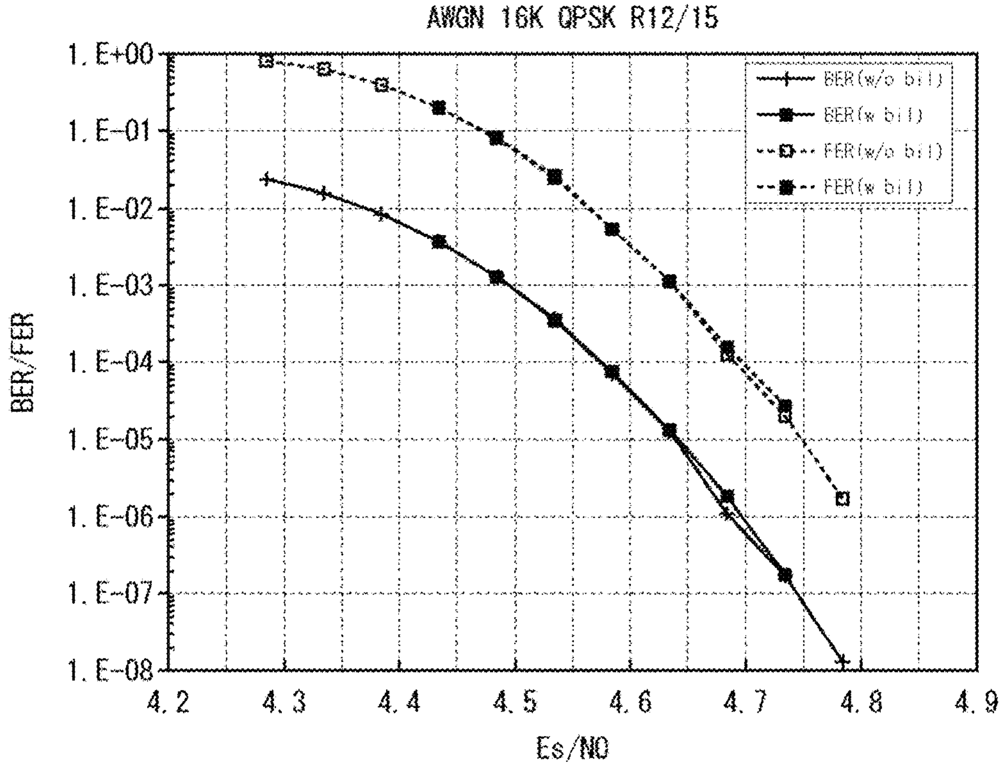
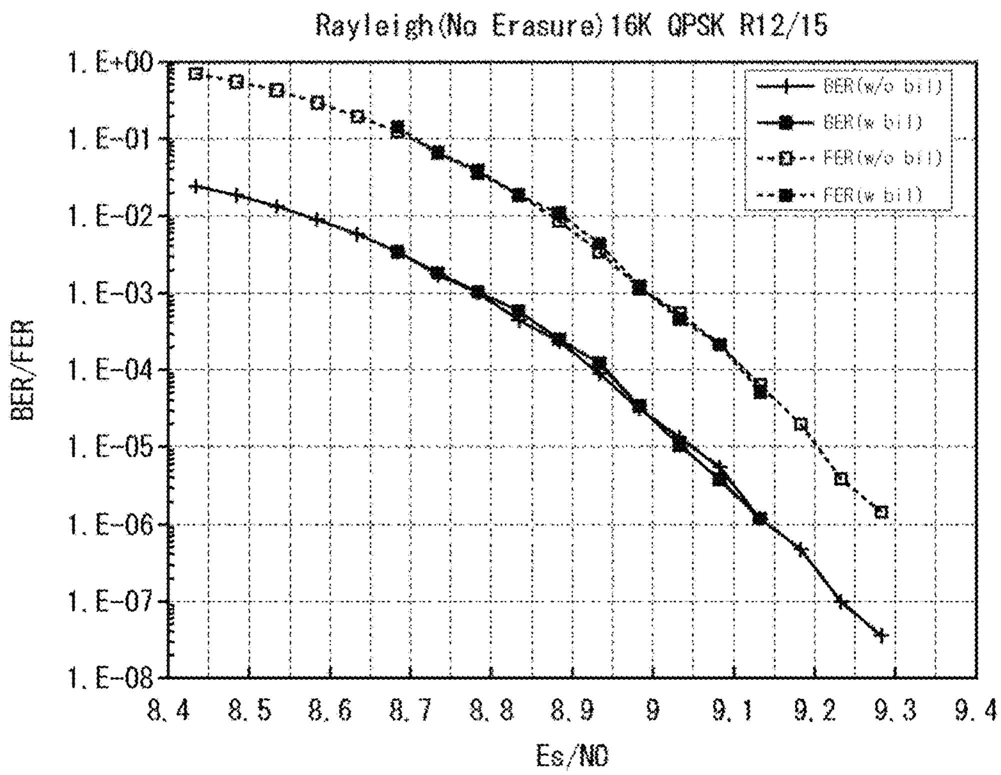

FIG. 201
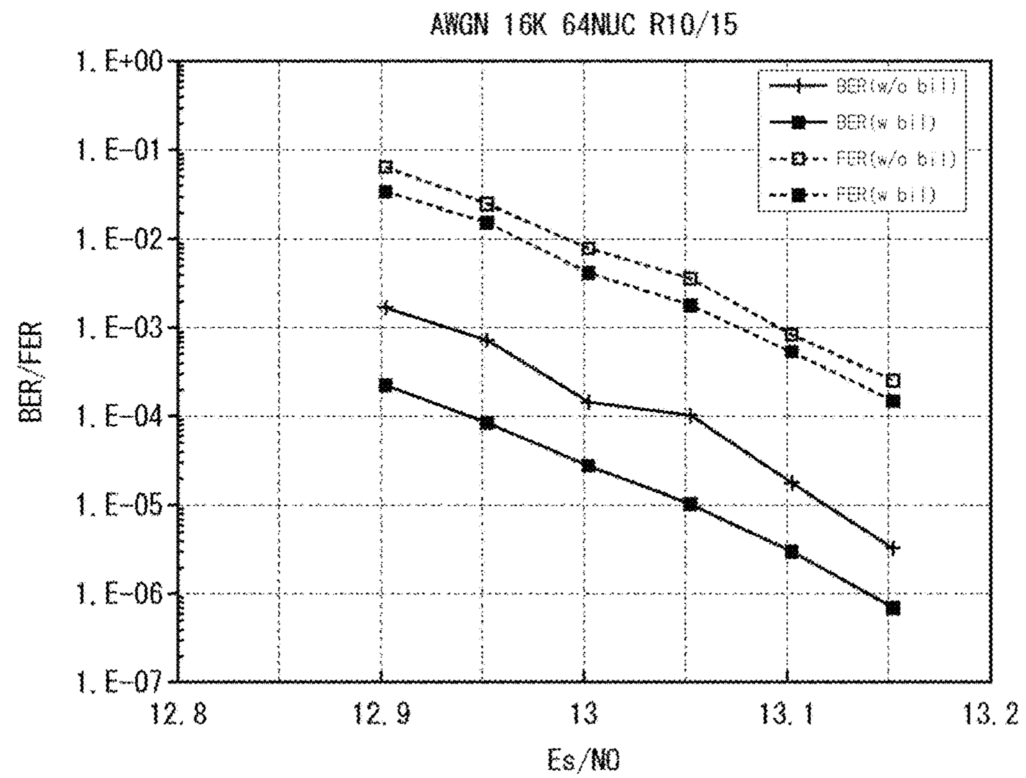
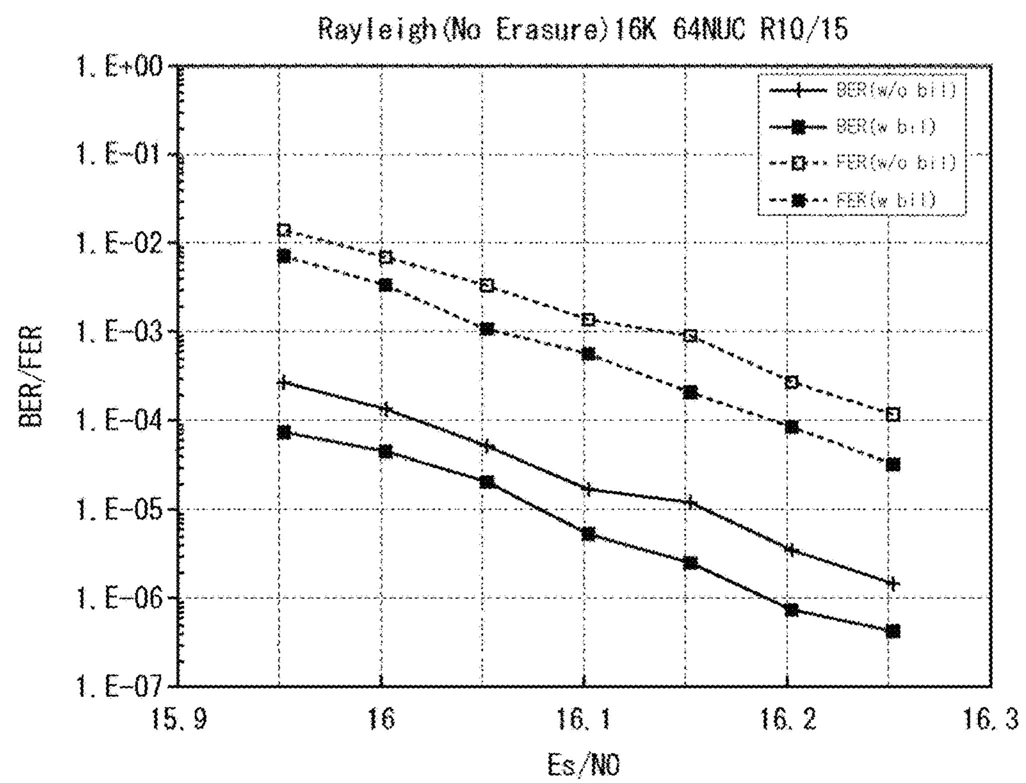

FIG. 204
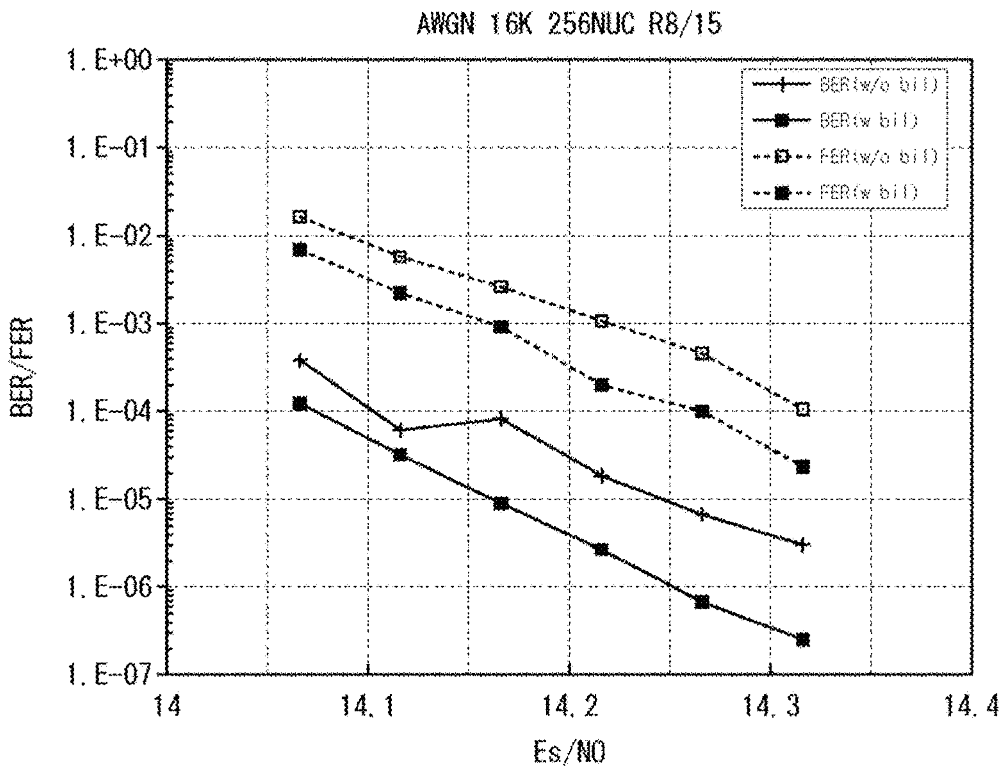
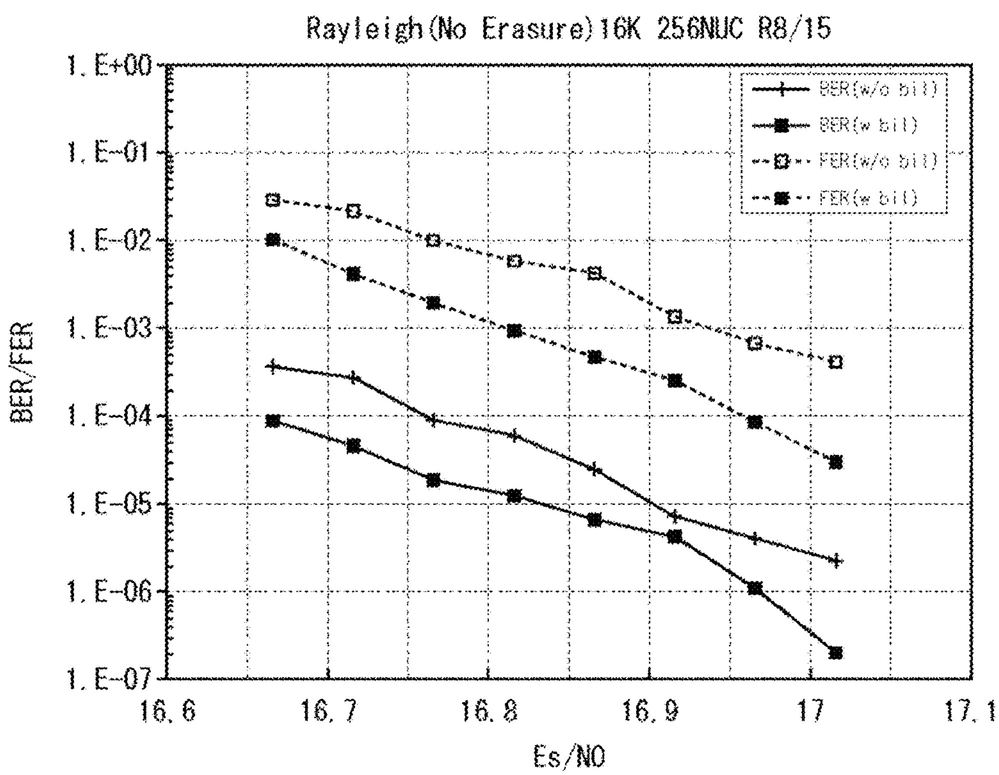

FIG. 205
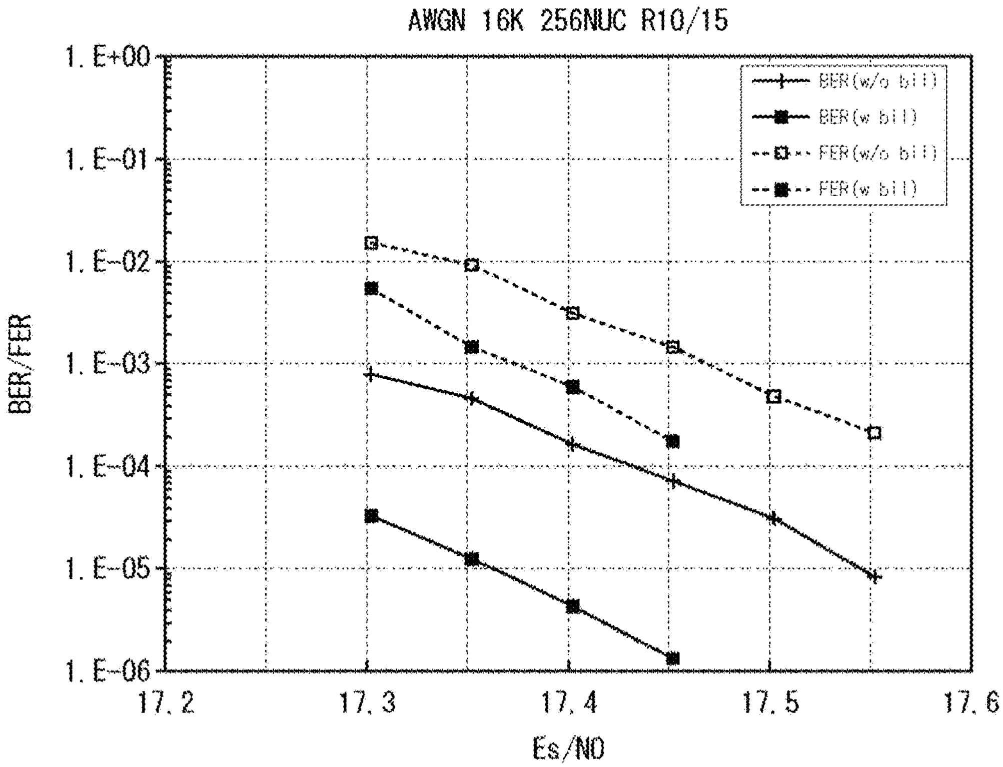
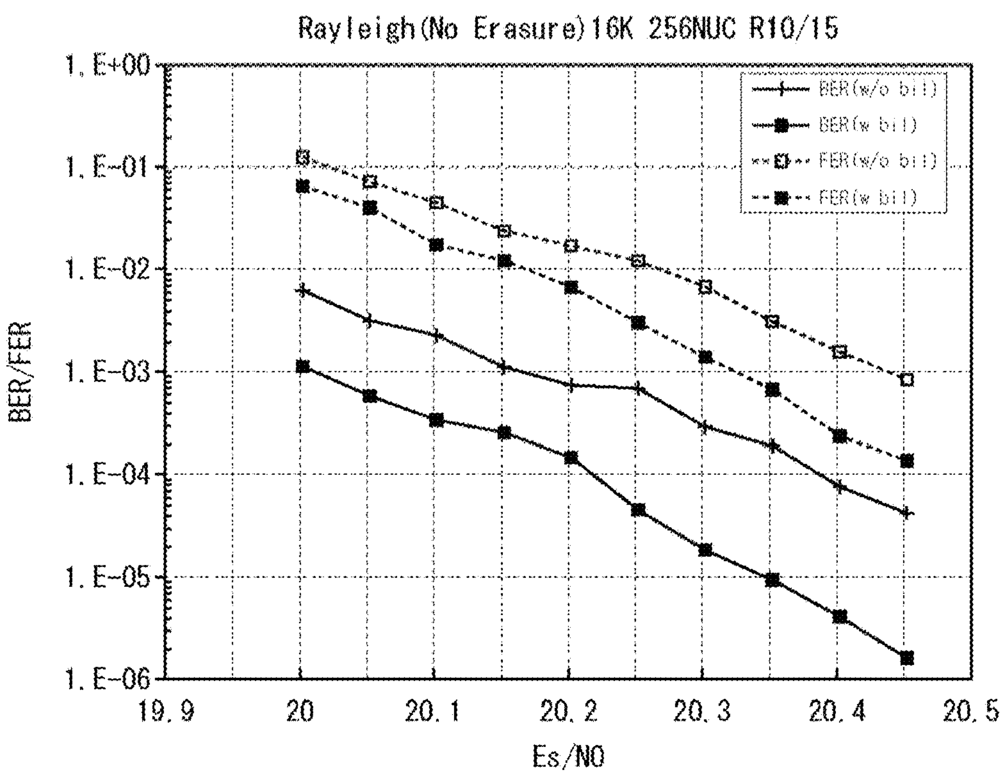

H =

DATA PROCESSING DEVICE AND DATA PROCESSING METHOD

CROSS-REFERENCE TO RELATED APPLICATIONS

This application is a continuation of U.S. application Ser. No. 16/290,147, filed Mar. 1, 2019, which is a continuation of U.S. application Ser. No. 15/935,439, filed Mar. 26, 2018, which is a continuation of U.S. application Ser. No. 15/310,930, filed Nov. 14, 2016, which is a national stage of International Application No. PCT/JP2015/063251, filed May 8, 2015, which is based upon and claims the benefit of priority under 35 U.S.C. § 119 from Japanese Application No. 2014-104807, filed May 21, 2014. The above-identified documents are incorporated herein by reference in their entireties.

TECHNICAL FIELD

The present technology relates to a data processing device and a data processing method, and more particularly, a data processing device and a data processing method, which are capable of securing excellent communication quality in data transmission using an LDPC code, for example.

BACKGROUND ART

Some of the information disclosed in this specification and the drawings was provided by Samsung Electronics Co., Ltd. (hereinafter referred to as Samsung), LG Electronics Inc., NERC, and CRC/ETRI (indicated in the drawings).

A low density parity check (LDPC) code has a high error correction capability, and in recent years, the LDPC code has widely been employed in transmission schemes of digital broadcasting such as Digital Video Broadcasting (DVB)-S.2, DVB-T.2, and DVB-C.2 of Europe and the like, or Advanced Television Systems Committee (ATSC) 3.0 of the USA and the like (for example, see Non-Patent Literature 1).

From a recent study, it is known that performance near a Shannon limit is obtained from the LDPC code when a code length increases, similar to a turbo code. Because the LDPC code has a property that a shortest distance is proportional to the code length, the LDPC code has advantages of a block error probability characteristic being superior and a so-called error floor phenomenon observed in a decoding characteristic of the turbo code being rarely generated, as characteristics thereof.

CITATION LIST

Non-Patent Literature

Non-Patent Literature 1: DVB-S.2: ETSI EN 302 307 V1.2.1 (2009 August)

SUMMARY OF INVENTION

Technical Problem

In data transmission using the LDPC code, for example, the LDPC code is converted into a symbol of an orthogonal modulation (digital modulation) such as Quadrature Phase Shift Keying (QPSK), and the symbol is mapped to a signal point of the orthogonal modulation and transmitted.

The data transmission using the LDPC code has spread worldwide, and there is a demand to secure excellent communication (transmission) quality.

The present technology was made in light of the foregoing, and it is desirable to secure excellent communication quality in data transmission using the LDPC code.

Solution to Problem

A first data processing device/method according to the present technology is a data processing device/method including: an encoding unit/step configured to perform LDPC encoding based on a parity check matrix of an LDPC code in which a code length N is 16200 bits and an encoding rate r is 6/15; a group-wise interleaving unit/step configured to perform group-wise interleave of interleaving the LDPC code in units of bit groups of 360 bits; and a mapping unit/step configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 27 430 519 828 1897 1943 2513 2600 2640 3310 3415 4266 5044 5100 5328 5483 5928 6204 6392 6416 6602 7019 7415 7623 8112 8485 8724 8994 9445 9667

27 174 188 631 1172 1427 1779 2217 2270 2601 2813 3196 3582 3895 3908 3948 4463 4955 5120 5809 5988 6478 6604 7096 7673 7735 7795 8925 9613 9670

27 370 617 852 910 1030 1326 1521 1606 2118 2248 2909 3214 3413 3623 3742 3752 4317 4694 5300 5687 6039 6100 6232 6491 6621 6860 7304 8542 8634

990 1753 7635 8540

933 1415 5666 8745

27 6567 8707 9216

2341 8692 9580 9615

260 1092 5839 6080

352 3750 4847 7726

4610 6580 9506 9597

2512 2974 4814 9348

1461 4021 5060 7009

1796 2883 5553 8306

1249 5422 7057

3965 6968 9422

1498 2931 5092

27 1090 6215

26 4232 6354.

In the first data processing device/method according to the present technology, LDPC encoding is performed based on a parity check matrix of an LDPC code in which a code length N is 16200 bits and an encoding rate r is 6/15. Group-wise interleave of interleaving the LDPC code in units of bit groups of 360 bits is performed. The LDPC code is mapped to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 27 430 519 828 1897 1943 2513 2600 2640 3310 3415 4266 5044 5100 5328 5483 5928 6204 6392 6416 6602 7019 7415 7623 8112 8485 8724 8994 9445 9667

27 174 188 631 1172 1427 1779 2217 2270 2601 2813 3196 3582 3895 3908 3948 4463 4955 5120 5809 5988 6478 6604 7096 7673 7735 7795 8925 9613 9670

27 370 617 852 910 1030 1326 1521 1606 2118 2248 2909 3214 3413 3623 3742 3752 4317 4694 5300 5687 6039 6100 6232 6491 6621 6860 7304 8542 8634

990 1753 7635 8540

933 1415 5666 8745

27 6567 8707 9216

2341 8692 9580 9615

260 1092 5839 6080

352 3750 4847 7726

4610 6580 9506 9597

2512 2974 4814 9348

1461 4021 5060 7009

1796 2883 5553 8306

1249 5422 7057

3965 6968 9422

1498 2931 5092

27 1090 6215

26 4232 6354.

A second data processing device/method according to the present technology is a data processing device/method including: a group-wise deinterleaving unit/step configured to restore a sequence of an LDPC code that has undergone group-wise interleave and has been obtained from data transmitted from a transmitting device to an original sequence, the transmitting device including an encoding unit configured to perform LDPC encoding based on a parity check matrix of the LDPC code in which a code length N is 16200 bits and an encoding rate r is 6/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 27 430 519 828 1897 1943 2513 2600 2640 3310 3415 4266 5044 5100 5328 5483 5928 6204 6392 6416 6602 7019 7415 7623 8112 8485 8724 8994 9445 9667

27 174 188 631 1172 1427 1779 2217 2270 2601 2813 3196 3582 3895 3908 3948 4463 4955 5120 5809 5988 6478 6604 7096 7673 7735 7795 8925 9613 9670

27 370 617 852 910 1030 1326 1521 1606 2118 2248 2909 3214 3413 3623 3742 3752 4317 4694 5300 5687 6039 6100 6232 6491 6621 6860 7304 8542 8634

990 1753 7635 8540

933 1415 5666 8745

27 6567 8707 9216

2341 8692 9580 9615

260 1092 5839 6080

352 3750 4847 7726

4610 6580 9506 9597

2512 2974 4814 9348

1461 4021 5060 7009

1796 2883 5553 8306

1249 5422 7057

3965 6968 9422

1498 2931 5092

27 1090 6215

26 4232 6354.

In the second data processing device/method according to the present technology, a sequence of an LDPC code that has undergone group-wise interleave and has been obtained from data transmitted from a transmitting device is restored to an original sequence, the transmitting device including an encoding unit configured to perform LDPC encoding based on a parity check matrix of the LDPC code in which a code length N is 16200 bits and an encoding rate r is 6/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 27 430 519 828 1897 1943 2513 2600 2640 3310 3415 4266 5044 5100 5328 5483 5928 6204 6392 6416 6602 7019 7415 7623 8112 8485 8724 8994 9445 9667

27 174 188 631 1172 1427 1779 2217 2270 2601 2813 3196 3582 3895 3908 3948 4463 4955 5120 5809 5988 6478 6604 7096 7673 7735 7795 8925 9613 9670

27 370 617 852 910 1030 1326 1521 1606 2118 2248 2909 3214 3413 3623 3742 3752 4317 4694 5300 5687 6039 6100 6232 6491 6621 6860 7304 8542 8634

990 1753 7635 8540

933 1415 5666 8745

27 6567 8707 9216

2341 8692 9580 9615

260 1092 5839 6080
352 3750 4847 7726
4610 6580 9506 9597
2512 2974 4814 9348
1461 4021 5060 7009
1796 2883 5553 8306
1249 5422 7057
3965 6968 9422
1498 2931 5092
27 1090 6215
26 4232 6354.

A third data processing device/method according to the present technology is a data processing device/method including: an encoding unit/step configured to perform LDPC encoding based on a parity check matrix of an LDPC code in which a code length N is 16200 bits and an encoding rate r is 8/15; a group-wise interleaving unit/step configured to perform group-wise interleave of interleaving the LDPC code in units of bit groups of 360 bits; and a mapping unit/step configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412

81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554

105 975 3421 3480 4120 4444 5957 5971 6119 6617 6761 6810 7067 7353

6 138 485 1444 1512 2615 2990 3109 5604 6435 6513 6632 6704 7507

20 858 1051 2539 3049 5162 5308 6158 6391 6604 6744 7071 7195 7238

1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

In the third data processing device/method according to the present technology, LDPC encoding is performed based on a parity check matrix of an LDPC code in which a code length N is 16200 bits and an encoding rate r is 8/15. Group-wise interleave of interleaving the LDPC code in units of bit groups of 360 bits is performed. The LDPC code is mapped to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412

81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554

105 975 3421 3480 4120 4444 5957 5971 6119 6617 6761 6810 7067 7353

6 138 485 1444 1512 2615 2990 3109 5604 6435 6513 6632 6704 7507

20 858 1051 2539 3049 5162 5308 6158 6391 6604 6744 7071 7195 7238

1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

A fourth data processing device/method according to the present technology is a data processing device/method including: a group-wise deinterleaving unit/step configured to restore a sequence of an LDPC code that has undergone group-wise interleave and has been obtained from data transmitted from a transmitting device to an original sequence, the transmitting device including an encoding unit configured to perform LDPC encoding based on a parity check matrix of the LDPC code in which a code length N is 16200 bits and an encoding rate r is 8/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412

81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554

105 975 3421 3480 4120 4444 5957 5971 6119 6617 6761 6810 7067 7353

6 138 485 1444 1512 2615 2990 3109 5604 6435 6513 6632 6704 7507

20 858 1051 2539 3049 5162 5308 6158 6391 6604 6744 7071 7195 7238

1140 5838 6203 6748

6282 6466 6481 6638

2346 2592 5436 7487

2219 3897 5896 7528

2897 6028 7018

1285 1863 5324

3075 6005 6466

5 6020 7551

2121 3751 7507

4027 5488 7542

2 6012 7011

3823 5531 5687

1379 2262 5297

1882 7498 7551

3749 4806 7227

2 2074 6898

17 616 7482

9 6823 7480

5195 5880 7559.

In the fourth data processing device/method according to the present technology, a sequence of an LDPC code that has undergone group-wise interleave and has been obtained from data transmitted from a transmitting device is restored to an original sequence, the transmitting device including an encoding unit configured to perform LDPC encoding based on a parity check matrix of the LDPC code in which a code length N is 16200 bits and an encoding rate r is 8/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412

81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554

105 975 3421 3480 4120 4444 5957 5971 6119 6617 6761 6810 7067 7353

6 138 485 1444 1512 2615 2990 3109 5604 6435 6513 6632 6704 7507

20 858 1051 2539 3049 5162 5308 6158 6391 6604 6744 7071 7195 7238

1140 5838 6203 6748

6282 6466 6481 6638

2346 2592 5436 7487

2219 3897 5896 7528

2897 6028 7018

1285 1863 5324

3075 6005 6466

5 6020 7551

2121 3751 7507

4027 5488 7542

2 6012 7011

3823 5531 5687

1379 2262 5297

1882 7498 7551

3749 4806 7227

2 2074 6898

17 616 7482

9 6823 7480

5195 5880 7559.

A fifth data processing device/method according to the present technology is a data processing device/method including: an encoding unit/step configured to perform LDPC encoding based on a parity check matrix of an LDPC code in which a code length N is 16200 bits and an encoding rate r is 10/15; a group-wise interleaving unit/step configured to perform group-wise interleave of interleaving the LDPC code in units of bit groups of 360 bits; and a mapping unit/step configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387.

In the fifth data processing device/method according to the present technology, LDPC encoding is performed based on a parity check matrix of an LDPC code in which a code length N is 16200 bits and an encoding rate r is 10/15. Group-wise interleave of interleaving the LDPC code in units of bit groups of 360 bits is performed. The LDPC code is mapped to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387.

A sixth data processing device/method according to the present technology is a data processing device/method including: a group-wise deinterleaving unit/step configured to restore a sequence of an LDPC code that has undergone group-wise interleave and has been obtained from data transmitted from a transmitting device to an original sequence, the transmitting device including an encoding unit configured to perform LDPC encoding based on a parity check matrix of the LDPC code in which a code length N is 16200 bits and an encoding rate r is 10/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387.

In the sixth data processing device/method according to the present technology, a sequence of an LDPC code that has undergone group-wise interleave and has been obtained from data transmitted from a transmitting device is restored to an original sequence, the transmitting device including an encoding unit configured to perform LDPC encoding based on a parity check matrix of the LDPC code in which a code length N is 16200 bits and an encoding rate r is 10/15, a group-wise interleaving unit configured to perform the group-wise interleave of interleaving the LDPC code in units of bit groups of 360 bits, and a mapping unit configured to map the LDPC code to any of 64 signal points decided in a modulation scheme in units of 6 bits. In the group-wise interleave, when an (i+1)-th bit group from a head of the LDPC code is indicated by a bit group i, a sequence of bit groups 0 to 44 of the LDPC code of 16200 bits is interleaved into a sequence of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4. The LDPC code includes an information bit and a parity bit. The parity check matrix includes an information matrix portion corresponding to the information bit and a parity matrix portion corresponding to the parity bit. The information matrix portion is represented by a parity check matrix initial value table. The parity check matrix initial value table is a table in which a position of a 1 element of the information matrix portion is indicated for every 360 columns, and includes 352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387.

The data processing device may be an independent device and may be an internal block constituting one device.

Advantageous Effects of Invention

According to the present technology, it is possible to secure excellent communication quality in data transmission using the LDPC code.

The effects described herein are not necessarily limited and may include any effect described in the present disclosure.

BRIEF DESCRIPTION OF DRAWINGS

FIG. 3 is an illustration of an example of a parity check matrix of an LDPC code.

FIG. 13 is an illustration of the parity check matrix of the LDPC code that is defined in the standard of the DVB-T.2.

FIG. 15 is an illustration of an example of a parity matrix $H_T$ becoming a staircase structure and a Tanner graph corresponding to the parity matrix $H_T$.

FIG. 20 is an illustration of an example of a parity check matrix initial value table in which an encoding rate is 1/4 and a code length is 16200.

FIG. 21 is an illustration of a method of calculating a parity check matrix H from a parity check matrix initial value table.

FIG. 23 is an illustration of an example of the parity check matrix initial value table.

FIG. 30 is an illustration of an example of the parity check matrix initial value table.

FIG. 31 is an illustration of an example of the parity check matrix initial value table.

FIG. 32 is an illustration of an example of the parity check matrix initial value table.

FIG. 33 is an illustration of an example of the parity check matrix initial value table.

FIG. 34 is an illustration of an example of the parity check matrix initial value table.

FIG. 35 is an illustration of an example of the parity check matrix initial value table.

FIG. 36 is an illustration of an example of the parity check matrix initial value table.

FIG. 37 is an illustration of an example of the parity check matrix initial value table.

FIG. 38 is an illustration of an example of the parity check matrix initial value table.

FIG. 39 is an illustration of an example of the parity check matrix initial value table.

FIG. 40 is an illustration of an example of the parity check matrix initial value table.

FIG. 41 is an illustration of an example of the parity check matrix initial value table.

Figure 42:
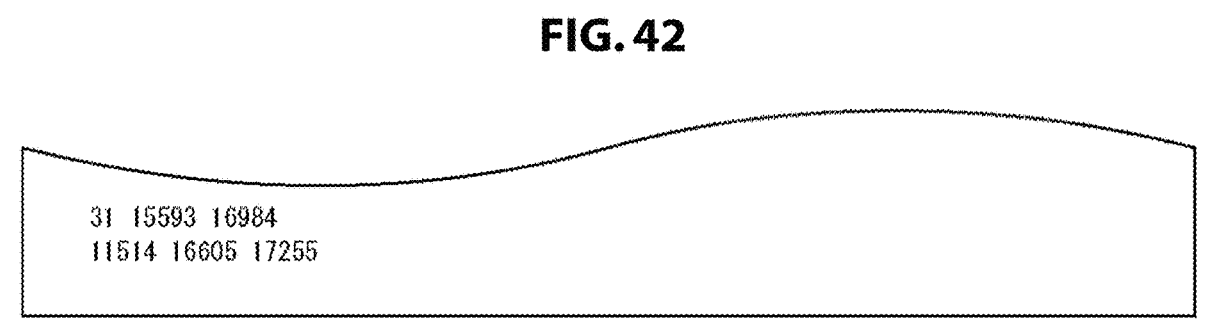

FIG. 42 is an illustration of an example of the parity check matrix initial value table.

FIG. 43 is an illustration of an example of the parity check matrix initial value table.

FIG. 44 is an illustration of an example of the parity check matrix initial value table.

FIG. 45 is an illustration of an example of the parity check matrix initial value table.

Figure 46:
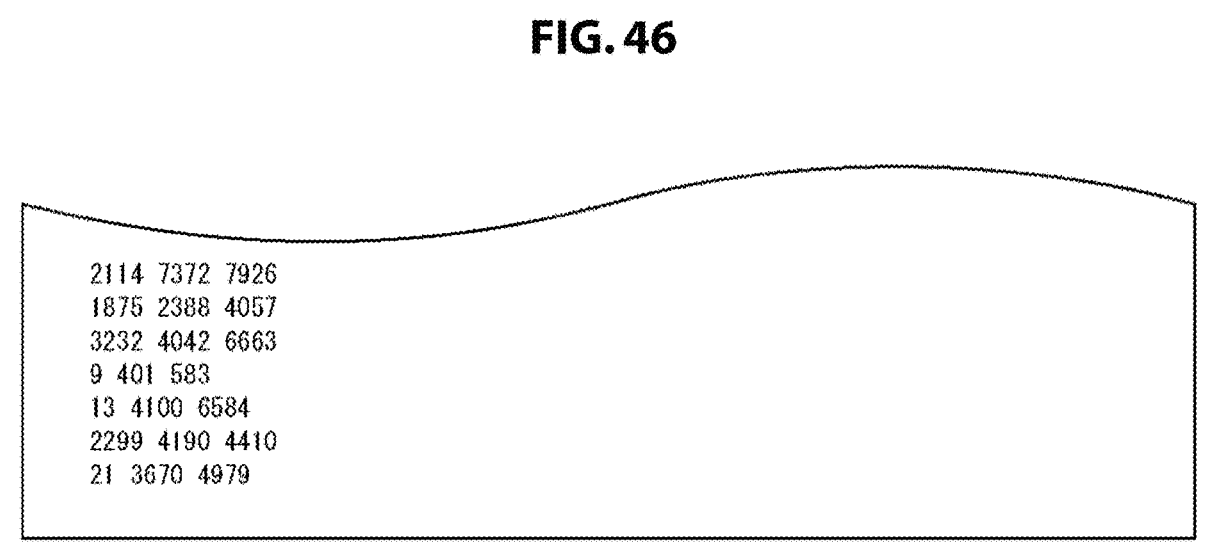

FIG. 46 is an illustration of an example of the parity check matrix initial value table.

FIG. 47 is an illustration of an example of the parity check matrix initial value table.

FIG. 48 is an illustration of an example of the parity check matrix initial value table.

FIG. 49 is an illustration of an example of the parity check matrix initial value table.

FIG. 50 is an illustration of an example of the parity check matrix initial value table.

FIG. 51 is an illustration of an example of the parity check matrix initial value table.

FIG. 52 is an illustration of an example of the parity check matrix initial value table.

FIG. 53 is an illustration of an example of the parity check matrix initial value table.

FIG. 54 is an illustration of an example of the parity check matrix initial value table.

FIG. 55 is an illustration of an example of the parity check matrix initial value table.

FIG. 56 is an illustration of an example of the parity check matrix initial value table.

FIG. 57 is an illustration of an example of the parity check matrix initial value table.

FIG. 58 is an illustration of an example of the parity check matrix initial value table.

FIG. 59 is an illustration of an example of the parity check matrix initial value table.

FIG. 60 is an illustration of an example of the parity check matrix initial value table.

FIG. 61 is an illustration of an example of the parity check matrix initial value table.

FIG. 62 is an illustration of an example of the parity check matrix initial value table.

FIG. 63 is an illustration of an example of the parity check matrix initial value table.

FIG. 64 is an illustration of an example of the parity check matrix initial value table.

FIG. 65 is an illustration of an example of the parity check matrix initial value table.

FIG. 66 is an illustration of an example of the parity check matrix initial value table.

FIG. 67 is an illustration of an example of the parity check matrix initial value table.

FIG. 68 is an illustration of an example of the parity check matrix initial value table.

FIG. 69 is an illustration of an example of the parity check matrix initial value table.

FIG. 70 is an illustration of an example of the parity check matrix initial value table.

FIG. 71 is an illustration of an example of the parity check matrix initial value table.

FIG. 72 is an illustration of an example of the parity check matrix initial value table.

FIG. 89 is an illustration of an example of coordinates of a signal point of a UC when a modulation scheme is QPSK.

FIG. 90 is an illustration of an example of coordinates of a signal point of a 2D NUC when a modulation scheme is 16QAM.

FIG. 91 is an illustration of an example of coordinates of a signal point of a 2D NUC when a modulation scheme is 64QAM.

FIG. 92 is an illustration of an example of coordinates of a signal point of a 2D NUC when a modulation scheme is 256QAM.

FIG. 93 is an illustration of an example of coordinates of a signal point of a 2D NUC when a modulation scheme is 256QAM.

FIG. 94 is an illustration of an example of coordinates of a signal point of a 1D NUC when a modulation scheme is 1024QAM.

FIG. 95 is an illustration of relations of a symbol y of 1024QAM with a real part Re ($z_q$) and an imaginary part Im ($z_q$) of a complex number serving as coordinates of a signal point $z_q$ of a 1D NUC corresponding to the symbol y.

FIG. 96 is an illustration of an example of coordinates of a signal point of a 1D NUC when a modulation scheme is 4096QAM.

FIG. 97 is an illustration of relations of a symbol y of 4096QAM with a real part Re ($z_q$) and an imaginary part Im ($z_q$) of a complex number serving as coordinates of a signal point $z_q$ of a 1D NUC corresponding to the symbol y.

FIG. 101 is an illustration of another example of coordinates of a signal point of a 2D NUC when a modulation scheme is 16QAM.

FIG. 102 is an illustration of another example of coordinates of a signal point of a 2D NUC when a modulation scheme is 64QAM.

FIG. 103 is an illustration of another example of coordinates of a signal point of a 2D NUC when a modulation scheme is 256QAM.

FIG. 104 is an illustration of another example of coordinates of a signal point of a 2D NUC when a modulation scheme is 256QAM.

FIG. 106 is an illustration of an example of the number C of columns of parts 1 and 2 and part column lengths R1 and R2 for a combination of a code length N and a modulation scheme.

FIG. 109 is an illustration of a 1st example of a GW pattern for an LDPC code in which a code length N is 64 k bits.

FIG. 110 is an illustration of a 2nd example of a GW pattern for an LDPC code in which a code length N is 64 k bits.

FIG. 111 is an illustration of a 3rd example of a GW pattern for an LDPC code in which a code length N is 64 k bits.

FIG. 112 is an illustration of a 4th example of a GW pattern for an LDPC code in which a code length N is 64 k bits.

FIG. 114 is an illustration of a 6th example of a GW pattern for an LDPC code in which a code length N is 64 k bits.

FIG. 117 is an illustration of a 9th example of a GW pattern for an LDPC code in which a code length N is 64 k bits.

FIG. 119 is an illustration of an 11th example of a GW pattern for an LDPC code in which a code length N is 64 k bits.

FIG. 120 is an illustration of a 12th example of a GW pattern for an LDPC code in which a code length N is 64 k bits.

FIG. 121 is an illustration of a 13th example of a GW pattern for an LDPC code in which a code length N is 64 k bits.

FIG. 122 is an illustration of a 14th example of a GW pattern for an LDPC code in which a code length N is 64 k bits.

FIG. 123 is an illustration of a 15th example of a GW pattern for an LDPC code in which a code length N is 64 k bits.

FIG. 124 is an illustration of a 16th example of a GW pattern for an LDPC code in which a code length N is 64 k bits.

FIG. 125 is an illustration of a 17th example of a GW pattern for an LDPC code in which a code length N is 64 k bits.

FIG. 126 is an illustration of an 18th example of a GW pattern for an LDPC code in which a code length N is 64 k bits.

FIG. 127 is an illustration of a 19th example of a GW pattern for an LDPC code in which a code length N is 64 k bits.

FIG. 128 is an illustration of a 20th example of a GW pattern for an LDPC code in which a code length N is 64 k bits.

FIG. 129 is an illustration of a 21st example of a GW pattern for an LDPC code in which a code length N is 64 k bits.

FIG. 130 is an illustration of a 22nd example of a GW pattern for an LDPC code in which a code length N is 64 k bits.

FIG. 131 is an illustration of a 23rd example of a GW pattern for an LDPC code in which a code length N is 64 k bits.

FIG. 132 is an illustration of a 24th example of a GW pattern for an LDPC code in which a code length N is 64 k bits.

FIG. 133 is an illustration of a 25th example of a GW pattern for an LDPC code in which a code length N is 64 k bits.

FIG. 134 is an illustration of a 26th example of a GW pattern for an LDPC code in which a code length N is 64 k bits.

Figure 135:
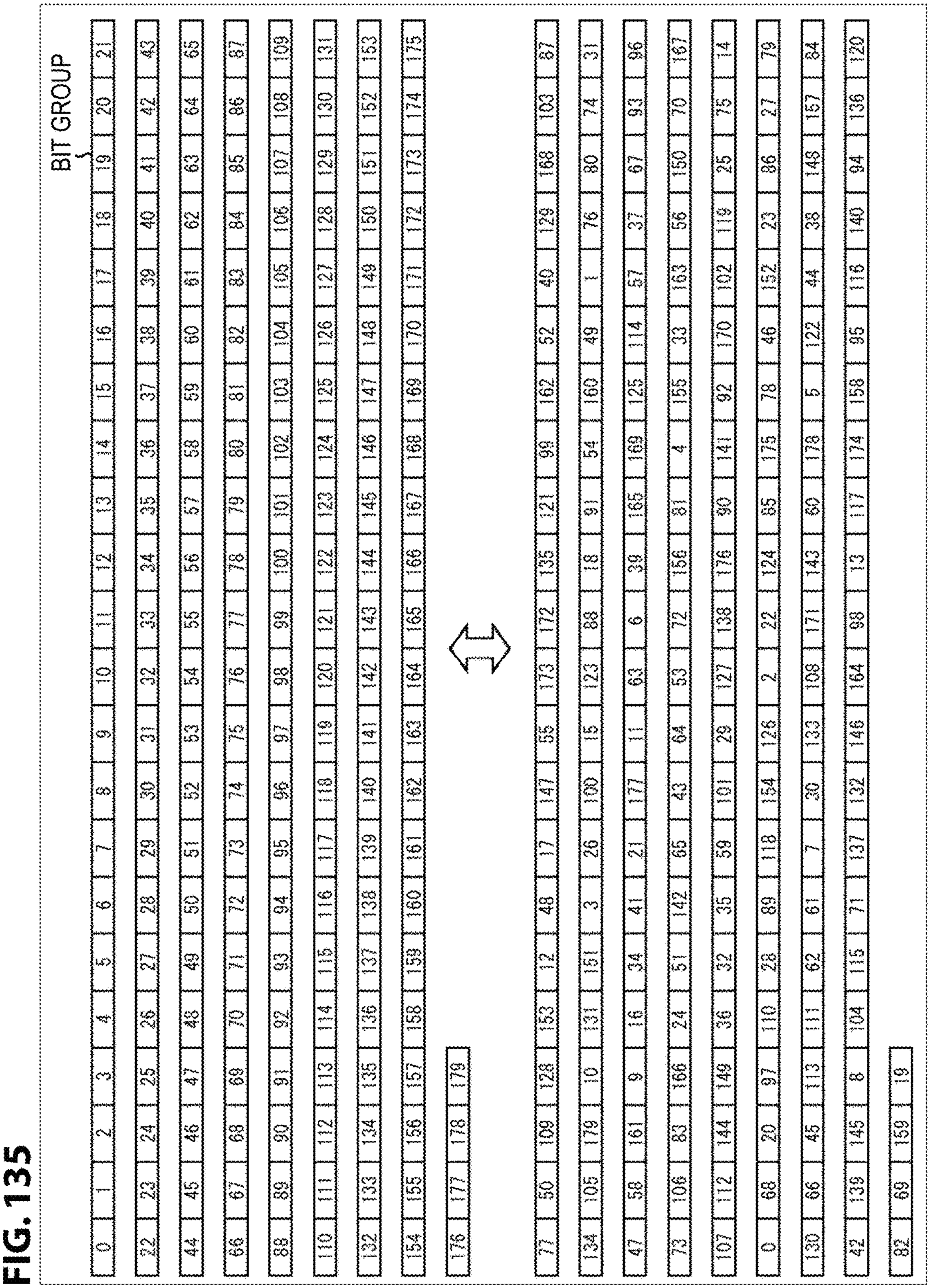

FIG. 135 is an illustration of a 27th example of a GW pattern for an LDPC code in which a code length N is 64 k bits.

FIG. 136 is an illustration of a 28th example of a GW pattern for an LDPC code in which a code length N is 64 k bits.

Figure 137:
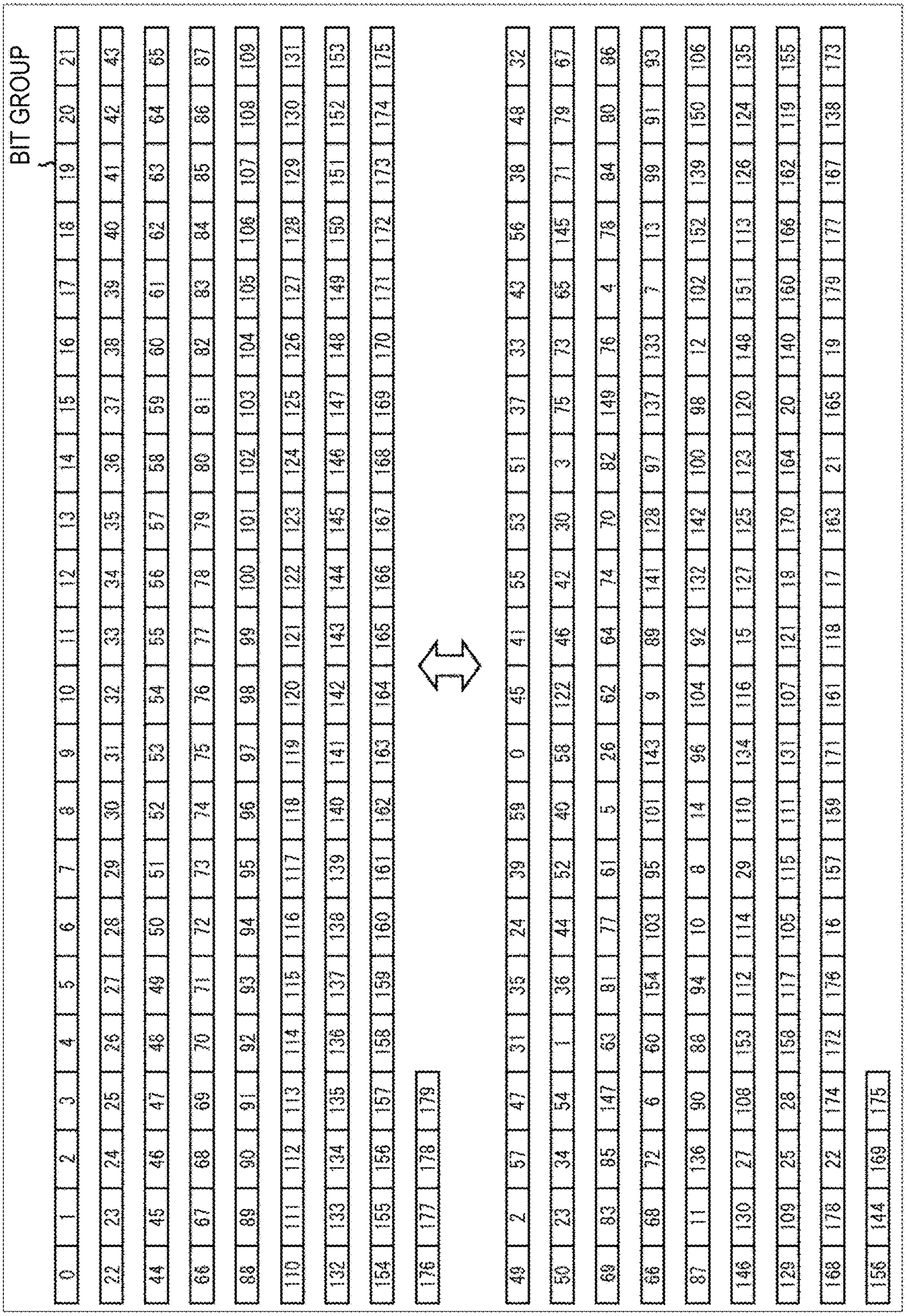

FIG. 137 is an illustration of a 29th example of a GW pattern for an LDPC code in which a code length N is 64 k bits.

FIG. 138 is an illustration of a 30th example of a GW pattern for an LDPC code in which a code length N is 64 k bits.

Figure 139:
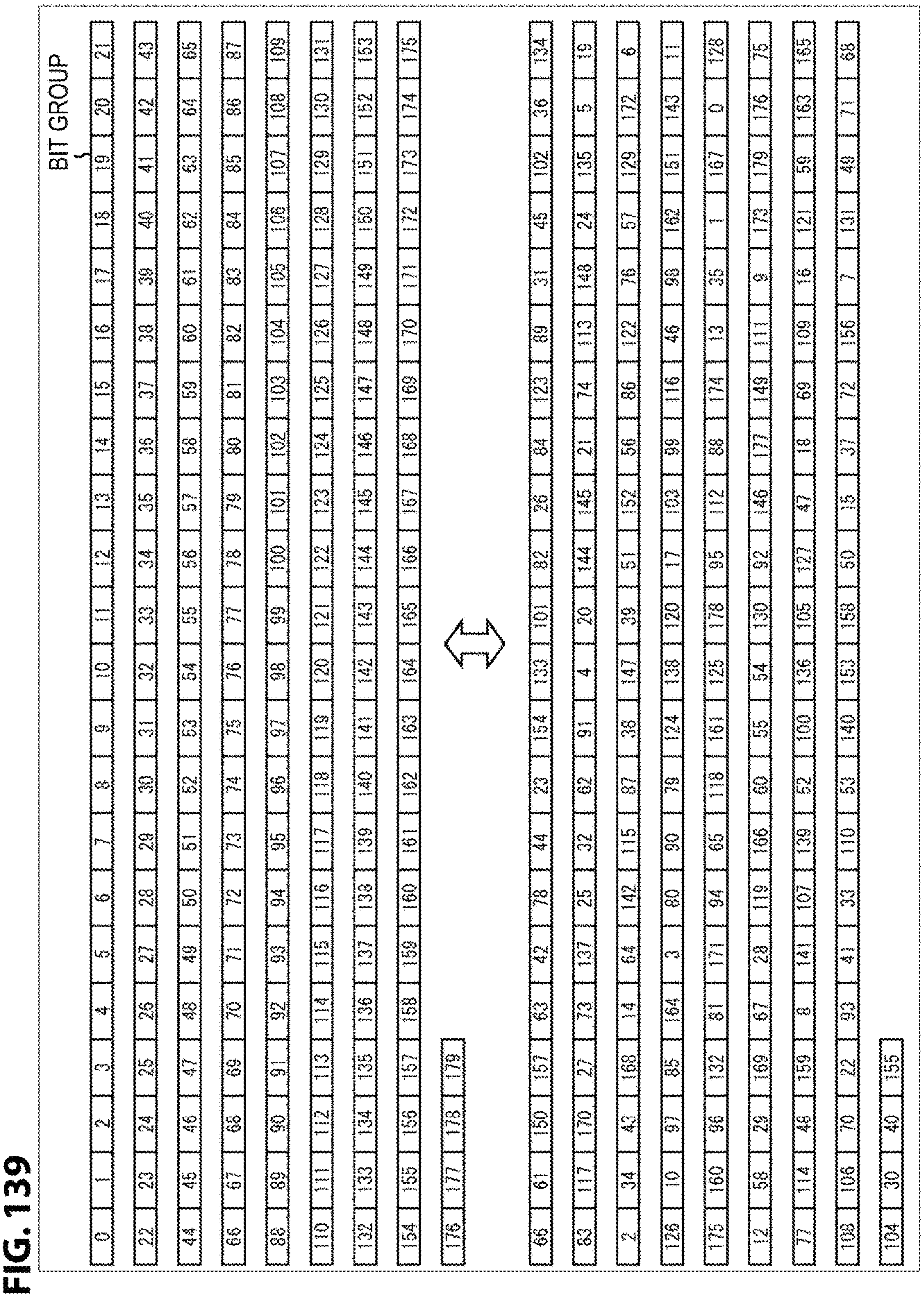

FIG. 139 is an illustration of a 31st example of a GW pattern for an LDPC code in which a code length N is 64 k bits.

Figure 140:
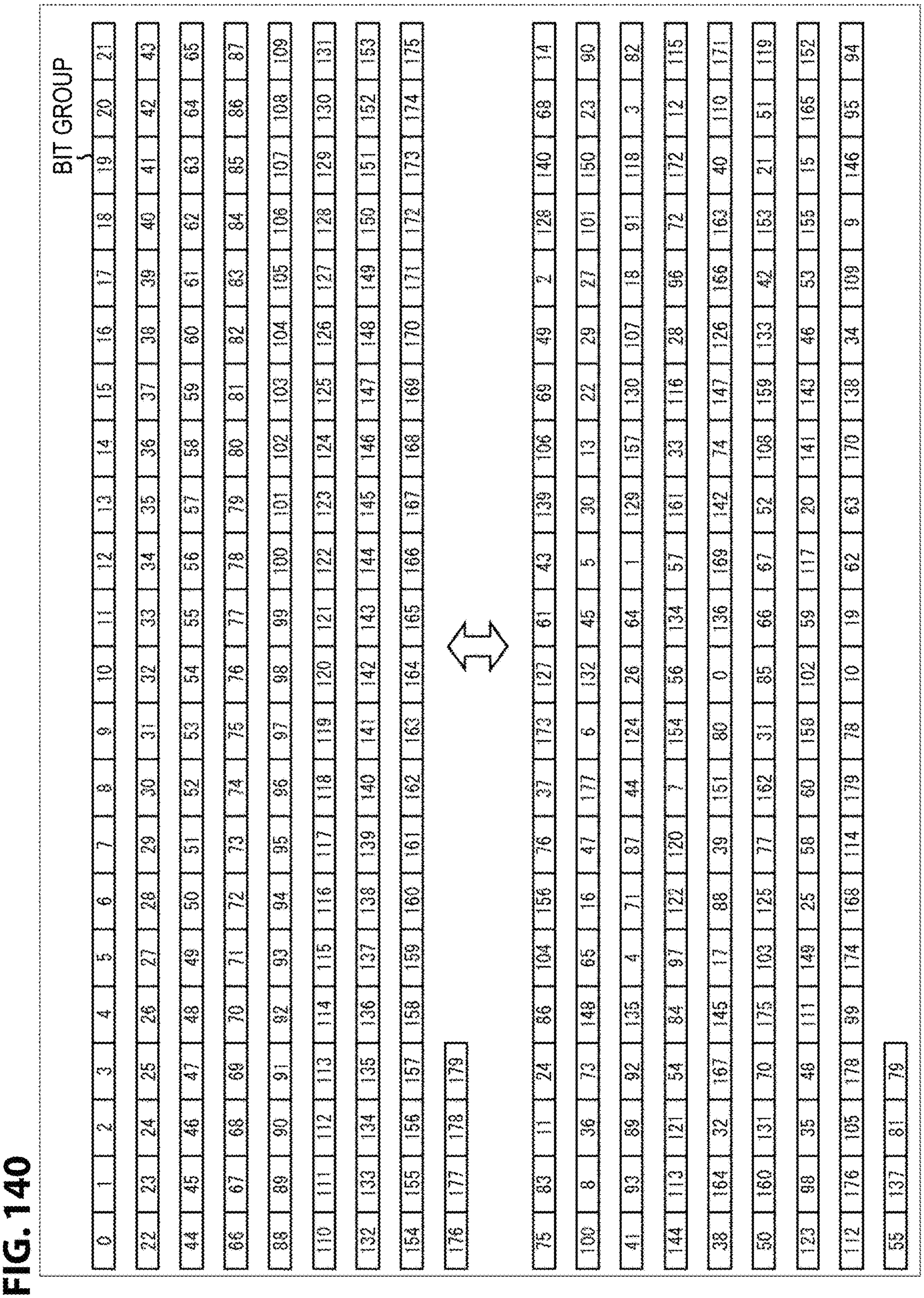

FIG. 140 is an illustration of a 32nd example of a GW pattern for an LDPC code in which a code length N is 64 k bits.

FIG. 141 is an illustration of a 33rd example of a GW pattern for an LDPC code in which a code length N is 64 k bits.

Figure 142:
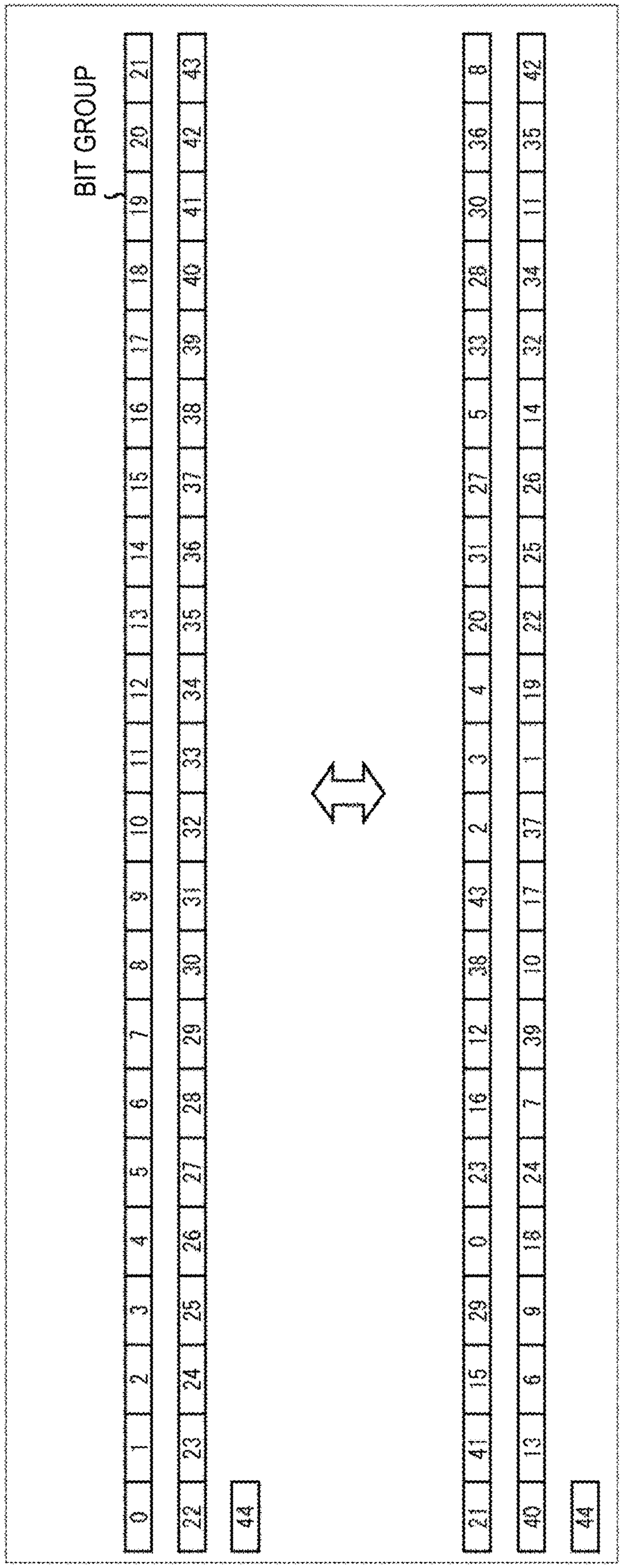

FIG. 142 is an illustration of a 1st example of a GW pattern for an LDPC code in which a code length N is 16 k bits.

Figure 143:
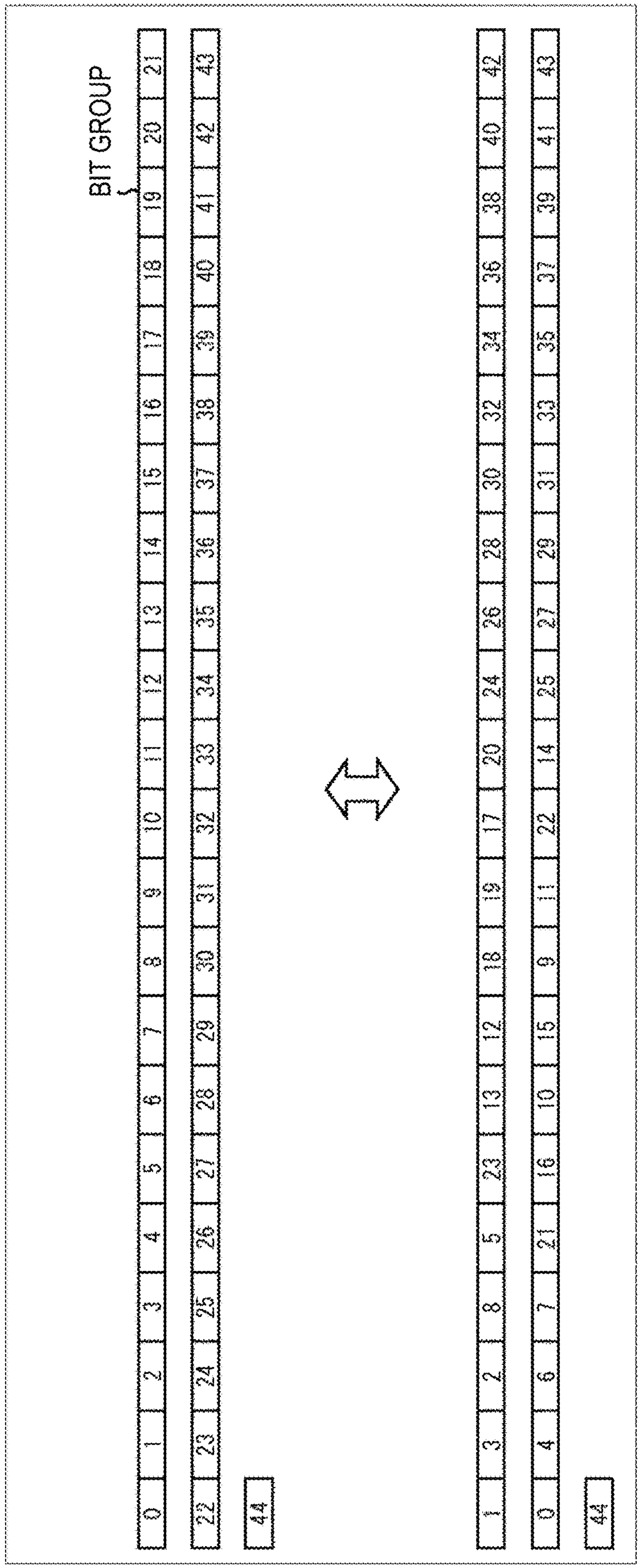

FIG. 143 is an illustration of a 2nd example of a GW pattern for an LDPC code in which a code length N is 16 k bits.

Figure 144:
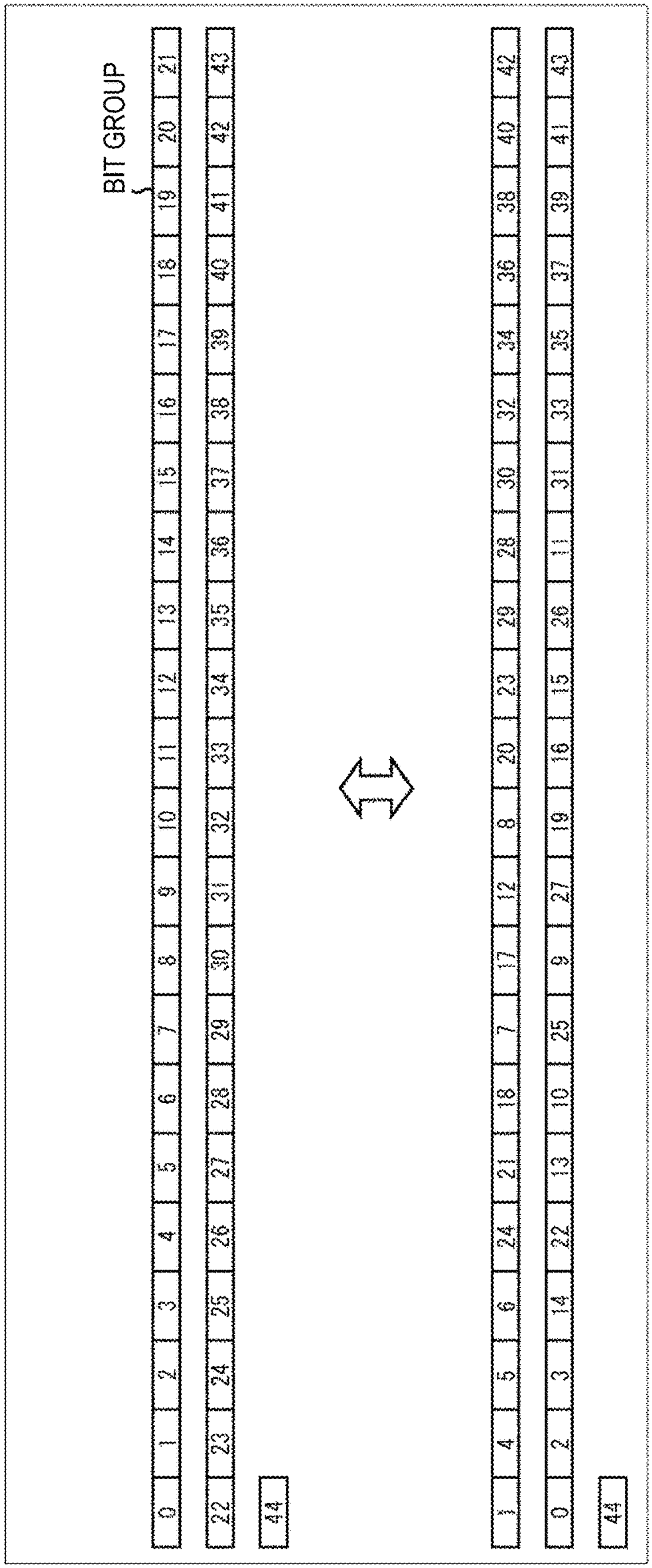

FIG. 144 is an illustration of a 3rd example of a GW pattern for an LDPC code in which a code length N is 16 k bits.

Figure 145:
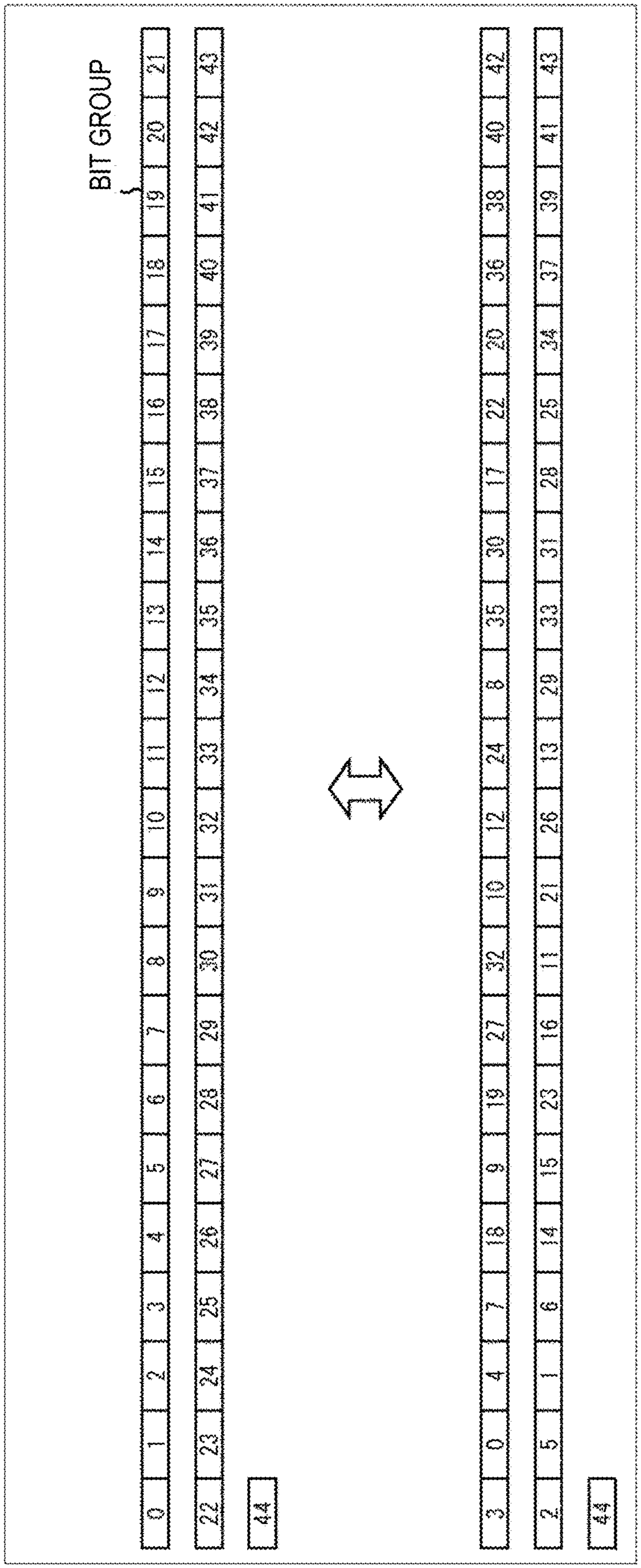

FIG. 145 is an illustration of a 4th example of a GW pattern for an LDPC code in which a code length N is 16 k bits.

Figure 146:
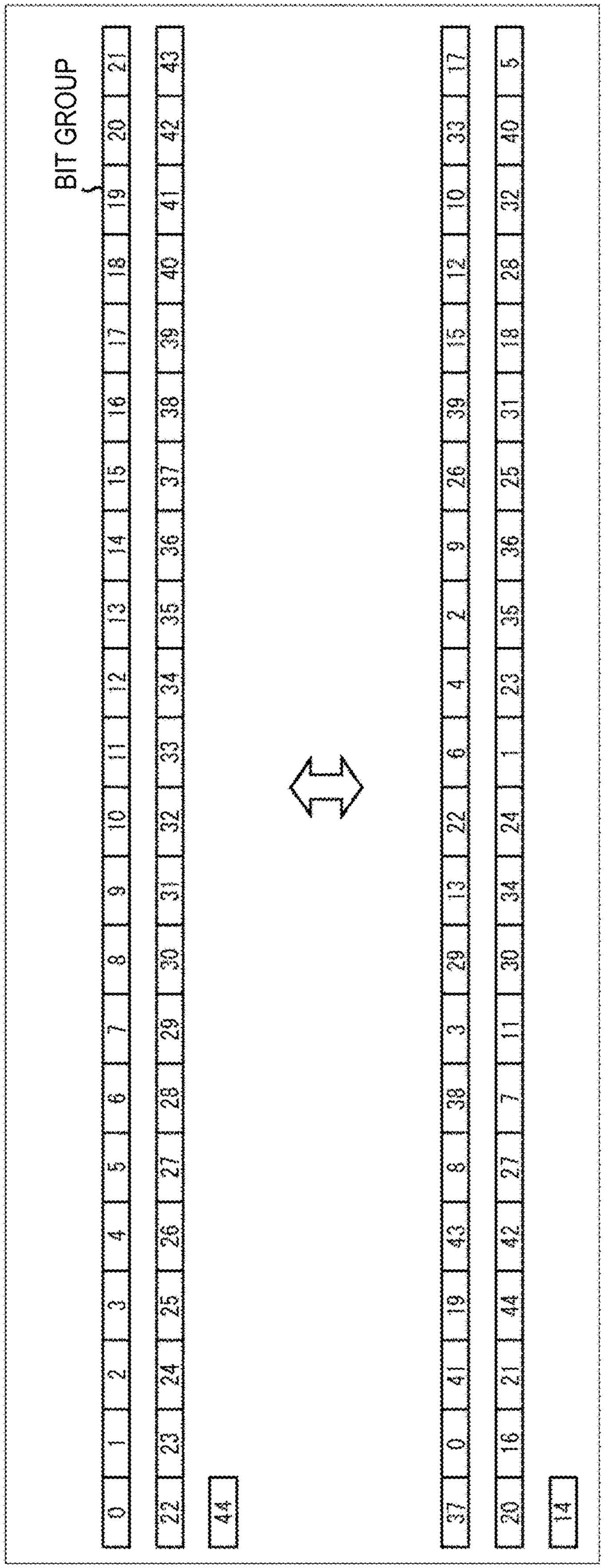

FIG. 146 is an illustration of a 5th example of a GW pattern for an LDPC code in which a code length N is 16 k bits.

Figure 147:
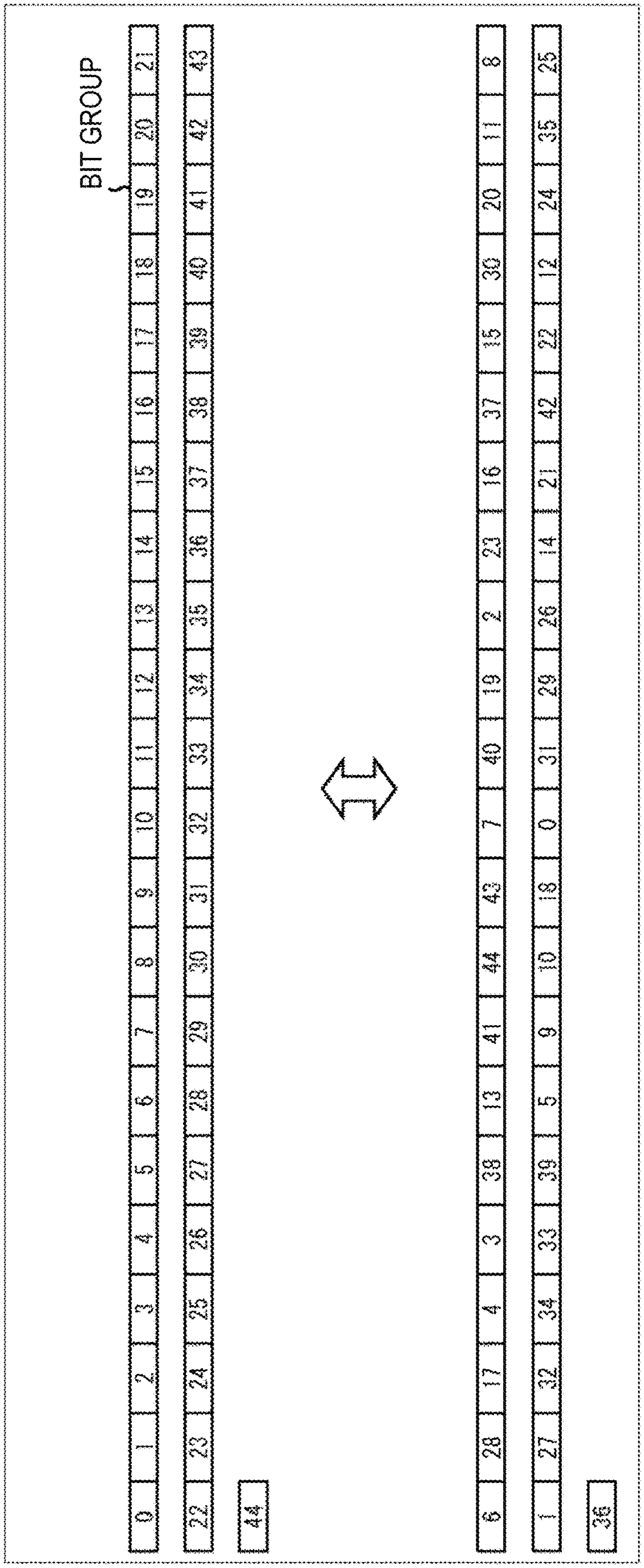

FIG. 147 is an illustration of a 6th example of a GW pattern for an LDPC code in which a code length N is 16 k bits.

Figure 148:
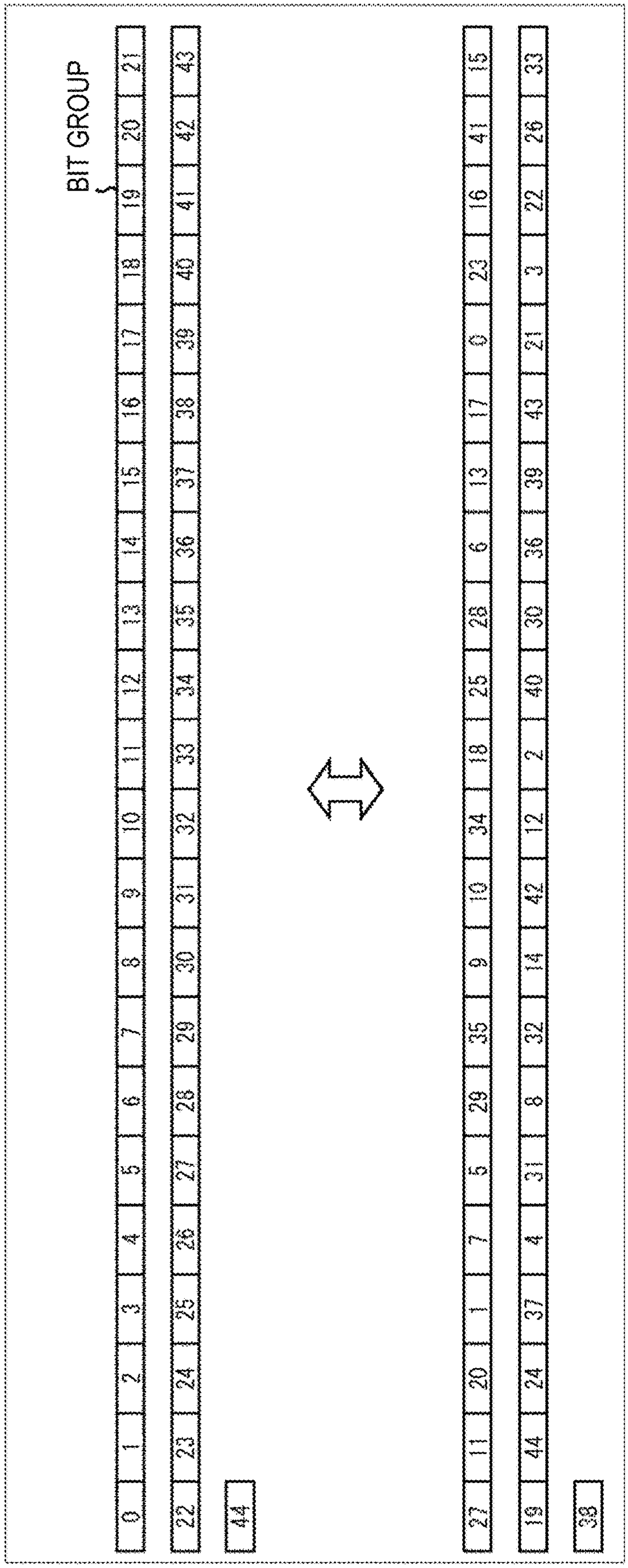

FIG. 148 is an illustration of a 7th example of a GW pattern for an LDPC code in which a code length N is 16 k bits.

Figure 149:
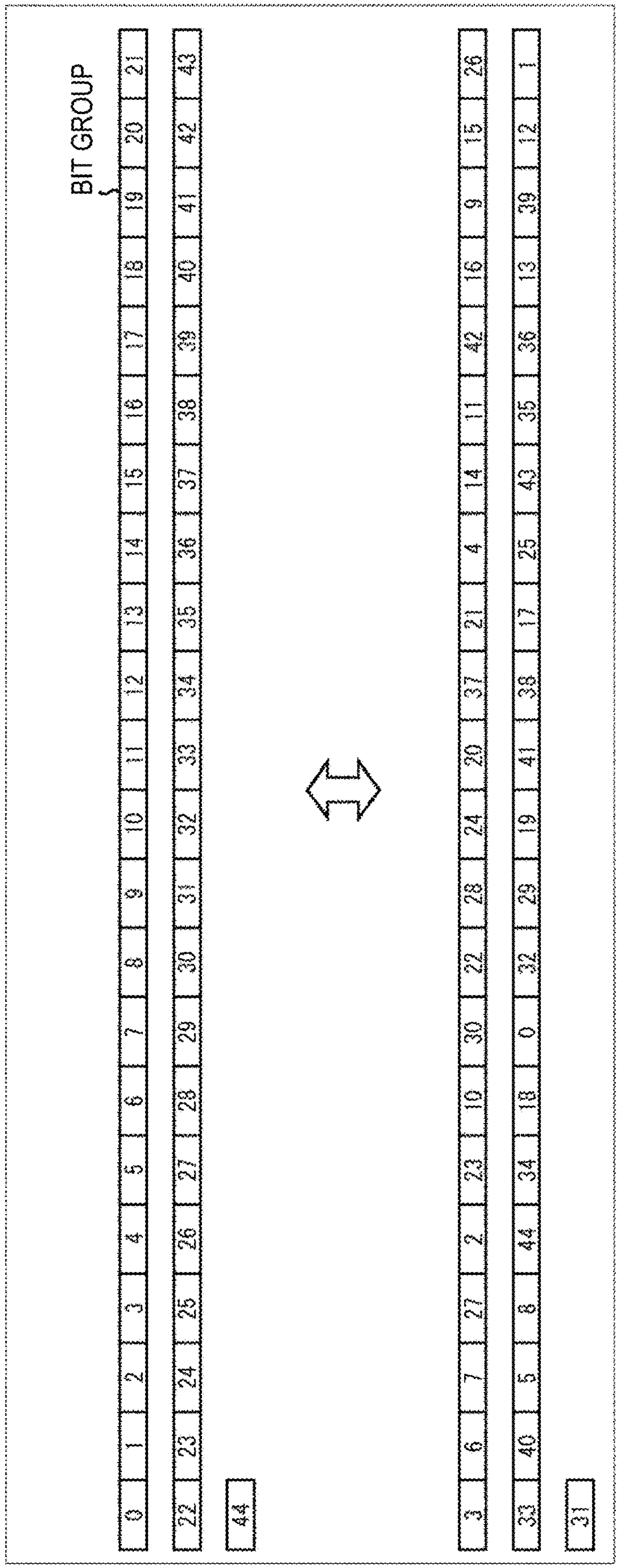

FIG. 149 is an illustration of an 8th example of a GW pattern for an LDPC code in which a code length N is 16 k bits.

Figure 150:
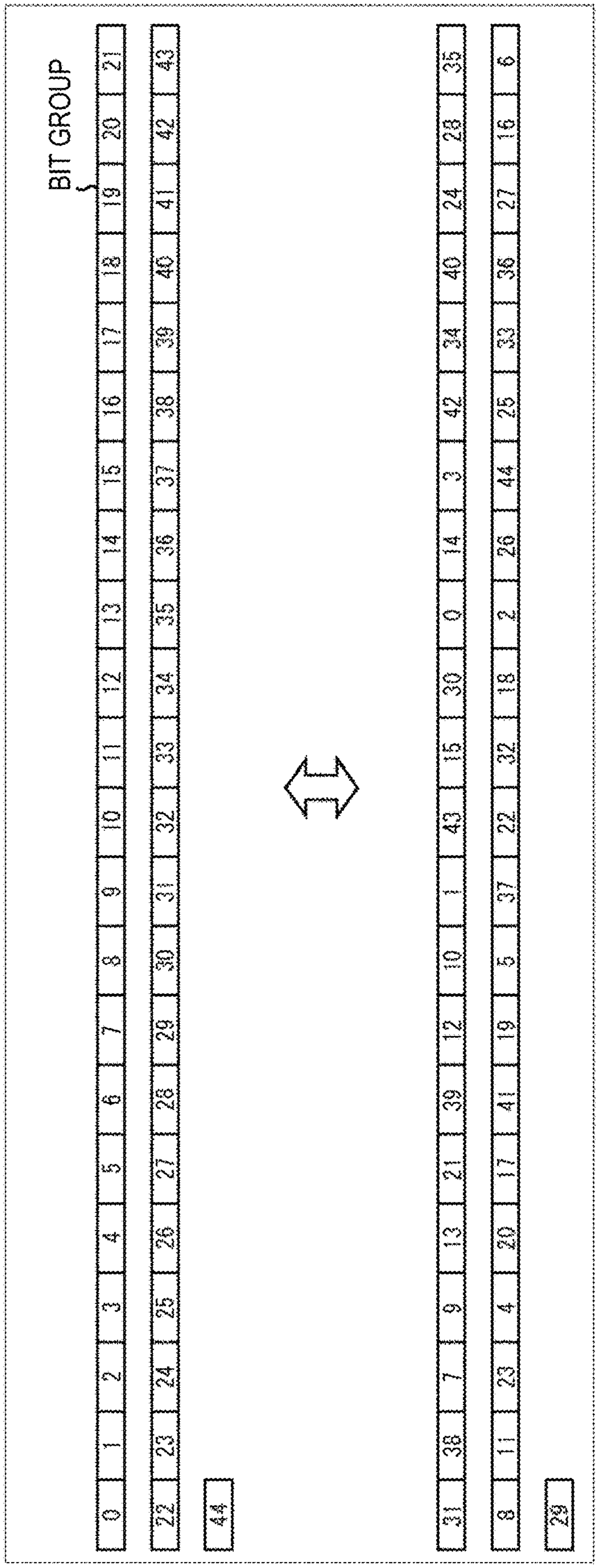

FIG. 150 is an illustration of a 9th example of a GW pattern for an LDPC code in which a code length N is 16 k bits.

Figure 151:
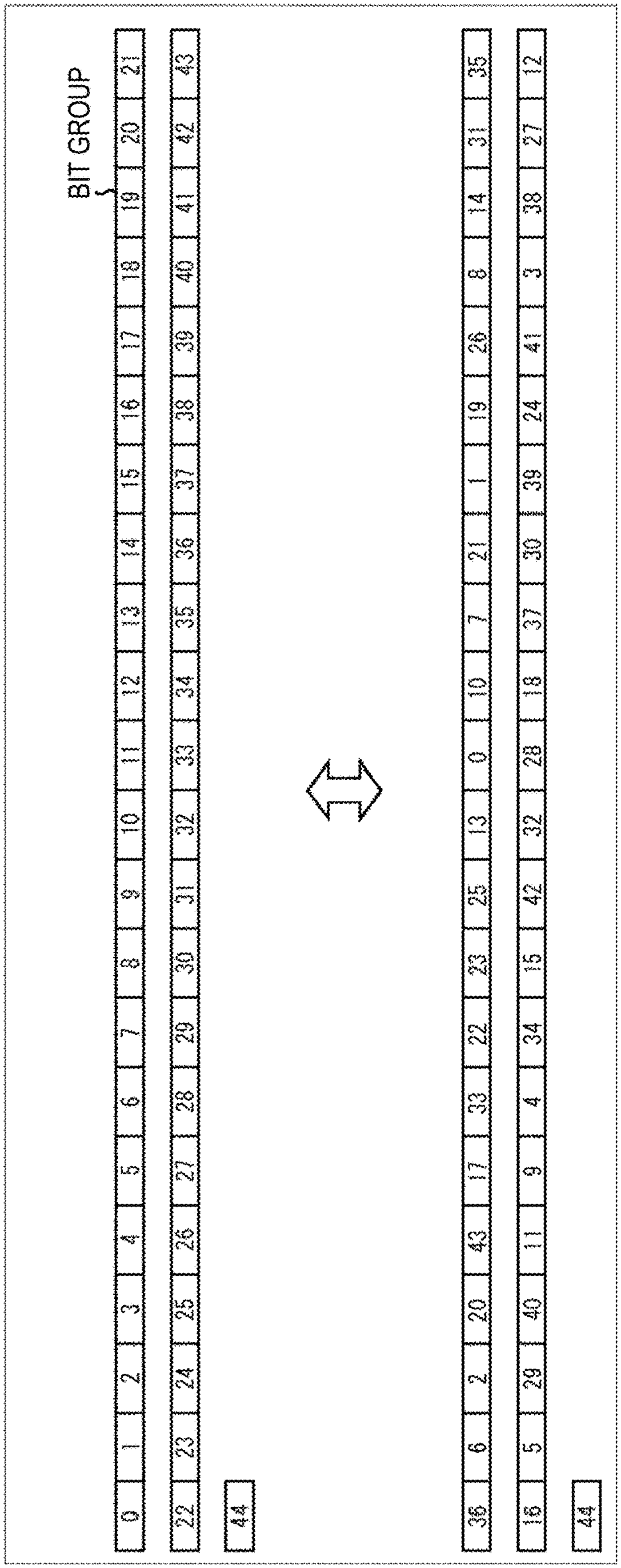

FIG. 151 is an illustration of a 10th example of a GW pattern for an LDPC code in which a code length N is 16 k bits.

Figure 152:
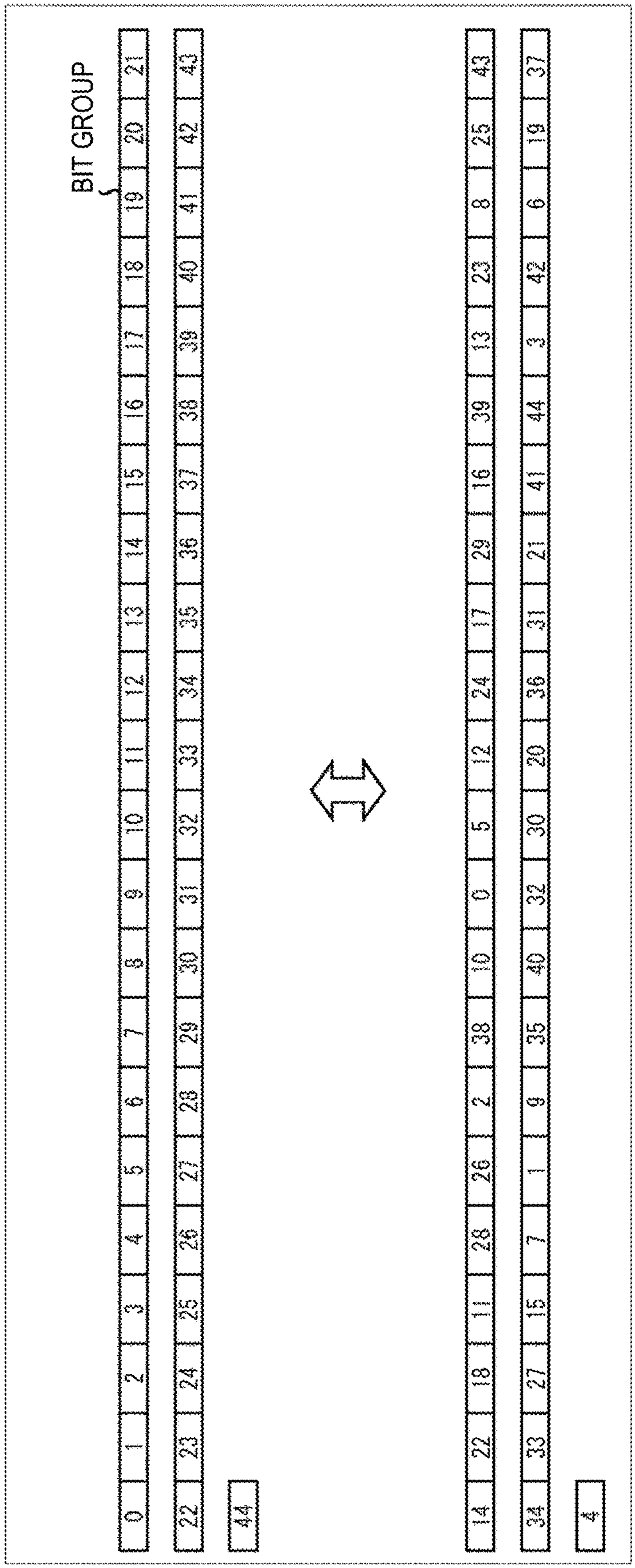

FIG. 152 is an illustration of an 11th example of a GW pattern for an LDPC code in which a code length N is 16 k bits.

Figure 153:
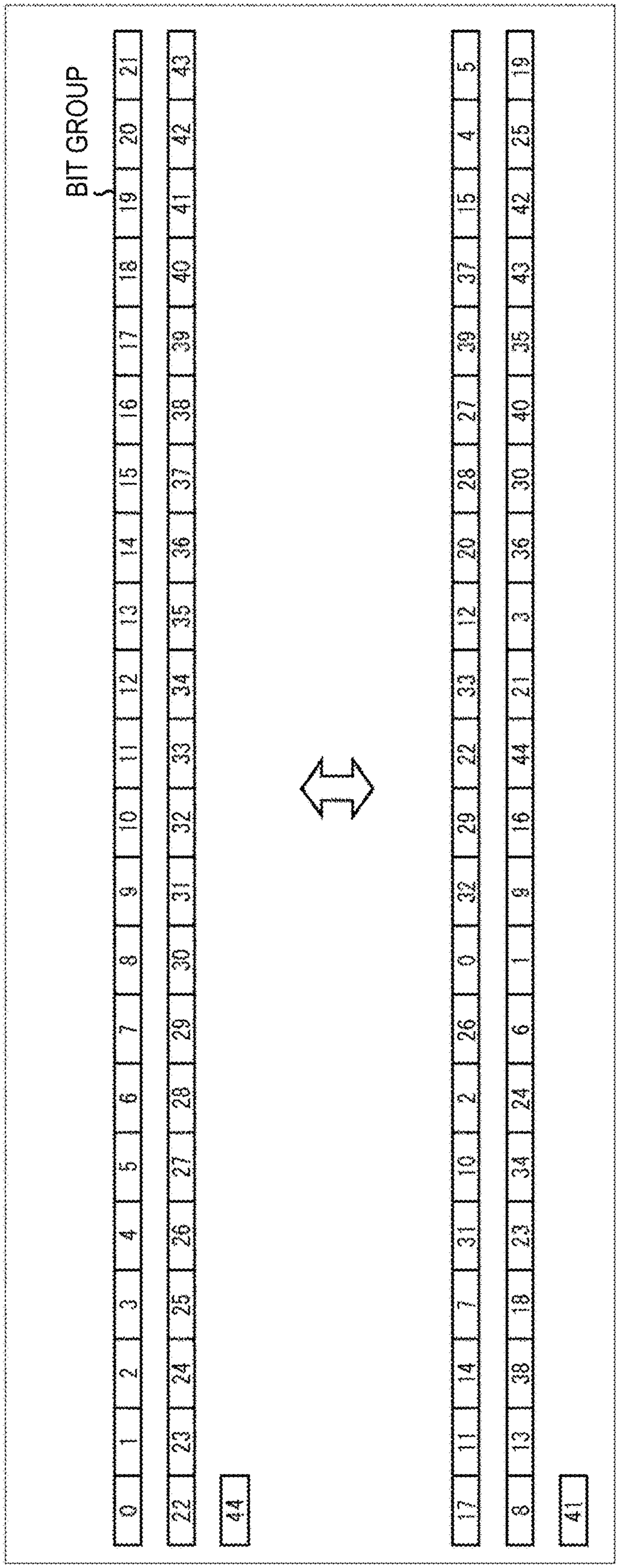

FIG. 153 is an illustration of a 12th example of a GW pattern for an LDPC code in which a code length N is 16 k bits.

Figure 154:
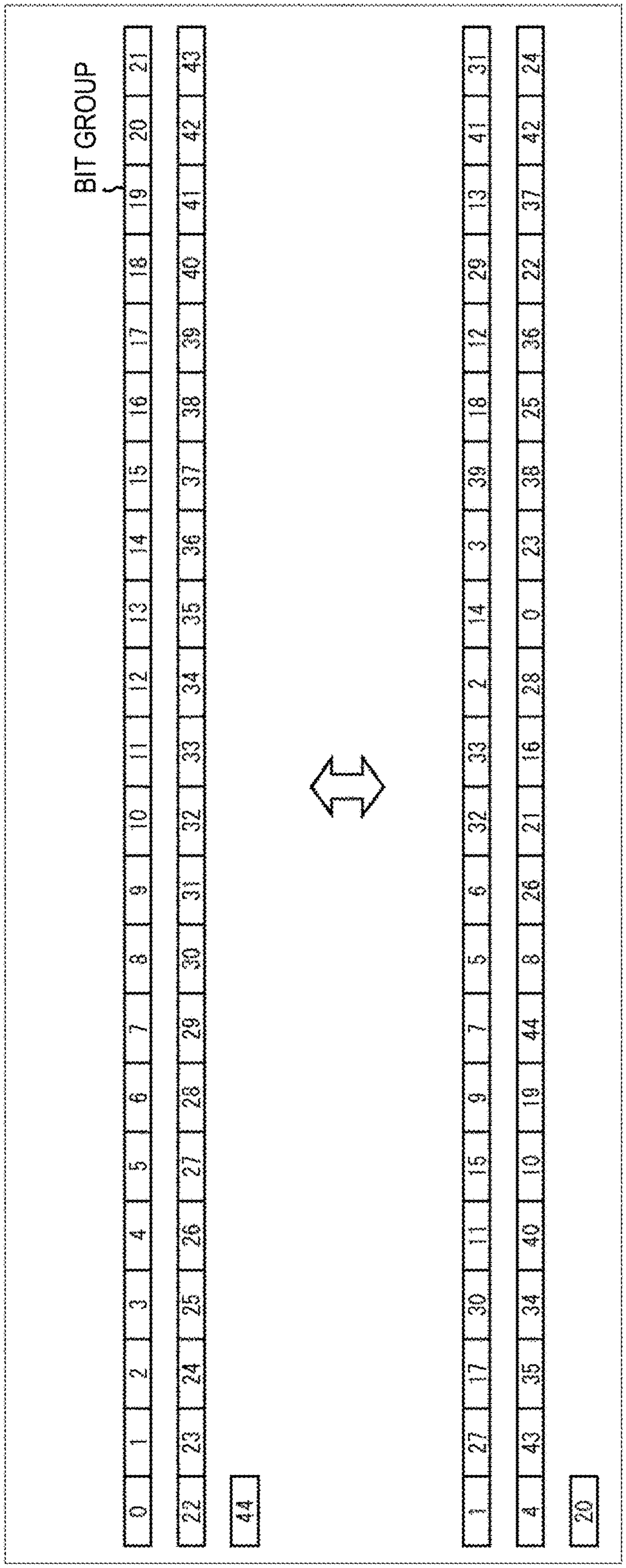

FIG. 154 is an illustration of a 13th example of a GW pattern for an LDPC code in which a code length N is 16 k bits.

Figure 155:
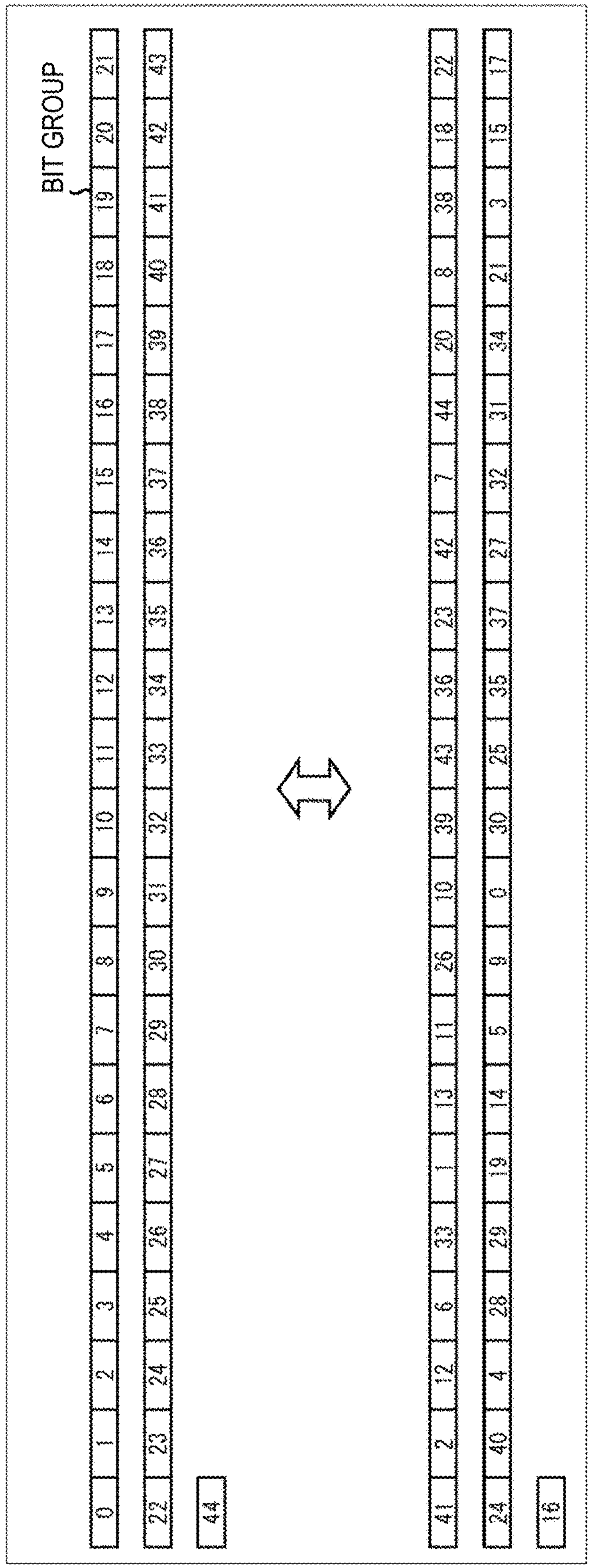

FIG. 155 is an illustration of a 14th example of a GW pattern for an LDPC code in which a code length N is 16 k bits.

Figure 156:
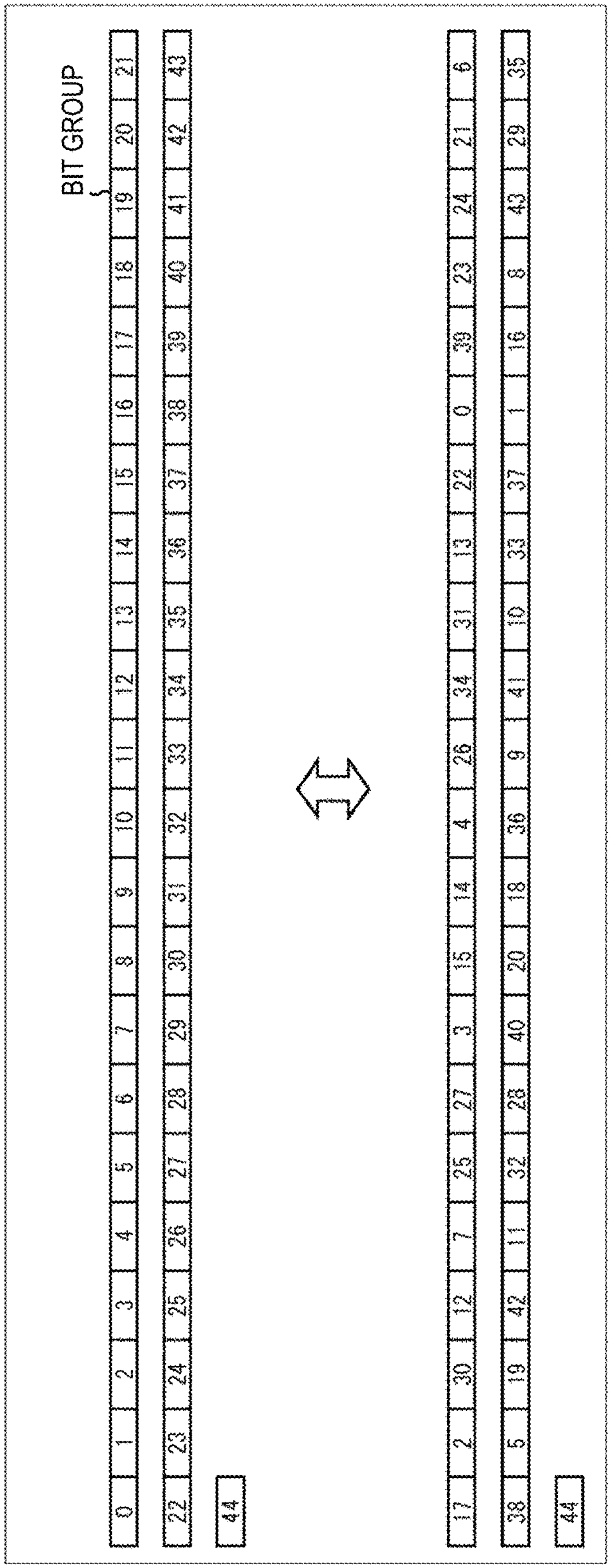

FIG. 156 is an illustration of a 15th example of a GW pattern for an LDPC code in which a code length N is 16 k bits.

Figure 157:
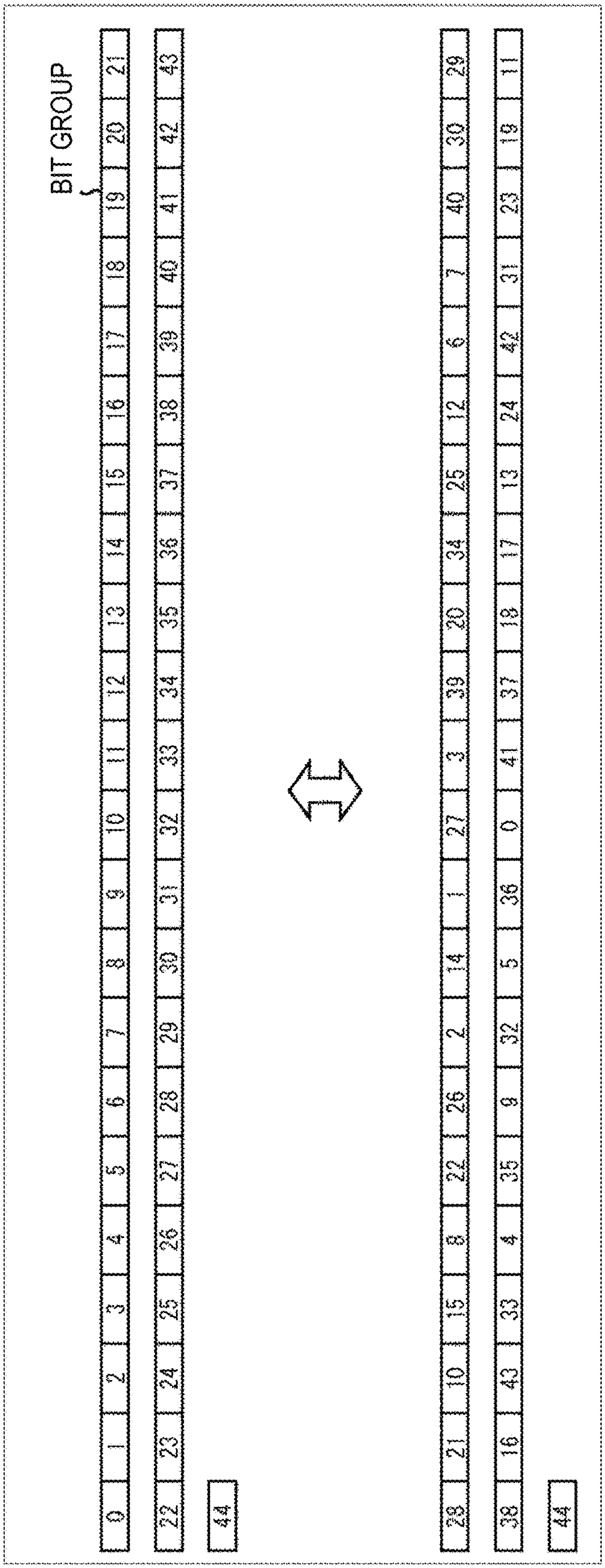

FIG. 157 is an illustration of a 16th example of a GW pattern for an LDPC code in which a code length N is 16 k bits.

FIG. 158 is an illustration of a simulation result of a simulation of measuring an error rate.

Figure 159:
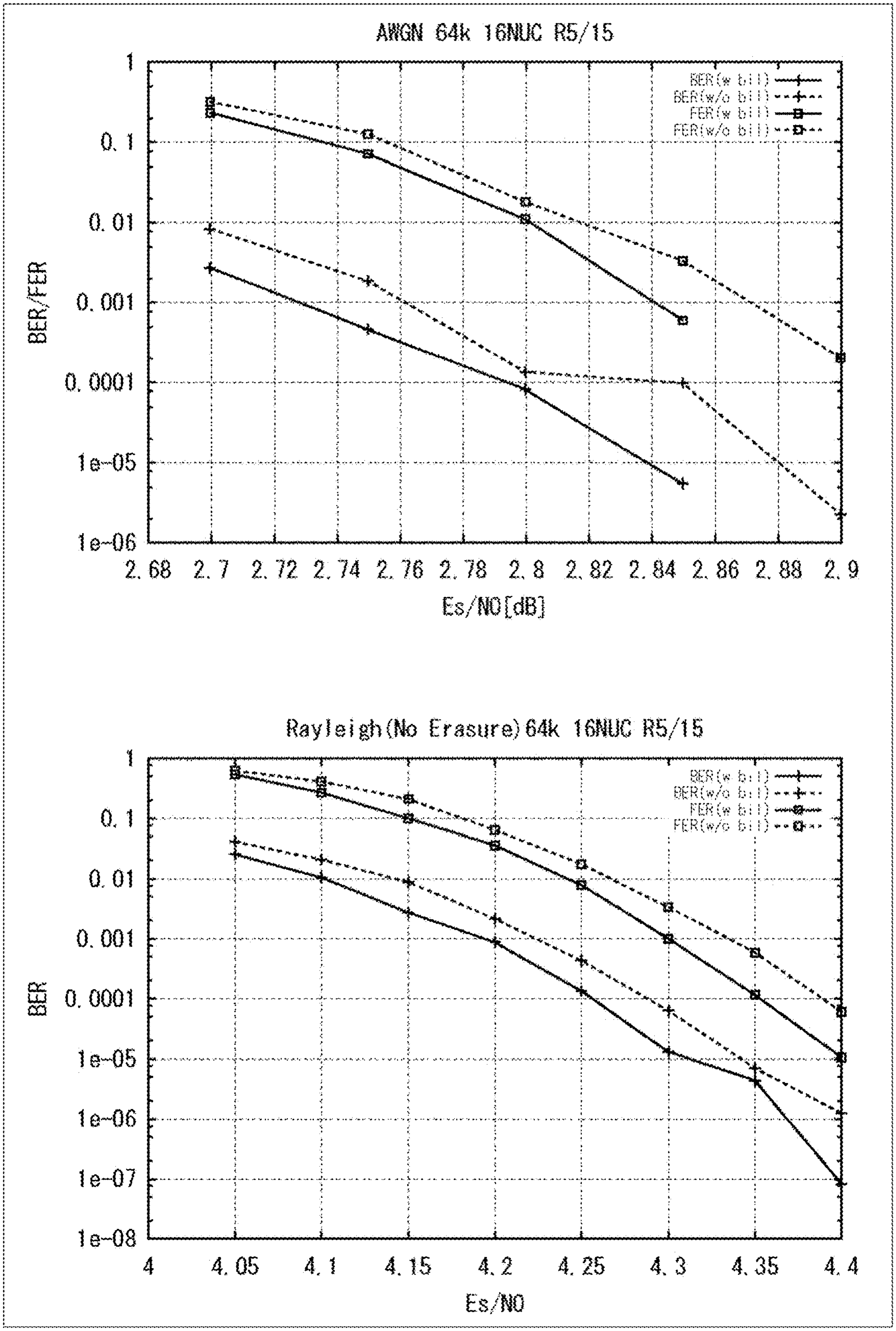

FIG. 159 is an illustration of a simulation result of a simulation of measuring an error rate.

FIG. 160 is an illustration of a simulation result of a simulation of measuring an error rate.

Figure 161:
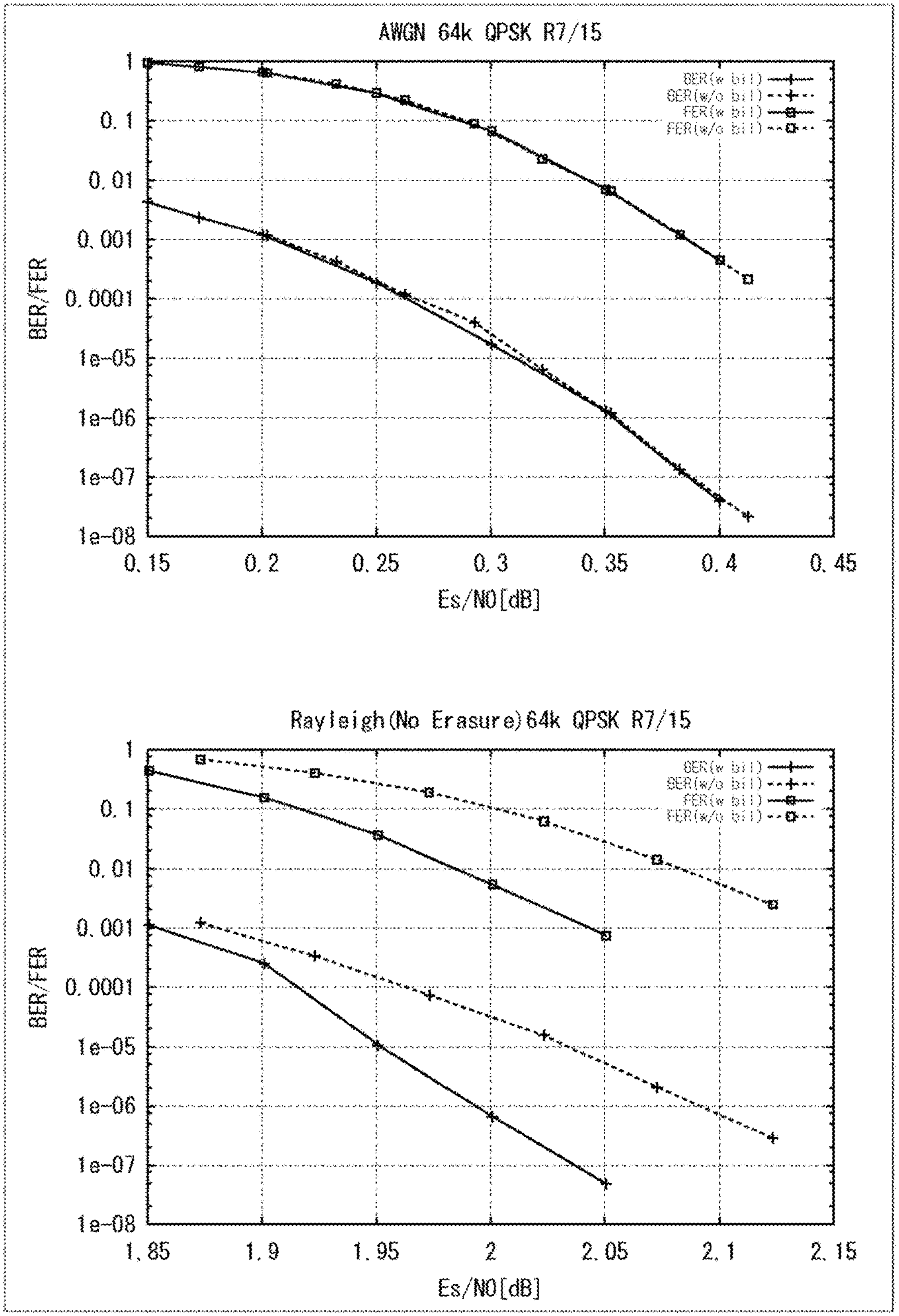

FIG. 161 is an illustration of a simulation result of a simulation of measuring an error rate.

FIG. 162 is an illustration of a simulation result of a simulation of measuring an error rate.

FIG. 163 is an illustration of a simulation result of a simulation of measuring an error rate.

Figure 164:
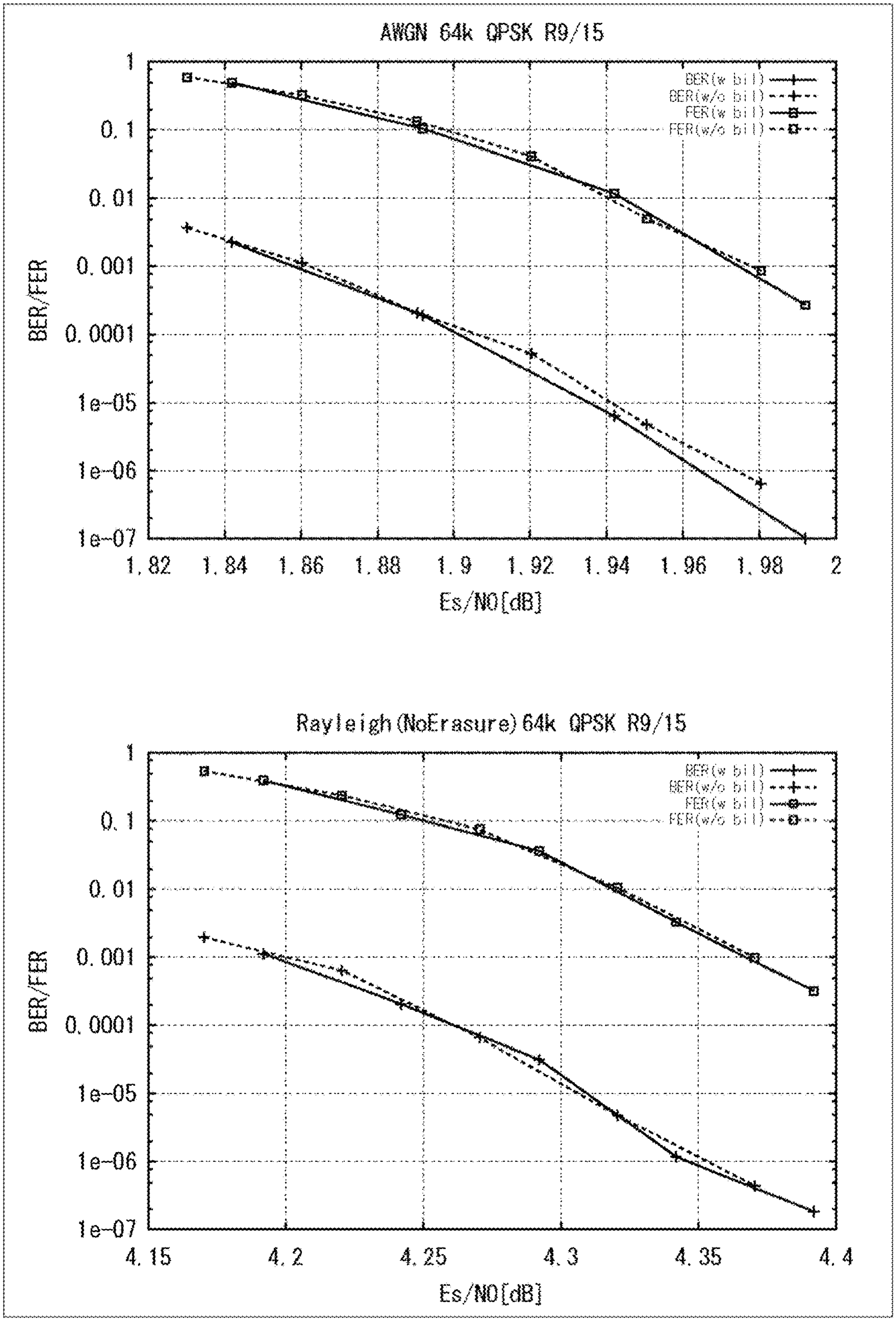

FIG. 164 is an illustration of a simulation result of a simulation of measuring an error rate.

Figure 165:
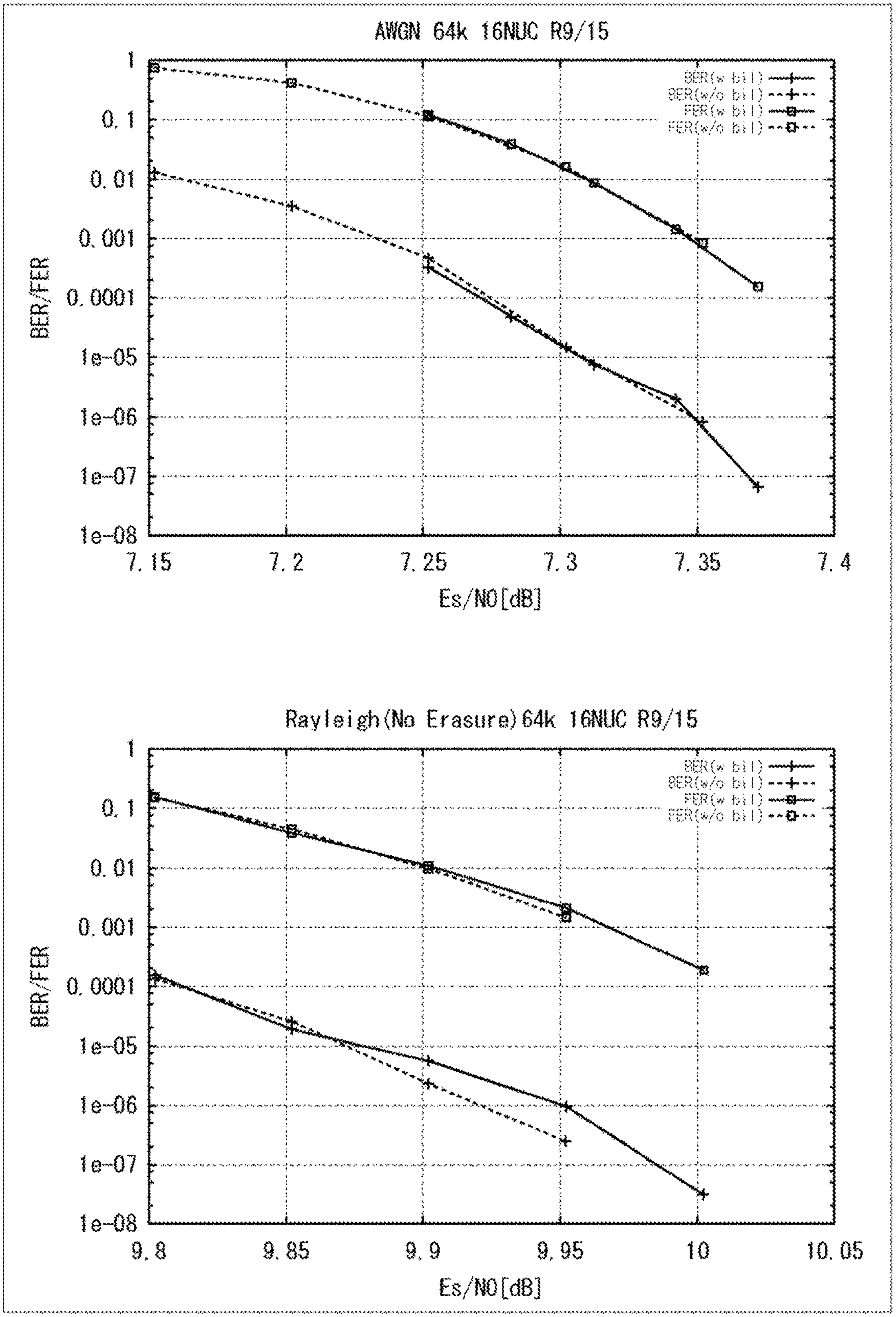

FIG. 165 is an illustration of a simulation result of a simulation of measuring an error rate.

FIG. 166 is an illustration of a simulation result of a simulation of measuring an error rate.

Figure 167:
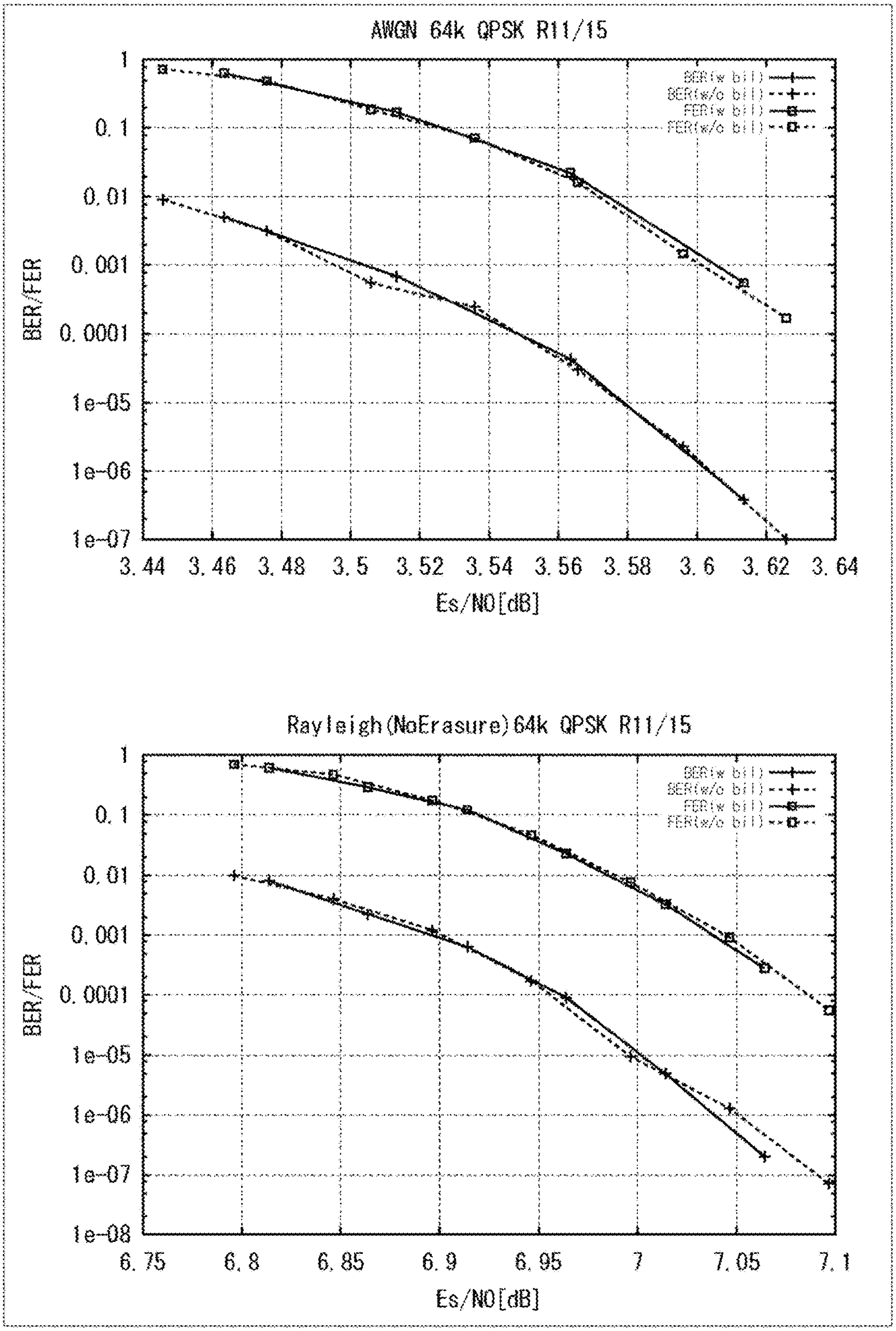

FIG. 167 is an illustration of a simulation result of a simulation of measuring an error rate.

Figure 168:
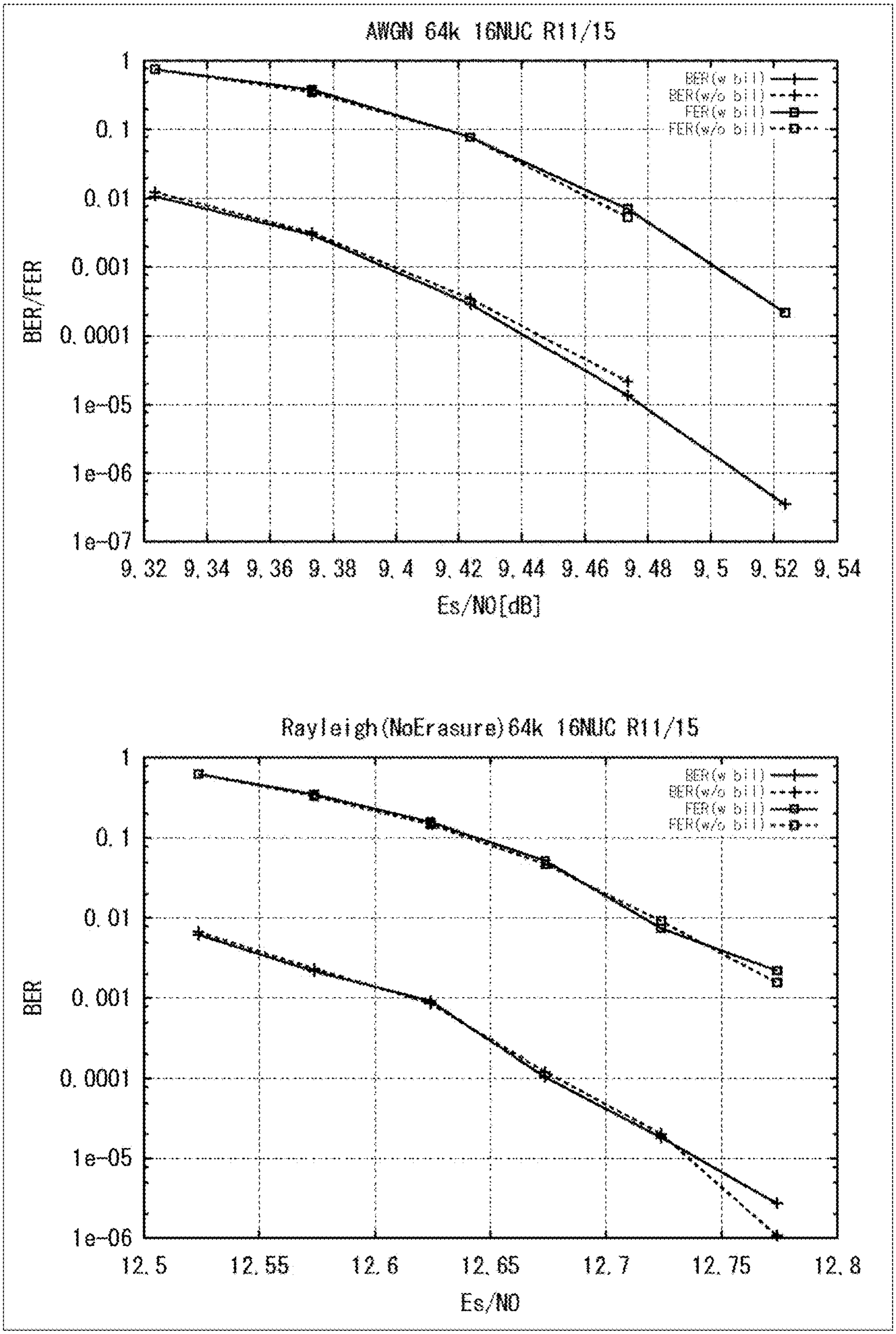

FIG. 168 is an illustration of a simulation result of a simulation of measuring an error rate.

Figure 169:
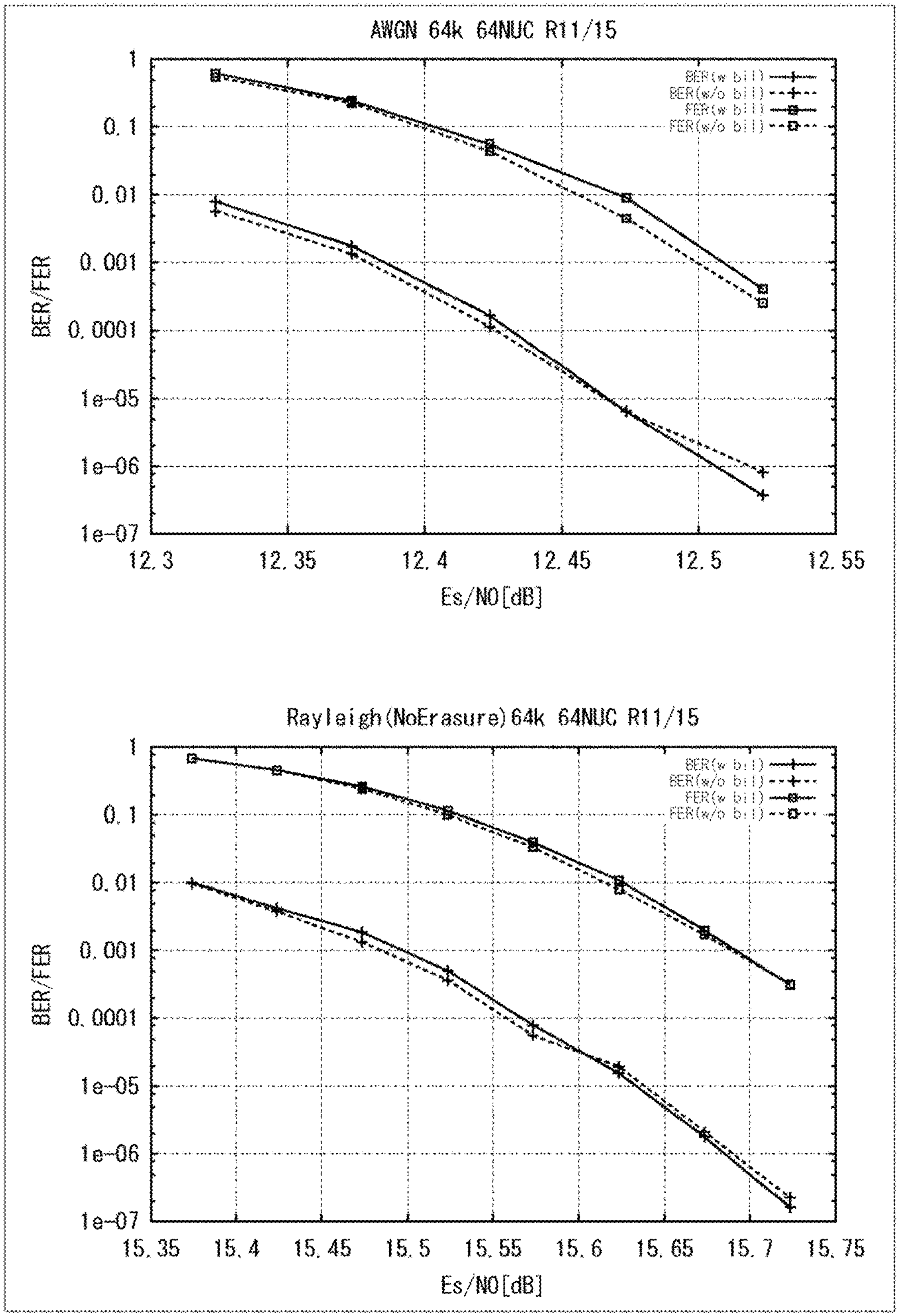

FIG. 169 is an illustration of a simulation result of a simulation of measuring an error rate.

Figure 170:
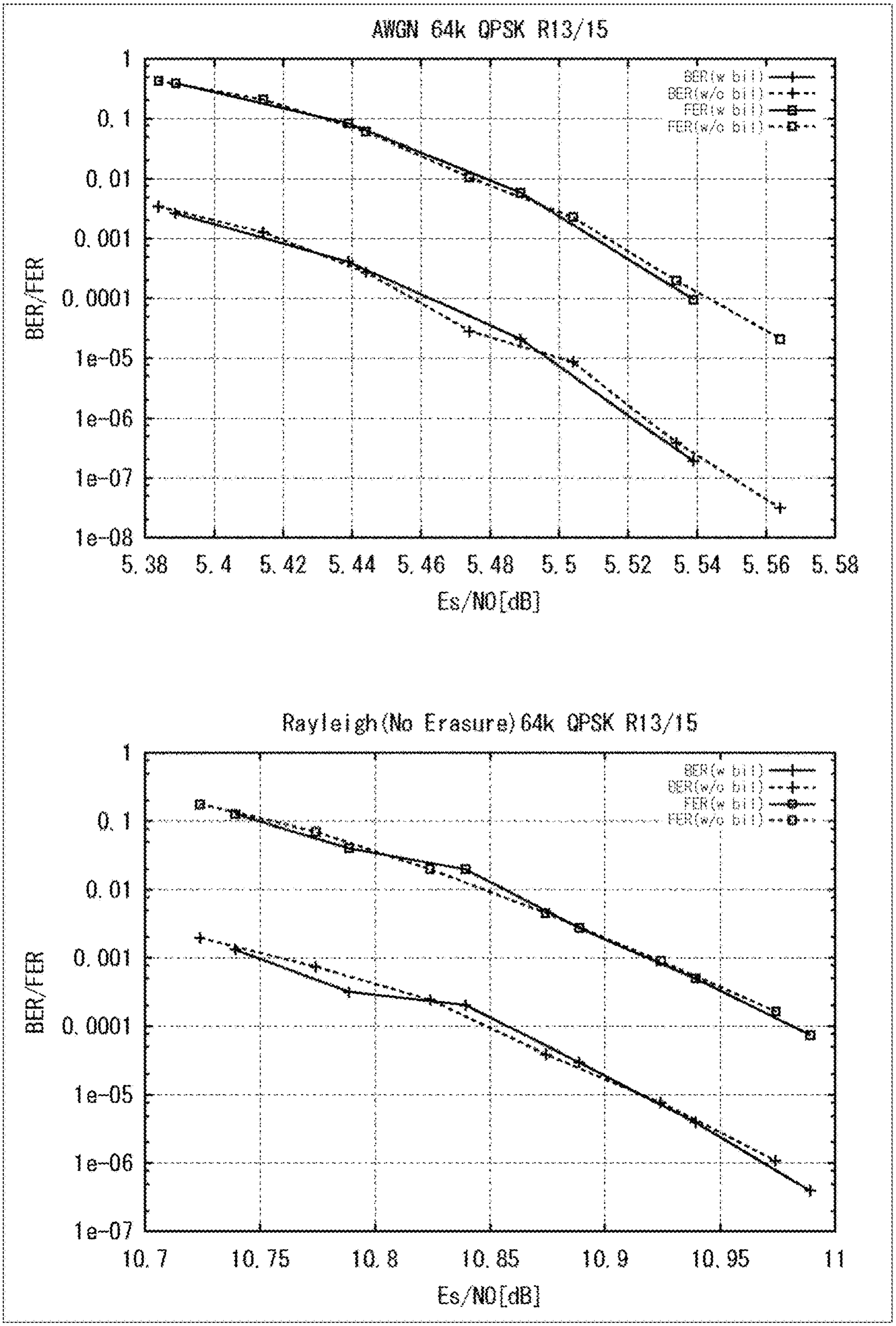

FIG. 170 is an illustration of a simulation result of a simulation of measuring an error rate.

Figure 171:
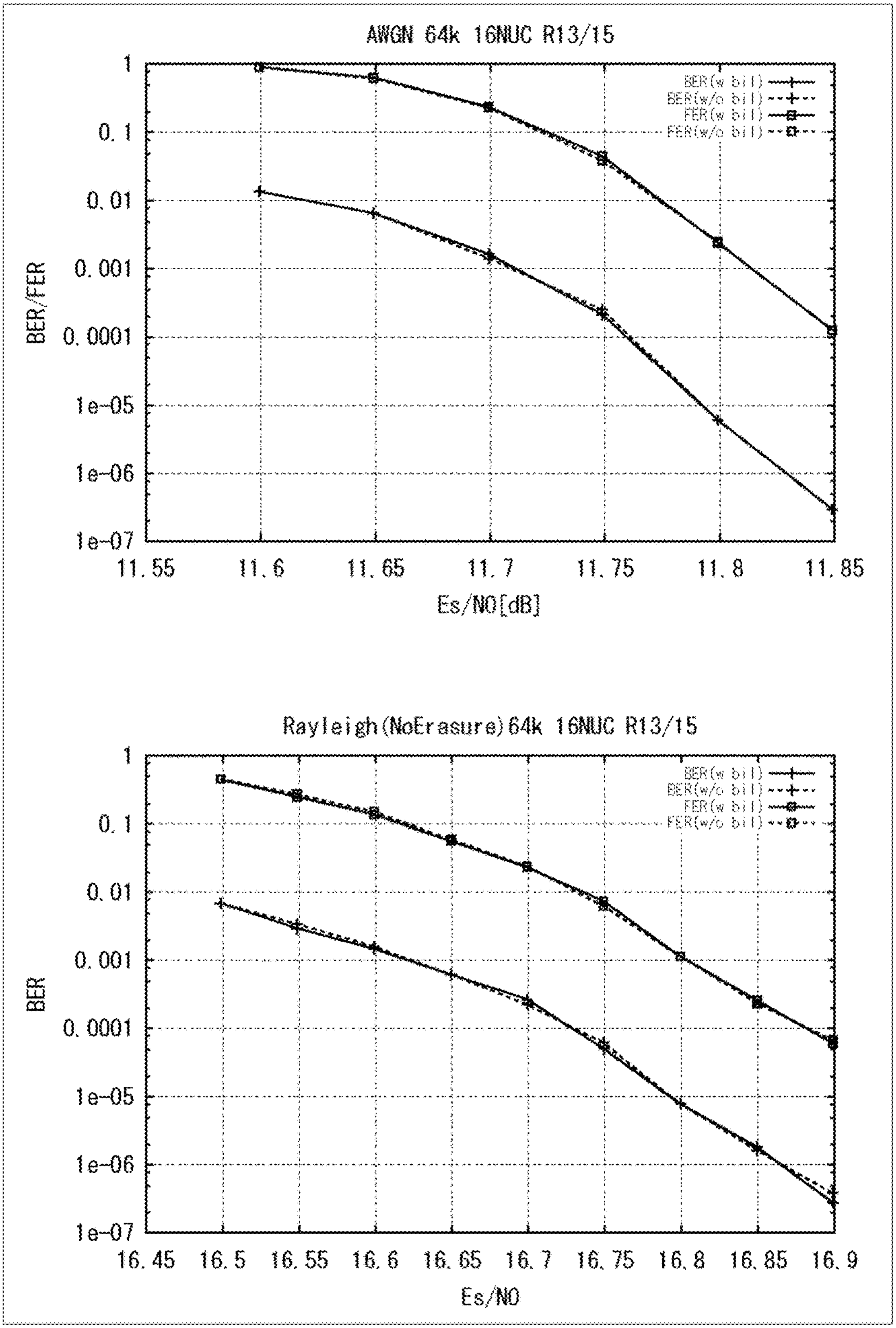

FIG. 171 is an illustration of a simulation result of a simulation of measuring an error rate.

Figure 172:
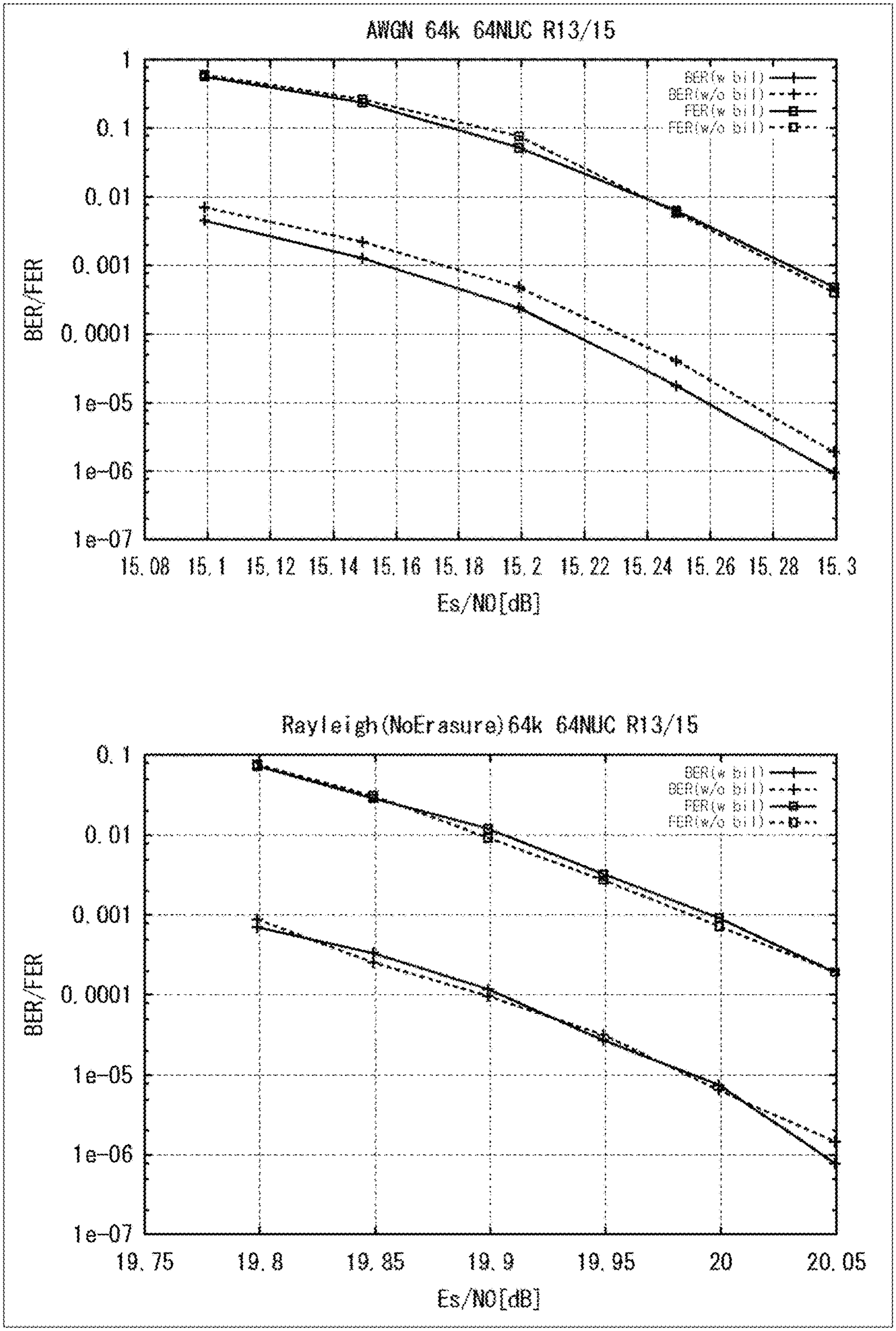

FIG. 172 is an illustration of a simulation result of a simulation of measuring an error rate.

Figure 173:
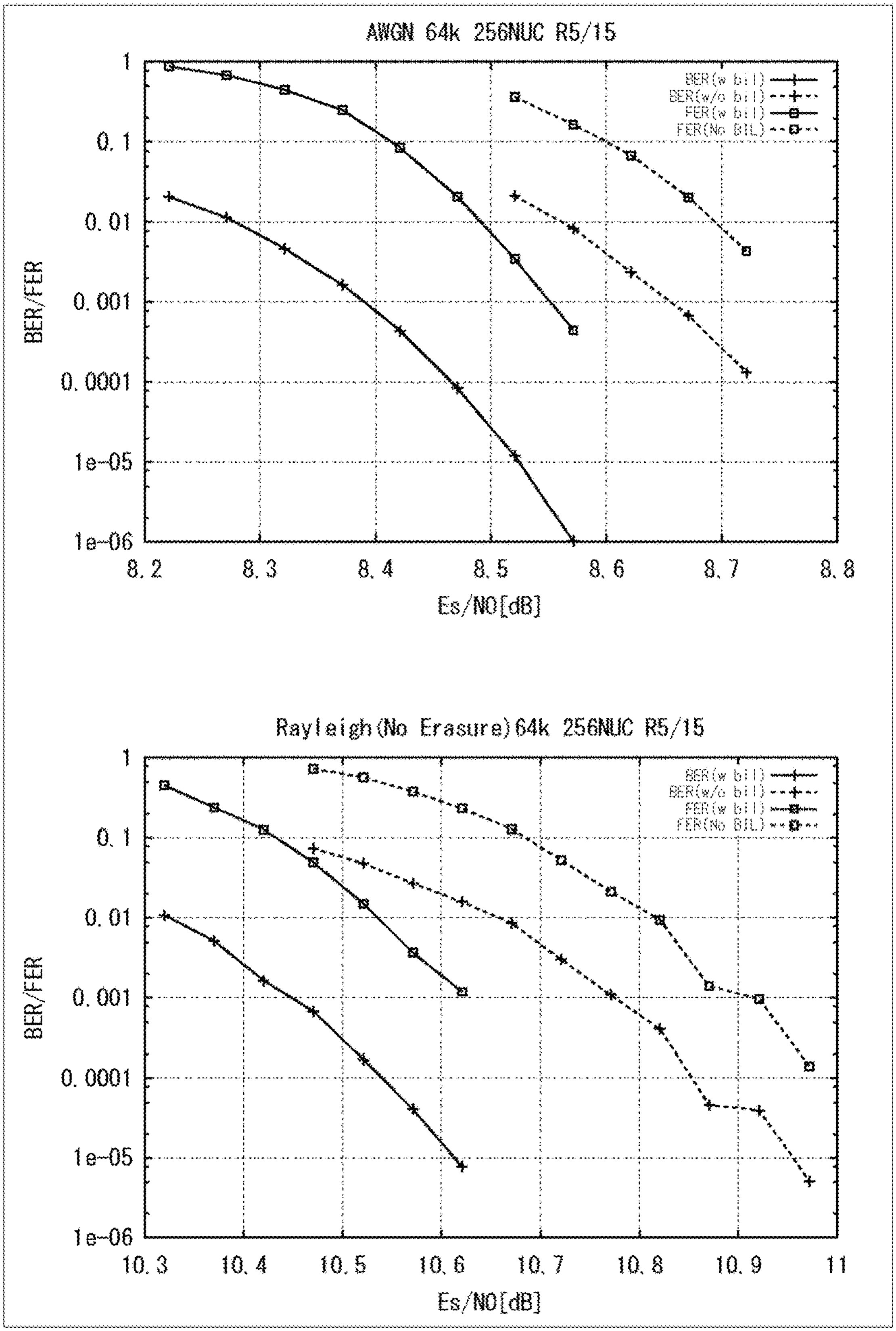

FIG. 173 is an illustration of a simulation result of a simulation of measuring an error rate.

FIG. 174 is an illustration of a simulation result of a simulation of measuring an error rate.

Figure 175:
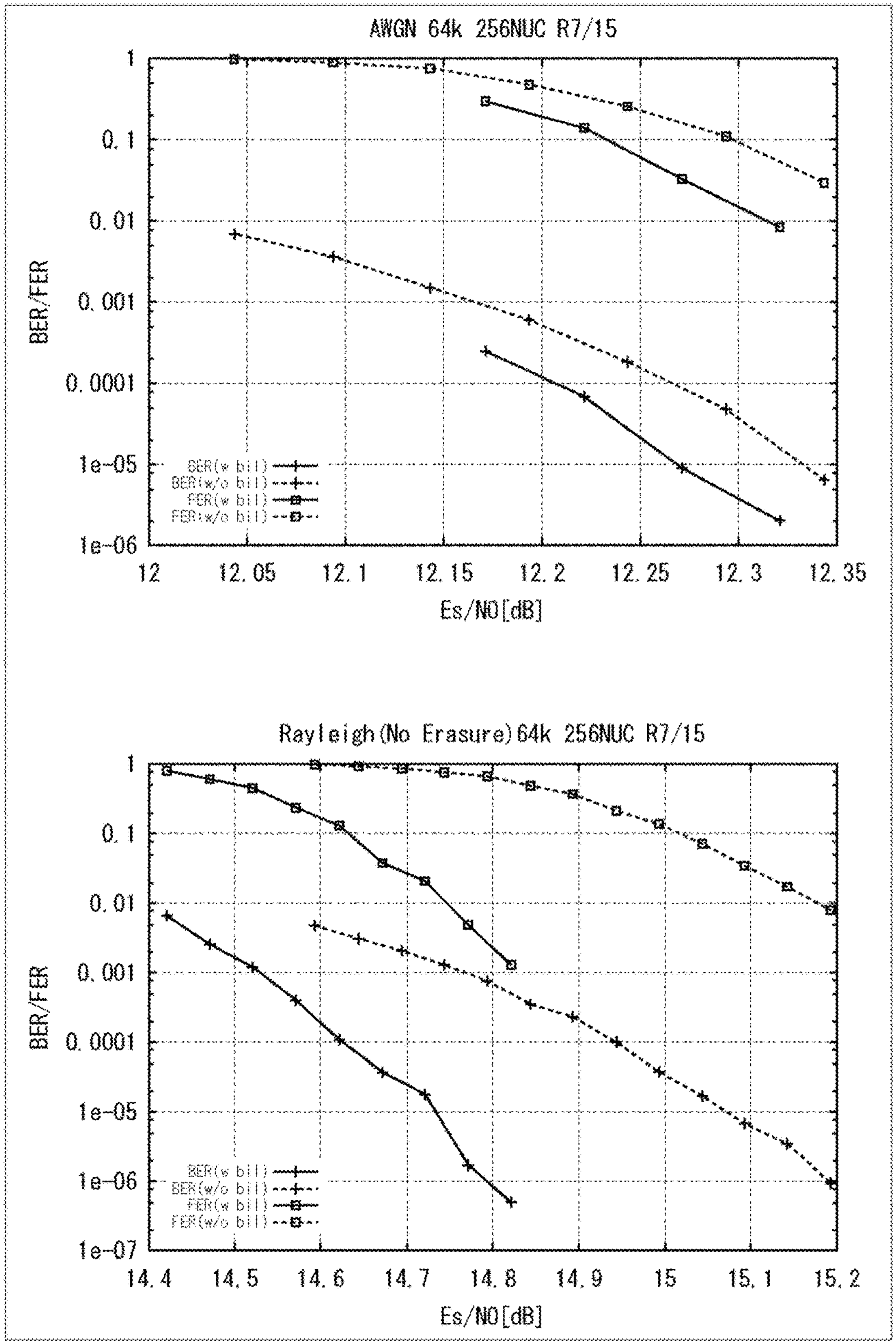

FIG. 175 is an illustration of a simulation result of a simulation of measuring an error rate.

FIG. 176 is an illustration of a simulation result of a simulation of measuring an error rate.

Figure 177:
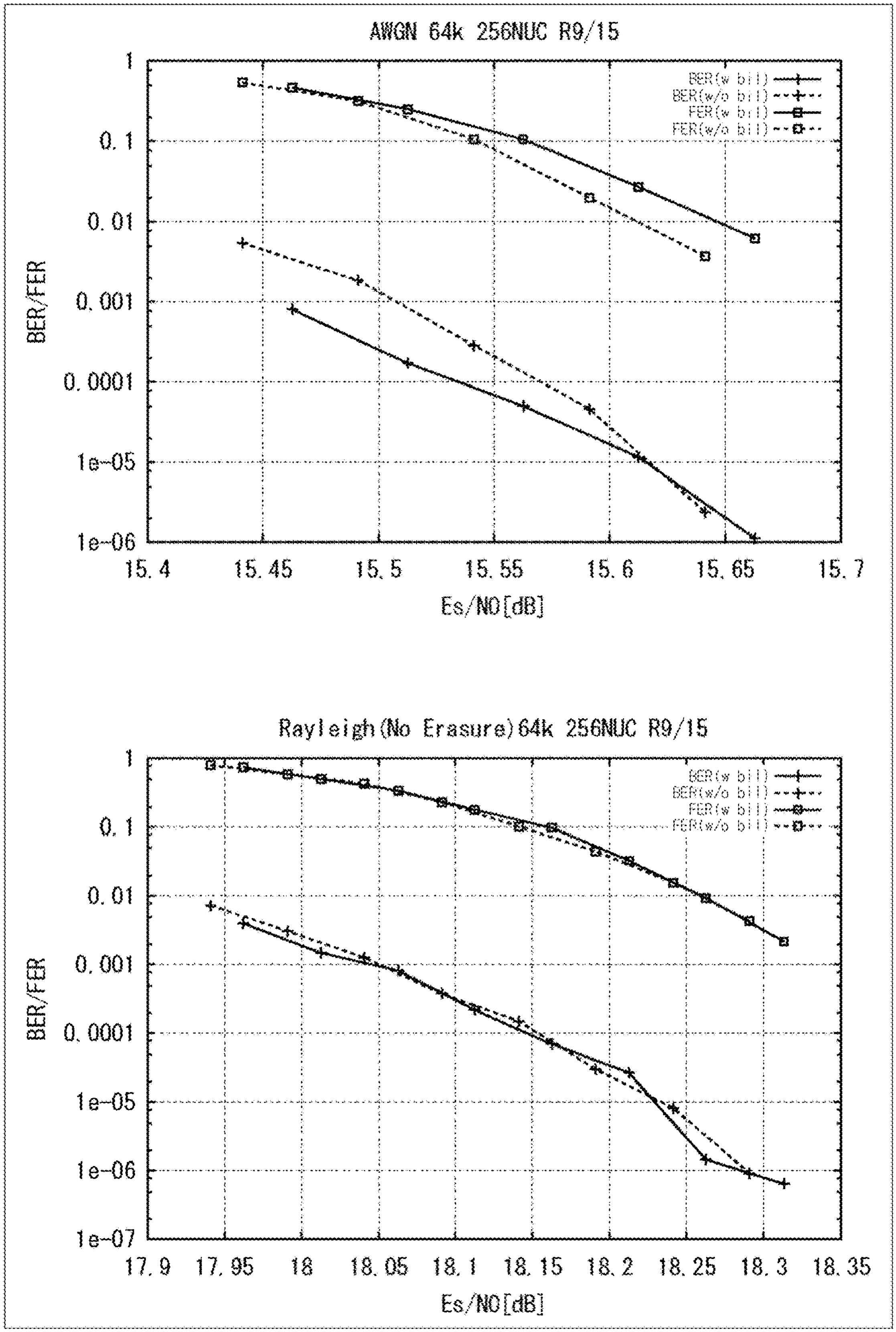

FIG. 177 is an illustration of a simulation result of a simulation of measuring an error rate.

FIG. 178 is an illustration of a simulation result of a simulation of measuring an error rate.

FIG. 179 is an illustration of a simulation result of a simulation of measuring an error rate.

Figure 180:
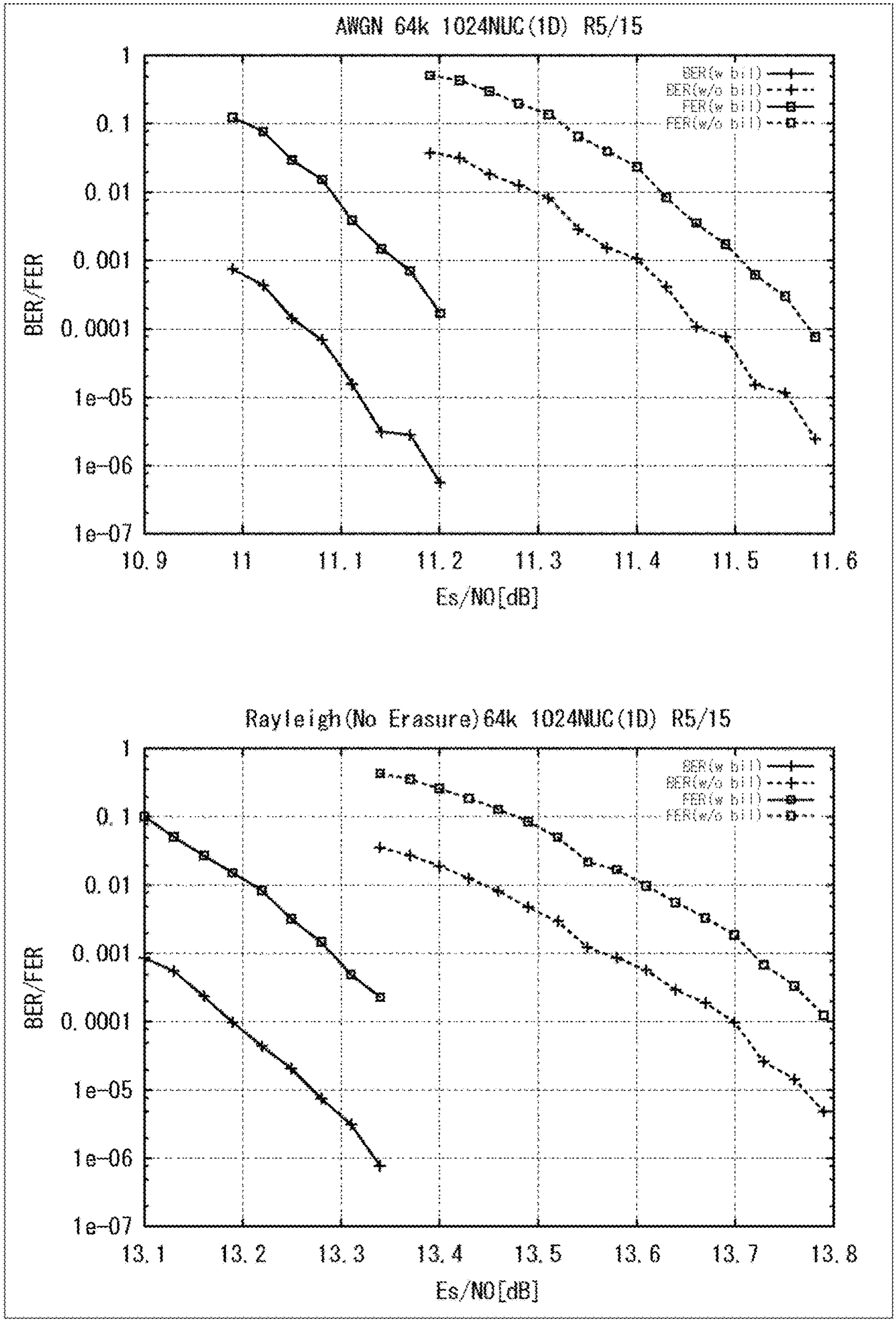

FIG. 180 is an illustration of a simulation result of a simulation of measuring an error rate.

FIG. 181 is an illustration of a simulation result of a simulation of measuring an error rate.

Figure 182:
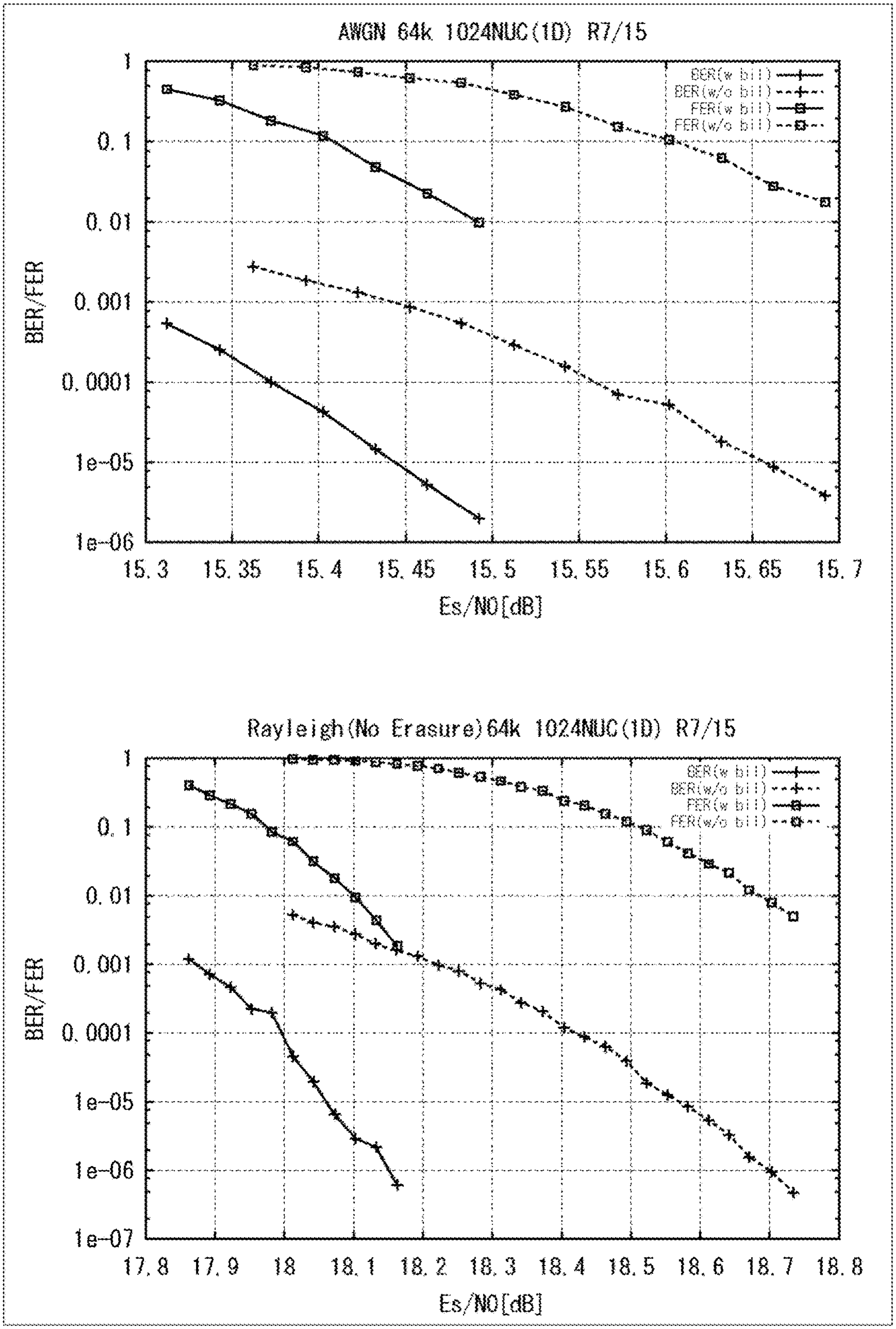

FIG. 182 is an illustration of a simulation result of a simulation of measuring an error rate.

Figure 183:
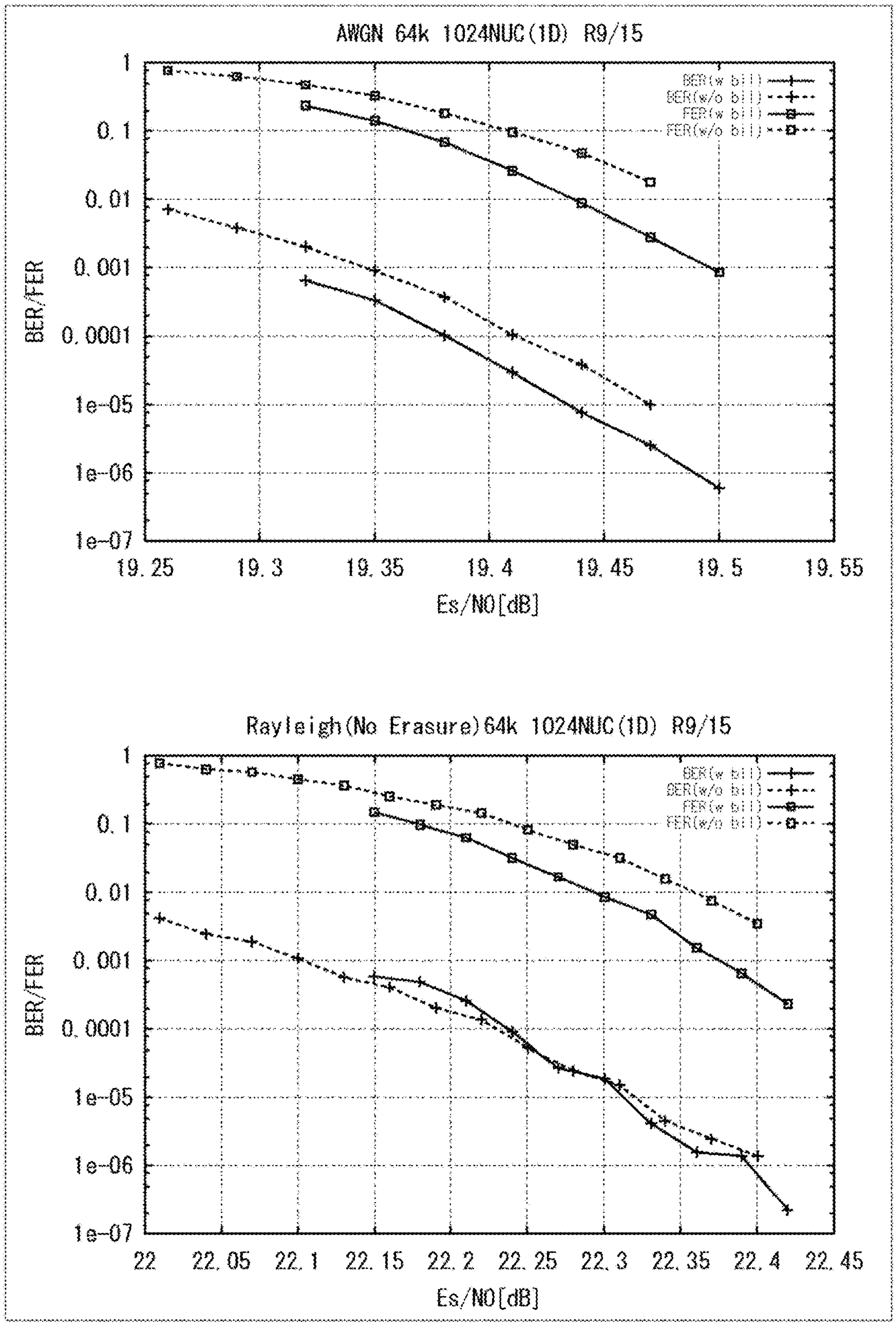

FIG. 183 is an illustration of a simulation result of a simulation of measuring an error rate.

Figure 184:
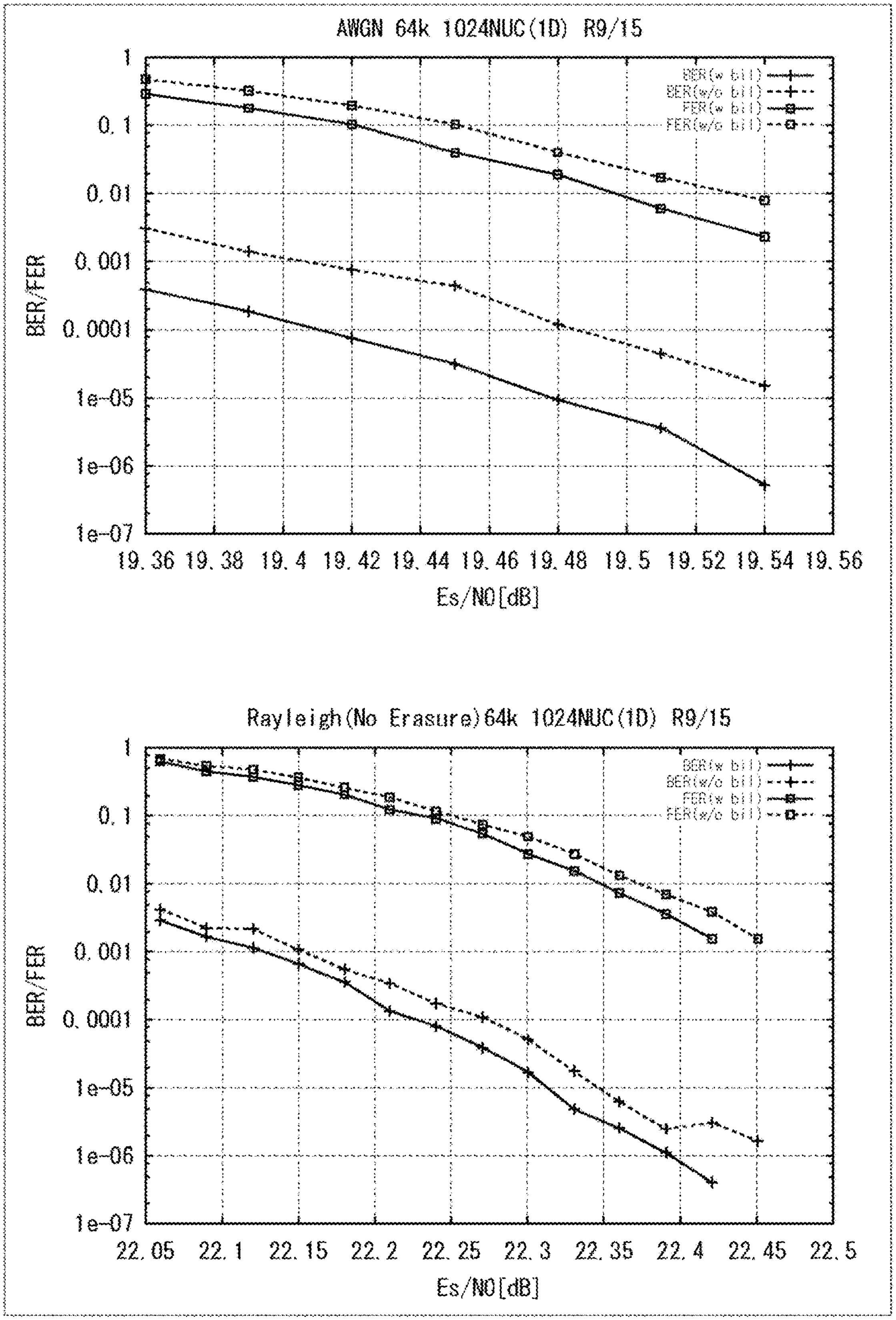

FIG. 184 is an illustration of a simulation result of a simulation of measuring an error rate.

FIG. 185 is an illustration of a simulation result of a simulation of measuring an error rate.

Figure 186:
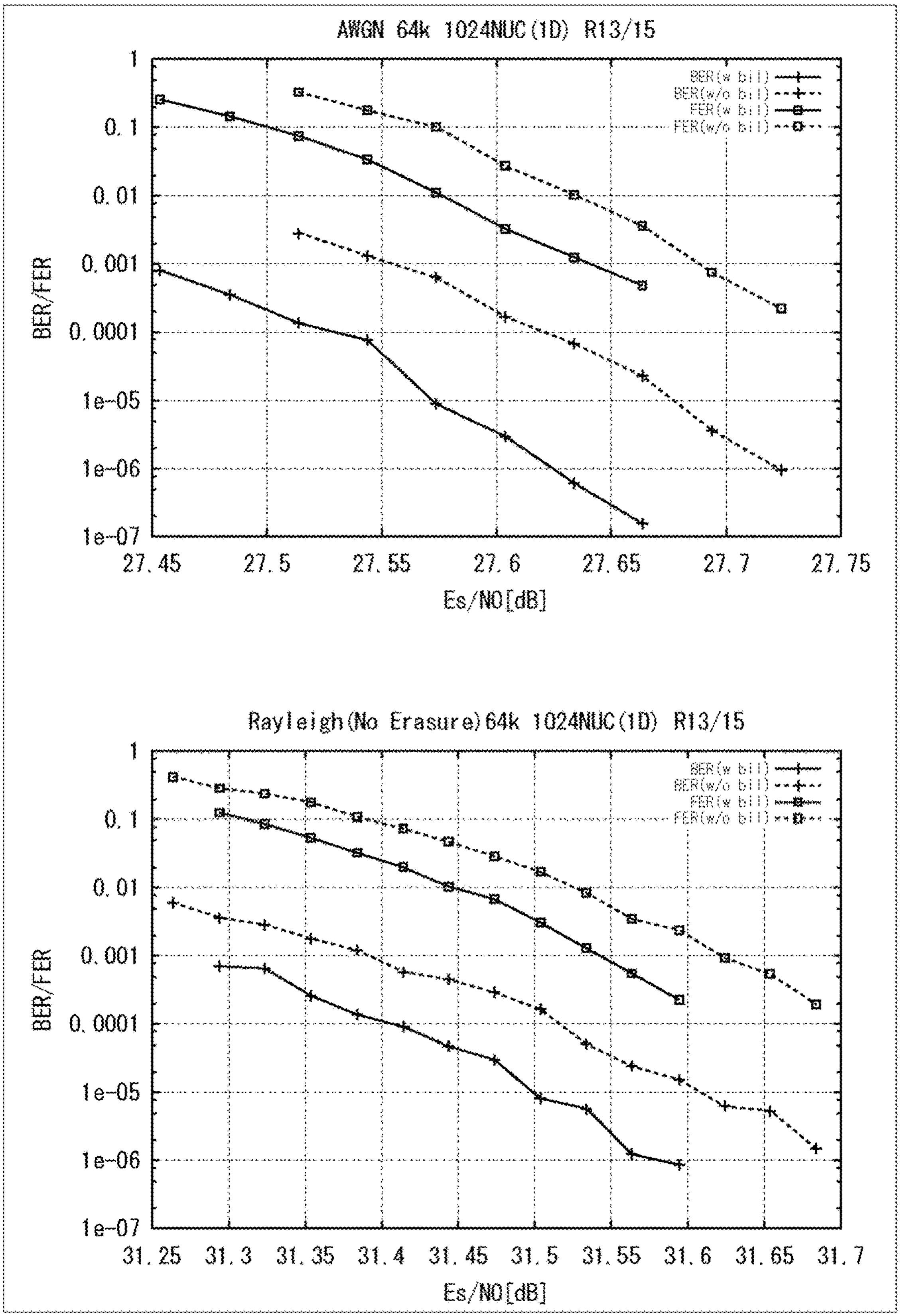

FIG. 186 is an illustration of a simulation result of a simulation of measuring an error rate.

Figure 187:
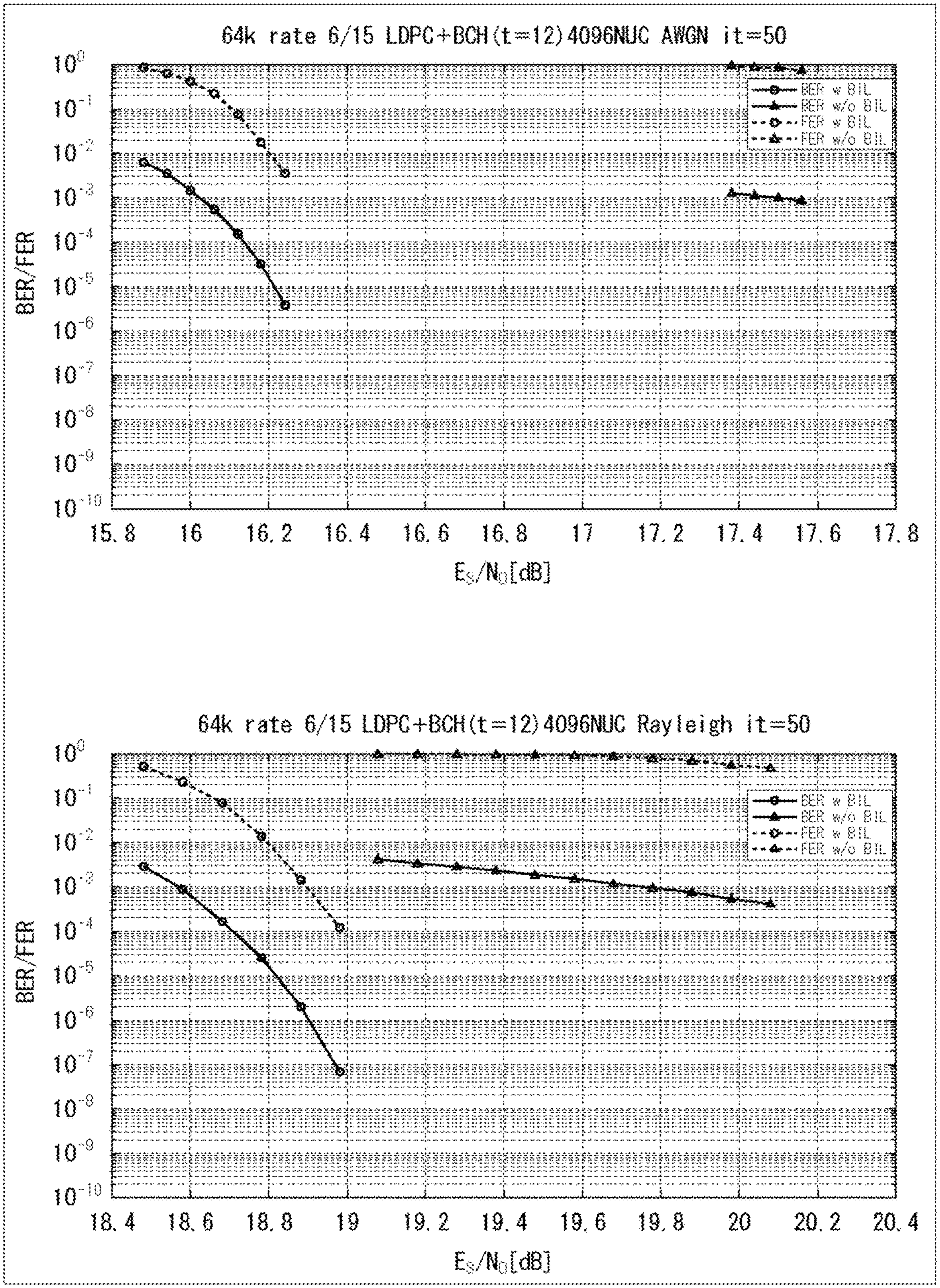

FIG. 187 is an illustration of a simulation result of a simulation of measuring an error rate.

FIG. 188 is an illustration of a simulation result of a simulation of measuring an error rate.

Figure 189:
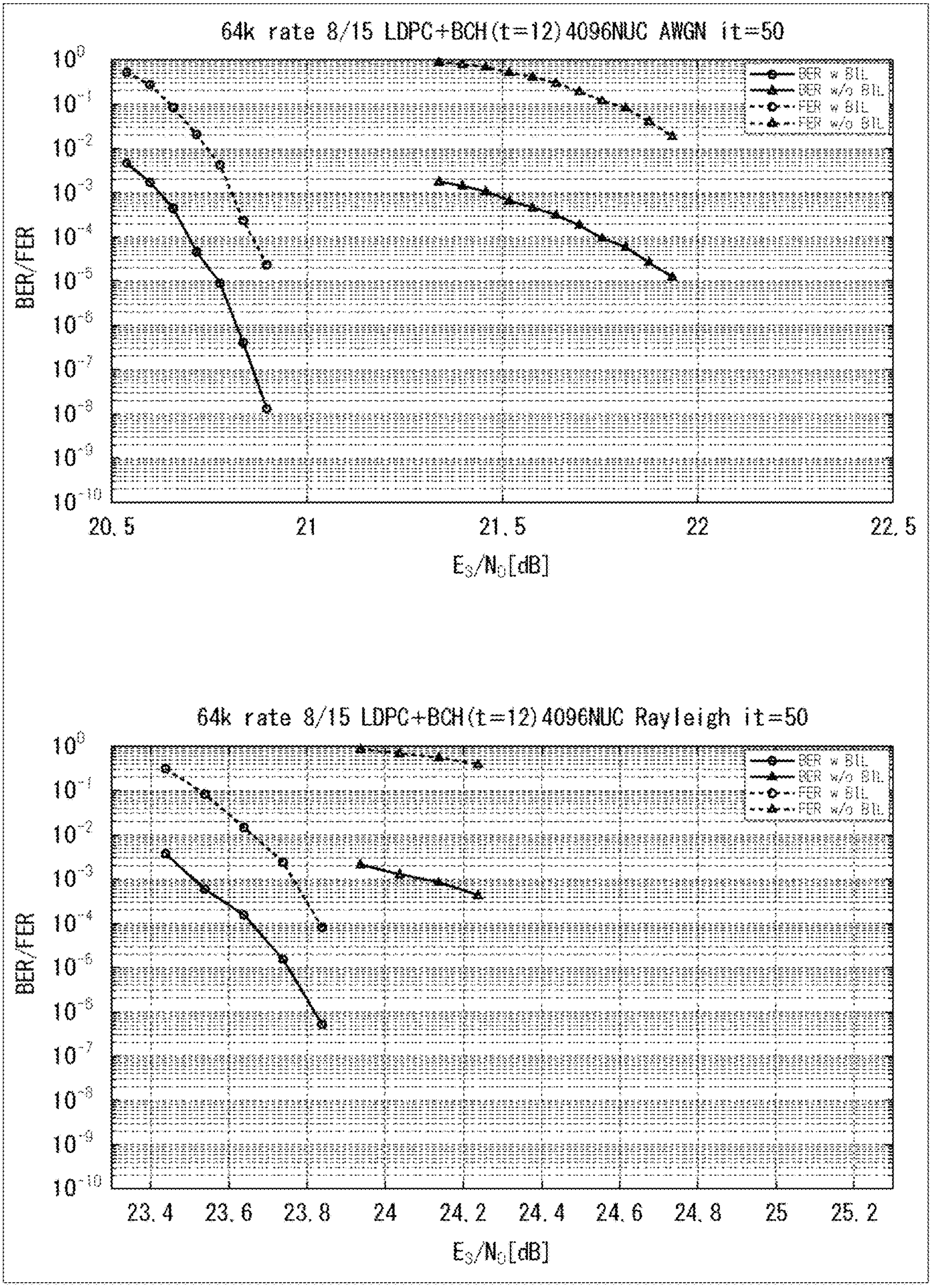

FIG. 189 is an illustration of a simulation result of a simulation of measuring an error rate.

Figure 190:
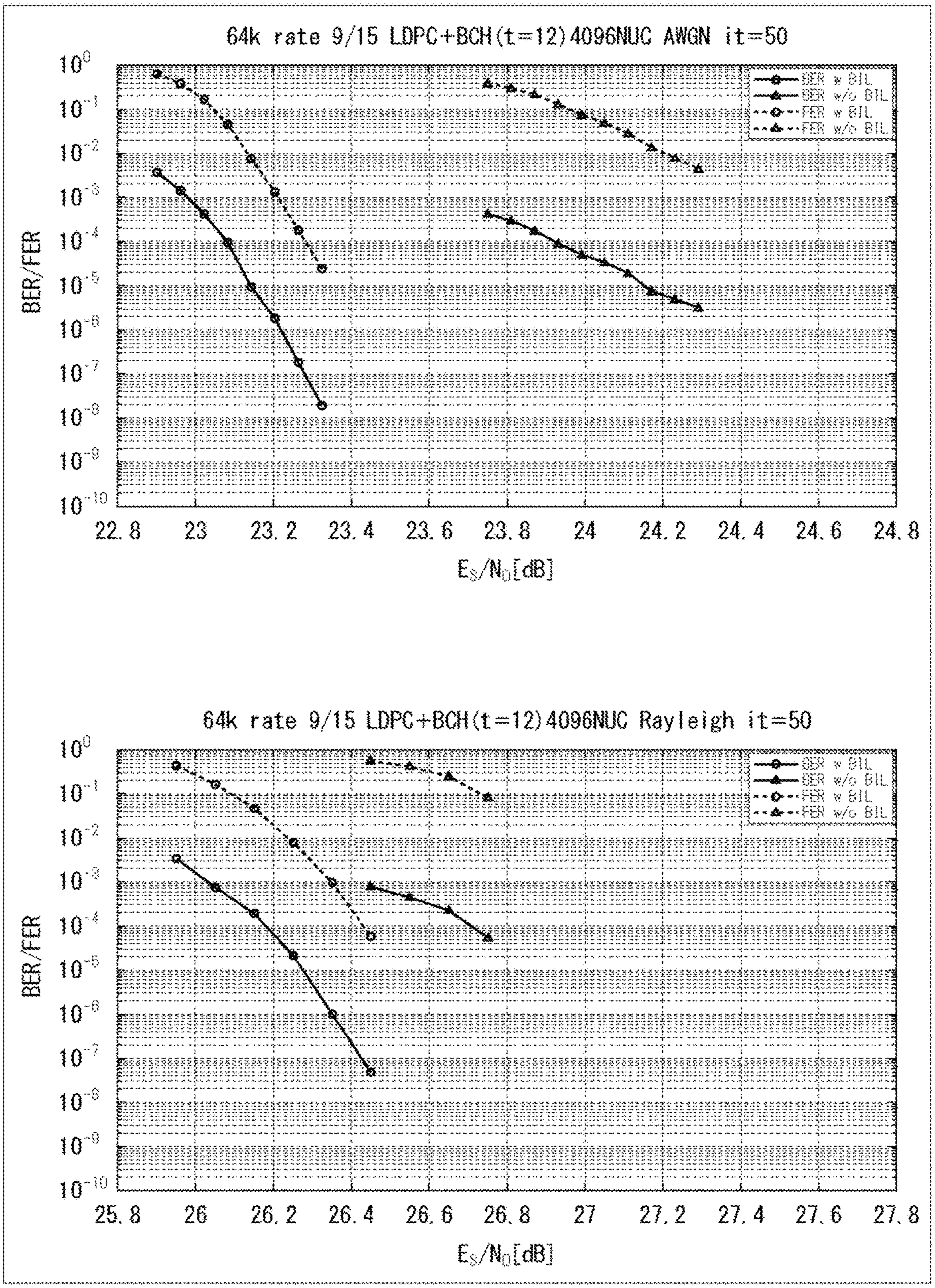

FIG. 190 is an illustration of a simulation result of a simulation of measuring an error rate.

Figure 191:
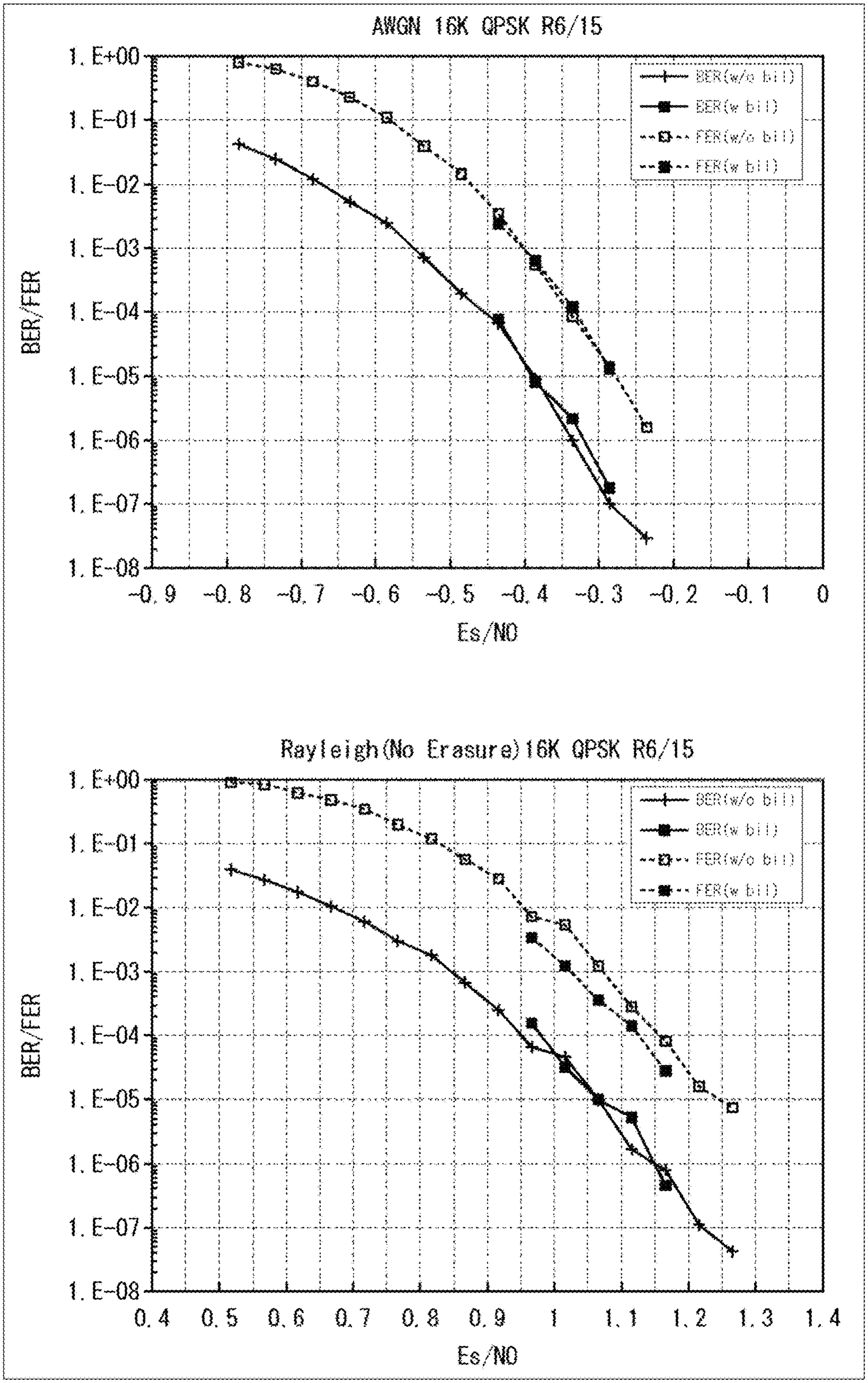

FIG. 191 is an illustration of a simulation result of a simulation of measuring an error rate.

Figure 192:
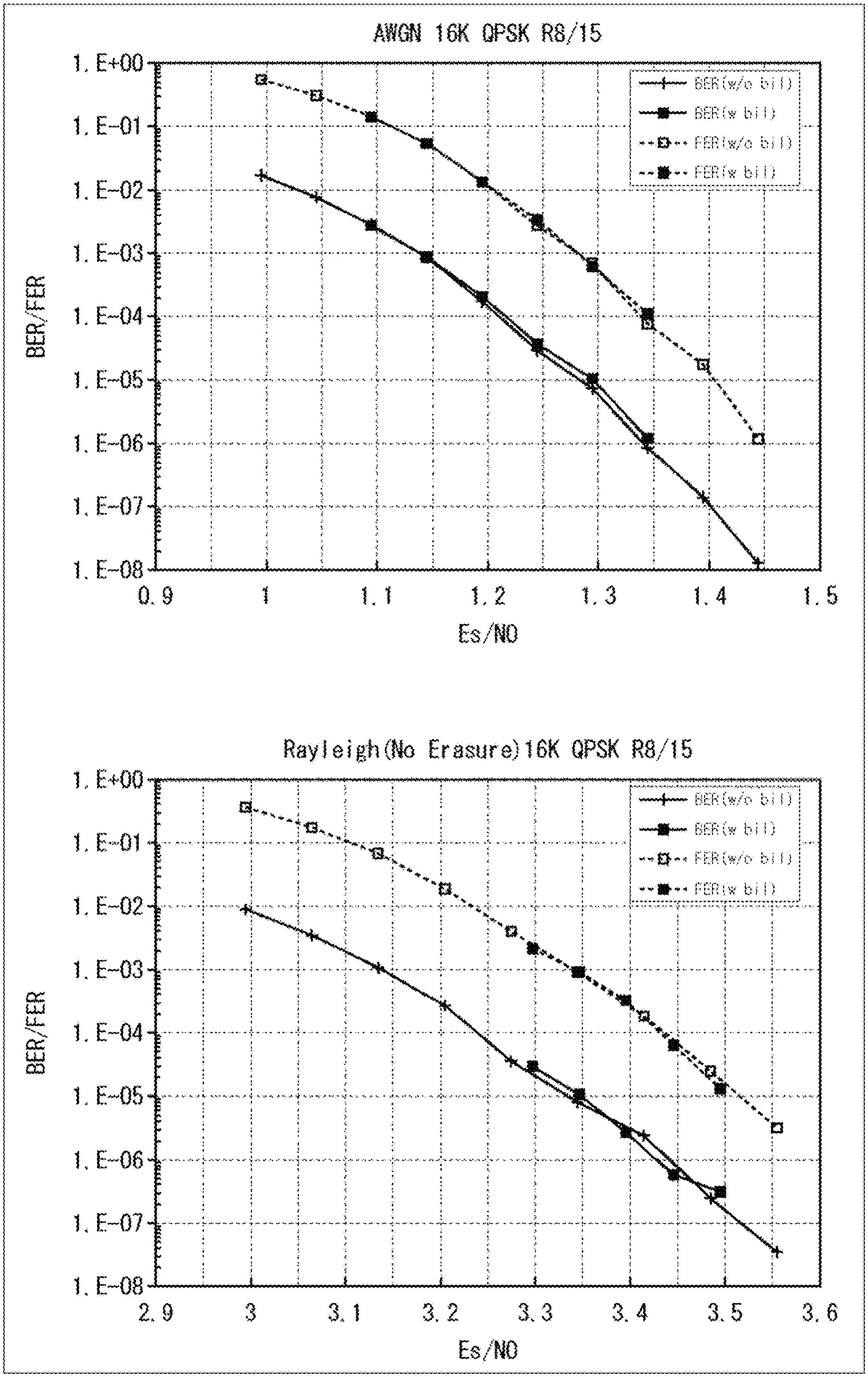

FIG. 192 is an illustration of a simulation result of a simulation of measuring an error rate.

FIG. 193 is an illustration of a simulation result of a simulation of measuring an error rate.

FIG. 194 is an illustration of a simulation result of a simulation of measuring an error rate.

Figure 195:
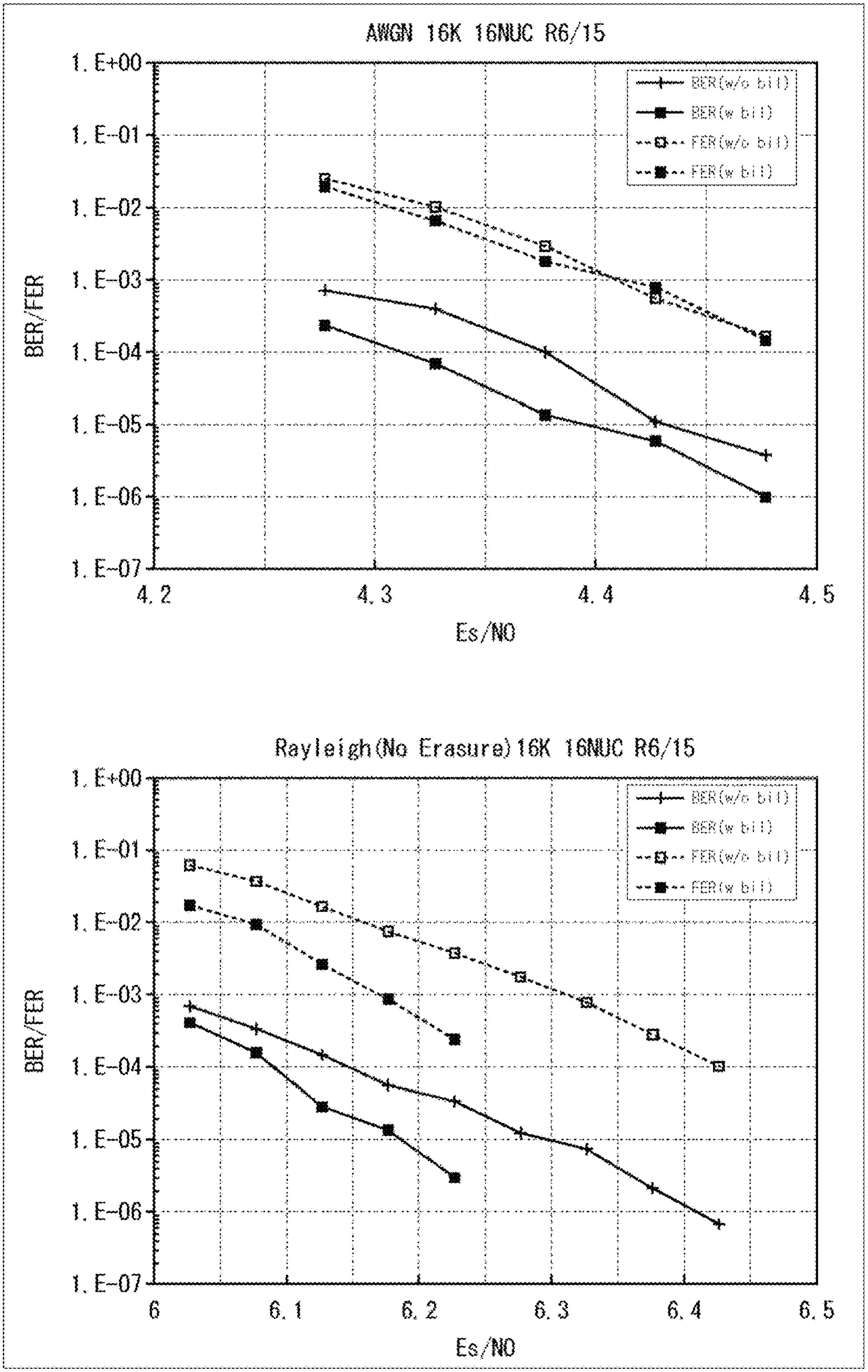

FIG. 195 is an illustration of a simulation result of a simulation of measuring an error rate.

Figure 196:
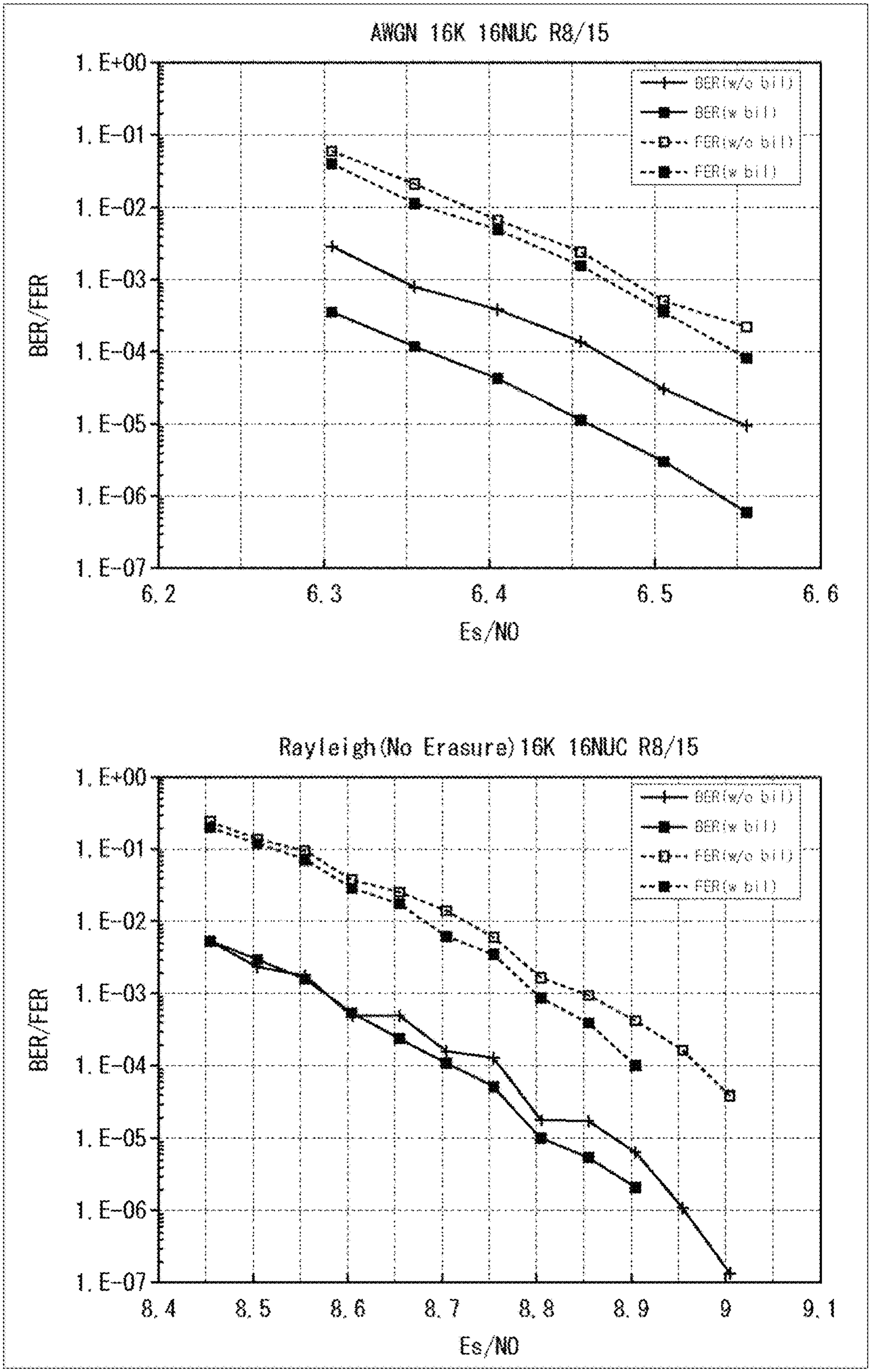

FIG. 196 is an illustration of a simulation result of a simulation of measuring an error rate.

Figure 197:
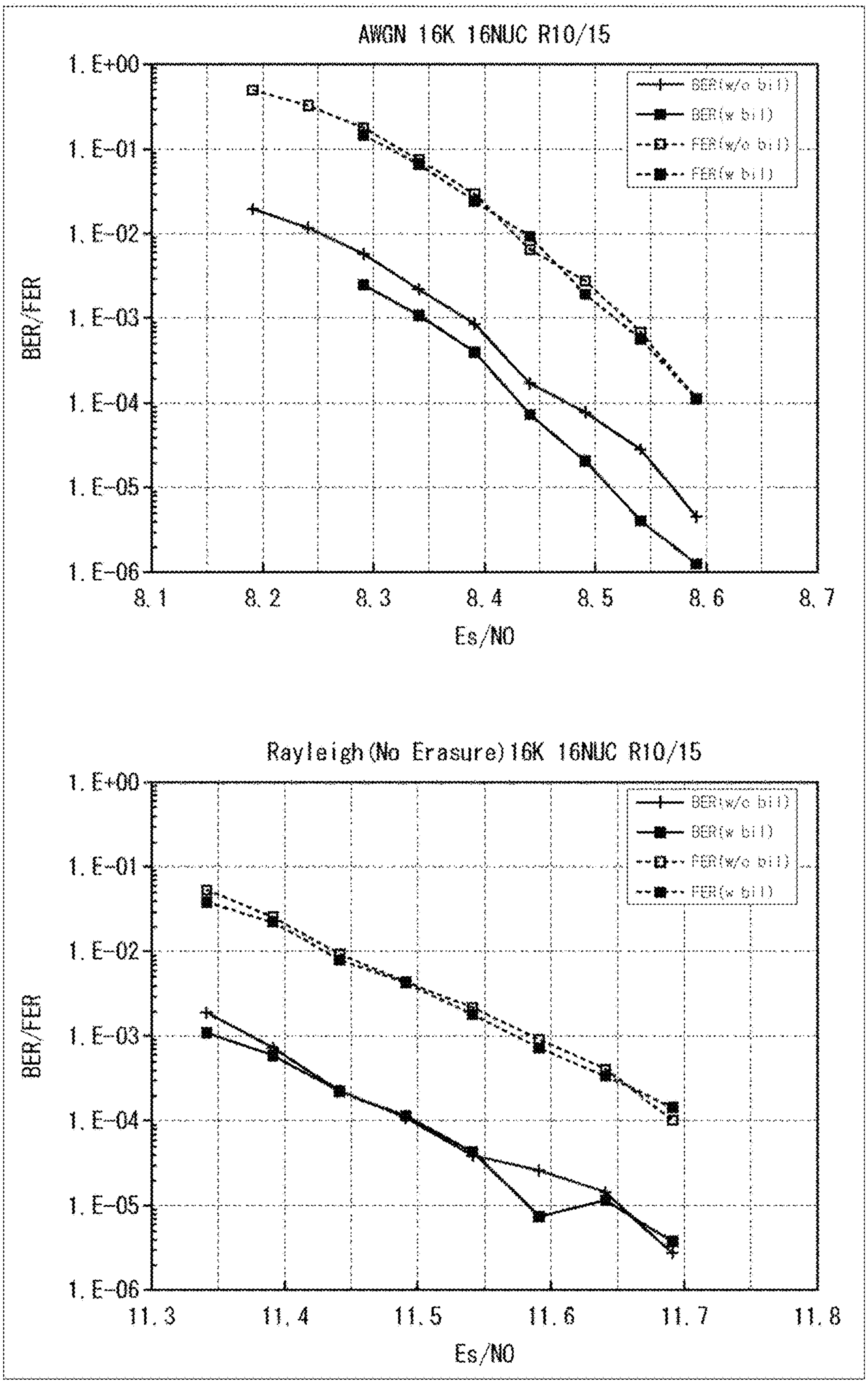

FIG. 197 is an illustration of a simulation result of a simulation of measuring an error rate.

Figure 198:
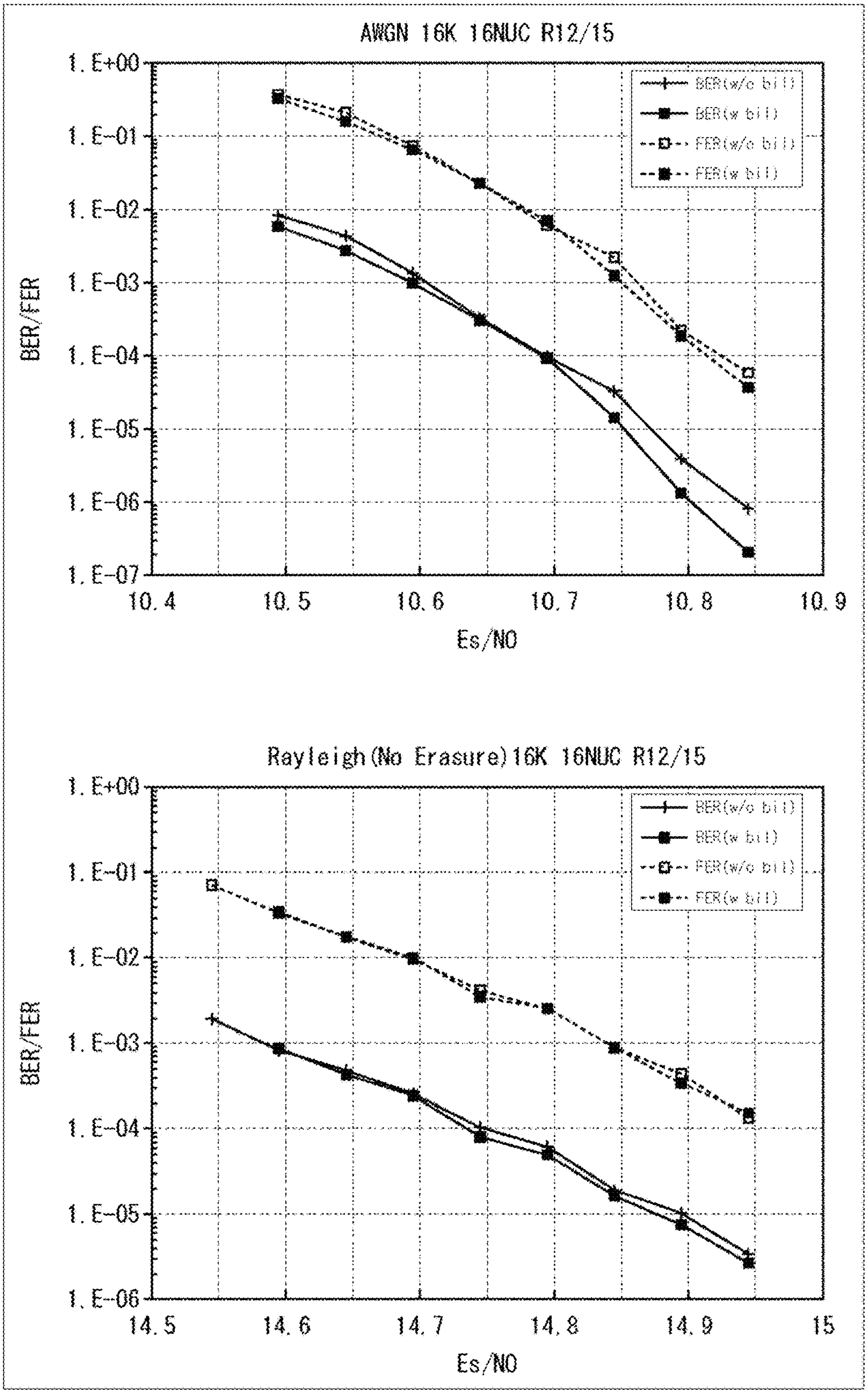

FIG. 198 is an illustration of a simulation result of a simulation of measuring an error rate.

Figure 199:
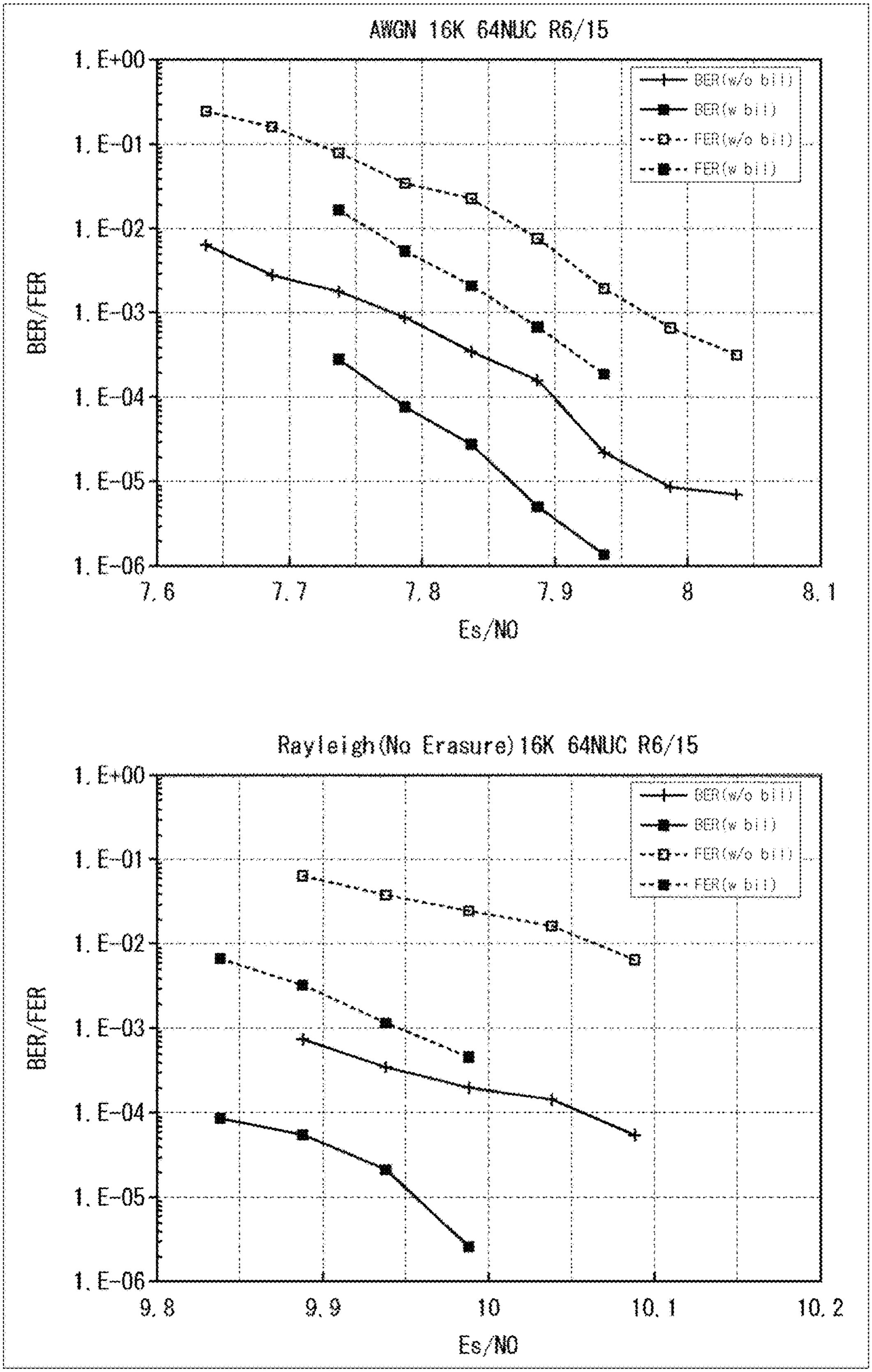

FIG. 199 is an illustration of a simulation result of a simulation of measuring an error rate.

Figure 200:
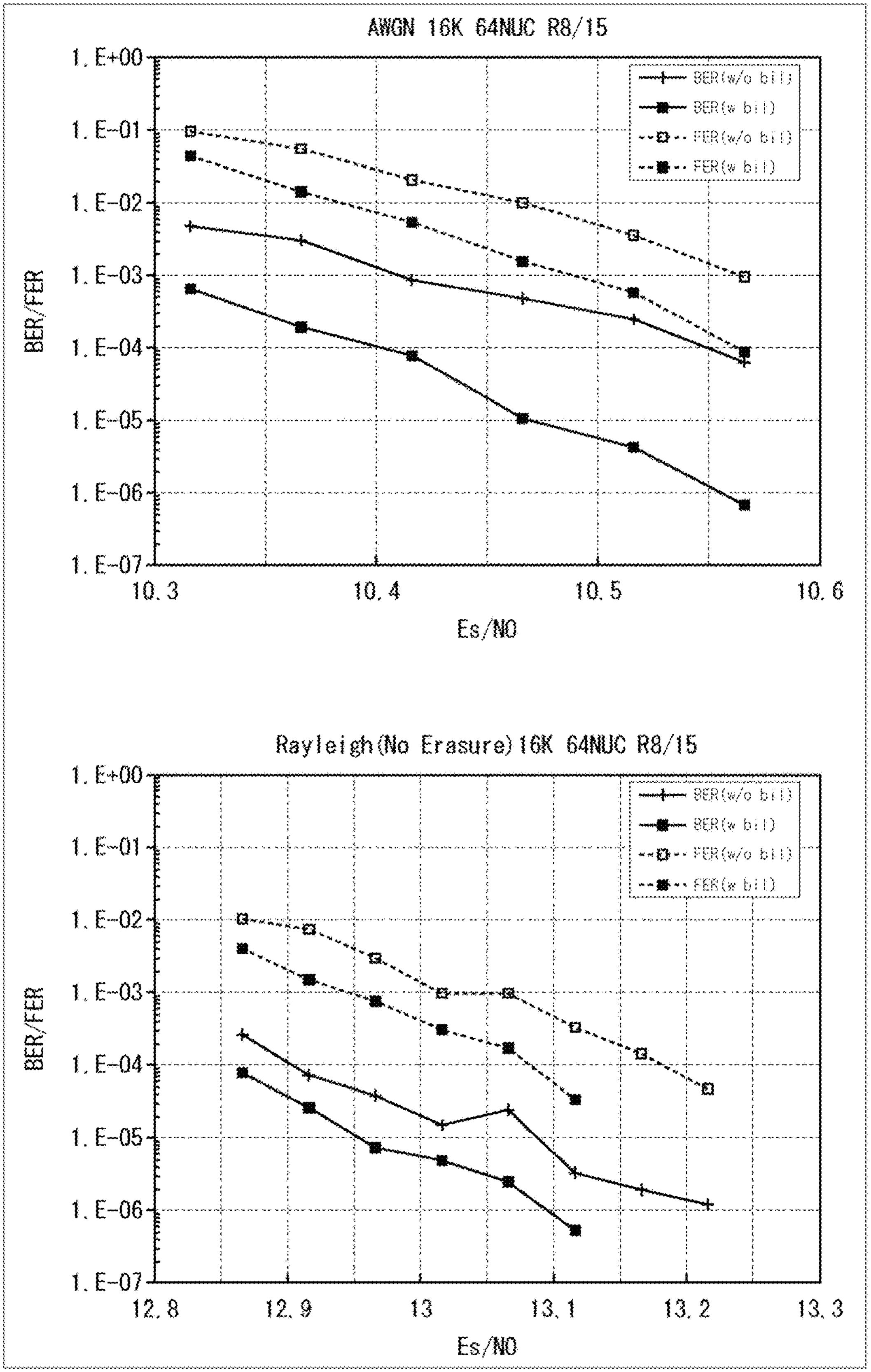

FIG. 200 is an illustration of a simulation result of a simulation of measuring an error rate.

FIG. 201 is an illustration of a simulation result of a simulation of measuring an error rate.

Figure 202:
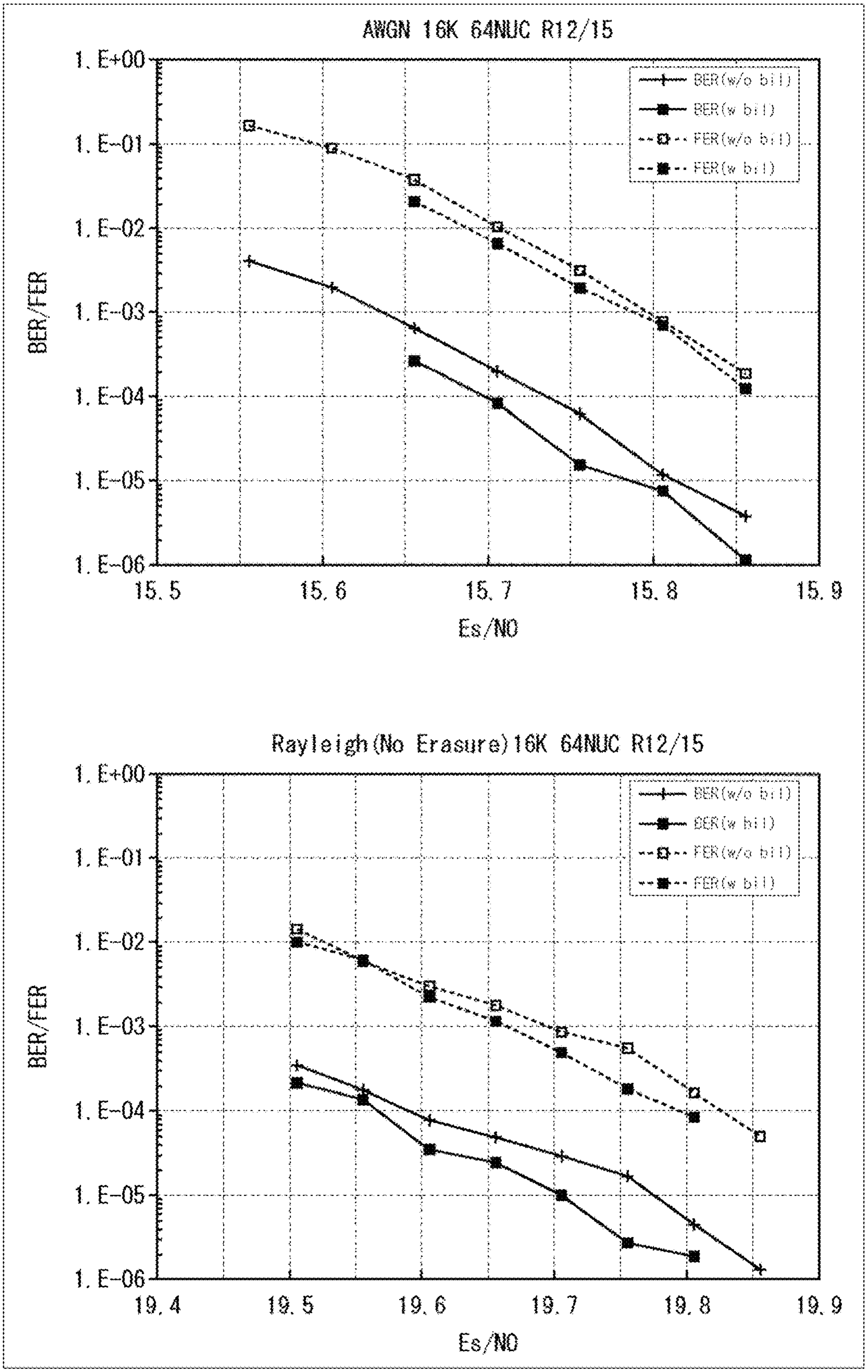

FIG. 202 is an illustration of a simulation result of a simulation of measuring an error rate.

Figure 203:
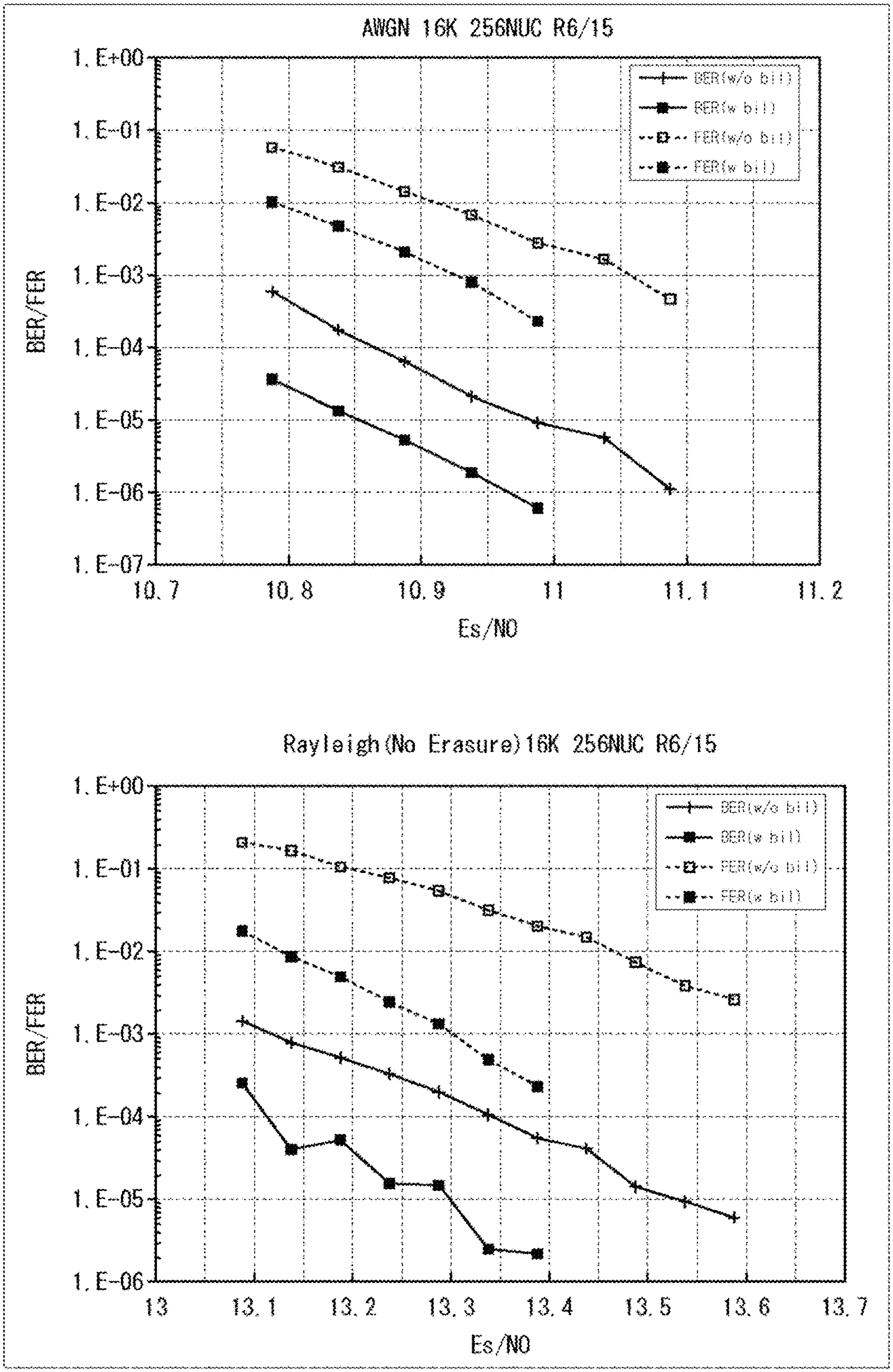

FIG. 203 is an illustration of a simulation result of a simulation of measuring an error rate.

FIG. 204 is an illustration of a simulation result of a simulation of measuring an error rate.

FIG. 205 is an illustration of a simulation result of a simulation of measuring an error rate.

Figure 206:
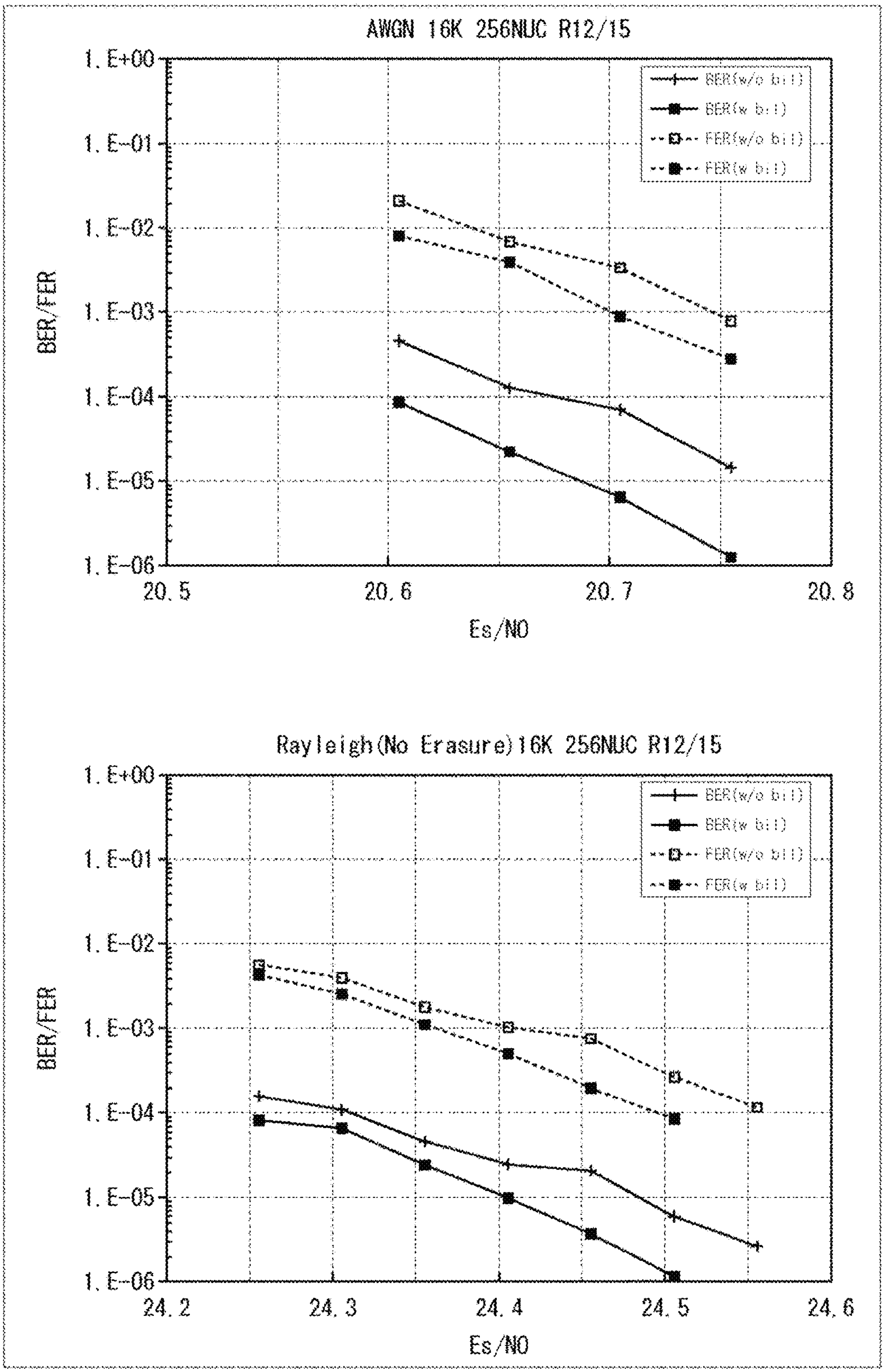

FIG. 206 is an illustration of a simulation result of a simulation of measuring an error rate.

Figure 207:
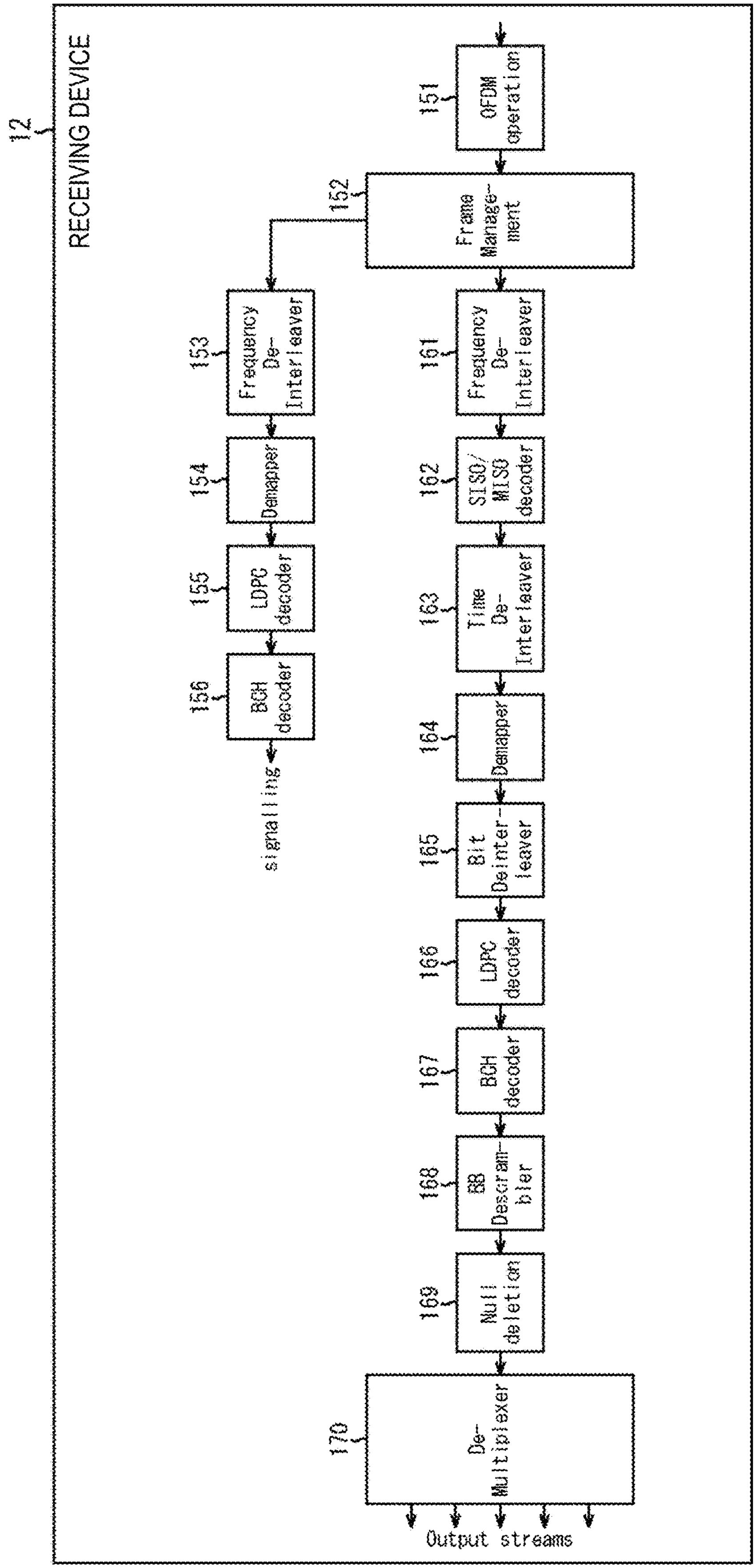

FIG. 207 is a block diagram illustrating a configuration example of a receiving device 12.

Figure 208:
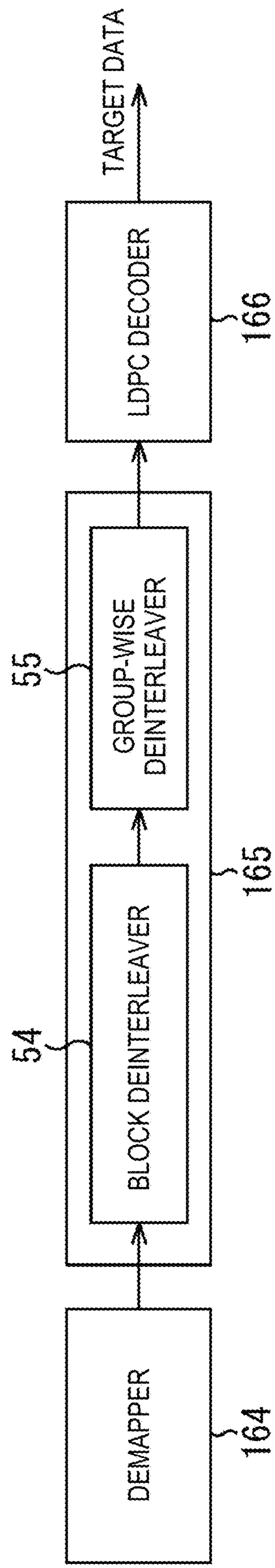

FIG. 208 is a block diagram illustrating a configuration example of a bit deinterleaver 165.

Figure 209:
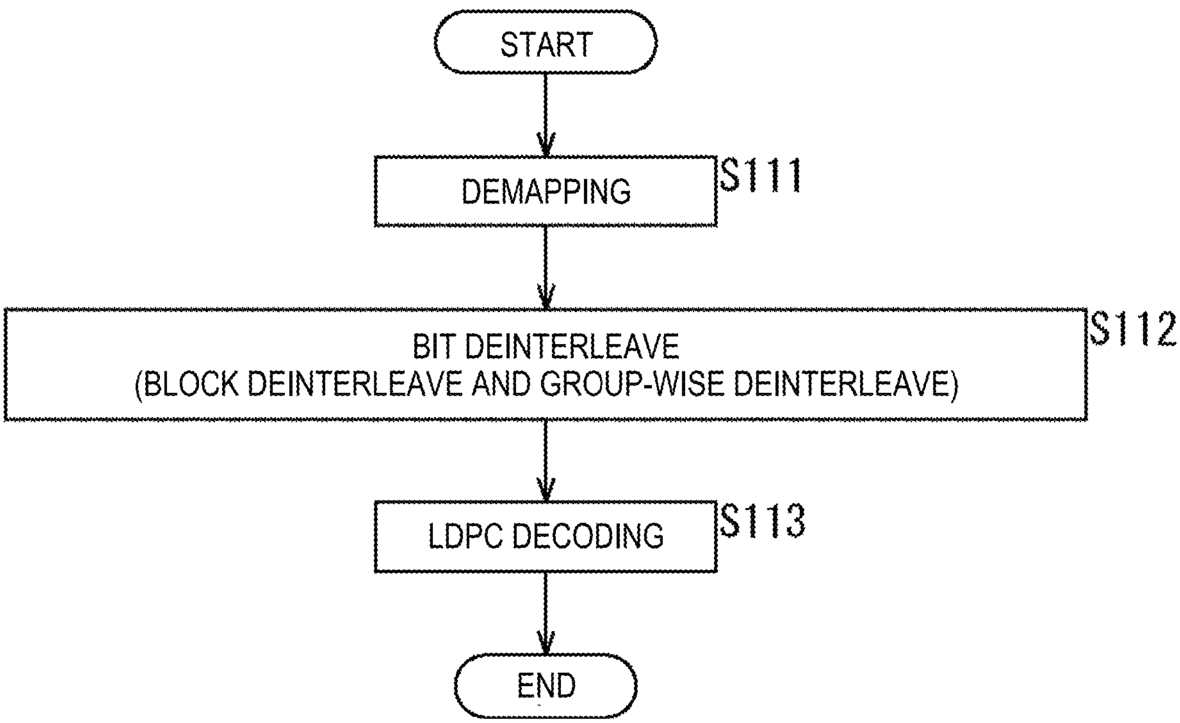

FIG. 209 is a flowchart illustrating an example of a process performed by a demapper 164, a bit deinterleaver 165, and an LDPC decoder 166.

Figure 210:
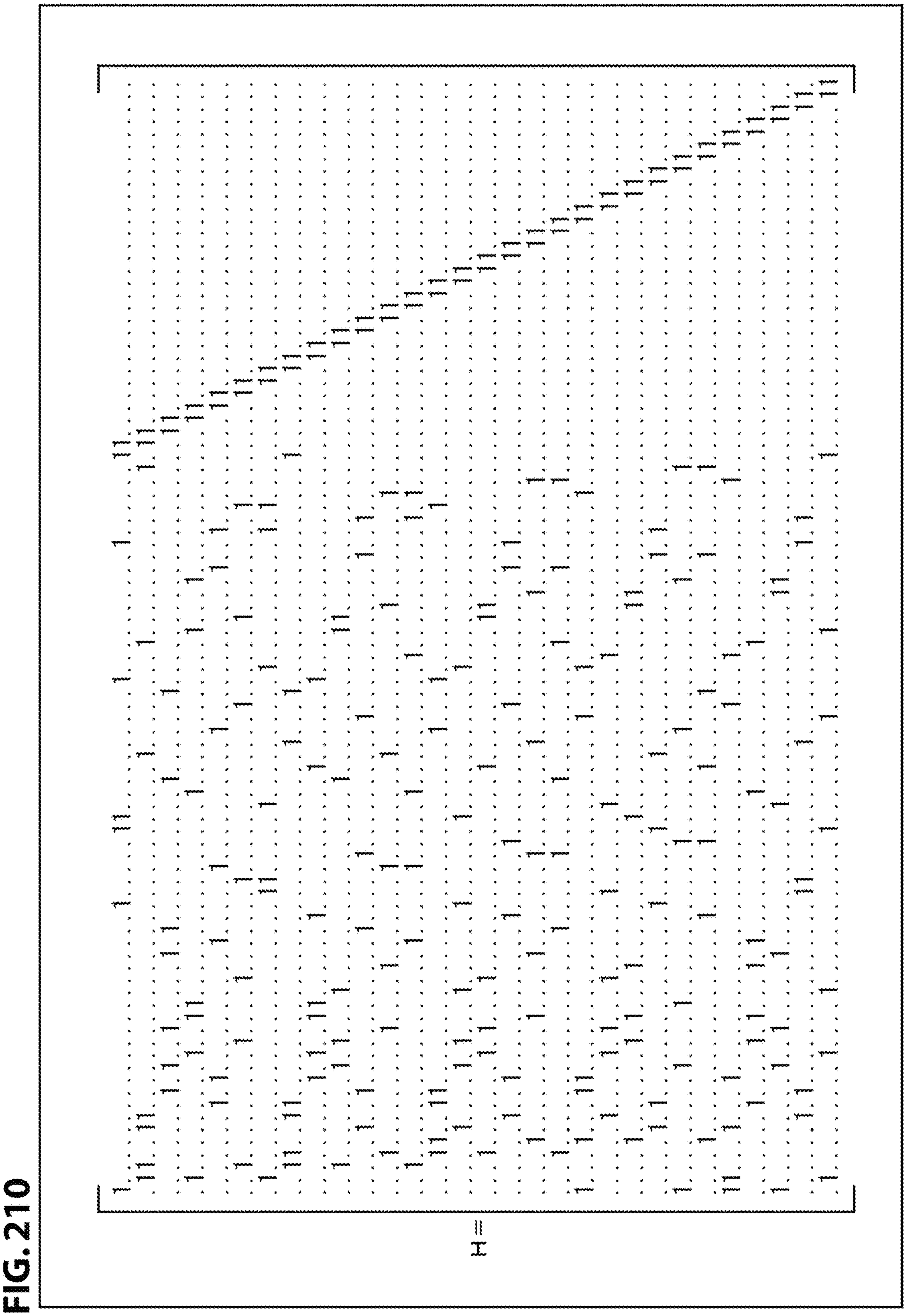

FIG. 210 is an illustration of an example of a parity check matrix of an LDPC code.

Figure 211:
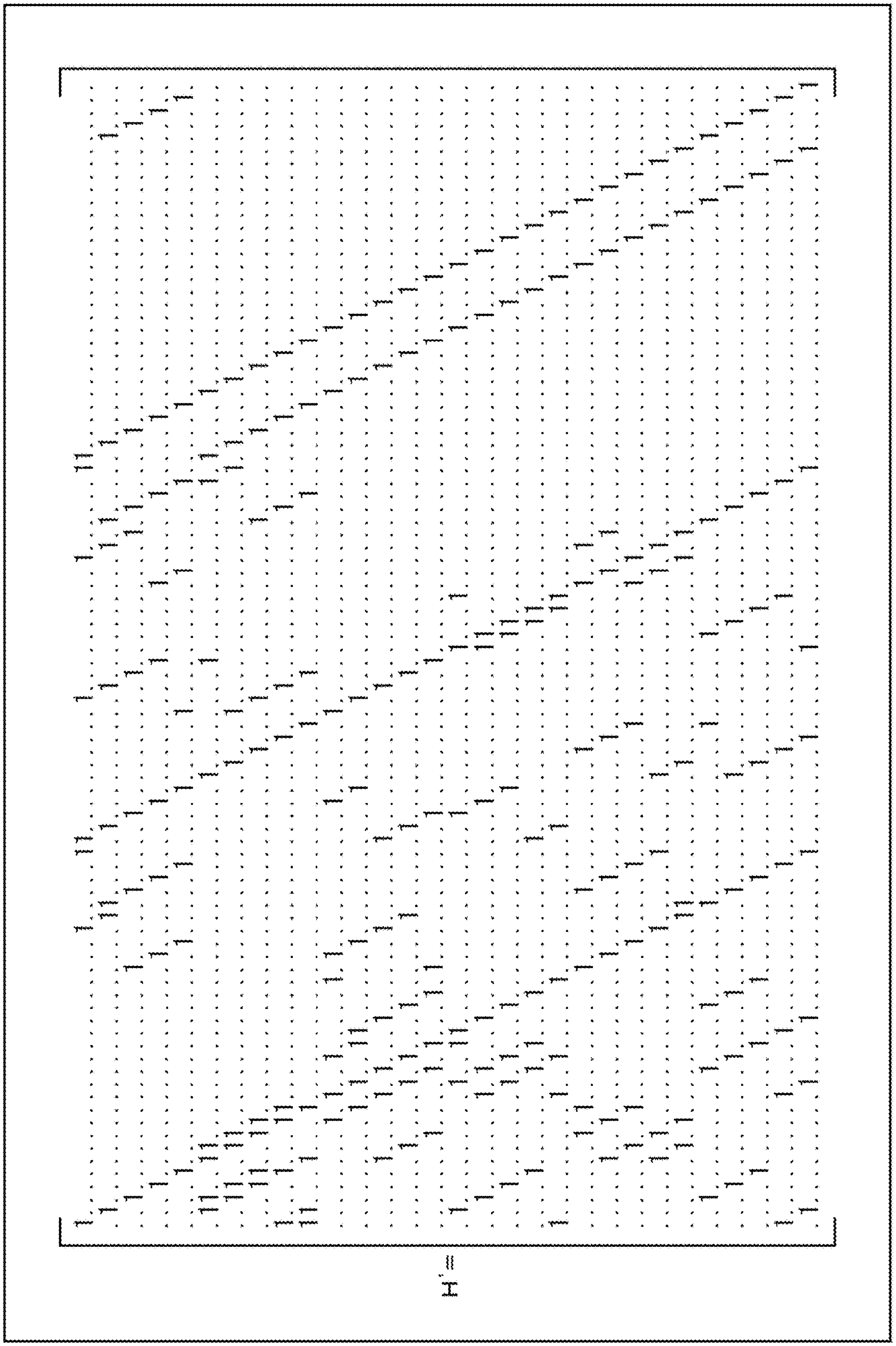

FIG. 211 is an illustration of an example of a matrix (a transformed parity check matrix) obtained by performing a row permutation and a column permutation on a parity check matrix.

Figure 212:
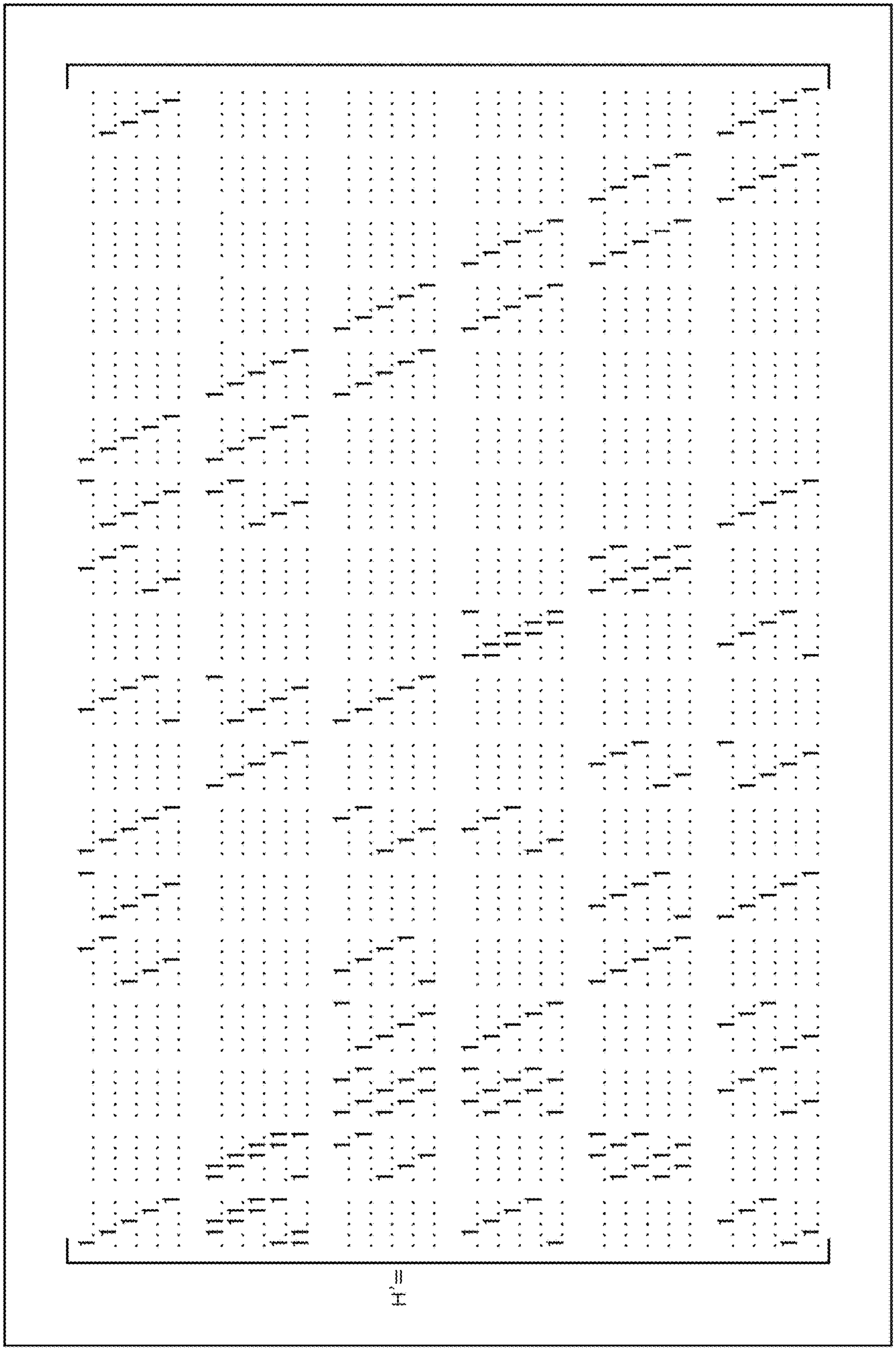

FIG. 212 is an illustration of an example of a transformed parity check matrix divided into 5×5 units.

Figure 213:
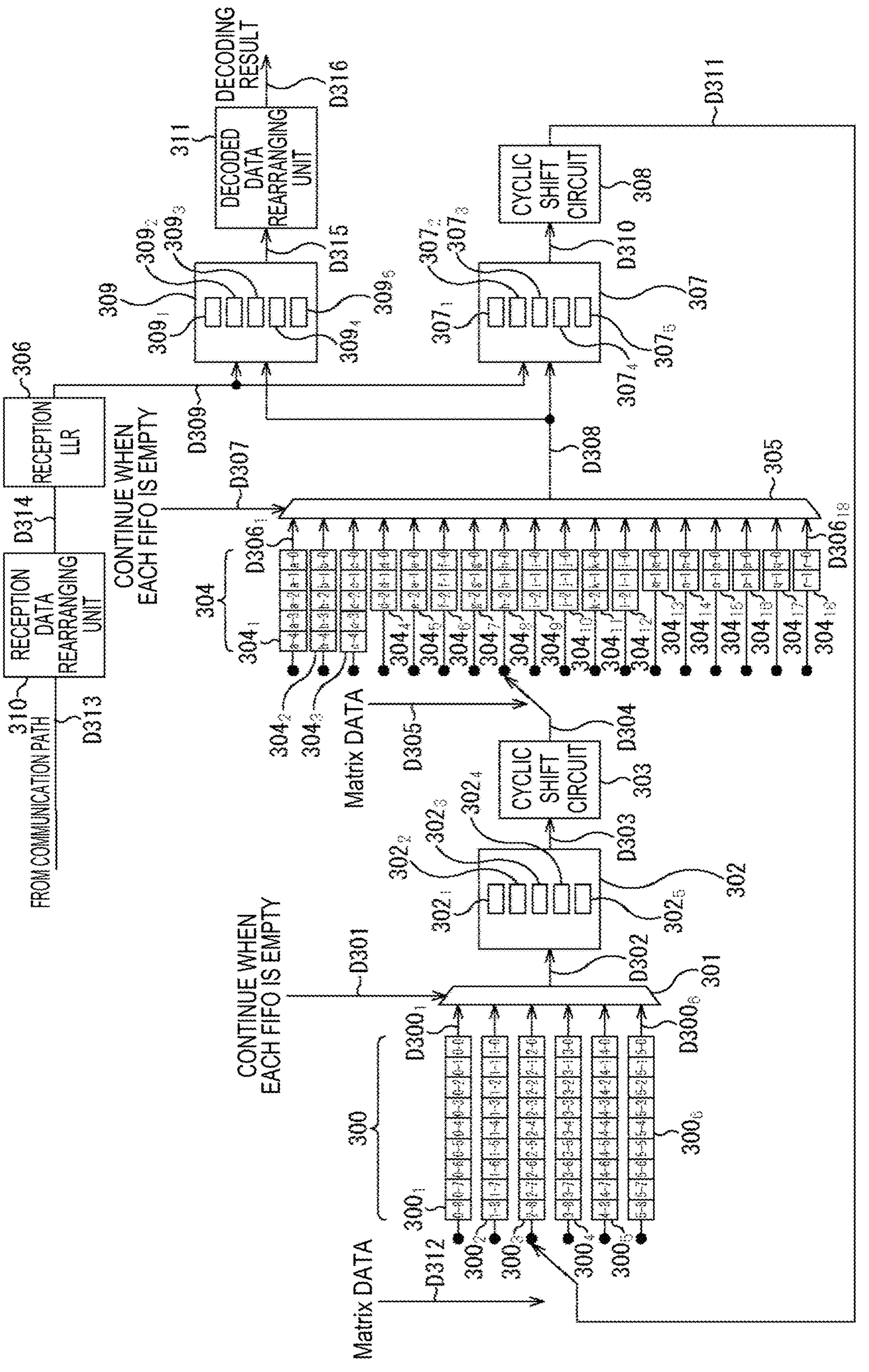

FIG. 213 is a block diagram illustrating a configuration example of a decoding device that collectively performs P node operations.

Figure 214:
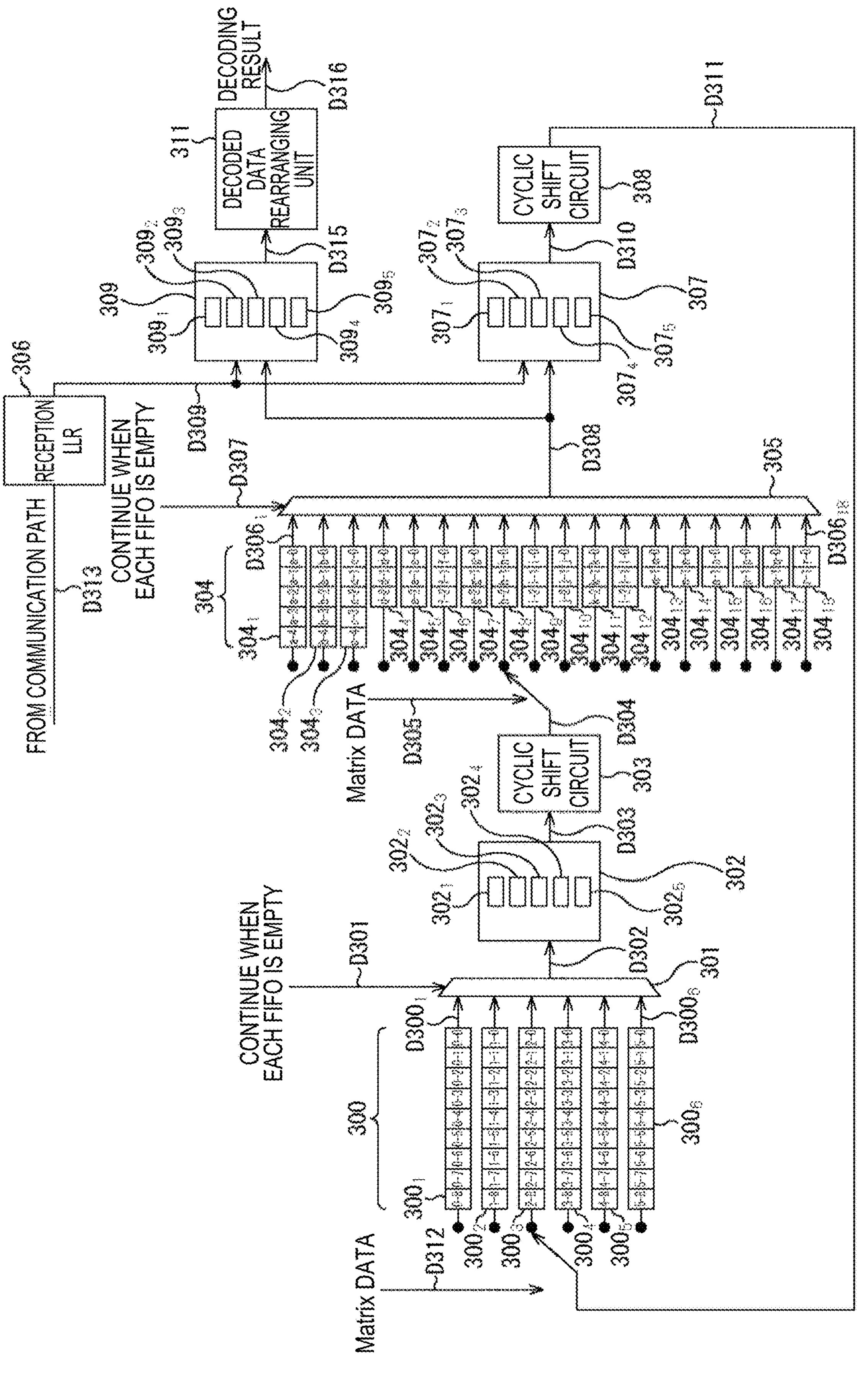

FIG. 214 is a block diagram illustrating a configuration example of an LDPC decoder 166.

Figure 215:
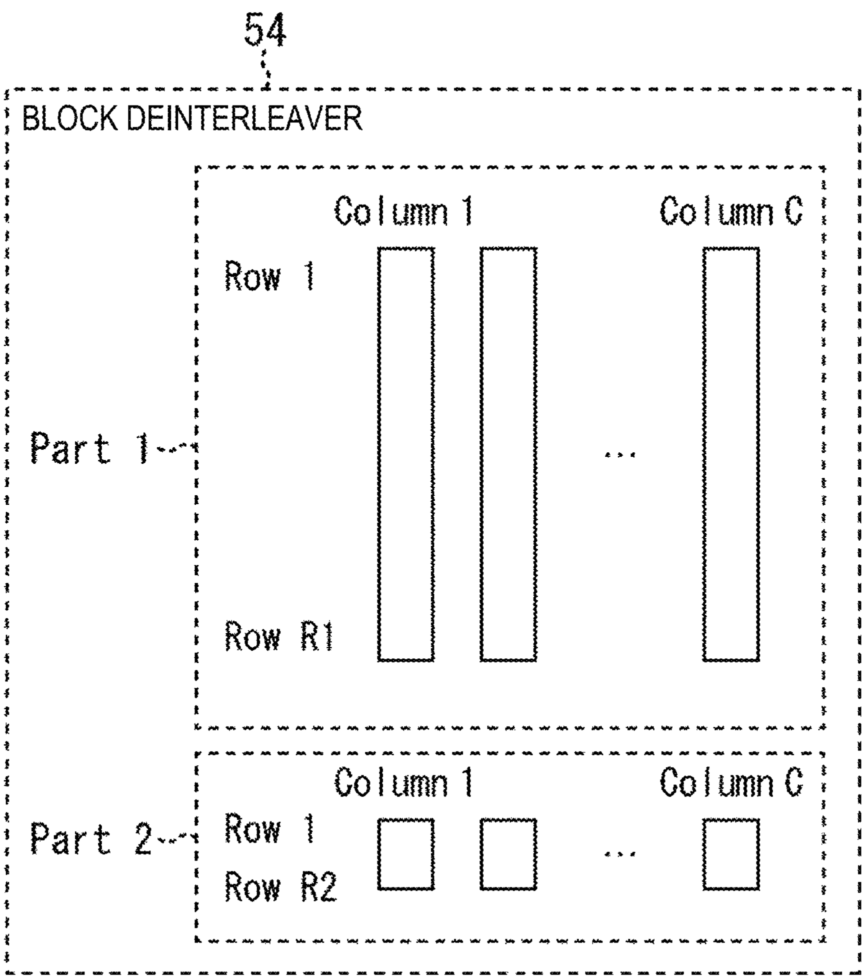

FIG. 215 is a block diagram illustrating a configuration example of a block deinterleaver 54.

Figure 216:
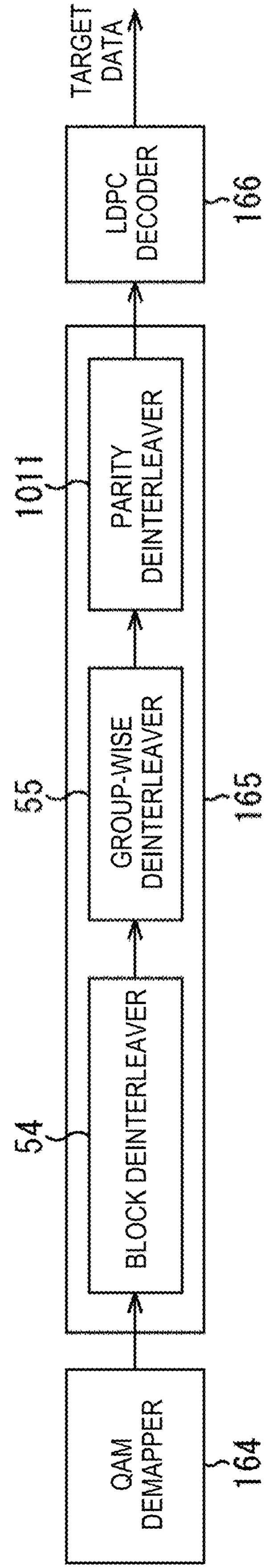

FIG. 216 is a block diagram illustrating another configuration example of a bit deinterleaver 165.

Figure 217:
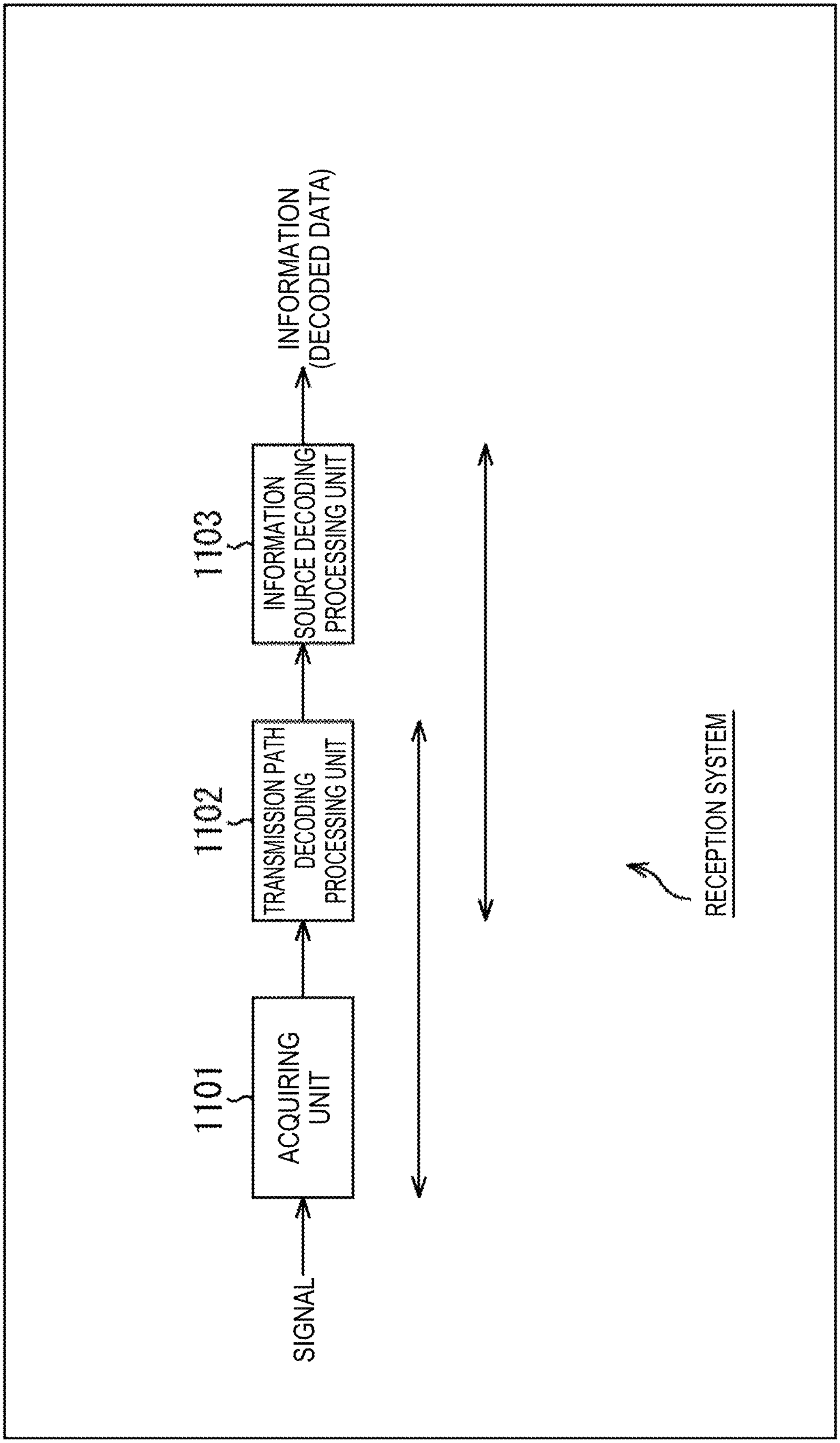

FIG. 217 is a block diagram illustrating a first configuration example of a reception system that can be applied to the receiving device 12.

Figure 218:
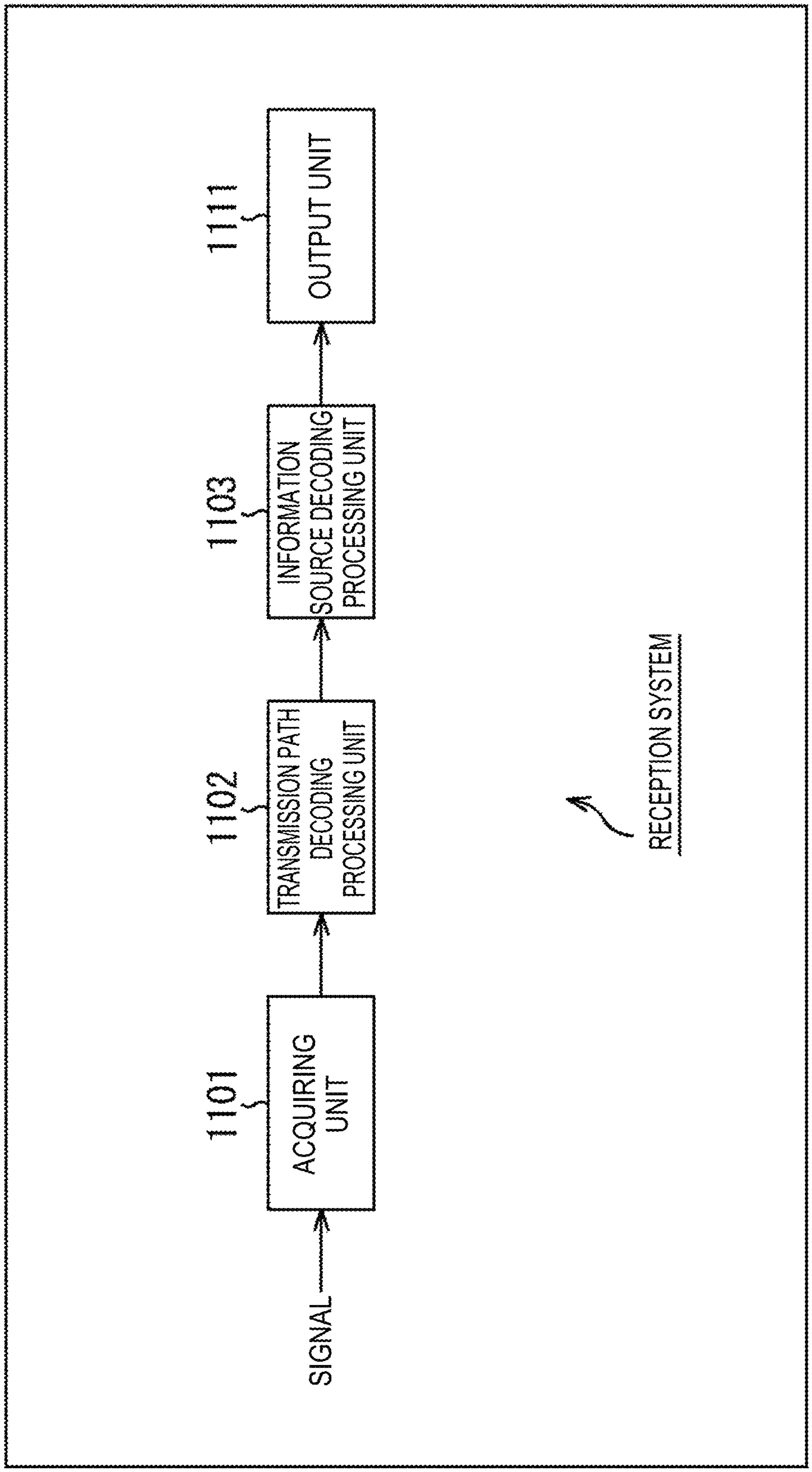

FIG. 218 is a block diagram illustrating a second configuration example of a reception system that can be applied to the receiving device 12.

Figure 219:
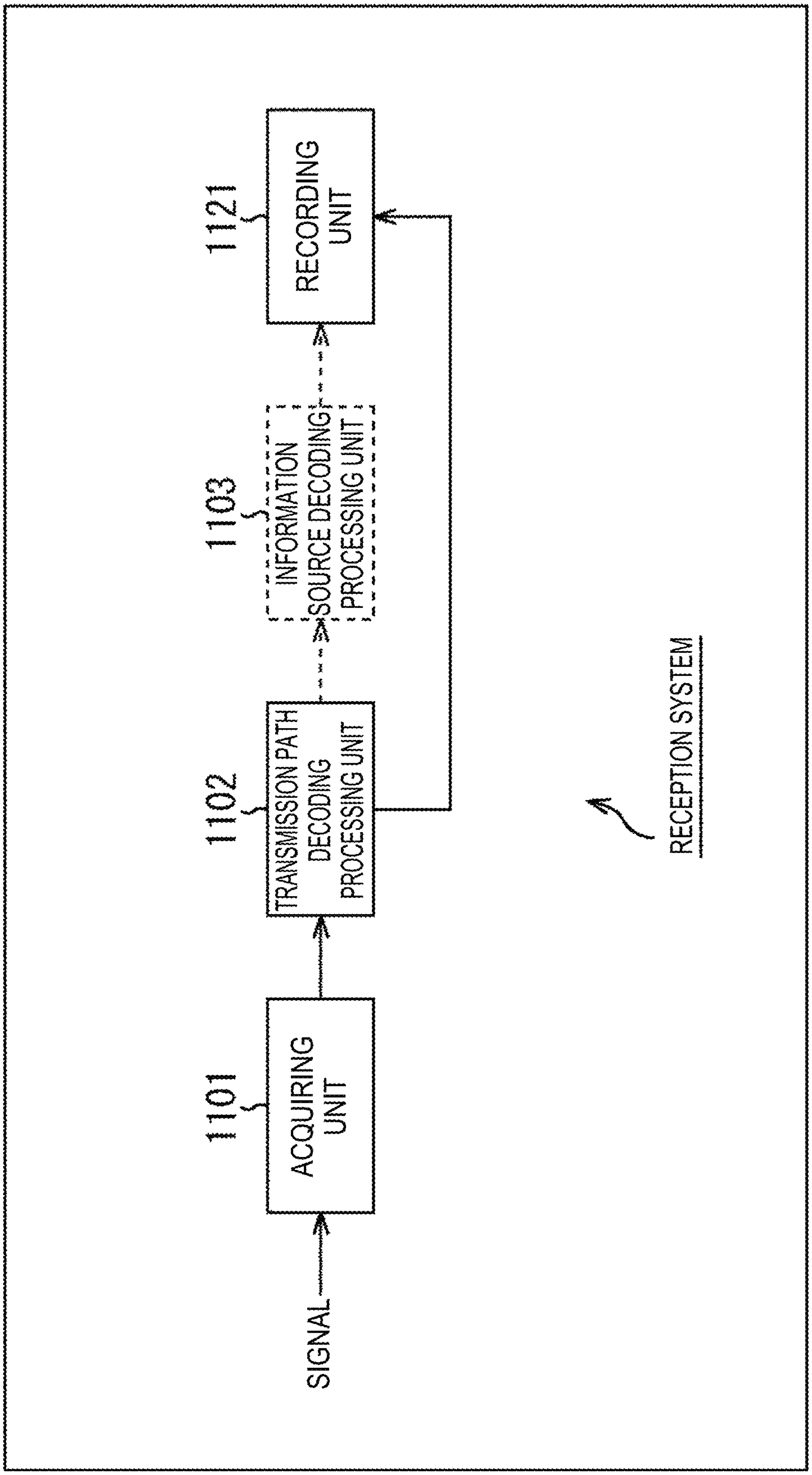

FIG. 219 is a block diagram illustrating a third configuration example of a reception system that can be applied to the receiving device 12.

Figure 220:
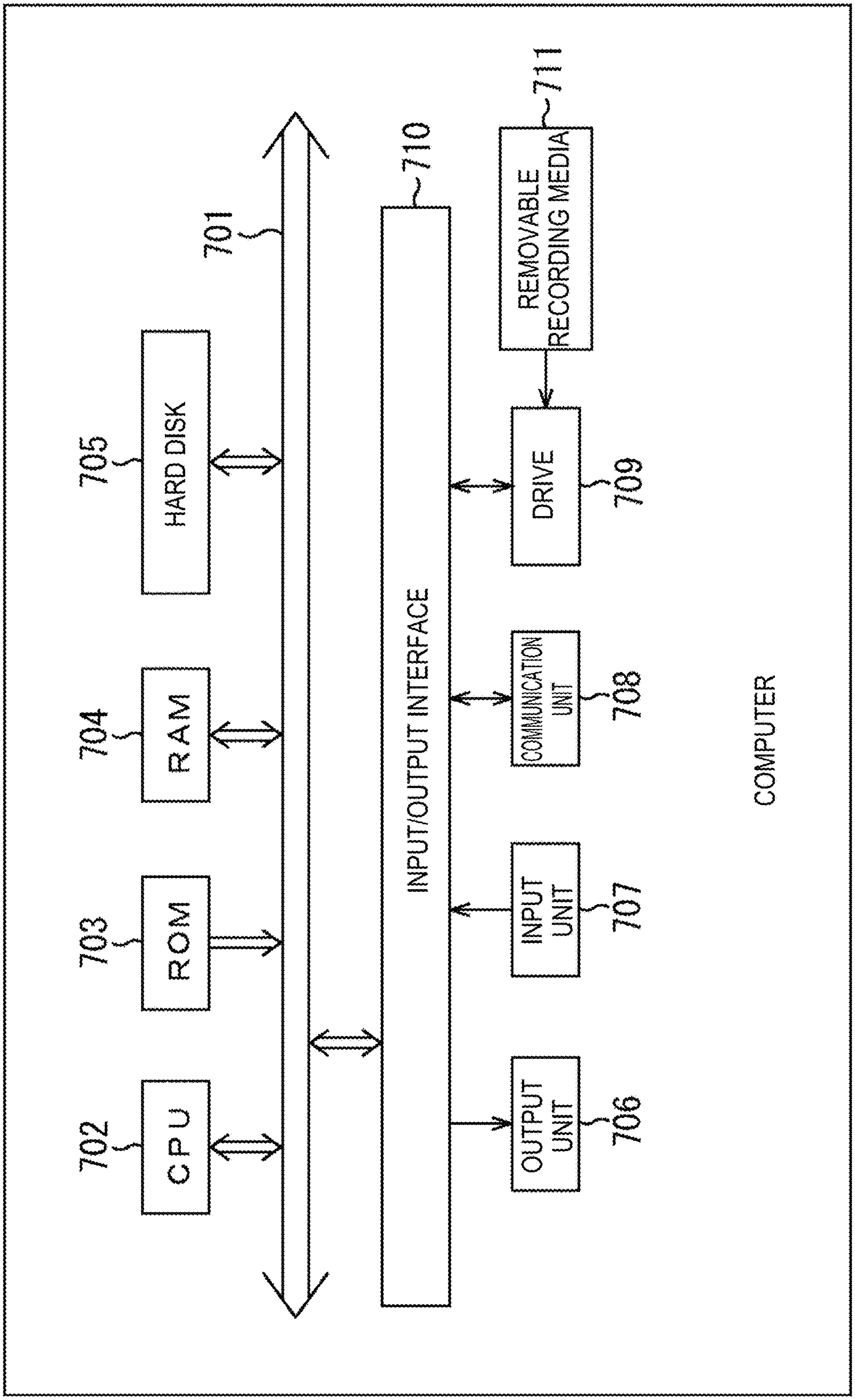

FIG. 220 is a block diagram illustrating a configuration example of an embodiment of a computer to which the present technology is applied.

DESCRIPTION OF EMBODIMENTS

Hereinafter, exemplary embodiments of the present technology will be described, but before the description of the exemplary embodiments of the present technology, an LDPC code will be described.

<LDPC Code>

The LDPC code is a linear code and it is not necessary for the LDPC code to be a binary code. However, in this case, it is assumed that the LDPC code is the binary code.

A maximum characteristic of the LDPC code is that a parity check matrix defining the LDPC code is sparse. In this case, the sparse matrix is a matrix in which the number of "1" of elements of the matrix is very small (a matrix in which most elements are 0).

Figure 1:
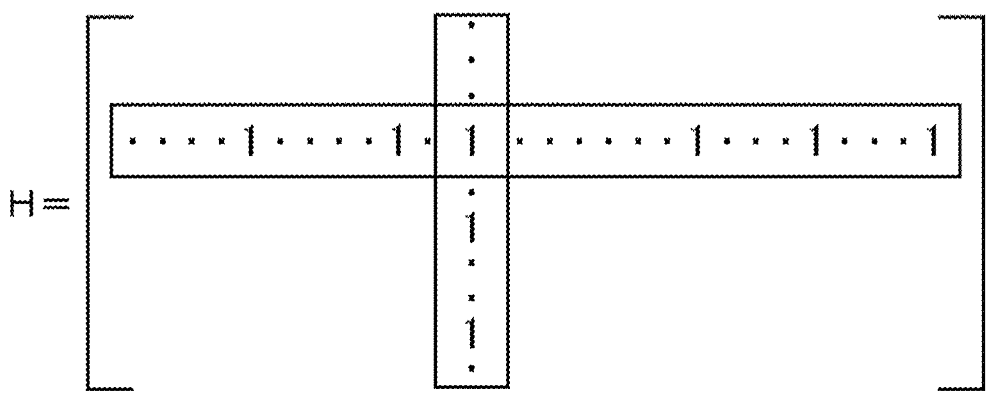
FIG. 1 is an illustration of a parity check matrix H of an LDPC code.

FIG. 1 is an illustration of an example of a parity check matrix H of the LDPC code.

In the parity check matrix H of FIG. 1, a weight of each column (the column weight) (the number of "1") becomes "3" and a weight of each row (the row weight) becomes "6".

In encoding using the LDPC code (LDPC encoding), for example, a generation matrix G is generated on the basis of the parity check matrix H and the generation matrix G is multiplied by binary information bits, so that a code word (LDPC code) is generated.

Specifically, an encoding device that performs the LDPC encoding first calculates the generation matrix G in which an expression $GH^T=0$ is realized, between a transposed matrix $H^T$ of the parity check matrix H and the generation matrix G. In this case, when the generation matrix G is a K×N matrix, the encoding device multiplies the generation matrix G with a bit string (vector u) of information bits including K bits and generates a code word c (=uG) including N bits. The code word (LDPC code) that is generated by the encoding device is received at a reception side through a predetermined communication path.

The LDPC code can be decoded by an algorithm called probabilistic decoding suggested by Gallager, that is, a message passing algorithm using belief propagation on a so-called Tanner graph, including a variable node (also referred to as a message node) and a check node. Hereinafter, the variable node and the check node are appropriately referred to as nodes simply.

Figure 2:
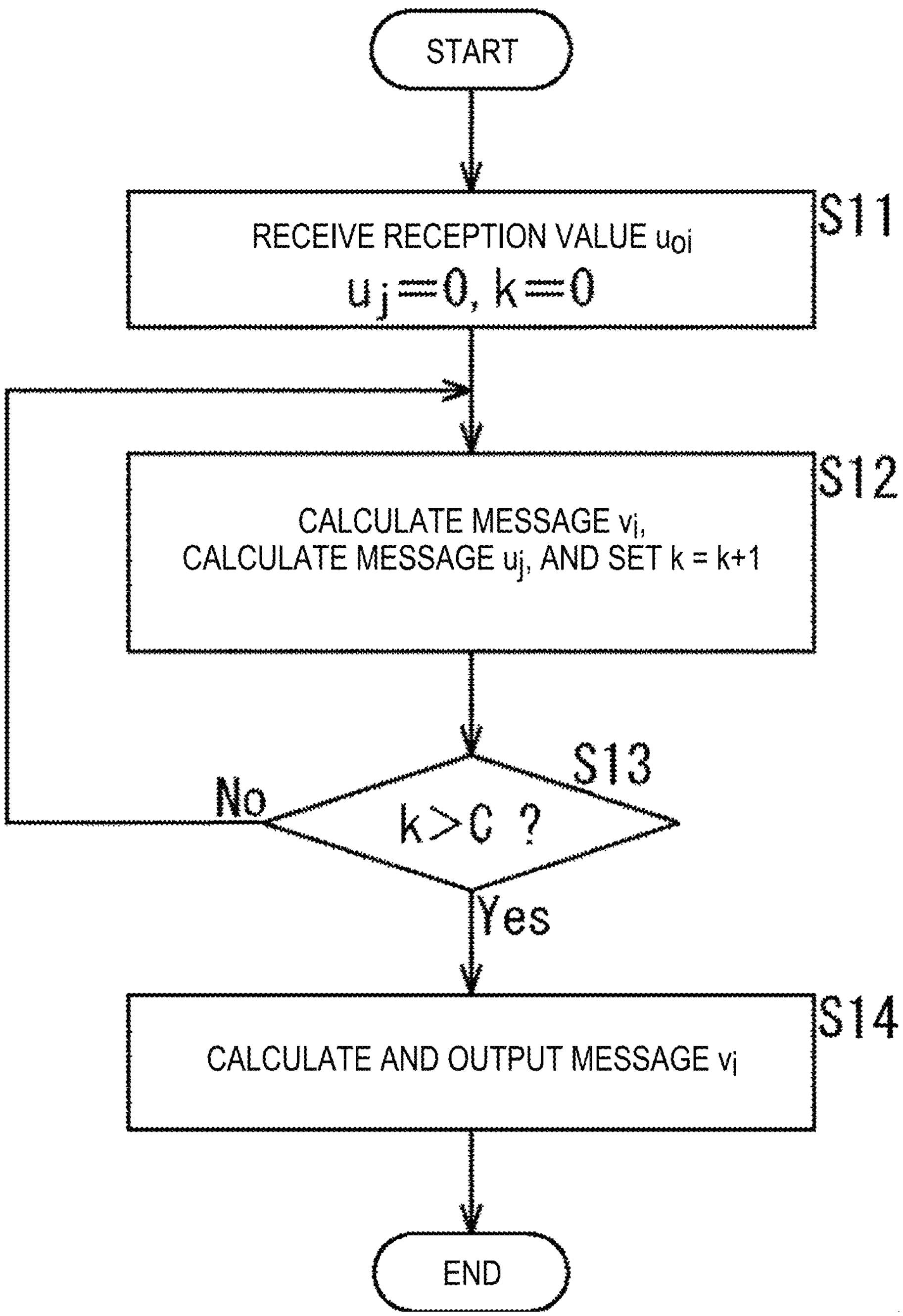
FIG. 2 is a flowchart illustrating a decoding sequence of an LDPC code.

FIG. 2 is a flowchart illustrating a decoding sequence of an LDPC code.

Hereinafter, a real value (a reception LLR) that is obtained by representing the likelihood of "0" of a value of an i-th code bit of the LDPC code (one code word) received by the reception side by a log likelihood ratio is appropriately referred to as a reception value $u_{0i}$. In addition, a message output from the check node is referred to as $u_j$ and a message output from the variable node is referred to as $v_i$.

First, in decoding of the LDPC code, as illustrated in FIG. 2, in step S11, the LDPC code is received, the message (check node message) $u_j$ is initialized to "0", and a variable k taking an integer as a counter of repetition processing is initialized to "0", and the processing proceeds to step S12. In step S12, the message (variable node message) $v_i$ is calculated by performing an operation (variable node operation) represented by an expression (1), on the basis of the reception value $u_{0i}$ obtained by receiving the LDPC code, and the message $u_j$ is calculated by performing an operation (check node operation) represented by an expression (2), on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in an expression (1) and expression (2) are respectively parameters which can be arbitrarily selected and illustrates the number of "1" in the longitudinal direction (column) and transverse direction (row) of the parity check matrix H. For example, in the case of an LDPC code ((3, 6) LDPC code) with respect to the parity check matrix H with a column weight of 3 and a row weight of 6 as illustrated in FIG. 1, $d_v$=3 and $d_c$=6 are established.

In the variable node operation of the expression (1) and the check node operation of the expression (2), because a message input from an edge (line coupling the variable node and the check node) for outputting the message is not an operation target, an operation range becomes 1 to $d_v-1$ or 1 to $d_c-1$. The check node operation of the expression (2) is performed actually by previously making a table of a function R ($v_1$, $v_2$) represented by an expression (3) defined by one output with respect to two inputs $v_1$ and $v_2$ and using the table consecutively (recursively), as represented by an expression (4).

[Math. 3]

$$x=2 \tan h^{-1}\{\tan h(v_1/2)\tan h(v_2/2)\}=R(v_1,v_2) \tag{3}$$

[Math. 4]

$$u_j=R(v_1,R(v_2,R(v_3, \ldots R(v_{d_c-2},v_{d_c-1})))) \tag{4}$$

In step S12, the variable k is incremented by "1" and the processing proceeds to step S13. In step S13, it is determined whether the variable k is more than the predetermined repetition decoding number of times C. When it is determined in step S13 that the variable k is not more than C, the processing returns to step S12 and the same processing is repeated hereinafter.

When it is determined in step S13 that the variable k is more than C, the processing proceeds to step S14, the message $v_i$ that corresponds to a decoding result to be finally output is calculated by performing an operation represented by an expression (5) and is output, and the decoding processing of the LDPC code ends.

[Math. 5]

$$v_i = u_{0i} + \sum_{j=1}^{d_v} u_j \tag{5}$$

In this case, the operation of the expression (5) is performed using messages $u_j$ from all edges connected to the variable node, different from the variable node operation of the expression (1).

FIG. 3 illustrates an example of the parity check matrix H of the (3, 6) LDPC code (an encoding rate of 1/2 and a code length of 12).

In the parity check matrix H of FIG. 3, a weight of a column is set to 3 and a weight of a row is set to 6, similar to FIG. 1.

Figure 4:
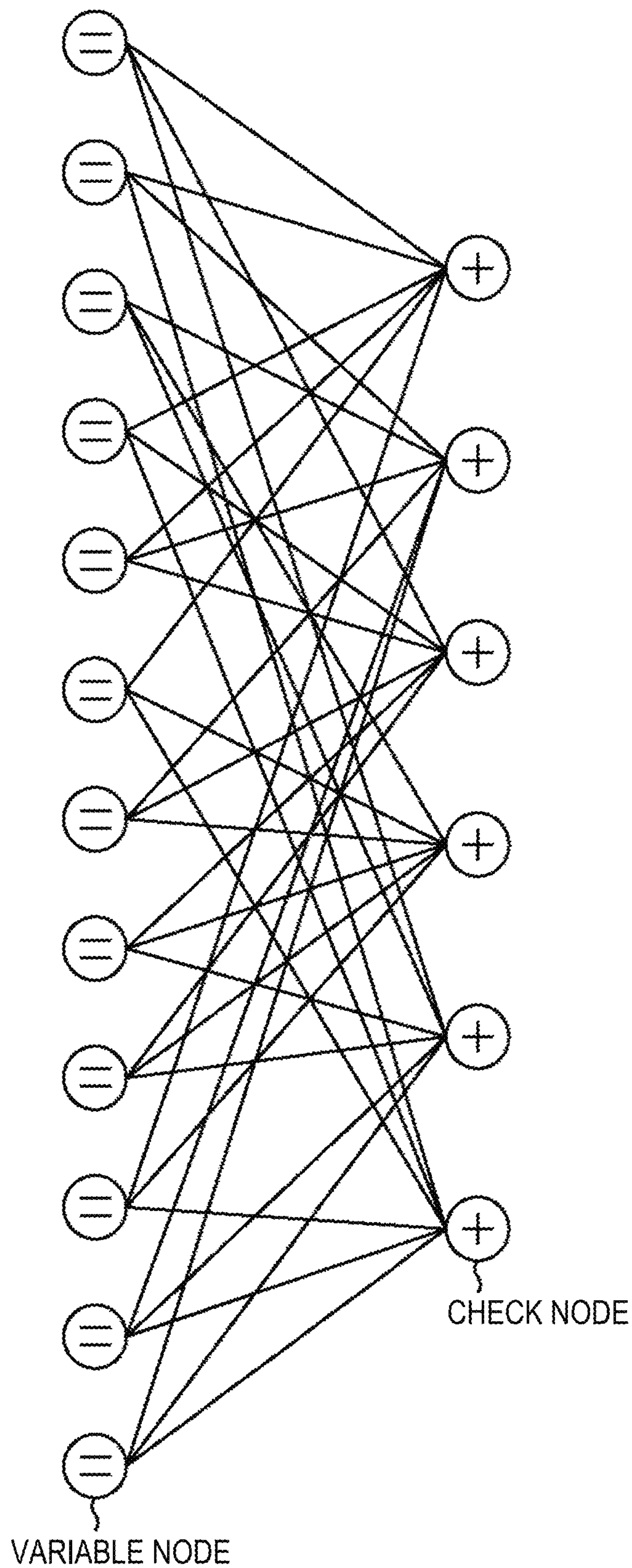
FIG. 4 is an illustration of an example of a Tanner graph of a parity check matrix.

FIG. 4 illustrates a Tanner graph of the parity check matrix H of FIG. 3.

In FIG. 4, the check node is represented by "+" (plus) and the variable node is represented by "=" (equal). The check node and the variable node correspond to the row and the column of the parity check matrix H. A line that couples the check node and the variable node is the edge and corresponds to "1" of elements of the parity check matrix.

That is, when an element of a j-th row and an i-th column of the parity check matrix is 1, in FIG. 4, an i-th variable node (node of "=") from the upper side and a j-th check node (node of "+") from the upper side are connected by the edge. The edge shows that a code bit corresponding to the variable node has a restriction condition corresponding to the check node.

In a sum product algorithm that is a decoding method of the LDPC code, the variable node operation and the check node operation are repetitively performed.

Figure 5:
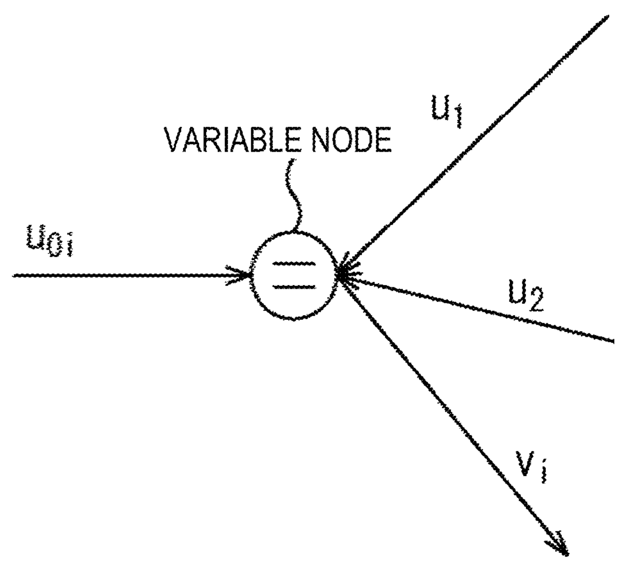
FIG. 5 is an illustration of an example of a variable node.

FIG. 5 illustrates the variable node operation that is performed by the variable node.

In the variable node, the message $v_i$ that corresponds to the edge for calculation is calculated by the variable node operation of the expression (1) using messages $u_1$ and $u_2$ from the remaining edges connected to the variable node and the reception value $u_{0i}$. The messages that correspond to the other edges are also calculated by the same method.

Figure 6:
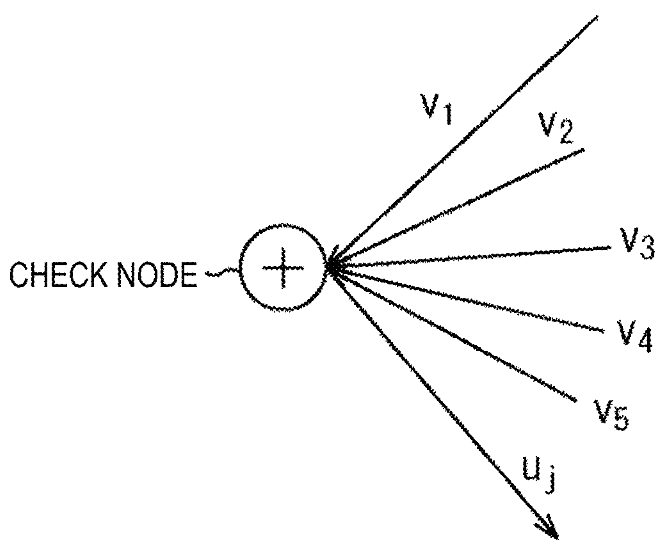
FIG. 6 is an illustration of an example of a check node.

FIG. 6 illustrates the check node operation that is performed by the check node.

In this case, the check node operation of the expression (2) can be rewritten by an expression (6) using a relation of an expression $a \times b = \exp\{\ln(|a|)+\ln(|b|)\} \times \text{sign}(a) \times \text{sign}(b)$. However, sign(x) is 1 in the case of $x \geq 0$ and is −1 in the case of $x<0$.

[Math. 6]

$$u_j = 2\tanh^{-1}\left(\prod_{i=1}^{d_c-1}\tanh\left(\frac{v_i}{2}\right)\right) \tag{6}$$

$$= 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\text{sign}\left(\tanh\left(\frac{v_i}{2}\right)\right)\right]$$

$$= 2\tanh^{-1}\left[\exp\left\{-\left(\sum_{i=1}^{d_c-1}-\ln\left(\tanh\left(\frac{|v_i|}{2}\right)\right)\right)\right\}\times\prod_{i=1}^{d_c-1}\text{sign}(v_i)\right]$$

In x≥0, if a function $\phi(x)$ is defined as an expression $\phi(x)=\ln(\tan h(x/2))$, an expression $\phi^{-1}(x)=2\tan h^{-1}(e^{-x})$ is realized. For this reason, the expression (6) can be changed to an expression (7).

[Math. 7]

$$u_j = \phi^{-1}\left(\sum_{i=1}^{d_c-1}\phi(|v_i|)\right)\times\prod_{i=1}^{d_c-1}\text{sign}(v_i) \tag{7}$$

In the check node, the check node operation of the expression (2) is performed according to the expression (7).

That is, in the check node, as illustrated in FIG. 6, the message $u_j$ that corresponds to the edge for calculation is calculated by the check node operation of the expression (7) using messages $v_1$, $v_2$, $v_3$, $v_4$, and $v_5$ from the remaining edges connected to the check node. The messages that correspond to the other edges are also calculated by the same method.

The function $\phi(x)$ of the expression (7) can be represented as $\phi(x)=\ln((e^x+1)/(e^x-1))$ and $\phi(x)=\phi^{-1}(x)$ is satisfied in x>0. When the functions $\phi(x)$ and $\phi^{-1}(x)$ are mounted to hardware, the functions $\phi(x)$ and $\phi^{-1}(x)$ may be mounted using an LUT (Look Up Table). However, both the functions $\phi(x)$ and $\phi^{-1}(x)$ become the same LUT.

<Configuration Example of Transmission System to which Present Disclosure is Applied>

Figure 7:
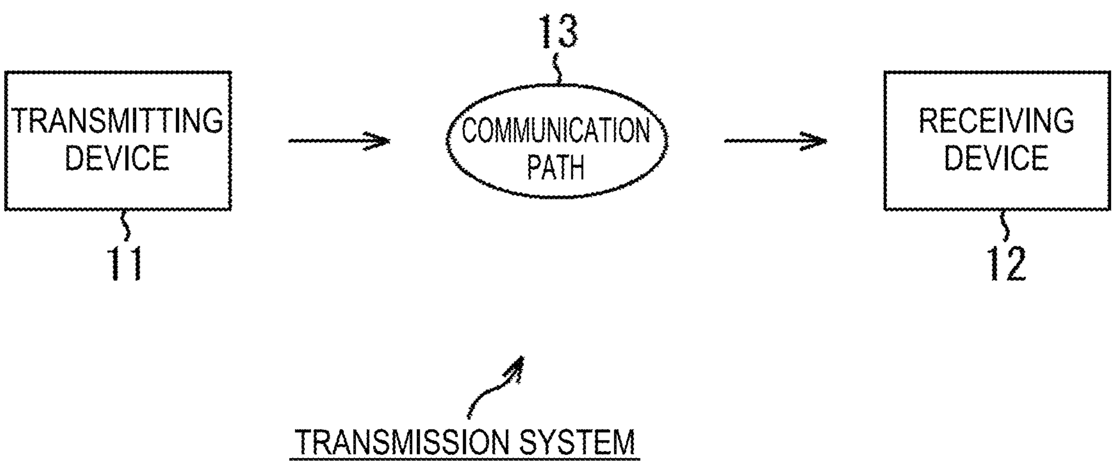
FIG. 7 is an illustration of a configuration example of an embodiment of a transmission system to which the present invention is applied.

FIG. 7 illustrates a configuration example of an embodiment of a transmission system (a system means a logical gathering of a plurality of devices and a device of each configuration may be arranged or may not be arranged in the same casing) to which the present invention is applied.

In FIG. 7, the transmission system includes a transmitting device 11 and a receiving device 12.

For example, the transmitting device 11 transmits (broadcasts) (transfers) a program of television broadcasting, and so on. That is, for example, the transmitting device 11 encodes target data that is a transmission target such as image data and audio data as a program into LDPC codes, and, for example, transmits them through a communication path 13 such as a satellite circuit, a ground wave and a cable (wire circuit).

The receiving device 12 receives the LDPC code transmitted from the transmitting device 11 through the communication path 13, decodes the LDPC code to obtain the target data, and outputs the target data.

In this case, it is known that the LDPC code used by the transmission system of FIG. 7 shows the very high capability in an AWGN (Additive White Gaussian Noise) communication path.

Meanwhile, in the communication path 13, burst error or erasure may be generated. Especially in the case where the communication path 13 is the ground wave, for example, in an OFDM (Orthogonal Frequency Division Multiplexing) system, power of a specific symbol may become 0 (erasure) according to delay of an echo (paths other than a main path), under a multi-path environment in which D/U (Desired to Undesired Ratio) is 0 dB (power of Undesired=echo is equal to power of Desired=main path).

In the flutter (communication path in which delay is 0 and an echo having a Doppler frequency is added), when D/U is 0 dB, entire power of an OFDM symbol at a specific time may become 0 (erasure) by the Doppler frequency.

In addition, the burst error may be generated due to a situation of a wiring line from a receiving unit (not illustrated in the drawings) of the side of the receiving device 12 such as an antenna receiving a signal from the transmitting device 11 to the receiving device 12 or instability of a power supply of the receiving device 12.

Meanwhile, in decoding of the LDPC code, in the variable node corresponding to the column of the parity check matrix H and the code bit of the LDPC code, as illustrated in FIG. 5, the variable node operation of the expression (1) with the addition of (the reception value u0i of) the code bit of the LDPC code is performed. For this reason, if error is generated in the code bits used for the variable node operation, precision of the calculated message is deteriorated.

In the decoding of the LDPC code, in the check node, the check node operation of the expression (7) is performed using the message calculated by the variable node connected to the check node. For this reason, if the number of check nodes in which error (including erasure) is generated simultaneously in (the code bits of the LDPC codes corresponding to) the plurality of connected variable nodes increases, decoding performance is deteriorated.

That is, if the two or more variable nodes of the variable nodes connected to the check node become simultaneously erasure, the check node returns a message in which the probability of a value being 0 and the probability of a value being 1 are equal to each other, to all the variable nodes. In this case, the check node that returns the message of the equal probabilities does not contribute to one decoding processing (one set of the variable node operation and the check node operation). As a result, it is necessary to increase the repetition number of times of the decoding processing, the decoding performance is deteriorated, and consumption power of the receiving device 12 that performs decoding of the LDPC code increases.

Therefore, in the transmission system of FIG. 7, tolerance against the burst error or the erasure can be improved while performance in the AWGN communication path (AWGN channel) is maintained.

<Configuration Example of Transmitting Device 11>

Figure 8:
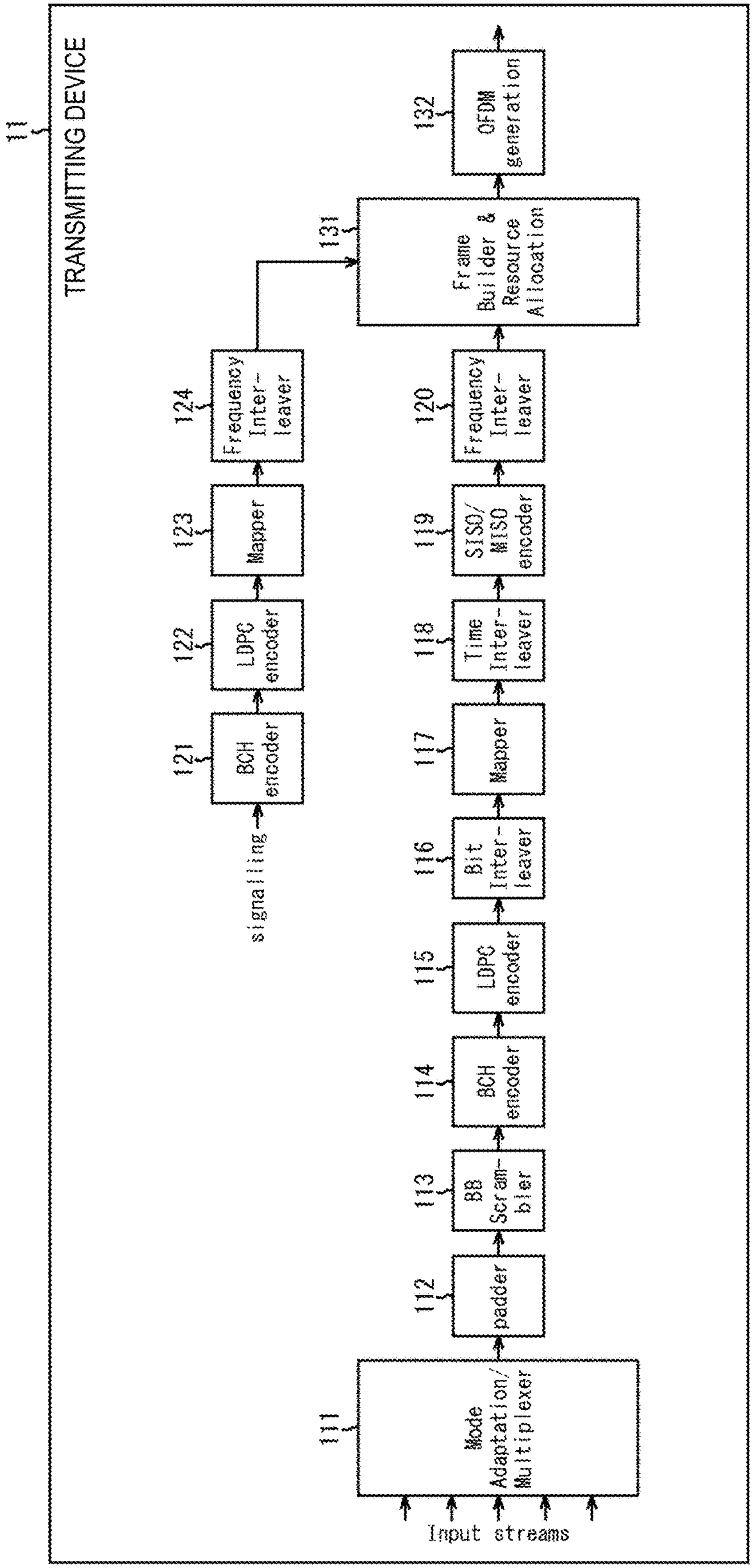
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams corresponding to target data are supplied to a mode adaptation/multiplexer 111.

The mode adaptation/multiplexer 111 performs mode selection and processes such as multiplexing of one or more input streams supplied thereto, as needed, and supplies data obtained as a result to a padder 112.

The padder 112 performs necessary zero padding (insertion of Null) with respect to the data supplied from the mode adaptation/multiplexer 111 and supplies data obtained as a result to a BB scrambler 113.

The BB scrambler 113 performs base-band scrambling (BB scrambling) with respect to the data supplied from the padder 112 and supplies data obtained as a result to a BCH encoder 114.

The BCH encoder 114 performs BCH encoding with respect to the data supplied from the BB scrambler 113 and supplies data obtained as a result as LDPC target data to be an LDPC encoding target to an LDPC encoder 115.

The LDPC encoder 115 performs LDPC encoding according to a parity check matrix or the like in which a parity matrix to be a portion corresponding to a parity bit of an LDPC code becomes a staircase (dual diagonal) structure with respect to the LDPC target data supplied from the BCH encoder 114, for example, and outputs an LDPC code in which the LDPC target data is information bits.

That is, the LDPC encoder 115 performs the LDPC encoding to encode the LDPC target data with an LDPC such as the LDPC code (corresponding to the parity check matrix) defined in the predetermined standard of the DVB-S.2, the DVB-T.2, the DVB-C.2 or the like, and the LDPC code (corresponding to the parity check matrix) or the like that is to be employed in ATSC 3.0, and outputs the LDPC code obtained as a result.

The LDPC code defined in the standard of the DVB-T.2 and the LDPC code that is to be employed in ATSC 3.0 are an IRA (Irregular Repeat Accumulate) code and a parity matrix of the parity check matrix of the LDPC code becomes a staircase structure. The parity matrix and the staircase structure will be described later. The IRA code is described in "Irregular Repeat-Accumulate Codes", H. Jin, A. Khandekar, and R. J. McEliece, in Proceedings of 2nd International Symposium on Turbo codes and Related Topics, pp. 1-8, September 2000, for example.

The LDPC code that is output by the LDPC encoder 115 is supplied to the bit interleaver 116.

The bit interleaver 116 performs bit interleave to be described later with respect to the LDPC code supplied from the LDPC encoder 115 and supplies the LDPC code after the bit interleave to an mapper 117.

The mapper 117 maps the LDPC code supplied from the bit interleaver 116 to a signal point representing one symbol of orthogonal modulation in a unit (symbol unit) of code bits of one or more bits of the LDPC code and performs the orthogonal modulation (multilevel modulation).

That is, the mapper 117 performs maps the LDPC code supplied from the bit interleaver 116 to a signal point determined by a modulation scheme performing the orthogonal modulation of the LDPC code, on an IQ plane (IQ constellation) defined by an I axis representing an I component of the same phase as a carrier and a Q axis representing a Q component orthogonal to the carrier, and performs the orthogonal modulation.

When the number of signal points decided in the modulation scheme of the orthogonal modulation performed by the mapper 117 is $2^m$, m-bit code bits of the LDPC code are used as a symbol (one symbol), and the mapper 117 maps the LDPC code supplied from the bit interleaver 116 to a signal point indicating a symbol among the $2^m$ signal points in units of symbols.

Here, examples of the modulation scheme of the orthogonal modulation performed by the mapper 117 include a modulation scheme specified in a standard such as DVB-T.2, a modulation scheme that is scheduled to be employed in ATSC 3.0, and other modulation schemes, that is, includes Binary Phase Shift Keying (BPSK), Quadrature Phase Shift Keying (QPSK), 8 Phase-Shift Keying (8PSK), 16 Amplitude Phase-Shift Keying (APSK), 32APSK, 16 Quadrature Amplitude Modulation (QAM), 16QAM, 64QAM, 256QAM, 1024QAM, 4096QAM, and 4 Pulse Amplitude Modulation (PAM). A modulation scheme by which the orthogonal modulation is performed in the mapper 117 is set in advance, for example, according to an operation of an operator of the transmitting device 11.

The data (a mapping result of mapping the symbol to the signal point) obtained by the process of the mapper 117 is supplied to a time interleaver 118.

The time interleaver 118 performs time interleave (interleave in a time direction) in a unit of symbol with respect to the data supplied from the mapper 117 and supplies data obtained as a result to an single input single output/multiple input single output encoder (SISO/MISO encoder) 119.

The SISO/MISO encoder 119 performs spatiotemporal encoding with respect to the data supplied from the time interleaver 118 and supplies the data to the frequency interleaver 120.

The frequency interleaver 120 performs frequency interleave (interleave in a frequency direction) in a unit of symbol with respect to the data supplied from the SISO/MISO encoder 119 and supplies the data to a frame builder/resource allocation unit 131.

On the other hand, for example, control data (signalling) for transfer control such as BB signaling (Base Band Signalling) (BB Header) is supplied to the BCH encoder 121.

The BCH encoder 121 performs the BCH encoding with respect to the signaling supplied thereto and supplies data obtained as a result to an LDPC encoder 122, similar to the BCH encoder 114.

The LDPC encoder 122 sets the data supplied from the BCH encoder 121 as LDPC target data, performs the LDPC encoding with respect to the data, and supplies an LDPC code obtained as a result to a mapper 123, similar to the LDPC encoder 115.

The mapper 123 maps the LDPC code supplied from the LDPC encoder 122 to a signal point representing one symbol of orthogonal modulation in a unit (symbol unit) of code bits of one or more bits of the LDPC code, performs the orthogonal modulation, and supplies data obtained as a result to the frequency interleaver 124, similar to the mapper 117.

The frequency interleaver 124 performs the frequency interleave in a unit of symbol with respect to the data supplied from the mapper 123 and supplies the data to the frame builder/resource allocation unit 131, similar to the frequency interleaver 120.

The frame builder/resource allocation unit 131 inserts symbols of pilots into necessary positions of the data (symbols) supplied from the frequency interleavers 120 and 124, configures a frame (for example, a physical layer (PL) frame, a T2 frame, a C2 frame, and so on) including symbols of a predetermined number from data (symbols) obtained as a result, and supplies the frame to an OFDM generating unit 132.

The OFDM generating unit 132 generates an OFDM signal corresponding to the frame from the frame supplied from the frame builder/resource allocation unit 131 and transmits the OFDM signal through the communication path 13 (FIG. 7).

Here, for example, the transmitting device 11 can be configured without including part of the blocks illustrated in FIG. 8 such as the time interleaver 118, the SISO/MISO encoder 119, the frequency interleaver 120 and the frequency interleaver 124.

<Configuration Example of Bit Interleaver 116>

Figure 9:
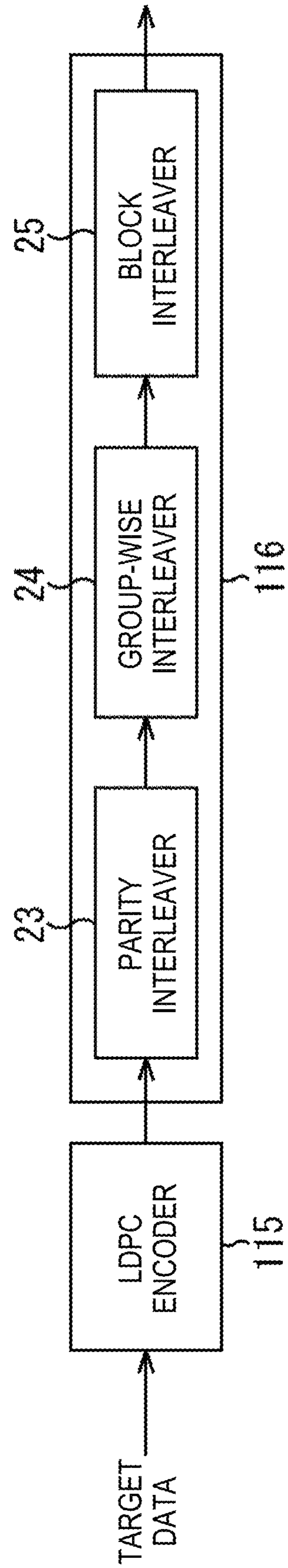
FIG. 9 is a block diagram illustrating a configuration example of a bit interleaver 116.

FIG. 9 illustrates a configuration example of the bit interleaver 116 of FIG. 8.

The bit interleaver 116 has a function of interleaving data, and includes a parity interleaver 23, a group-wise interleaver 24, and a block interleaver 25.

The parity interleaver 23 performs parity interleave for interleaving the parity bits of the LDPC code supplied from the LDPC encoder 115 into positions of other parity bits and supplies the LDPC code after the parity interleave to the group-wise interleaver 24.

The group-wise interleaver 24 performs the group-wise interleave with respect to the LDPC code supplied from the parity interleaver 23 and supplies the LDPC code after the group-wise interleave to the block interleaver 25.

Here, in the group-wise interleave, 360 bits of one segment are used as a bit group, where the LDPC code of one code is divided into segments in units of 360 bits equal to the unit size P which will be described later, and the LDPC code supplied from the parity interleaver 23 is interleaved in units of bit groups, starting from the head.

When the group-wise interleave is performed, the error rate can be improved to be better than when the group-wise interleave is not performed, and as a result, it is possible to secure the excellent communication quality in the data transmission.

The block interleaver 25 performs block interleave for demultiplexing the LDPC code supplied from the group-wise interleaver 24, converts, for example, the LDPC code corresponding to one code into an m-bit symbol serving as a unit of mapping, and supplies the m-bit symbol to the mapper 117 (FIG. 8).

Here, in the block interleave, for example, the LDPC code corresponding to one code is converted into the m-bit symbol such that the LDPC code supplied from the group-wise interleaver 24 is written in a storage region in which columns serving as a storage region storing a predetermined number of bits in a column (vertical) direction are arranged in a row (horizontal) direction by the number m of bits of the symbol in the column direction and read from the storage region in the row direction.

<Parity Check Matrix H of the LDPC Code>

Figure 10:
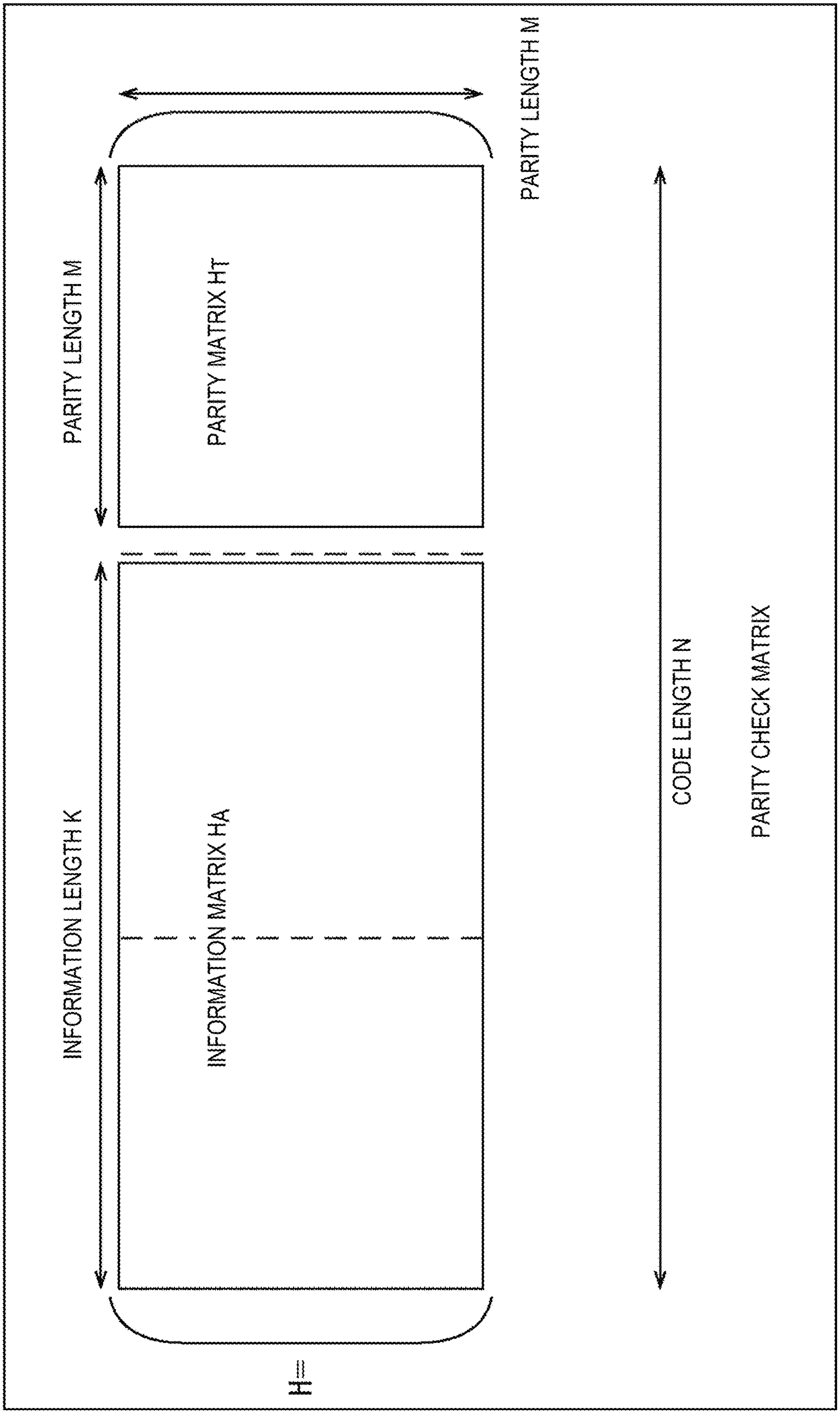
FIG. 10 is an illustration of an example of a parity check matrix.

Next, FIG. 10 illustrates an example of the parity check matrix H that is used for LDPC encoding by the LDPC encoder 115 of FIG. 8.

The parity check matrix H becomes an LDGM (Low-Density Generation Matrix) structure and can be represented by an expression $H=[H_A|H_T]$ (a matrix in which elements of the information matrix $H_A$ are set to left elements and elements of the parity matrix $H_T$ are set to right elements), using an information matrix $H_A$ of a portion corresponding to information bits among the code bits of the LDPC code and a parity matrix $H_T$ corresponding to the parity bits.

In this case, a bit number of the information bits among the code bits of one code of LDPC code (one code word) and a bit number of the parity bits are referred to as an information length K and a parity length M, respectively, and a bit number of the code bits of one code (one code word) of LDPC code is referred to as a code length N(=K+M).

The information length K and the parity length M of the LDPC code having the certain code length N are determined by an encoding rate. The parity check matrix H becomes a matrix in which row×column is M×N (a matrix of M×N). The information matrix $H_A$ becomes a matrix of M×K and the parity matrix $H_T$ becomes a matrix of M×M.

Figure 11:
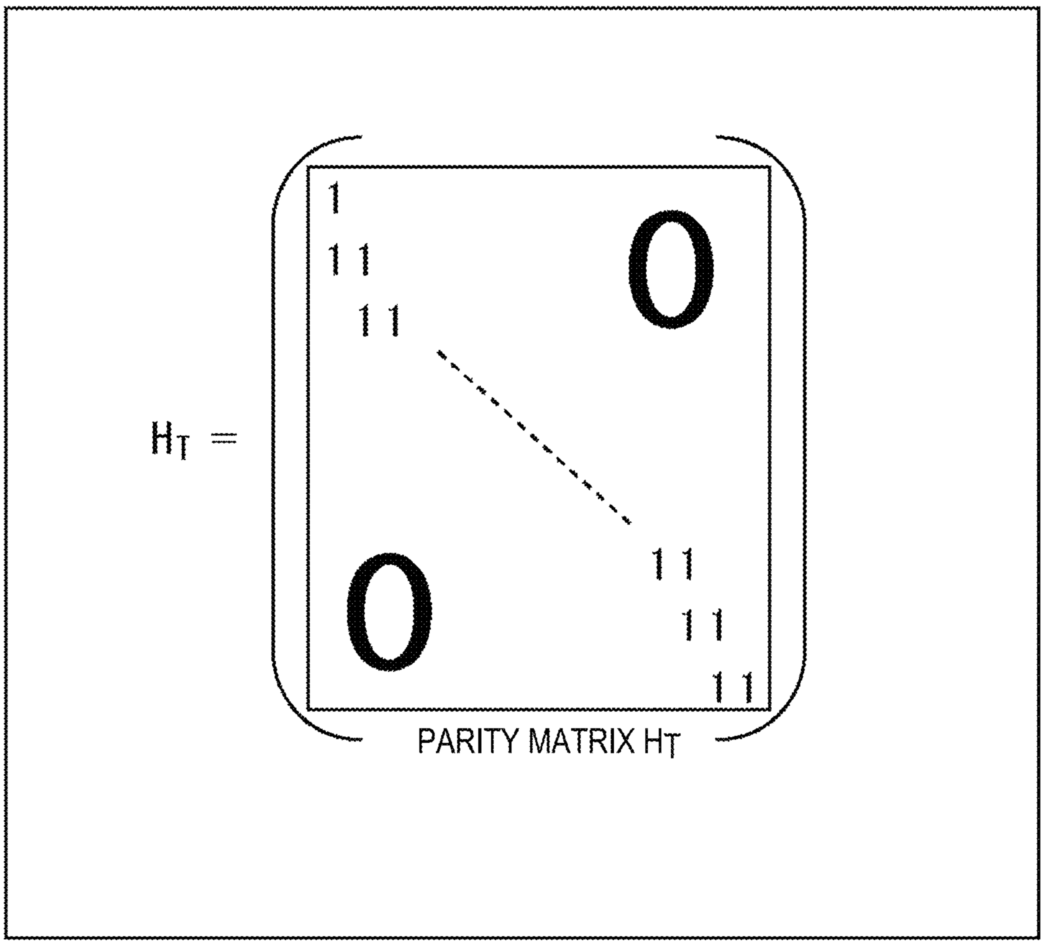
FIG. 11 is an illustration of an example of a parity matrix.

FIG. 11 is an illustration of an example of the parity matrix $H_T$ of the parity check matrix H used for LDPC encoding in the LDPC encoder 115 of FIG. 8.

The parity matrix $H_T$ of the parity check matrix H used for LDPC encoding in the LDPC encoder 115 is identical to, for example, the parity matrix $H_T$ of the parity check matrix H of the LDPC code specified in a standard such as DVB-T.2.

The parity matrix $H_T$ of the parity check matrix H of the LDPC code that is defined in the standard of the DVB-T.2 or the like becomes a staircase structure matrix (lower bidiagonal matrix) in which elements of 1 are arranged in a staircase shape, as illustrated in FIG. 11. The row weight of the parity matrix $H_T$ becomes 1 with respect to the first row and becomes 2 with respect to the remaining rows. The column weight becomes 1 with respect to the final column and becomes 2 with respect to the remaining columns.

As described above, the LDPC code of the parity check matrix H in which the parity matrix $H_T$ becomes the staircase structure can be easily generated using the parity check matrix H.

That is, the LDPC code (one code word) is represented by a row vector c and a column vector obtained by transposing the row vector is represented by $C^T$. In addition, a portion of information bits of the row vector c to be the LDPC code is represented by a row vector A and a portion of the parity bits is represented by a row vector T.

The row vector c can be represented by an expression $c=[A|T]$ (a row vector in which elements of the row vector A are set to left elements and elements of the row vector T are set to right elements), using the row vector A corresponding to the information bits and the row vector T corresponding to the parity bits.

In the parity check matrix H and the row vector $c=[A|T]$ corresponding to the LDPC code, it is necessary to satisfy an expression $Hc^T=0$. The row vector T that corresponds to the parity bits constituting the row vector $c=[A|T]$ satisfying the expression $Hc^T=0$ can be sequentially calculated by setting elements of each row to 0, sequentially (in order) from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

Figure 12:
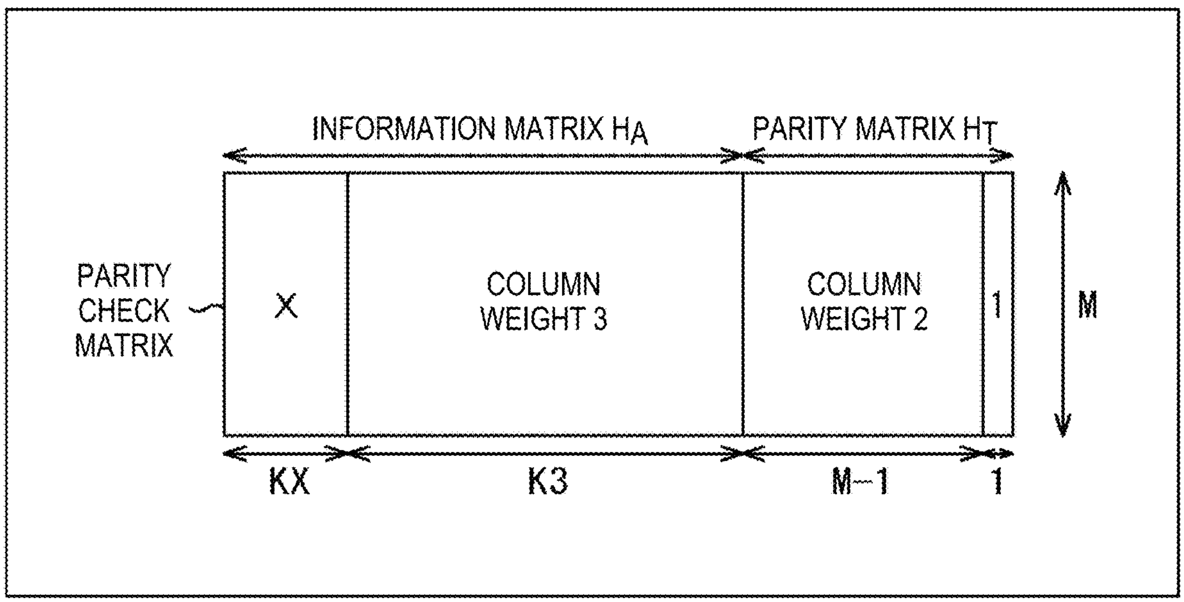
FIG. 12 is an illustration of the parity check matrix of the LDPC code that is defined in the standard of the DVB-T.2.

FIG. 12 is an illustration of the parity check matrix H of the LDPC code that is defined in the standard of the DVB-T.2 or the like.

The column weight becomes X with respect KX columns from a first column of the parity check matrix H of the LDPC code defined in the standard of the DVB-T.2 or the like, becomes 3 with respect to the following K3 columns, becomes 2 with respect to the following (M−1) columns, and becomes 1 with respect to a final column.

In this case, KX+K3+M−1+1 is equal to the code length N.

FIG. 13 is an illustration of column numbers KX, K3, and M and a column weight X, with respect to each encoding rate r of the LDPC code defined in the standard of the DVB-T.2 or the like.

In the standard of the DVB-T.2 or the like, LDPC codes that have code lengths N of 64800 bits and 16200 bits are defined.

With respect to the LDPC code having the code length N of 64800 bits, 11 encoding rates (nominal rates) of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined.

Hereinafter, the code length N of the 64800 bits is referred to as 64 kbits and the code length N of the 16200 is referred to as 16 kbits.

With respect to the LDPC code, an error rate tends to be lower in a code bit corresponding to a column of which a column weight of the parity check matrix H is large.

In the parity check matrix H that is illustrated in FIGS. 12 and 13 and is defined in the standard of the DVB-T.2 or the like, a column weight of a column of a head side (left side) tends to be large. Therefore, with respect to the LDPC code corresponding to the parity check matrix H, a code bit of a head side tends to be robust to error (there is tolerance against the error) and a code bit of an ending side tends to be weak for the error.

<Parity Interleave>

Next, the parity interleave by the parity interleaver 23 of FIG. 9 will be described with reference to FIGS. 14 to 16.

Figure 24:
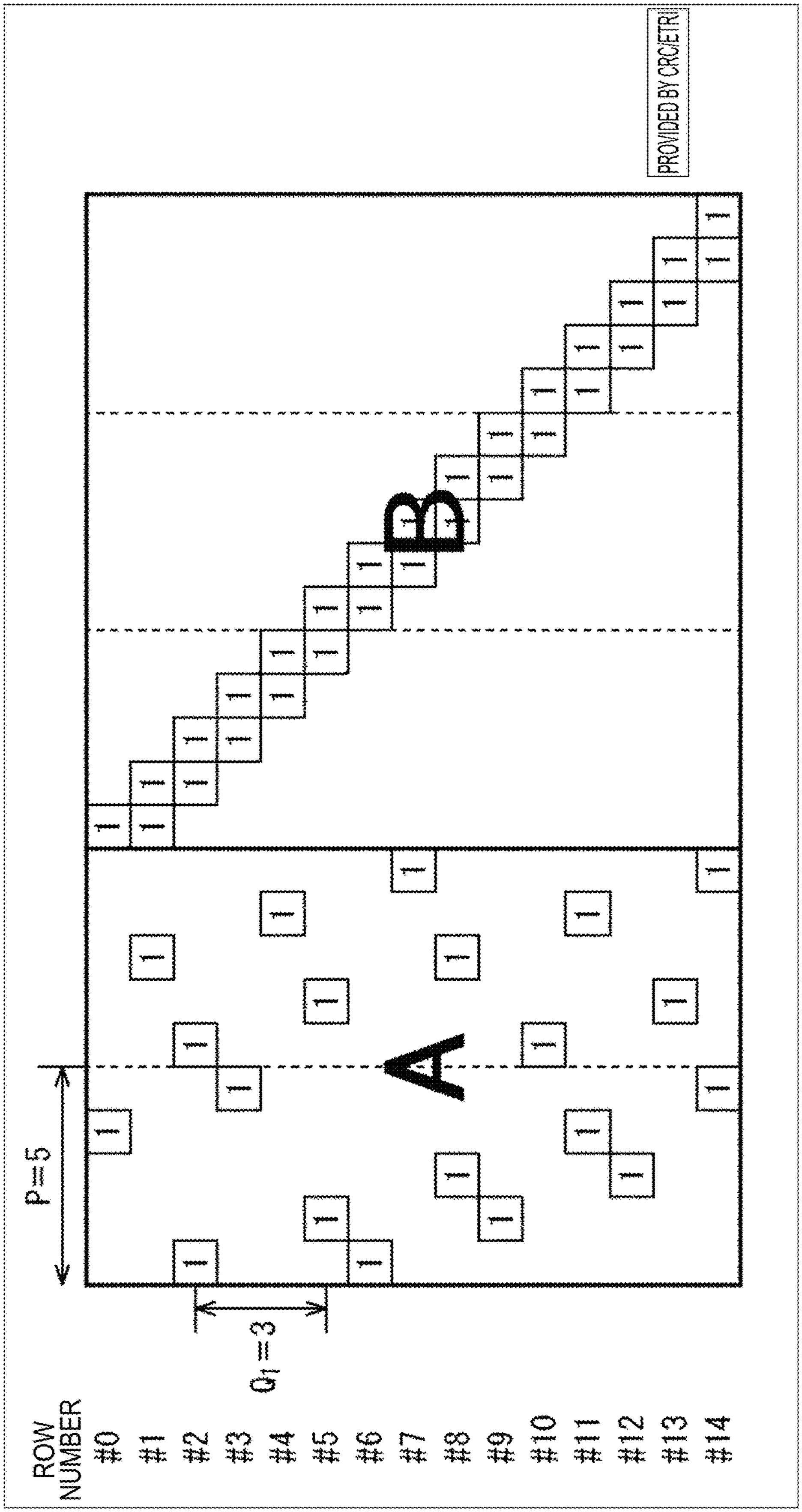
FIG. 24 is an illustration of an A matrix generated from a parity check matrix initial value table.

FIG. 24 illustrates an example of (a part of) a Tanner graph of the parity check matrix of the LDPC code.

Figure 14:
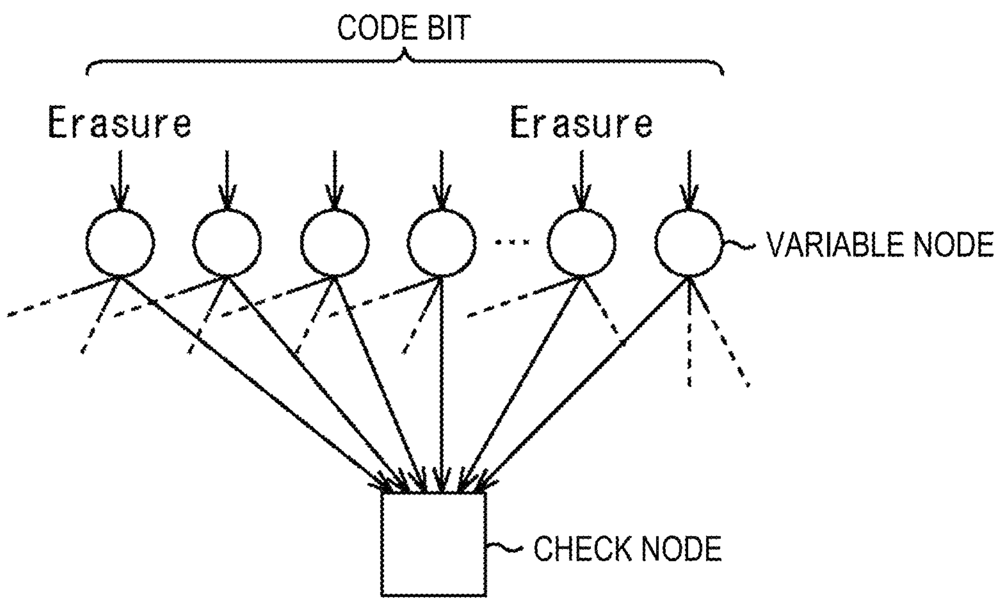
FIG. 14 is an illustration of an example of a Tanner graph for decoding of an LDPC code.

As illustrated in FIG. 14, if a plurality of, for example, two variable nodes among (the code bits corresponding to) the variable nodes connected to the check node simultaneously become the error such as the erasure, the check node returns a message in which the probability of a value being 0 and the probability of a value being 1 are equal to each other, to all the variable nodes connected to the check node. For this reason, if the plurality of variable nodes connected to the same check node simultaneously become the erasure, decoding performance is deteriorated.

Meanwhile, the LDPC code that is output by the LDPC encoder 115 of FIG. 8 is an IRA code, same as the LDPC code that is defined in the standard of the DVB-T.2 or the like, and the parity matrix $H_T$ of the parity check matrix H becomes a staircase structure, as illustrated in FIG. 11.

FIG. 15 illustrates the parity matrix HT becoming the staircase structure as illustrated in FIG. 11, and an example of a Tanner graph corresponding to the parity matrix HT.

That is, A of FIG. 15 illustrates an example of the parity matrix HT becoming the staircase structure and B of FIG. 15 illustrates the Tanner graph corresponding to the parity matrix HT of A of FIG. 15.

In the parity matrix $H_T$ with a staircase structure, elements of 1 are adjacent in each row (excluding the first row). Therefore, in the Tanner graph of the parity matrix $H_T$, two adjacent variable nodes corresponding to a column of two adjacent elements in which the value of the parity matrix $H_T$ is 1 are connected with the same check node.

Therefore, when parity bits corresponding to two above-mentioned adjacent variable nodes become errors at the same time by burst error and erasure, and so on, the check node connected with two variable nodes (variable nodes to find a message by the use of parity bits) corresponding to those two parity bits that became errors returns message that the probability with a value of 0 and the probability with a value of 1 are equal probability, to the variable nodes connected with the check node, and therefore the performance of decoding is deteriorated. Further, when the burst length (bit number of parity bits that continuously become errors) becomes large, the number of check nodes that return the message of equal probability increases and the performance of decoding is further deteriorated.

Therefore, the parity interleaver 23 (FIG. 9) performs the parity interleave for interleaving the parity bits of the LDPC code from the LDPC encoder 115 into positions of other parity bits, to prevent the decoding performance from being deteriorated.

Figure 16:
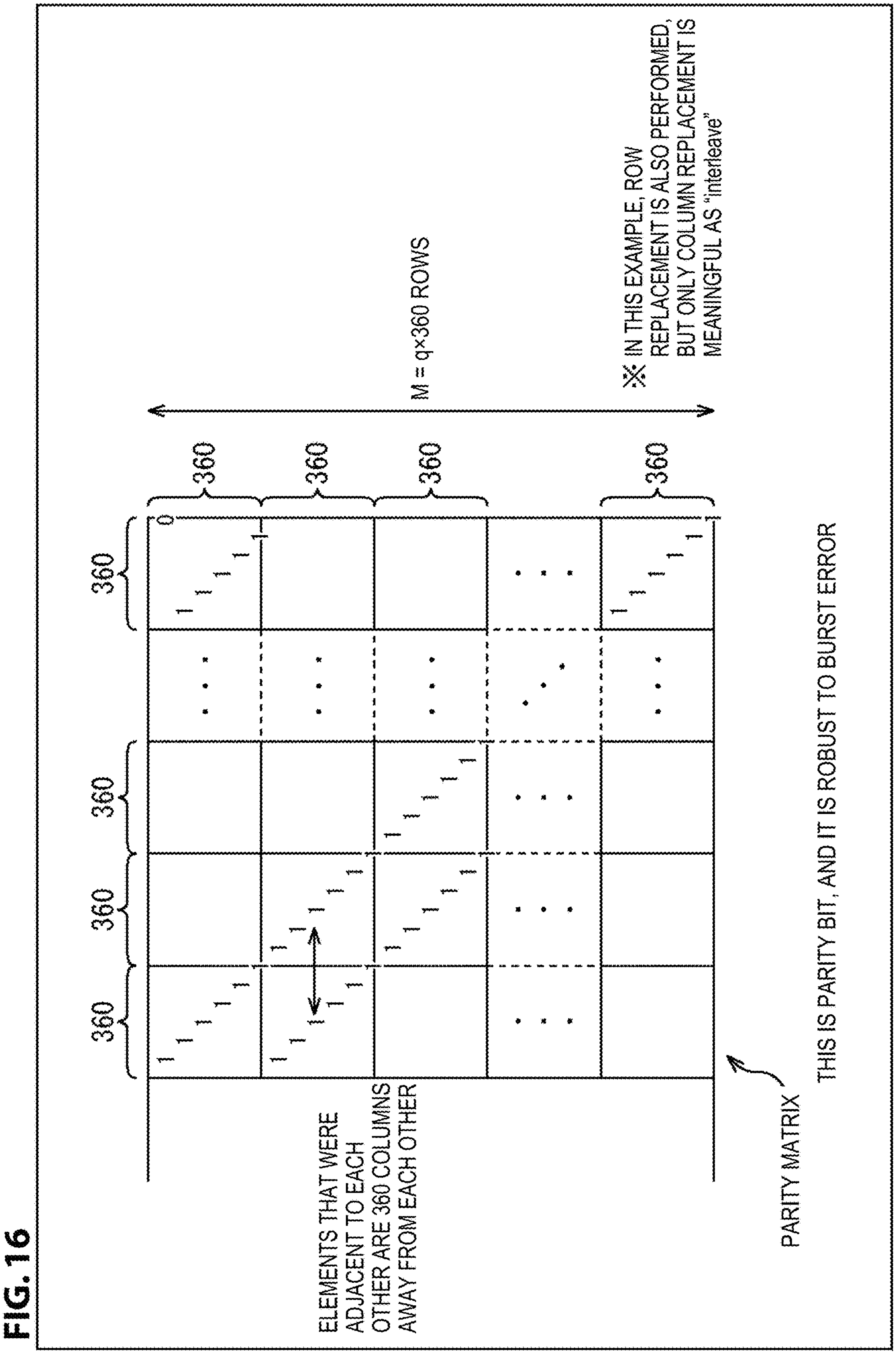
FIG. 16 is an illustration of an example of a parity matrix $H_T$ of a parity check matrix H corresponding to an LDPC code after parity interleave.

FIG. 16 is an illustration of the parity matrix $H_T$ of the parity check matrix H corresponding to the LDPC code that has undergone the parity interleave performed by the parity interleaver 23 of FIG. 9.

Here, the information matrix $H_A$ of the parity check matrix H corresponding to the LDPC code output by the LDPC encoder 115 has a cyclic structure, similarly to the information matrix of the parity check matrix H corresponding to the LDPC code specified in a standard such as DVB-T.2.

The cyclic structure refers to a structure in which a certain column matches one obtained by cyclically shifting another column, and includes, for example, a structure in which a position of 1 of each row of P columns becomes a position obtained by cyclically shifting a first column of the P columns in the column direction by a predetermined value such as a value that is proportional to a value q obtained by dividing a parity length M for every P columns. Hereinafter, the P columns in the cyclic structure are referred to appropriately as a unit size.

As an LDPC code defined in a standard such as DVB-T.2, as described in FIG. 12 and FIG. 13, there are two kinds of LDPC codes whose code length N is 64800 bits and 16200 bits, and, for both of those two kinds of LDPC codes, the unit size P is defined as 360 which is one of divisors excluding 1 and M among the divisors of the parity length M.

The parity length M becomes a value other than primes represented by an expression M=q×P=q×360, using a value q different according to the encoding rate. Therefore, similar to the unit size P, the value q is one other than 1 and M among the divisors of the parity length M and is obtained by dividing the parity length M by the unit size P (the product of P and q to be the divisors of the parity length M becomes the parity length M).

As described above, when information length is assumed to be K, an integer equal to or greater than 0 and less than P is assumed to be x and an integer equal to or greater than 0 and less than q is assumed to be y, the parity interleaver 23 interleaves the K+qx+y+1-th code bit among code bits of an LDPC code of N bits to the position of the K+Py+x+1-th code bit as parity interleave.

Since both of the K+qx+y+1-th code bit and the K+Py+x+1-th code bit are code bits after the K+1-th one, they are parity bits, and therefore the positions of the parity bits of the LDPC code are moved according to the parity interleave.

According to the parity interleave, (the parity bits corresponding to) the variable nodes connected to the same check node are separated by the unit size P, that is, 360 bits in this case. For this reason, when the burst length is less than 360 bits, the plurality of variable nodes connected to the same check node can be prevented from simultaneously becoming the error. As a result, tolerance against the burst error can be improved.

The LDPC code after the interleave for interleaving the (K+qx+y+1)-th code bit into the position of the (K+Py+x+1)-th code bit is matched with an LDPC code of a parity check matrix (hereinafter, referred to as a transformed parity check matrix) obtained by performing column replacement for replacing the (K+qx+y+1)-th column of the original parity check matrix H with the (K+Py+x+1)-th column.

In the parity matrix of the transformed parity check matrix, as illustrated in FIG. 16, a pseudo cyclic structure that uses the P columns (in FIG. 16, 360 columns) as a unit appears.

Here, the pseudo cyclic structure is a structure in which the remaining portion excluding a part has the cyclic structure.

The transformed parity check matrix obtained by performing the column permutation corresponding to the parity interleave on the parity check matrix of the LDPC code specified in the standard such as DVB-T.2 has the pseudo cyclic structure rather than the (perfect) cyclic structure since it is one 1 element short (it is a 0 element) in a portion (a shift matrix which will be described later) of a 360×360 matrix of a right top corner portion of the transformed parity check matrix.

The transformed parity check matrix for the parity check matrix of the LDPC code output by the LDPC encoder 115 has the pseudo cyclic structure, for example, similarly to the transformed parity check matrix for the parity check matrix of the LDPC code specified in the standard such as DVB-T.2.

The transformed parity check matrix of FIG. 16 becomes a matrix that is obtained by performing the column replacement corresponding to the parity interleave and replacement (row replacement) of a row to configure the transformed parity check matrix with a constitutive matrix to be described later, with respect to the original parity check matrix H.

Figure 17:
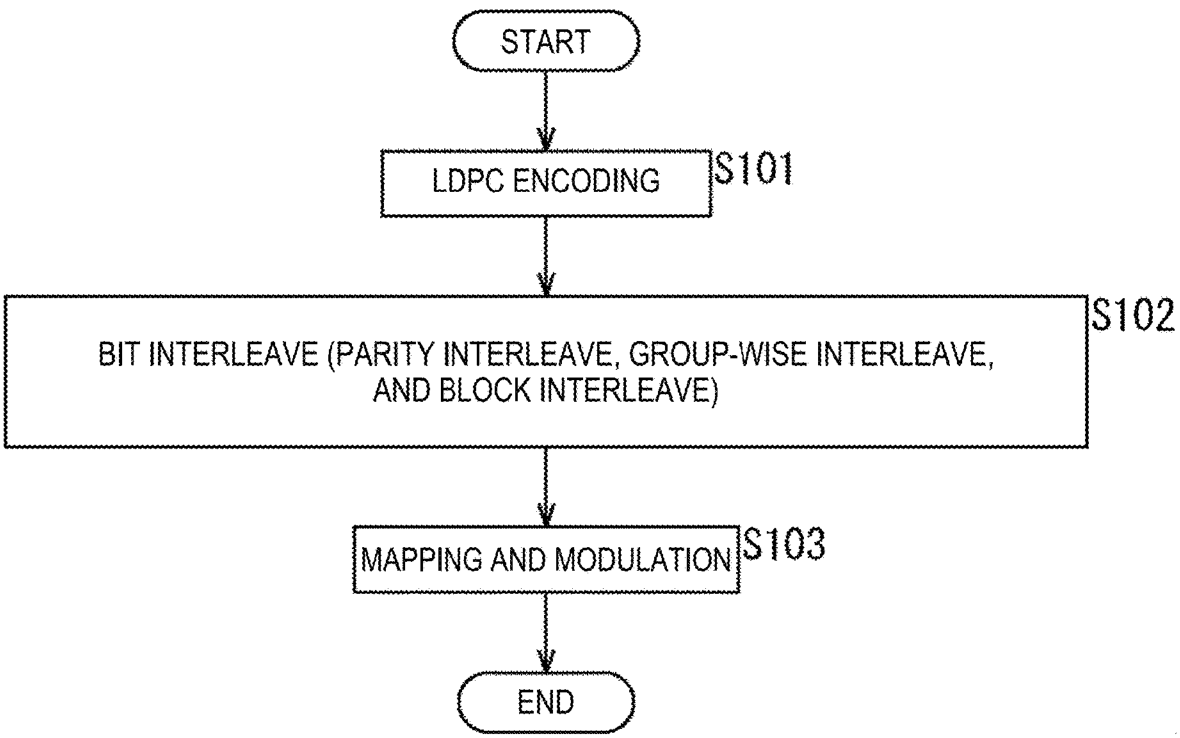
FIG. 17 is a flowchart illustrating an example of a process performed by a bit interleaver 116 and a mapper 117.

FIG. 17 is a flowchart illustrating processing executed by the LDPC encoder 115, the bit interleaver 116, and the mapper 117 of FIG. 8.

The LDPC encoder 115 awaits supply of the LDPC target data from the BCH encoder 114. In step S101, the LDPC encoder 115 encodes the LDPC target data with the LDPC code and supplies the LDPC code to the bit interleaver 116. The processing proceeds to step S102.

In step S102, the bit interleaver 116 performs the bit interleave on the LDPC code supplied from the LDPC encoder 115, and supplies the symbol obtained by the bit interleave to the mapper 117, and the process proceeds to step S103.

That is, in step S102, in the bit interleaver 116 (FIG. 9), the parity interleaver 23 performs parity interleave with respect to the LDPC code supplied from the LDPC encoder 115 and supplies the LDPC code after the parity interleave to the group-wise interleaver 24.

The group-wise interleaver 24 performs the group-wise interleave on the LDPC code supplied from the parity interleaver 23, and supplies the resulting LDPC code to the block interleaver 25.

The block interleaver 25 performs the block interleave on the LDPC code that has undergone the group-wise interleave performed by the group-wise interleaver 24, and supplies the m-bit symbol obtained as a result to the mapper 117.

In step S103, the mapper 117 maps the symbol supplied from the block interleaver 25 to any of the $2^m$ signal points decided in the modulation scheme of the orthogonal modulation performed by the mapper 117, performs the orthogonal modulation, and supplies data obtained as a result to the time interleaver 118.

As described above, by performing the parity interleave and the group-wise interleave, it is possible to improve the error rate when transmission is performed using a plurality of code bits of the LDPC code as one symbol.

Here, in FIG. 9, for the sake of convenience of description, the parity interleaver 23 serving as the block performing the parity interleave and the group-wise interleaver 24 serving as the block performing the group-wise interleave are configured individually, but the parity interleaver 23 and the group-wise interleaver 24 may be configured integrally.

That is, both the parity interleave and the group-wise interleave can be performed by writing and reading of the code bits with respect to the memory and can be represented by a matrix to convert an address (write address) to perform writing of the code bits into an address (read address) to perform reading of the code bits.

Therefore, if a matrix obtained by multiplying a matrix representing the parity interleave and a matrix representing the group-wise interleave is calculated, the code bits are converted by the matrixes, the parity interleave is performed, and a group-wise interleave result of the LDPC code after the parity interleave can be obtained.

In addition to the parity interleaver 23 and the group-wise interleaver 24, the block interleaver 25 can be integrally configured.

That is, the block interleave executed by the block interleaver 25 can be represented by the matrix to convert the write address of the memory storing the LDPC code into the read address.

Therefore, if a matrix obtained by multiplying the matrix representing the parity interleave, the matrix representing the group-wise interleave, and the matrix representing the block interleave is calculated, the parity interleave, the group-wise interleave, and the block interleave can be collectively executed by the matrixes.

<Configuration Example of LDPC Encoder 115>

Figure 18:
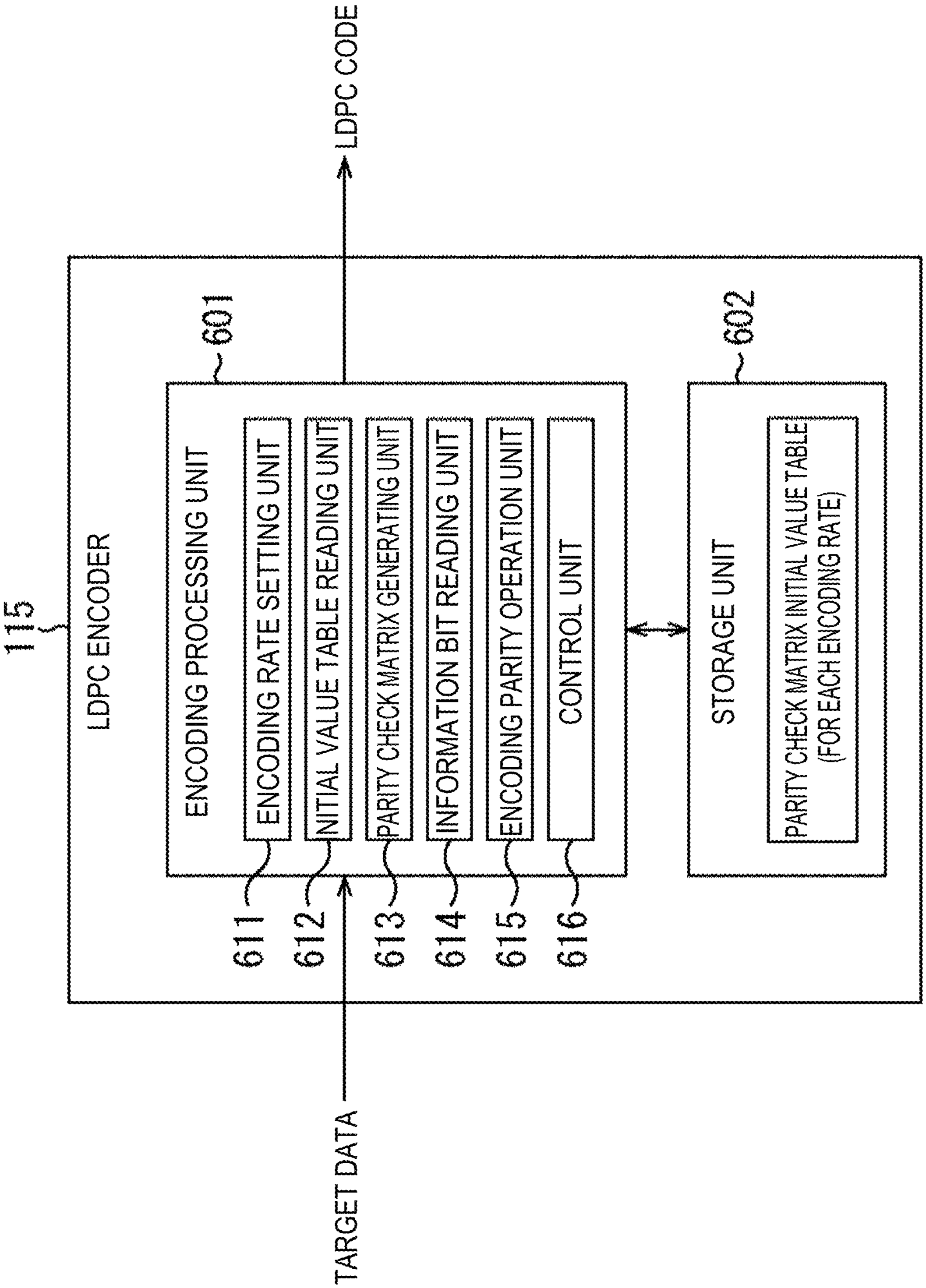
FIG. 18 is a block diagram illustrating a configuration example of an LDPC encoder 115.

FIG. 18 is a block diagram illustrating a configuration example of the LDPC encoder 115 of FIG. 8.

The LDPC encoder 122 of FIG. 8 is also configured in the same manner.

As described in FIGS. 12 and 13, in the standard of the DVB-T.2 or the like, the LDPC codes that have the two code lengths N of 64800 bits and 16200 bits are defined.

With respect to the LDPC code having the code length N of 64800 bits, 11 encoding rates of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined (FIGS. 12 and 13).

For example, the LDPC encoder 115 can perform encoding (error correction encoding) using the LDPC code of each encoding rate having the code length N of 64800 bits or 16200 bits, according to the parity check matrix H prepared for each code length N and each encoding rate.

The LDPC encoder 115 includes an encoding processing unit 601 and a storage unit 602.

The encoding processing unit 601 includes an encoding rate setting unit 611, an initial value table reading unit 612, a parity check matrix generating unit 613, an information bit reading unit 614, an encoding parity operation unit 615, an a control unit 616. The encoding processing unit 601 performs the LDPC encoding of LDPC target data supplied to the LDPC encoder 115 and supplies an LDPC code obtained as a result to the bit interleaver 116 (FIG. 8).

That is, the encoding rate setting unit 611 sets the code length N and the encoding rate of the LDPC code, according to an operation of an operator.

The initial value table reading unit 612 reads a parity check matrix initial value table to be described later, which corresponds to the code length N and the encoding rate set by the encoding rate setting unit 611, from the storage unit 602.

The parity check matrix generating unit 613 generates a parity check matrix H by arranging elements of 1 of an information matrix $H_A$ corresponding to an information length K (=information length N−parity length M) according to the code length N and the encoding rate set by the encoding rate setting unit 611 in the column direction with a period of 360 columns (unit size P), on the basis of the parity check matrix initial value table read by the initial value table reading unit 612, and stores the parity check matrix H in the storage unit 602.

The information bit reading unit 614 reads (extracts) information bits corresponding to the information length K, from the LDPC target data supplied to the LDPC encoder 115.

The encoding parity operation unit 615 reads the parity check matrix H generated by the parity check matrix generating unit 613 from the storage unit 602, and generates a code word (LDPC code) by calculating parity bits for the information bits read by the information bit reading unit 614 on the basis of a predetermined expression using the parity check matrix H.

The control unit 616 controls each block constituting the encoding processing unit 601.

In the storage unit 602, a plurality of parity check matrix initial value tables that correspond to the plurality of encoding rates illustrated in FIGS. 12 and 13, with respect to the code lengths N such as the 64800 bits and 16200 bits, are stored. In addition, the storage unit 602 temporarily stores data that is necessary for processing of the encoding processing unit 601.

Figure 19:
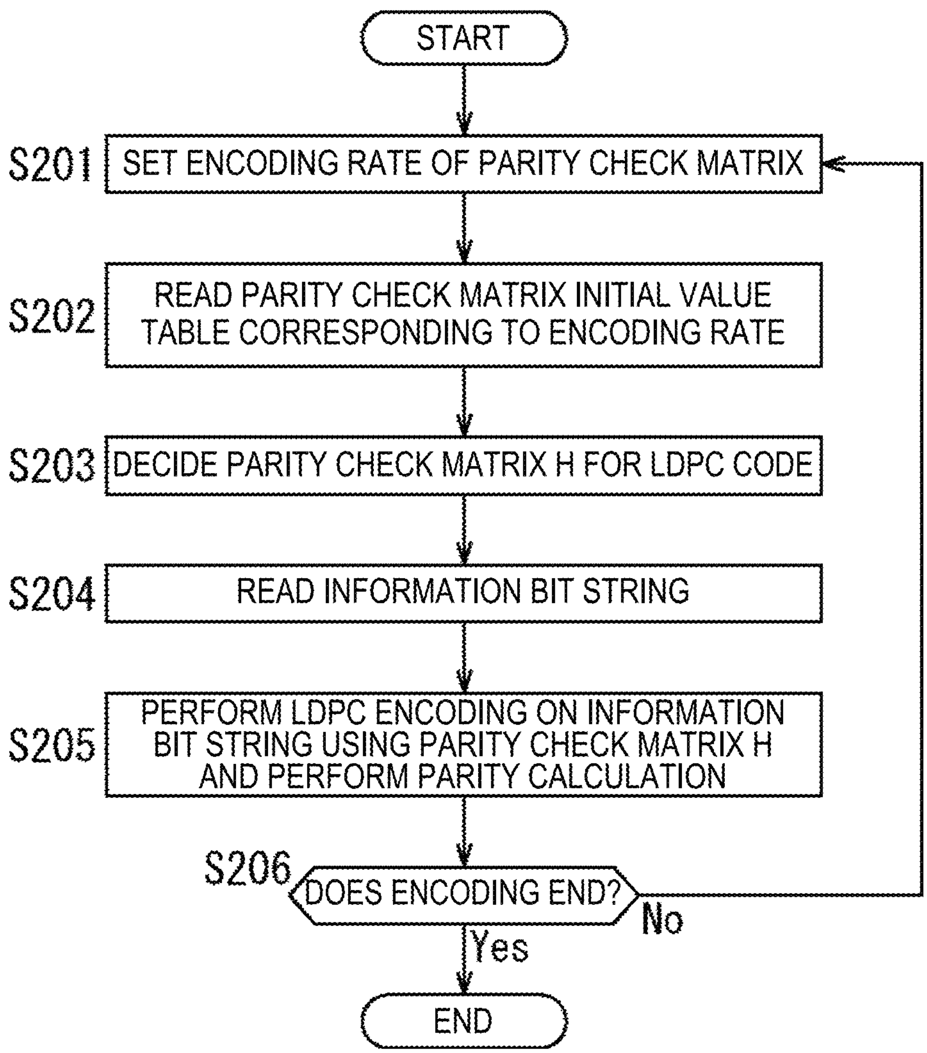
FIG. 19 is a flowchart illustrating processing of an example of an LDPC encoder 115.

FIG. 19 is a flowchart illustrating an example of processing of the LDPC encoder 115 of FIG. 18.

In step S201, the encoding rate setting unit 611 determines (sets) the code length N and the encoding rate r to perform the LDPC encoding.

In step S202, the initial value table reading unit 612 reads the previously determined parity check matrix initial value table corresponding to the code length N and the encoding rate r determined by the encoding rate setting unit 611, from the storage unit 602.

In step S203, the parity check matrix generating unit 613 calculates (generates) the parity check matrix H of the LDPC code of the code length N and the encoding rate r determined by the encoding rate setting unit 611, using the parity check matrix initial value table read from the storage unit 602 by the initial value table reading unit 612, supplies the parity check matrix to the storage unit 602, and stores the parity check matrix in the storage unit.

In step S204, the information bit reading unit 614 reads the information bits of the information length K (=N×r) corresponding to the code length N and the encoding rate r determined by the encoding rate setting unit 611, from the LDPC target data supplied to the LDPC encoder 115, reads the parity check matrix H calculated by the parity check matrix generating unit 613 from the storage unit 602, and supplies the information bits and the parity check matrix to the encoding parity operation unit 615.

In step S205, the encoding parity operation unit 615 sequentially operates parity bits of a code word c that satisfies an expression (8) using the information bits and the parity check matrix H that have been read from the information bit reading unit 614.

$$Hc^T=0 \quad (8)$$

In the expression (8), c represents a row vector as the code word (LDPC code) and $c^T$ represents transposition of the row vector c.

As described above, when a portion of the information bits of the row vector c as the LDPC code (one code word) is represented by a row vector A and a portion of the parity bits is represented by a row vector T, the row vector c can be represented by an expression c=[A/T], using the row vector A as the information bits and the row vector T as the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be sequentially calculated by setting elements of each row to 0, sequentially from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

If the encoding parity operation unit 615 calculates the parity bits T with respect to the information bits A from the information bit reading unit 614, the encoding parity operation unit 615 outputs the code word c=[A/T] represented by the information bits A and the parity bits T as an LDPC encoding result of the information bits A.

Then, in step S206, the control unit 616 determines whether the LDPC encoding ends. When it is determined in step S206 that the LDPC encoding does not end, that is, when there is LDPC target data to perform the LDPC encoding, the processing returns to step S201 (or step S204). Hereinafter, the processing of steps S201 (or step S204) to S206 is repeated.

When it is determined in step S206 that the LDPC encoding ends, that is, there is no LDPC target data to perform the LDPC encoding, the LDPC encoder 115 ends the processing.

As described above, the parity check matrix initial value table corresponding to each code length N and each encoding rate r is prepared and the LDPC encoder 115 performs the LDPC encoding of the predetermined code length N and the predetermined encoding rate r, using the parity check matrix H generated from the parity check matrix initial value table corresponding to the predetermined code length N and the predetermined encoding rate r.

<Example of the Parity Check Matrix Initial Value Table>

The parity check matrix initial value table is a table that represents positions of elements of 1 of the information matrix $H_A$ (FIG. 10) of the parity check matrix H corresponding to the information length K according to the code length N and the encoding rate r of the LDPC code (LDPC code defined by the parity check matrix H) for every 360 columns (unit size P) and is previously made for each parity check matrix H of each code length N and each encoding rate r.

That is, the parity check matrix initial value table represents at least positions of elements of 1 of the information matrix $H_A$ for every 360 columns (unit size P).

Examples of the parity check matrix H include a parity check matrix in which the (whole) parity matrix $H_T$ has the staircase structure, which is specified in DVB-T.2 or the like and a parity check matrix in which a part of the parity matrix $H_T$ has the staircase structure, and the remaining portion is a diagonal matrix (a unit matrix), which is proposed by CRC/ETRI.

Hereinafter, an expression scheme of a parity check matrix initial value table indicating the parity check matrix in which the parity matrix $H_T$ has the staircase structure, which is specified in DVB-T.2 or the like, is referred to as a DVB scheme, and an expression scheme of a parity check matrix initial value table indicating the parity check matrix proposed by CRC/ETRI is referred to as an ETRI scheme.

Figure 20:
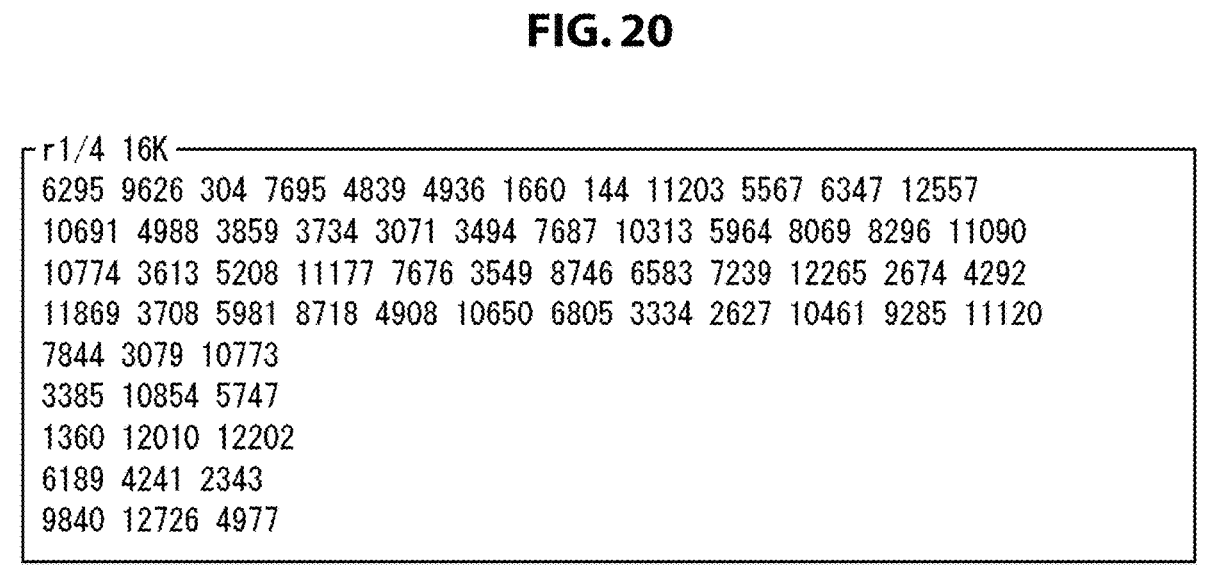

FIG. 20 is an illustration of an example of the parity check matrix initial value table in the DVB method.

That is, FIG. 20 illustrates a parity check matrix initial value table with respect to the parity check matrix H that is defined in the standard of the DVB-T.2 and has the code length N of 16200 bits and the encoding rate (an encoding rate of notation of the DVB-T.2) r of 1/4.

The parity check matrix generating unit 613 (FIG. 18) calculates the parity check matrix H using the parity check matrix initial value table in the DVB method, as follows.

FIG. 21 is an illustration of a method of calculating a parity check matrix H from a parity check matrix initial value table in the DVB method.

That I, FIG. 21 illustrates a parity check matrix initial value table with respect to the parity check matrix H that is defined in the standard of the DVB-T.2 and has the code length N of 16200 bits and the encoding rate r of 2/3.

The parity check matrix initial value table in the DVB method is the table that represents the positions of the elements of 1 of the whole information matrix $H_A$ corresponding to the information length K according to the code length N and the encoding rate r of the LDPC code for every 360 columns (unit size P). In the i-th row thereof, row numbers (row numbers when a row number of a first row of the parity check matrix H is set to 0) of elements of 1 of a (1+360×(i−1)-th column of the parity check matrix H are arranged by a number of column weights of the (1+360×(i−1)-th column.

Here, since the parity matrix $H_T$ (FIG. 10) corresponding to the parity length M in the parity check matrix H of the DVB scheme is fixed to the staircase structure illustrated in FIG. 15, it is possible to obtain the parity check matrix H if it is possible to obtain the information matrix $H_A$ (FIG. 10) corresponding to the information length K through the parity check matrix initial value table.

A row number k+1 of the parity check matrix initial value table in the DVB method is different according to the information length K.

A relation of an expression (9) is realized between the information length K and the row number k+1 of the parity check matrix initial value table.

$$K=(k+1)\times 360 \tag{9}$$

In this case, 360 of the expression (9) is the unit size P described in FIG. 16.

In the parity check matrix initial value table of FIG. 21, 13 numerical values are arranged from the first row to the third row and 3 numerical values are arranged from the fourth row to the (k+1)-th row (in FIG. 21, the 30th row).

Therefore, the column weights of the parity check matrix H that are calculated from the parity check matrix initial value table of FIG. 21 are 13 from the first column to the (1+360×(3−1)−1)-th column and are 3 from the (1+360×(3−1))-th column to the K-th column.

The first row of the parity check matrix initial value table of FIG. 21 becomes 0, 2084, 1613, 1548, 1286, 1460, 3196, 4297, 2481, 3369, 3451, 4620, and 2622, which shows that elements of rows having row numbers of 0, 2084, 1613, 1548, 1286, 1460, 3196, 4297, 2481, 3369, 3451, 4620, and 2622 are 1 (and the other elements are 0), in the first column of the parity check matrix H.

The second row of the parity check matrix initial value table of FIG. 21 becomes 1, 122, 1516, 3448, 2880, 1407, 1847, 3799, 3529, 373, 971, 4358, and 3108, which shows that elements of rows having row numbers of 1, 122, 1516, 3448, 2880, 1407, 1847, 3799, 3529, 373, 971, 4358, and 3108 are 1, in the 361 (=1+360×(2−1))-th column of the parity check matrix H.

As described above, the parity check matrix initial value table represents positions of elements of 1 of the information matrix $H_A$ of the parity check matrix H for every 360 columns.

The columns other than the (1+360×(i−1))-th column of the parity check matrix H, that is, the individual columns from the (2+360×(i−1))-th column to the (360×i)-th column are arranged by cyclically shifting elements of 1 of the (1+360×(i−1))-th column determined by the parity check matrix initial value table periodically in a downward direction (downward direction of the columns) according to the parity length M.

That is, the (2+360×(i−1))-th column is obtained by cyclically shifting (1+360×(i−1))-th column in the downward direction by M/360 (=q) and the next (3+360×(i−1))-th column is obtained by cyclically shifting (1+360×(i−1))-th column in the downward direction by 2×M/360 (=2×q) (obtained by cyclically shifting (2+360×(i−1))-th column in the downward direction by M/360 (=q)).

If a numerical value of a j-th column (j-th column from the left side) of an i-th row (i-th row from the upper side) of the parity check matrix initial value table is represented as $h_{i,j}$ and a row number of the j-th element of 1 of the w-th column of the parity check matrix H is represented as $H_{w-j}$ the row number $H_{w-j}$ of the element of 1 of the w-th column to be a column other than the (1+360×(i−1))-th column of the parity check matrix H can be calculated by an expression (10).

$$H_{w-j}=\mathrm{mod}\{h_{i,j}+\mathrm{mod}((w-1),P)\times q,M) \tag{10}$$

In this case, mod(x, y) means a remainder that is obtained by dividing x by y.

In addition, P is a unit size described above. In the present embodiment, for example, same as the standard of the DVB-S.2, the DVB-T.2, and the DVB-C.2, P is 360. In addition, q is a value M/360 that is obtained by dividing the parity length M by the unit size P (=360).

The parity check matrix generating unit 613 (FIG. 18) specifies the row numbers of the elements of 1 of the (1+360×(i−1))-th column of the parity check matrix H by the parity check matrix initial value table.

The parity check matrix generating unit 613 (FIG. 18) calculates the row number $H_{w-j}$ of the element of 1 of the w-th column to be the column other than the (1+360×(i−1))-th column of the parity check matrix H, according to the expression (10), and generates the parity check matrix H in which the element of the obtained row number is set to 1.

Figure 22:
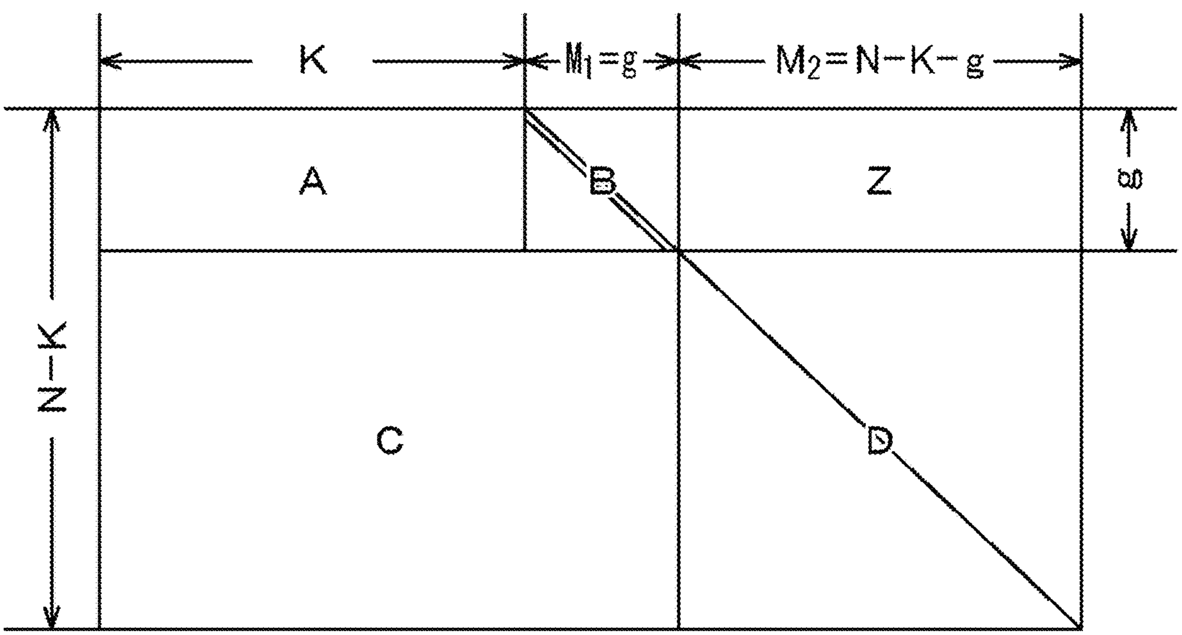
FIG. 22 is an illustration of a structure of a parity check matrix.

FIG. 22 is an illustration of a structure of the parity check matrix of the ETRI scheme.

The parity check matrix of the ETRI scheme is configured with an A matrix, a B matrix, a C matrix, a D matrix, and a Z matrix.

The A matrix is a g×K upper left matrix of the parity check matrix expressed by a predetermined value g and the information length K of the LDPC code (=the code length N×the encoding rate r).

The B matrix is a g×g matrix having the staircase structure adjacent to the right of the A matrix.

The C matrix is an (N−K−g)×(K+g) matrix adjacently below the A matrix and the B matrix.

The D matrix is an (N−K−g)×(N−K−g) unit matrix adjacent to the right of the C matrix.

The Z matrix is a g×(N−K−g) zero matrix (zero matrix) adjacent to the right of the B matrix.

In the parity check matrix of the ETRI scheme configured with the A to D matrices and the Z matrix, the A matrix and a portion of the C matrix configure an information matrix, and the B matrix, the remaining portion of the C matrix, the D matrix, and the Z matrix configure a parity matrix.

Further, since the B matrix is the matrix having the staircase structure, and the D matrix is the unit matrix, a portion (a portion of the B matrix) of the parity matrix of the parity check matrix of the ETRI scheme has the staircase structure, and the remaining portion (the portion of the D matrix) is the diagonal matrix (the unit matrix).

Similarly to the information matrix of the parity check matrix of the DVB scheme, the A matrix and the C matrix have the cyclic structure for every 360 columns (the unit size P), and the parity check matrix initial value table of the ETRI scheme indicates positions of 1 elements of the A matrix and the C matrix in units of 360 columns.

Here, as described above, since the A matrix, and a portion of the C matrix configure the information matrix, it can be said that the parity check matrix initial value table of the ETRI scheme that indicates positions of 1 elements of the A matrix and the C matrix in units of 360 columns indicates at least positions of 1 elements of the information matrix in units of 360 columns.

FIG. 23 is an illustration of an example of the parity check matrix initial value table of the ETRI scheme.

In other words, FIG. 23 illustrates an example of a parity check matrix initial value table for a parity check matrix in which the code length N is 50 bits, and the encoding rate r is 1/2.

The parity check matrix initial value table of the ETRI scheme is a table in which positions of 1 elements of the A matrix and the C matrix are indicated for each unit size P, and row numbers (row numbers when a row number of a first row of the parity check matrix is 0) of 1 elements of a $(1+P\times(i-1))$-th column of the parity check matrix that correspond in number to the column weight of the $(1+P\times(i-1))$-th column are arranged in an i-th row.

Here, in order to simplify the description, the unit size P is assumed to be, for example, 5.

Further, parameters for the parity check matrix of the ETRI scheme include $g=M_1$, $M_2$, $Q_1$, and $Q_2$.

$g=M_1$ is a parameter for deciding the size of the B matrix and has a value that is a multiple of the unit size P. The performance of the LDPC code is changed by adjusting $g=M_1$, and $g=M_1$ is adjusted to a predetermined value when the parity check matrix is decided. Here, 15, which is three times the unit size P (=5), is assumed to be employed as $g=M_1$.

$M_2$ has a value $M-M_1$ obtained by subtracting $M_1$ from the parity length M.

Here, since the information length K is $N\times r=50\times 1/2=25$, and the parity length M is $N-K=50-25=25$, $M_2$ is $M-M_1=25-15=10$.

$Q_1$ is obtained from the formula $Q_1=M_1/P$, and indicates the number of shifts (the number of rows) of the cyclic shift in the A matrix.

In other words, in each column other than the $(1+P\times(i-1))$-th column of the A matrix of the parity check matrix of the ETRI scheme, that is, in each of a $(2+P\times(i-1))$-th column to a $(P\times i)$-th column, 1 elements of a $(1+360\times(i-1))$-th column decided by the parity check matrix initial value table have periodically been cyclically shifted downward (downward in the column) and arranged, and $Q_1$ indicates the number of shifts the cyclic shift in the A matrix.

$Q_2$ is obtained from the formula $Q_2=M_2/P$, and indicates the number of shifts (the number of rows) of the cyclic shift in the C matrix.

In other words, in each column other than the $(1+P\times(i-1))$-th column of the C matrix of the parity check matrix of the ETRI scheme, that is, in each of a $(2+P\times(i-1))$-th column to a $(P\times i)$-th column, 1 elements of a $(1+360\times(i-1))$-th column decided by the parity check matrix initial value table have periodically been cyclically shifted downward (downward in the column) and arranged, and $Q_2$ indicates the number of shifts the cyclic shift in the C matrix.

Here, $Q_1$ is $M_1/P=15/5=3$, and $Q_2$ is $M_2/P=10/5=2$.

In the parity check matrix initial value table of FIG. 23, 3 numerical values are arranged in 1st and 2nd rows, and one numerical value is arranged in 3rd to 5th rows, and according to a sequence of the numerical values, the column weight of the parity check matrix obtained from the parity check matrix initial value table of FIG. 23 is 3 in the 1st column to a $(1+5\times(2-1)-1)$-th column and 1 in a $(1+5\times(2-1))$-th column to a 5th column.

In other words, 2, 6, and 18 are arranged in the 1st row of the parity check matrix initial value table of FIG. 23, which indicates that elements of rows having the row numbers of 2, 6, and 18 are 1 (and the other elements are 0) in the 1st column of the parity check matrix.

Here, in this case, the A matrix is a 15×25 (g×K) matrix, the C matrix is a 10×40 ((N−K−g)×(K+g)) matrix, rows having the row numbers of 0 to 14 in the parity check matrix are rows of the A matrix, and rows having the row numbers of 15 to 24 in the parity check matrix are rows of the C matrix.

Thus, among the rows having the row numbers of 2, 6, and 18 (hereinafter referred to as rows #2, #6, and #18), the rows #2 and #6 are the rows of the A matrix, and the row #18 is the row of the C matrix.

2, 10, and 19 are arranged in the 2nd row of the parity check matrix initial value table of FIG. 23, which indicates that elements of the rows #2, #10, and #19 are 1 in a 6 $(=1+5\times(2-1))$-th column of the parity check matrix.

Here, in the 6 $(=1+5\times(2-1))$-th column of the parity check matrix, among the rows #2, #10, and #19, the rows #2 and #10 are the rows of the A matrix, and the row #19 is the row of the C matrix.

22 is arranged in the 3rd row of the parity check matrix initial value table of FIG. 23, which indicates that an element of the row #22 is 1 in an 11 $(=1+5\times(3-1))$-th column of the parity check matrix.

Here, in the 11 $(=1+5\times(3-1))$-th column of the parity check matrix, the row #22 is the row of the C matrix.

Similarly, 19 in the 4th column of the parity check matrix initial value table of FIG. 23 indicates that an element of the row #19 is 1 in a 16 $(=1+5\times(4-1))$-th column of the parity check matrix, and 15 in the 5th row of the parity check matrix initial value table of FIG. 23 indicates that an element of the row #15 is 1 in a 21$(=1+5\times(5-1))$-st column of the parity check matrix.

As described above, the parity check matrix initial value table indicates the positions of the 1 elements of the A matrix and the C matrix of the parity check matrix for each unit size P (=5 columns).

In each column other than a $(1+5\times(i-1))$-th column of the A matrix and the C matrix of the parity check matrix, that is, in each of a $(2+5\times(i-1))$-th column to a $(5\times i)$-th column, the 1 elements of the $(1+5\times(i-1))$-th column decided by the parity check matrix initial value table have periodically been cyclically shifted downward (downward in the column) and arranged according to the parameters $Q_1$ and $Q_2$.

In other words, for example, in the $(2+5\times(i-1))$-th column of the A matrix, the $(1+5\times(i-1))$-th column has been cyclically shifted downward by $Q_1$ (=3), and in a $(3+5\times(i-1))$-th column, the $(1+5\times(i-1))$-th column has been cyclically shifted downward by $2\times Q_1$(=2×3) (the (2+5×(i−1))-th column has been cyclically shifted downward by $Q_1$).

Further, for example, in the (2+5×(i−1))-th column of the C matrix, the (1+5×(i−1))-th column has been cyclically shifted downward by $Q_2$ (=2), and in a (3+5×(i−1))-th column, the (1+5×(i−1))-th column has been cyclically shifted downward by $2\times Q_2$ (=2×2) (the (2+5×(i−1))-th column has been cyclically shifted downward by $Q_2$).

FIG. 24 is an illustration of the A matrix generated from the parity check matrix initial value table of FIG. 23.

In the A matrix of FIG. 24, according to the 1st row of the parity check matrix initial value table of FIG. 23, elements of rows #2 and #6 of a 1 (=1+5×(1−1))-st column are 1.

Further, in each of a 2 (=2+5×(1−1))-nd column to a 5 (=5+5×(1−1))-th column, an immediately previous column has been cyclically shifted downward by $Q_1$=3.

Further, in the A matrix of FIG. 24, according to the 2nd row of the parity check matrix initial value table of FIG. 23, elements of rows #2 and #10 of a 6 (=1+5×(2−1))-th column are 1.

Further, in each of a 7 (=2+5×(2−1))-th column to a 10 (=5+5×(2−1))-th column, an immediately previous column has been cyclically shifted downward by $Q_1$=3.

Figure 25:
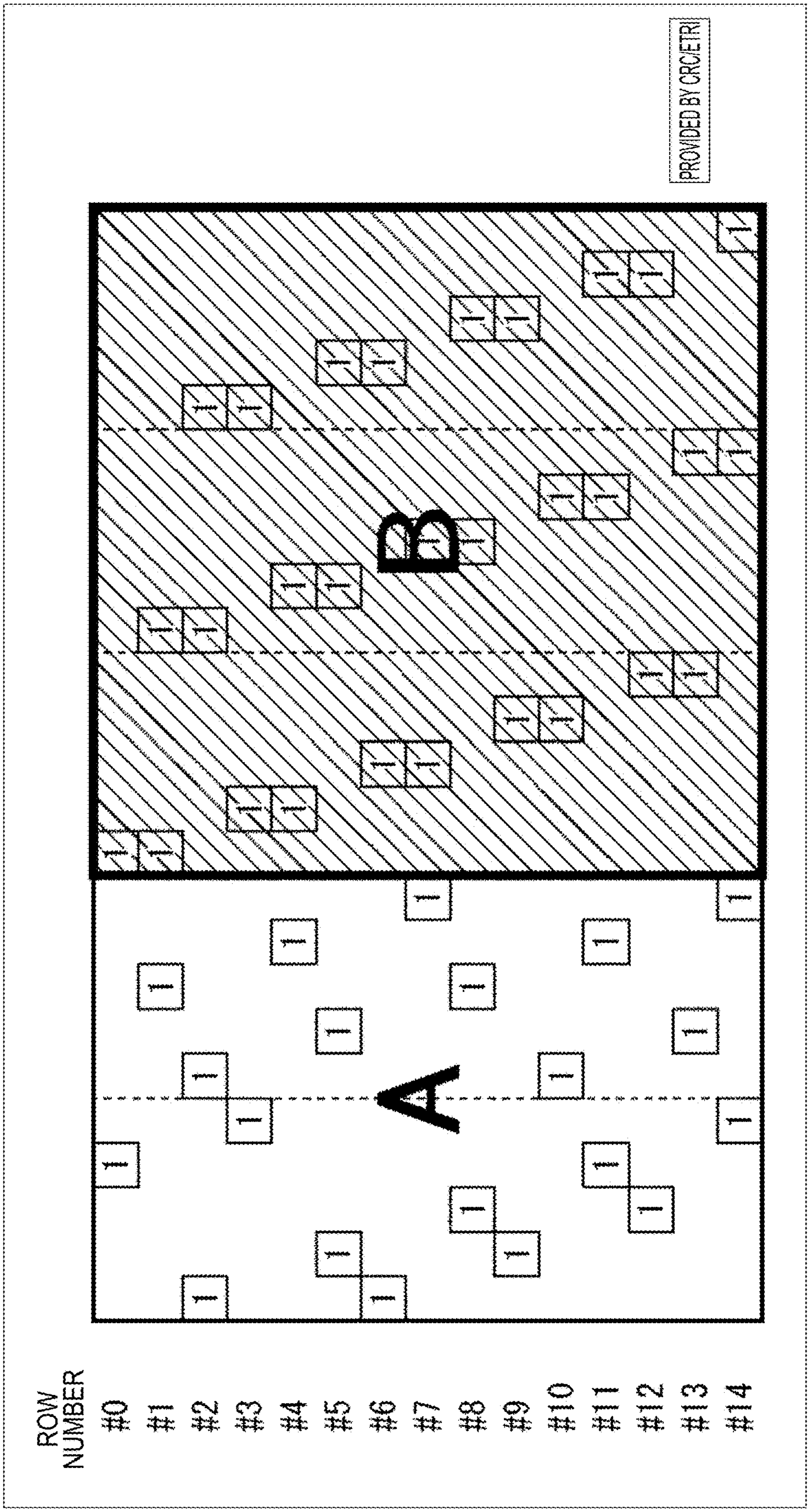
FIG. 25 is an illustration of parity interleave of a B matrix.

FIG. 25 is an illustration of the parity interleave of the B matrix.

The parity check matrix generating unit 613 (FIG. 18) generates the A matrix using the parity check matrix initial value table, and arranges the B matrix having the staircase structure at the right of the A matrix. Further, the parity check matrix generating unit 613 regards the B matrix as the parity matrix, and performs the parity interleave so that the adjacent 1 elements of the B matrix having the staircase structure are away from each other in the row direction by the unit size P=5.

FIG. 25 illustrates the A matrix and the B matrix after the B matrix has undergone the parity interleave.

Figure 26:
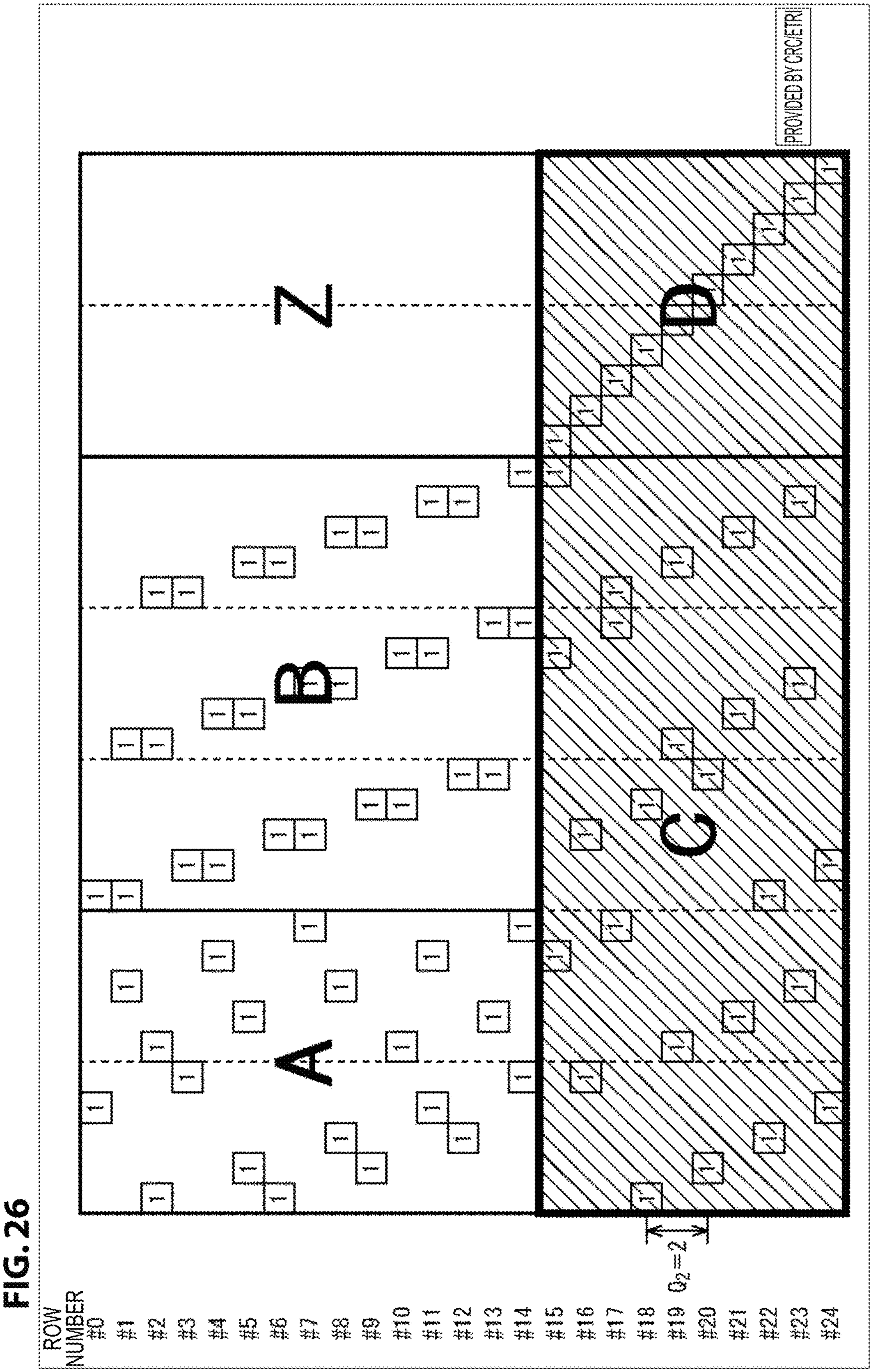
FIG. 26 is an illustration of a C matrix generated from a parity check matrix initial value table.

FIG. 26 is an illustration of the C matrix generated from the parity check matrix initial value table of FIG. 23.

In the C matrix of FIG. 26, according to the 1st row of the parity check matrix initial value table of FIG. 23, element of a row #18 of a 1 (=1+5×(1−1))-st column of the parity check matrix is 1.

Further, each of a 2 (=2+5×(1−1))-nd column to a 5 (=5+5×(1−1))-th column is one in which an immediately previous column has been cyclically shifted downward by $Q_2$=2.

Further, in the C matrix of FIG. 26, according to the 2nd to 5th columns of the parity check matrix initial value table of FIG. 23, elements of a row #19 of a 6 (=1+5×(2−1))-th column of the parity check matrix, a row #22 of an 11 (=1+5×(3−1))-th column, a row #19 of a 16 (=1+5×(4−1))-th column, and a row #15 of a 21 (=1+5×(5−1))-th column are 1.

Further, in each of the 7 (=2+5×(2−1))-th column to the 10 (=5+5×(2−1))-th column, each of a 12 (=2+5×(3−1))-th column to a 15 (=5+5×(3−1))-th column, each of a 17 (=2+5×(4−1))-th column to a 20 (=5+5×(4−1))-th column, and each of a 22 (=2+5×(5−1))-nd column to a 25 (=5+5×(5−1))-th column, an immediately previous column has been cyclically shifted downward by $Q_2$=2.

The parity check matrix generating unit 613 (FIG. 18) generates the C matrix using the parity check matrix initial value table, and arranges the C matrix below the A matrix and the B matrix (that has undergone the parity interleave).

Further, the parity check matrix generating unit 613 arranges the Z matrix at the right of the B matrix, arranges the D matrix at the right of the C matrix, and generates the parity check matrix illustrated in FIG. 26.

Figure 27:
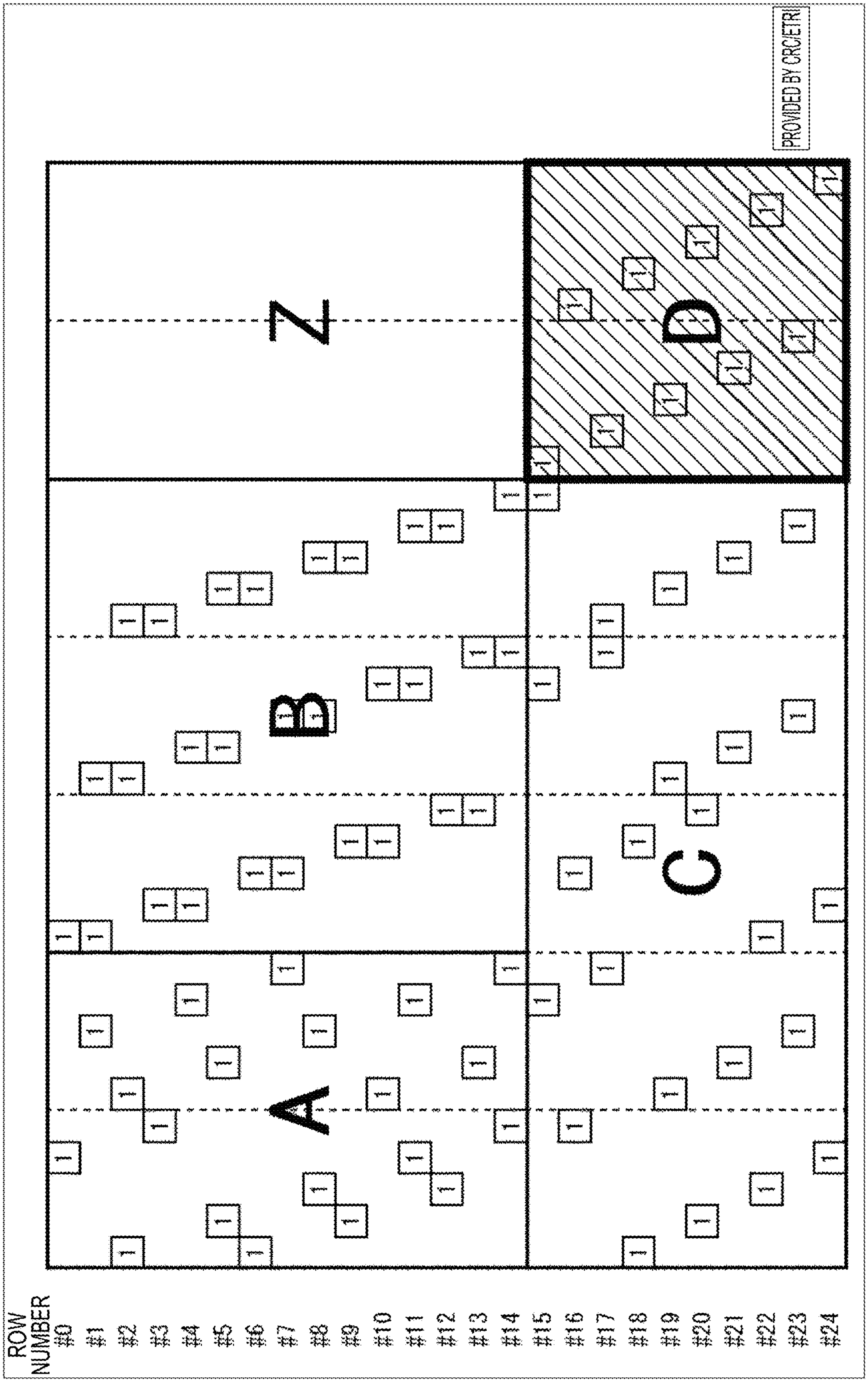
FIG. 27 is an illustration of parity interleave of a D matrix.

FIG. 27 is an illustration of the parity interleave of the D matrix.

After generating the parity check matrix of FIG. 26, the parity check matrix generating unit 613 regards the D matrix as the parity matrix, and performs the parity interleave (only for the D matrix) so that the 1 elements of the odd-numbered rows and the next even-numbered rows of the D matrix of the unit matrix are away from each other in the row direction by the unit size P (=5).

FIG. 27 illustrates the parity check matrix after the parity interleave of the D matrix is performed on the parity check matrix of FIG. 26.

(The encoding parity operation unit 615 (FIG. 18) of) The LDPC encoder 115 performs LDPC encoding (generation of the LDPC code), for example, using the parity check matrix of FIG. 27.

Here, the LDPC code generated using the parity check matrix of FIG. 27 is the LDPC code that has undergone the parity interleave, and thus it is unnecessary to perform the parity interleave on the LDPC code generated using the parity check matrix of FIG. 27 in the parity interleaver 23 (FIG. 9).

Figure 28:
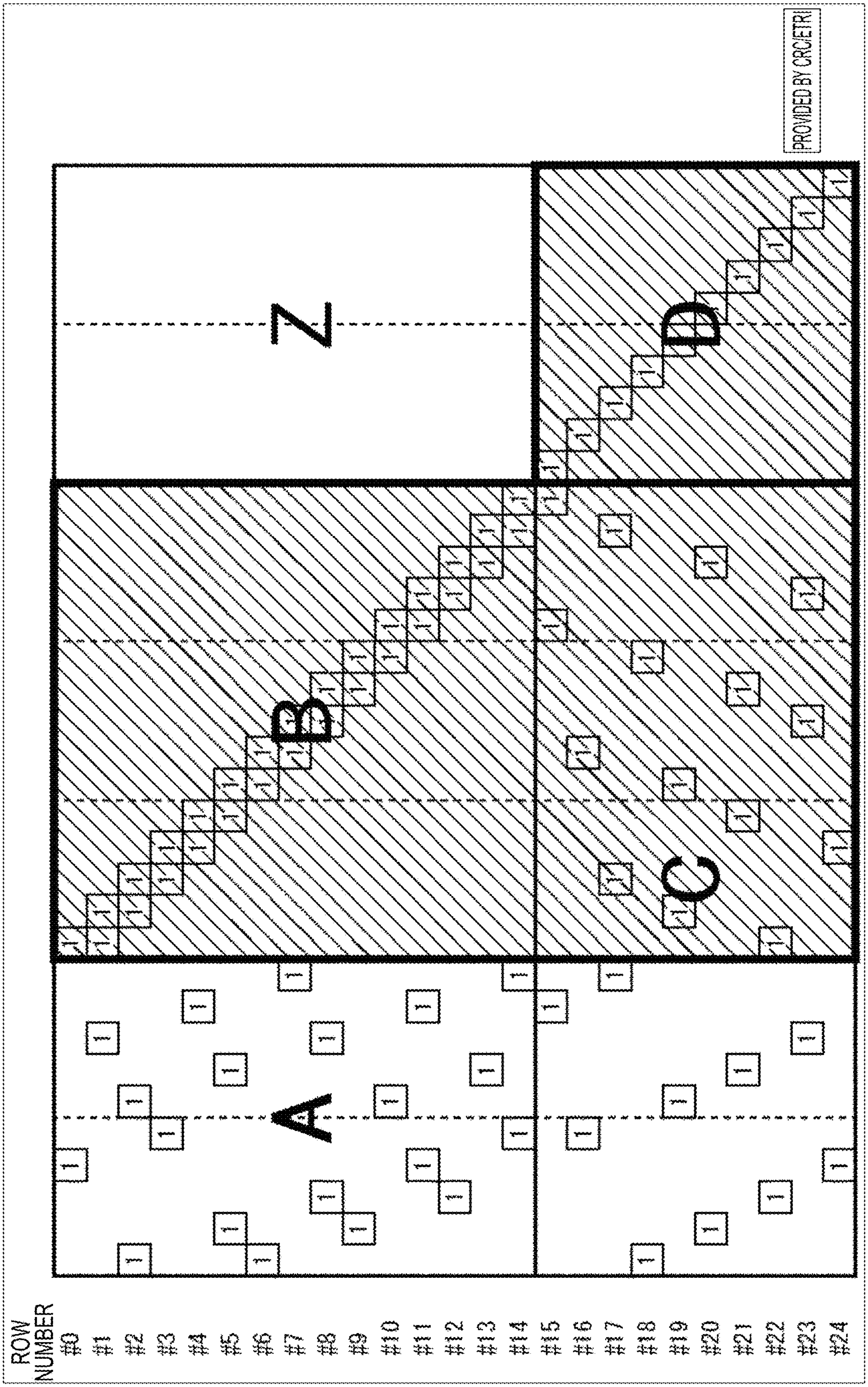
FIG. 28 is an illustration of a parity check matrix obtained by performing a column permutation serving as parity deinterleave for restoring parity interleave to an original state on a parity check matrix.

FIG. 28 is an illustration of the parity check matrix obtained by performing the column permutation serving as the parity deinterleave for restoring the parity interleave to an original state on the B matrix, the portion of the C matrix (the portion of the C matrix arranged below the B matrix), and the D matrix of the parity check matrix of FIG. 27.

The LDPC encoder 115 can perform LDPC encoding (generation of the LDPC code) using the parity check matrix of FIG. 28.

When the LDPC encoding is performed using the parity check matrix of FIG. 28, the LDPC code that does not undergo the parity interleave is obtained according to the LDPC encoding. Thus, when the LDPC encoding is performed using the parity check matrix of FIG. 28, the parity interleaver 23 (FIG. 9) performs the parity interleave.

Figure 29:
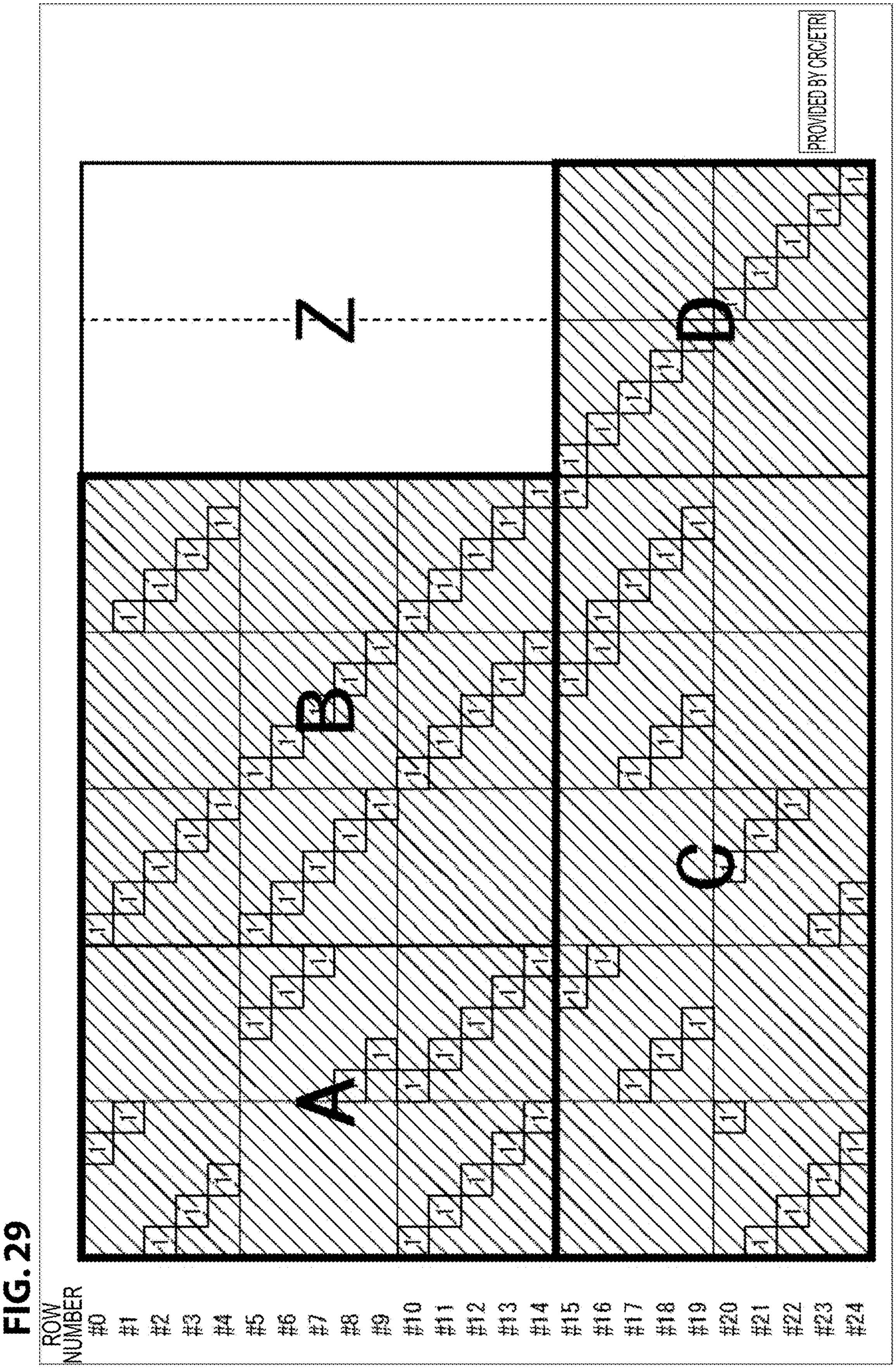
FIG. 29 is an illustration of a transformed parity check matrix obtained by performing a row permutation on a parity check matrix.

FIG. 29 is an illustration of the transformed parity check matrix obtained by performing the row permutation on the parity check matrix of FIG. 27.

As will be described later, the transformed parity check matrix is a matrix represented by a combination of a P×P unit matrix, a quasi unit matrix obtained by setting one or more is of the unit matrix to zero (0), a shift matrix obtained by cyclically shifting the unit matrix or the quasi unit matrix, a sum matrix serving as a sum of two or more matrices of the unit matrix, the quasi unit matrix, and the shifted matrix, and a P×P zero matrix.

As the transformed parity check matrix is used for decoding of the LDPC code, an architecture of performing P check node operations and P variable node operations at the same time can be employed for decoding the LDPC code as will be described later.

<New LDPC Code>

Incidentally, a terrestrial digital television broadcasting standard called ATSC 3.0 is currently pending.

In this regard, a novel LDPC code which can be used in ATSC 3.0 and other data transmission (hereinafter referred to as a new LDPC code) will be described.

For example, the LDPC code of the DVB scheme or the LDPC code of the ETRI scheme having the unit size P of 360, similarly to DVB-T.2 or the like, and corresponding to the parity check matrix having the cyclic structure can be employed as the new LDPC code.

The LDPC encoder 115 (FIGS. 8 and 18) can perform LDPC encoding for generating a new LDPC code using the parity check matrix obtained from the parity check matrix initial value table of the new LDPC code in which the code length N is 16 kbits or 64 kbits, and the encoding rate r is any of 5/15, 6,15, 7/15, 8/15, 9/15, 10/15, 11/15, 12/15, and 13/15.

In this case, the storage unit 602 of the LDPC encoder 115 (FIG. 8) stores the parity check matrix initial value of the new LDPC code.

FIG. 30 is an illustration of an example of a parity check matrix initial value table of the DVB scheme for a parity check matrix of a new LDPC code in which the code length N is 16 kbits, and the encoding rate r is 8/15 (hereinafter, also referred to as Sony symbol (16 k, 8/15)), proposed by the applicant of the present application.

FIG. 31 is an illustration of an example of a parity check matrix initial value table of the DVB scheme for a parity check matrix of a new LDPC code in which the code length N is 16 kbits, and the encoding rate r is 10/15 (hereinafter, also referred to as Sony symbol (16 k, 10/15)), proposed by the applicant of the present application.

Figure 32:
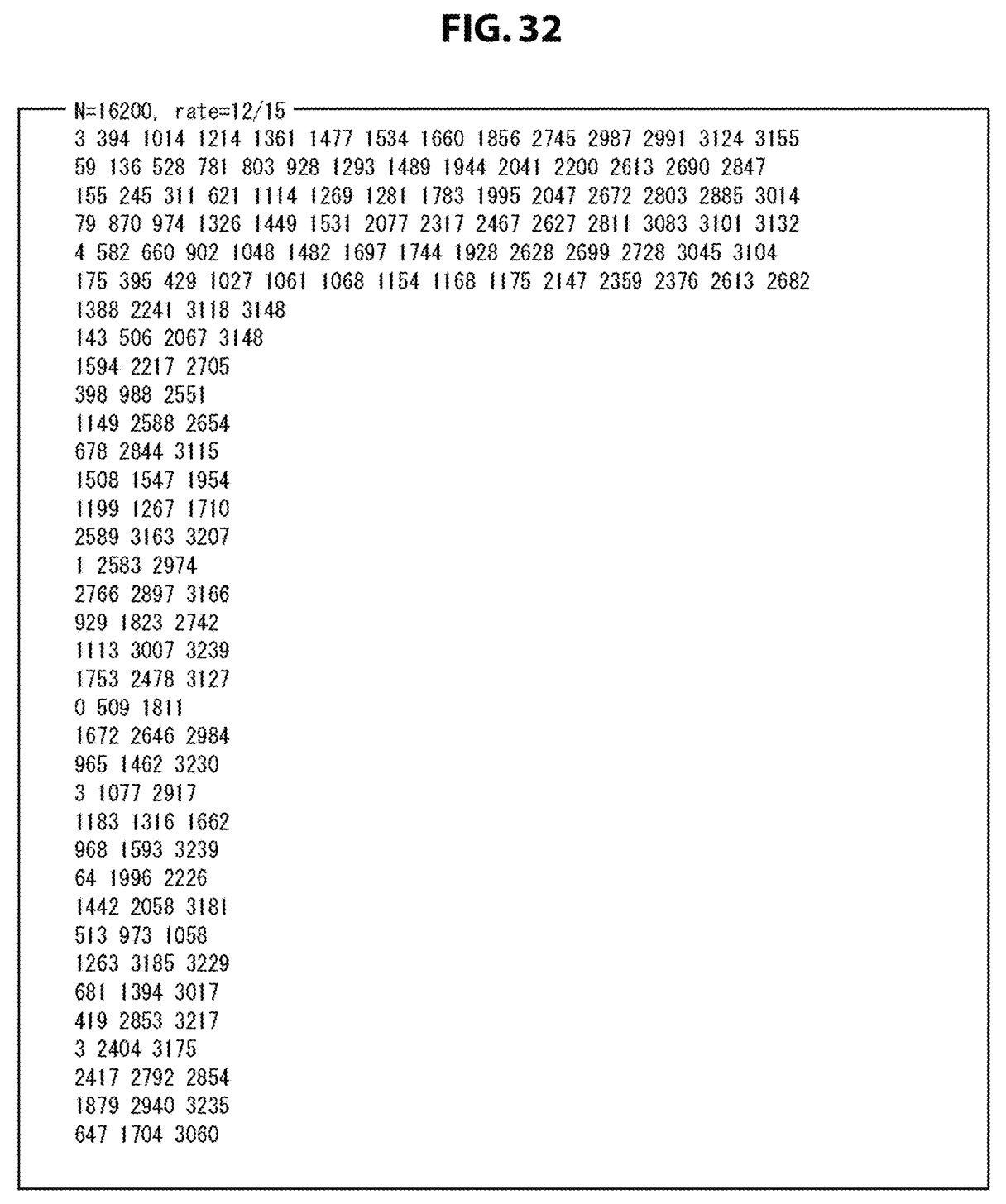

FIG. 32 is an illustration of an example of a parity check matrix initial value table of the DVB scheme for a parity check matrix of a new LDPC code in which the code length N is 16 kbits, and the encoding rate r is 12/15 (hereinafter, also referred to as Sony symbol (16 k, 12/15)), proposed by the applicant of the present application.

Figure 33:
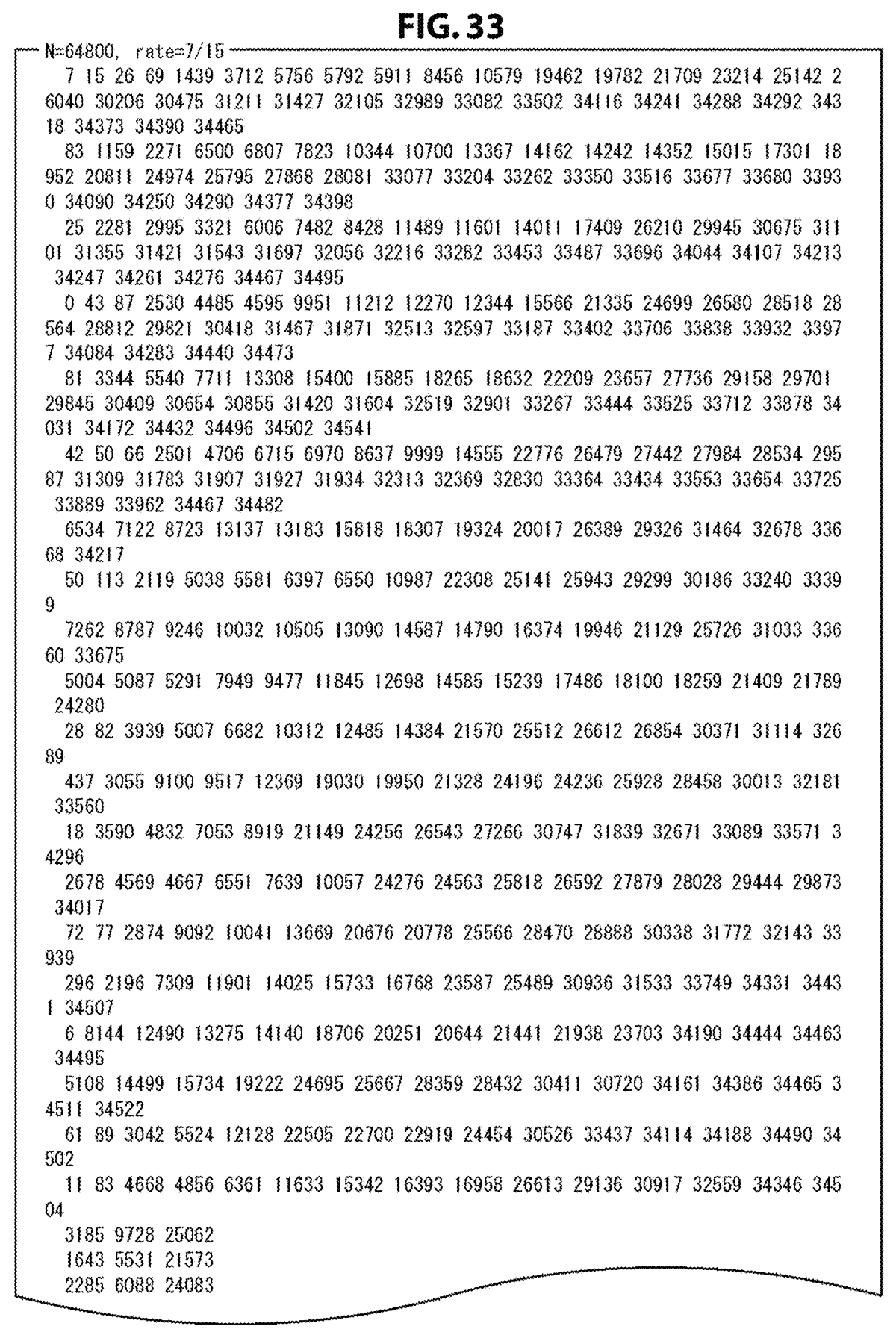
Figure 34:
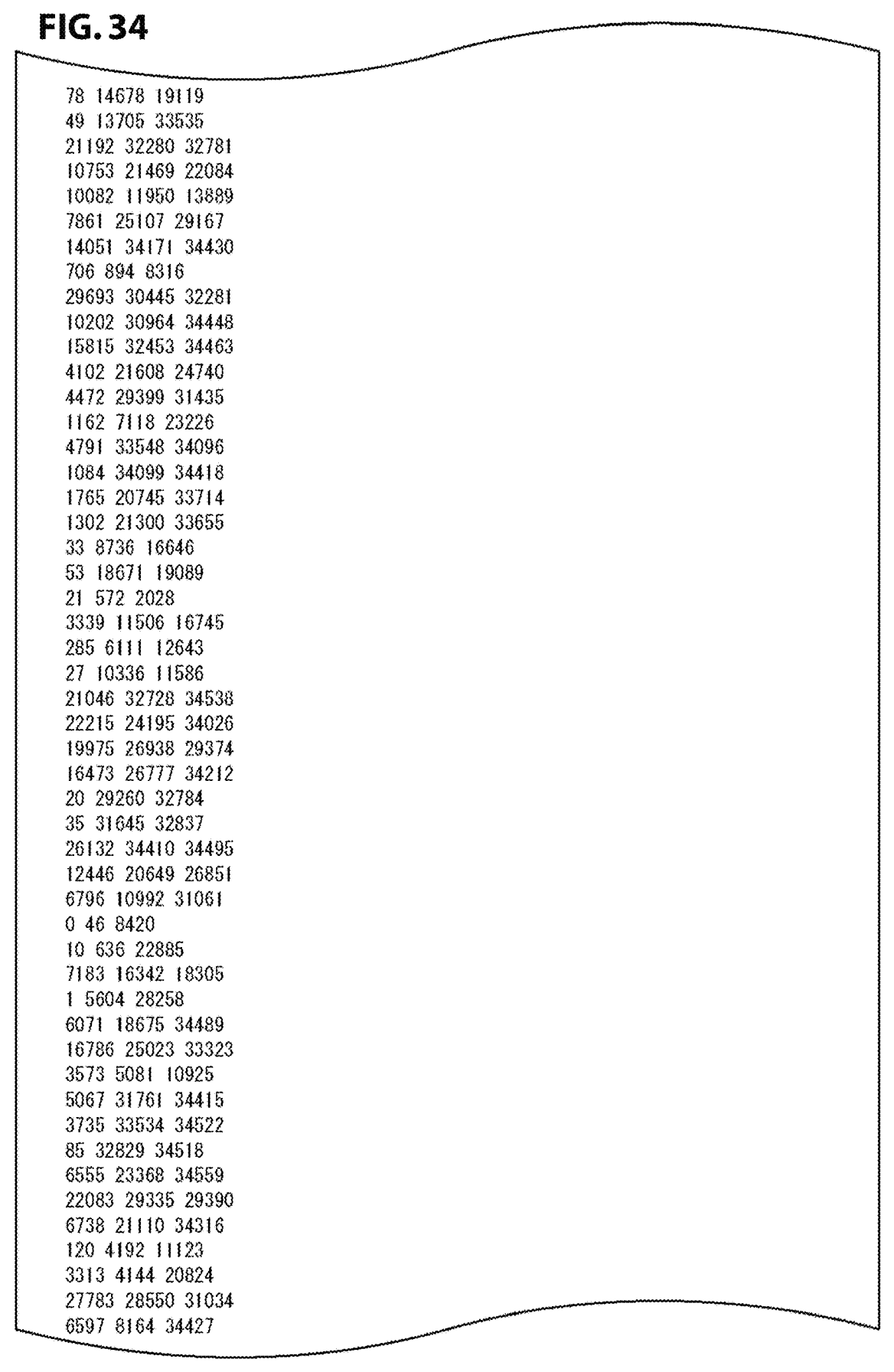
Figure 35:
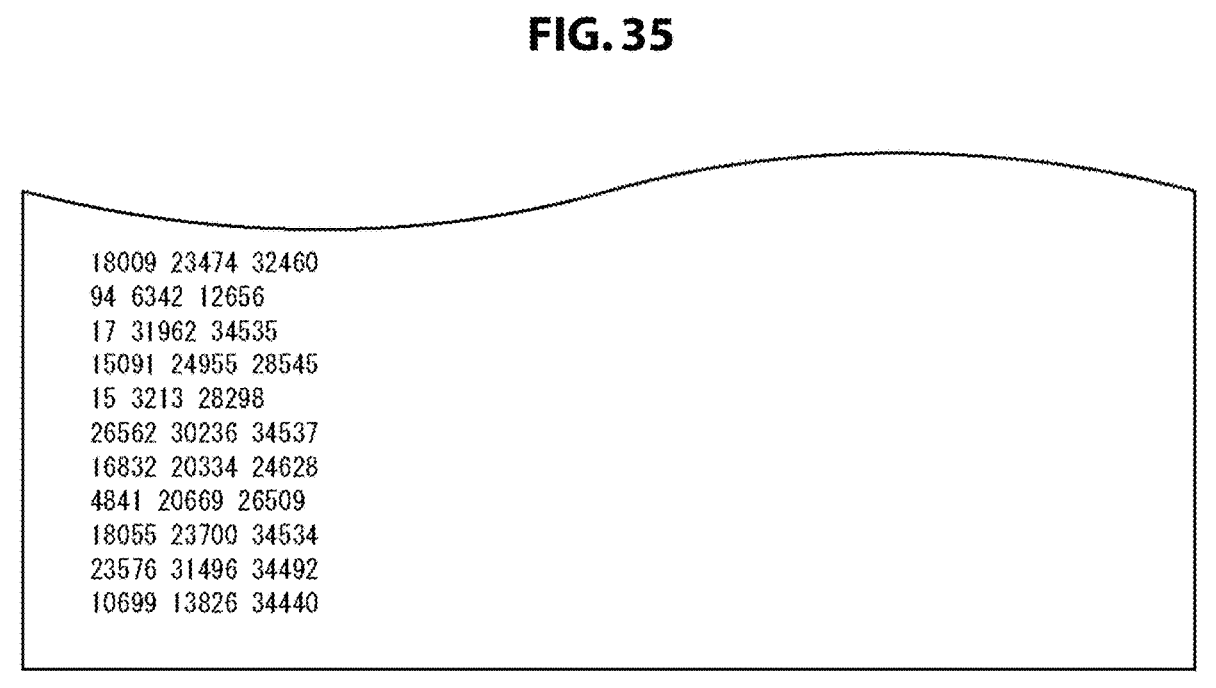

FIGS. 33, 34, and 35 are illustrations of an example of a parity check matrix initial value table of the DVB scheme for a parity check matrix of a new LDPC code in which the code length N is 64 kbits, and the encoding rate r is 7/15 (hereinafter, also referred to as Sony symbol (64 k, 7/15)), proposed by the applicant of the present application.

FIG. 34 is an illustration subsequent to FIG. 33, and FIG. 35 is an illustration subsequent to FIG. 34.

Figure 36:
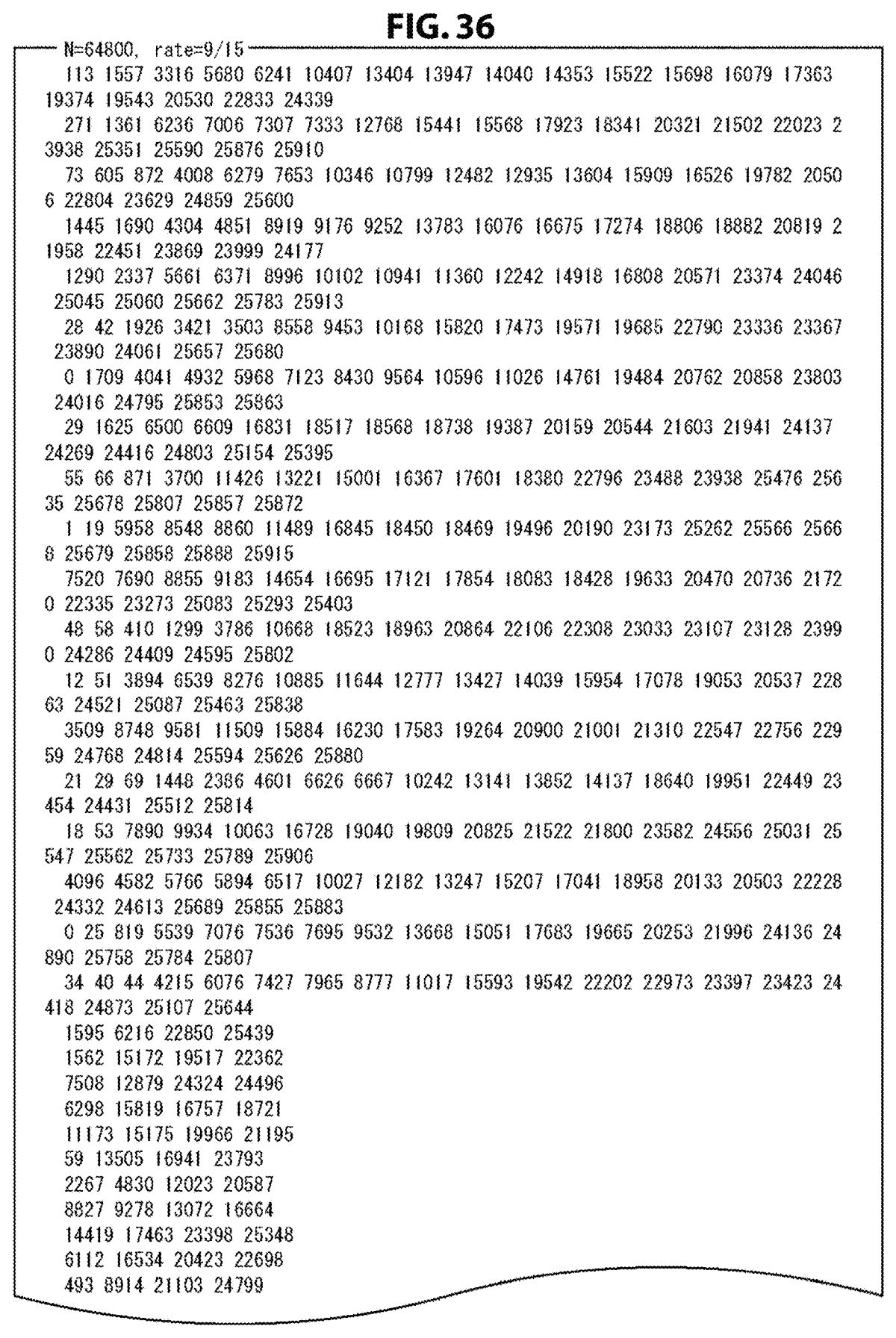
Figure 37:
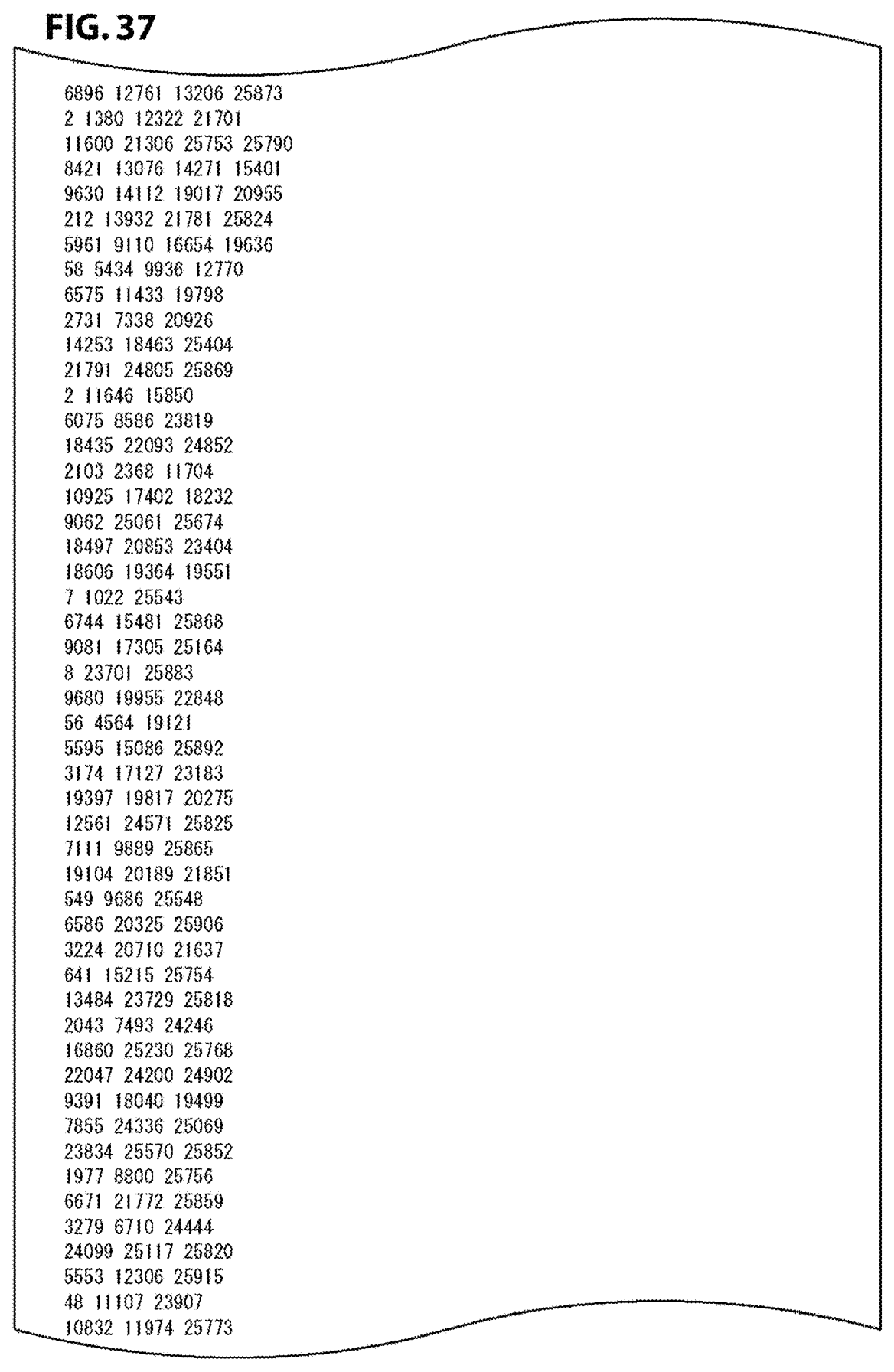
Figure 38:
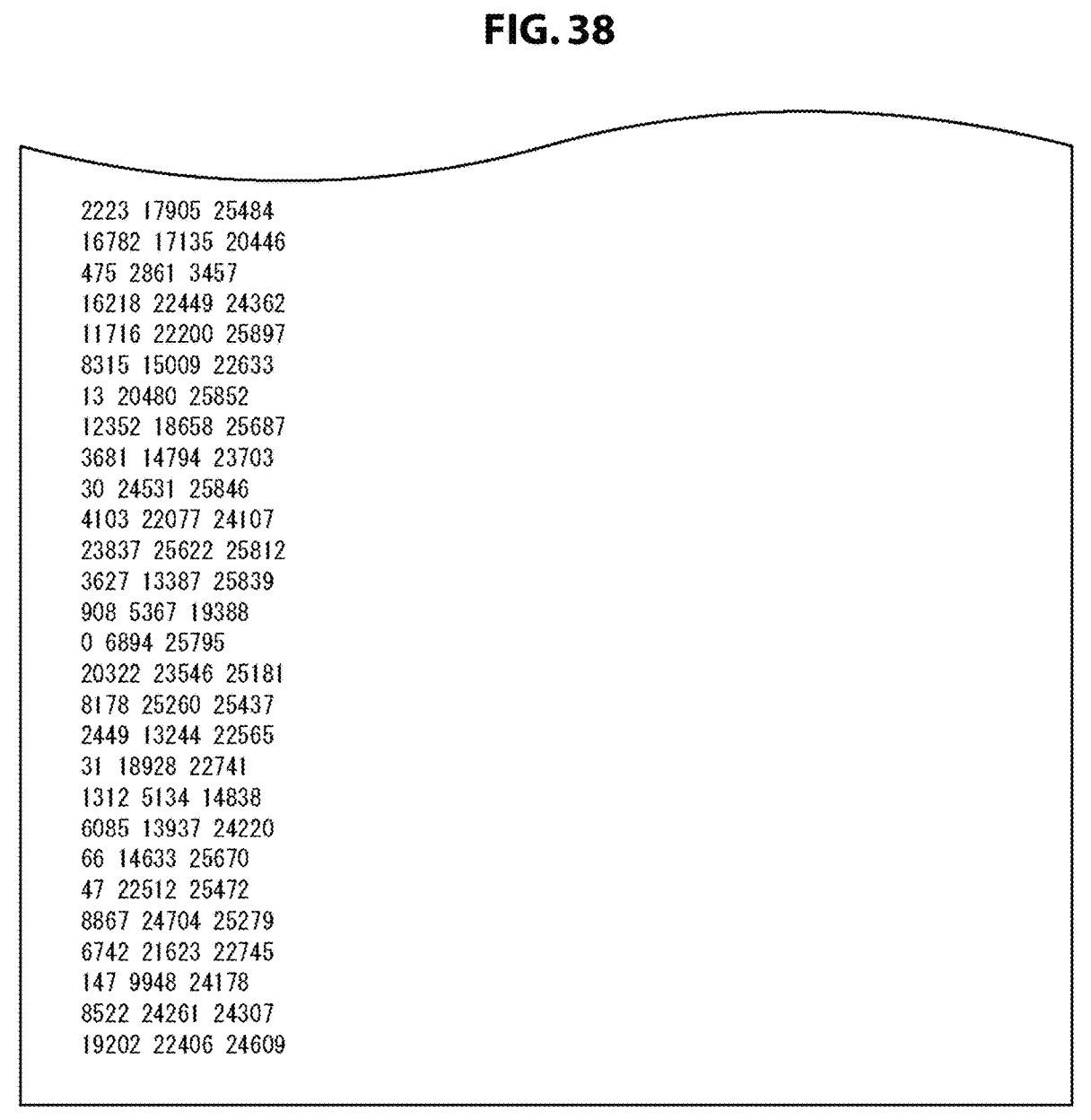

FIGS. 36, 37, and 38 are illustrations of an example of a parity check matrix initial value table of the DVB scheme for a parity check matrix of a new LDPC code in which the code length N is 64 kbits, and the encoding rate r is 9/15 (hereinafter, also referred to as Sony symbol (64 k, 9/15)), proposed by the applicant of the present application.

FIG. 37 is an illustration subsequent to FIG. 36, and FIG. 38 is an illustration subsequent to FIG. 37.

FIGS. 39, 40, 41, and 42 are illustrations of an example of a parity check matrix initial value table of the DVB scheme for a parity check matrix of a new LDPC code in which the code length N is 64 kbits, and the encoding rate r is 11/15 (hereinafter, also referred to as Sony symbol (64 k, 11/15)), proposed by the applicant of the present application.

Figure 39:
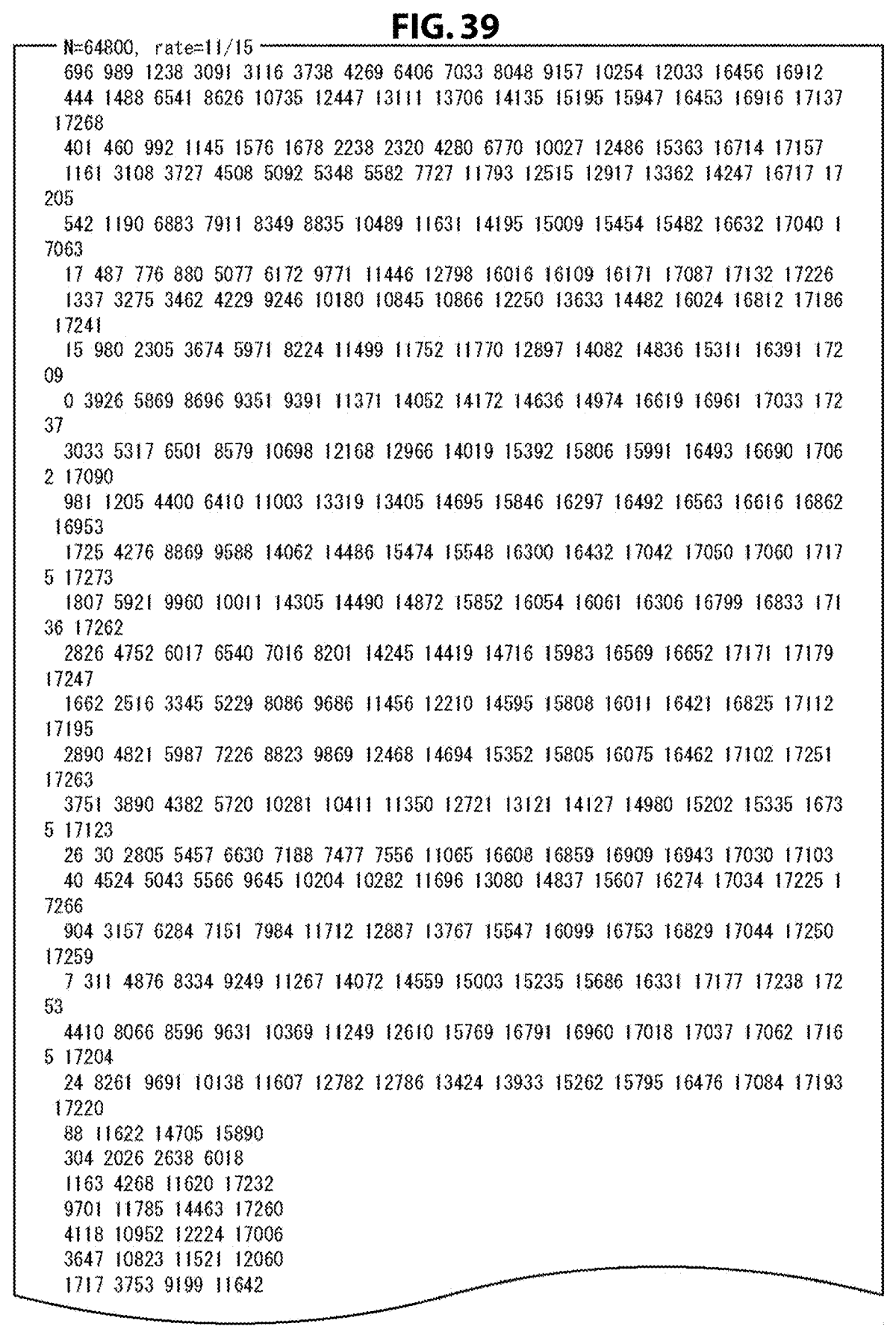
Figure 40:
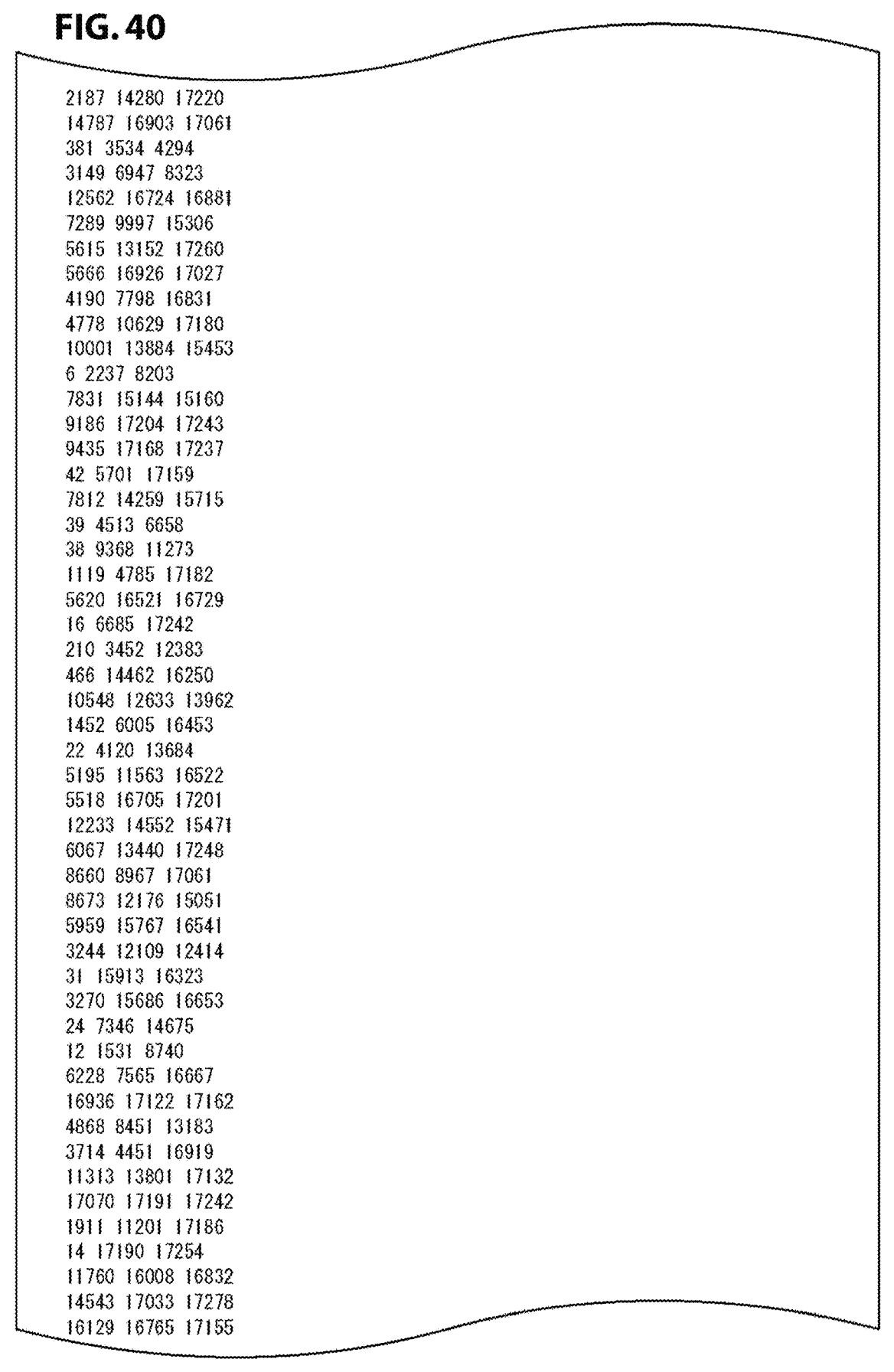
Figure 41:
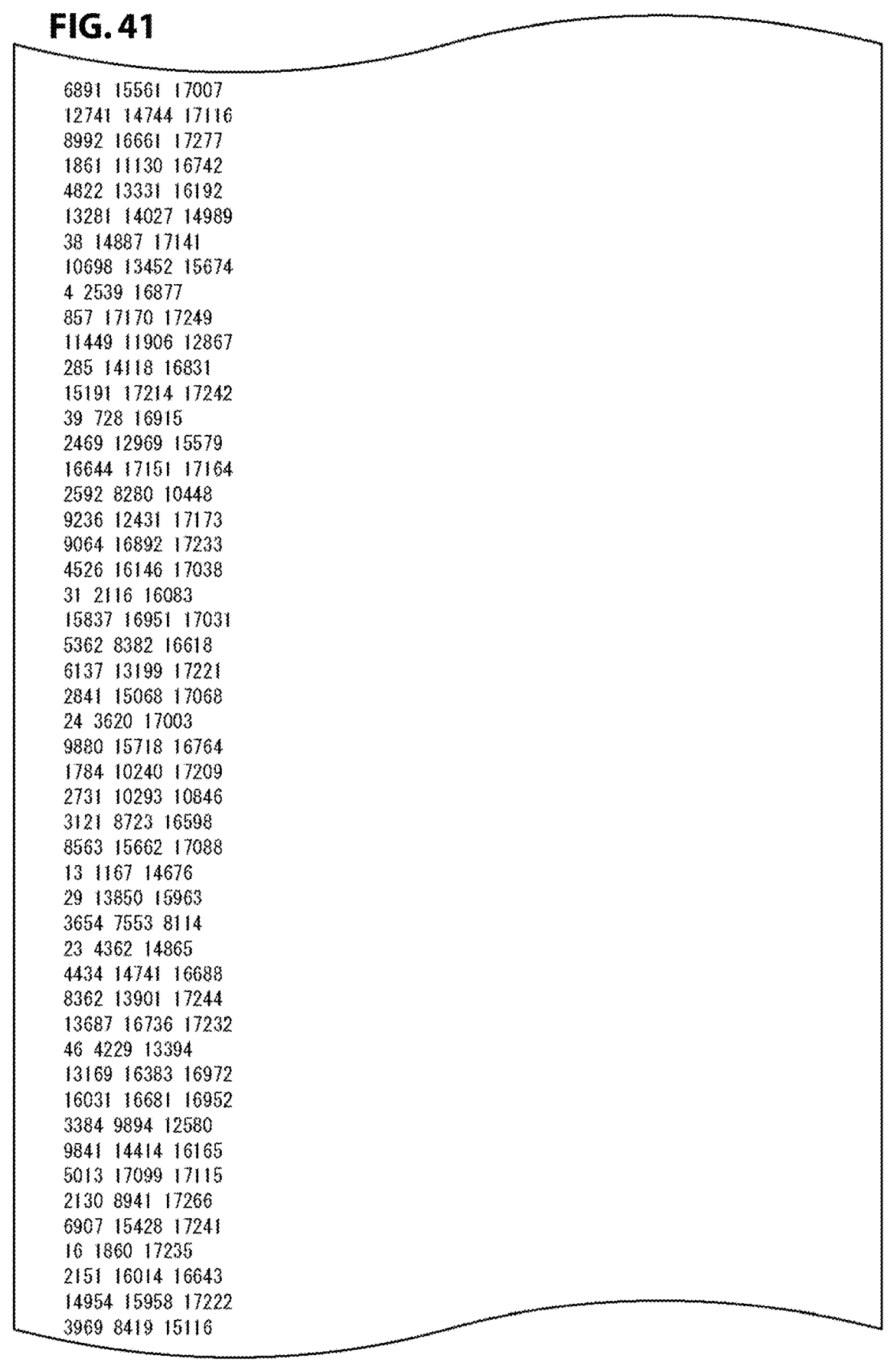

FIG. 40 is an illustration subsequent to FIG. 39, and FIG. 41 is an illustration subsequent to FIG. 40.

FIGS. 43, 44, 45, and 46 are illustrations of an example of a parity check matrix initial value table of the DVB scheme for a parity check matrix of a new LDPC code in which the code length N is 64 kbits, and the encoding rate r is 13/15 (hereinafter, also referred to as Sony symbol (64 k, 13/15)), proposed by the applicant of the present application.

Figure 43:
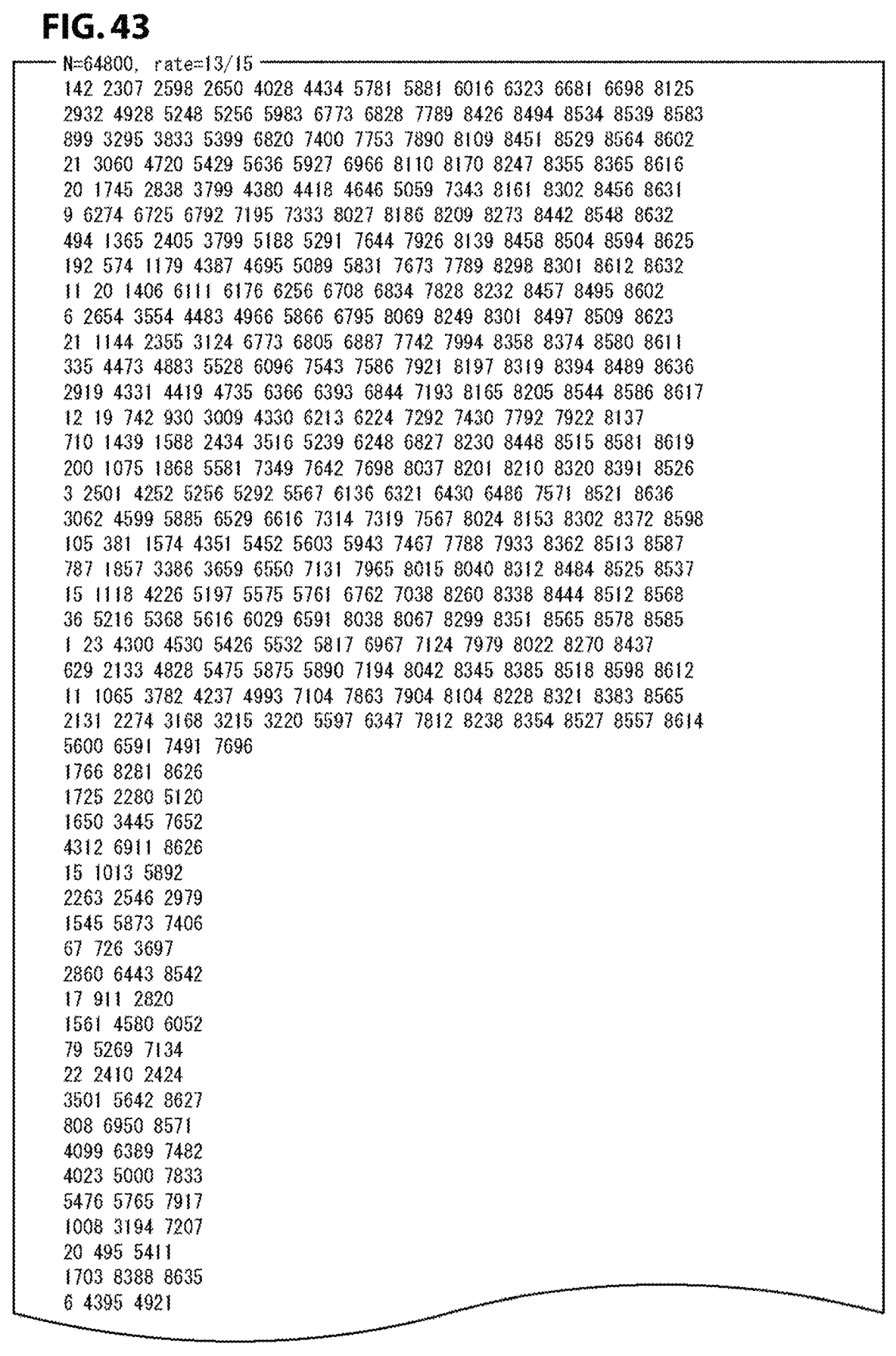
Figure 44:
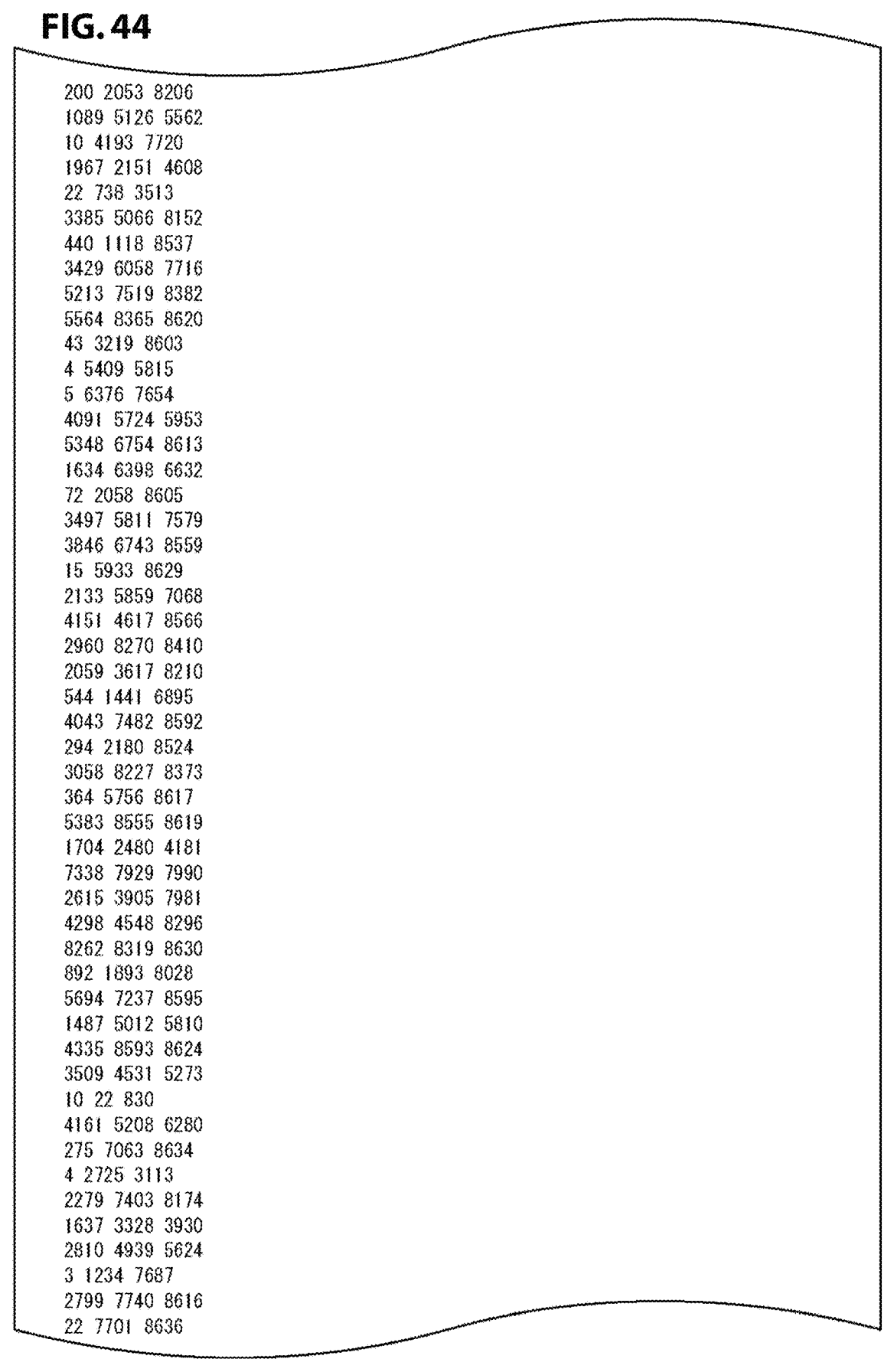
Figure 45:
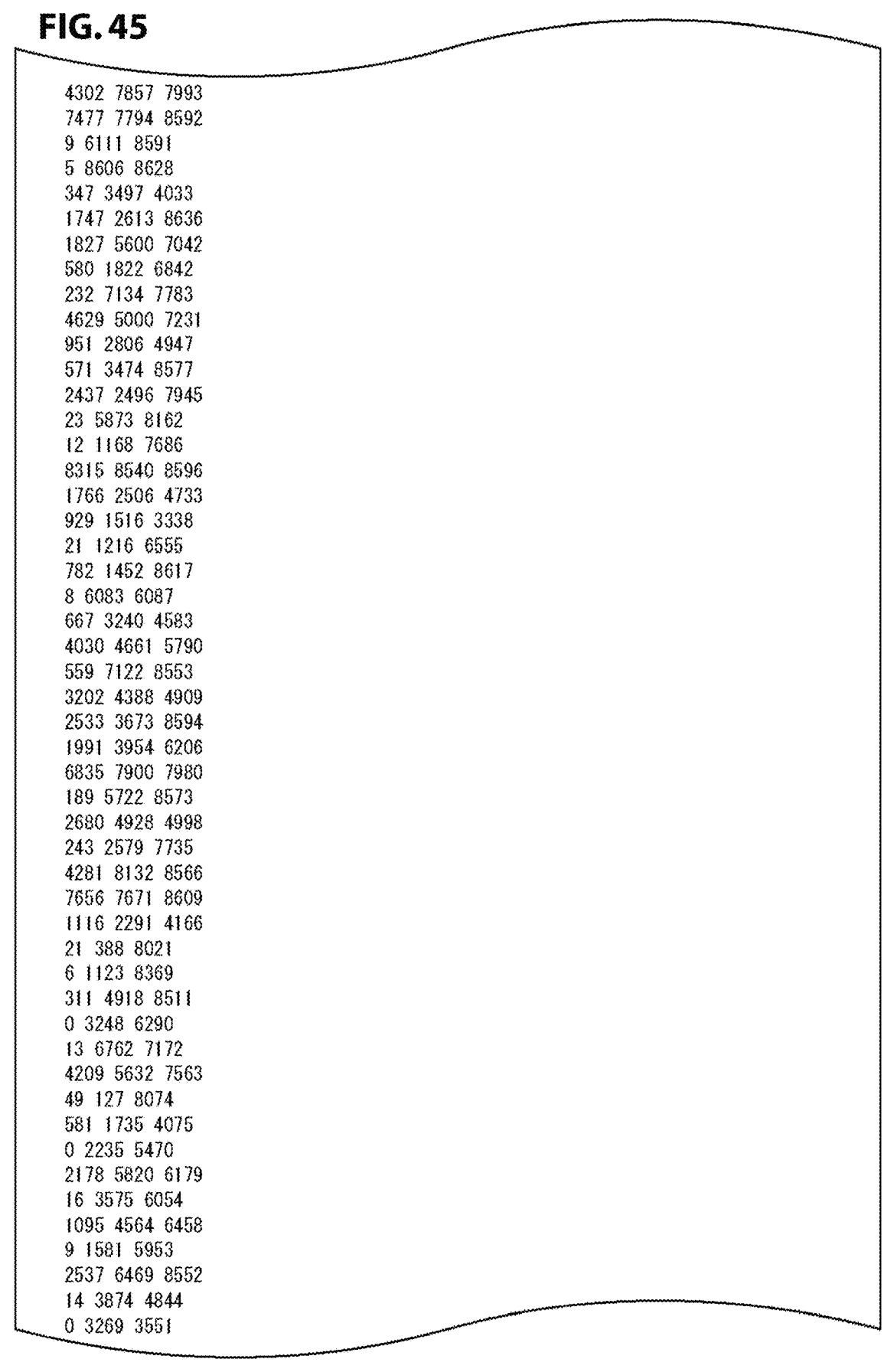

FIG. 44 is an illustration subsequent to FIG. 43, and FIG. 45 is an illustration subsequent to FIG. 44.

Figure 48:
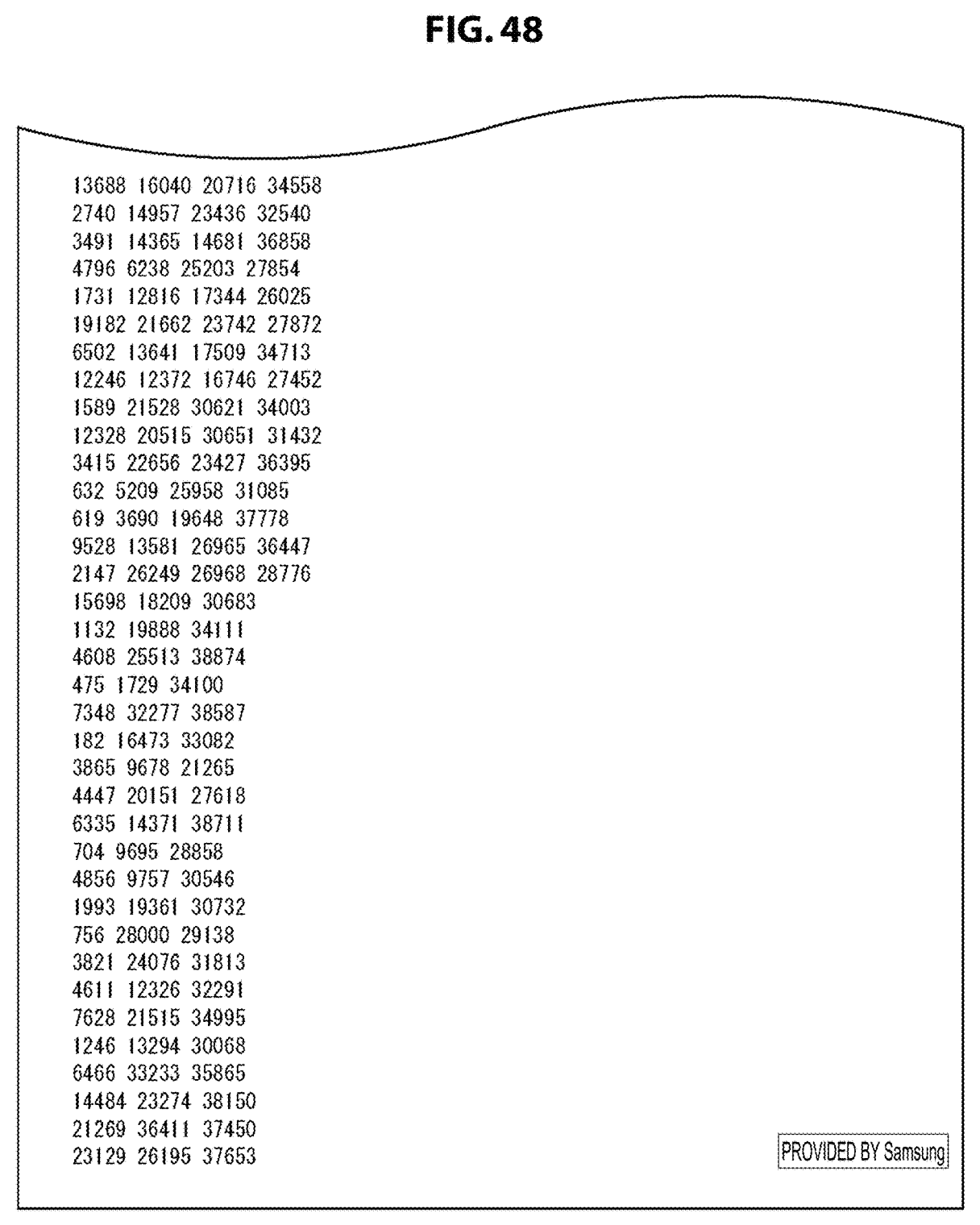

FIGS. 47 and 48 are illustrations of an example of a parity check matrix initial value table of the DVB scheme for a parity check matrix of a new LDPC code in which the code length N is 64 kbits, and the encoding rate r is 6/15 (hereinafter, also referred to as Samsung symbol (64 k, 6/15)), proposed by Samsung.

FIG. 48 is an illustration subsequent to FIG. 47.

Figure 50:
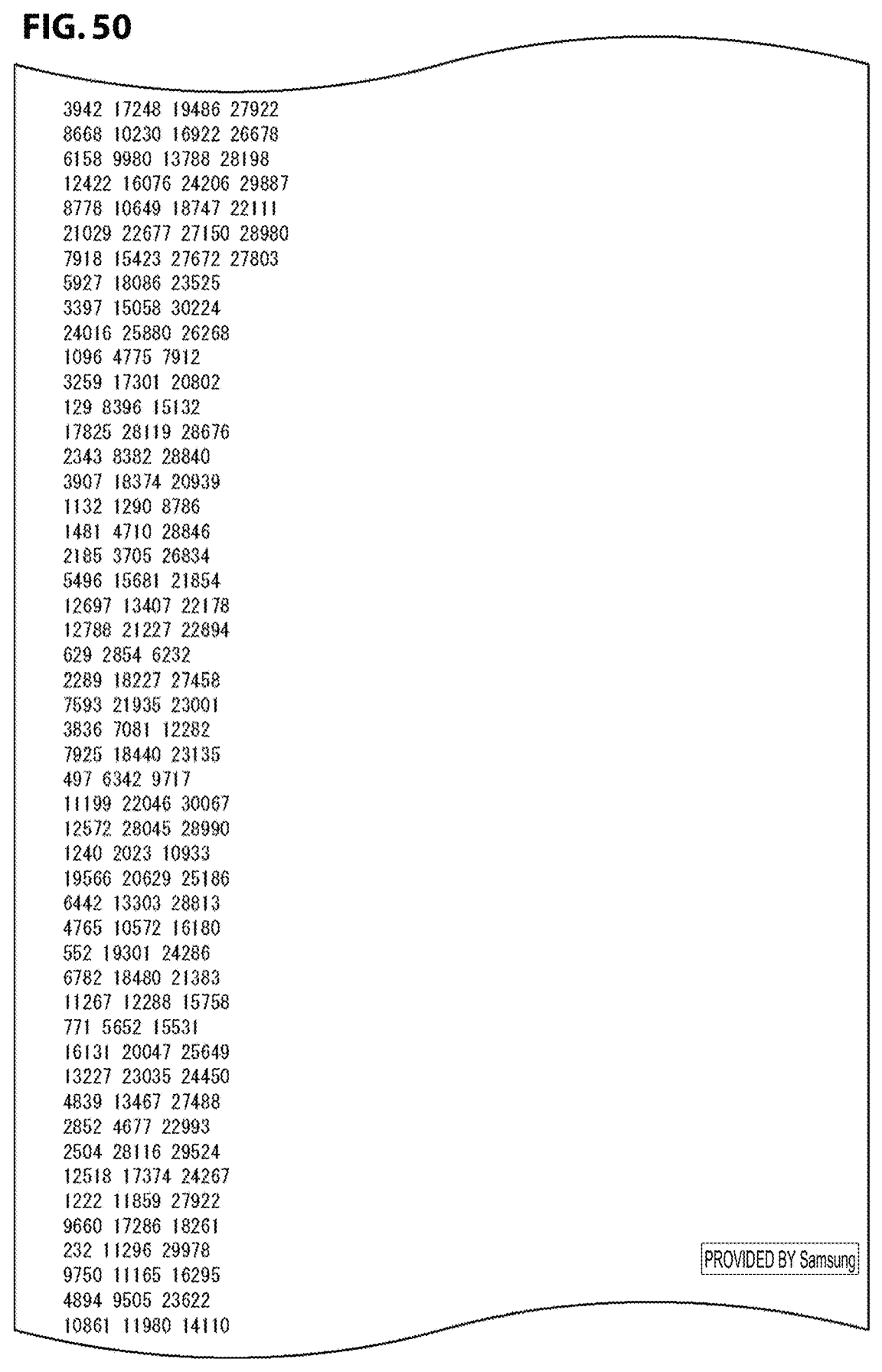
Figure 51:
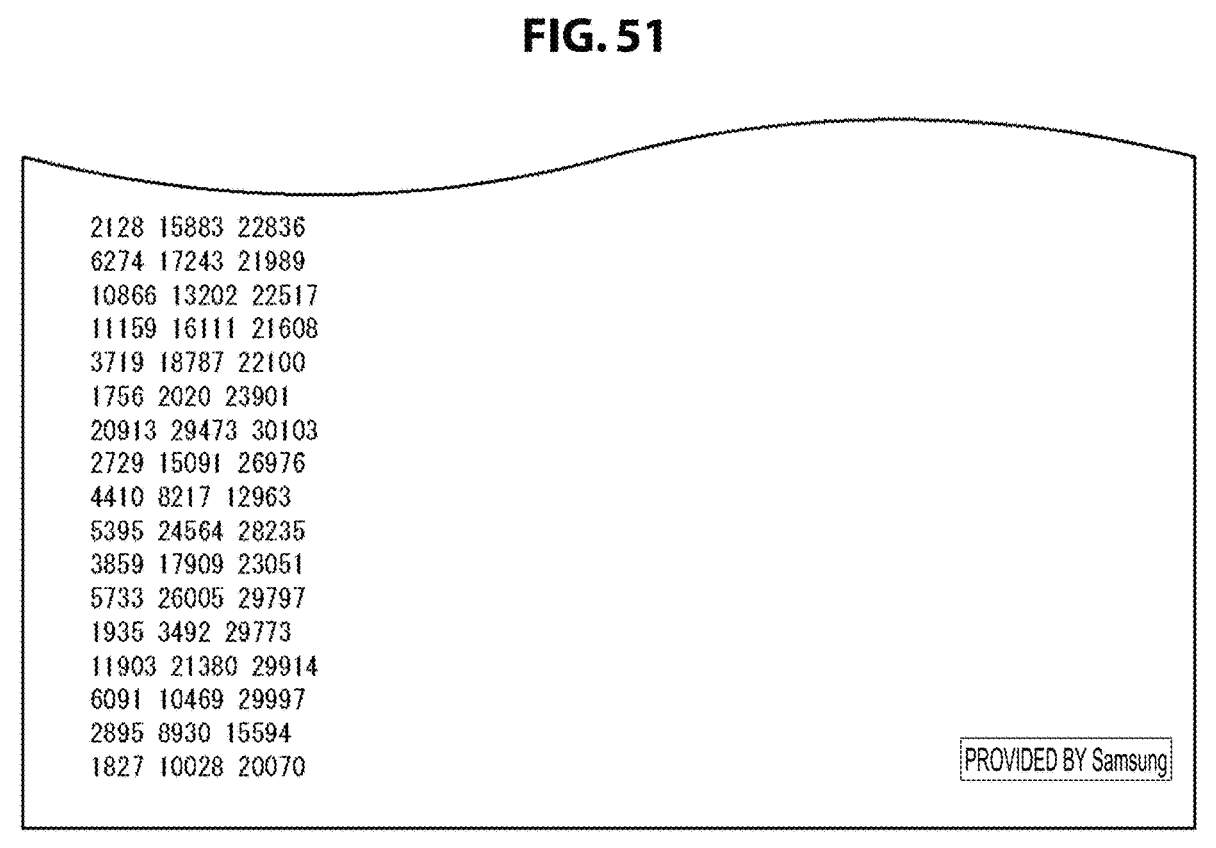

FIGS. 49, 50, and 51 are illustrations of an example of a parity check matrix initial value table of the DVB scheme for a parity check matrix of a new LDPC code in which the code length N is 64 kbits, and the encoding rate r is 8/15 (hereinafter, also referred to as Samsung symbol (64 k, 8/15)), proposed by Samsung.

FIG. 50 is an illustration subsequent to FIG. 49, and FIG. 51 is an illustration subsequent to FIG. 50.

Figure 53:
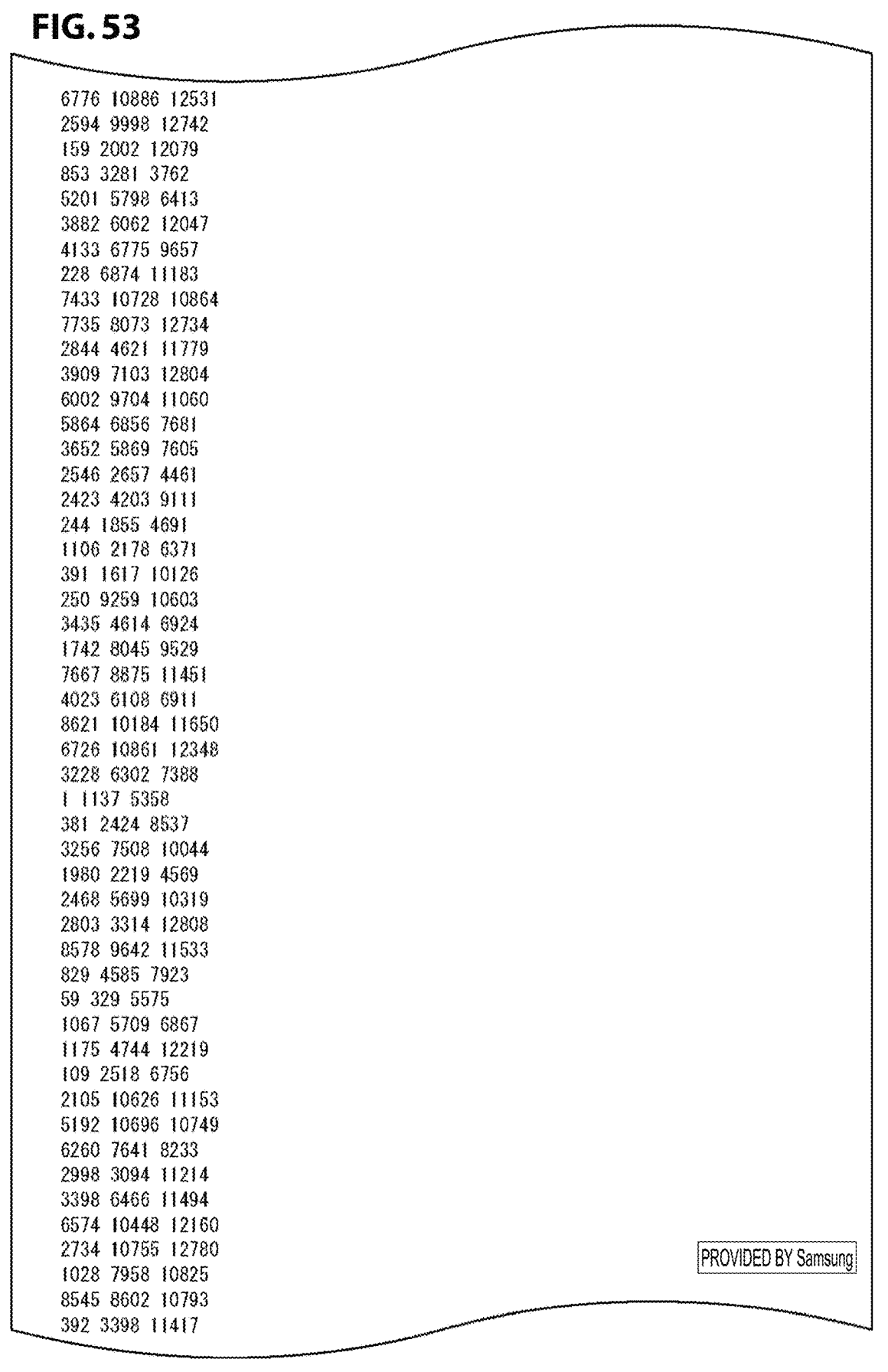
Figure 54:
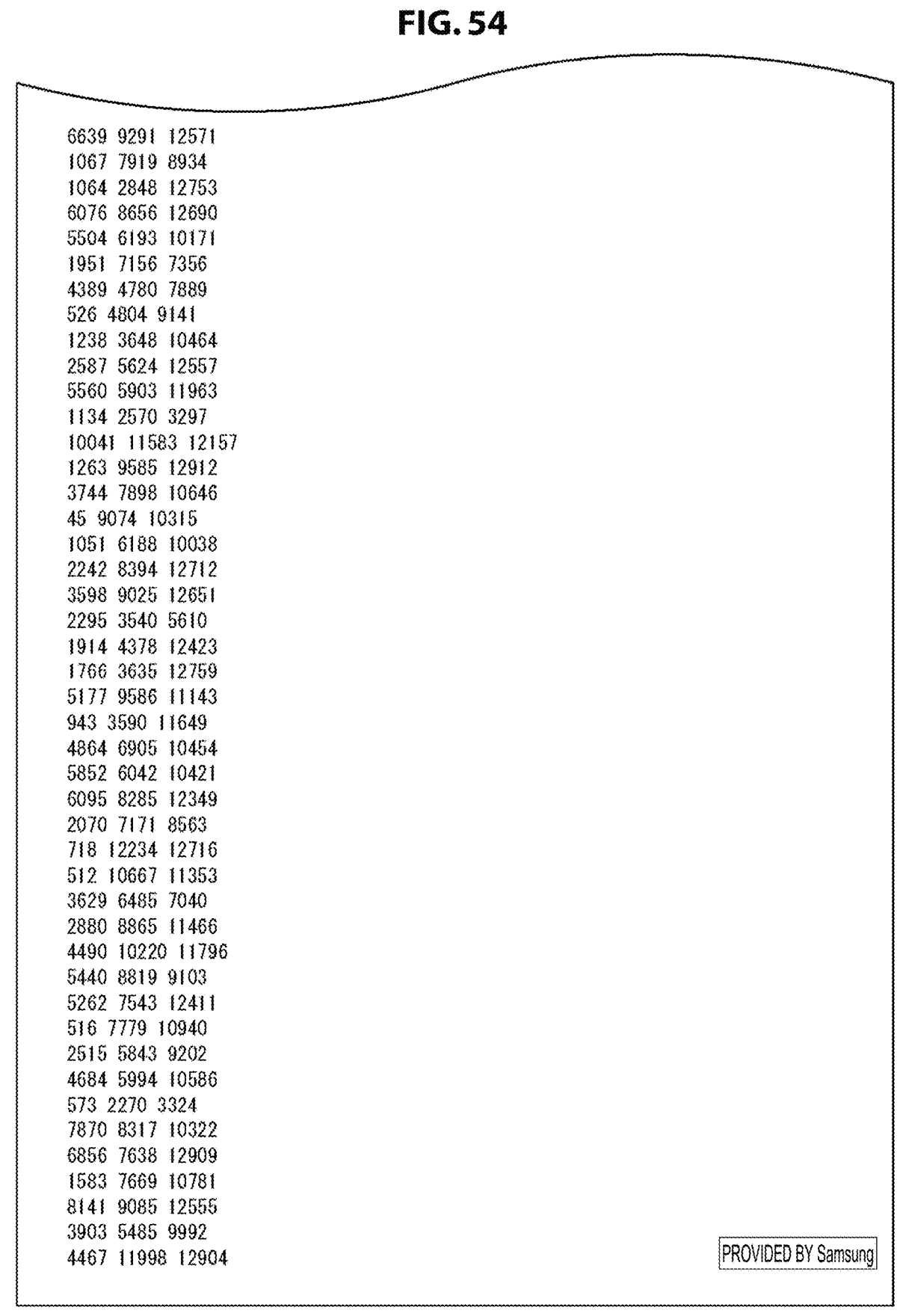

FIGS. 52, 53, and 54 are illustrations of an example of a parity check matrix initial value table of the DVB scheme for a parity check matrix of a new LDPC code in which the code length N is 64 kbits, and the encoding rate r is 12/15 (hereinafter, also referred to as Samsung symbol (64 k, 12/15)), proposed by Samsung.

FIG. 53 is an illustration subsequent to FIG. 52, and FIG. 54 is an illustration subsequent to FIG. 53.

FIG. 55 is an illustration of an example of a parity check matrix initial value table of the DVB scheme for a parity check matrix of a new LDPC code in which the code length N is 16 kbits, and the encoding rate r is 6/15 (hereinafter, also referred to as LGE symbol (16 k, 6/15)), proposed by LG Electronics Inc.

FIG. 56 is an illustration of an example of a parity check matrix initial value table of the DVB scheme for a parity check matrix of a new LDPC code in which the code length N is 16 kbits, and the encoding rate r is 7/15 (hereinafter, also referred to as LGE symbol (16 k, 7/15)), proposed by LG Electronics Inc.

FIG. 57 is an illustration of an example of a parity check matrix initial value table of the DVB scheme for a parity check matrix of a new LDPC code in which the code length N is 16 kbits, and the encoding rate r is 9/15 (hereinafter, also referred to as LGE symbol (16 k, 9/15)), proposed by LG Electronics Inc.

FIG. 58 is an illustration of an example of a parity check matrix initial value table of the DVB scheme for a parity check matrix of a new LDPC code in which the code length N is 16 kbits, and the encoding rate r is 11/15 (hereinafter, also referred to as LGE symbol (16 k, 11/15)), proposed by LG Electronics Inc.

FIG. 59 is an illustration of an example of a parity check matrix initial value table of the DVB scheme for a parity check matrix of a new LDPC code in which the code length N is 16 kbits, and the encoding rate r is 13/15 (hereinafter, also referred to as LGE symbol (16 k, 13/15)), proposed by LG Electronics Inc.

Figure 61:
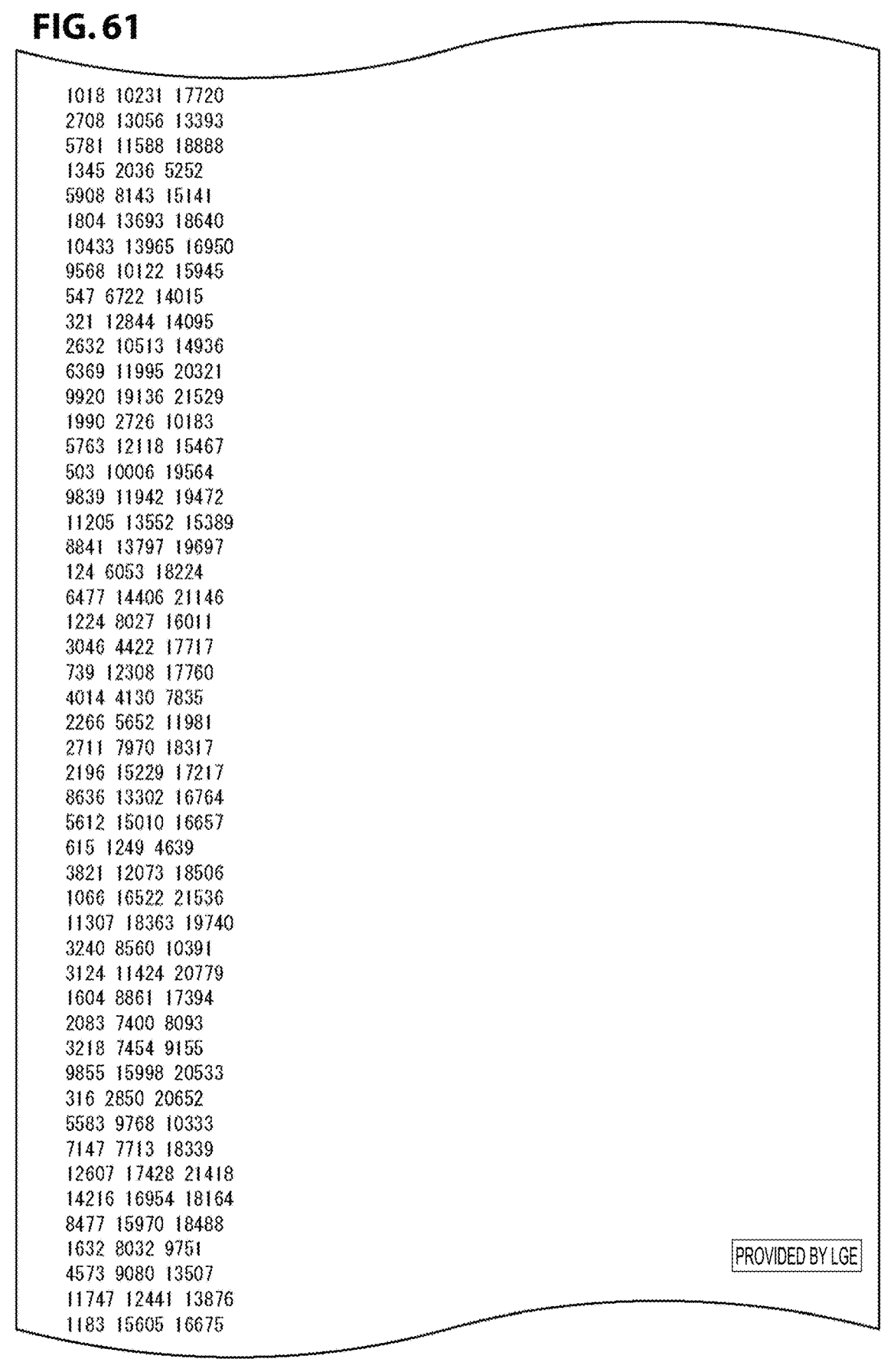
Figure 62:
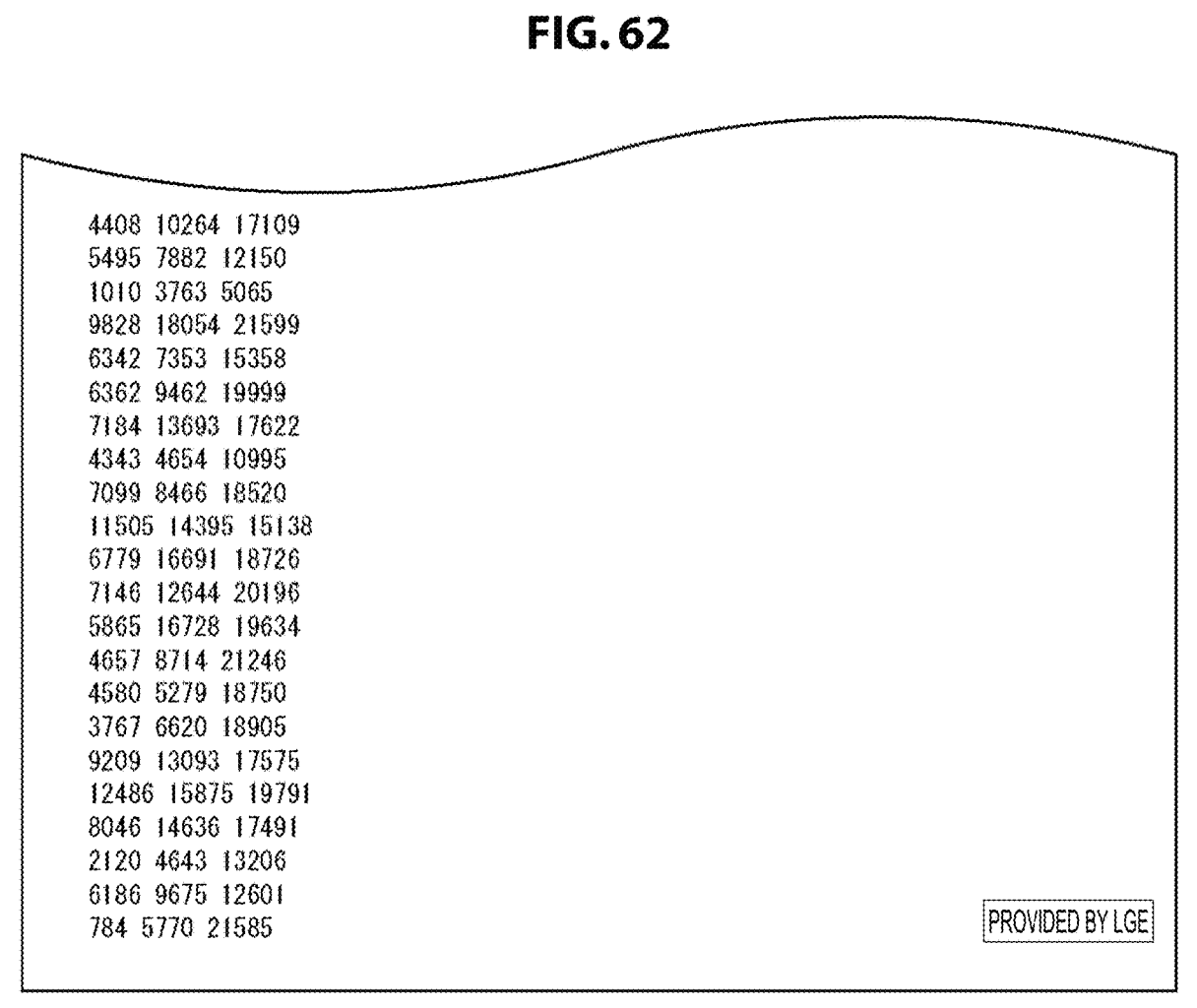

FIGS. 60, 61, and 62 are an illustrations of an example of a parity check matrix initial value table of the DVB scheme for a parity check matrix of a new LDPC code in which the code length N is 64 kbits, and the encoding rate r is 10/15 (hereinafter, also referred to as LGE symbol (64 k, 10/15)), proposed by LG Electronics Inc.

FIG. 61 is an illustration subsequent to FIG. 60, and FIG. 62 is an illustration subsequent to FIG. 61.

Figure 64:
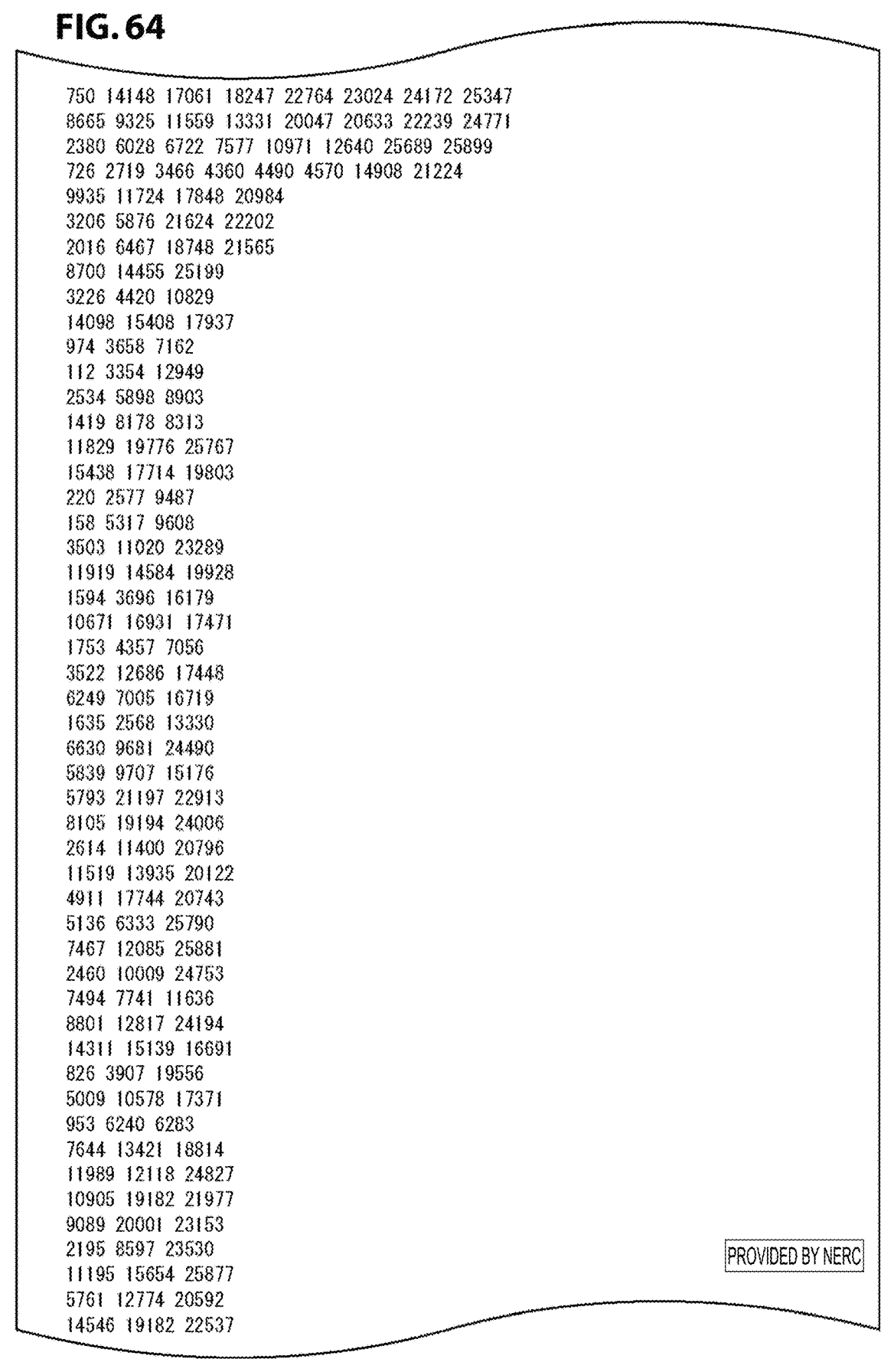
Figure 65:
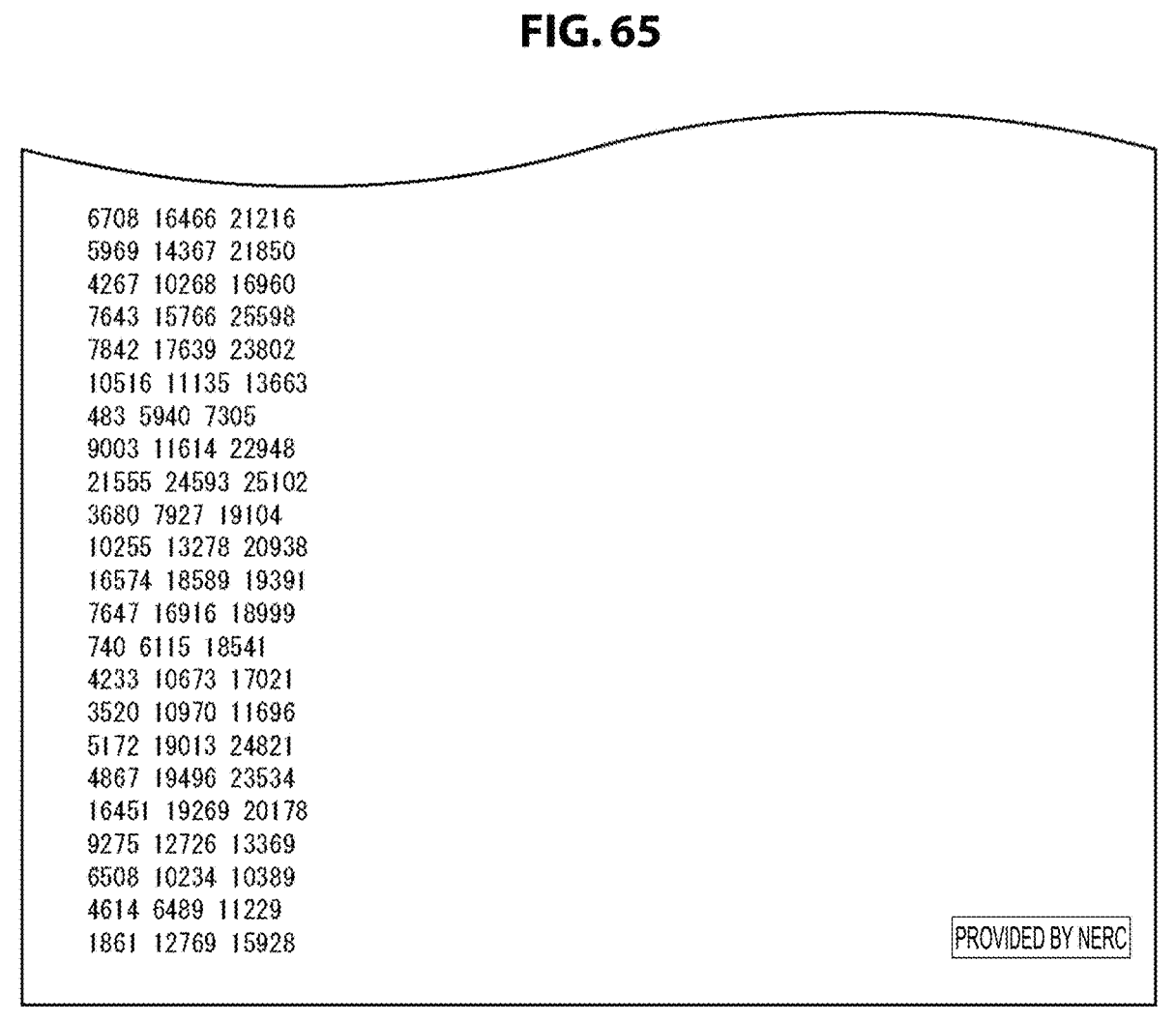

FIGS. 63, 64, and 65 are illustrations of an example of a parity check matrix initial value table of the DVB scheme for a parity check matrix of a new LDPC code in which the code length N is 64 kbits, and the encoding rate r is 9/15 (hereinafter, also referred to as NERC symbol (64 k, 9/15)), proposed by NERC.

FIG. 64 is an illustration subsequent to FIG. 63, and FIG. 65 is an illustration subsequent to FIG. 64.

FIG. 66 is an illustration of an example of a parity check matrix initial value table of the ETRI scheme for a parity check matrix of a new LDPC code in which the code length N is 16 kbits, and the encoding rate r is 5/15 (hereinafter, also referred to as ETRI symbol (16 k, 5/15)), proposed by CRC/ETRI.

Figure 68:
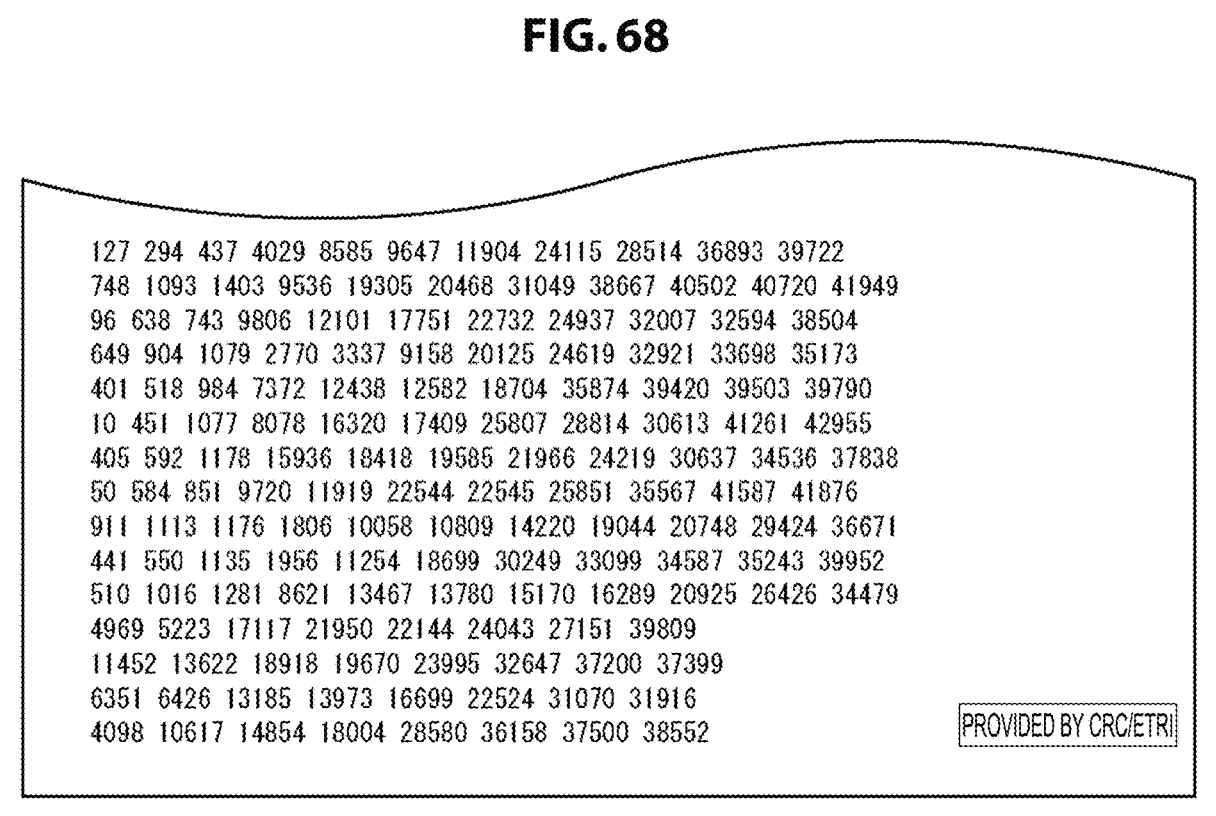

FIGS. 67 and 68 are illustrations of an example of a parity check matrix initial value table of the ETRI scheme for a parity check matrix of a new LDPC code in which the code length N is 64 kbits, and the encoding rate r is 5/15 (hereinafter, also referred to as ETRI symbol (64 k, 5/15)), proposed by CRC/ETRI.

FIG. 68 is an illustration subsequent to FIG. 67.

Figure 70:
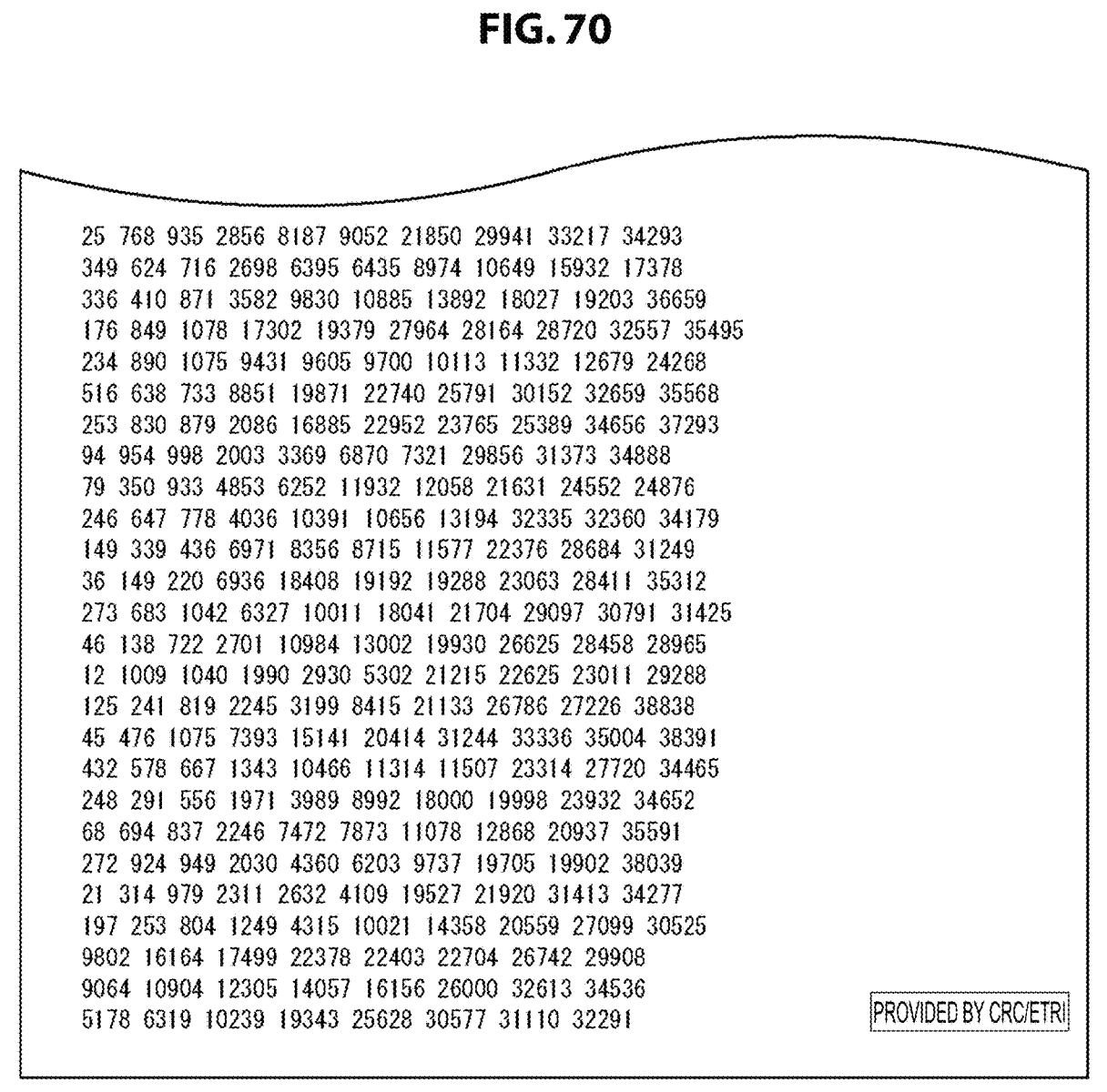

FIGS. 69 and 70 are illustrations of an example of a parity check matrix initial value table of the ETRI scheme for a parity check matrix of a new LDPC code in which the code length N is 64 kbits, and the encoding rate r is 6/15 (hereinafter, also referred to as ETRI symbol (64 k, 6/15)), proposed by CRC/ETRI.

FIG. 70 is an illustration subsequent to FIG. 69.

Figure 72:
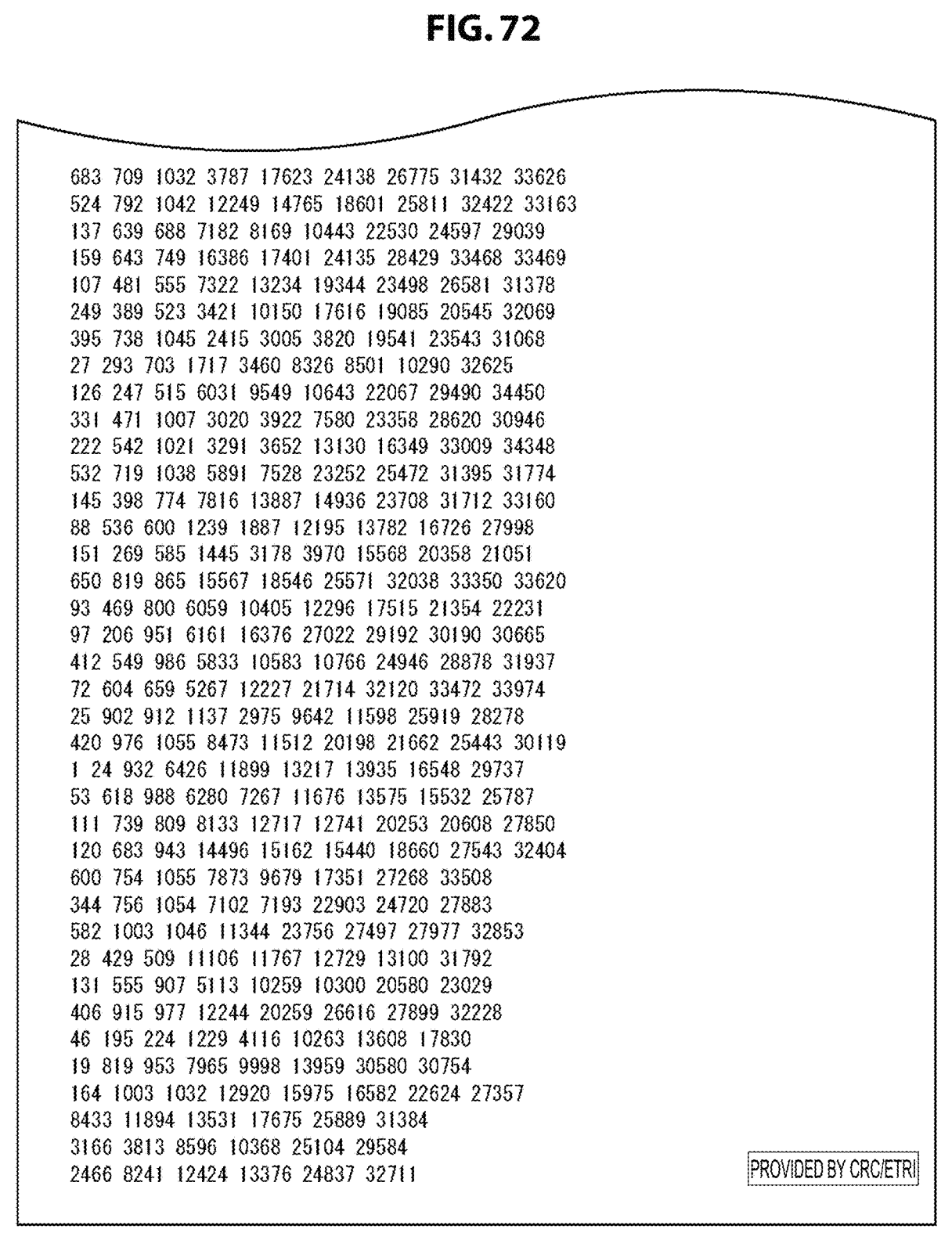

FIGS. 71 and 72 are illustrations of an example of a parity check matrix initial value table of the ETRI scheme for a parity check matrix of a new LDPC code in which the code length N is 64 kbits, and the encoding rate r is 7/15 (hereinafter, also referred to as ETRI symbol (64 k, 7/15)), proposed by CRC/ETRI.

FIG. 72 is an illustration subsequent to FIG. 71.

Among the new LDPC codes, the Sony symbol is an LDPC code having particularly excellent performance.

Here, the LDPC code of good performance is an LDPC code obtained from an appropriate parity check matrix H.

The appropriate parity check matrix H is, for example, a parity check matrix that satisfies a predetermined condition to make BER (and FER) smaller when an LDPC code obtained from the parity check matrix H is transmitted at low $E_s/N_0$ or $E_b/N_o$ (signal-to-noise power ratio per bit).

For example, the appropriate parity check matrix H can be found by performing simulation to measure BER when LDPC codes obtained from various parity check matrices that satisfy a predetermined condition are transmitted at low $E_s/N_o$.

As a predetermined condition to be satisfied by the appropriate parity check matrix H, for example, an analysis result obtained by a code performance analysis method called density evolution (Density Evolution) is excellent, and a loop of elements of 1 does not exist, which is called cycle 4, and so on.

Here, in the information matrix $H_A$, it is known that the decoding performance of LDPC code is deteriorated when elements of 1 are dense like cycle 4, and therefore it is requested that cycle 4 does not exist, as a predetermined condition to be satisfied by the appropriate parity check matrix H.

Here, the predetermined condition to be satisfied by the appropriate parity check matrix H can be arbitrarily determined from the viewpoint of the improvement in the decoding performance of LDPC code and the facilitation (simplification) of decoding processing of LDPC code, and so on.

Figure 73:
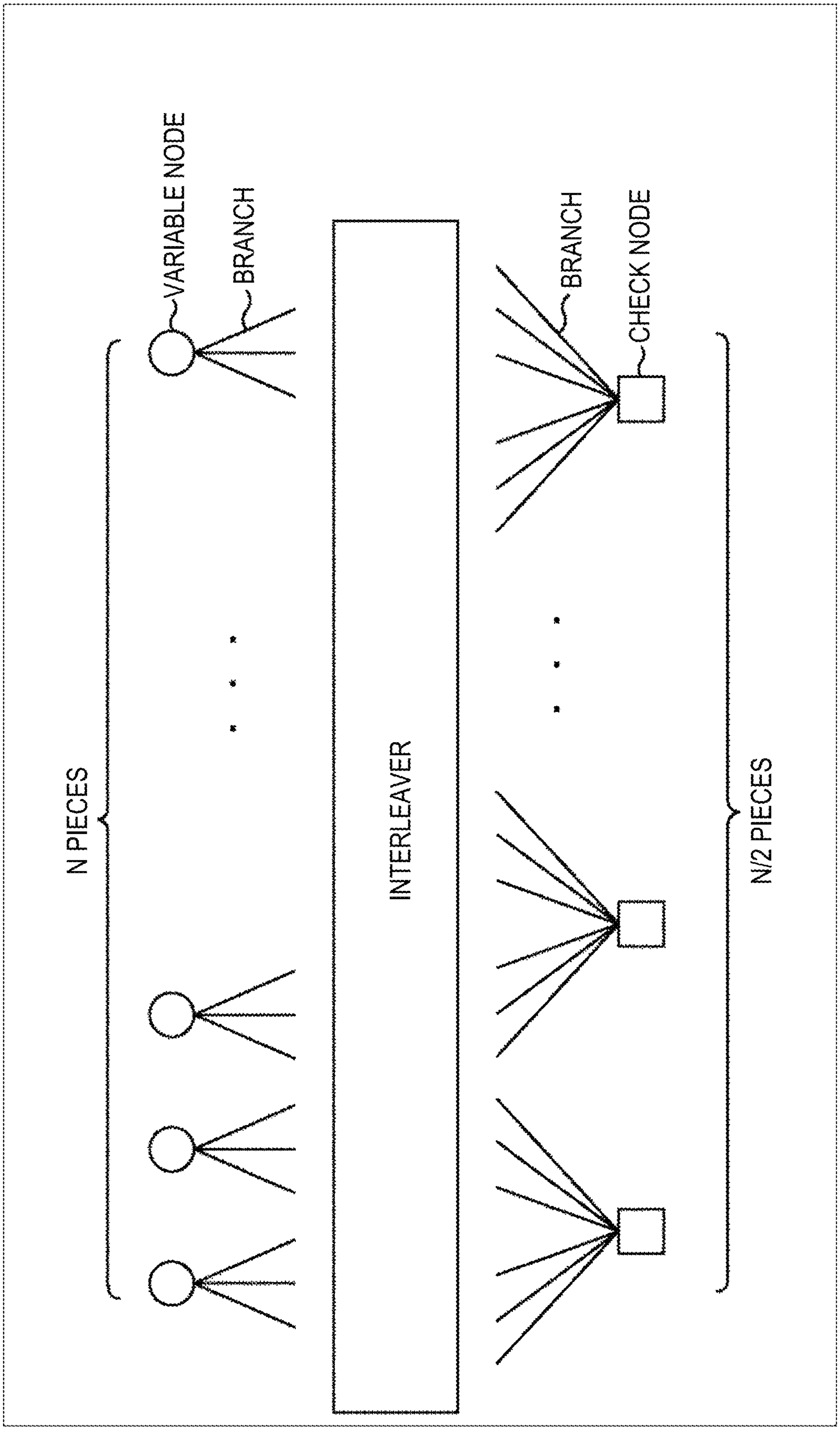
FIG. 73 is an illustration of an example of a tanner graph of an ensemble of a degree sequence in which a column weight is 3, and a row weight is 6.
Figure 74:
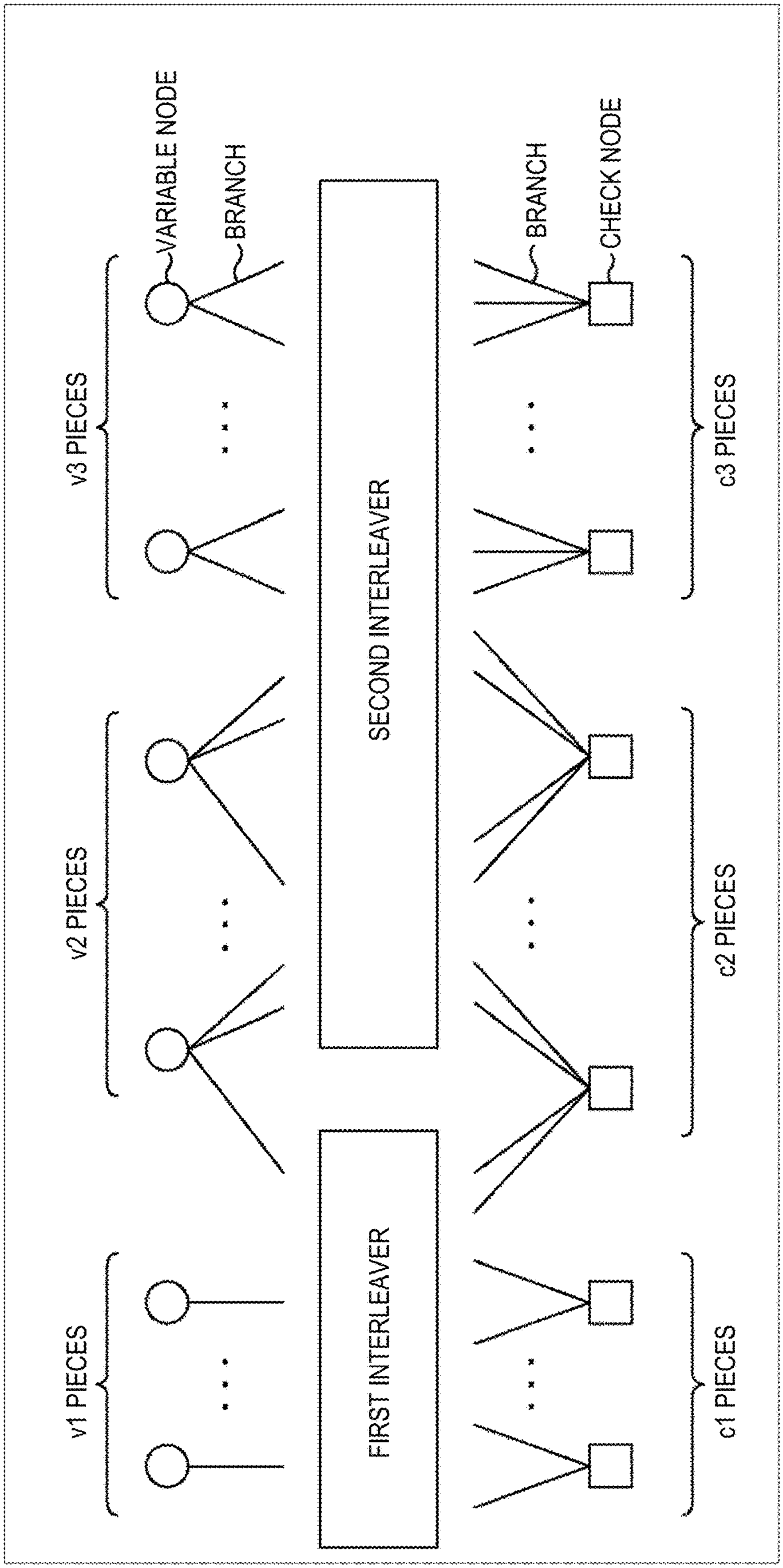
FIG. 74 is an illustration of an example of a tanner graph of an ensemble of a multi-edge type.

FIG. 73 and FIG. 74 are diagrams to describe the density evolution that can obtain an analytical result as a predetermined condition to be satisfied by the appropriate parity check matrix H.

The density evolution is a code analysis method that calculates the expectation value of the error probability of the entire LDPC code (ensemble) with a code length N of ∞ characterized by a degree sequence described later.

For example, when the dispersion value of noise is gradually increased from 0 on the AWGN channel, the expectation value of the error probability of a certain ensemble is 0 first, but, when the dispersion value of noise becomes equal to or greater than a certain threshold, it is not 0.

According to the density evolution, by comparison of the threshold of the dispersion value of noise (which may also be called a performance threshold) in which the expectation value of the error probability is not 0, it is possible to decide the quality of ensemble performance (appropriateness of the parity check matrix).

Here, as for a specific LDPC code, when an ensemble to which the LDPC code belongs is decided and density evolution is performed for the ensemble, rough performance of the LDPC code can be expected.

Therefore, if an ensemble of good performance is found, an LDPC code of good performance can be found from LDPC codes belonging to the ensemble.

Here, the above-mentioned degree sequence shows at what percentage a variable node or check node having the weight of each value exists with respect to the code length N of an LDPC code.

For example, a regular (3,6) LDPC code with an encoding rate of 1/2 belongs to an ensemble characterized by a degree sequence in which the weight (column weight) of all variable nodes is 3 and the weight (row weight) of all check nodes is 6.

FIG. 73 illustrates a Tanner graph of such an ensemble.

In the Tanner graph of FIG. 73, there are variable nodes shown by circles (sign O) in the diagram only by N pieces equal to the code length N, and there are check nodes shown by quadrangles (sign □) only by N/2 pieces equal to a multiplication value multiplying encoding rate 1/2 by the code length N.

Three branches (edge) equal to the column weight are connected with each variable node, and therefore there are totally 3N branches connected with N variable nodes.

Moreover, six branches (edge) equal to the row weight are connected with each check node, and therefore there are totally 3N branches connected with N/2 check nodes.

In addition, there is one interleaver in the Tanner graph in FIG. 73.

The interleaver randomly rearranges 3N branches connected with N variable nodes and connects each rearranged branch with any of 3N branches connected with N/2 check nodes.

There are $(3N)!(=(3N)\times(3N-1)\times \ldots \times 1)$ rearrangement patterns to rearrange 3N branches connected with N variable nodes in the interleaver. Therefore, an ensemble characterized by the degree sequence in which the weight of all variable nodes is 3 and the weight of all check nodes is 6, becomes aggregation of (3N)!LDPC codes.

In simulation to find an LDPC code of good performance (appropriate parity check matrix), an ensemble of a multi-edge type is used in the density evolution.

In the multi edge type, an interleaver through which the branches connected with the variable nodes and the branches connected with the check nodes pass, is divided into plural (multi edge), and, by this means, the ensemble is characterized more strictly.

FIG. 74 illustrates an example of a Tanner graph of an ensemble of the multi-edge type.

In the Tanner graph of FIG. 74, there are two interleavers of the first interleaver and the second interleaver.

Moreover, in the Tanner graph chart of FIG. 74, v1 variable nodes with one branch connected with the first interleaver and no branch connected with the second interleaver exist, v2 variable nodes with one branch connected with the first interleaver and two branches connected with the second interleaver exist, and v3 variable nodes with no branch connected with the first interleaver and two branches connected with the second interleaver exist, respectively.

Furthermore, in the Tanner graph chart of FIG. 74, c1 check nodes with two branches connected with the first interleaver and no branch connected with the second interleaver exist, c2 check nodes with two branches connected with the first interleaver and two branches connected with the second interleaver exist, and c3 check nodes with no branch connected with the first interleaver and three branches connected with the second interleaver exist, respectively.

Here, for example, the density evolution and the mounting thereof are described in "On the Design of Low-Density Parity-Check Codes within 0.0045 dB of the Shannon Limit", S. Y. Chung, G. D. Fomey, T. J. Richardson, R. Urbanke, IEEE Communications Leggers, VOL. 5, NO. 2, February 2001.

In simulation to find (a parity check matrix initial value table of) a Sony code, by the density evaluation of the multi-edge type, an ensemble in which a performance threshold that is $E_b/N_0$ (signal-to-noise power ratio per bit) with deteriorating (decreasing) BER is equal to or less than a predetermined value is found, and an LDPC code that decreases BER in a case using one or more orthogonal modulations such as QPSK is selected from LDPC codes belonging to the ensemble as an LDPC code of good performance.

The parity check matrix initial value table of the Sony code is found from the above-mentioned simulation.

Thus, according to the Sony symbol obtained from the parity check matrix initial value table, it is possible to secure the excellent communication quality in the data transmission.

Figure 75:
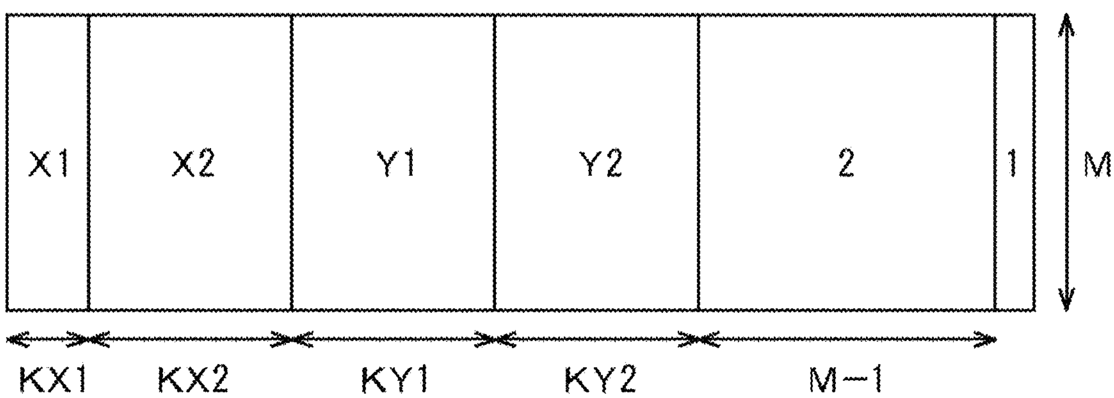
FIG. 75 is an illustration of a parity check matrix.

FIG. 75 is an illustration of parity check matrices H (hereinafter, also referred to as "parity check matrices H of Sony symbols (16 k, 8/15), (16 k, 10/15), and (16 k, 12/15)") obtained from the parity check matrix initial value table of the Sony symbols (16 k, 8/15), (16 k, 10/15), and (16 k, 12/15).

Every minimum cycle length of the parity check matrices H of the Sony symbols (16 k, 8/15), (16 k, 10/15), and (16 k, 12/15) has a value exceeding cycle 4, and thus there is no cycle 4 (a loop of 1 elements in which a loop length is 4). Here, the minimum cycle length (girth) is a minimum value of a length (a loop length) of a loop configured with 1 elements in the parity check matrix H.

A performance threshold value of the Sony symbol (16 k, 8/15) is set to 0.805765, a performance threshold value of the Sony symbol (16 k, 10/15) is set to 2.471011, and a performance threshold value of the Sony symbol (16 k, 12/15) is set to 4.269922.

The column weight is set to X1 for KX1 columns of the parity check matrices H of the Sony symbols (16 k, 8/15), (16 k, 10/15), and (16 k, 12/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=16200 bits) of the Sony symbols (16 k, 8/15), (16 k, 10/15), and (16 k, 12/15).

In the parity check matrices H of the Sony symbols (16 k, 8/15), (16 k, 10/15), and (16 k, 12/15), the numbers KX1, KX2, KY1, KY2, and M of columns and column weights X1, X2, Y1, and Y2 are set as illustrated in FIG. 75.

In the parity check matrices H of the Sony symbols (16 k, 8/15), (16 k, 10/15), and (16 k, 12/15), similarly to the parity check matrix described above with reference to FIGS. 12 and 13, columns closer to the head side (the left side) have higher column weights, and thus a code bit at the head of the Sony symbol tends to be robust to error (have error tolerance).

According to the simulation conducted by the applicant of the present application, an excellent BER/FER is obtained for the Sony symbols (16 k, 8/15), (16 k, 10/15), and (16 k, 12/15), and thus it is possible to secure the excellent communication quality in the data transmission using the Sony symbols (16 k, 8/15), (16 k, 10/15), and (16 k, 12/15).

Figure 76:
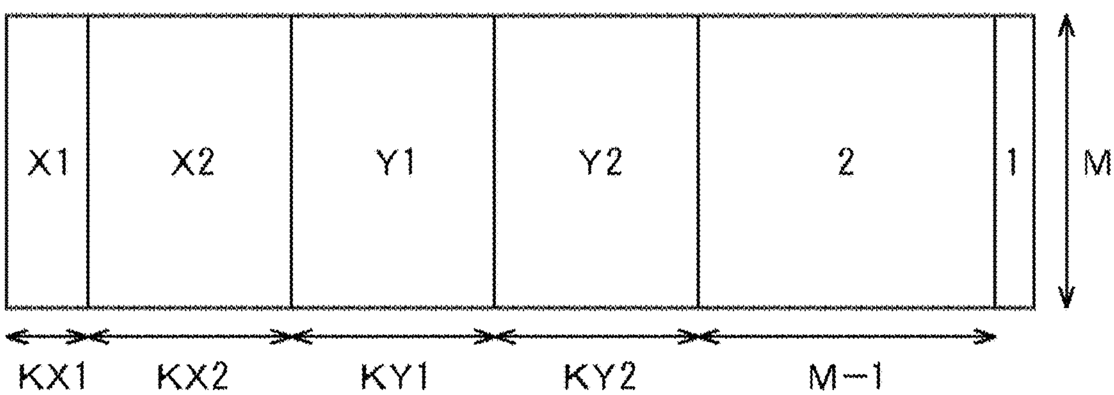
FIG. 76 is an illustration of a parity check matrix.

FIG. 76 is an illustration of parity check matrices H of the Sony symbols (64 k, 7/15), (64 k, 9/15), (64 k, 11/15), and (64 k, 13/15).

Every minimum cycle length of the parity check matrices H of the Sony symbols (64 k, 7/15), (64 k, 9/15), (64 k, 11/15), and (64 k, 13/15) has a value exceeding a cycle 4, and thus there is no cycle 4.

A performance threshold value of the Sony symbol (64 k, 7/15) is set to −0.093751, a performance threshold value of the Sony symbol (64 k, 9/15) is set to 1.658523, a performance threshold value of the Sony symbol (64 k, 11/15) is set to 3.351930, and a performance threshold value of the Sony symbol (64 k, 13/15) is set to 5.301749.

The column weight is set to X1 for KX1 columns of the parity check matrices H of the Sony symbols (64 k, 7/15), (64 k, 9/15), (64 k, 11/15), and (64 k, 13/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=64800 bits) of the Sony symbols (64 k, 7/15), (64 k, 9/15), (64 k, 11/15), and (64 k, 13/15).

In the parity check matrices H of the Sony symbols (64 k, 7/15), (64 k, 9/15), (64 k, 11/15), and (64 k, 13/15), the numbers KX1, KX2, KY1, KY2, and M of columns and column weights X1, X2, Y1, and Y2 are set as illustrated in FIG. 76.

In the parity check matrices H of the Sony symbols (64 k, 7/15), (64 k, 9/15), (64 k, 11/15), and (64 k, 13/15), similarly to the parity check matrix described above with reference to FIGS. 12 and 13, columns closer to the head side (the left side) have higher column weights, and thus a code bit at the head of the Sony symbol tends to be robust to error (have error tolerance).

According to the simulation conducted by the applicant of the present application, an excellent BER/FER is obtained for the Sony symbols (64 k, 7/15), (64 k, 9/15), (64 k, 11/15), and (64 k, 13/15), and thus it is possible to secure the excellent communication quality in the data transmission using the Sony symbols (64 k, 7/15), (64 k, 9/15), (64 k, 11/15), and (64 k, 13/15).

Figure 77:
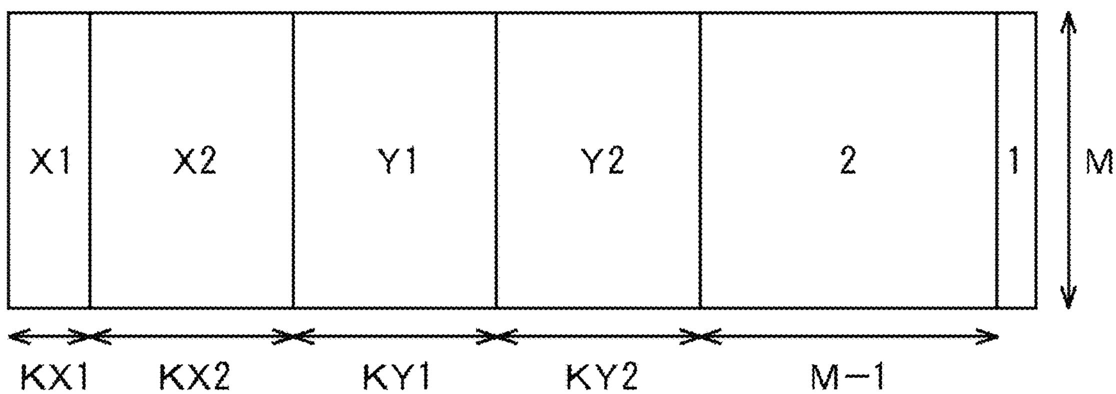
FIG. 77 is an illustration of a parity check matrix.

FIG. 77 is an illustration of parity check matrices H of Samsung symbols (64 k, 6/15), (64 k, 8/15), and (64 k, 12/15).

The column weight is set to X1 for KX1 columns of the parity check matrices H of the Samsung symbols (64 k, 6/15), (64 k, 8/15), and (64 k, 12/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=64800 bits) of the Samsung symbols (64 k, 6/15), (64 k, 8/15), and (64 k, 12/15).

In the parity check matrices H of the Samsung symbols (64 k, 6/15), (64 k, 8/15), and (64 k, 12/15), the numbers KX1, KX2, KY1, KY2, and M of columns and column weights X1, X2, Y1, and Y2 are set as illustrated in FIG. 77.

Figure 78:
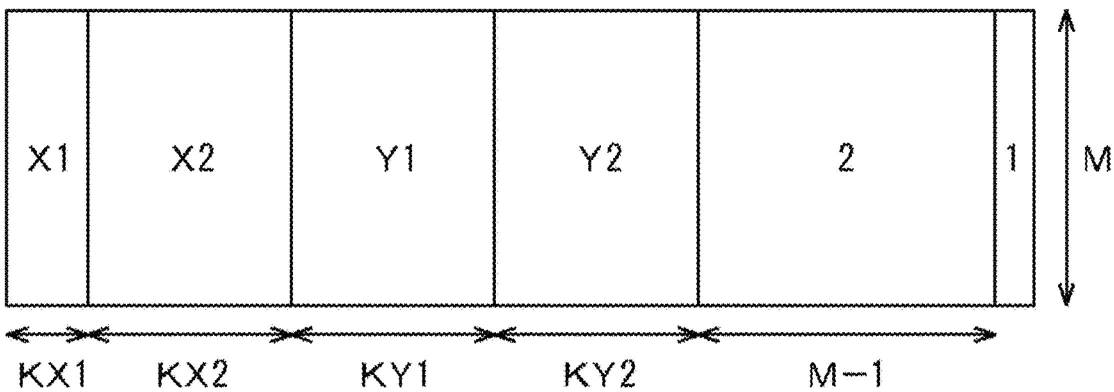
FIG. 78 is an illustration of a parity check matrix.

FIG. 78 is an illustration of parity check matrices H of the LGE symbols (16 k, 6/15), (16 k, 7/15), (16 k, 9/15), (16 k, 11/15), and (16 k, 13/15).

The column weight is set to X1 for KX1 columns of the parity check matrices H of the LGE symbols (16 k, 6/15), (16 k, 7/15), (16 k, 9/15), (16 k, 11/15), and (16 k, 13/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=16200 bits) of the LGE symbols (16 k, 6/15), (16 k, 7/15), (16 k, 9/15), (16 k, 11/15), and (16 k, 13/15).

In the parity check matrices H of the LGE symbols (16 k, 6/15), (16 k, 7/15), (16 k, 9/15), (16 k, 11/15), and (16 k, 13/15), the numbers KX1, KX2, KY1, KY2, and M of columns and column weights X1, X2, Y1, and Y2 are set as illustrated in FIG. 78.

Figure 79:
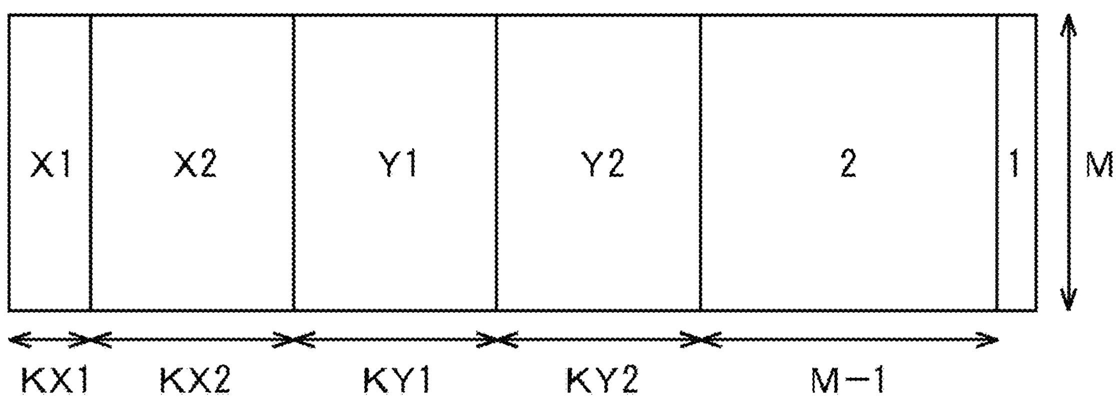
FIG. 79 is an illustration of a parity check matrix.

FIG. 79 is an illustration of parity check matrices H of the LGE symbols (64 k, 10/15).

The column weight is set to X1 for KX1 columns of the parity check matrices H of the LGE symbols (64 k, 10/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=64800 bits) of the LGE symbols (64 k, 10/15).

In the parity check matrices H of the LGE symbols (64 k, 10/15), the numbers KX1, KX2, KY1, KY2, and M of columns and column weights X1, X2, Y1, and Y2 are set as illustrated in FIG. 79.

Figure 80:
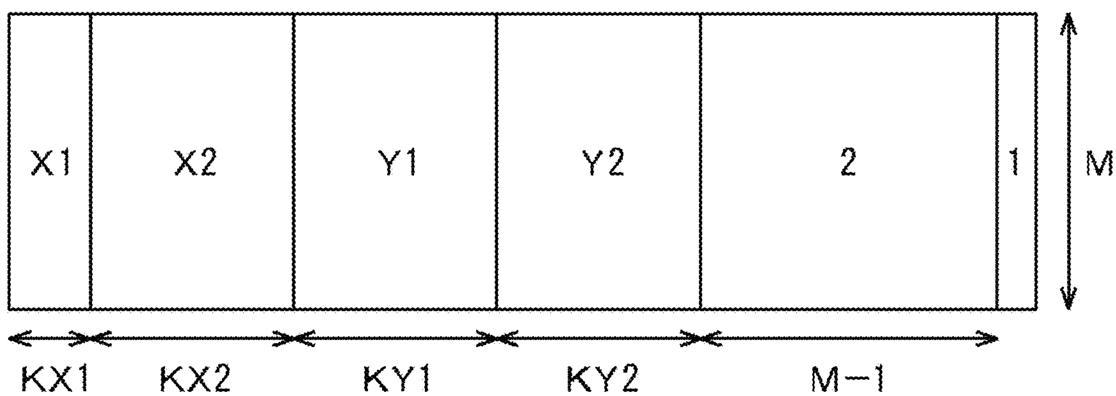
FIG. 80 is an illustration of a parity check matrix.

FIG. 80 is an illustration of parity check matrices H of the NERC symbols (64 k, 9/15).

The column weight is set to X1 for KX1 columns of the parity check matrices H of the NERC symbols (64 k, 9/15) starting from the 1st column, the column weight is set to X2 for KX2 columns subsequent thereto, the column weight is set to Y1 for KY1 columns subsequent thereto, the column weight is set to Y2 for KY2 columns subsequent thereto, the column weight is set to 2 for M−1 columns subsequent thereto, and the column weight is set to 1 for the last column.

Here, KX1+KX2+KY1+KY2+M−1+1 is equal to the code length N(=64800 bits) of the NERC symbols (64 k, 9/15).

In the parity check matrices H of the NERC symbols (64 k, 9/15), the numbers KX1, KX2, KY1, KY2, and M of columns and column weights X1, X2, Y1, and Y2 are set as illustrated in FIG. 80.

Figure 81:
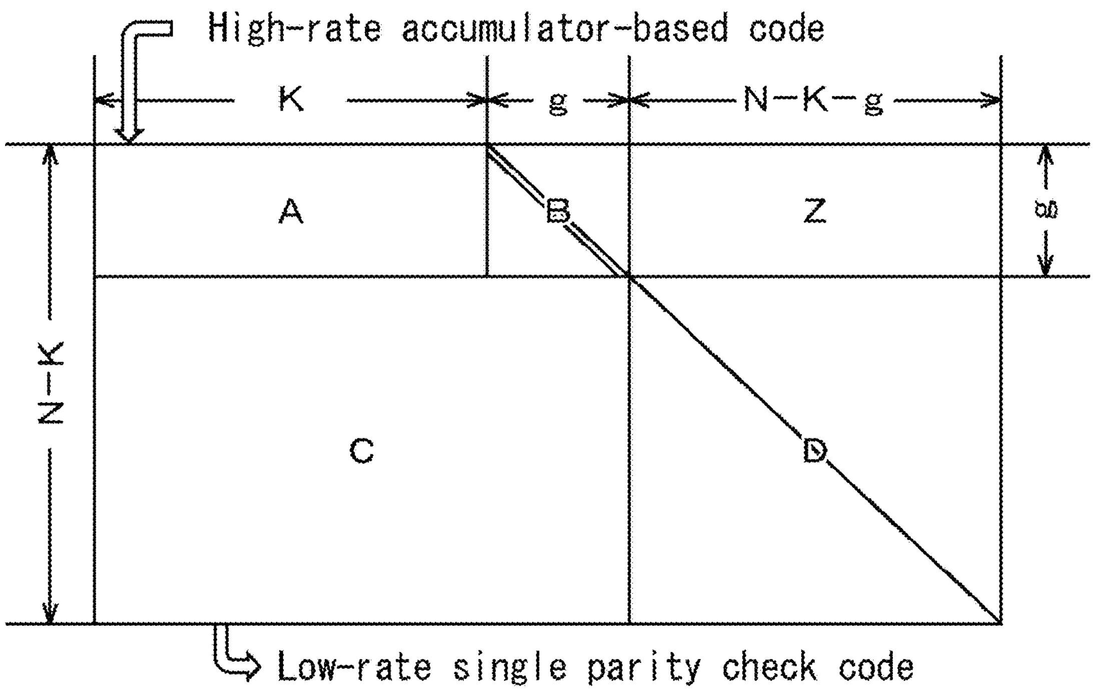
FIG. 81 is an illustration of a parity check matrix.

FIG. 81 is an illustration of a parity check matrix H of an ETRI symbol (16 k, 5/15).

For the parity check matrix H of the ETRI symbol (16 k, 5/15), the parameter $g=M_1$ is 720.

Further, for the ETRI symbol (16 k, 5/15), since the code length N is 16200 and the encoding rate r is 5/15, the information length K=N×r is 16200×5/15=5400 and the parity length M=N−K is 16200−5400=10800.

Further, the parameter $M_2=M-M_1=N-K-g$ is 10800−720=10080.

Thus, the parameter $Q_1=M_1/P$ is 720/360=2, and the parameter $Q_2=M_2/P$ is 10080/360=28.

Figure 82:
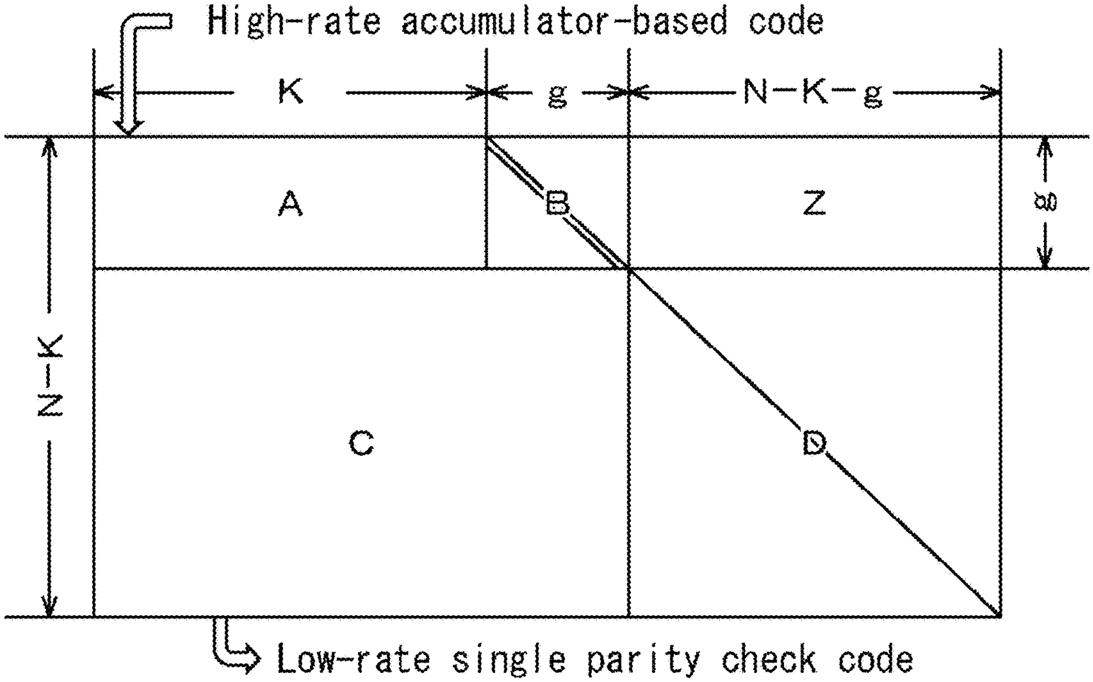
FIG. 82 is an illustration of a parity check matrix.

FIG. 82 is an illustration of parity check matrices H of ETRI symbols of (64 k, 5/15), (64 k, 6/15), and (64 k, 7/15).

For the parity check matrices H of the ETRI symbols of (64 k, 5/15), (64 k, 6/15), and (64 k, 7/15), the parameters $g=M_1$, $M_2$, $Q_1$, and $Q_2$ are set as illustrated in FIG. 82.

<Constellation>

FIGS. 83 to 104 are illustrations of examples of constellation types employed in the transmission system of FIG. 7.

In the transmission system of FIG. 7, for example, a constellation used in MODCOD can be set to MODCOD serving as a combination of a modulation scheme and an LDPC code.

In other words, in the transmission system of FIG. 7, for example, the LDPC codes can be classified into 9 types of LDPC codes in which the encoding rate r is 5/15, 6/15, 7/15, 8/15, 9/15, 10/15, 11/15, 12,15, and 13/15 according to the encoding rate r (regardless of the code length N), and a combination of the 9 types of LDPC codes (each of the LDPC codes in which the encoding rate r is 5/15, 6/15, 7/15, 8/15, 9/15, 10/15, 11/15, 12,15, and 13/15) and each modulation scheme can be employed as MODCOD.

Further, in the transmission system of FIG. 7, one or more of constellations can be set to MODCOD of 1 using the modulation scheme of MODCOD.

The constellations include uniform constellations (UCs) in which an arrangement of signal points is uniform, and non uniform constellations (NUCs) in which an arrangement of signal points is not uniform.

Examples of NUCs include a constellation called a 1-dimensional $M^2$-QAM non-uniform constellation (1D NUC) and a constellation called a 2-dimensional QQAM non-uniform constellation (2D NUC).

Commonly, the 1D NUC is better in the BER than the UC, and the 2D NUC is better in the BER than the 1D NUC.

A constellation in which the modulation scheme is QPSK is the UC. For example, the 2D NUC can be employed as the constellation in which the modulation scheme is 16QAM, 64QAM, 256QAM, or the like, and for example, the 1D NUC can be employed as the constellation in which the modulation scheme is 1024QAM, 4096QAM, or the like.

Hereinafter, a constellation of an NUC used in MODCOD in which the modulation scheme is a modulation scheme in which an m-bit symbol is mapped to any of $2^m$ signal points, and an encoding rate of an LDPC is r is also referred to as NUC_$2^m$_r.

For example, "NUC_16_6/15" indicates a constellation of an NUC used in MODCOD in which the modulation scheme is 16QAM (or the modulation scheme in which a symbol is mapped to any of 16 signal points), and the encoding rate r of the LDPC code is 6/15.

In the transmission system of FIG. 7, when the modulation scheme is QPSK, the same constellation is used for each encoding rate r of the LDPC code.

Further, in the transmission system of FIG. 7, when the modulation scheme is 16QAM, 64QAM, or 256QAM, a different constellation of a 2D NUC is used according to each encoding rate r of the LDPC code.

Further, in the transmission system of FIG. 7, when the modulation scheme is 1024QAM or 4096QAM, a different constellation of a 1D NUC is used according to each encoding rate r of the LDPC code.

Thus, as described above, when the LDPC codes are classified into the 9 types of LDPC codes of r=5/15, 6/15, 7/15, 8/15, 9/15, 10/15, 11/15, 12, 15, 13/15 according to the encoding rate r, one type of constellation is prepared for QPSK, 9 types of constellations of a 2D NUC are prepared for each of 16QAM, 64QAM, and 256QAM, and 9 types of constellations of a 1D NUC are prepared for each of 1024QAM and 4096QAM.

Figure 83:
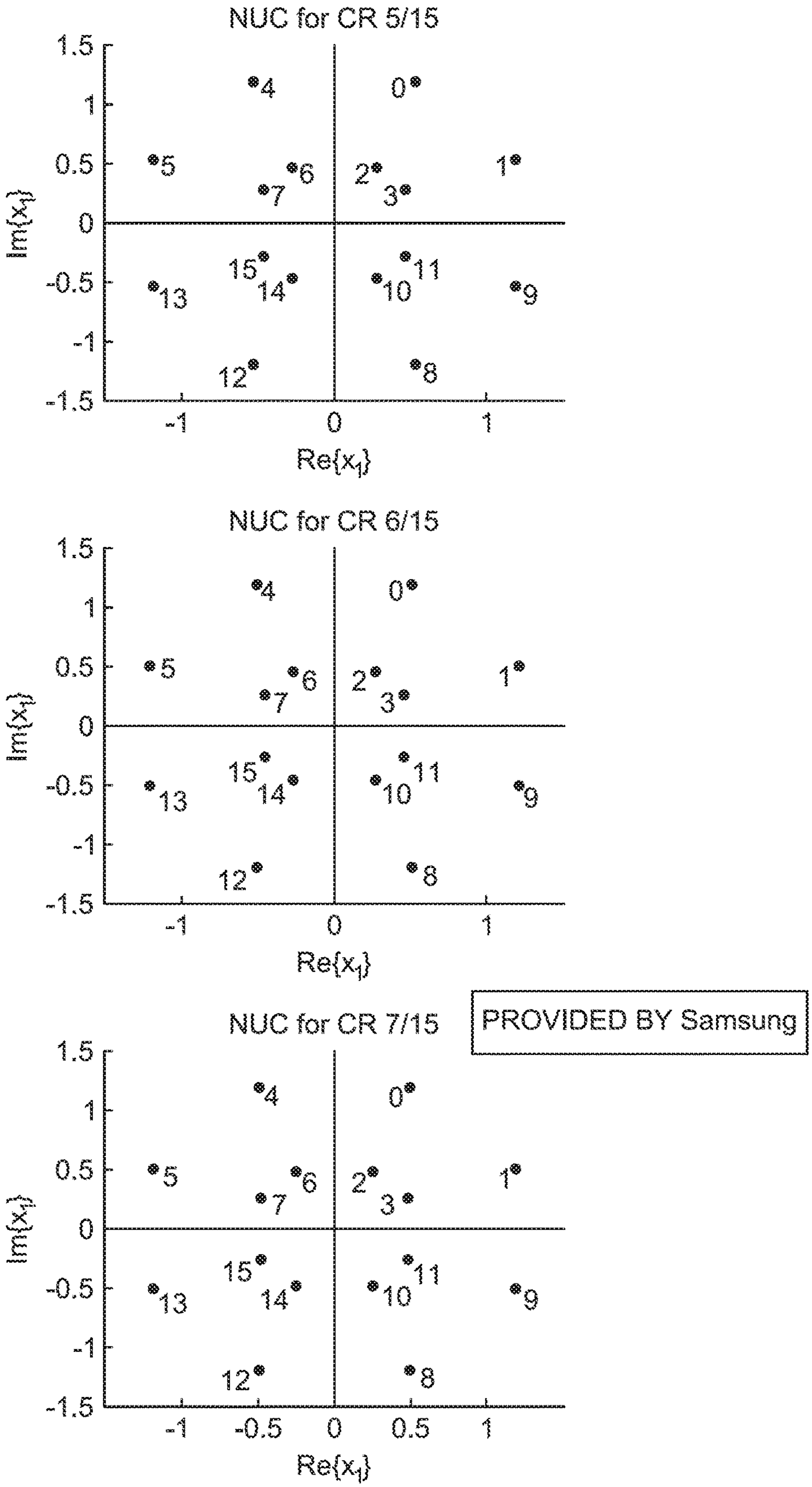
FIG. 83 is an illustration of an example of a constellation when a modulation scheme is 16QAM.
Figure 83:
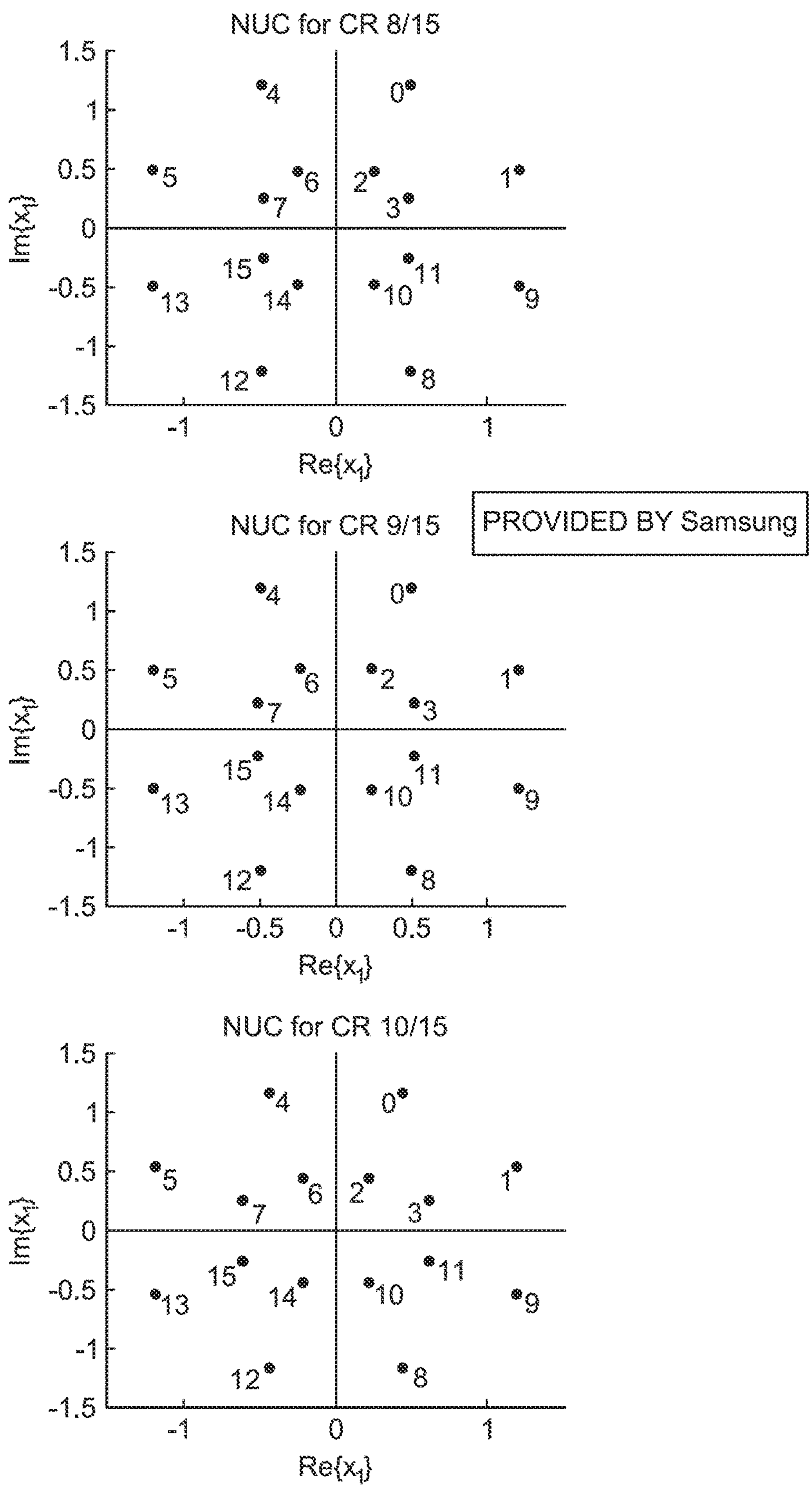
Figure 83:
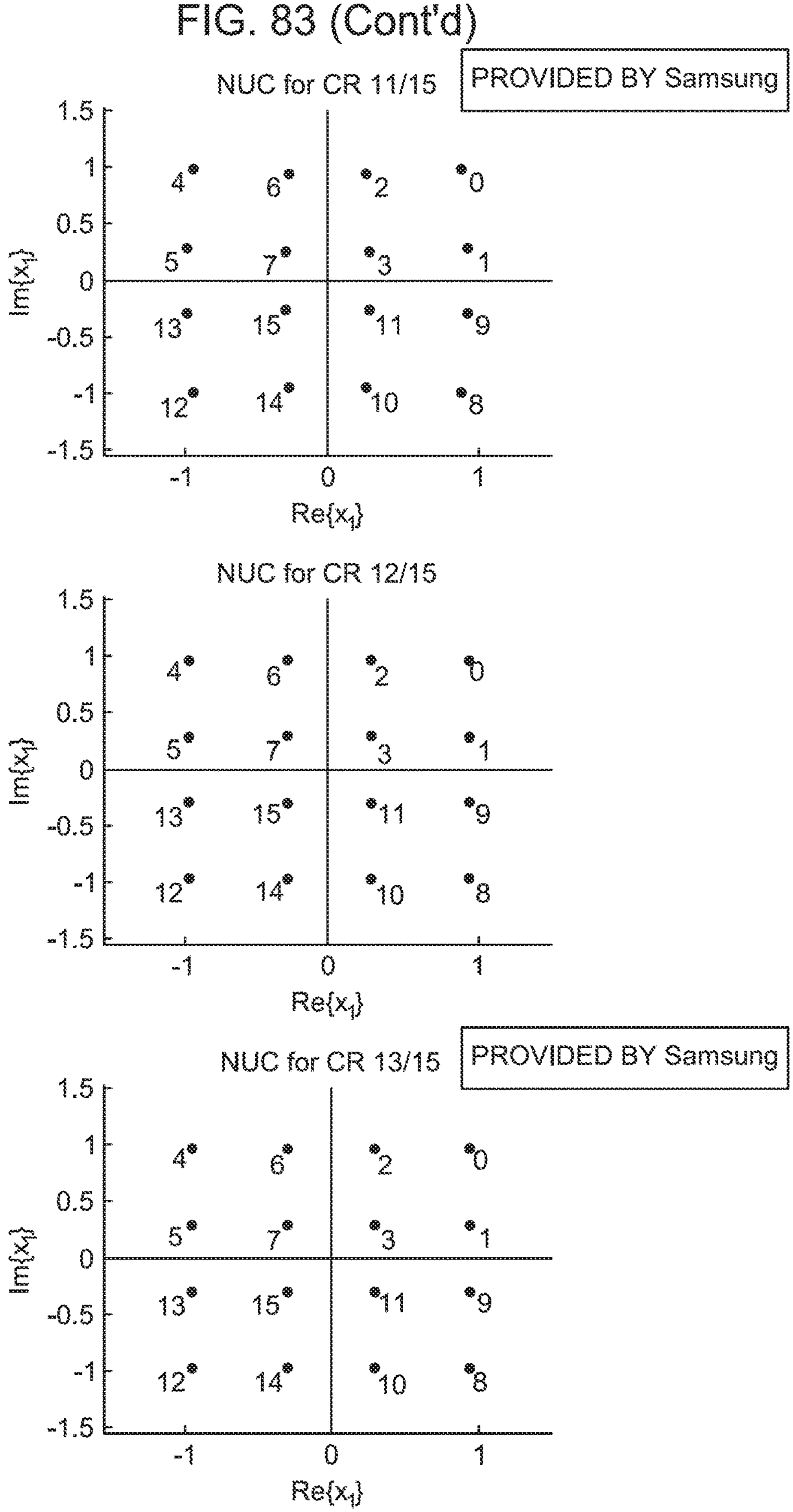

FIG. 83 is an illustration of an example of a constellation of a 2D NUC for each of 9 types of encoding rates r (=5/15, 6/15, 7/15, 8/15, 9/15, 10/15, 11/15, 12, 15, and 13/15) of LDPC codes when the modulation scheme is 16QAM.

Figure 84:
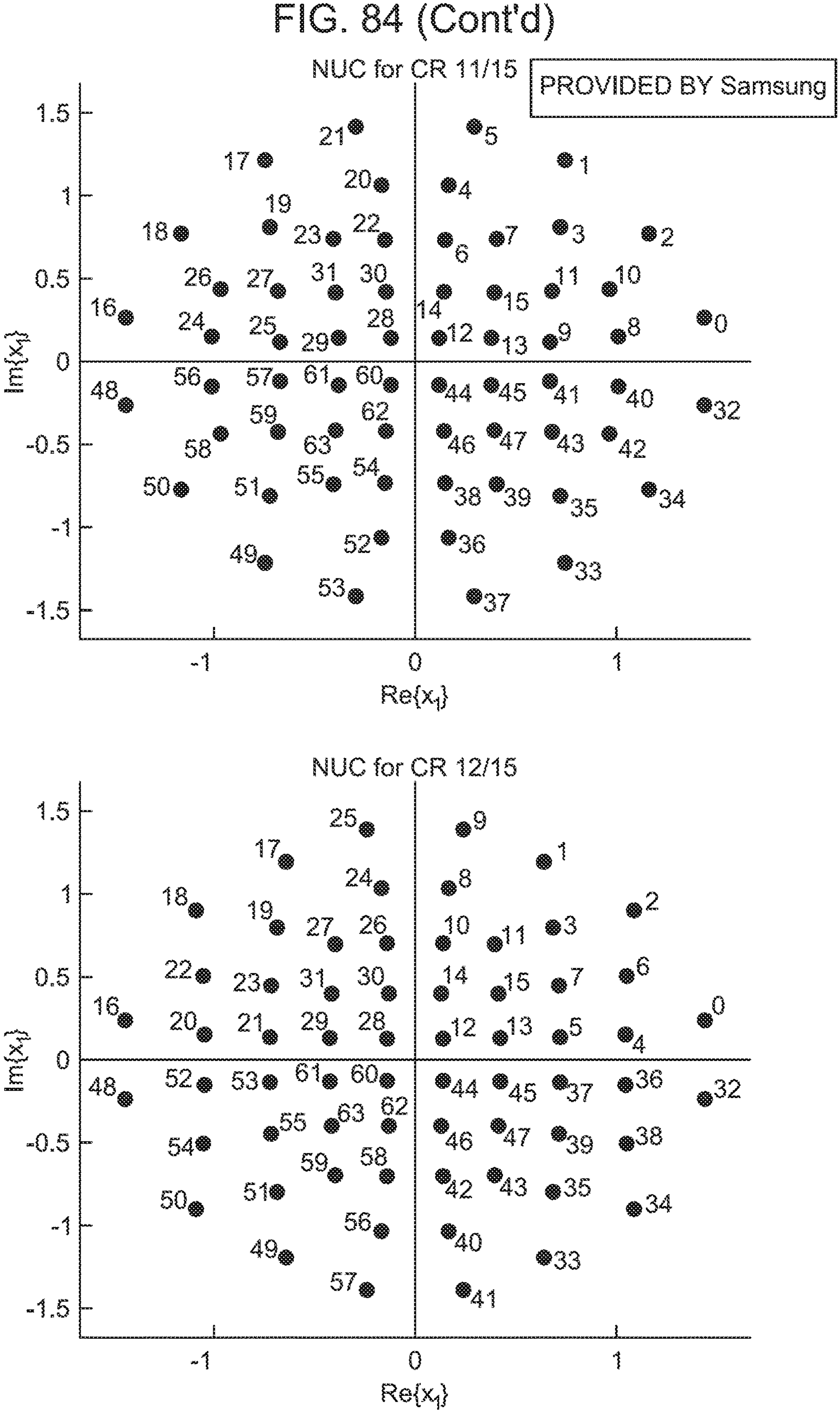
FIG. 84 is an illustration of an example of a constellation when a modulation scheme is 64QAM.
Figure 84:
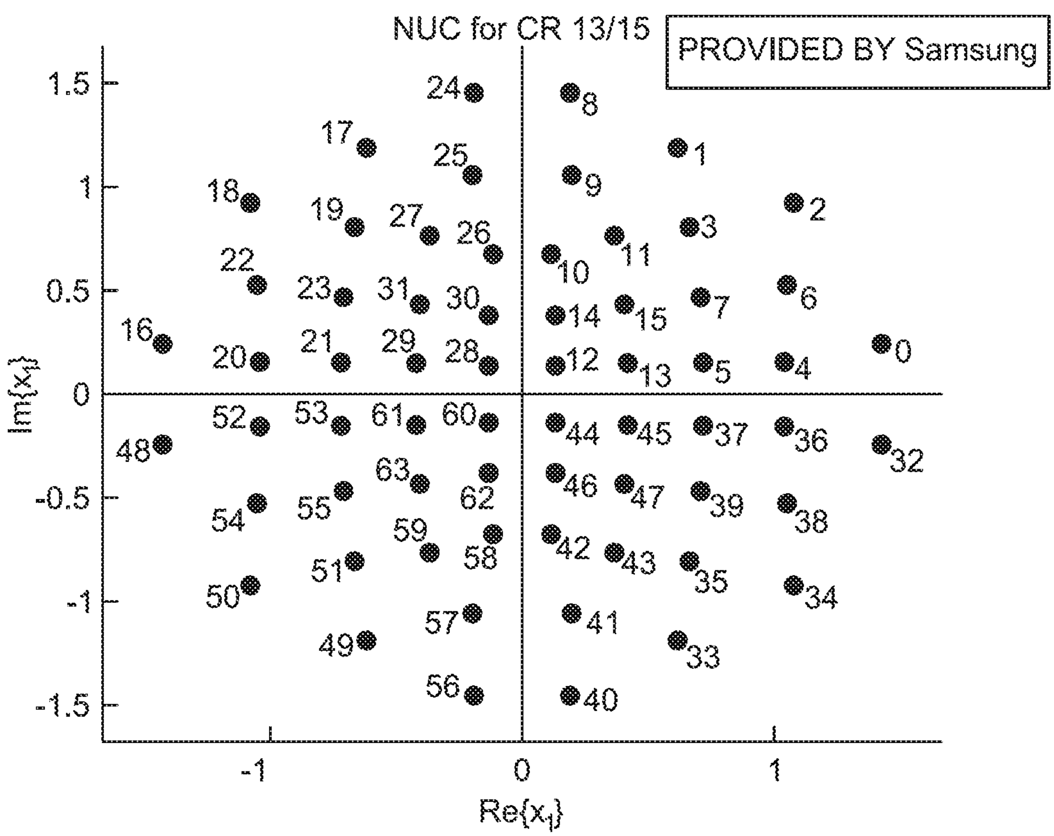

FIG. 84 is an illustration of an example of a constellation of a 2D NUC for each of 9 types of encoding rates r (=5/15, 6/15, 7/15, 8/15, 9/15, 10/15, 11/15, 12, 15, and 13/15) of LDPC codes when the modulation scheme is 64QAM.

Figure 85:
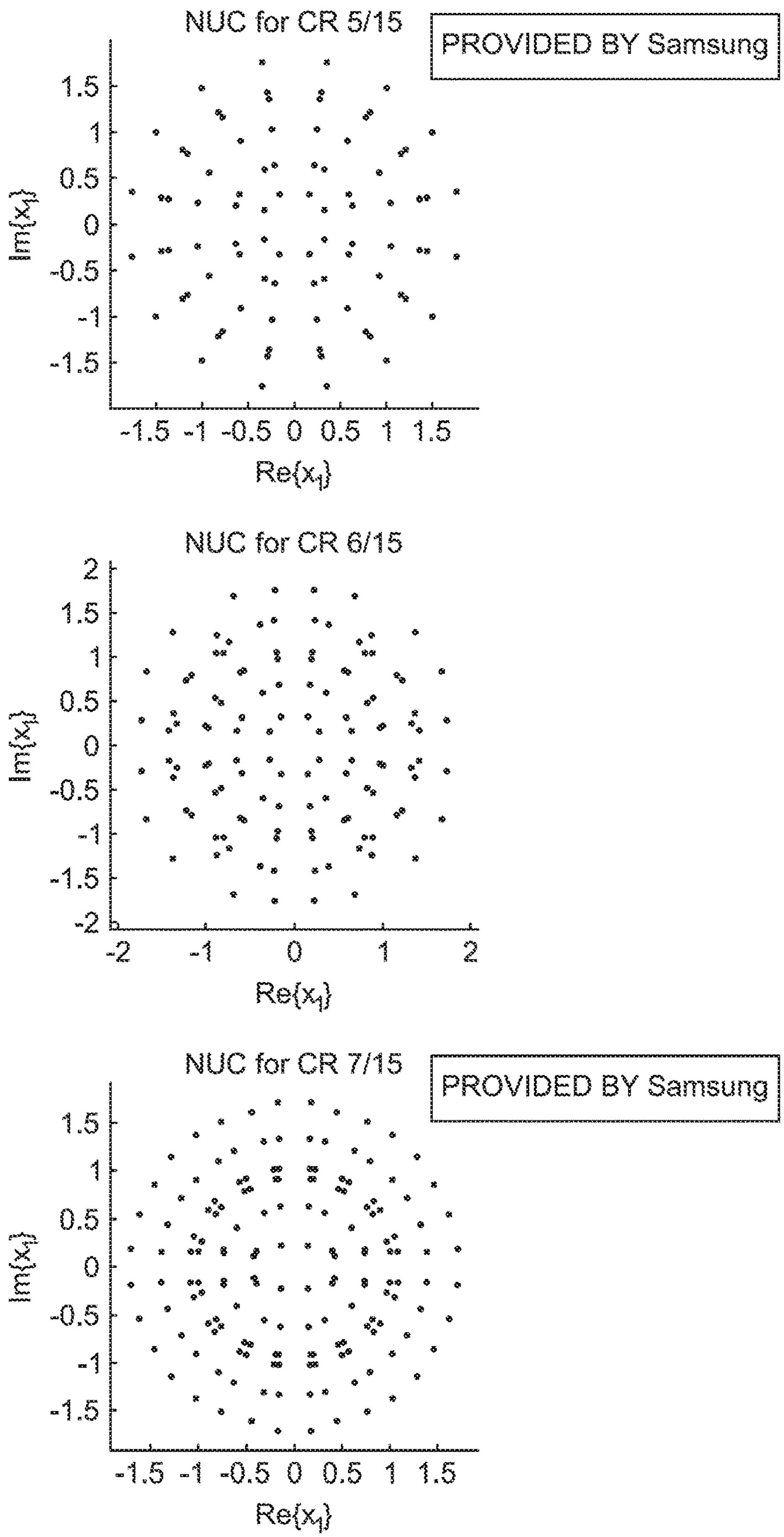
FIG. 85 is an illustration of an example of a constellation when a modulation scheme is 256QAM.

FIG. 85 is an illustration of an example of a constellation of a 2D NUC for each of 9 types of encoding rates r (=5/15, 6/15, 7/15, 8/15, 9/15, 10/15, 11/15, 12, 15, and 13/15) of LDPC codes when the modulation scheme is 256QAM.

Figure 86:
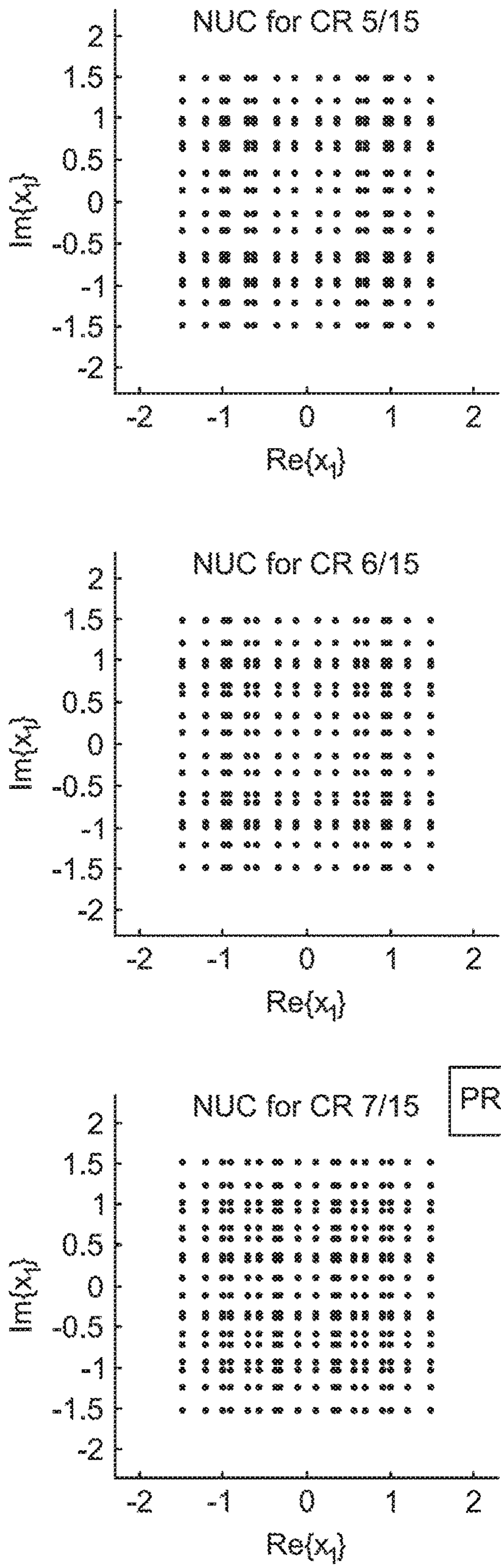
FIG. 86 is an illustration of an example of a constellation when a modulation scheme is 1024QAM.

FIG. 86 is an illustration of an example of a constellation of a 1D NUC for each of 9 types of encoding rates r (=5/15, 6/15, 7/15, 8/15, 9/15, 10/15, 11/15, 12, 15, and 13/15) of LDPC codes when the modulation scheme is 1024QAM.

Figure 87:
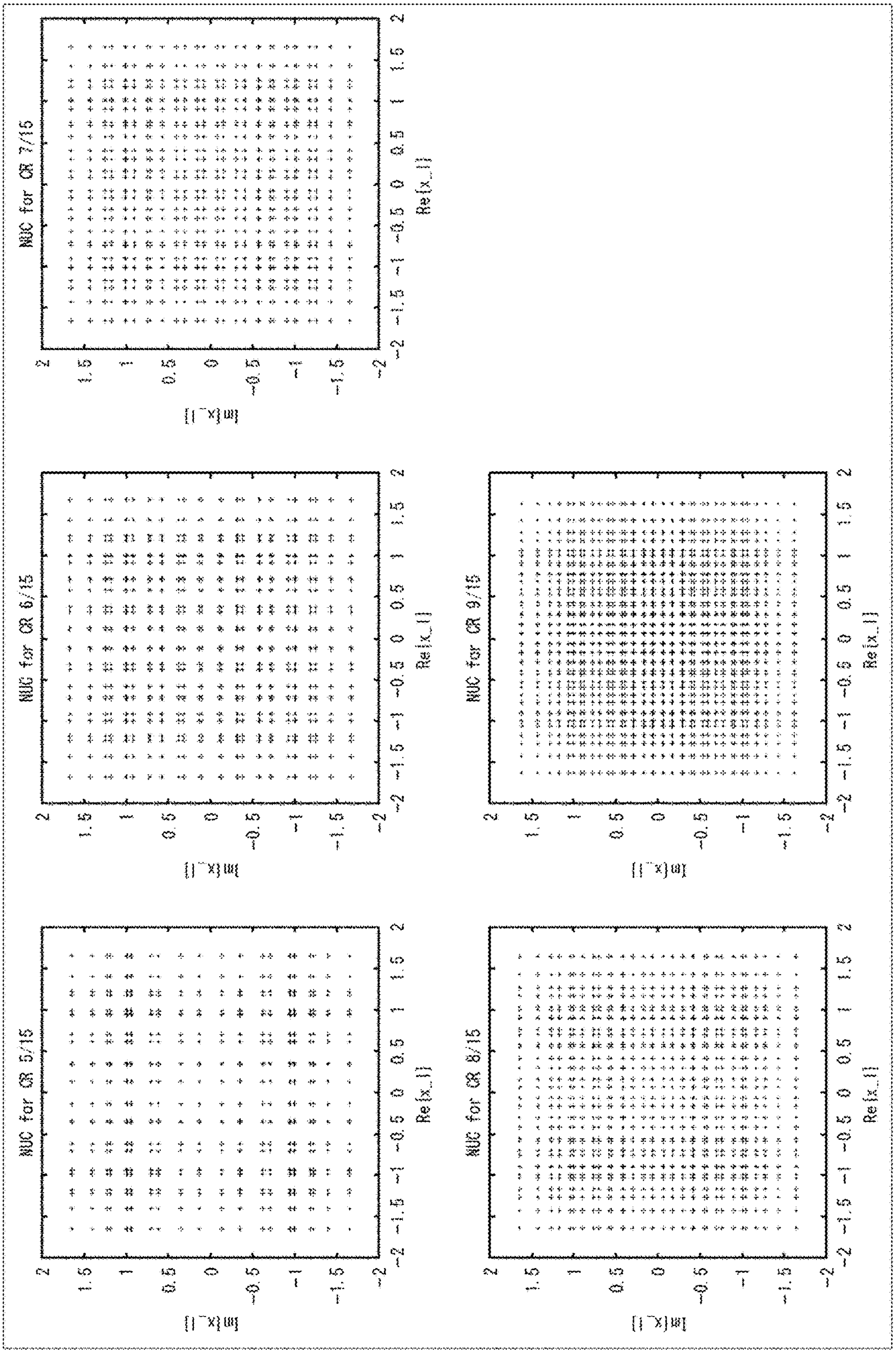
FIG. 87 is an illustration of an example of a constellation when a modulation scheme is 4096QAM.
Figure 88:
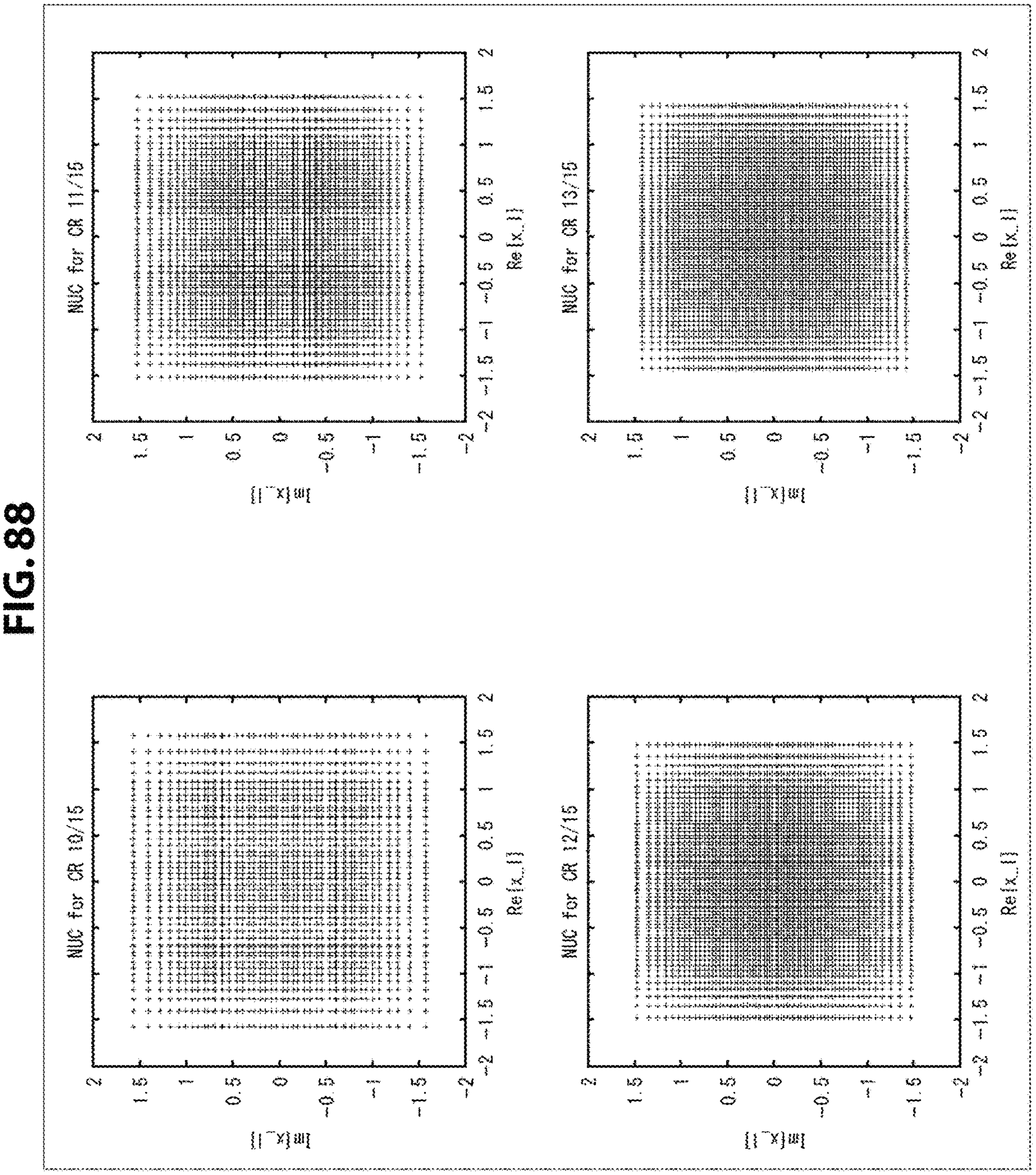
FIG. 88 is an illustration of an example of a constellation when a modulation scheme is 4096QAM.

FIG. 87 and FIG. 88 are illustrations of examples of a constellation of a 1D NUC for each of 9 types of encoding rates r (=5/15, 6/15, 7/15, 8/15, 9/15, 10/15, 11/15, 12, 15, and 13/15) of LDPC codes when the modulation scheme is 4096QAM.

In FIGS. 83 to 88, a horizontal axis and a vertical axis are an I axis and a Q axis, and $Re\{x_1\}$ and $Im\{x_1\}$ indicate a real part and an imaginary part of a signal point $x_1$ serving as coordinates of the signal point $x_1$.

In FIGS. 83 to 88, a numerical value written after "for CR" indicates the encoding rate r of the LDPC code.

FIG. 89 is an illustration of an example of coordinates of a signal point of a UC that is used in common to 9 types of encoding rates r (=5/15, 6/15, 7/15, 8/15, 9/15, 10/15, 11/15, 12, 15, and 13/15) of LDPC codes when the modulation scheme is QPSK.

In FIG. 89, "Input cell word y" indicates a 2-bit symbol that is mapped to a UC of QPSK, and "Constellation point $z_q$" indicates coordinates a signal point $z_q$. An index q of the signal point $z_q$ indicates a discrete time (a time interval between a certain symbol and a next symbol) of a symbol.

In FIG. 89, coordinates of the signal point $z_q$ are indicated in the form of a complex number, in which i indicates an imaginary unit ($\sqrt{(-1)}$).

FIG. 90 is an illustration of an example of coordinates of the signal point of the 2D NUC of FIG. 83 used for the 9 types of encoding rates r (=5/15, 6/15, 7/15, 8/15, 9/15, 10/15, 11/15, 12, 15, and 13/15) of the LDPC codes when the modulation scheme is 16QAM.

FIG. 91 is an illustration of an example of coordinates of the signal point of the 2D NUC of FIG. 84 used for the 9 types of encoding rates r (=5/15, 6/15, 7/15, 8/15, 9/15, 10/15, 11/15, 12, 15, and 13/15) of the LDPC codes when the modulation scheme is 64QAM.

FIGS. 92 and 93 are illustrations of an example of coordinates of the signal point of the 2D NUC of FIG. 85 used for the 9 types of encoding rates r (=5/15, 6/15, 7/15, 8/15, 9/15, 10/15, 11/15, 12, 15, and 13/15) of the LDPC codes when the modulation scheme is 256QAM.

In FIGS. 90 to 93, NUC_$2^m$_r indicates coordinates of a signal point of a 2D NUC used when the modulation scheme is $2^m$QAM, and the encoding rate of the LDPC code is r.

In FIGS. 90 to 93, similarly to FIG. 89, coordinates of the signal point $z_q$ are indicated in the form of a complex number, in which i indicates an imaginary unit.

In FIGS. 90 to 93, w #k indicates coordinates of a signal point of a first quadrant of the constellation.

In the 2D NUC, a signal point of a second quadrant of the constellation is arranged at a position to which the signal point of the first quadrant has moved symmetrically to the Q axis, and a signal point of a third quadrant of the constellation is arranged at a position to which the signal point of the first quadrant has moved symmetrically to an origin. Further, a signal point of a fourth quadrant of the constellation is arranged at a position to which the signal point of the first quadrant has moved symmetrically to the I axis.

Here, when the modulation scheme is $2^m$QAM, m bits are used as one symbol, and one symbol is mapped to a signal point corresponding to the symbol.

The m-bit symbol is expressed by, for example, an integer value of 0 to $2^m-1$, but if $b=2^m/4$ is assumed, symbols y(0), y(1), . . . , and y($2^m-1$) expressed by the integer value of 0 to $2^m-1$ can be classified into four symbols y(0) to y(b−1), y(b) to y(2b−1), y(2b) to y(3b−1), and y(3b) to y(4b−1).

In FIGS. 90 to 93, a suffix k of w #k has an integer value within a range of 0 to b−1, and w #k indicates coordinates of a signal point corresponding to the symbol y(k) within the range of the symbols y(0) to y(b−1).

Further, coordinates of a signal point corresponding to the symbol y(k+b) within the range of the symbols y(b) to y(2b−1) are indicated by −conj(w #k), and coordinates of a signal point corresponding to the symbol y(k+2b) within the range of the symbols y(2b) to y(3b−1) are indicated by conj(w #k). Further, coordinates of a signal point corresponding to the symbol y(k+3b) within the range of the symbols y(3b) to y(4b−1) are indicated by −w #k.

Here, conj(w #k) indicates a complex conjugate of w #k.

For example, when the modulation scheme is 16QAM, the symbols y(0), y(1), . . . , and y(15) of m=4 bits are classified into four symbols y(0) to y(3), y(4) to y(7), y(8) to y(11), and y(12) to y(15) if $b=2^4/4=4$.

Among the symbols y(0) to y(15), for example, the symbol y(12) is the symbol y(k+3b)=y(0+3×4) within the symbols y(3b) to y(4b−1), and k is zero (0), and thus the coordinates of the signal point corresponding to the symbol y(12) are −w #k=−w0.

Now, for example, if the encoding rate r of the LDPC code is 9/15, according to FIG. 90, when the modulation scheme is 16QAM, and the encoding rate r is 9/15, w0 of (NUC_16_9/15) is 0.4967+1.1932i, and thus the coordinates −w0 of the signal point corresponding to the symbol y(12) are −(0.4967+1.1932i).

FIG. 94 is an illustration of an example of the coordinates of the signal point of the 1D NUC of FIG. 86 used for the 9 types of encoding rates r (=5/15, 6/15, 7/15, 8/15, 9/15, 10/15, 11/15, 12, 15, and 13/15) of the LDPC codes when the modulation scheme is 1024QAM.

In FIG. 94, a column of NUC_1k_r indicates a value of u #k indicating the coordinates of the signal point of the 1D NUC used when the modulation scheme is 1024QAM, and the encoding rate of the LDPC code is r.

u #k indicates the real part $Re(z_q)$ and the imaginary part $Im(z_q)$ of the complex number serving as the coordinates of the signal point $z_q$ of the 1D NUC.

FIG. 95 is an illustration of a relation between the symbol y of 1024QAM and u #k serving as each of the real part $Re(z_q)$ and the imaginary part $Im(z_q)$ of the complex number indicating the coordinates of the signal point $z_q$ of the 1D NUC corresponding to the symbol y.

Now, the 10-bit symbol y of 1024QAM is assumed to be indicated by $y_{0,q}$, $y_{1,q}$, $y_{2,q}$, $y_{3,q}$, $y_{4,q}$, $y_{5,q}$, $y_{6,q}$, $y_{7,q}$, $y_{8,q}$, and $y_{9,q}$ from the first bit (the most significant bit).

A of FIG. 95 illustrates a correspondence relation between 5 odd-numbered bits $y_{0,q}$, $y_{2,q}$, $y_{4,q}$, $y_{6,q}$, $y_{8,q}$ of the symbol y and u #k indicating the real part $Re(z_q)$ (of the coordinates) of the signal point $z_q$ corresponding to the symbol y.

B of FIG. 95 is a correspondence relation between 5 even-numbered bits $y_1$,q, $y_3$,q, $y_5$,q, $y_7$,q, and $y_9$,q of the symbol y and u #k indicating the imaginary part $Im(z_q)$ (of the coordinates) of the signal point $z_q$ corresponding to the symbol y.

For example, when the 10-bit symbol y=($y_{0,q}$, $y_{1,q}$, $y_{2,q}$, $y_{3,q}$, $y_{4,q}$, $y_{5,q}$, $y_{6,q}$, $y_{7,q}$, $y_{8,q}$, $y_{9,q}$) of 1024QAM is (0, 0, 1, 0, 0, 1, 1, 1, 0, 0), the 5 odd-numbered bits ($y_{0,q}$, $y_{2,q}$, $y_{4,q}$, $y_{6,q}$, $y_{8,q}$) are (0, 1, 0, 1, 0), and the 5 even-numbered bits ($y_{1,q}$, $y_{3,q}$, $y_{5,q}$, $y_{7,q}$, and $y_{9,q}$) are (0, 0, 1, 1, 0).

In A of FIG. 95, the 5 odd-numbered bits (0, 1, 0, 1, 0) are associated with u3, and thus the real part $Re(z_q)$ of the signal point $z_q$ corresponding to the symbol y=(0, 0, 1, 0, 0, 1, 1, 1, 0, 0) is u3.

In B of FIG. 95, the 5 even-numbered bits (0, 0, 1, 1, 0) are associated with u11, and thus the imaginary part $Im(z_q)$ of the signal point $z_q$ corresponding to the symbol y=(0, 0, 1, 0, 0, 1, 1, 1, 0, 0) is u11.

Meanwhile, for example, if the encoding rate r of the LDPC code is 7/15, according to FIG. 94, for the 1D NUC (NUC_1k_7/15) used when the modulation scheme is 1024QAM and the encoding rate r of the LDPC code is 7/15, u3 is 1.1963, and u11 is 6.9391.

Thus, the real part $Re(z_q)$ of the signal point $z_q$ corresponding to the symbol y=(0, 0, 1, 0, 0, 1, 1, 1, 0, 0) is u3 (=1.1963), and $Im(z_q)$ is u11 (=6.9391). As a result, the coordinates of the signal point $z_q$ corresponding to the symbol y=(0, 0, 1, 0, 0, 1, 1, 1, 0, 0) are indicated by 1.1963+6.9391i.

FIG. 96 is an illustration of an example of the coordinates of the signal point of the 1D NUC of FIGS. 87 and 88 used for the 9 types of encoding rates r (=5/15, 6/15, 7/15, 8/15, 9/15, 10/15, 11/15, 12, 15, and 13/15) of the LDPC codes when the modulation scheme is 4096QAM.

In FIG. 96, each column indicates a value of u #k indicating the coordinates of the signal point of the 1D NUC used when the modulation scheme is 4096QAM and the encoding rates r of the LDPC codes are 5/15, 6/15, 7/15, 8/15, 9/15, 10/15, 11/15, 12, 15, and 13/15.

u #k indicates the real part $Re(z_q)$ and the imaginary part $Im(z_q)$ of the complex number serving as the coordinates of the signal point $z_q$ of the 1D NUC.

FIG. 97 is an illustration of a relation between the symbol y of 4096QAM and u #k serving as each of the real part $Re(z_q)$ and the imaginary part $Im(z_q)$ of the complex number indicating the coordinates of the signal point $z_q$ of the 1D NUC corresponding to the symbol y.

A method of obtaining the coordinates of the signal point of the 1D NUC of 4096QAM using FIGS. 96 and 97 is the same as the method of obtaining the coordinates of the signal point of the 1D NUC of 1024QAM using FIGS. 94 and 95, and thus a description thereof is omitted.

Figure 98:
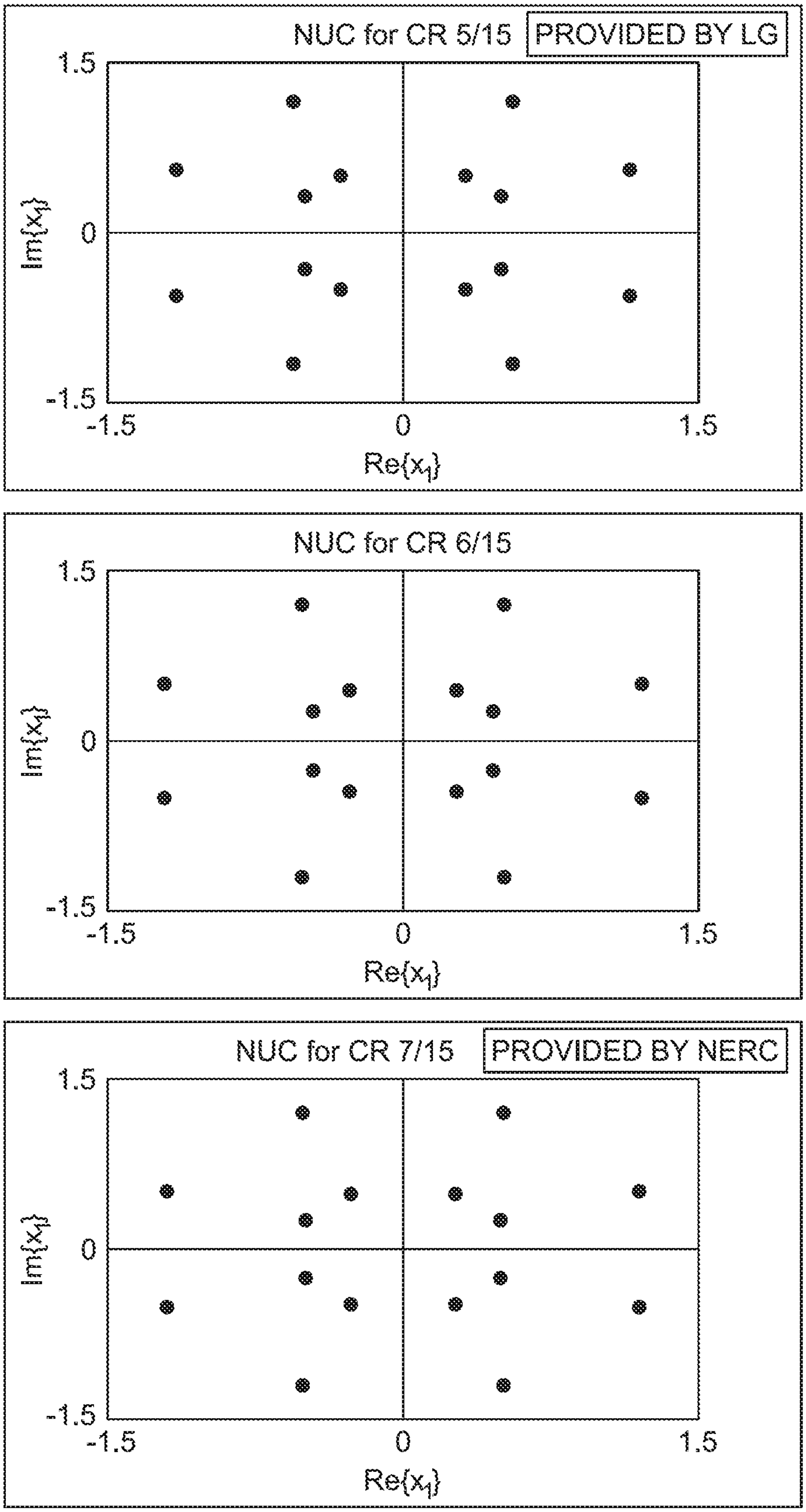
FIG. 98 is an illustration of another example of a constellation when a modulation scheme is 16QAM.
Figure 98:
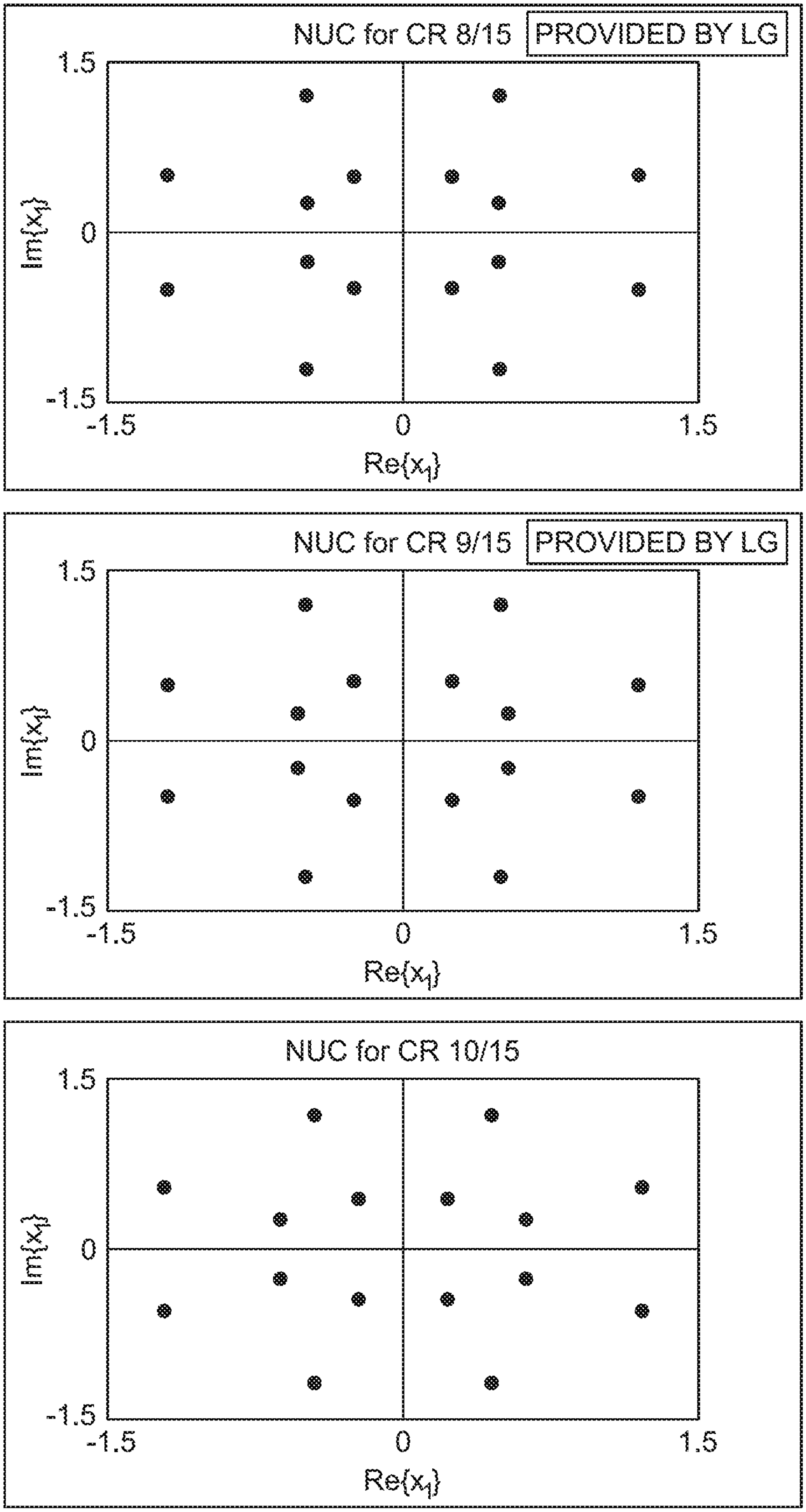
Figure 98:
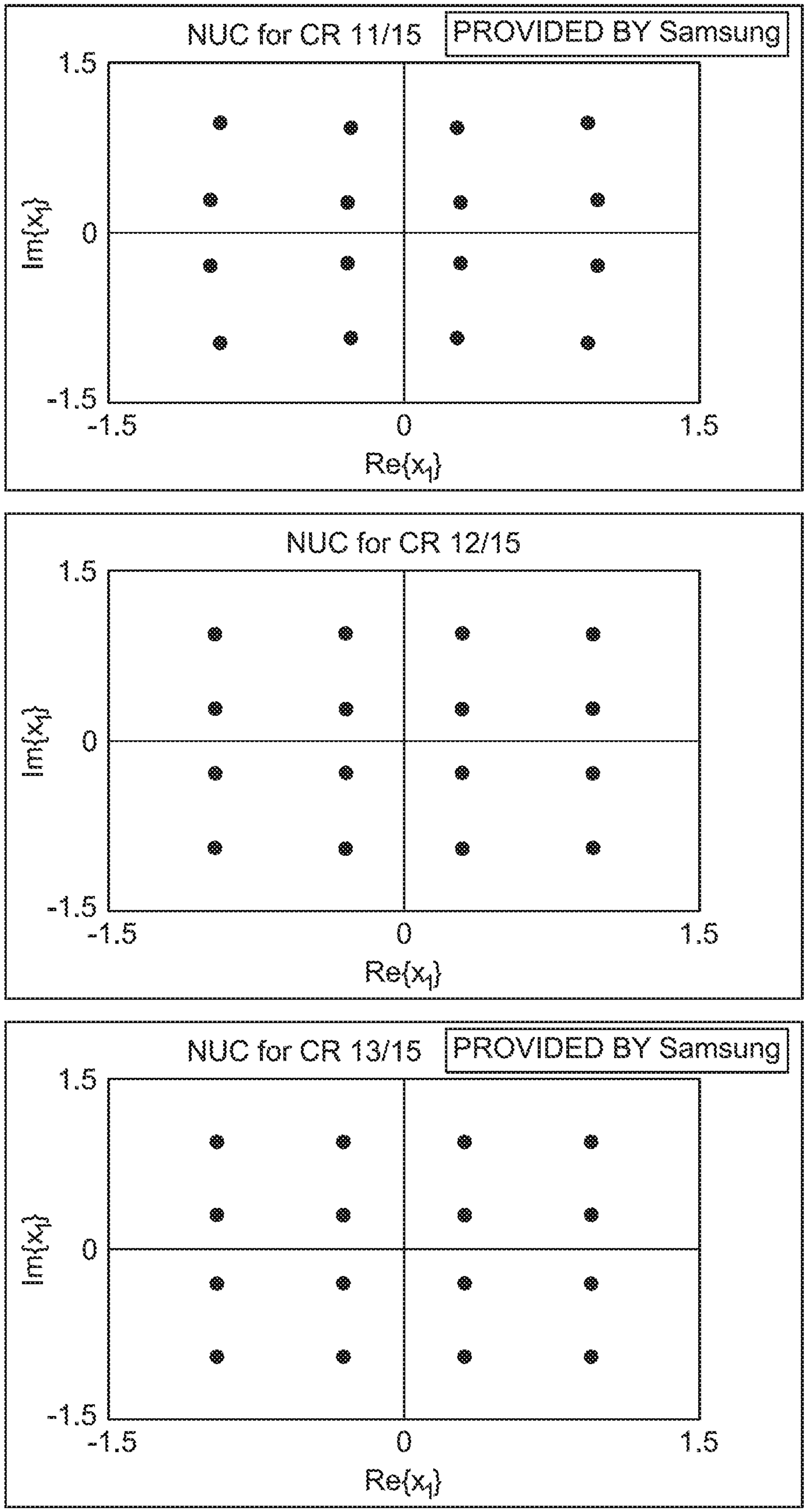

FIG. 98 is an illustration of another example of the constellation of the 2D NUC for each of the 9 types of encoding rates r of the LDPC codes when the modulation scheme is 16QAM.

Figure 99:
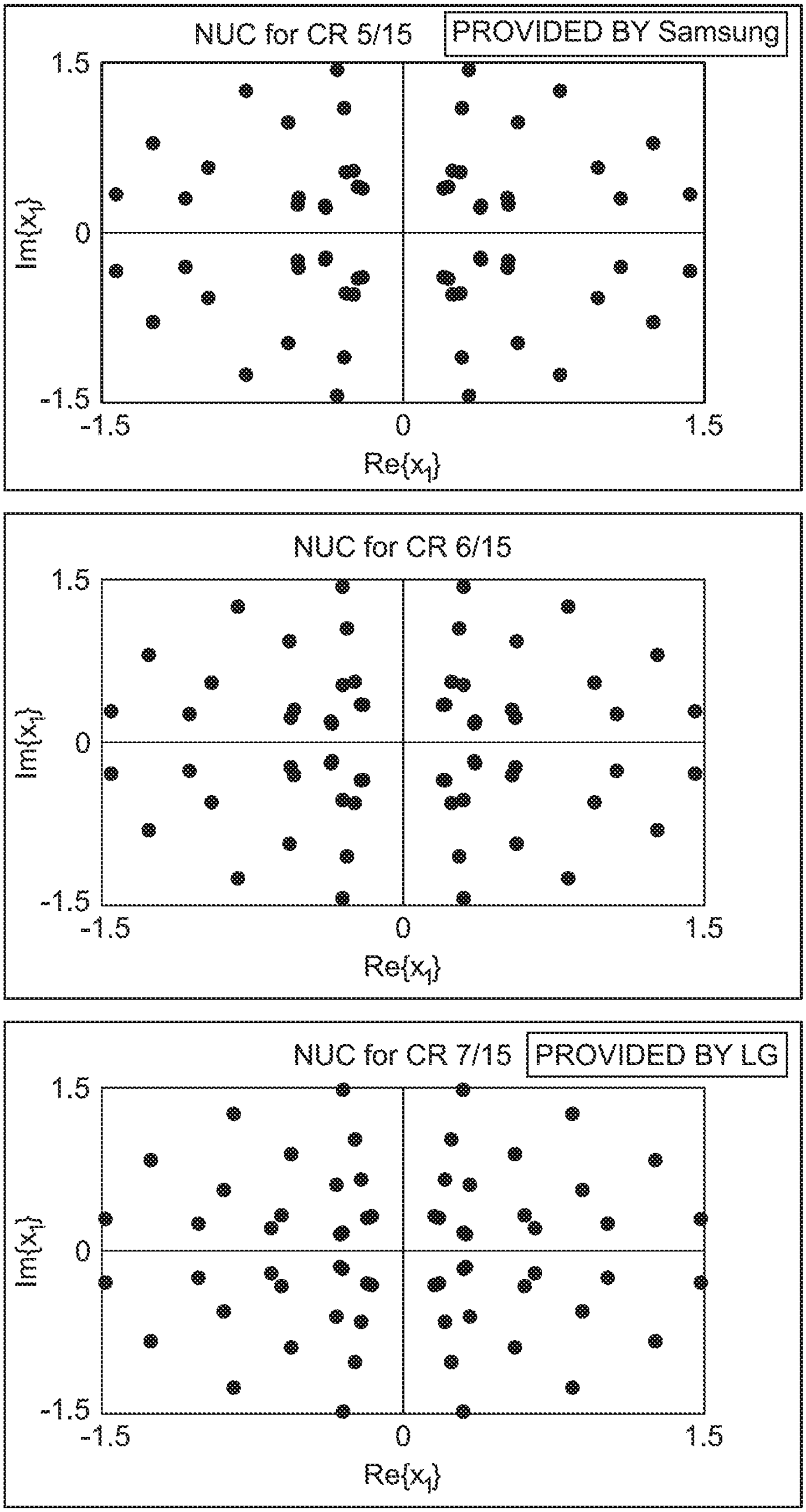
FIG. 99 is an illustration of another example of a constellation when a modulation scheme is 64QAM.

FIG. 99 is an illustration of another example of the constellation of the 2D NUC for each of the 9 types of encoding rates r of the LDPC codes when the modulation scheme is 64QAM.

Figure 100:
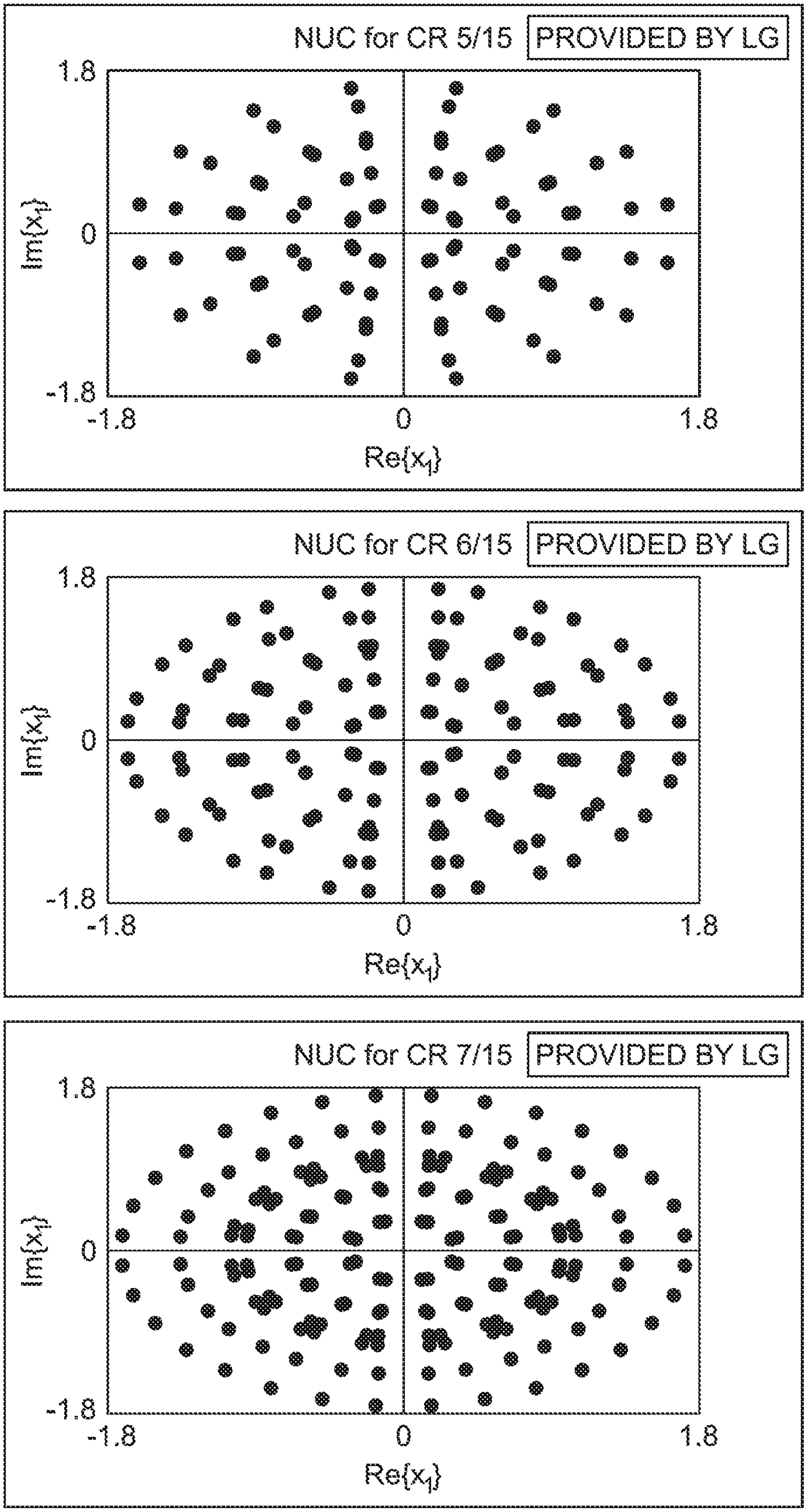
FIG. 100 is an illustration of another example of a constellation when a modulation scheme is 256QAM.

FIG. 100 is an illustration of another example of the constellation of the 2D NUC for each of the 9 types of encoding rates r of the LDPC codes when the modulation scheme is 256QAM.

In FIGS. 98 to 100, similarly to FIGS. 83 to 88, a horizontal axis and a vertical axis are the I axis and the Q axis, and $Re\{x_1\}$ and $Im\{x_1\}$ indicate the real part and the imaginary part of the signal point $x_1$ serving as the coordinates of the signal point $x_1$. Further, in FIGS. 98 to 100, a numerical value written after "for CR" indicates the encoding rate r of the LDPC code.

FIG. 101 is an illustration of another example of the coordinates of the signal point of the 2D NUC of FIG. 98 used for each of the 9 types of encoding rates r of the LDPC codes when the modulation scheme is 16QAM.

FIG. 102 is an illustration of another example of the coordinates of the signal point of the 2D NUC of FIG. 99 used for each of the 9 types of encoding rates r of the LDPC codes when the modulation scheme is 64QAM.

FIGS. 103 and 104 are illustrations of another example of the coordinates of the signal point of the 2D NUC of FIG. 100 used for each of the 9 types of encoding rates r of the LDPC codes when the modulation scheme is 256QAM.

In FIGS. 101 to 104, NUC_$2^m$_r indicates the coordinates of the signal point of the 2D NUC used when the modulation scheme is $2^m$QAM, and the encoding rate of the LDPC code is r, similarly to FIGS. 90 to 93.

The signal points of the 1D NUC are arranged in a grid form on a straight line parallel to the I axis or a straight line parallel to the Q axis. However, an interval between the signal points is not constant. Further, when the signal point (the mapped data) is transmitted, average power of the signal points on the constellation is normalized. The normalization is performed by multiplying each signal point $z_q$ on the constellation by a reciprocal $1/(\sqrt{P_{ave}})$ of a square root $\sqrt{P_{ave}}$ of a root mean square value $P_{ave}$ when a root mean square value of an absolute value for (coordinates of) all signal points on the constellation is indicated by $P_{ave}$.

According to the constellations described above with reference to FIGS. 83 to 104, it is confirmed that the excellent error rate is obtained.

<Block Interleaver 25>

Figure 105:
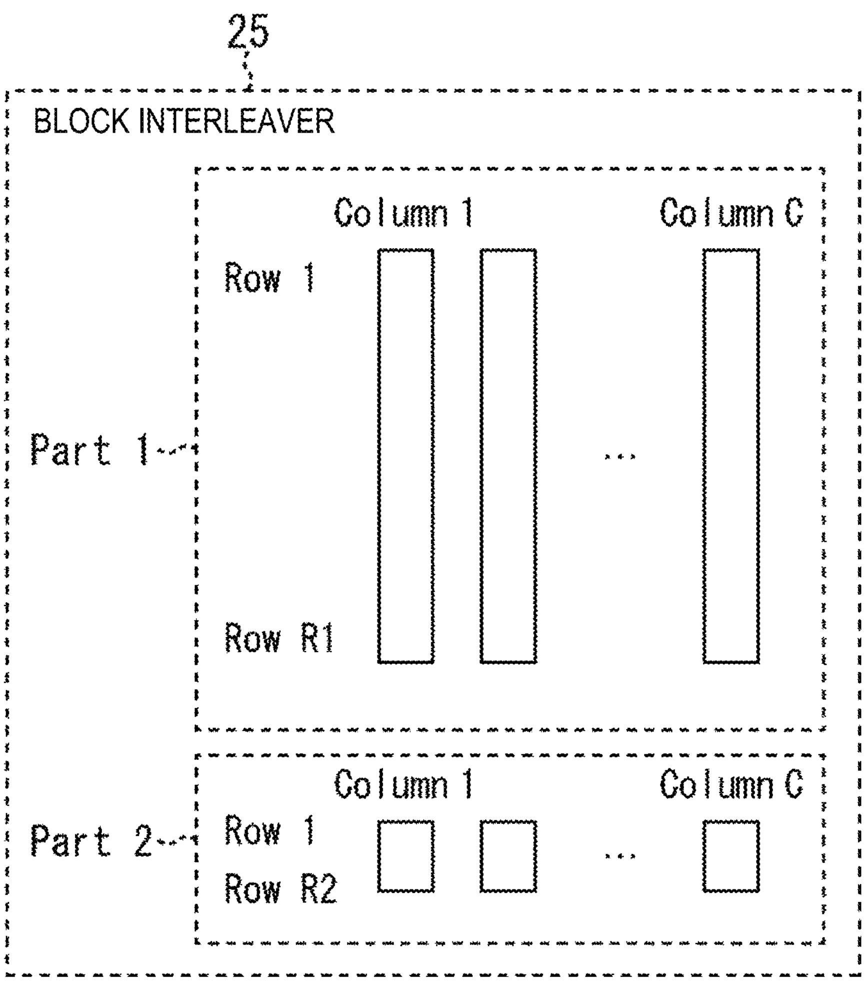
FIG. 105 is a block diagram illustrating a configuration example of a block interleaver 25.

FIG. 105 is a block diagram illustrating a configuration example of the block interleaver 25 of FIG. 9.

The block interleaver 25 includes a storage region called a part 1 and a storage region called a part 2.

Each of the parts 1 and 2 is configured such that a number C of columns equal in number to the number m of bits of the symbol and serving as storage regions that store one bit in the row (horizontal) direction and store a predetermined number of bits in the column (vertical) direction are arranged.

If the number of bits (hereinafter, also referred to as a part column length) that are stored in the column direction by the column of the part 1 is indicated by R1, and the part column length of the column of the part 2 is indicated by R2, (R1+R2)×C is equal to the code length N (64800 bits or 16200 bits in the present embodiment) of the LDPC code of the block interleave target.

Further, the part column length R1 is equal to a multiple of 360 bits serving as the unit size P, and the part column length R2 is equal to a remainder when a sum (hereinafter, also referred to as a column length) R1+R2 of the part column length R1 of the part 1 and the part column length R2 of the part 2 is divided by 360 bits serving as the unit size P.

Here, the column length R1+R2 is equal to a value obtained by dividing the code length N of the LDPC code of the block interleave target by the number m of bits of the symbol.

For example, when 16QAM is employed as the modulation scheme for the LDPC code in which the code length N is 16200 bits, the number m of bits of the symbol is 4 bits, and thus the column length R1+R2 is 4050 (=16200/4) bits.

Further, since the remainder when the column length R1+R2=4050 is divided by 360 bits serving as the unit size P is 90, the part column length R2 of the part 2 is 90 bits.

Further, the part column length R1 of the part 1 is R1+R2−R2=4050−90=3960 bits.

FIG. 106 is an illustration of the number C of columns of the parts 1 and 2 and the part column lengths (the number of rows) R1 and R2 for a combination of the code length N and the modulation scheme.

FIG. 106 illustrates the number C of columns of the parts 1 and 2 and the part column lengths R1 and R2 for combinations of the LDPC code in which the code length N is 16200 bits and the LDPC code in which the code length N is 64800 bits and the modulation schemes of QPSK, 16QAM, 64QAM, 256QAM, 1024QAM, and 4096QAM.

Figure 107:
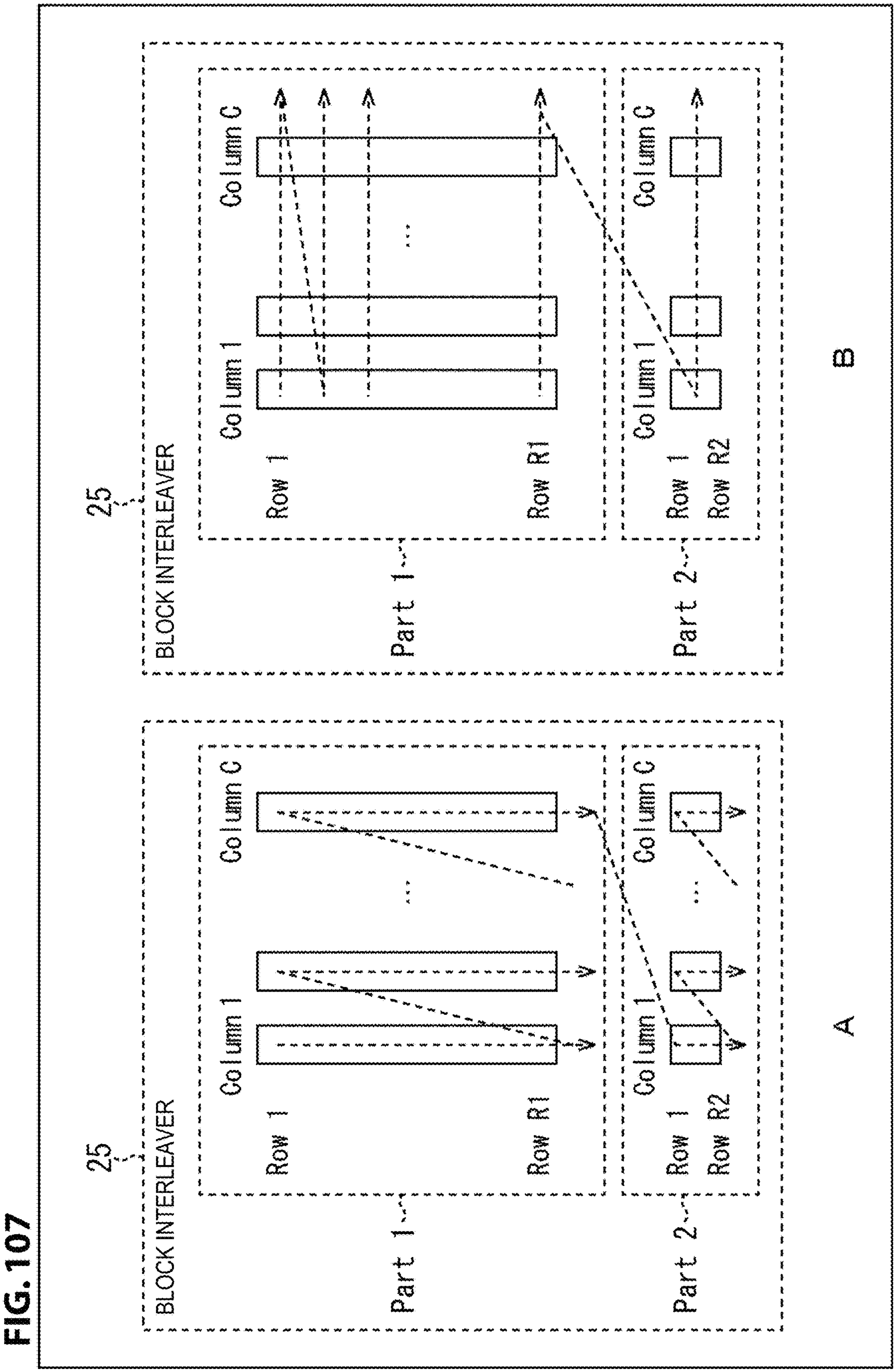
FIG. 107 is an illustration of block interleave performed by a block interleaver 25.

FIG. 107 is an illustration of the block interleave performed by the block interleaver 25 of FIG. 105.

The block interleaver 25 performs the block interleave by writing the LDPC code in the parts 1 and 2 and reading the LDPC code from the parts 1 and 2.

In other words, in the block interleave, writing of the code bits of the LDPC code of one code word downward (in the column direction) in the column of the part 1 is performed from the column at the left side to the column at the right side as illustrated in A of FIG. 107.

Then, when the writing of the code bits is completed to the bottom of the rightmost column (a C-th column) of the columns of the part 1, writing of the remaining code bits downward (in the column direction) in the column of the part 2 is performed from the column at the left side to the column at the right side.

Thereafter, when the writing of the code bits is completed to the bottom of the rightmost column (the C-th column) of the columns of the part 2, the code bits are read from the 1st rows of all the C columns of the part 1 in the row direction in units of C=m bits.

Then, the reading of the code bits from all the C columns of the part 1 is sequentially performed toward a row therebelow, and when the reading is completed up to an R1-th row serving as the last row, the code bits are read from the 1st rows of all the C columns of the part 2 in the row direction in units of C=m bits.

The reading of the code bits from all the C columns of the part 2 is sequentially performed toward a row therebelow and the reading is performed up to an R2 row serving as the last row.

As a result, the code bits read from the parts 1 and 2 in units of m bits are supplied to the mapper 117 (FIG. 8) as the symbol.

<Group-Wise Interleave>

Figure 108:
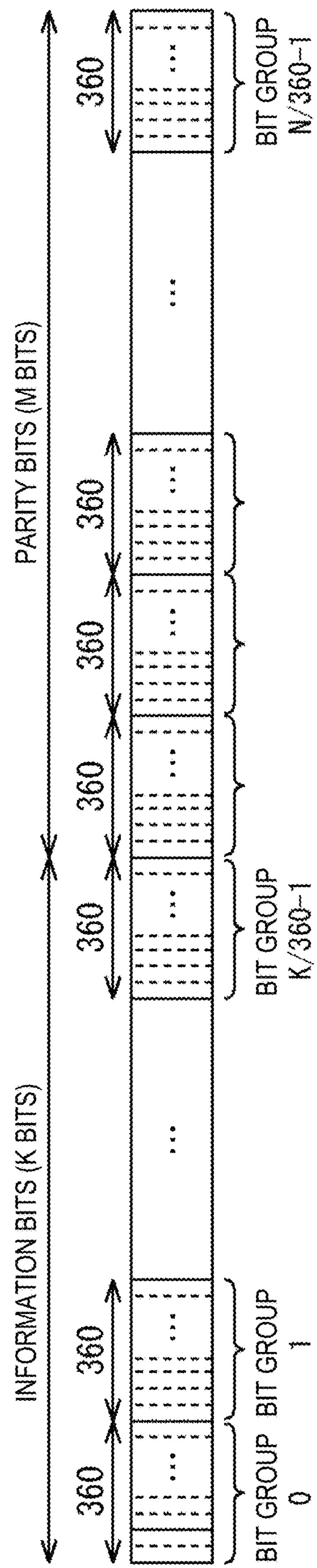
FIG. 108 is an illustration of group-wise interleave performed by a group-wise interleaver 24.

FIG. 108 is an illustration of the group-wise interleave performed by the group-wise interleaver 24 of FIG. 9.

In the group-wise interleave, 360 bits of one segment are used as the bit group, where the LDPC code of one code word is divided into segments in units of 360 bits equal to the unit size P, and the LDPC code of one code word is interleaved according to a predetermined pattern (hereinafter, also referred to as a GW pattern), starting from the head.

Here, when the LDPC code of one code word is segmented into the bit groups, an (i+1)-th bit group from the head is also referred to as a bit group i.

When the unit size P is 360, for example, the LDPC code in which the code length N is 1800 bits is segmented into bit groups 0, 1, 2, 3, and 4, that is, 5 (=1800/360) bit groups. Further, for example, the LDPC code in which the code length N is 16200 bits is segmented into bit groups 0, 1, . . . , and 44, that is, 45 (=16200/360) bit groups, and the LDPC code in which the code length N is 64800 bits is segmented into bit groups 0, 1, . . . , and 179, that is, 180 (=64800/360) bit groups.

Hereinafter, the GW pattern is assumed to be indicated by a sequence of numbers indicating a bit group. For example, for the LDPC code in which the code length N is 1800 bits, for example, the GW pattern 4, 2, 0, 3, 1 indicates that a sequence of bit groups 0, 1, 2, 3, and 4 is interleaved (rearranged) into a sequence of bit groups 4, 2, 0, 3, and 1.

The GW pattern can be set at least for each code length N of the LDPC code.

<Example of GW Pattern for LDPC Code of 64 k Bits>

FIG. 109 is an illustration of a 1st example of the GW pattern for an LDPC code in which the code length N is 64 kbits.

According to the GW pattern of FIG. 109, a sequence of bit groups 0 to 179 of the LDPC code of 64 kbits is interleaved into a sequence of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

FIG. 110 is an illustration of a 2nd example of the GW pattern for an LDPC code in which the code length N is 64 kbits.

According to the GW pattern of FIG. 110, a sequence of bit groups 0 to 179 of the LDPC code of 64 kbits is interleaved into a sequence of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

FIG. 111 is an illustration of a 3rd example of the GW pattern for an LDPC code in which the code length N is 64 kbits.

According to the GW pattern of FIG. 111, a sequence of bit groups 0 to 179 of the LDPC code of 64 kbits is interleaved into a sequence of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20.

FIG. 112 is an illustration of a 4th example of the GW pattern for an LDPC code in which the code length N is 64 kbits.

According to the GW pattern of FIG. 112, a sequence of bit groups 0 to 179 of the LDPC code of 64 kbits is interleaved into a sequence of bit groups 139, 106, 125, 81, 88, 104, 3, 66, 60, 65, 2, 95, 155, 24, 151, 5, 51, 53, 29, 75, 52, 85, 8, 22, 98, 93, 168, 15, 86, 126, 173, 100, 130, 176, 20, 10, 87, 92, 175, 36, 143, 110, 67, 146, 149, 127, 133, 42, 84, 64, 78, 1, 48, 159, 79, 138, 46, 112, 164, 31, 152, 57, 144, 69, 27, 136, 122, 170, 132, 171, 129, 115, 107, 134, 89, 157, 113, 119, 135, 45, 148, 83, 114, 71, 128, 161, 140, 26, 13, 59, 38, 35, 96, 28, 0, 80, 174, 137, 49, 16, 101, 74, 179, 91, 44, 55, 169, 131, 163, 123, 145, 162, 108, 178, 12, 77, 167, 21, 154, 82, 54, 90, 177, 17, 41, 39, 7, 102, 156, 62, 109, 14, 37, 23, 153, 6, 147, 50, 47, 63, 18, 70, 68, 124, 72, 33, 158, 32, 118, 99, 105, 94, 25, 121, 166, 120, 160, 141, 165, 111, 19, 150, 97, 76, 73, 142, 117, 4, 172, 58, 11, 30, 9, 103, 40, 61, 43, 34, 56, and 116.

Figure 113:
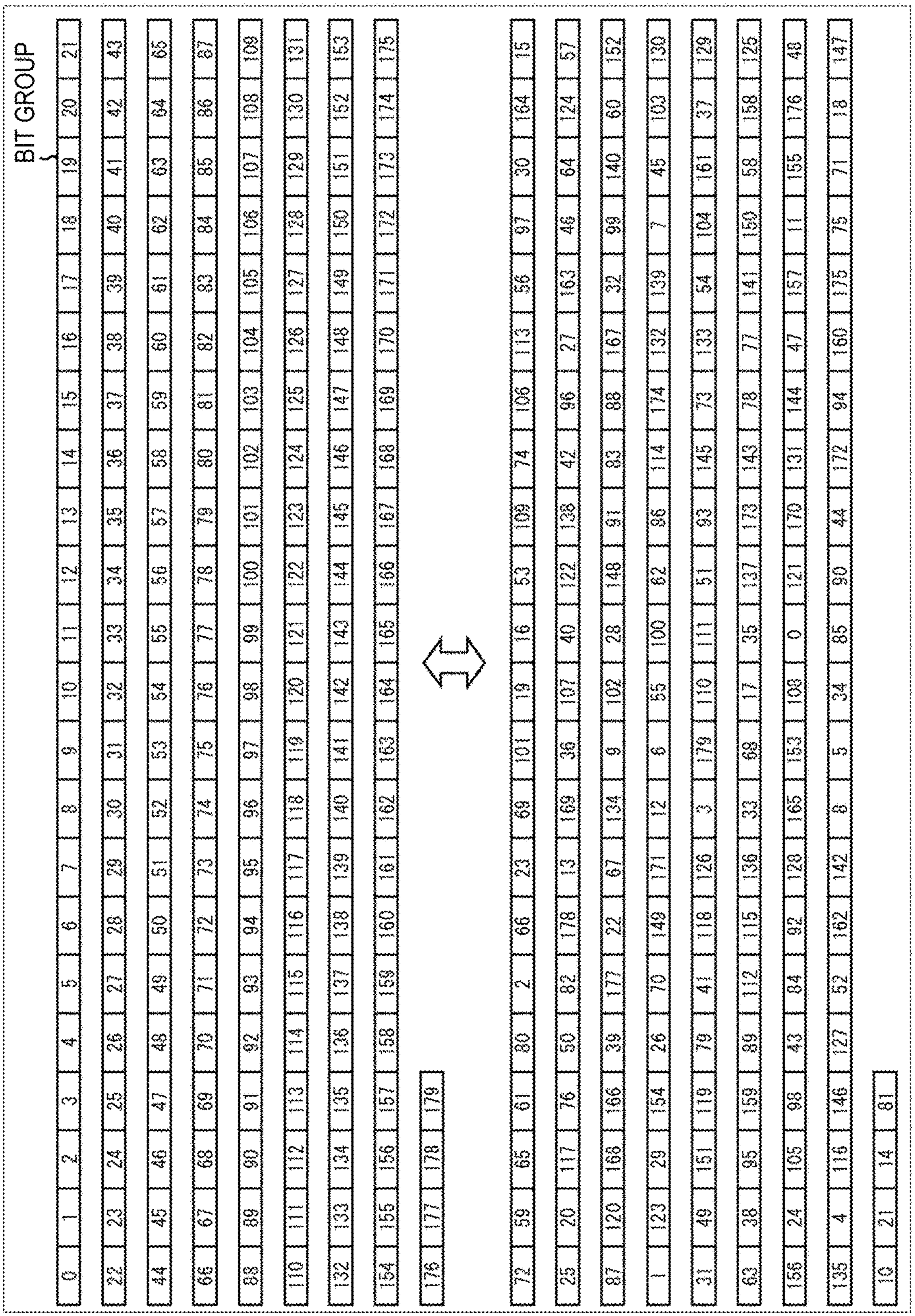
FIG. 113 is an illustration of a 5th example of a GW pattern for an LDPC code in which a code length N is 64 k bits.

FIG. 113 is an illustration of a 5th example of the GW pattern for an LDPC code in which the code length N is 64 kbits.

According to the GW pattern of FIG. 113, a sequence of bit groups 0 to 179 of the LDPC code of 64 kbits is interleaved into a sequence of bit groups 72, 59, 65, 61, 80, 2, 66, 23, 69, 101, 19, 16, 53, 109, 74, 106, 113, 56, 97, 30, 164, 15, 25, 20, 117, 76, 50, 82, 178, 13, 169, 36, 107, 40, 122, 138, 42, 96, 27, 163, 46, 64, 124, 57, 87, 120, 168, 166, 39, 177, 22, 67, 134, 9, 102, 28, 148, 91, 83, 88, 167, 32, 99, 140, 60, 152, 1, 123, 29, 154, 26, 70, 149, 171, 12, 6, 55, 100, 62, 86, 114, 174, 132, 139, 7, 45, 103, 130, 31, 49, 151, 119, 79, 41, 118, 126, 3, 179, 110, 111, 51, 93, 145, 73, 133, 54, 104, 161, 37, 129, 63, 38, 95, 159, 89, 112, 115, 136, 33, 68, 17, 35, 137, 173, 143, 78, 77, 141, 150, 58, 158, 125, 156, 24, 105, 98, 43, 84, 92, 128, 165, 153, 108, 0, 121, 170, 131, 144, 47, 157, 11, 155, 176, 48, 135, 4, 116, 146, 127, 52, 162, 142, 8, 5, 34, 85, 90, 44, 172, 94, 160, 175, 75, 71, 18, 147, 10, 21, 14, and 81.

FIG. 114 is an illustration of a 6th example of the GW pattern for an LDPC code in which the code length N is 64 kbits.

According to the GW pattern of FIG. 114, a sequence of bit groups 0 to 179 of the LDPC code of 64 kbits is interleaved into a sequence of bit groups 8, 27, 7, 70, 75, 84, 50, 131, 146, 99, 96, 141, 155, 157, 82, 57, 120, 38, 137, 13, 83, 23, 40, 9, 56, 171, 124, 172, 39, 142, 20, 128, 133, 2, 89, 153, 103, 112, 129, 151, 162, 106, 14, 62, 107, 110, 73, 71, 177, 154, 80, 176, 24, 91, 32, 173, 25, 16, 17, 159, 21, 92, 6, 67, 81, 37, 15, 136, 100, 64, 102, 163, 168, 18, 78, 76, 45, 140, 123, 118, 58, 122, 11, 19, 86, 98, 119, 111, 26, 138, 125, 74, 97, 63, 10, 152, 161, 175, 87, 52, 60, 22, 79, 104, 30, 158, 54, 145, 49, 34, 166, 109, 179, 174, 93, 41, 116, 48, 3, 29, 134, 167, 105, 132, 114, 169, 147, 144, 77, 61, 170, 90, 178, 0, 43, 149, 130, 117, 47, 44, 36, 115, 88, 101, 148, 69, 46, 94, 143, 164, 139, 126, 160, 156, 33, 113, 65, 121, 53, 42, 66, 165, 85, 127, 135, 5, 55, 150, 72, 35, 31, 51, 4, 1, 68, 12, 28, 95, 59, and 108.

Figure 115:
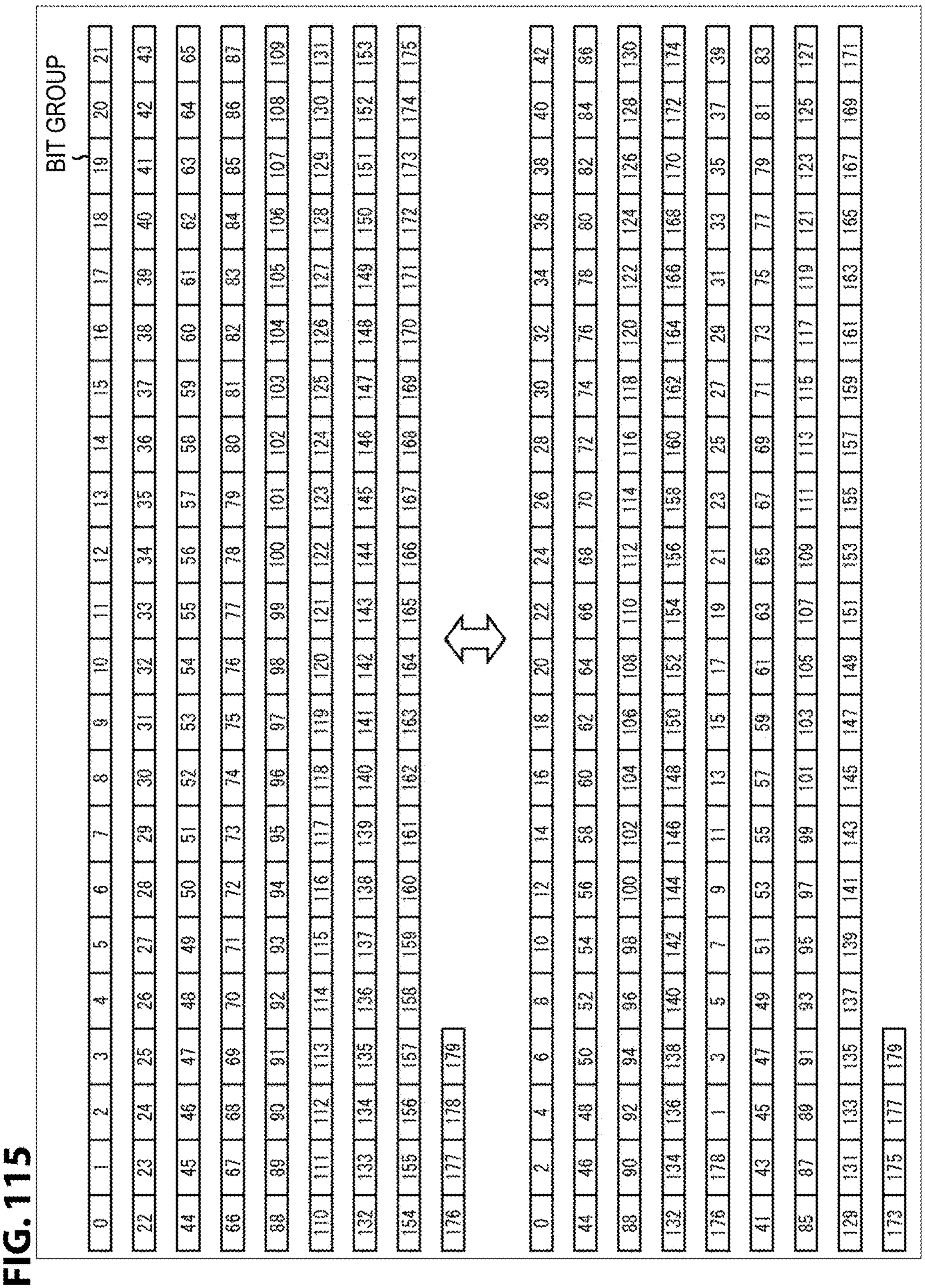
FIG. 115 is an illustration of a 7th example of a GW pattern for an LDPC code in which a code length N is 64 k bits.

FIG. 115 is an illustration of a 7th example of the GW pattern for an LDPC code in which the code length N is 64 kbits.

According to the GW pattern of FIG. 115, a sequence of bit groups 0 to 179 of the LDPC code of 64 kbits is interleaved into a sequence of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

Figure 116:
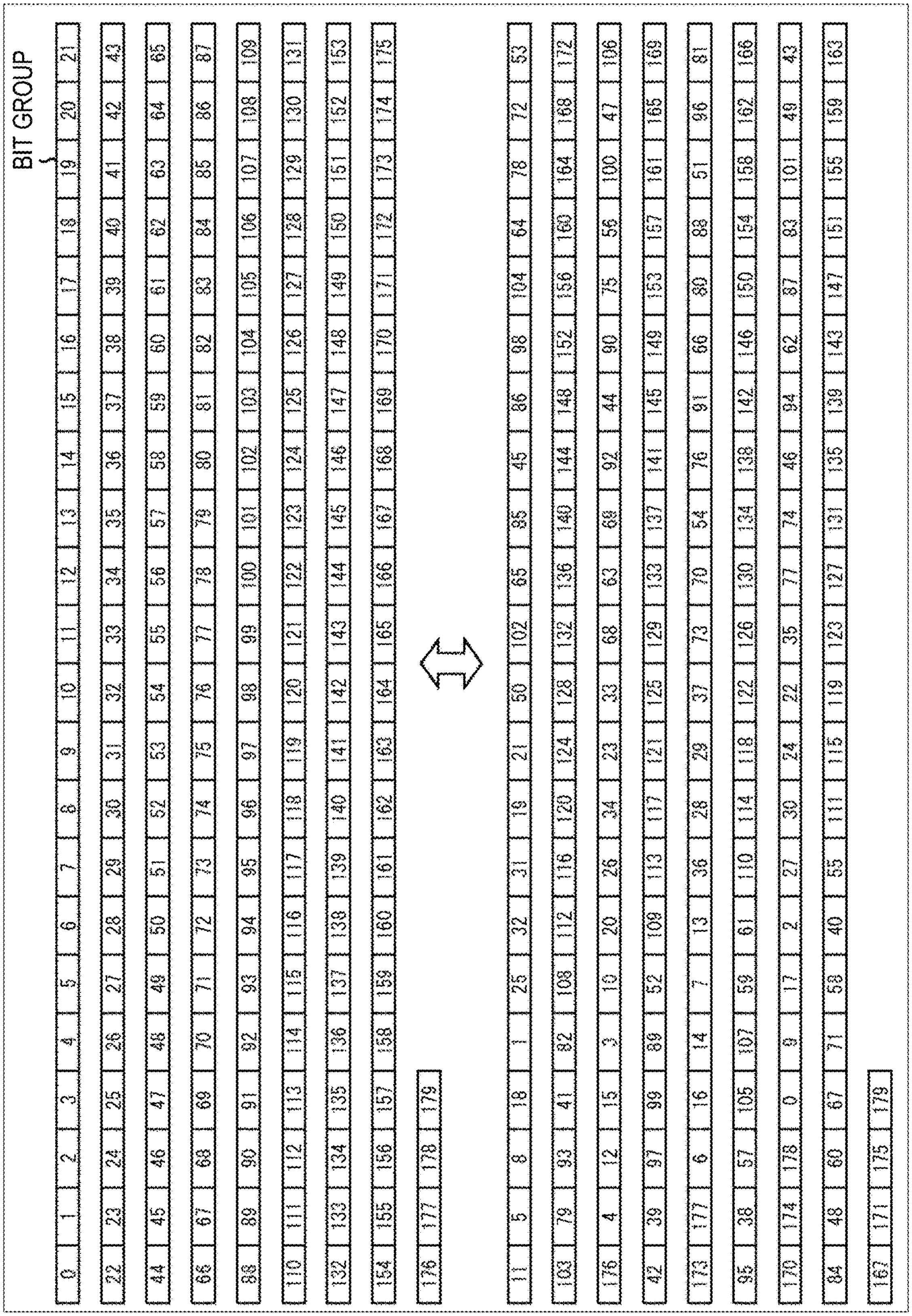
FIG. 116 is an illustration of an 8th example of a GW pattern for an LDPC code in which a code length N is 64 k bits.

FIG. 116 is an illustration of an 8th example of the GW pattern for an LDPC code in which the code length N is 64 kbits.

According to the GW pattern of FIG. 116, a sequence of bit groups 0 to 179 of the LDPC code of 64 kbits is interleaved into a sequence of bit groups 11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, and 179.

FIG. 117 is an illustration of a 9th example of the GW pattern for an LDPC code in which the code length N is 64 kbits.

According to the GW pattern of FIG. 117, a sequence of bit groups 0 to 179 of the LDPC code of 64 kbits is interleaved into a sequence of bit groups 9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, and 179.

Figure 118:
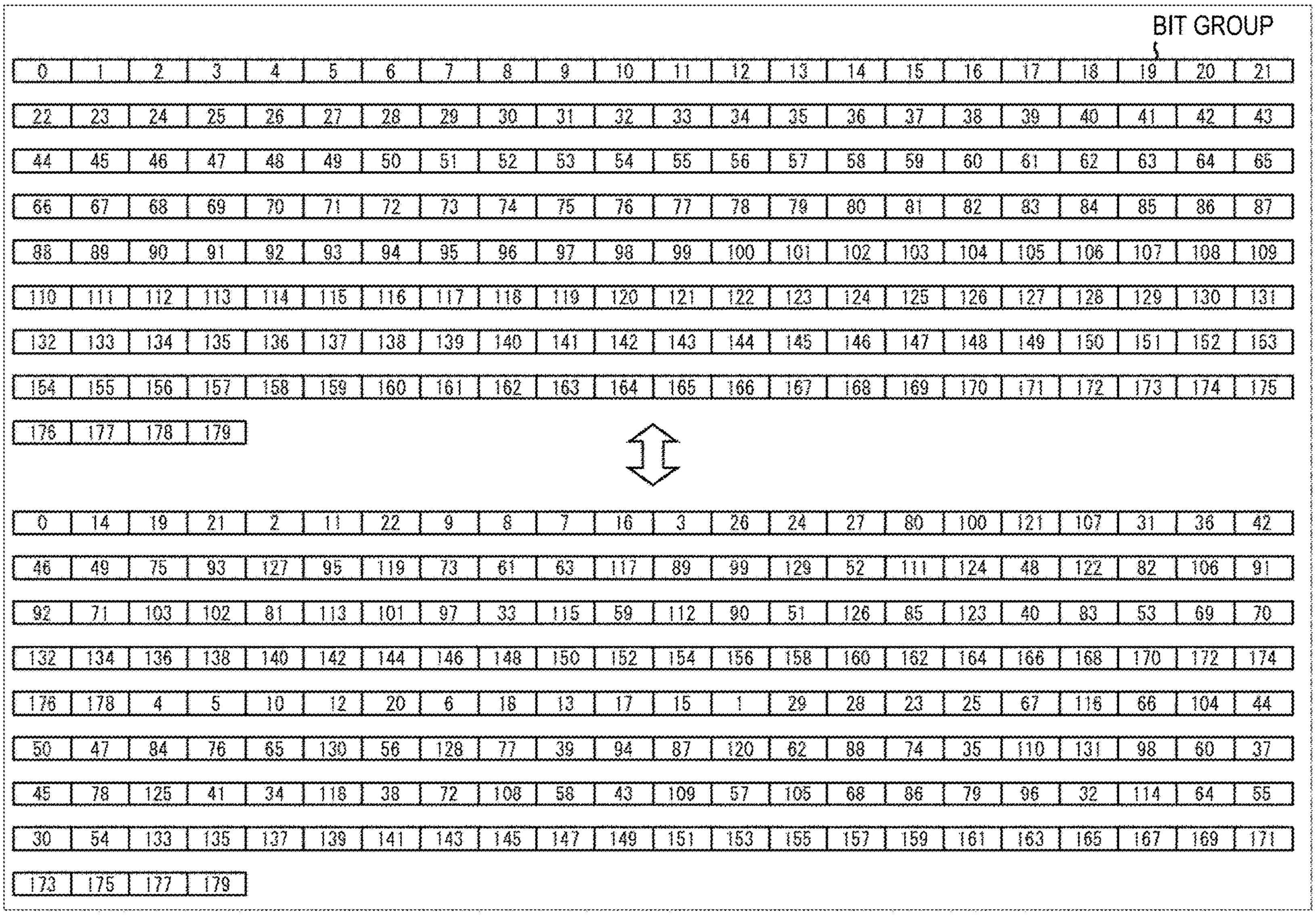
FIG. 118 is an illustration of a 10th example of a GW pattern for an LDPC code in which a code length N is 64 k bits.

FIG. 118 is an illustration of a 10th example of the GW pattern for an LDPC code in which the code length N is 64 kbits.

According to the GW pattern of FIG. 118, a sequence of bit groups 0 to 179 of the LDPC code of 64 kbits is interleaved into a sequence of bit groups 0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, and 179.

FIG. 119 is an illustration of an 11th example of the GW pattern for an LDPC code in which the code length N is 64 kbits.

According to the GW pattern of FIG. 119, a sequence of bit groups 0 to 179 of the LDPC code of 64 kbits is interleaved into a sequence of bit groups 21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, and 179.

FIG. 120 is an illustration of a 12th example of the GW pattern for an LDPC code in which the code length N is 64 kbits.

According to the GW pattern of FIG. 120, a sequence of bit groups 0 to 179 of the LDPC code of 64 kbits is interleaved into a sequence of bit groups 12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, and 179.

Figure 121:
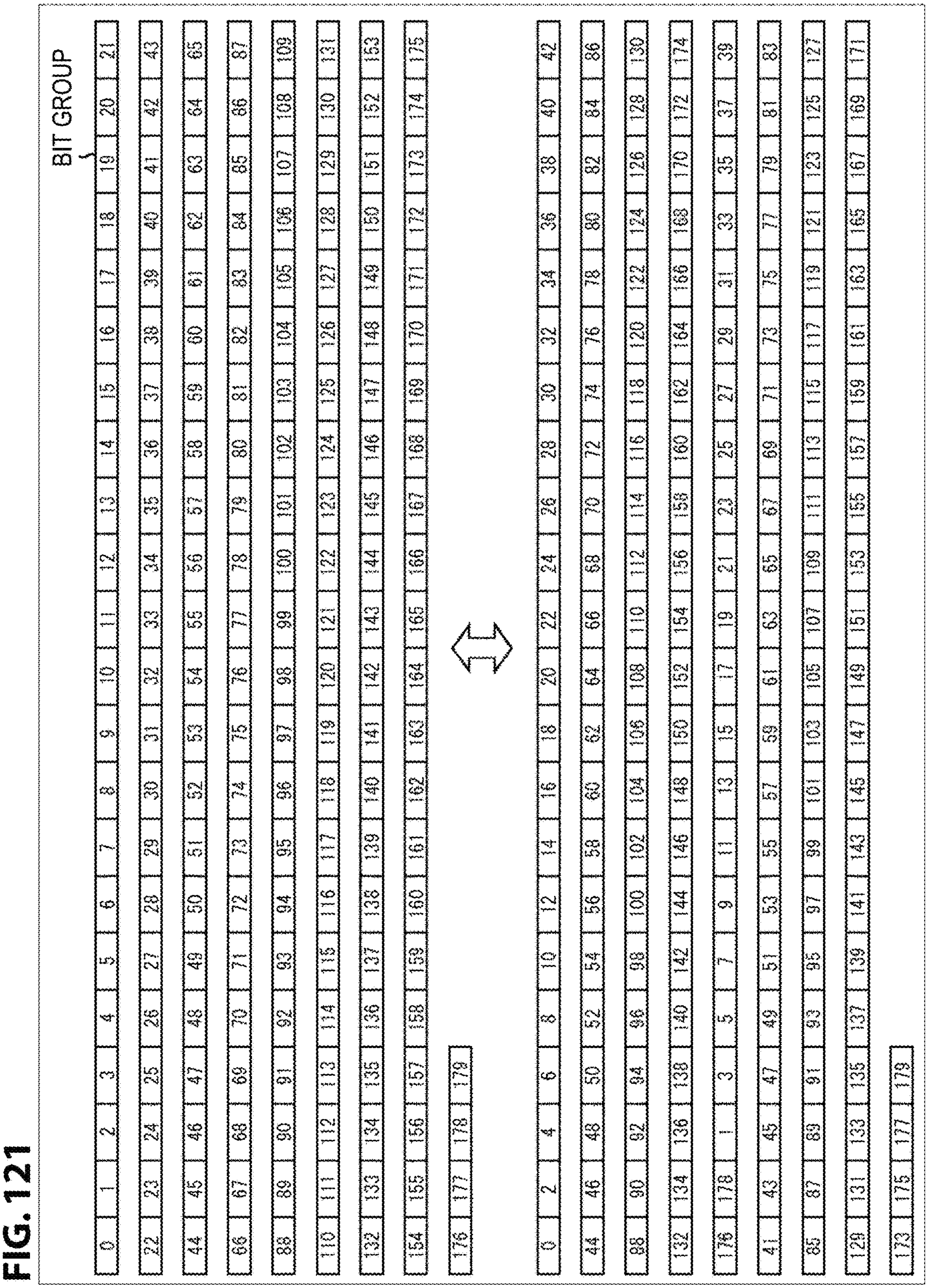

FIG. 121 is an illustration of a 13th example of the GW pattern for an LDPC code in which the code length N is 64 kbits.

According to the GW pattern of FIG. 121, a sequence of bit groups 0 to 179 of the LDPC code of 64 kbits is interleaved into a sequence of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

Figure 122:
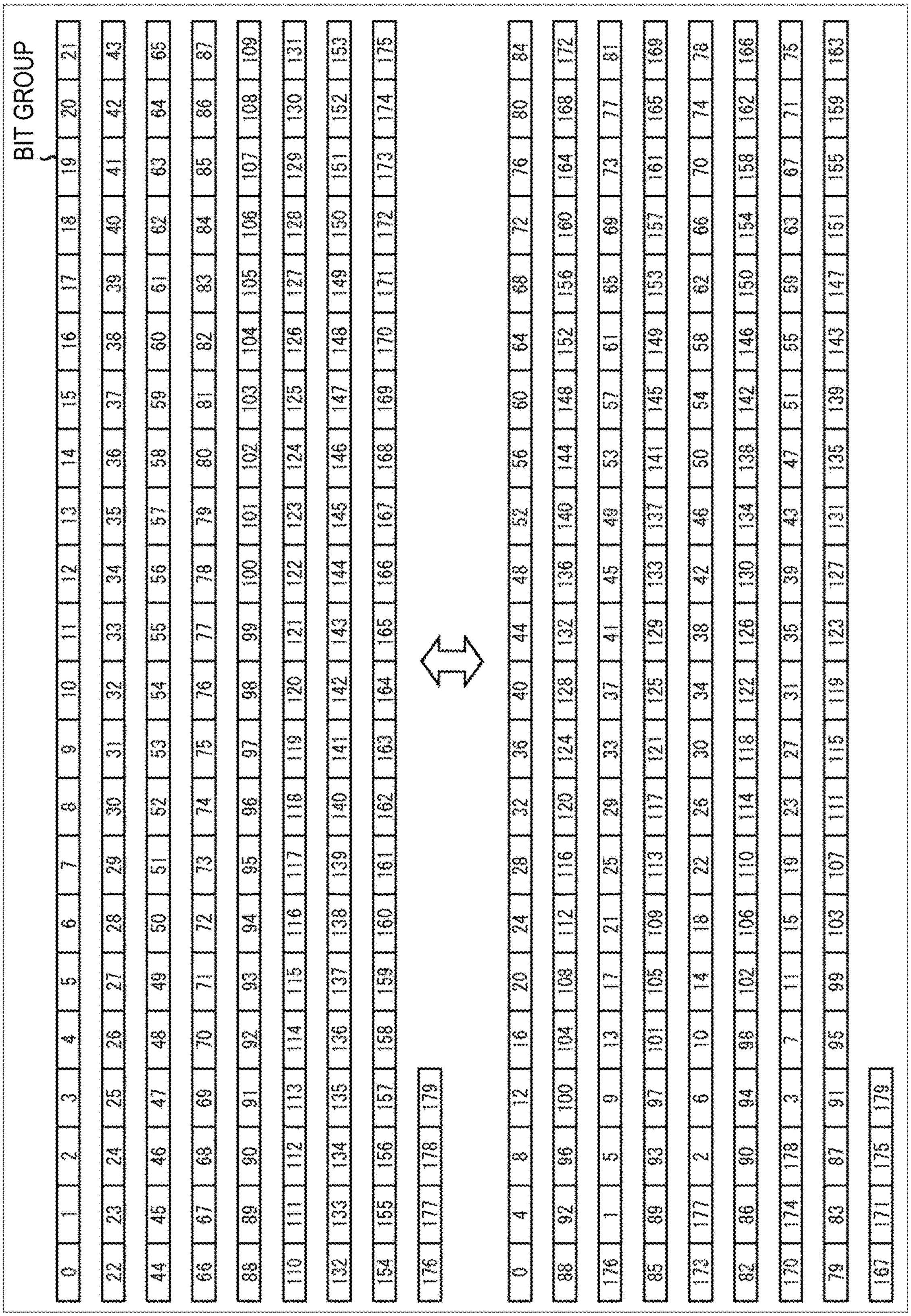

FIG. 122 is an illustration of a 14th example of the GW pattern for an LDPC code in which the code length N is 64 kbits.

According to the GW pattern of FIG. 122, a sequence of bit groups 0 to 179 of the LDPC code of 64 kbits is interleaved into a sequence of bit groups 0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, and 179.

FIG. 123 is an illustration of a 15th example of the GW pattern for an LDPC code in which the code length N is 64 kbits.

According to the GW pattern of FIG. 123, a sequence of bit groups 0 to 179 of the LDPC code of 64 kbits is interleaved into a sequence of bit groups 8, 112, 92, 165, 12, 55, 5, 126, 87, 70, 69, 94, 103, 78, 137, 148, 9, 60, 13, 7, 178, 79, 43, 136, 34, 68, 118, 152, 49, 15, 99, 61, 66, 28, 109, 125, 33, 167, 81, 93, 97, 26, 35, 30, 153, 131, 122, 71, 107, 130, 76, 4, 95, 42, 58, 134, 0, 89, 75, 40, 129, 31, 80, 101, 52, 16, 142, 44, 138, 46, 116, 27, 82, 88, 143, 128, 72, 29, 83, 117, 172, 14, 51, 159, 48, 160, 100, 1, 102, 90, 22, 3, 114, 19, 108, 113, 39, 73, 111, 155, 106, 105, 91, 150, 54, 25, 135, 139, 147, 36, 56, 123, 6, 67, 104, 96, 157, 10, 62, 164, 86, 74, 133, 120, 174, 53, 140, 156, 171, 149, 127, 85, 59, 124, 84, 11, 21, 132, 41, 145, 158, 32, 17, 23, 50, 169, 170, 38, 18, 151, 24, 166, 175, 2, 47, 57, 98, 20, 177, 161, 154, 176, 163, 37, 110, 168, 141, 64, 65, 173, 162, 121, 45, 77, 115, 179, 63, 119, 146, and 144.

FIG. 124 is an illustration of a 16th example of the GW pattern for an LDPC code in which the code length N is 64 kbits.

According to the GW pattern of FIG. 124 a sequence of bit groups 0 to 179 of the LDPC code of 64 kbits is interleaved into a sequence of bit groups 103, 138, 168, 82, 116, 45, 178, 28, 160, 2, 129, 148, 150, 23, 54, 106, 24, 78, 49, 87, 145, 179, 26, 112, 119, 12, 18, 174, 21, 48, 134, 137, 102, 147, 152, 72, 68, 3, 22, 169, 30, 64, 108, 142, 131, 13, 113, 115, 121, 37, 133, 136, 101, 59, 73, 161, 38, 164, 43, 167, 42, 144, 41, 85, 91, 58, 128, 154, 172, 57, 75, 17, 157, 19, 4, 86, 15, 25, 35, 9, 105, 123, 14, 34, 56, 111, 60, 90, 74, 149, 146, 62, 163, 31, 16, 141, 88, 6, 155, 130, 89, 107, 135, 79, 8, 10, 124, 171, 114, 162, 33, 66, 126, 71, 44, 158, 51, 84, 165, 173, 120, 7, 11, 170, 176, 1, 156, 96, 175, 153, 36, 47, 110, 63, 132, 29, 95, 143, 98, 70, 20, 122, 53, 100, 93, 140, 109, 139, 76, 151, 52, 61, 46, 125, 94, 50, 67, 81, 69, 65, 40, 127, 77, 32, 39, 27, 99, 97, 159, 166, 80, 117, 55, 92, 118, 0, 5, 83, 177, and 104.

FIG. 125 is an illustration of a 17th example of the GW pattern for an LDPC code in which the code length N is 64 kbits.

According to the GW pattern of FIG. 125, a sequence of bit groups 0 to 179 of the LDPC code of 64 kbits is interleaved into a sequence of bit groups 104, 120, 47, 136, 116, 109, 22, 20, 117, 61, 52, 108, 86, 99, 76, 90, 37, 58, 36, 138, 95, 130, 177, 93, 56, 33, 24, 82, 0, 67, 83, 46, 79, 70, 154, 18, 75, 43, 49, 63, 162, 16, 167, 80, 125, 1, 123, 107, 9, 45, 53, 15, 38, 23, 57, 141, 4, 178, 165, 113, 21, 105, 11, 124, 126, 77, 146, 29, 131, 27, 176, 40, 74, 91, 140, 64, 73, 44, 129, 157, 172, 51, 10, 128, 119, 163, 103, 28, 85, 156, 78, 6, 8, 173, 160, 106, 31, 54, 122, 25, 139, 68, 150, 164, 87, 135, 97, 166, 42, 169, 161, 137, 26, 39, 133, 5, 94, 69, 2, 30, 171, 149, 115, 96, 145, 101, 92, 143, 12, 88, 81, 71, 19, 147, 50, 152, 159, 155, 151, 174, 60, 32, 3, 142, 72, 14, 170, 112, 65, 89, 175, 158, 17, 114, 62, 144, 13, 98, 66, 59, 7, 118, 48, 153, 100, 134, 84, 111, 132, 127, 41, 168, 110, 102, 34, 121, 179, 148, 55, and 35.

FIG. 126 is an illustration of a 18th example of the GW pattern for an LDPC code in which the code length N is 64 kbits.

According to the GW pattern of FIG. 126, a sequence of bit groups 0 to 179 of the LDPC code of 64 kbits is interleaved into a sequence of bit groups 37, 98, 160, 63, 18, 6, 94, 136, 8, 50, 0, 75, 65, 32, 107, 60, 108, 17, 21, 156, 157, 5, 73, 66, 38, 177, 162, 130, 171, 76, 57, 126, 103, 62, 120, 134, 154, 101, 143, 29, 13, 149, 16, 33, 55, 56, 159, 128, 23, 146, 153, 141, 169, 49, 46, 152, 89, 155, 111, 127, 48, 14, 93, 41, 7, 78, 135, 69, 123, 179, 36, 87, 27, 58, 88, 170, 125, 110, 15, 97, 178, 90, 121, 173, 30, 102, 10, 80, 104, 166, 64, 4, 147, 1, 52, 45, 148, 68, 158, 31, 140, 100, 85, 115, 151, 70, 39, 82, 122, 79, 12, 91, 133, 132, 22, 163, 47, 19, 119, 144, 35, 25, 42, 83, 92, 26, 72, 138, 54, 124, 24, 74, 118, 117, 168, 71, 109, 112, 106, 176, 175, 44, 145, 11, 9, 161, 96, 77, 174, 137, 34, 84, 2, 164, 129, 43, 150, 61, 53, 20, 165, 113, 142, 116, 95, 3, 28, 40, 81, 99, 139, 114, 59, 67, 172, 131, 105, 167, 51, and 86.

FIG. 127 is an illustration of a 19th example of the GW pattern for an LDPC code in which the code length N is 64 kbits.

According to the GW pattern of FIG. 127, a sequence of bit groups 0 to 179 of the LDPC code of 64 kbits is interleaved into a sequence of bit groups 58, 70, 23, 32, 26, 63, 55, 48, 35, 41, 53, 20, 38, 51, 61, 65, 44, 29, 7, 2, 113, 68, 96, 104, 106, 89, 27, 0, 119, 21, 4, 49, 46, 100, 13, 36, 57, 98, 102, 9, 42, 39, 33, 62, 22, 95, 101, 15, 91, 25, 93, 132, 69, 87, 47, 59, 67, 124, 17, 11, 31, 43, 40, 37, 85, 50, 97, 140, 45, 92, 56, 30, 34, 60, 107, 24, 52, 94, 64, 5, 71, 90, 66, 103, 88, 86, 84, 19, 169, 159, 147, 126, 28, 130, 14, 162, 144, 166, 108, 153, 115, 135, 120, 122, 112, 139, 151, 156, 16, 172, 164, 123, 99, 54, 136, 81, 105, 128, 116, 150, 155, 76, 18, 142, 170, 175, 83, 146, 78, 109, 73, 131, 127, 82, 167, 77, 110, 79, 137, 152, 3, 173, 148, 72, 158, 117, 1, 6, 12, 8, 161, 74, 143, 133, 168, 171, 134, 163, 138, 121, 141, 160, 111, 10, 149, 80, 75, 165, 157, 174, 129, 145, 114, 125, 154, 118, 176, 177, 178, and 179.

FIG. 128 is an illustration of a 20th example of the GW pattern for an LDPC code in which the code length N is 64 kbits.

According to the GW pattern of FIG. 128, a sequence of bit groups 0 to 179 of the LDPC code of 64 kbits is interleaved into a sequence of bit groups 40, 159, 100, 14, 88, 75, 53, 24, 157, 84, 23, 77, 140, 145, 32, 28, 112, 39, 76, 50, 93, 27, 107, 25, 152, 101, 127, 5, 129, 71, 9, 21, 96, 73, 35, 106, 158, 49, 136, 30, 137, 115, 139, 48, 167, 85, 74, 72, 7, 110, 161, 41, 170, 147, 82, 128, 149, 33, 8, 120, 47, 68, 58, 67, 87, 155, 11, 18, 103, 151, 29, 36, 83, 135, 79, 150, 97, 54, 70, 138, 156, 31, 121, 34, 20, 130, 61, 57, 2, 166, 117, 15, 6, 165, 118, 98, 116, 131, 109, 62, 126, 175, 22, 111, 164, 16, 133, 102, 55, 105, 64, 177, 78, 37, 162, 124, 119, 19, 4, 69, 132, 65, 123, 160, 17, 52, 38, 1, 80, 90, 42, 81, 104, 13, 144, 51, 114, 3, 43, 146, 163, 59, 45, 89, 122, 169, 44, 94, 86, 99, 66, 171, 173, 0, 141, 148, 176, 26, 143, 178, 60, 153, 142, 91, 179, 12, 168, 113, 95, 174, 56, 134, 92, 46, 108, 125, 10, 172, 154, and 63.

Figure 129:
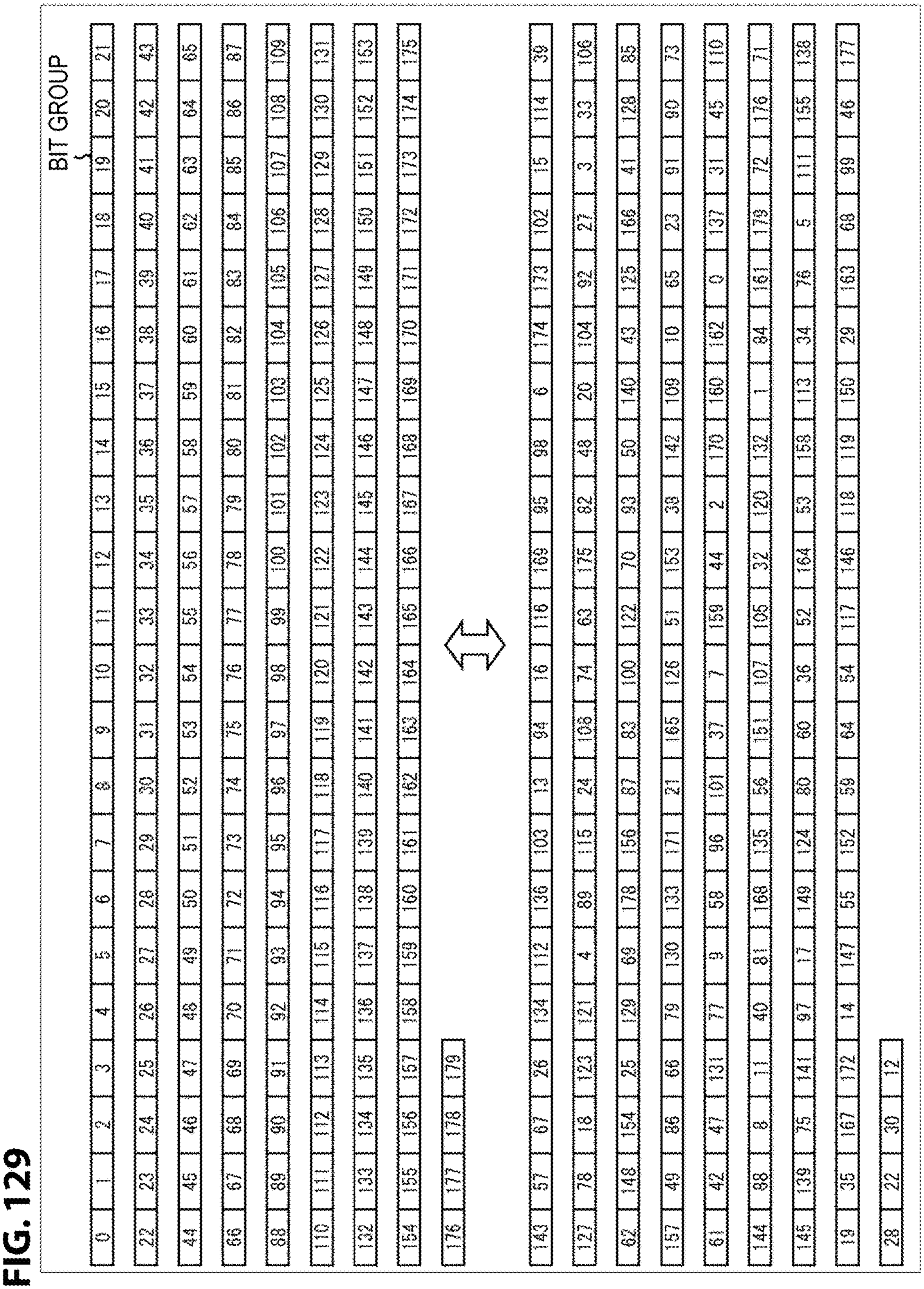

FIG. 129 is an illustration of a 21st example of the GW pattern for an LDPC code in which the code length N is 64 kbits.

According to the GW pattern of FIG. 129, a sequence of bit groups 0 to 179 of the LDPC code of 64 kbits is interleaved into a sequence of bit groups 143, 57, 67, 26, 134, 112, 136, 103, 13, 94, 16, 116, 169, 95, 98, 6, 174, 173, 102, 15, 114, 39, 127, 78, 18, 123, 121, 4, 89, 115, 24, 108, 74, 63, 175, 82, 48, 20, 104, 92, 27, 3, 33, 106, 62, 148, 154, 25, 129, 69, 178, 156, 87, 83, 100, 122, 70, 93, 50, 140, 43, 125, 166, 41, 128, 85, 157, 49, 86, 66, 79, 130, 133, 171, 21, 165, 126, 51, 153, 38, 142, 109, 10, 65, 23, 91, 90, 73, 61, 42, 47, 131, 77, 9, 58, 96, 101, 37, 7, 159, 44, 2, 170, 160, 162, 0, 137, 31, 45, 110, 144, 88, 8, 11, 40, 81, 168, 135, 56, 151, 107, 105, 32, 120, 132, 1, 84, 161, 179, 72, 176, 71, 145, 139, 75, 141, 97, 17, 149, 124, 80, 60, 36, 52, 164, 53, 158, 113, 34, 76, 5, 111, 155, 138, 19, 35, 167, 172, 14, 147, 55, 152, 59, 64, 54, 117, 146, 118, 119, 150, 29, 163, 68, 99, 46, 177, 28, 22, 30, and 12.

FIG. 130 is an illustration of a 22nd example of the GW pattern for an LDPC code in which the code length N is 64 kbits.

According to the GW pattern of FIG. 130, a sequence of bit groups 0 to 179 of the LDPC code of 64 kbits is interleaved into a sequence of bit groups 116, 47, 155, 89, 109, 137, 103, 60, 114, 14, 148, 100, 28, 132, 129, 105, 154, 7, 167, 140, 160, 30, 57, 32, 81, 3, 86, 45, 69, 147, 125, 52, 20, 22, 156, 168, 17, 5, 93, 53, 61, 149, 56, 62, 112, 48, 11, 21, 166, 73, 158, 104, 79, 128, 135, 126, 63, 26, 44, 97, 13, 151, 123, 41, 118, 35, 131, 8, 90, 58, 134, 6, 78, 130, 82, 106, 99, 178, 102, 29, 108, 120, 107, 139, 23, 85, 36, 172, 174, 138, 95, 145, 170, 122, 50, 19, 91, 67, 101, 92, 179, 27, 94, 66, 171, 39, 68, 9, 59, 146, 15, 31, 38, 49, 37, 64, 77, 152, 144, 72, 165, 163, 24, 1, 2, 111, 80, 124, 43, 136, 127, 153, 75, 42, 113, 18, 164, 133, 142, 98, 96, 4, 51, 150, 46, 121, 76, 10, 25, 176, 34, 110, 115, 143, 173, 169, 40, 65, 157, 175, 70, 33, 141, 71, 119, 16, 162, 177, 12, 84, 87, 117, 0, 88, 161, 55, 54, 83, 74, and 159.

Figure 131:
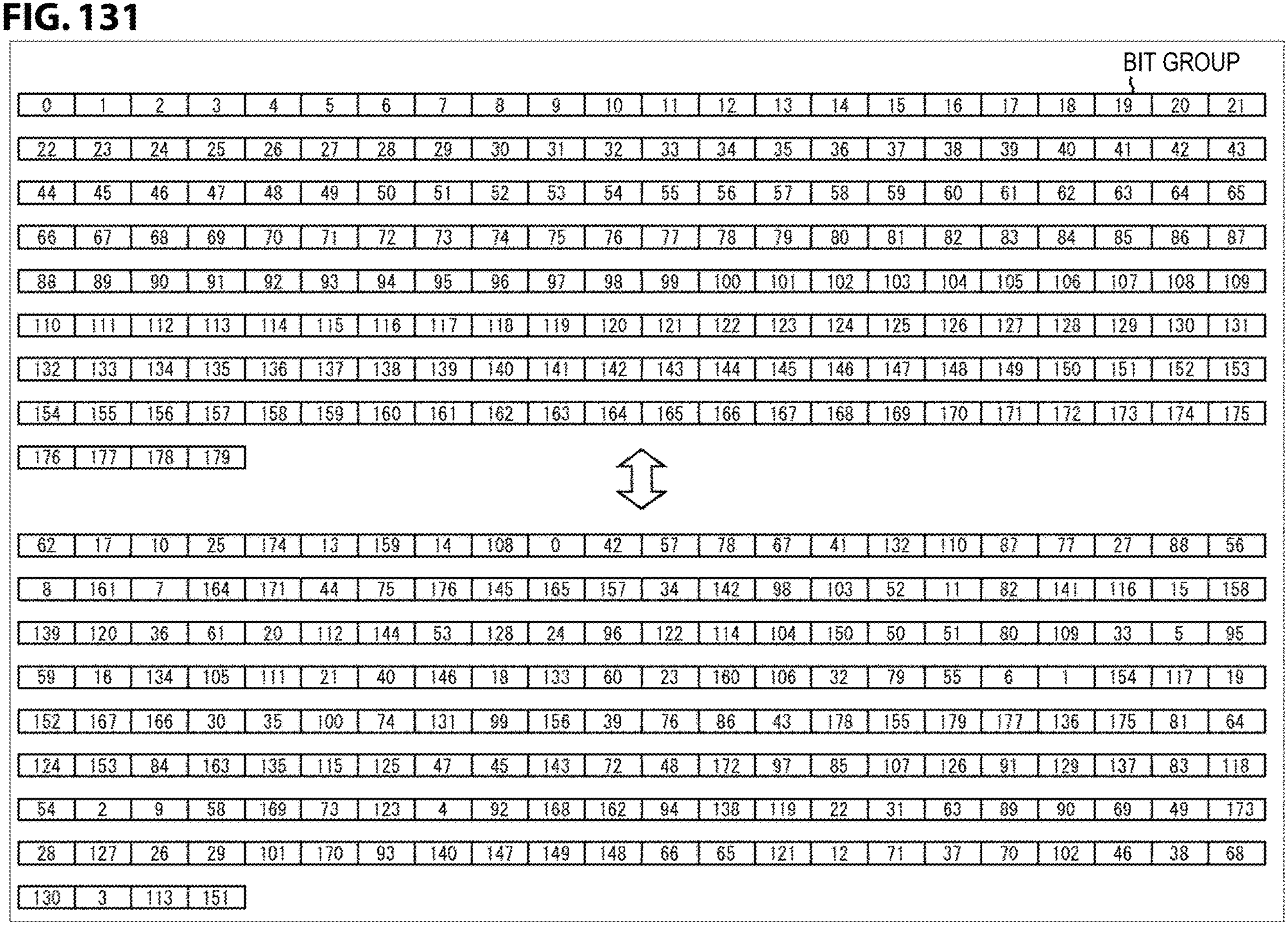

FIG. 131 is an illustration of a 23rd example of the GW pattern for an LDPC code in which the code length N is 64 kbits.

According to the GW pattern of FIG. 131, a sequence of bit groups 0 to 179 of the LDPC code of 64 kbits is interleaved into a sequence of bit groups 62, 17, 10, 25, 174, 13, 159, 14, 108, 0, 42, 57, 78, 67, 41, 132, 110, 87, 77, 27, 88, 56, 8, 161, 7, 164, 171, 44, 75, 176, 145, 165, 157, 34, 142, 98, 103, 52, 11, 82, 141, 116, 15, 158, 139, 120, 36, 61, 20, 112, 144, 53, 128, 24, 96, 122, 114, 104, 150, 50, 51, 80, 109, 33, 5, 95, 59, 16, 134, 105, 111, 21, 40, 146, 18, 133, 60, 23, 160, 106, 32, 79, 55, 6, 1, 154, 117, 19, 152, 167, 166, 30, 35, 100, 74, 131, 99, 156, 39, 76, 86, 43, 178, 155, 179, 177, 136, 175, 81, 64, 124, 153, 84, 163, 135, 115, 125, 47, 45, 143, 72, 48, 172, 97, 85, 107, 126, 91, 129, 137, 83, 118, 54, 2, 9, 58, 169, 73, 123, 4, 92, 168, 162, 94, 138, 119, 22, 31, 63, 89, 90, 69, 49, 173, 28, 127, 26, 29, 101, 170, 93, 140, 147, 149, 148, 66, 65, 121, 12, 71, 37, 70, 102, 46, 38, 68, 130, 3, 113, and 151.

FIG. 132 is an illustration of a 24th example of the GW pattern for an LDPC code in which the code length N is 64 kbits.

According to the GW pattern of FIG. 132, a sequence of bit groups 0 to 179 of the LDPC code of 64 kbits is interleaved into a sequence of bit groups 168, 18, 46, 131, 88, 90, 11, 89, 111, 174, 172, 38, 78, 153, 9, 80, 53, 27, 44, 79, 35, 83, 171, 51, 37, 99, 95, 119, 117, 127, 112, 166, 28, 123, 33, 160, 29, 6, 135, 10, 66, 69, 74, 92, 15, 109, 106, 178, 65, 141, 0, 3, 154, 156, 164, 7, 45, 115, 122, 148, 110, 24, 121, 126, 23, 175, 21, 113, 58, 43, 26, 143, 56, 142, 39, 147, 30, 25, 101, 145, 136, 19, 4, 48, 158, 118, 133, 49, 20, 102, 14, 151, 5, 2, 72, 103, 75, 60, 84, 34, 157, 169, 31, 161, 81, 70, 85, 159, 132, 41, 152, 179, 98, 144, 36, 16, 87, 40, 91, 1, 130, 108, 139, 94, 97, 8, 104, 13, 150, 137, 47, 73, 62, 12, 50, 61, 105, 100, 86, 146, 165, 22, 17, 57, 167, 59, 96, 120, 155, 77, 162, 55, 68, 140, 134, 82, 76, 125, 32, 176, 138, 173, 177, 163, 107, 170, 71, 129, 63, 93, 42, 52, 116, 149, 54, 128, 124, 114, 67, and 64.

FIG. 133 is an illustration of a 25th example of the GW pattern for an LDPC code in which the code length N is 64 kbits.

According to the GW pattern of FIG. 133, a sequence of bit groups 0 to 179 of the LDPC code of 64 kbits is interleaved into a sequence of bit groups 18, 150, 165, 42, 81, 48, 63, 45, 93, 152, 25, 16, 174, 29, 47, 83, 8, 60, 30, 66, 11, 113, 44, 148, 4, 155, 59, 33, 134, 99, 32, 176, 109, 72, 36, 111, 106, 73, 170, 126, 64, 88, 20, 17, 172, 154, 120, 121, 139, 77, 98, 43, 105, 133, 19, 41, 78, 15, 7, 145, 94, 136, 131, 163, 65, 31, 96, 79, 119, 143, 10, 95, 9, 146, 14, 118, 162, 37, 97, 49, 22, 51, 127, 6, 71, 132, 87, 21, 39, 38, 54, 115, 159, 161, 84, 108, 13, 102, 135, 103, 156, 67, 173, 76, 75, 164, 52, 142, 69, 130, 56, 153, 74, 166, 158, 124, 141, 58, 116, 85, 175, 169, 168, 147, 35, 62, 5, 123, 100, 90, 122, 101, 149, 112, 140, 86, 68, 89, 125, 27, 177, 160, 0, 80, 55, 151, 53, 2, 70, 167, 114, 129, 179, 138, 1, 92, 26, 50, 28, 110, 61, 82, 91, 117, 107, 178, 34, 157, 137, 128, 40, 24, 57, 3, 171, 46, 104, 12, 144, and 23.

FIG. 134 is an illustration of a 26th example of the GW pattern for an LDPC code in which the code length N is 64 kbits.

According to the GW pattern of FIG. 134, a sequence of bit groups 0 to 179 of the LDPC code of 64 kbits is interleaved into a sequence of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35.

FIG. 135 is an illustration of a 27th example of the GW pattern for an LDPC code in which the code length N is 64 kbits.

According to the GW pattern of FIG. 135, a sequence of bit groups 0 to 179 of the LDPC code of 64 kbits is interleaved into a sequence of bit groups 77, 50, 109, 128, 153, 12, 48, 17, 147, 55, 173, 172, 135, 121, 99, 162, 52, 40, 129, 168, 103, 87, 134, 105, 179, 10, 131, 151, 3, 26, 100, 15, 123, 88, 18, 91, 54, 160, 49, 1, 76, 80, 74, 31, 47, 58, 161, 9, 16, 34, 41, 21, 177, 11, 63, 6, 39, 165, 169, 125, 114, 57, 37, 67, 93, 96, 73, 106, 83, 166, 24, 51, 142, 65, 43, 64, 53, 72, 156, 81, 4, 155, 33, 163, 56, 150, 70, 167, 107, 112, 144, 149, 36, 32, 35, 59, 101, 29, 127, 138, 176, 90, 141, 92, 170, 102, 119, 25, 75, 14, 0, 68, 20, 97, 110, 28, 89, 118, 154, 126, 2, 22, 124, 85, 175, 78, 46, 152, 23, 86, 27, 79, 130, 66, 45, 113, 111, 62, 61, 7, 30, 133, 108, 171, 143, 60, 178, 5, 122, 44, 38, 148, 157, 84, 42, 139, 145, 8, 104, 115, 71, 137, 132, 146, 164, 98, 13, 117, 174, 158, 95, 116, 140, 94, 136, 120, 82, 69, 159, and 19.

FIG. 136 is an illustration of a 28th example of the GW pattern for an LDPC code in which the code length N is 64 kbits.

According to the GW pattern of FIG. 136, a sequence of bit groups 0 to 179 of the LDPC code of 64 kbits is interleaved into a sequence of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159.

FIG. 137 is an illustration of a 29th example of the GW pattern for an LDPC code in which the code length N is 64 kbits.

According to the GW pattern of FIG. 137, a sequence of bit groups 0 to 179 of the LDPC code of 64 kbits is interleaved into a sequence of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175.

FIG. 138 is an illustration of a 30th example of the GW pattern for an LDPC code in which the code length N is 64 kbits.

According to the GW pattern of FIG. 138, a sequence of bit groups 0 to 179 of the LDPC code of 64 kbits is interleaved into a sequence of bit groups 71, 38, 98, 159, 1, 32, 28, 177, 125, 102, 83, 17, 121, 151, 66, 92, 140, 6, 165, 23, 75, 91, 87, 108, 163, 50, 77, 39, 110, 128, 73, 148, 14, 5, 68, 37, 53, 93, 149, 26, 166, 48, 79, 10, 122, 150, 103, 178, 119, 101, 61, 34, 8, 86, 36, 138, 146, 72, 179, 143, 147, 89, 4, 107, 33, 144, 141, 40, 100, 29, 118, 63, 46, 20, 153, 90, 152, 124, 7, 30, 31, 43, 78, 120, 85, 25, 52, 47, 64, 81, 175, 94, 115, 15, 112, 99, 13, 21, 42, 169, 76, 19, 168, 16, 27, 162, 167, 164, 97, 82, 44, 106, 12, 109, 132, 145, 161, 174, 95, 0, 105, 134, 173, 84, 9, 65, 88, 54, 67, 116, 154, 80, 22, 172, 60, 111, 133, 56, 170, 104, 131, 123, 24, 49, 113, 136, 55, 3, 157, 156, 35, 58, 45, 155, 70, 59, 57, 171, 176, 74, 117, 18, 127, 114, 11, 69, 158, 129, 139, 62, 135, 96, 142, 41, 130, 160, 2, 126, 51, and 137.

FIG. 139 is an illustration of a 31th example of the GW pattern for an LDPC code in which the code length N is 64 kbits.

According to the GW pattern of FIG. 139, a sequence of bit groups 0 to 179 of the LDPC code of 64 kbits is interleaved into a sequence of bit groups 66, 61, 150, 157, 63, 42, 78, 44, 23, 154, 133, 101, 82, 26, 84, 123, 89, 31, 45, 102, 36, 134, 83, 117, 170, 27, 73, 137, 25, 32, 62, 91, 4, 20, 144, 145, 21, 74, 113, 148, 24, 135, 5, 19, 2, 34, 43, 168, 14, 64, 142, 115, 87, 38, 147, 39, 51, 152, 56, 86, 122, 76, 57, 129, 172, 6, 126, 10, 97, 85, 164, 3, 80, 90, 79, 124, 138, 120, 17, 103, 99, 116, 46, 98, 162, 151, 143, 11, 175, 160, 96, 132, 81, 171, 94, 65, 118, 161, 125, 178, 95, 112, 88, 174, 13, 35, 1, 167, 0, 128, 12, 58, 29, 169, 67, 28, 119, 166, 60, 55, 54, 130, 92, 146, 177, 149, 111, 9, 173, 179, 176, 75, 77, 114, 48, 159, 8, 141, 107, 139, 52, 100, 136, 105, 127, 47, 18, 69, 109, 16, 121, 59, 163, 165, 108, 106, 70, 22, 93, 41, 33, 110, 53, 140, 153, 158, 50, 15, 37, 72, 156, 7, 131, 49, 71, 68, 104, 30, 40, 155.

FIG. 140 is an illustration of a 32nd example of the GW pattern for an LDPC code in which the code length N is 64 kbits.

According to the GW pattern of FIG. 140, a sequence of bit groups 0 to 179 of the LDPC code of 64 kbits is interleaved into a sequence of bit groups 75, 83, 11, 24, 86, 104, 156, 76, 37, 173, 127, 61, 43, 139, 106, 69, 49, 2, 128, 140, 68, 14, 100, 8, 36, 73, 148, 65, 16, 47, 177, 6, 132, 45, 5, 30, 13, 22, 29, 27, 101, 150, 23, 90, 41, 93, 89, 92, 135, 4, 71, 87, 44, 124, 26, 64, 1, 129, 157, 130, 107, 18, 91, 118, 3, 82, 144, 113, 121, 54, 84, 97, 122, 120, 7, 154, 56, 134, 57, 161, 33, 116, 28, 96, 72, 172, 12, 115, 38, 164, 32, 167, 145, 17, 88, 39, 151, 80, 0, 136, 169, 142, 74, 147, 126, 166, 163, 40, 110, 171, 50, 160, 131, 70, 175, 103, 125, 77, 162, 31, 85, 66, 67, 52, 108, 159, 133, 42, 153, 21, 51, 119, 123, 98, 35, 48, 111, 149, 25, 58, 60, 158, 102, 59, 117, 20, 141, 143, 46, 53, 155, 15, 165, 152, 112, 176, 105, 178, 99, 174, 168, 114, 179, 78, 10, 19, 62, 63, 170, 138, 34, 109, 9, 146, 95, 94, 55, 137, 81, and 79.

FIG. 141 is an illustration of a 33rd example of the GW pattern for an LDPC code in which the code length N is 64 kbits.

According to the GW pattern of FIG. 141, a sequence of bit groups 0 to 179 of the LDPC code of 64 kbits is interleaved into a sequence of bit groups 98, 159, 59, 125, 163, 89, 26, 4, 102, 70, 92, 36, 37, 142, 176, 95, 71, 19, 87, 45, 81, 47, 65, 170, 103, 48, 67, 61, 64, 35, 76, 80, 140, 77, 10, 167, 178, 155, 120, 156, 151, 12, 58, 5, 83, 137, 41, 109, 2, 66, 133, 62, 135, 28, 93, 128, 86, 57, 153, 161, 110, 52, 147, 141, 31, 79, 32, 88, 160, 84, 150, 6, 100, 73, 126, 164, 17, 42, 101, 7, 55, 105, 91, 22, 130, 154, 1, 82, 14, 0, 9, 21, 50, 165, 72, 138, 175, 106, 108, 3, 169, 30, 157, 54, 18, 20, 44, 34, 134, 107, 56, 53, 15, 162, 38, 166, 24, 33, 60, 85, 145, 115, 43, 39, 40, 124, 149, 144, 132, 96, 11, 146, 90, 129, 119, 111, 171, 8, 152, 121, 173, 131, 49, 27, 118, 16, 148, 68, 177, 94, 179, 13, 114, 75, 51, 117, 25, 46, 136, 143, 139, 113, 127, 174, 74, 29, 122, 158, 69, 97, 78, 63, 99, 112, 104, 116, 172, 168, 23, and 123.

The 1st to 33rd examples of the GW pattern for the LDPC code in which the code length N is 64 kbits can be applied to any combination of the LDPC code in which the code length N is 64 kbits with an arbitrary encoding rate r and modulation scheme (constellation).

However, when the GW pattern to be applied to the group-wise interleave is set for each combination of the code length N of the LDPC code, the encoding rate r of the LDPC code, and the modulation scheme (constellation), the error rate of each combination can be further improved.

When the GW pattern of FIG. 109 is applied to, for example, the combination of the ETRI symbol (64 k, 5/15) and QPSK of FIG. 89, a particularly excellent error rate can be achieved.

When the GW pattern of FIG. 110 is applied to, for example, the combination of the ETRI symbol (64 k, 5/15) and 16QAM of FIG. 90, a particularly excellent error rate can be achieved.

When the GW pattern of FIG. 111 is applied to, for example, the combination of the ETRI symbol (64 k, 5/15) and 64QAM of FIG. 91, a particularly excellent error rate can be achieved.

When the GW pattern of FIG. 112 is applied to, for example, the combination of the Sony symbol (64 k, 7/15) and QPSK of FIG. 89, a particularly excellent error rate can be achieved.

When the GW pattern of FIG. 113 is applied to, for example, the combination of the Sony symbol (64 k, 7/15) and 16QAM of FIG. 90, a particularly excellent error rate can be achieved.

When the GW pattern of FIG. 114 is applied to, for example, the combination of the Sony symbol (64 k, 7/15) and 64QAM of FIG. 91, a particularly excellent error rate can be achieved.

When the GW pattern of FIG. 115 is applied to, for example, the combination of the Sony symbol (64 k, 9/15) and QPSK of FIG. 89, a particularly excellent error rate can be achieved.

When the GW pattern of FIG. 116 is applied to, for example, the combination of the Sony symbol (64 k, 9/15) and 16QAM of FIG. 90, a particularly excellent error rate can be achieved.

When the GW pattern of FIG. 117 is applied to, for example, the combination of the Sony symbol (64 k, 9/15) and 64QAM of FIG. 91, a particularly excellent error rate can be achieved.

When the GW pattern of FIG. 118 is applied to, for example, the combination of the Sony symbol (64 k, 11/15) and QPSK of FIG. 89, a particularly excellent error rate can be achieved.

When the GW pattern of FIG. 119 is applied to, for example, the combination of the Sony symbol (64 k, 11/15) and 16QAM of FIG. 90, a particularly excellent error rate can be achieved.

When the GW pattern of FIG. 120 is applied to, for example, the combination of the Sony symbol (64 k, 11/15) and 64QAM of FIG. 91, a particularly excellent error rate can be achieved.

When the GW pattern of FIG. 121 is applied to, for example, the combination of the Sony symbol (64 k, 13/15) and QPSK of FIG. 89, a particularly excellent error rate can be achieved.

When the GW pattern of FIG. 122 is applied to, for example, the combination of the Sony symbol (64 k, 13/15) and 16QAM of FIG. 90, a particularly excellent error rate can be achieved.

When the GW pattern of FIG. 123 is applied to, for example, the combination of the Sony symbol (64 k, 13/15) and 64QAM of FIG. 91, a particularly excellent error rate can be achieved.

When the GW pattern of FIG. 124 is applied to, for example, the combination of the ETRI symbol (64 k, 5/15) and 256QAM of FIGS. 92 and 93, a particularly excellent error rate can be achieved.

When the GW pattern of FIG. 125 is applied to, for example, the combination of the ETRI symbol (64 k, 7/15) and 256QAM of FIGS. 92 and 93, a particularly excellent error rate can be achieved.

When the GW pattern of FIG. 126 is applied to, for example, the combination of the Sony symbol (64 k, 7/15) and 256QAM of FIGS. 92 and 93, a particularly excellent error rate can be achieved.

When the GW pattern of FIG. 127 is applied to, for example, the combination of the Sony symbol (64 k, 9/15) and 256QAM of FIGS. 92 and 93, a particularly excellent error rate can be achieved.

When the GW pattern of FIG. 128 is applied to, for example, the combination of the NERC symbol (64 k, 9/15) and 256QAM of FIGS. 92 and 93, a particularly excellent error rate can be achieved.

When the GW pattern of FIG. 129 is applied to, for example, the combination of the Sony symbol (64 k, 11/15) and 256QAM of FIGS. 92 and 93, a particularly excellent error rate can be achieved.

When the GW pattern of FIG. 130 is applied to, for example, the combination of the Sony symbol (64 k, 13/15) and 256QAM of FIGS. 92 and 93, a particularly excellent error rate can be achieved.

When the GW pattern of FIG. 131 is applied to, for example, the combination of the ETRI symbol (64 k, 5/15) and 1024QAM of FIGS. 94 and 95, a particularly excellent error rate can be achieved.

When the GW pattern of FIG. 132 is applied to, for example, the combination of the ETRI symbol (64 k, 7/15) and 1024QAM of FIGS. 94 and 95, a particularly excellent error rate can be achieved.

When the GW pattern of FIG. 133 is applied to, for example, the combination of the Sony symbol (64 k, 7/15) and 1024QAM of FIGS. 94 and 95, a particularly excellent error rate can be achieved.

When the GW pattern of FIG. 134 is applied to, for example, the combination of the Sony symbol (64 k, 9/15) and 1024QAM of FIGS. 94 and 95, a particularly excellent error rate can be achieved.

When the GW pattern of FIG. 135 is applied to, for example, the combination of the NERC symbol (64 k, 9/15) and 1024QAM of FIGS. 94 and 95, a particularly excellent error rate can be achieved.

When the GW pattern of FIG. 136 is applied to, for example, the combination of the Sony symbol (64 k, 11/15) and 1024QAM of FIGS. 94 and 95, a particularly excellent error rate can be achieved.

When the GW pattern of FIG. 137 is applied to, for example, the combination of the Sony symbol (64 k, 13/15) and 1024QAM of FIGS. 94 and 95, a particularly excellent error rate can be achieved.

When the GW pattern of FIG. 138 is applied to, for example, the combination of the Samsung symbol (64 k, 6/15) and 4096QAM of FIGS. 96 and 97, a particularly excellent error rate can be achieved.

When the GW pattern of FIG. 139 is applied to, for example, the combination of the ETRI symbol (64 k, 7/15) and 4096QAM of FIGS. 96 and 97, a particularly excellent error rate can be achieved.

When the GW pattern of FIG. 140 is applied to, for example, the combination of the Samsung symbol (64 k, 8/15) and 4096QAM of FIGS. 96 and 97, a particularly excellent error rate can be achieved.

When the GW pattern of FIG. 141 is applied to, for example, the combination of the Sony symbol (64 k, 9/15) and 4096QAM of FIGS. 96 and 97, a particularly excellent error rate can be achieved.

<Example of GW Pattern for LDPC Code of 16 k Bits>

FIG. 142 is an illustration of a 1st example of a GW pattern for an LDPC code in which a code length N is 16 k bits.

According to the GW pattern of FIG. 142, a sequence of bit groups 0 to 44 of the LDPC code of 16 kbits is interleaved into a sequence of bit groups 21, 41, 15, 29, 0, 23, 16, 12, 38, 43, 2, 3, 4, 20, 31, 27, 5, 33, 28, 30, 36, 8, 40, 13, 6, 9, 18, 24, 7, 39, 10, 17, 37, 1, 19, 22, 25, 26, 14, 32, 34, 11, 35, 42, and 44.

FIG. 143 is an illustration of a 2nd example of a GW pattern for an LDPC code in which a code length N is 16 k bits.

According to the GW pattern of FIG. 143, a sequence of bit groups 0 to 44 of the LDPC code of 16 kbits is interleaved into a sequence of bit groups 1, 3, 2, 8, 5, 23, 13, 12, 18, 19, 17, 20, 24, 26, 28, 30, 32, 34, 36, 38, 40, 42, 0, 4, 6, 7, 21, 16, 10, 15, 9, 11, 22, 14, 25, 27, 29, 31, 33, 35, 37, 39, 41, 43, and 44.

FIG. 144 is an illustration of a 3rd example of a GW pattern for an LDPC code in which a code length N is 16 k bits.

According to the GW pattern of FIG. 144, a sequence of bit groups 0 to 44 of the LDPC code of 16 kbits is interleaved into a sequence of bit groups 1, 4, 5, 6, 24, 21, 18, 7, 17, 12, 8, 20, 23, 29, 28, 30, 32, 34, 36, 38, 40, 42, 0, 2, 3, 14, 22, 13, 10, 25, 9, 27, 19, 16, 15, 26, 11, 31, 33, 35, 37, 39, 41, 43, and 44.

FIG. 145 is an illustration of a 4th example of a GW pattern for an LDPC code in which a code length N is 16 k bits.

According to the GW pattern of FIG. 145, a sequence of bit groups 0 to 44 of the LDPC code of 16 kbits is interleaved into a sequence of bit groups 3, 0, 4, 7, 18, 9, 19, 27, 32, 10, 12, 24, 8, 35, 30, 17, 22, 20, 36, 38, 40, 42, 2, 5, 1, 6, 14, 15, 23, 16, 11, 21, 26, 13, 29, 33, 31, 28, 25, 34, 37, 39, 41, 43, and 44.

FIG. 146 is an illustration of a 5th example of a GW pattern for an LDPC code in which a code length N is 16 k bits.

According to the GW pattern of FIG. 146, a sequence of bit groups 0 to 44 of the LDPC code of 16 kbits is interleaved into a sequence of bit groups 37, 0, 41, 19, 43, 8, 38, 3, 29, 13, 22, 6, 4, 2, 9, 26, 39, 15, 12, 10, 33, 17, 20, 16, 21, 44, 42, 27, 7, 11, 30, 34, 24, 1, 23, 35, 36, 25, 31, 18, 28, 32, 40, 5, and 14.

FIG. 147 is an illustration of a 6th example of a GW pattern for an LDPC code in which a code length N is 16 k bits.

According to the GW pattern of FIG. 147, a sequence of bit groups 0 to 44 of the LDPC code of 16 kbits is interleaved into a sequence of bit groups 6, 28, 17, 4, 3, 38, 13, 41, 44, 43, 7, 40, 19, 2, 23, 16, 37, 15, 30, 20, 11, 8, 1, 27, 32, 34, 33, 39, 5, 9, 10, 18, 0, 31, 29, 26, 14, 21, 42, 22, 12, 24, 35, 25, and 36.

FIG. 148 is an illustration of a 7th example of a GW pattern for an LDPC code in which a code length N is 16 k bits.

According to the GW pattern of FIG. 148, a sequence of bit groups 0 to 44 of the LDPC code of 16 kbits is interleaved into a sequence of bit groups 27, 11, 20, 1, 7, 5, 29, 35, 9, 10, 34, 18, 25, 28, 6, 13, 17, 0, 23, 16, 41, 15, 19, 44, 24, 37, 4, 31, 8, 32, 14, 42, 12, 2, 40, 30, 36, 39, 43, 21, 3, 22, 26, 33, and 38.

FIG. 149 is an illustration of an 8th example of a GW pattern for an LDPC code in which a code length N is 16 k bits.

According to the GW pattern of FIG. 149, a sequence of bit groups 0 to 44 of the LDPC code of 16 kbits is interleaved into a sequence of bit groups 3, 6, 7, 27, 2, 23, 10, 30, 22, 28, 24, 20, 37, 21, 4, 14, 11, 42, 16, 9, 15, 26, 33, 40, 5, 8, 44, 34, 18, 0, 32, 29, 19, 41, 38, 17, 25, 43, 35, 36, 13, 39, 12, 1, and 31.

FIG. 150 is an illustration of a 9th example of a GW pattern for an LDPC code in which a code length N is 16 k bits.

According to the GW pattern of FIG. 150, a sequence of bit groups 0 to 44 of the LDPC code of 16 kbits is interleaved into a sequence of bit groups 31, 38, 7, 9, 13, 21, 39, 12, 10, 1, 43, 15, 30, 0, 14, 3, 42, 34, 40, 24, 28, 35, 8, 11, 23, 4, 20, 17, 41, 19, 5, 37, 22, 32, 18, 2, 26, 44, 25, 33, 36, 27, 16, 6, and 29.

FIG. 151 is an illustration of a 10th example of a GW pattern for an LDPC code in which a code length N is 16 k bits.

According to the GW pattern of FIG. 151, a sequence of bit groups 0 to 44 of the LDPC code of 16 kbits is interleaved into a sequence of bit groups 36, 6, 2, 20, 43, 17, 33, 22, 23, 25, 13, 0, 10, 7, 21, 1, 19, 26, 8, 14, 31, 35, 16, 5, 29, 40, 11, 9, 4, 34, 15, 42, 32, 28, 18, 37, 30, 39, 24, 41, 3, 38, 27, 12, and 44.

FIG. 152 is an illustration of a 11th example of a GW pattern for an LDPC code in which a code length N is 16 k bits.

According to the GW pattern of FIG. 152, a sequence of bit groups 0 to 44 of the LDPC code of 16 kbits is interleaved into a sequence of bit groups 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4.

FIG. 153 is an illustration of a 12th example of a GW pattern for an LDPC code in which a code length N is 16 k bits.

According to the GW pattern of FIG. 153, a sequence of bit groups 0 to 44 of the LDPC code of 16 kbits is interleaved into a sequence of bit groups 17, 11, 14, 7, 31, 10, 2, 26, 0, 32, 29, 22, 33, 12, 20, 28, 27, 39, 37, 15, 4, 5, 8, 13, 38, 18, 23, 34, 24, 6, 1, 9, 16, 44, 21, 3, 36, 30, 40, 35, 43, 42, 25, 19, and 41.

FIG. 154 is an illustration of a 13th example of a GW pattern for an LDPC code in which a code length N is 16 k bits.

According to the GW pattern of FIG. 154, a sequence of bit groups 0 to 44 of the LDPC code of 16 kbits is interleaved into a sequence of bit groups 1, 27, 17, 30, 11, 15, 9, 7, 5, 6, 32, 33, 2, 14, 3, 39, 18, 12, 29, 13, 41, 31, 4, 43, 35, 34, 40, 10, 19, 44, 8, 26, 21, 16, 28, 0, 23, 38, 25, 36, 22, 37, 42, 24, and 20.

FIG. 155 is an illustration of a 14th example of a GW pattern for an LDPC code in which a code length N is 16 k bits.

According to the GW pattern of FIG. 155, a sequence of bit groups 0 to 44 of the LDPC code of 16 kbits is interleaved into a sequence of bit groups 41, 2, 12, 6, 33, 1, 13, 11, 26, 10, 39, 43, 36, 23, 42, 7, 44, 20, 8, 38, 18, 22, 24, 40, 4, 28, 29, 19, 14, 5, 9, 0, 30, 25, 35, 37, 27, 32, 31, 34, 21, 3, 15, 17, and 16, FIG. 156 is an illustration of a 15th example of a GW pattern for an LDPC code in which a code length N is 16 k bits.

According to the GW pattern of FIG. 156, a sequence of bit groups 0 to 44 of the LDPC code of 16 kbits is interleaved into a sequence of bit groups 17, 2, 30, 12, 7, 25, 27, 3, 15, 14, 4, 26, 34, 31, 13, 22, 0, 39, 23, 24, 21, 6, 38, 5, 19, 42, 11, 32, 28, 40, 20, 18, 36, 9, 41, 10, 33, 37, 1, 16, 8, 43, 29, 35, and 44.

FIG. 157 is an illustration of a 16th example of a GW pattern for an LDPC code in which a code length N is 16 k bits.

According to the GW pattern of FIG. 157, a sequence of bit groups 0 to 44 of the LDPC code of 16 kbits is interleaved into a sequence of bit groups 28, 21, 10, 15, 8, 22, 26, 2, 14, 1, 27, 3, 39, 20, 34, 25, 12, 6, 7, 40, 30, 29, 38, 16, 43, 33, 4, 35, 9, 32, 5, 36, 0, 41, 37, 18, 17, 13, 24, 42, 31, 23, 19, 11, and 44.

The 1st to 16th examples of the GW pattern for the LDPC code in which the code length N is 16 kbits can be applied to any combination of the LDPC code in which the code length N is 16 kbits with an arbitrary encoding rate r and modulation scheme (constellation).

However, when the GW pattern to be applied to the group-wise interleave is set for each combination of the code length N of the LDPC code, the encoding rate r of the LDPC code, and the modulation scheme (constellation), the error rate of each combination can be further improved.

When the GW pattern of FIG. 142 is applied to, for example, the combination of the LGE symbol (16 k, 6/15) and QPSK of FIG. 89, a particularly excellent error rate can be achieved.

When the GW pattern of FIG. 143 is applied to, for example, the combination of the Sony symbol (16 k, 8/15) and QPSK of FIG. 89, a particularly excellent error rate can be achieved.

When the GW pattern of FIG. 144 is applied to, for example, the combination of the Sony symbol (16 k, 10/15) and QPSK of FIG. 89, a particularly excellent error rate can be achieved.

When the GW pattern of FIG. 145 is applied to, for example, the combination of the Sony symbol (16 k, 12/15) and QPSK of FIG. 89, a particularly excellent error rate can be achieved.

When the GW pattern of FIG. 146 is applied to, for example, the combination of the LGE symbol (16 k, 6/15) and 16QAM of FIG. 101, a particularly excellent error rate can be achieved.

When the GW pattern of FIG. 147 is applied to, for example, the combination of the Sony symbol (16 k, 8/15) and 16QAM of FIG. 101, a particularly excellent error rate can be achieved.

When the GW pattern of FIG. 148 is applied to, for example, the combination of the Sony symbol (16 k, 10/15) and 16QAM of FIG. 101, a particularly excellent error rate can be achieved.

When the GW pattern of FIG. 149 is applied to, for example, the combination of the Sony symbol (16 k, 12/15) and 16QAM of FIG. 101, a particularly excellent error rate can be achieved.

When the GW pattern of FIG. 150 is applied to, for example, the combination of the LGE symbol (16 k, 6/15) and 64QAM of FIG. 102, a particularly excellent error rate can be achieved.

When the GW pattern of FIG. 151 is applied to, for example, the combination of the Sony symbol (16 k, 8/15) and 64QAM of FIG. 102 a particularly excellent error rate can be achieved.

When the GW pattern of FIG. 152 is applied to, for example, the combination of the Sony symbol (16 k, 10/15) and 64QAM of FIG. 102 a particularly excellent error rate can be achieved.

When the GW pattern of FIG. 153 is applied to, for example, the combination of the Sony symbol (16 k, 12/15) and 64QAM of FIG. 102 a particularly excellent error rate can be achieved.

When the GW pattern of FIG. 154 is applied to, for example, the combination of the LGE symbol (16 k, 6/15) and 256QAM of FIGS. 103 and 104 a particularly excellent error rate can be achieved.

When the GW pattern of FIG. 155 is applied to, for example, the combination of the Sony symbol (16 k, 8/15) and 256QAM of FIGS. 103 and 104 a particularly excellent error rate can be achieved.

When the GW pattern of FIG. 156 is applied to, for example, the combination of the Sony symbol (16 k, 10/15) and 256QAM of FIGS. 103 and 104 a particularly excellent error rate can be achieved.

When the GW pattern of FIG. 157 is applied to, for example, the combination of the Sony symbol (16 k, 12/15) and 256QAM of FIGS. 103 and 104 a particularly excellent error rate can be achieved.

<Simulation Result>

FIG. 158 is an illustration of a BER/FER curve indicating a simulation result of a simulation of measuring the error rate when the GW pattern of FIG. 109 is applied to a combination of the ETRI symbol (64 k, 5/15) and QPSK of FIG. 89.

FIG. 159 is an illustration of a BER/FER curve indicating a simulation result of a simulation of measuring the error rate when the GW pattern of FIG. 110 is applied to a combination of the ETRI symbol (64 k, 5/15) and 16QAM of FIG. 90.

FIG. 160 is an illustration of a BER/FER curve indicating a simulation result of a simulation of measuring the error rate when the GW pattern of FIG. 111 is applied to a combination of the ETRI symbol (64 k, 5/15) and 64QAM of FIG. 91.

FIG. 161 is an illustration of a BER/FER curve indicating a simulation result of a simulation of measuring the error rate when the GW pattern of FIG. 112 is applied to a combination of the Sony symbol (64 k, 7/15) and QPSK of FIG. 89.

FIG. 162 is an illustration of a BER/FER curve indicating a simulation result of a simulation of measuring the error rate when the GW pattern of FIG. 113 is applied to a combination of the Sony symbol (64 k, 7/15) and 16QAM of FIG. 90.

FIG. 163 is an illustration of a BER/FER curve indicating a simulation result of a simulation of measuring the error rate when the GW pattern of FIG. 114 is applied to a combination of the Sony symbol (64 k, 7/15) and 64QAM of FIG. 91.

FIG. 164 is an illustration of a BER/FER curve indicating a simulation result of a simulation of measuring the error rate when the GW pattern of FIG. 115 is applied to a combination of the Sony symbol (64 k, 9/15) and QPSK of FIG. 89.

FIG. 165 is an illustration of a BER/FER curve indicating a simulation result of a simulation of measuring the error rate when the GW pattern of FIG. 116 is applied to a combination of the Sony symbol (64 k, 9/15) and 16QAM of FIG. 90.

FIG. 166 is an illustration of a BER/FER curve indicating a simulation result of a simulation of measuring the error rate when the GW pattern of FIG. 117 is applied to a combination of the Sony symbol (64 k, 9/15) and 64QAM of FIG. 91.

FIG. 167 is an illustration of a BER/FER curve indicating a simulation result of a simulation of measuring the error rate when the GW pattern of FIG. 118 is applied to a combination of the Sony symbol (64 k, 11/15) and QPSK of FIG. 89.

FIG. 168 is an illustration of a BER/FER curve indicating a simulation result of a simulation of measuring the error rate when the GW pattern of FIG. 119 is applied to a combination of the Sony symbol (64 k, 11/15) and 16QAM of FIG. 90.

FIG. 169 is an illustration of a BER/FER curve indicating a simulation result of a simulation of measuring the error rate when the GW pattern of FIG. 120 is applied to a combination of the Sony symbol (64 k, 11/15) and 64QAM of FIG. 91.

FIG. 170 is an illustration of a BER/FER curve indicating a simulation result of a simulation of measuring the error rate when the GW pattern of FIG. 121 is applied to a combination of the Sony symbol (64 k, 13/15) and QPSK of FIG. 89.

FIG. 171 is an illustration of a BER/FER curve indicating a simulation result of a simulation of measuring the error rate when the GW pattern of FIG. 122 is applied to a combination of the Sony symbol (64 k, 13/15) and 16QAM of FIG. 90.

FIG. 172 is an illustration of a BER/FER curve indicating a simulation result of a simulation of measuring the error rate when the GW pattern of FIG. 123 is applied to a combination of the Sony symbol (64 k, 13/15) and 64QAM of FIG. 91.

FIG. 173 is an illustration of a BER/FER curve indicating a simulation result of a simulation of measuring the error rate when the GW pattern of FIG. 124 is applied to a combination of the ETRI symbol (64 k, 5/15) and 256QAM of FIGS. 92 and 93.

FIG. 174 is an illustration of a BER/FER curve indicating a simulation result of a simulation of measuring the error rate when the GW pattern of FIG. 125 is applied to a combination of the ETRI symbol (64 k, 7/15) and 256QAM of FIGS. 92 and 93.

FIG. 175 is an illustration of a BER/FER curve indicating a simulation result of a simulation of measuring the error rate when the GW pattern of FIG. 126 is applied to a combination of the Sony symbol (64 k, 7/15) and 256QAM of FIGS. 92 and 93.

FIG. 176 is an illustration of a BER/FER curve indicating a simulation result of a simulation of measuring the error rate when the GW pattern of FIG. 127 is applied to a combination of the Sony symbol (64 k, 9/15) and 256QAM of FIGS. 92 and 93.

FIG. 177 is an illustration of a BER/FER curve indicating a simulation result of a simulation of measuring the error rate when the GW pattern of FIG. 128 is applied to a combination of the NERC symbol (64 k, 9/15) and 256QAM of FIGS. 92 and 93.

FIG. 178 is an illustration of a BER/FER curve indicating a simulation result of a simulation of measuring the error rate when the GW pattern of FIG. 129 is applied to a combination of the Sony symbol (64 k, 9/15) and 256QAM of FIGS. 92 and 93.

FIG. 179 is an illustration of a BER/FER curve indicating a simulation result of a simulation of measuring the error rate when the GW pattern of FIG. 130 is applied to a combination of the Sony symbol (64 k, 13/15) and 256QAM of FIGS. 92 and 93.

FIG. 180 is an illustration of a BER/FER curve indicating a simulation result of a simulation of measuring the error rate when the GW pattern of FIG. 131 is applied to a combination of the ETRI symbol (64 k, 5/15) and 1024QAM of FIGS. 94 and 95.

FIG. 181 is an illustration of a BER/FER curve indicating a simulation result of a simulation of measuring the error rate when the GW pattern of FIG. 132 is applied to a combination of the ETRI symbol (64 k, 7/15) and 1024QAM of FIGS. 94 and 95.

FIG. 182 is an illustration of a BER/FER curve indicating a simulation result of a simulation of measuring the error rate when the GW pattern of FIG. 133 is applied to a combination of the Sony symbol (64 k, 7/15) and 1024QAM of FIGS. 94 and 95.

FIG. 183 is an illustration of a BER/FER curve indicating a simulation result of a simulation of measuring the error rate when the GW pattern of FIG. 134 is applied to a combination of the Sony symbol (64 k, 9/15) and 1024QAM of FIGS. 94 and 95.

FIG. 184 is an illustration of a BER/FER curve indicating a simulation result of a simulation of measuring the error rate when the GW pattern of FIG. 135 is applied to a combination of the NERC symbol (64 k, 9/15) and 1024QAM of FIGS. 94 and 95.

FIG. 185 is an illustration of a BER/FER curve indicating a simulation result of a simulation of measuring the error rate when the GW pattern of FIG. 136 is applied to a combination of the Sony symbol (64 k, 11/15) and 1024QAM of FIGS. 94 and 95.

FIG. 186 is an illustration of a BER/FER curve indicating a simulation result of a simulation of measuring the error rate when the GW pattern of FIG. 137 is applied to a combination of the Sony symbol (64 k, 13/15) and 1024QAM of FIGS. 94 and 95.

FIG. 187 is an illustration of a BER/FER curve indicating a simulation result of a simulation of measuring the error rate when the GW pattern of FIG. 138 is applied to a combination of the Samsung symbol (64 k, 6/15) and 4096QAM of FIGS. 96 and 97.

FIG. 188 is an illustration of a BER/FER curve indicating a simulation result of a simulation of measuring the error rate when the GW pattern of FIG. 139 is applied to a combination of the ETRI symbol (64 k, 7/15) and 4096QAM of FIGS. 96 and 97.

FIG. 189 is an illustration of a BER/FER curve indicating a simulation result of a simulation of measuring the error rate when the GW pattern of FIG. 140 is applied to a combination of the Samsung symbol (64 k, 8/15) and 4096QAM of FIGS. 96 and 97.

FIG. 190 is an illustration of a BER/FER curve indicating a simulation result of a simulation of measuring the error rate when the GW pattern of FIG. 141 is applied to a combination of the Sony symbol (64 k, 9/15) and 4096QAM of FIGS. 96 and 97.

FIG. 191 is an illustration of a BER/FER curve indicating a simulation result of a simulation of measuring the error rate when the GW pattern of FIG. 142 is applied to a combination of the LGE symbol (16 k, 6/15) and QPSK of FIG. 89.

FIG. 192 is an illustration of a BER/FER curve indicating a simulation result of a simulation of measuring the error rate when the GW pattern of FIG. 143 is applied to a combination of the Sony symbol (16 k, 8/15) and QPSK of FIG. 89.

FIG. 193 is an illustration of a BER/FER curve indicating a simulation result of a simulation of measuring the error rate when the GW pattern of FIG. 144 is applied to a combination of the Sony symbol (16 k, 10/15) and QPSK of FIG. 89.

FIG. 194 is an illustration of a BER/FER curve indicating a simulation result of a simulation of measuring the error rate when the GW pattern of FIG. 145 is applied to a combination of the Sony symbol (16 k, 12/15) and QPSK of FIG. 89.

FIG. 195 is an illustration of a BER/FER curve indicating a simulation result of a simulation of measuring the error rate when the GW pattern of FIG. 146 is applied to a combination of the LGE symbol (16 k, 6/15) and 16QAM of FIG. 101.

FIG. 196 is an illustration of a BER/FER curve indicating a simulation result of a simulation of measuring the error rate when the GW pattern of FIG. 147 is applied to a combination of the Sony symbol (16 k, 8/15) and 16QAM of FIG. 101.

FIG. 197 is an illustration of a BER/FER curve indicating a simulation result of a simulation of measuring the error rate when the GW pattern of FIG. 148 is applied to a combination of the Sony symbol (16 k, 10/15) and 16QAM of FIG. 101.

FIG. 198 is an illustration of a BER/FER curve indicating a simulation result of a simulation of measuring the error rate when the GW pattern of FIG. 149 is applied to a combination of the Sony symbol (16 k, 12/15) and 16QAM of FIG. 101.

FIG. 199 is an illustration of a BER/FER curve indicating a simulation result of a simulation of measuring the error rate when the GW pattern of FIG. 150 is applied to a combination of the LGE symbol (16 k, 6/15) and 64QAM of FIG. 102.

FIG. 200 is an illustration of a BER/FER curve indicating a simulation result of a simulation of measuring the error rate when the GW pattern of FIG. 151 is applied to a combination of the Sony symbol (16 k, 8/15) and 64QAM of FIG. 102.

FIG. 201 is an illustration of a BER/FER curve indicating a simulation result of a simulation of measuring the error rate when the GW pattern of FIG. 152 is applied to a combination of the Sony symbol (16 k, 10/15) and 64QAM of FIG. 102.

FIG. 202 is an illustration of a BER/FER curve indicating a simulation result of a simulation of measuring the error rate when the GW pattern of FIG. 153 is applied to a combination of the Sony symbol (16 k, 12/15) and 64QAM of FIG. 102.

FIG. 203 is an illustration of a BER/FER curve indicating a simulation result of a simulation of measuring the error rate when the GW pattern of FIG. 154 is applied to a combination of the LGE symbol (16 k, 6/15) and 256QAM of FIGS. 103 and 104.

FIG. 204 is an illustration of a BER/FER curve indicating a simulation result of a simulation of measuring the error rate when the GW pattern of FIG. 155 is applied to a combination of the Sony symbol (16 k, 8/15) and 256QAM of FIGS. 103 and 104.

FIG. 205 is an illustration of a BER/FER curve indicating a simulation result of a simulation of measuring the error rate when the GW pattern of FIG. 156 is applied to a combination of the Sony symbol (16 k, 10/15) and 256QAM of FIGS. 103 and 104.

FIG. 206 is an illustration of a BER/FER curve indicating a simulation result of a simulation of measuring the error rate when the GW pattern of FIG. 157 is applied to a combination of the Sony symbol (16 k, 12/15) and 256QAM of FIGS. 103 and 104.

FIGS. 158 to 206 illustrate BER/FER curves when an AWGN channel is employed as the communication path 13 (FIG. 7) (the upper drawings) and BER/FER curves when a Rayleigh (fading) channel is employed as the communication path 13 (FIG. 7) (the lower drawings).

In FIGS. 158 to 206, "w bil" indicates a BER/FER curve when the parity interleave, the group-wise interleave, and the block-wise interleave are performed, and "w/o bil" indicates a BER/FER curve when the parity interleave, the group-wise interleave, and the block-wise interleave are not performed.

As can be seen from FIGS. 158 to 206, when the parity interleave, the group-wise interleave, and the block-wise interleave are performed, it is possible to improve the BER/FER and achieve the excellent error rate compared to when they are not performed.

Further, it is possible to apply the GW patterns of FIGS. 109 to 157 to the constellation in which the signal point arrangements illustrated in FIGS. 83 to 104 have been moved symmetrically to the I axis or the Q axis, the constellation in which the signal point arrangements illustrated in FIGS. 83 to 104 have been moved symmetrically to the origin, the constellation in which the signal point arrangements illustrated in FIGS. 83 to 104 have been rotated at an arbitrary angle centering on the origin, and the like in addition to the constellation of QPSK, 16QAM, 64QAM, 256QAM, 1024QAM, and 4096QAM of the signal point arrangements illustrated in FIGS. 83 to 104, and it is possible to obtain the same effects as when the GW patterns of FIGS. 109 to 157 are applied to the constellation of QPSK, 16QAM, 64QAM, 256QAM, 1024QAM, and 4096QAM of the signal point arrangements illustrated in FIGS. 83 to 104.

Further, it is possible to apply the GW pattern of FIGS. 109 to 157 to the constellation in which the most significant bit (MSB) and the least significant bit (LSB) of the symbol to be associated with (allocated to) the signal point are interchanged in the signal point arrangements illustrated in FIGS. 83 to 104 in addition to the constellation of QPSK, 16QAM, 64QAM, 256QAM, 1024QAM, and 4096QAM of the signal point arrangements illustrated in FIGS. 83 to 104, and it is possible to obtain the same effects as when the GW patterns of FIGS. 109 to 157 are applied to the constellation of QPSK, 16QAM, 64QAM, 256QAM, 1024QAM, and 4096QAM of the signal point arrangements illustrated in FIGS. 83 to 104 as well.

<Configuration Example of Receiving Device 12>

FIG. 207 is a block diagram illustrating a configuration example of the receiving device 12 of FIG. 7.

An OFDM operating unit 151 receives an OFDM signal from the transmitting device 11 (FIG. 7) and executes signal processing of the OFDM signal. Data that is obtained by executing the signal processing by the OFDM operating unit 151 is supplied to a frame managing unit 152.

The frame managing unit 152 executes processing (frame interpretation) of a frame configured by the data supplied from the OFDM operating unit 151 and supplies a signal of target data obtained as a result and a signal of signaling to frequency deinterleavers 161 and 153.

The frequency deinterleaver 153 performs frequency deinterleave in a unit of symbol, with respect to the data supplied from the frame managing unit 152, and supplies the symbol to a demapper 154.

The demapper 154 performs demapping (signal point arrangement decoding) and orthogonal demodulation on the data (the data on the constellation) supplied from the frequency deinterleaver 153 based on the arrangement (constellation) of the signal points decided according to the orthogonal modulation performed at the transmitting device 11 side, and supplies the data ((the likelihood of) the LDPC code) obtained as a result to the LDPC decoder 155.

The LDPC decoder 155 performs LDPC decoding of the LDPC code supplied from the demapper 154 and supplies LDPC target data (in this case, a BCH code) obtained as a result to a BCH decoder 156.

The BCH decoder 156 performs BCH decoding of the LDPC target data supplied from the LDPC decoder 155 and outputs control data (signaling) obtained as a result.

Meanwhile, the frequency deinterleaver 161 performs frequency deinterleave in a unit of symbol, with respect to the data supplied from the frame managing unit 152, and supplies the symbol to a SISO/MISO decoder 162.

The SISO/MISO decoder 162 performs spatiotemporal decoding of the data supplied from the frequency deinterleaver 161 and supplies the data to a time deinterleaver 163.

The time deinterleaver 163 performs time deinterleave in a unit of symbol, with respect to the data supplied from the SISO/MISO decoder 162, and supplies the data to a demapper 164.

The demapper 164 performs demapping (signal point arrangement decoding) and orthogonal demodulation on the data (the data on the constellation) supplied from the time deinterleaver 163 based on the arrangement (constellation) of the signal points decided according to the orthogonal modulation performed at the transmitting device 11 side, and supplies the data obtained as a result to a bit deinterleaver 165.

The bit deinterleaver 165 perform the bit deinterleave on the data supplied from the demapper 164, and supplies (the likelihood of) the LDPC code serving as the data that has undergone the bit deinterleave to an LDPC decoder 166.

The LDPC decoder 166 performs LDPC decoding of the LDPC code supplied from the bit deinterleaver 165 and supplies LDPC target data (in this case, a BCH code) obtained as a result to a BCH decoder 167.

The BCH decoder 167 performs BCH decoding of the LDPC target data supplied from the LDPC decoder 155 and supplies data obtained as a result to a BB descrambler 168.

The BB descrambler 168 executes BB descramble with respect to the data supplied from the BCH decoder 167 and supplies data obtained as a result to a null deletion unit 169.

The null deletion unit 169 deletes null inserted by the padder 112 of FIG. 8, from the data supplied from the BB descrambler 168, and supplies the data to a demultiplexer 170.

The demultiplexer 170 individually separates one or more streams (target data) multiplexed with the data supplied from the null deletion unit 169, performs necessary processing to output the streams as output streams.

Here, the receiving device 12 can be configured without including part of the blocks illustrated in FIG. 207. That is, for example, in a case where the transmitting device 11 (FIG. 8) is configured without including the time interleaver 118, the SISO/MISO encoder 119, the frequency interleaver 120 and the frequency interleaver 124, the receiving device 12 can be configured without including the time deinterleaver 163, the SISO/MISO decoder 162, the frequency deinterleaver 161 and the frequency deinterleaver 153 which are blocks respectively corresponding to the time interleaver 118, the SISO/MISO encoder 119, the frequency interleaver 120 and the frequency interleaver 124 of the transmitting device 11.

<Configuration Example of Bit Deinterleaver 165>

FIG. 208 is a block diagram illustrating a configuration example of the bit deinterleaver 165 of FIG. 207.

The bit deinterleaver 165 is configured with a block deinterleaver 54 and a group-wise deinterleaver 55, and performs the (bit) deinterleave of the symbol bits of the symbol serving as the data supplied from the demapper 164 (FIG. 207).

In other words, the block deinterleaver 54 performs the block deinterleave (the inverse process of the block interleave) corresponding to the block interleave performed by the block interleaver 25 of FIG. 9, that is, the block deinterleave of restoring the positions of (the likelihood of) of the code bits of the LDPC code rearranged by the block interleave to the original positions on the symbol bits of the symbol supplied from the demapper 164, and supplies the LDPC code obtained as a result to the group-wise deinterleaver 55.

The group-wise deinterleaver 55 performs the group-wise deinterleave (the inverse process of the group-wise interleave) corresponding to the group-wise interleave performed by the group-wise interleaver 24 of FIG. 9, that is, the group-wise deinterleave of restoring the original sequence by rearranging the code bits of the LDPC code whose sequence has been changed in units of bit groups by the group-wise interleave described above, for example, with reference to FIG. 108 in units of bit groups on the LDPC code supplied from the block deinterleaver 54

Here, when the LDPC code supplied from the demapper 164 to the bit deinterleaver 165 has undergone the parity interleave, the group-wise interleave, and the block interleave, the bit deinterleaver 165 can perform all of the parity deinterleave (the inverse process of the parity interleave, that is, the parity deinterleave of restoring the code bits of the LDPC code whose sequence has been changed by the parity interleave to the original sequence) corresponding to the parity interleave, the block deinterleave corresponding to the block interleave, and the group-wise deinterleave corresponding to the group-wise interleave.

However, the bit deinterleaver 165 of FIG. 208 is provided with the block deinterleaver 54 that performs the block deinterleave corresponding to the block interleave and the group-wise deinterleaver 55 that performs the group-wise deinterleave corresponding to the group-wise interleave, but no block that performs the parity deinterleave corresponding to the parity interleave is provided, and thus the parity deinterleave is not performed.

Thus, the LDPC code that has undergone the block deinterleave and group-wise deinterleave but has not undergone the parity deinterleave is supplied from (the group-wise deinterleaver 55 of) the bit deinterleaver 165 to the LDPC decoder 166.

The LDPC decoder 166 performs LDPC decoding of the LDPC code supplied from the bit deinterleaver 165 using the transformed parity check matrix obtained by performing at least the column permutation corresponding to the parity interleave on the parity check matrix H of the DVB scheme used for the LDPC encoding by the LDPC encoder 115 of FIG. 8 (or the transformed parity check matrix (FIG. 29) obtained by performing the row permutation on the parity check matrix of the ETRI scheme (FIG. 27)), and outputs data obtained as a result as a decoding result of LDPC target data.

FIG. 209 is a flowchart illustrating a process performed by the demapper 164, the bit deinterleaver 165, and the LDPC decoder 166 of FIG. 208.

In step S111, the demapper 164 performs demapping and orthogonal demodulation on the data (the data on the constellation mapped to the signal points) supplied from the time deinterleaver 163, and supplies the resulting data to the bit deinterleaver 165, and the process proceeds to step S112.

In step S112, the bit deinterleaver 165 performs the deinterleave (the bit deinterleave) on the data supplied from the demapper 164, and the process proceeds to step S113.

In other words, in step S112, in the bit deinterleaver 165, the block deinterleaver 54 performs the block deinterleave on the data (symbol) supplied from the demapper 164, and supplies the code bits of the LDPC code obtained as a result to the group-wise deinterleaver 55.

The group-wise deinterleaver 55 performs the group-wise deinterleave on the LDPC code supplied from the block deinterleaver 54, and supplies (the likelihood of) the LDPC code obtained as a result to the LDPC decoder 166.

In step S113, the LDPC decoder 166 performs LDPC decoding of the LDPC code supplied from the group-wise deinterleaver 55 using the parity check matrix H used for the LDPC encoding by the LDPC encoder 115 of FIG. 8, that is, using the transformed parity check matrix obtained from the parity check matrix H, for example, and outputs the data obtained as a result to the BCH decoder 167 as a decoding result of the LDPC target data.

In FIG. 208, similarly to the example of FIG. 9, for the sake of convenience of description, the block deinterleaver 54 that performs the block deinterleave and the group-wise deinterleaver 55 that performs the group-wise deinterleave are configured individually, but the block deinterleaver 54 and the group-wise deinterleaver 55 may be configured integrally.

<LDPC Decoding>

The LDPC decoding performed by the LDPC decoder 166 of FIG. 207 will be described.

As described above, the LDPC decoder 166 of FIG. 207 performs the LDPC decoding of the LDPC code that is supplied from the bit deinterleaver 165 and has undergone the block deinterleave and the group-wise deinterleave but has not undergone the parity deinterleave using the transformed parity check matrix obtained by performing at least the column permutation corresponding to the parity interleave on the parity check matrix H of the DVB scheme used for the LDPC encoding by the LDPC encoder 115 of FIG. 8 (or the transformed parity check matrix (FIG. 29) obtained by performing the row permutation on the parity check matrix of the ETRI scheme (FIG. 27)).

In this case, LDPC decoding that can suppress an operation frequency at a sufficiently realizable range while suppressing a circuit scale, by performing the LDPC decoding using the transformed parity check matrix, is previously suggested (for example, refer to JP 4224777B).

Therefore, first, the previously suggested LDPC decoding using the transformed parity check matrix will be described with reference to FIGS. 210 to 213.

FIG. 210 illustrates an example of a parity check matrix H of an LDPC code in which a code length N is 90 and an encoding rate is 2/3.

In FIG. 210 (and FIGS. 211 and 212 to be described later), 0 is represented by a period (.).

In the parity check matrix H of FIG. 210, the parity matrix becomes a staircase structure.

FIG. 211 illustrates a parity check matrix H' that is obtained by executing row replacement of an expression (11) and column replacement of an expression (12) with respect to the parity check matrix H of FIG. 210.

$$\text{Row Replacement: } (6s+t+1)\text{-th row} \rightarrow (5t+s+1)\text{-th row} \quad (11)$$

$$\text{Column Replacement: } (6x+y+61)\text{-th column} \rightarrow (5y+x+61)\text{-th column} \quad (12)$$

In the expressions (11) and (12), s, t, x, and y are integers in ranges of 0≤s<5, 0≤t<6, 0≤x<5, and 0≤t<6, respectively.

According to the row replacement of the expression (11), replacement is performed such that the 1st, 7th, 13rd, 19th, and 25th rows having remainders of 1 when being divided by 6 are replaced with the 1st, 2nd, 3rd, 4th, and 5th rows, and the 2nd, 8th, 14th, 20th, and 26th rows having remainders of 2 when being divided by 6 are replaced with the 6th, 7th, 8th, 9th, and 10th rows, respectively.

According to the column replacement of the expression (12), replacement is performed such that the 61st, 67th, 73rd, 79th, and 85th columns having remainders of 1 when being divided by 6 are replaced with the 61st, 62nd, 63rd, 64th, and 65th columns, respectively, and the 62nd, 68th, 74th, 80th, and 86th columns having remainders of 2 when being divided by 6 are replaced with the 66th, 67th, 68th, 69th, and 70th columns, respectively, with respect to the 61st and following columns (parity matrix).

In this way, a matrix that is obtained by performing the replacements of the rows and the columns with respect to the parity check matrix H of FIG. 210 is a parity check matrix H' of FIG. 211.

In this case, even when the row replacement of the parity check matrix H is performed, the sequence of the code bits of the LDPC code is not influenced.

The column replacement of the expression (12) corresponds to parity interleave to interleave the (K+qx+y+1)-th code bit into the position of the (K+Py+x+1)-th code bit, when the information length K is 60, the unit size P is 5, and the divisor q (=M/P) of the parity length M (in this case, 30) is 6.

Therefore, the parity check matrix H' in FIG. 211 is a transformed parity check matrix obtained by performing at least column replacement that replaces the K+qx+y+1-th column of the parity check matrix H in FIG. 210 (which may be arbitrarily called an original parity check matrix below) with the K+Py+x+1-th column.

If the parity check matrix H' of FIG. 211 is multiplied with a result obtained by performing the same replacement as the expression (12) with respect to the LDPC code of the parity check matrix H of FIG. 210, a zero vector is output. That is, if a row vector obtained by performing the column replacement of the expression (12) with respect to a row vector c as the LDPC code (one code word) of the original parity check matrix H is represented as c', HcT becomes the zero vector from the property of the parity check matrix. Therefore, H'c'T naturally becomes the zero vector.

Thereby, the transformed parity check matrix H' of FIG. 211 becomes a parity check matrix of an LDPC code c' that is obtained by performing the column replacement of the expression (12) with respect to the LDPC code c of the original parity check matrix H.

Therefore, the column replacement of the expression (12) is performed with respect to the LDPC code of the original parity check matrix H, the LDPC code c' after the column replacement is decoded (LDPC decoding) using the transformed parity check matrix H' of FIG. 211, reverse replacement of the column replacement of the expression (12) is performed with respect to a decoding result, and the same decoding result as the case in which the LDPC code of the original parity check matrix H is decoded using the parity check matrix H can be obtained.

FIG. 212 illustrates the transformed parity check matrix H' of FIG. 211 with being spaced in units of 5×5 matrixes.

In FIG. 212, the transformed parity check matrix H' is represented by a combination of a 5×5 (=p×p) unit matrix that is a unit size P, a matrix (hereinafter, appropriately referred to as a quasi unit matrix) obtained by setting one or more 1 of the unit matrix to zero, a matrix (hereinafter, appropriately referred to as a shifted matrix) obtained by cyclically shifting the unit matrix or the quasi unit matrix, a sum (hereinafter, appropriately referred to as a sum matrix) of two or more matrixes of the unit matrix, the quasi unit matrix, and the shifted matrix, and a 5×5 zero matrix.

The transformed parity check matrix H' of FIG. 212 can be configured using the 5×5 unit matrix, the quasi unit matrix, the shifted matrix, the sum matrix, and the zero matrix. Therefore, the 5×5 matrixes (the unit matrix, the quasi unit matrix, the shifted matrix, the sum matrix, and the zero matrix) that constitute the transformed parity check matrix H' are appropriately referred to as constitutive matrixes hereinafter.

When the LDPC code represented by the parity check matrix represented by the P×P constitutive matrixes is decoded, an architecture in which P check node operations and variable node operations are simultaneously performed can be used.

FIG. 213 is a block diagram illustrating a configuration example of a decoding device that performs the decoding.

That is, FIG. 213 illustrates the configuration example of the decoding device that performs decoding of the LDPC code, using the transformed parity check matrix H' of FIG. 210 obtained by performing at least the column replacement of the expression (12) with respect to the original parity check matrix H of FIG. 212.

The decoding device of FIG. 213 includes a branch data storing memory 300 that includes 6 FIFOs 300$_1$ to 300$_6$, a selector 301 that selects the FIFOs 300$_1$ to 300$_6$, a check node calculating unit 302, two cyclic shift circuits 303 and 308, a branch data storing memory 304 that includes 18 FIFOs 304$_1$ to 304$_{18}$, a selector 305 that selects the FIFOs 304$_1$ to 304$_{18}$, a reception data memory 306 that stores reception data, a variable node calculating unit 307, a decoding word calculating unit 309, a reception data rearranging unit 310, and a decoded data rearranging unit 311.

First, a method of storing data in the branch data storing memories 300 and 304 will be described.

The branch data storing memory 300 includes the 6 FIFOs 300$_1$ to 300$_6$ that correspond to a number obtained by dividing a row number 30 of the transformed parity check matrix H' of FIG. 212 by a row number 5 of the constitutive matrix (the unit size P). The FIFO 300$_y$ (y=1, 2, . . . , and 6) includes a plurality of steps of storage regions. In the storage region of each step, messages corresponding to five branches to be a row number and a column number of the constitutive matrix (the unit size P) can be simultaneously read or written. The number of steps of the storage regions of the FIFO 300, becomes 9 to be a maximum number of the number (Hamming weight) of 1 of a row direction of the transformed parity check matrix of FIG. 212.

In the FIFO $\mathbf{300}_1$, data (messages $v_i$ from variable nodes) corresponding to positions of 1 in the first to fifth rows of the transformed parity check matrix H' of FIG. 212 is stored in a form filling each row in a transverse direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $\mathbf{300}_1$. In the storage region of the second step, data corresponding to positions of 1 of a shifted matrix (shifted matrix obtained by cyclically shifting the 5×5 unit matrix to the right side by 3) of (1, 21) to (5, 25) of the transformed parity check matrix H' is stored. Similar to the above case, in the storage regions of the third to eighth steps, data is stored in association with the transformed parity check matrix H'. In the storage region of the ninth step, data corresponding to positions of 1 of a shifted matrix (shifted matrix obtained by replacing 1 of the first row of the 5×5 unit matrix with 0 and cyclically shifting the unit matrix to the left side by 1) of (1, 86) to (5, 90) of the transformed parity check matrix H' is stored.

In the FIFO $\mathbf{300}_2$, data corresponding to positions of 1 in the sixth to tenth rows of the transformed parity check matrix H' of FIG. 212 is stored. That is, in the storage region of the first step of the FIFO $\mathbf{300}_2$, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the second step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $\mathbf{300}_1$ to $\mathbf{300}_6$).

Subsequently, in the storage regions of the third to ninth steps, data is stored in association with the transformed parity check matrix H', similar to the above case.

In the FIFOs $\mathbf{300}_3$ to $\mathbf{300}_6$, data is stored in association with the transformed parity check matrix H', similar to the above case.

The branch data storing memory 304 includes 18 FIFOs $\mathbf{304}_1$ to $\mathbf{304}_{18}$ that correspond to a number obtained by dividing a column number 90 of the transformed parity check matrix H' by 5 to be a column number of a constitutive matrix (the unit size P). The FIFO $\mathbf{304}_x$ (x=1, 2, . . . , and 18) includes a plurality of steps of storage regions. In the storage region of each step, messages corresponding to five branches corresponding to a row number and a column number of the constitutive matrix (the unit size P) can be simultaneously read or written.

In the FIFO $\mathbf{304}_1$, data (messages $u_j$ from check nodes) corresponding to positions of 1 in the first to fifth columns of the transformed parity check matrix H' of FIG. 212 is stored in a form filling each column in a longitudinal direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $\mathbf{304}_1$. In the storage region of the second step, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the third step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $\mathbf{304}_1$ to $\mathbf{304}_{18}$).

Subsequently, in the storage regions of the fourth and fifth steps, data is stored in association with the transformed parity check matrix H', similar to the above case. The number of steps of the storage regions of the FIFO $\mathbf{304}_1$ becomes 5 to be a maximum number of the number (Hamming weight) of 1 of a row direction in the first to fifth columns of the transformed parity check matrix H'.

In the FIFOs $\mathbf{304}_2$ and $\mathbf{304}_3$, data is stored in association with the transformed parity check matrix H', similar to the above case, and each length (the number of steps) is 5. In the FIFOs $\mathbf{304}_4$ to $\mathbf{304}_{12}$, data is stored in association with the transformed parity check matrix H', similar to the above case, and each length is 3. In the FIFOs $\mathbf{304}_{13}$ to $\mathbf{304}_{18}$, data is stored in association with the transformed parity check matrix H', similar to the above case, and each length is 2.

Next, an operation of the decoding device of FIG. 213 will be described.

The branch data storing memory 300 includes the 6 FIFOs $\mathbf{300}_1$ to $\mathbf{300}_6$. According to information (matrix data) D312 on which row of the transformed parity check matrix H' in FIG. 212 five messages D311 supplied from a cyclic shift circuit 308 of a previous step belongs to, the FIFO storing data is selected from the FIFOs $\mathbf{300}_1$ to $\mathbf{300}_6$ and the five messages D311 are collectively stored sequentially in the selected FIFO. When the data is read, the branch data storing memory 300 sequentially reads the five messages D$\mathbf{300}_1$ from the FIFO $\mathbf{300}_1$ and supplies the messages to the selector 301 of a next step. After reading of the messages from the FIFO $\mathbf{300}_1$ ends, the branch data storing memory 300 reads the messages sequentially from the FIFOs $\mathbf{300}_2$ to $\mathbf{300}_6$ and supplies the messages to the selector 301.

The selector 301 selects the five messages from the FIFO from which data is currently read, among the FIFOs $\mathbf{300}_1$ to $300_6$, according to a select signal D301, and supplies the selected messages as messages D302 to the check node calculating unit 302.

The check node calculating unit 302 includes five check node calculators $\mathbf{302}_1$ to $\mathbf{302}_5$. The check node calculating unit 302 performs a check node operation according to the expression (7), using the messages D302 (D$\mathbf{302}_1$ to D$\mathbf{302}_5$) (messages $v_i$ of the expression 7) supplied through the selector 301, and supplies five messages D303 (D$\mathbf{303}_1$ to D$\mathbf{303}_5$) (messages $u_j$ of the expression (7)) obtained as a result of the check node operation to a cyclic shift circuit 303.

The cyclic shift circuit 303 cyclically shifts the five messages D$\mathbf{303}_1$ to D$\mathbf{303}_5$ calculated by the check node calculating unit 302, on the basis of information (matrix data) D305 on how many the unit matrixes (or the quasi unit matrix) becoming the origin in the transformed parity check matrix H' are cyclically shifted to obtain the corresponding branches, and supplies a result as messages D304 to the branch data storing memory 304.

The branch data storing memory 304 includes the eighteen FIFOs $\mathbf{304}_1$ to $\mathbf{304}_{18}$. According to information D305 on which row of the transformed parity check matrix H' five messages D304 supplied from a cyclic shift circuit 303 of a previous step belongs to, the FIFO storing data is selected from the FIFOs $\mathbf{304}_1$ to $\mathbf{304}_{18}$ and the five messages D304 are collectively stored sequentially in the selected FIFO. When the data is read, the branch data storing memory 304 sequentially reads the five messages D$\mathbf{304}_1$ from the FIFO $\mathbf{304}_1$ and supplies the messages to the selector 305 of a next step. After reading of the messages from the FIFO $\mathbf{304}_1$ ends, the branch data storing memory 304 reads the messages sequentially from the FIFOs $\mathbf{304}_2$ to $\mathbf{304}_{18}$ and supplies the messages to the selector 305.

The selector 305 selects the five messages from the FIFO from which data is currently read, among the FIFOs $\mathbf{304}_1$ to $\mathbf{304}_{18}$, according to a select signal D307, and supplies the selected messages as messages D308 to the variable node calculating unit 307 and the decoding word calculating unit 309.

Meanwhile, the reception data rearranging unit 310 rearranges the LDPC code D313, that is corresponding to the parity check matrix H in FIG. 210, received through the communication path 13 by performing the column replacement of the expression (12) and supplies the LDPC code as reception data D314 to the reception data memory 306. The reception data memory 306 calculates a reception LLR (Log Likelihood Ratio) from the reception data D314 supplied from the reception data rearranging unit 310, stores the reception LLR, collects five reception LLRs, and supplies the reception LLRs as reception values D309 to the variable node calculating unit 307 and the decoding word calculating unit 309.

The variable node calculating unit 307 includes five variable node calculators $\mathbf{307}_1$ to $\mathbf{307}_5$. The variable node calculating unit 307 performs the variable node operation according to the expression (1), using the messages D308 (D$\mathbf{308}_1$ to D$\mathbf{308}_5$) (messages $u_j$ of the expression (1)) supplied through the selector 305 and the five reception values D309 (reception values $u_{0i}$ of the expression (1)) supplied from the reception data memory 306, and supplies messages D310 (D$\mathbf{310}_1$ to D$\mathbf{310}_5$) (message $v_i$ of the expression (1)) obtained as an operation result to the cyclic shift circuit 308.

The cyclic shift circuit 308 cyclically shifts the messages D$\mathbf{310}_1$ to D$\mathbf{310}_5$ calculated by the variable node calculating unit 307, on the basis of information on how many the unit matrixes (or the quasi unit matrix) becoming the origin in the transformed parity check matrix H' are cyclically shifted to obtain the corresponding branches, and supplies a result as messages D311 to the branch data storing memory 300.

By circulating the above operation in one cycle, decoding (variable node operation and check node operation) of the LDPC code can be performed once. After decoding the LDPC code by the predetermined number of times, the decoding device of FIG. 213 calculates a final decoding result and outputs the final decoding result, in the decoding word calculating unit 309 and the decoded data rearranging unit 311.

That is, the decoding word calculating unit 309 includes five decoding word calculators $\mathbf{309}_1$ to $\mathbf{309}_5$. The decoding word calculating unit 309 calculates a decoding result (decoding word) on the basis of the expression (5), as a final step of multiple decoding, using the five messages D308 (D$\mathbf{308}_1$ to D$\mathbf{308}_5$) (messages $u_j$ of the expression) output by the selector 305 and the five reception values D309 (reception values $u_{0i}$ of the expression (5)) supplied from the reception data memory 306, and supplies decoded data D315 obtained as a result to the decoded data rearranging unit 311.

The decoded data rearranging unit 311 performs the reverse replacement of the column replacement of the expression (12) with respect to the decoded data D315 supplied from the decoding word calculating unit 309, rearranges the order thereof, and outputs the decoded data as a final decoding result D316.

As mentioned above, by performing one or both of row replacement and column replacement on the parity check matrix (original parity check matrix) and converting it into a parity check matrix (transformed parity check matrix) that can be shown by the combination of a p×p unit matrix, a quasi unit matrix in which one or more elements of 1 thereof become 0, a shifted matrix that cyclically shifts the unit matrix or the quasi unit matrix, a sum matrix that is the sum of two or more of the unit matrix, the quasi unit matrix and the shifted matrix, and a p×p 0 matrix, that is, the combination of constitutive matrixes, as for LDPC code decoding, it becomes possible to adopt architecture that simultaneously performs check node calculation and variable node calculation by P which is the number less than the row number and column number of the parity check matrix. In the case of adopting the architecture that simultaneously performs node calculation (check node calculation and variable node calculation) by P which is the number less than the row number and column number of the parity check matrix, as compared with a case where the node calculation is simultaneously performed by the number equal to the row number and column number of the parity check matrix, it is possible to suppress the operation frequency within a feasible range and perform many items of iterative decoding.

The LDPC decoder 166 that constitutes the receiving device 12 of FIG. 207 performs the LDPC decoding by simultaneously performing P check node operations and variable node operations, similar to the decoding device of FIG. 213.

That is, for the simplification of explanation, if the parity check matrix of the LDPC code output by the LDPC encoder 115 constituting the transmitting device 11 of FIG. 8 is regarded as the parity check matrix H illustrated in FIG. 210 in which the parity matrix becomes a staircase structure, in the parity interleaver 23 of the transmitting device 11, the parity interleave to interleave the (K+qx+y+1)-th code bit into the position of the (K+Py+x+1)-th code bit is performed in a state in which the information K is set to 60, the unit size P is set to 5, and the divisor q (=M/P) of the parity length M is set to 6.

Because the parity interleave corresponds to the column replacement of the expression (12) as described above, it is not necessary to perform the column replacement of the expression (12) in the LDPC decoder 166.

For this reason, in the receiving device 12 of FIG. 207, as described above, the LDPC code in which the parity deinterleave is not performed, that is, the LDPC code in a state in which the column replacement of the expression (12) is performed is supplied from the group-wise deinterleaver 55 to the LDPC decoder 166. In the LDPC decoder 166, the same processing as the decoding device of FIG. 213, except that the column replacement of the expression (12) is not performed, is executed.

That is, FIG. 214 illustrates a configuration example of the LDPC decoder 166 of FIG. 207.

In FIG. 214, the LDPC decoder 166 has the same configuration as the decoding device of FIG. 213, except that the reception data rearranging unit 310 of FIG. 213 is not provided, and executes the same processing as the decoding device of FIG. 213, except that the column replacement of the expression (12) is not performed. Therefore, explanation of the LDPC decoder is omitted.

As described above, because the LDPC decoder 166 can be configured without providing the reception data rearranging unit 310, a scale can be decreased as compared with the decoding device of FIG. 213.

In FIGS. 210 to 214, for the simplification of explanation, the code length N of the LDPC code is set to 90, the information length K is set to 60, the unit size (the row number and the column number of the constitutive matrix) P is set to 5, and the divisor q (=M/P) of the parity length M is set to 6. However, the code length N, the information length K, the unit size P, and the divisor q (=M/P) are not limited to the above values.

That is, in the transmitting device 11 of FIG. 8, the LDPC encoder 115 outputs the LDPC code in which the code length N is set to 64800 or 16200, the information length K is set to N−Pq (=N−M), the unit size P is set to 360, and the divisor q is set to M/P. However, the LDPC decoder 166 of FIG. 214 can be applied to the case in which P check node operation and variable node operations are simultaneously performed with respect to the LDPC code and the LDPC decoding is performed.

Further, when the parity portion of the decoding result is unnecessary, and only the information bits of the decoding result are output after the decoding of the LDPC code by the LDPC decoder 166, the LDPC decoder 166 may be configured without the decoded data rearranging unit 311.

<Configuration Example of Block Deinterleaver 54>

FIG. 215 is a block diagram illustrating a configuration example of the block deinterleaver 54 of FIG. 208.

The block deinterleaver 54 has a similar configuration to the block interleaver described above with reference to FIG. 105.

Thus, the block deinterleaver 54 includes the storage region called the part 1 and the storage region called the part 2, and each of the parts 1 and 2 is configured such that a number C of columns equal in number to the number m of bits of the symbol and serving as storage regions that store one bit in the row (horizontal) direction and store a predetermined number of bits in the column (vertical) direction are arranged.

The block deinterleaver 54 performs the block deinterleave by writing the LDPC code in the parts 1 and 2 and reading the LDPC code from the parts 1 and 2.

However, in the block deinterleave, the writing of the LDPC code (serving as the symbol) is performed in the order in which the LDPC code is read by the block interleaver 25 of FIG. 105.

Further, in the block deinterleave, the reading of the LDPC code is performed in the order in which the LDPC code is written by the block interleaver 25 of FIG. 105.

In other words, in the block interleave performed by the block interleaver 25 of FIG. 105, the LDPC code is written in the parts 1 and 2 in the column direction and read from the parts 1 and 2 in the row direction, but in the block deinterleave performed by the block deinterleaver 54 of FIG. 215, the LDPC code is written in the parts 1 and 2 in the row direction and read from the parts 1 and 2 in the column direction.

<Other Configuration Example of Bit Deinterleaver 165>

FIG. 216 is a block diagram illustrating another configuration example of the bit deinterleaver 165 of FIG. 217.

In the drawings, portions that correspond to the case of FIG. 208 are denoted with the same reference numerals and explanation thereof is appropriately omitted hereinafter.

That is, the bit deinterleaver 165 of FIG. 216 has the same configuration as the case of FIG. 208, except that a parity deinterleaver 1011 is newly provided.

Referring to FIG. 216, the bit deinterleaver 165 is configured with a block deinterleaver 54, a group-wise deinterleaver 55, and a parity deinterleaver 1011, and performs the bit deinterleave on the code bits of the LDPC code supplied from the demapper 164.

In other words, the block deinterleaver 54 performs the block deinterleave (the inverse process of the block interleave) corresponding to the block interleave performed by the block interleaver 25 of the transmitting device 11, that is, the block deinterleave of restoring the positions of the code bits rearranged by the block interleave to the original positions on the LDPC code supplied from the demapper 164, and supplies the LDPC code obtained as a result to the group-wise deinterleaver 55.

The group-wise deinterleaver 55 performs the group-wise deinterleave corresponding to the group-wise interleave serving as the rearrangement process performed by the group-wise interleaver 24 of the transmitting device 11 on the LDPC code supplied from the block deinterleaver 54.

The LDPC code that is obtained as a result of the group-wise deinterleave is supplied from the group-wise deinterleaver 55 to the parity deinterleaver 1011.

The parity deinterleaver 1011 performs the parity deinterleave (reverse processing of the parity interleave) corresponding to the parity interleave performed by the parity interleaver 23 of the transmitting device 11, that is, the parity deinterleave to restore the sequence of the code bits of the LDPC code of which a sequence is changed by the parity interleave to the original sequence, with respect to the code bits after the group-wise deinterleave in the group-wise deinterleaver 55.

The LDPC code that is obtained as a result of the parity deinterleave is supplied from the parity deinterleaver 1011 to the LDPC decoder 166.

Therefore, in the bit deinterleaver 165 of FIG. 216, the LDPC code in which the block deinterleave, the group-wise deinterleave, and the parity deinterleave are performed, that is, the LDPC code that is obtained by the LDPC encoding according to the parity check matrix H is supplied to the LDPC decoder 166.

The LDPC decoder 166 performs the LDPC decoding of the LDPC code supplied from the bit deinterleaver 165 using the parity check matrix H used for the LDPC encoding by the LDPC encoder 115 of the transmitting device 11. In other words, the LDPC decoder 166 performs the LDPC decoding of the LDPC code supplied from the bit deinterleaver 165 using the parity check matrix H (of the DVB scheme) used for the LDPC encoding by the LDPC encoder 115 of the transmitting device 11 or the transformed parity check matrix obtained by performing at least the column permutation corresponding to the parity interleave on the parity check matrix H (for the ETRI scheme, the parity check matrix (FIG. 28) obtained by performing the column permutation on the parity check matrix (FIG. 27) used for the LDPC encoding or the transformed parity check matrix (FIG. 29) obtained by performing the row permutation on the parity check matrix (FIG. 27) used for the LDPC encoding).

In FIG. 216, the LDPC code that is obtained by the LDPC encoding according to the parity check matrix H is supplied from (the parity deinterleaver 1011 of) the bit deinterleaver 165 to the LDPC decoder 166. For this reason, when the LDPC decoding of the LDPC code is performed using the parity check matrix H (of the DVB method) itself used by the LDPC encoder 115 of the transmitting device 11 to perform the LDPC encoding (for the ETRI scheme, the parity check matrix (FIG. 28) obtained by performing the column permutation on the parity check matrix (FIG. 27) used for the LDPC encoding), the LDPC decoder 166 can be configured by a decoding device performing the LDPC decoding according to a full serial decoding method to sequentially perform operations of messages (a check node message and a variable node message) for each node or a decoding device performing the LDPC decoding according to a full parallel decoding method to simultaneously (in parallel) perform operations of messages for all nodes.

In the LDPC decoder 166, when the LDPC decoding of the LDPC code is performed using the transformed parity check matrix obtained by performing at least the column replacement corresponding to the parity interleave with respect to the parity check matrix H (of the DVB method) used by the LDPC encoder 115 of the transmitting device 11 to perform the LDPC encoding (for the ETRI scheme, the transformed parity check matrix (FIG. 29) obtained by performing the row permutation on the parity check matrix (FIG. 27) used for the LDPC encoding), the LDPC decoder 166 can be configured by a decoding device (FIG. 213) that is a decoding device of an architecture simultaneously performing P (or divisor of P other than 1) check node operations and variable node operations and has the reception data rearranging unit 310 to perform the same column replacement as the column replacement (parity interleave) to obtain the transformed parity check matrix with respect to the LDPC code and rearrange the code bits of the LDPC code.

In FIG. 216, for the sake of convenience of description, the block deinterleaver 54 that performs the block deinterleave, the group-wise deinterleaver 55 that performs the group-wise deinterleave, and the parity deinterleaver 1011 that performs the parity deinterleave are configured individually, but two or more of the block deinterleaver 54, the group-wise deinterleaver 55, and the parity deinterleaver 1011 may be configured integrally, similarly to the parity interleaver 23, the group-wise interleaver 24, and the block interleaver 25 of the transmitting device 11.

<Configuration Example of Reception System>

FIG. 217 is a block diagram illustrating a first configuration example of a reception system that can be applied to the receiving device 12.

In FIG. 217, the reception system includes an acquiring unit 1101, a transmission path decoding processing unit 1102, and an information source decoding processing unit 1103.

The acquiring unit 1101 acquires a signal including an LDPC code obtained by performing at least LDPC encoding with respect to LDPC target data such as image data or sound data of a program, through a transmission path (communication path) not illustrated in the drawings, such as terrestrial digital broadcasting, satellite digital broadcasting, a CATV network, the Internet, or other networks, and supplies the signal to the transmission path decoding processing unit 1102.

In this case, when the signal acquired by the acquiring unit 1101 is broadcast from a broadcasting station through a ground wave, a satellite wave, or a CATV (Cable Television) network, the acquiring unit 1101 is configured using a tuner and an STB (Set Top Box). When the signal acquired by the acquiring unit 1101 is transmitted from a web server by multicasting like an IPTV (Internet Protocol Television), the acquiring unit 1101 is configured using a network I/F (Interface) such as an NIC (Network Interface Card).

The transmission path decoding processing unit 1102 corresponds to the receiving device 12. The transmission path decoding processing unit 1102 executes transmission path decoding processing including at least processing for correcting error generated in a transmission path, with respect to the signal acquired by the acquiring unit 1101 through the transmission path, and supplies a signal obtained as a result to the information source decoding processing unit 1103.

That is, the signal that is acquired by the acquiring unit 1101 through the transmission path is a signal that is obtained by performing at least error correction encoding to correct the error generated in the transmission path. The transmission path decoding processing unit 1102 executes transmission path decoding processing such as error correction processing, with respect to the signal.

As the error correction encoding, for example, LDPC encoding or BCH encoding exists. In this case, as the error correction encoding, at least the LDPC encoding is performed.

The transmission path decoding processing includes demodulation of a modulation signal.

The information source decoding processing unit 1103 executes information source decoding processing including at least processing for extending compressed information to original information, with respect to the signal on which the transmission path decoding processing is executed.

That is, compression encoding that compresses information may be performed with respect to the signal acquired by the acquiring unit 1101 through the transmission path to decrease a data amount of an image or a sound corresponding to information. In this case, the information source decoding processing unit 1103 executes the information source decoding processing such as the processing (extension processing) for extending the compressed information to the original information, with respect to the signal on which the transmission path decoding processing is executed.

When the compression encoding is not performed with respect to the signal acquired by the acquiring unit 1101 through the transmission path, the processing for extending the compressed information to the original information is not executed in the information source decoding processing unit 1103.

In this case, as the extension processing, for example, MPEG decoding exists. In the transmission path decoding processing, in addition to the extension processing, descramble may be included.

In the reception system that is configured as described above, in the acquiring unit 1101, a signal in which the compression encoding such as the MPEG encoding and the error correction encoding such as the LDPC encoding are performed with respect to data such as an image or a sound is acquired through the transmission path and is supplied to the transmission path decoding processing unit 1102.

In the transmission path decoding processing unit 1102, the same processing as the receiving device 12 executes as the transmission path decoding processing with respect to the signal supplied from the acquiring unit 1101 and a signal obtained as a result is supplied to the information source decoding processing unit 1103.

In the information source decoding processing unit 1103, the information source decoding processing such as the MPEG decoding is executed with respect to the signal supplied from the transmission path decoding processing unit 1102 and an image or a sound obtained as a result is output.

The reception system of FIG. 217 described above can be applied to a television tuner to receive television broadcasting corresponding to digital broadcasting.

Each of the acquiring unit 1101, the transmission path decoding processing unit 1102, and the information source decoding processing unit 1103 can be configured as one independent device (hardware (IC (Integrated Circuit) and the like) or software module).

With respect to the acquiring unit 1101, the transmission path decoding processing unit 1102, and the information source decoding processing unit 1103, each of a set of the acquiring unit 1101 and the transmission path decoding processing unit 1102, a set of the transmission path decoding processing unit 1102 and the information source decoding processing unit 1103, and a set of the acquiring unit 1101, the transmission path decoding processing unit 1102, and the information source decoding processing unit 1103 can be configured as one independent device.

FIG. 218 is a block diagram illustrating a second configuration example of the reception system that can be applied to the receiving device 12.

In the drawings, portions that correspond to the case of FIG. 217 are denoted with the same reference numerals and explanation thereof is appropriately omitted hereinafter.

The reception system of FIG. 218 is common to the case of FIG. 217 in that the acquiring unit 1101, the transmission path decoding processing unit 1102, and the information source decoding processing unit 1103 are provided and is different from the case of FIG. 217 in that an output unit 1111 is newly provided.

The output unit 1111 is a display device to display an image or a speaker to output a sound and outputs an image or a sound corresponding to a signal output from the information source decoding processing unit 1103. That is, the output unit 1111 displays the image or outputs the sound.

The reception system of FIG. 218 described above can be applied to a TV (television receiver) receiving television broadcasting corresponding to digital broadcasting or a radio receiver receiving radio broadcasting.

When the compression encoding is not performed with respect to the signal acquired in the acquiring unit 1101, the signal that is output by the transmission path decoding processing unit 1102 is supplied to the output unit 1111.

FIG. 219 is a block diagram illustrating a third configuration example of the reception system that can be applied to the receiving device 12.

In the drawings, portions that correspond to the case of FIG. 217 are denoted with the same reference numerals and explanation thereof is appropriately omitted hereinafter.

The reception system of FIG. 219 is common to the case of FIG. 217 in that the acquiring unit 1101 and the transmission path decoding processing unit 1102 are provided.

However, the reception system of FIG. 219 is different from the case of FIG. 217 in that the information source decoding processing unit 1103 is not provided and a recording unit 1121 is newly provided.

The recording unit 1121 records (stores) a signal (for example, TS packets of TS of MPEG) output by the transmission path decoding processing unit 1102 on recording (storage) media such as an optical disk, a hard disk (magnetic disk), and a flash memory.

The reception system of FIG. 219 described above can be applied to a recorder that records television broadcasting.

In FIG. 219, the reception system is configured by providing the information source decoding processing unit 1103 and can record the signal obtained by executing the information source decoding processing by the information source decoding processing unit 1103, that is, the image or the sound obtained by decoding, by the recording unit 1121.

<Embodiment of Computer>

Next, the series of processing described above can be executed by hardware or can be executed by software. In the case in which the series of processing is executed by the software, a program configuring the software is installed in a general-purpose computer.

Therefore, FIG. 220 illustrates a configuration example of an embodiment of the computer in which a program executing the series of processing is installed.

The program can be previously recorded on a hard disk 705 and a ROM 703 corresponding to recording media embedded in the computer.

Alternatively, the program can be temporarily or permanently stored (recorded) on removable recording media 711 such as a flexible disk, a CD-ROM (Compact Disc Read Only Memory), an MO (Magneto Optical) disk, a DVD (Digital Versatile Disc), a magnetic disk, and a semiconductor memory. The removable recording media 711 can be provided as so-called package software.

The program is installed from the removable recording media 711 to the computer. In addition, the program can be transmitted from a download site to the computer by wireless through an artificial satellite for digital satellite broadcasting or can be transmitted to the computer by wire through a network such as a LAN (Local Area Network) or the Internet. The computer can receive the program transmitted as described above by a communication unit 708 and install the program in the embedded hard disk 705.

The computer includes a CPU (Central Processing Unit) 702 embedded therein. An input/output interface 710 is connected to the CPU 702 through a bus 701. If a user operates an input unit 707 configured using a keyboard, a mouse, and a microphone and a command is input through the input/output interface 710, the CPU 702 executes the program stored in the ROM (Read Only Memory) 703, according to the command. Alternatively, the CPU 702 loads the program stored in the hard disk 705, the program transmitted from a satellite or a network, received by the communication unit 708, and installed in the hard disk 705, or the program read from the removable recording media 711 mounted to a drive 709 and installed in the hard disk 705 to the RAM (Random Access Memory) 704 and executes the program. Thereby, the CPU 702 executes the processing according to the flowcharts described above or the processing executed by the configurations of the block diagrams described above. In addition, the CPU 702 outputs the processing result from the output unit 706 configured using an LCD (Liquid Crystal Display) or a speaker, transmits the processing result from the communication unit 708, and records the processing result on the hard disk 705, through the input/output interface 710, according to necessity.

In the present specification, it is not necessary to process the processing steps describing the program for causing the computer to execute the various processing in time series according to the order described as the flowcharts and processing executed in parallel or individually (for example, parallel processing or processing using an object) is also included.

The program may be processed by one computer or may be processed by a plurality of computers in a distributed manner. The program may be transmitted to a remote computer and may be executed.

An embodiment of the disclosure is not limited to the embodiments described above, and various changes and modifications may be made without departing from the scope of the disclosure.

That is, for example, (the parity check matrix initial value table of) the above-described new LDPC code can be used even if the communication path 13 (FIG. 7) is any of a satellite circuit, a ground wave, a cable (wire circuit) and others. In addition, the new LDPC code can also be used for data transmission other than digital broadcasting.

The GW patterns can be applied to a code other than the new LDPC code. Further, the modulation scheme to which the GW patterns are applied is not limited to QPSK, 16QAM, 64QAM, 256QAM, 1024QAM, and 4096QAM.

The effects described in this specification are merely examples and not limited, and any other effect may be obtained.

REFERENCE SIGNS LIST

11 transmitting device
12 receiving device
23 parity interleaver
24 group-wise interleaver
25 block interleaver
54 block deinterleaver
55 group-wise deinterleaver
111 mode adaptation/multiplexer
112 padder
113 BB scrambler
114 BCH encoder
115 LDPC encoder
116 bit interleaver
117 mapper
118 time interleaver
119 SISO/MISO encoder
120 frequency interleaver
121 BCH encoder
122 LDPC encoder
123 mapper
124 frequency interleaver
131 frame builder/resource allocation unit
132 OFDM generating unit
151 OFDM operating unit
152 frame managing unit
153 frequency deinterleaver
154 demapper
155 LDPC decoder
156 BCH decoder
161 frequency deinterleaver
162 SISO/MISO decoder
163 time deinterleaver
164 demapper
165 bit deinterleaver
166 LDPC decoder
167 BCH decoder
168 BB descrambler
169 null deletion unit
170 demultiplexer
300 branch data storing memory
301 selector
302 check node calculating unit
303 cyclic shift circuit
304 branch data storing memory
305 selector
306 reception data memory
307 variable node calculating unit
308 cyclic shift circuit
309 decoding word calculating unit
310 reception data rearranging unit
311 decoded data rearranging unit
601 encoding processing unit
602 storage unit
611 encoding rate setting unit
612 initial value table reading unit
613 parity check matrix generating unit
614 information bit reading unit
615 encoding parity operation unit
616 control unit
701 bus
702 CPU
703 ROM
704 RAM
705 hard disk
706 output unit
707 input unit
708 communication unit
709 drive
710 input/output interface
711 removable recording media
1001 reverse interchanging unit
1002 memory
1011 parity deinterleaver
1101 acquiring unit
1101 transmission path decoding processing unit
1103 information source decoding processing unit
1111 output unit
1121 recording unit

The invention claimed is:

1. A receiving device for receiving digital television signals, the receiving device comprising:

a receiver configured to receive encoded data, each six bits of which are mapped to one of 64 signal points of a modulation method; and circuitry configured to:

process the encoded data to produce a group-wise interleaved low density parity check (LDPC) code word;

process the group-wise interleaved LDPC code word in a unit of a bit group of 360 bits to produce an LDPC code word of an LDPC code;

wherein an (i+1)-th bit group from a head of the LDPC code word of the LDPC code is indicated by a bit group i, the LDPC code word of the LDPC code has a sequence of bit groups 0 to 44, and the group-wise interleaved LDPC code word has a following sequence of bit groups, 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4, decode the LDPC code word of the LDPC code to produce decoded data; and process the decoded data for presentation;

wherein the LDPC code has a length N of 16200 bits and a coding rate r of 10/15 and corresponds to a parity check matrix initial value table including the following, 352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387.

2. The receiving device according to claim 1, wherein the LDPC code uses a parity check matrix, which includes an information matrix part and a parity matrix part.

3. The receiving device according to claim 2, wherein the LDPC code word includes information bits and parity bits; and the information matrix part corresponds to the information bits and the parity matrix part corresponds to the parity bits.

4. The receiving device according to claim 3, wherein the parity matrix part is a lower bidiagonal matrix, in which elements of "1" are arranged in a step-wise fashion.

5. The receiving device according to claim 3, wherein the information matrix part is represented by the parity check matrix initial value table, and the parity check matrix initial value table is a table showing in an i-th row, i>0, positions of elements "1" in (1+360×(i−1))-th column of the information matrix part.

6. The receiving device according to claim 5, wherein if a length of the parity bits of the LDPC code word is represented by M, the z+360×(i−1)-th column of the parity check matrix, z>1, is obtained by the cyclic shift of the (z−1)+360×(i−1)-th column of the parity check matrix indicating a position of an element "1" in the parity check matrix initial value table downward by q=M/360.

7. The receiving device according to claim 6, wherein as for each column from the 2+360×(i−1)-th column to a 360×i-th column being the column other than the 1+360×(i−1)-th column of the parity check matrix, if an i-th row j-th column value of the parity check matrix initial value table is represented as hi,j and the row number of a j-th element "1" of a w-th column of the parity check matrix is represented as Hw-j, a row number Hw-j of the j-th element "1" of the w-th column being the column other than the 1+360×(i−1)-th column of the parity check matrix is represented by the equation Hw-j=mod (hi,j+mod ((w−1), 360)×M/360, M).

8. The receiving device according to claim 2, wherein the parity check matrix has no cycle-4.

9. The receiving device according to claim 1, wherein the receiver is a television including a display configured to display an image and a speaker configured to output a sound.

10. The receiving device according to claim 1, wherein the modulation method employs non-uniform constellations (NUCs).

11. A method performed by a receiving device receiving digital television signals, the method comprising:

receiving encoded data, each six bits of which are mapped to one of 64 signal points of a modulation method;

processing the encoded data to produce a group-wise interleaved low density parity check (LDPC) code word;

processing the group-wise interleaved LDPC code word in a unit of a bit group of 360 bits to produce an LDPC code word of an LDPC code;

wherein an (i+1)-th bit group from a head of the LDPC code word of the LDPC code is indicated by a bit group i, the LDPC code word of the LDPC code has a sequence of bit groups 0 to 44, and the group-wise interleaved LDPC code word has a following sequence of bit groups, 14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4, decoding the LDPC code word of the LDPC code to produce decoded data; and processing the decoded data for presentation;

wherein the LDPC code has a length N of 16200 bits and a coding rater of 10/15 and corresponds to a parity check matrix initial value table including the following, 352 747 894 1437 1688 1807 1883 2119 2159 3321 3400 3543 3588 3770 3821 4384 4470 4884 5012 5036 5084 5101 5271 5281 5353
505 915 1156 1269 1518 1650 2153 2256 2344 2465 2509 2867 2875 3007 3254 3519 3687 4331 4439 4532 4940 5011 5076 5113 5367
268 346 650 919 1260 4389 4653 4721 4838 5054 5157 5162 5275 5362
220 236 828 1590 1792 3259 3647 4276 4281 4325 4963 4974 5003 5037
381 737 1099 1409 2364 2955 3228 3341 3473 3985 4257 4730 5173 5242
88 771 1640 1737 1803 2408 2575 2974 3167 3464 3780 4501 4901 5047
749 1502 2201 3189
2873 3245 3427
2158 2605 3165
1 3438 3606
10 3019 5221
371 2901 2923
9 3935 4683
1937 3502 3735
507 3128 4994
25 3854 4550
1178 4737 5366
2 223 5304
1146 5175 5197
1816 2313 3649
740 1951 3844
1320 3703 4791
1754 2905 4058
7 917 5277
3048 3954 5396
4804 4824 5105
2812 3895 5226
0 5318 5358
1483 2324 4826
2266 4752 5387.

12. The method according to claim 11 wherein the LDPC code uses a parity check matrix, which includes an information matrix part and a parity matrix part.

13. The method according to claim 12, wherein
the LDPC code word includes information bits and parity bits; and
the information matrix part corresponds to the information bits and the parity matrix part corresponds to the parity bits.

14. The method according to claim 13, wherein
the parity matrix part is a lower bidiagonal matrix, in which elements of "1" are arranged in a step-wise fashion.

15. The method according to claim 13, wherein
the information matrix part is represented by the parity check matrix initial value table, and
the parity check matrix initial value table is a table showing in an i-th row, i>0, positions of elements "1" in (1+360×(i−1))-th column of the information matrix part.

16. The method according to claim 15, wherein
if a length of the parity bits of the LDPC code word is represented by M, the z+360×(i−1)-th column of the parity check matrix, z>1, is obtained by the cyclic shift of the (z−1)+360×(i−1)-th column of the parity check matrix indicating a position of an element "1" in the parity check matrix initial value table downward by q=M/360.

17. The method according to claim 16, wherein
as for each column from the 2+360×(i−1)-th column to a 360×i-th column being the column other than the 1+360×(i−1)-th column of the parity check matrix,
if an i-th row j-th column value of the parity check matrix initial value table is represented as hi,j and the row number of a j-th element "1" of a w-th column of the parity check matrix is represented as Hw-j,
a row number Hw-j of the j-th element "1" of the w-th column being the column other than the 1+360×(i−1)-th column of the parity check matrix is represented by the equation Hw-j=mod (hi,j+mod ((w−1), 360)×M/360, M).

18. The method according to claim 12, wherein
the parity check matrix has no cycle-4.

19. The method according to claim 11 wherein the modulation method employs non-uniform constellations (NUCs).

20. A non-transitory computer readable medium including computer executable instructions which, when executed by a computer, cause the computer to perform a method comprising:
receiving encoded data, each six bits of which are mapped to one of 64 signal points of a modulation method;
processing the encoded data to produce a group-wise interleaved low density parity check (LDPC) code word;
processing the group-wise interleaved LDPC code word in a unit of a bit group of 360 bits to produce an LDPC code word of an LDPC code;
wherein an (i+1)-th bit group from a head of the LDPC code word of the LDPC code is indicated by a bit group i, the LDPC code word of the LDPC code has a sequence of bit groups 0 to 44, and the group-wise interleaved LDPC code word has a following sequence of bit groups,
14, 22, 18, 11, 28, 26, 2, 38, 10, 0, 5, 12, 24, 17, 29, 16, 39, 13, 23, 8, 25, 43, 34, 33, 27, 15, 7, 1, 9, 35, 40, 32, 30, 20, 36, 31, 21, 41, 44, 3, 42, 6, 19, 37, and 4,
decoding the LDPC code word of the LDPC code to produce decoded data; and
processing the decoded data for presentation;
wherein the LDPC code has a length N of 16200 bits and a coding rate r of 10/15 and corresponds to a parity check matrix initial value table including the following,
352 747 894 1437 1688 1807 1883 2119 2159 3321 3400 3543 3588 3770 3821 4384 4470 4884 5012 5036 5084 5101 5271 5281 5353
505 915 1156 1269 1518 1650 2153 2256 2344 2465 2509 2867 2875 3007 3254 3519 3687 4331 4439 4532 4940 5011 5076 5113 5367
268 346 650 919 1260 4389 4653 4721 4838 5054 5157 5162 5275 5362
220 236 828 1590 1792 3259 3647 4276 4281 4325 4963 4974 5003 5037
381 737 1099 1409 2364 2955 3228 3341 3473 3985 4257 4730 5173 5242
88 771 1640 1737 1803 2408 2575 2974 3167 3464 3780 4501 4901 5047
749 1502 2201 3189
2873 3245 3427
2158 2605 3165
1 3438 3606
10 3019 5221
371 2901 2923
9 3935 4683
1937 3502 3735
507 3128 4994

25 3854 4550
1178 4737 5366
2 223 5304
1146 5175 5197
1816 2313 3649
740 1951 3844
1320 3703 4791
1754 2905 4058
7 917 5277
3048 3954 5396
4804 4824 5105
2812 3895 5226
0 5318 5358
1483 2324 4826
2266 4752 5387.

* * * * *